US012402531B2

(12) United States Patent
Ahn et al.

(10) Patent No.: US 12,402,531 B2
(45) Date of Patent: Aug. 26, 2025

(54) MULTI-COMPONENT HOST MATERIAL AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Hee-Choon Ahn, Gyeonggi-do (KR); Young-Kwang Kim, Gyeonggi-do (KR); Doo-Hyeon Moon, Gyeonggi-do (KR); Su-Hyun Lee, Gyeonggi-do (KR); Seon-Woo Lee, Gyeonggi-do (KR); Chi-Sik Kim, Gyeonggi-do (KR); Kyoung-Jin Park, Gyeonggi-do (KR); Nam-Kyun Kim, Gyeonggi-do (KR); Kyung-Hoon Choi, Gyeonggi-do (KR); Jae-Hoon Shim, Seoul (KR); Young-Jun Cho, Gyeonggi-do (KR); Kyung-Joo Lee, Seoul (KR)

(73) Assignee: DuPont Specialty Materials Korea Ltd. (KR)

( * ) Notice: Subject to any disclaimer, the term of this patent is extended or adjusted under 35 U.S.C. 154(b) by 0 days.

(21) Appl. No.: 18/416,245

(22) Filed: Jan. 18, 2024

(65) Prior Publication Data

US 2024/0206333 A1 Jun. 20, 2024

Related U.S. Application Data

(63) Continuation of application No. 17/526,112, filed on Nov. 15, 2021, now abandoned, which is a continuation of application No. 15/301,978, filed as application No. PCT/KR2015/003485 on Apr. 7, 2015, now abandoned.

(30) Foreign Application Priority Data

Apr. 8, 2014 (KR) ........................ 10-2014-0041844
Jul. 10, 2014 (KR) ........................ 10-2014-0086754
Mar. 26, 2015 (KR) ........................ 10-2015-0042704

(51) Int. Cl.

| | |
|---|---|
| ***H01L 51/54*** | (2006.01) |
| ***C09K 11/02*** | (2006.01) |
| ***C09K 11/06*** | (2006.01) |
| ***H10K 85/30*** | (2023.01) |
| ***H10K 85/40*** | (2023.01) |
| ***H10K 85/60*** | (2023.01) |
| *H10K 50/11* | (2023.01) |
| *H10K 101/00* | (2023.01) |
| *H10K 101/10* | (2023.01) |

(52) U.S. Cl.

CPC ........ *H10K 85/6572* (2023.02); *C09K 11/025* (2013.01); *C09K 11/06* (2013.01); *H10K 85/342* (2023.02); *H10K 85/40* (2023.02); *H10K 85/615* (2023.02); *H10K 85/626* (2023.02); *H10K 85/654* (2023.02); *H10K 85/657* (2023.02); *H10K 85/6574* (2023.02); *H10K 85/6576* (2023.02); *C09K 2211/1007* (2013.01); *C09K 2211/1011* (2013.01); *C09K 2211/1029* (2013.01); *C09K 2211/1033* (2013.01); *C09K 2211/1037* (2013.01); *C09K 2211/1044* (2013.01); *C09K 2211/1059* (2013.01); *C09K 2211/1088* (2013.01); *C09K 2211/1092* (2013.01); *C09K 2211/185* (2013.01); *H10K 50/11* (2023.02); *H10K 2101/10* (2023.02); *H10K 2101/90* (2023.02)

(58) Field of Classification Search

None

See application file for complete search history.

(56) References Cited

U.S. PATENT DOCUMENTS

| | | | |
|---|---|---|---|
| 8,652,654 | B2 | 2/2014 | Inoue et al. |
| 9,391,288 | B2 | 7/2016 | Nagao et al. |
| 9,419,230 | B2 | 8/2016 | Kim et al. |
| 9,647,226 | B2 | 5/2017 | Nishirmura et al. |
| 9,818,948 | B2 | 11/2017 | Jatsch et al. |
| 9,893,290 | B2 | 2/2018 | Min et al. |
| 2004/0086745 | A1 | 5/2004 | Iwakuma et al. |

(Continued)

FOREIGN PATENT DOCUMENTS

| | | | |
|---|---|---|---|
| JP | 3139321 | B2 | 2/2001 |
| JP | 2008135498 | A | 6/2008 |

(Continued)

OTHER PUBLICATIONS

Machine translation of JP2008-135498. (Year: 2008).
Shin et al. Organic Electronics 2011, 12, 785-793. (Year: 2011).
Machine translation of WO2013168688. (Year: 2013).

*Primary Examiner* — Andrew K Bohaty

(74) *Attorney, Agent, or Firm* — G. Creston Campbell

(57) ABSTRACT

The present invention relates to an organic electroluminescent device comprising at least one light-emitting layer between an anode and a cathode, wherein the light-emitting layer comprises a host and a phosphorescent dopant; the host consists of multi-component host compounds; at least a first host compound of the multi-component host compounds is a specific bicarbazole derivative containing an aryl group, and a second host compound is a specific carbazole derivative including a nitrogen-containing heteroaryl group. According to the present invention, the organic electroluminescent device using the multi-component host compounds has a high efficiency and long lifespan compared with the conventional device using one component host compound.

3 Claims, No Drawings

(56) References Cited

U.S. PATENT DOCUMENTS

| | | | |
|---|---|---|---|
| 2011/0278555 A1 | 11/2011 | Inoue et al. | |
| 2011/0279020 A1 | 11/2011 | Inoue | |
| 2012/0068170 A1* | 3/2012 | Pflumm | C09B 19/00 544/212 |
| 2012/0211736 A1 | 8/2012 | Kim et al. | |
| 2013/0020561 A1 | 1/2013 | Suzuki et al. | |
| 2013/0056720 A1 | 3/2013 | Kim et al. | |
| 2013/0075716 A1 | 3/2013 | Nishimura | |
| 2013/0234119 A1 | 9/2013 | Mizuki et al. | |
| 2014/0042469 A1 | 2/2014 | Seo et al. | |
| 2014/0048784 A1* | 2/2014 | Inoue | H10K 85/622 548/440 |
| 2014/0054564 A1 | 2/2014 | Cho et al. | |
| 2014/0070204 A1 | 3/2014 | Nagao | |
| 2014/0084270 A1 | 3/2014 | Kato et al. | |
| 2014/0151647 A1* | 6/2014 | Mizuki | H05B 33/20 257/40 |
| 2014/0197386 A1 | 7/2014 | Kim | |
| 2014/0217378 A1 | 8/2014 | Nishimura | |
| 2014/0299865 A1 | 10/2014 | Nishimura et al. | |
| 2014/0306207 A1 | 10/2014 | Nishimura | |
| 2014/0336392 A1 | 11/2014 | Kim et al. | |
| 2015/0001488 A1 | 1/2015 | Min | |
| 2015/0115240 A1 | 4/2015 | Fukumatsu et al. | |
| 2015/0236262 A1 | 8/2015 | Cho | |
| 2017/0117488 A1 | 4/2017 | Ahn et al. | |

FOREIGN PATENT DOCUMENTS

| | | |
|---|---|---|
| JP | 2014049539 A | 3/2014 |
| KR | 101170666 B1 | 8/2012 |
| WO | 2010114264 A2 | 10/2010 |
| WO | 2011155507 A1 | 12/2011 |
| WO | 2012150826 A1 | 11/2012 |
| WO | 2012153725 A1 | 11/2012 |
| WO | 2012176818 A1 | 12/2012 |
| WO | 2013012298 A1 | 1/2013 |
| WO | 2013058343 A1 | 4/2013 |
| WO | 2013062075 A1 | 5/2013 |
| WO | 2013112557 A1 | 8/2013 |
| WO | 2013147205 A1 | 10/2013 |
| WO | 2013168688 A1 | 11/2013 |
| WO | 2013187896 A1 | 12/2013 |
| WO | 2014038677 A1 | 3/2014 |
| WO | 2014094961 A1 | 6/2014 |

* cited by examiner

MULTI-COMPONENT HOST MATERIAL AND ORGANIC ELECTROLUMINESCENT DEVICE COMPRISING THE SAME

CROSS-REFERENCE TO RELATED APPLICATIONS

This application is a continuation of U.S. patent application Ser. No. 17/526,112, filed Nov. 15, 2021, which is a continuation of U.S. patent application Ser. No. 15/301,978, filed Oct. 5, 2016, which is the national stage entry, filed under 35 U.S.C. § 371, of International Patent Application No. PCT/KR15/003485, filed Apr. 7, 2015, each of which is incorporated by reference herein in its entirety.

TECHNICAL FIELD

The present invention relates to a multi-component host material and an organic electroluminescent device comprising the same.

BACKGROUND ART

An electroluminescent (EL) device is a self-light-emitting device with the advantage of providing a wider viewing angle, a greater contrast ratio, and a faster response time. An organic EL device was first developed by Eastman Kodak, by using small aromatic diamine molecules and aluminum complexes as materials for forming a light-emitting layer (see Appl. Phys. Lett. 51, 913, 1987).

The organic EL device changes electric energy into light by the injection of a charge into an organic light-emitting material and commonly comprises an anode, a cathode, and an organic layer formed between the two electrodes. The organic layer of the organic EL device may be composed of a hole injection layer (HIL), a hole transport layer (HTL), an electron blocking layer (EBL), a light-emitting layer (EML) (containing host and dopant materials), an electron buffer layer, a hole blocking layer (HBL), an electron transport layer (ETL), an electron injection layer (EIL), etc.; the materials used in the organic layer can be classified into a hole injection material, a hole transport material, an electron blocking material, a light-emitting material, an electron buffer material, a hole blocking material, an electron transport material, an electron injection material, etc., depending on functions. In the organic EL device, holes from an anode and electrons from a cathode are injected into a light-emitting layer by the injection of a charge, and an exciton having high energy is produced by the recombination of holes and electrons. The organic light-emitting compound moves into an excited state by the energy and emits light which changes from energy when the organic light-emitting compound returns to the ground state from the excited state.

The most important factor determining luminescent efficiency in an organic EL device is the light-emitting material. The light-emitting material is required to have the following features: high quantum efficiency, high movement degree of an electron and a hole, formability of a uniform layer, and stability. The light-emitting material is classified into blue light-emitting materials, green light-emitting materials, and red light-emitting materials according to the light-emitting color, and further includes yellow light-emitting materials or orange light-emitting materials. Furthermore, the light-emitting material is classified into a host material and a dopant material in the functional aspect. Recently, an urgent task is the development of an organic EL device having high efficacy and long operating lifespan. In particular, the development of highly excellent light-emitting material over conventional light-emitting materials is urgent considering EL properties required in medium- and large-sized OLED panels. For this, preferably, as a solvent in a solid state and energy transmitter, a host material should have high purity and suitable molecular weight in order to be deposited under vacuum. Furthermore, a host material is required to have high glass transition temperature and pyrolysis temperature to guarantee thermal stability, high electrochemical stability to provide long lifespan, easy formability of an amorphous thin film, good adhesion with adjacent layers, and no movement between layers.

A mixed system of a dopant/host material can be used as a light-emitting material to improve color purity, luminescent efficiency, and stability. Generally, the device having the most excellent EL properties comprises the light-emitting layer, wherein a dopant is doped onto a host. If the dopant/host material system is used, the selection of the host material is important since the host material greatly influences on efficiency and performance of a light-emitting device.

WO 2013/168688 A1, Japanese Patent No. 3139321, Korean Patent No. 10-1170666, Korean Patent Application Laying-open No. 10-2012-0013173, and WO 2013/112557 A1 disclose organic EL devices comprising a dopant/host material system. The above literature use one host component having a carbazole-carbazole skeleton or exclude a host having a cabazole skeleton from second and third hosts.

The present inventors have found that an organic EL device using a multi-component host compounds having a specific bicarbazole derivative which contains an aryl group and a specific carbazole derivative which includes a nitrogen-containing heteroaryl group has high efficiency and long lifespan, compared with using one component host compound in a light-emitting layer.

DISCLOSURE OF THE INVENTION

Problems to be Solved

The object of the present invention is to provide an organic EL device having high efficiency and long lifespan.

Solution to Problems

The above objective can be achieved by an organic electroluminescent device comprising at least one light-emitting layer between an anode and a cathode, wherein the light-emitting layer comprises a host and a phosphorescent dopant; the host consists of multi-component host compounds; at least a first host compound of the multi-component host compounds is represented by the following formula 1 which is a specific bicarbazole derivative containing an aryl group, and a second host compound is represented by the following formula 2 which is a specific carbazole derivative including a nitrogen-containing heteroaryl group:

(1)

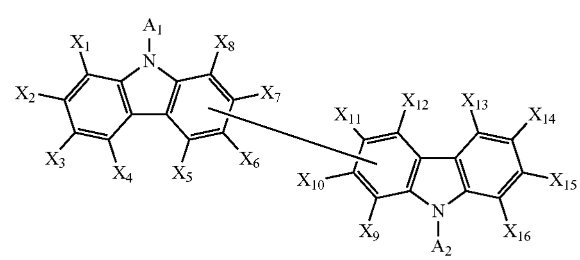

-continued (2)

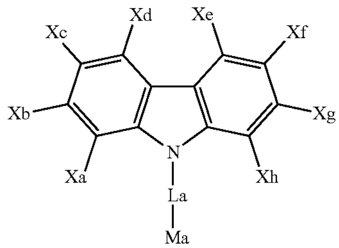

wherein

- $A_1$ and $A_2$ each independently represent a substituted or unsubstituted (C6-C30)aryl group;
- $X_1$ to $X_{16}$ each independently represent hydrogen, deuterium, a halogen, a cyano group, a substituted or unsubstituted (C1-C30)alkyl group, a substituted or unsubstituted (C2-C30)alkenyl group, a substituted or unsubstituted (C2-C30)alkynyl group, a substituted or unsubstituted (C3-C30)cycloalkyl group, a substituted or unsubstituted (C6-C60)aryl group, a substituted or unsubstituted 3- to 30-membered heteroaryl group, a substituted or unsubstituted tri(C1-C30)alkylsilyl group, a substituted or unsubstituted tri(C6-C30)arylsilyl group, a substituted or unsubstituted di(C1-C30)alkyl(C6-C30)arylsilyl group, or a substituted or unsubstituted mono- or di-(C6-C30)arylamino group; or are linked between adjacent substituents to form a substituted or unsubstituted mono- or polycyclic, (C3-C30) alicyclic or aromatic ring whose carbon atom(s) may be replaced with at least one hetero atom selected from nitrogen, oxygen and sulfur;
- Ma represents a substituted or unsubstituted nitrogen-containing 5- to 30-membered heteroaryl group;
- La represents a single bond, or a substituted or unsubstituted (C6-C30)arylene group;
- Xa to Xh each independently represent hydrogen, deuterium, a halogen, a cyano group, a substituted or unsubstituted (C1-C30)alkyl group, a substituted or unsubstituted (C2-C30)alkenyl group, a substituted or unsubstituted (C2-C30)alkynyl group, a substituted or unsubstituted (C3-C30)cycloalkyl group, a substituted or unsubstituted (C6-C60)aryl group, a substituted or unsubstituted 3- to 30-membered heteroaryl group, a substituted or unsubstituted tri(C1-C30)alkylsilyl group, a substituted or unsubstituted tri(C6-C30)arylsilyl group, a substituted or unsubstituted di(C1-C30)alkyl(C6-C30)arylsilyl group, or a substituted or unsubstituted mono- or di-(C6-C30)arylamino group; or are linked between adjacent substituents to form a substituted or unsubstituted mono- or polycyclic, (C3-C30) alicyclic or aromatic ring whose carbon atom(s) ring may be replaced with at least one hetero atom selected from nitrogen, oxygen and sulfur;
- the fused aromatic or heteroaromatic ring is selected from the group consisting of benzene, indole, indene, benzofuran and benzothiophene, which may be further substituted with a (C1-C10)alkyl group or a (C6-C15) aryl group; and
- the heteroaryl group contains at least one hetero atom selected from B, N, O, S, P(=O), Si and P.

Effects of the Invention

According to the present invention, the organic EL device having high efficiency and long lifespan is provided and the production of a display device or a lighting device is possible by using the organic EL device.

EMBODIMENTS OF THE INVENTION

Hereinafter, the present invention will be described in detail. However, the following description is intended to explain the invention, and is not meant in any way to restrict the scope of the invention.

The compound of formula 1 is represented by the following formula 3, 4, 5, or 6:

(3)

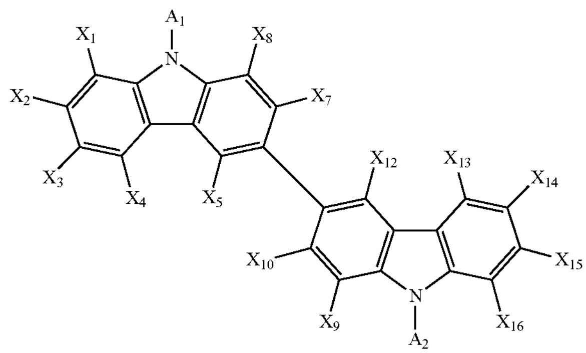

(4)

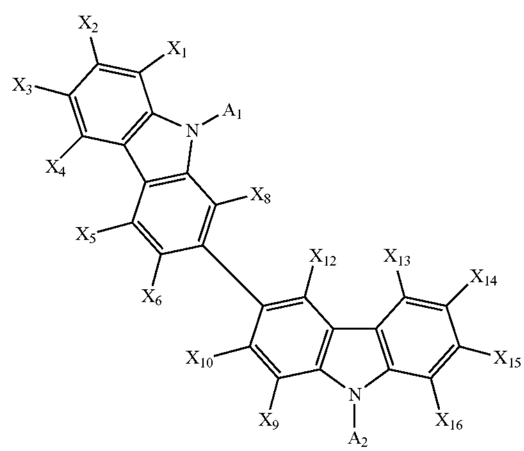

(5)

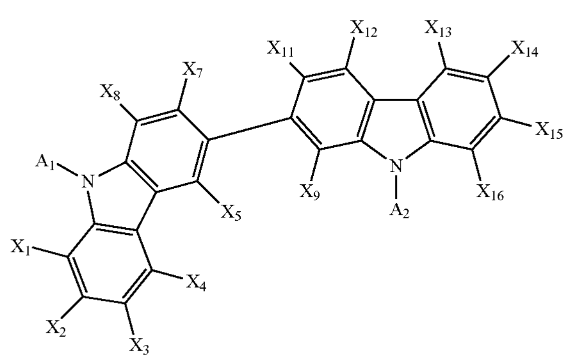

-continued (6)

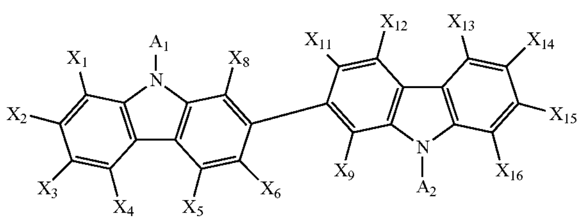

wherein $A_1$, $A_2$ and $X_1$ to $X_{16}$ are as defined in formula 1.

In formula 1, $A_1$ and $A_2$ each independently represent a substituted or unsubstituted (C6-C30)aryl group; preferably, a substituted or unsubstituted (C6-C18)aryl group; more preferably, a (C6-C18)aryl group which is unsubstituted or substituted with a (C1-C6)alkyl group, a (C6-C12)aryl group, or a tri(C6-C12)arylsilyl group; and even more preferably, phenyl, biphenyl, terphenyl, naphthyl, fluorenyl, phenanthrenyl, anthracenyl, indenyl, triphenylenyl, pyrenyl, tetracenyl, perylenyl, chrysenyl, naphthacenyl, or fluoranthenyl.

In formula 1, $X_1$ to $X_{16}$ each independently represent hydrogen, deuterium, a halogen, a cyano group, a substituted or unsubstituted (C1-C30)alkyl group, a substituted or unsubstituted (C2-C30)alkenyl group, a substituted or unsubstituted (C2-C30)alkynyl group, a substituted or unsubstituted (C3-C30)cycloalkyl group, a substituted or unsubstituted (C6-C60)aryl group, a substituted or unsubstituted 3- to 30-membered heteroaryl group, a substituted or unsubstituted tri(C1-C30)alkylsilyl group, a substituted or unsubstituted tri(C6-C30)arylsilyl group, a substituted or unsubstituted di(C1-C30)alkyl(C6-C30)arylsilyl group, or a substituted or unsubstituted mono- or di-(C6-C30)arylamino group; or are linked between adjacent substituents to form a substituted or unsubstituted mono- or polycyclic, (C3-C30) alicyclic or aromatic ring whose carbon atom(s) ring may be replaced with at least one hetero atom selected from nitrogen, oxygen and sulfur; preferably, hydrogen, a substituted or unsubstituted (C6-C20)aryl group, a substituted or unsubstituted tri(C6-C12)arylsilyl group, or a substituted or unsubstituted 3- to 15-membered heteroaryl group; and more preferably, hydrogen, a substituted or unsubstituted (C6-C18)aryl group, an unsubstituted triphenylsilyl group, a substituted or unsubstituted dibenzothiophene group, or a substituted or unsubstituted dibenzofuran group.

The compound of formula 2 is represented by the following formula 7, 8, or 9:

(7)

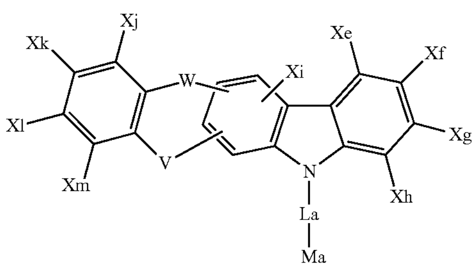

-continued (8)

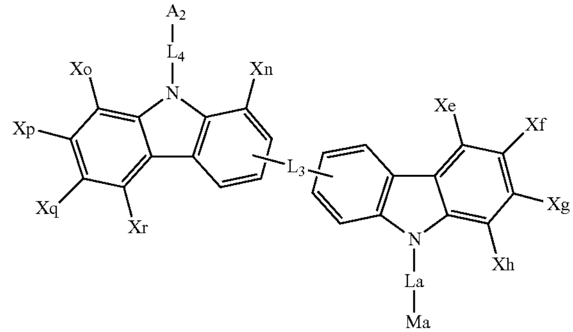

(9)

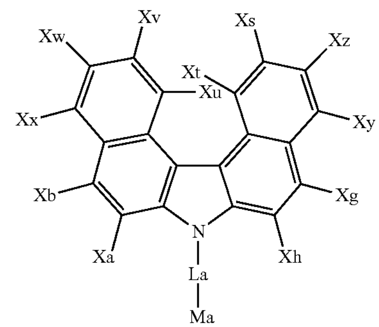

wherein

V and W each independently represent a single bond, $NR_{15}$, $CR_{16}R_{17}$, S, or O, provided that both V and W neither represent a single bond nor represent $NR_{15}$;

$A_2$ represents a substituted or unsubstituted (C6-C30)aryl group and may be bonded to Xn or Xo;

$L_3$ and $L_4$ each independently represent a single bond, or a substituted or unsubstituted (C6-C60)arylene group;

Xi represents hydrogen, deuterium, a halogen, a cyano group, a substituted or unsubstituted (C1-C30)alkyl group, a substituted or unsubstituted (C2-C30)alkenyl group, a substituted or unsubstituted (C2-C30)alkynyl group, a substituted or unsubstituted (C3-C30)cycloalkyl group, a substituted or unsubstituted (C6-C60)aryl group, a substituted or unsubstituted 3- to 30-membered heteroaryl group, a substituted or unsubstituted tri(C1-C30)alkylsilyl group, a substituted or unsubstituted tri(C6-C30)arylsilyl group, a substituted or unsubstituted di(C1-C30)alkyl(C6-C30)arylsilyl group, or a substituted or unsubstituted mono- or di-(C6-C30)arylamino group; or are linked between adjacent substituents to form a substituted or unsubstituted mono- or polycyclic, (C3-C30) alicyclic or aromatic ring whose carbon atom(s) ring may be replaced with at least one hetero atom selected from nitrogen, oxygen and sulfur;

Xj to Xz each independently represent hydrogen, deuterium, a halogen, a cyano group, a carboxyl group, a nitro group, a hydroxyl group, a substituted or unsubstituted (C1-C30)alkyl group, a substituted or unsubstituted (C3-C30)cycloalkyl group, a substituted or unsubstituted (C3-C30)cycloalkenyl group, a substituted or unsubstituted 3- to 7-membered heterocycloalkyl group, a substituted or unsubstituted (C6-C60)aryl group, a substituted or unsubstituted 3- to 30-membered heteroaryl group, $—NR_5R_6$, or $—SiR_7R_8R_9$; or are linked between adjacent substituents to form a substituted or unsubstituted mono- or polycyclic, (C3-C30) alicyclic or aromatic ring whose carbon atom(s) ring may be replaced with at least one hetero atom selected from nitrogen, oxygen and sulfur;

Ma, La, Xa, Xb, and Xe to Xh are as defined in formula 2;

$R_5$ to $R_9$ each independently represent hydrogen, deuterium, a halogen, a cyano group, a carboxyl group, a nitro group, a hydroxyl group, a substituted or unsubstituted (C1-C30)alkyl group, a substituted or unsubstituted (C3-C30)cycloalkyl group, a substituted or unsubstituted (C3-C30)cycloalkenyl group, a substituted or unsubstituted 3- to 7-membered heterocycloalkyl group, a substituted or unsubstituted (C6-C60)aryl group, or a substituted or unsubstituted 3- to 30-membered heteroaryl group; or are linked between adjacent substituents to form a substituted or unsubstituted mono- or polycyclic, (C3-C30) alicyclic or aromatic ring whose carbon atom(s) ring may be replaced with at least one hetero atom selected from nitrogen, oxygen and sulfur; preferably, hydrogen, or a substituted or unsubstituted (C6-C25)aryl group; more preferably, hydrogen or an unsubstituted (C6-C18)aryl group; and specifically, hydrogen, an unsubstituted phenyl group, a biphenyl group, or a fluorenyl group;

$R_{16}$ and $R_{17}$ each independently represent hydrogen, deuterium, a halogen, a cyano group, a carboxyl group, a nitro group, a hydroxyl group, a substituted or unsubstituted (C1-C30)alkyl group, a substituted or unsubstituted (C3-C30)cycloalkyl group, a substituted or unsubstituted (C3-C30)cycloalkenyl group, a substituted or unsubstituted 3- to 7-membered heterocycloalkyl group, a substituted or unsubstituted (C6-C60)aryl group, or a substituted or unsubstituted 3- to 30-membered heteroaryl group; and $R_{15}$ represents hydrogen, deuterium, a halogen, a cyano group, a carboxyl group, a nitro group, a hydroxyl group, a substituted or unsubstituted (C1-C30)alkyl group, a substituted or unsubstituted (C3-C30)cycloalkyl group, a substituted or unsubstituted (C3-C30) cycloalkenyl group, a substituted or unsubstituted 3- to 7-membered heterocycloalkyl group, a substituted or unsubstituted (C6-C60)aryl group, or a substituted or unsubstituted 3- to 30-membered heteroaryl group; preferably, a substituted or unsubstituted (C6-C30)aryl group; and more preferably, a substituted or unsubstituted phenyl group, an unsubstituted biphenyl group, an unsubstituted naphthyl group, or a substituted fluorenyl group.

In formula 2, La represents a single bond, or a substituted or unsubstituted (C6-C30)arylene group; preferably, a single bond, or a substituted or unsubstituted (C6-C12)arylene group; and more preferably, a single bond, a (C6-C12) arylene group which is unsubstituted or substituted with a tri(C6-C10)arylsilyl group or a (C6-C12)aryl group.

Furthermore, La represents a single bond, or is represented by one selected from the following formulas 10 to 19:

(10)

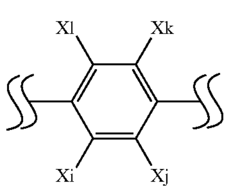

-continued (11)

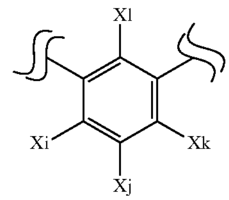

(12)

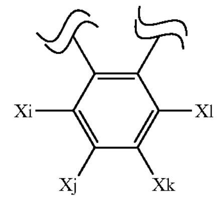

(13)

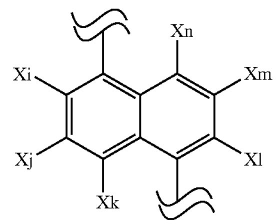

(14)

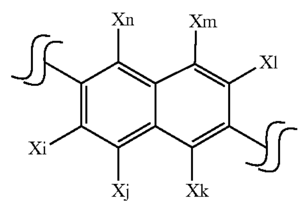

(15)

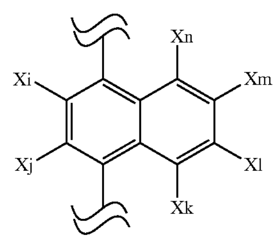

(16)

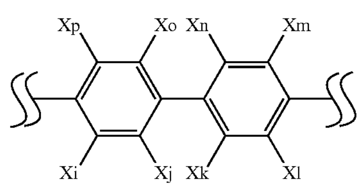

(17)

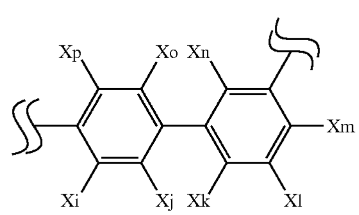

-continued (18)

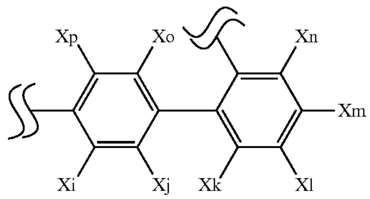

(19)

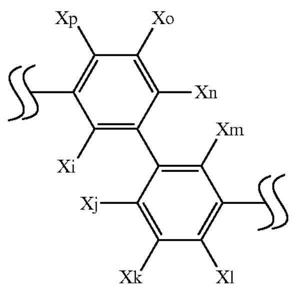

wherein

Xi to Xp each independently represent hydrogen, deuterium, a halogen, a cyano group, a substituted or unsubstituted (C1-C30)alkyl group, a substituted or unsubstituted (C2-C30)alkenyl group, a substituted or unsubstituted (C2-C30)alkynyl group, a substituted or unsubstituted (C3-C30)cycloalkyl group, a substituted or unsubstituted (C6-C60)aryl group, a substituted or unsubstituted 3- to 30-membered heteroaryl group, a substituted or unsubstituted tri(C1-C30)alkylsilyl group, a substituted or unsubstituted tri(C6-C30)arylsilyl group, a substituted or unsubstituted di(C1-C30)alkyl(C6-C30)arylsilyl group, or a substituted or unsubstituted mono- or di-(C6-C30)arylamino group; or are linked between adjacent substituents to form a substituted or unsubstituted mono- or polycyclic, (C3-C30) alicyclic or aromatic ring whose carbon atom(s) ring may be replaced with at least one hetero atom selected from nitrogen, oxygen and sulfur; preferably, hydrogen, a cyano group, a substituted or unsubstituted (C6-C15)aryl group, a substituted or unsubstituted 10- to 20-membered heteroaryl group, or a substituted or unsubstituted tri(C6-C10)arylsilyl group; more preferably, hydrogen, a cyano group, a (C6-C15)aryl group which is unsubstituted or substituted with a tri(C6-C10)arylsilyl group, or a 10- to 20-membered heteroaryl group which is unsubstituted or substituted with a (C6-C15)aryl group.

In formula 2, Ma represents a substituted or unsubstituted nitrogen-containing 5- to 11-membered heteroaryl group; preferably, a substituted or unsubstituted nitrogen-containing 6- to 10-membered heteroaryl group; and more preferably, a nitrogen-containing 6- to 10-membered heteroaryl group which is substituted with a substituents(s) selected from the group consisting of an unsubstituted (C6-C18)aryl group, a (C6-C12)aryl group substituted with a cyano group, a (C6-C12)aryl group substituted with a (C1-C6)alkyl group, a (C6-C12)aryl group substituted with a tri(C6-C12)arylsilyl group, and a 6- to 15-membered heteroaryl group.

Furthermore, Ma represents a monocyclic-based heteroaryl group selected from the group consisting of pyrrolyl, imidazolyl, pyrazolyl, triazinyl, tetrazinyl, triazolyl, tetrazolyl, pyridyl, pyrazinyl, pyrimidinyl, pyridazinyl, etc., or a fused ring-based heteroaryl group selected from the group consisting of benzoimidazolyl, isoindolyl, indolyl, indazolyl, benzothiadiazolyl, quinolyl, isoquinolyl, cinnolinyl, quinazolinyl, naphthyridinyl, quinoxalinyl, carbazolyl, phenanthridinyl, etc.; preferably, triazinyl, pyrimidinyl, pyridyl, quinolyl, isoquinolyl, quinazolinyl, naphthyridinyl, or quinoxalinyl.

Herein, "(C1-C30)alkyl(ene)" is meant to be a linear or branched alkyl(ene) having 1 to 30 carbon atoms, in which the number of carbon atoms is preferably 1 to 20, more preferably 1 to 10, and includes methyl, ethyl, n-propyl, isopropyl, n-butyl, isobutyl, tert-butyl, etc. "(C2-C30)alkenyl" is meant to be a linear or branched alkenyl having 2 to 30 carbon atoms, in which the number of carbon atoms is preferably 2 to 20, more preferably 2 to 10, and includes vinyl, 1-propenyl, 2-propenyl, 1-butenyl, 2-butenyl, 3-butenyl, 2-methylbut-2-enyl, etc. "(C2-C30)alkynyl" is a linear or branched alkynyl having 2 to 30 carbon atoms, in which the number of carbon atoms is preferably 2 to 20, more preferably 2 to 10, and includes ethynyl, 1-propynyl, 2-propynyl, 1-butynyl, 2-butynyl, 3-butynyl, 1-methylpent-2-ynyl, etc. "(C3-C30)cycloalkyl" is a mono- or polycyclic hydrocarbon having 3 to 30 carbon atoms, in which the number of carbon atoms is preferably 3 to 20, more preferably 3 to 7, and includes cyclopropyl, cyclobutyl, cyclopentyl, cyclohexyl, etc. "3- to 7-membered heterocycloalkyl" is a cycloalkyl having at least one heteroatom selected from the group consisting of B, N, O, S, P(=O), Si and P, preferably O, S and N, and 3 to 7, preferably 5 to 7 ring backbone atoms, and includes tetrahydrofuran, pyrrolidine, thiolan, tetrahydropyran, etc. "(C6-C30)aryl(ene)" is a monocyclic or fused ring derived from an aromatic hydrocarbon having 6 to 30 carbon atoms, in which the number of carbon atoms is preferably 6 to 20, more preferably 6 to 15, and includes phenyl, biphenyl, terphenyl, naphthyl, fluorenyl, phenanthrenyl, anthracenyl, indenyl, triphenylenyl, pyrenyl, tetracenyl, perylenyl, chrysenyl, naphthacenyl, fluoranthenyl, etc. "3- to 30-membered heteroaryl(ene)" is an aryl group having at least one, preferably 1 to 4 heteroatom selected from the group consisting of B, N, O, S, P(=O), Si and P, and 3 to 30 ring backbone atoms; is a monocyclic ring, or a fused ring condensed with at least one benzene ring; has preferably 3 to 20, more preferably 3 to 15 ring backbone atoms; may be partially saturated; may be one formed by linking at least one heteroaryl or aryl group to a heteroaryl group via a single bond(s); and includes a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, benzoimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, quinoxalinyl, carbazolyl, phenoxazinyl, phenanthridinyl, benzodioxolyl, etc. "Nitrogen-containing 5- to 30-membered heteroaryl(ene) group" is an aryl(ene) group having at least one heteroatom N and 5 to 30 ring backbone atoms. 5 to 20 ring backbone atoms and 1 to 4 heteroatom are preferable, and 5 to 15 ring backbone atoms are more preferable. It is a monocyclic ring, or a fused ring condensed with at least one benzene ring; may be partially saturated; may be one formed by linking at least one heteroaryl or aryl group to a heteroaryl group via a single bond(s); and includes a monocyclic ring-type heteroaryl including pyrrolyl, imidazolyl, pyrazolyl, triazinyl, tetrazinyl, triazolyl, tetrazolyl, pyridyl, pyrazinyl, pyrimidinyl, pyridazinyl, etc., and a fused ring-type heteroaryl including benzoimidazolyl, isoindolyl, indolyl, indazolyl, benzothiadiazolyl, quinolyl, isoquinolyl, cinnolinyl, quinazolinyl, quinoxalinyl, carbazolyl, phenanthridinyl, etc. "Halogen" includes F, Cl, Br and I.

Herein, "substituted" in the expression "substituted or unsubstituted" means that a hydrogen atom in a certain functional group is replaced with another atom or group, i.e., a substituent. Substituents of the substituted alkyl(ene) group, the substituted alkenyl group, the substituted alkynyl group, the substituted cycloalkyl group, the substituted aryl(ene) group, the substituted heteroaryl(ene) group, the substituted trialkylsilyl group, the substituted triarylsilyl group, the substituted dialkylarylsilyl group, the substituted mono- or di-arylamino group, or the substituted mono- or polycyclic, (C3-C30) alicyclic or aromatic ring are each independently at least one selected from the group consisting of deuterium; a halogen; a cyano group; a carboxyl group; a nitro group; a hydroxyl group; a (C1-C30)alkyl group; a halo(C1-C30)alkyl group; a (C2-C30)alkenyl group; a (C2-C30)alkynyl group; a (C1-C30)alkoxy group; a (C1-C30)alkylthio group; a (C3-C30)cycloalkyl group; a (C3-C30)cycloalkenyl group; a 3- to 7-membered heterocycloalkyl group; a (C6-C30)aryloxy group; a (C6-C30)arylthio group; a 3- to 30-membered heteroaryl group which is unsubstituted or substituted with a (C6-C30)aryl group; a (C6-C30)aryl group which is unsubstituted or substituted with a cyano group, a 3- to 30-membered heteroaryl group, or a tri(C6-C30)arylsilyl group; a tri(C1-C30)alkylsilyl group; a tri(C6-C30)arylsilyl group; a di(C1-C30)alkyl(C6-C30)arylsilyl group; a (C1-C30)alkyldi(C6-C30)arylsilyl group; an amino group; a mono- or di(C1-C30)alkylamino group; a mono- or di(C6-C30)arylamino group; a (C1-C30) alkyl(C6-C30)arylamino group; a (C1-C30)alkylcarbonyl group; a (C1-C30)alkoxycarbonyl group; a (C6-C30)arylcarbonyl group; a di(C6-C30)arylboronyl group; a di(C1-C30)alkylboronyl group; a (C1-C30)alkyl(C6-C30)arylboronyl group; a (C6-C30)aryl(C1-C30)alkyl group; and a (C1-C30)alkyl(C6-C30)aryl group. Preferably, the substituents are each independently at least one selected from the group consisting of a (C1-C6)alkyl group; a 5- to 15-membered heteroaryl group; a (C6-C18)aryl group which is unsubstituted or substituted with a cyano group or a tri(C6-C12)arylsilyl group; a tri(C6-C12)arylsilyl group; and a (C1-C6)alkyl(C6-C12)aryl group.

The compound of formula 1 as a first host compound may be selected from the group consisting of following compounds, but is not limited thereto:

H1-1

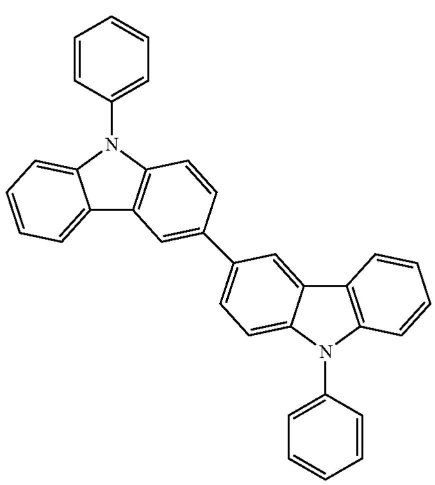

-continued

H1-2

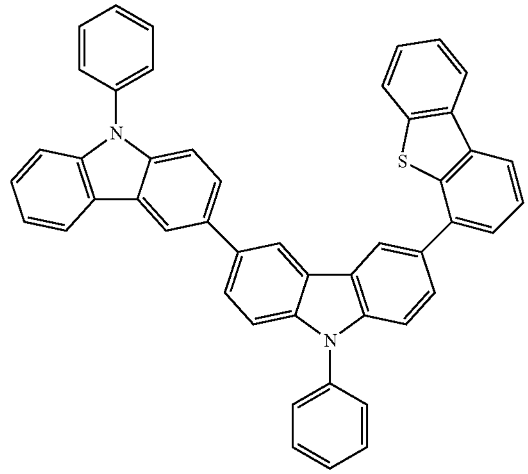

H1-3

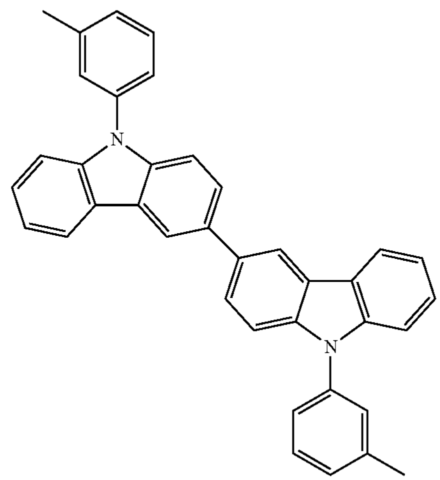

H1-4

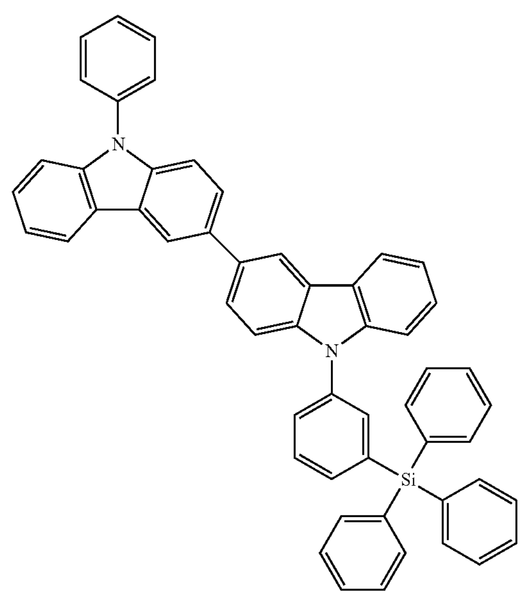

-continued
H1-5
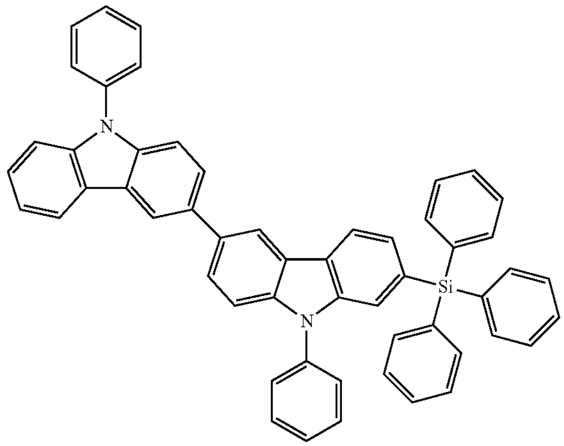
H1-6
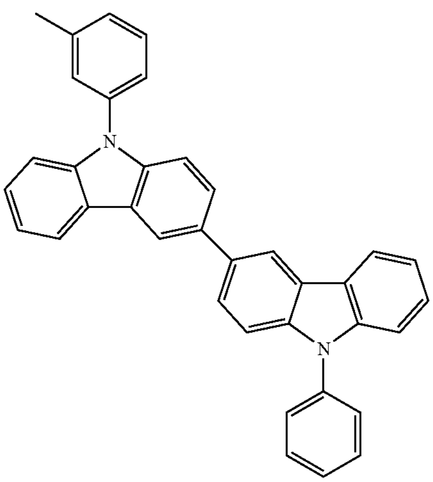
H1-7
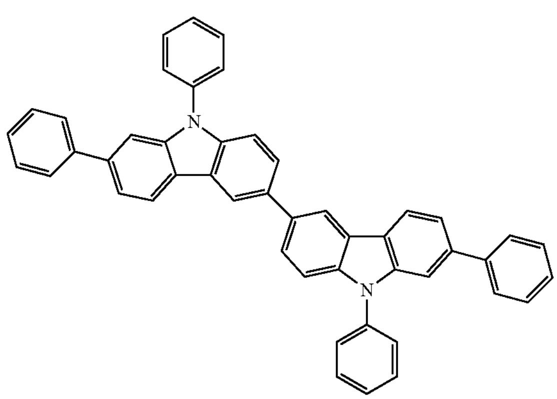
-continued
H1-8
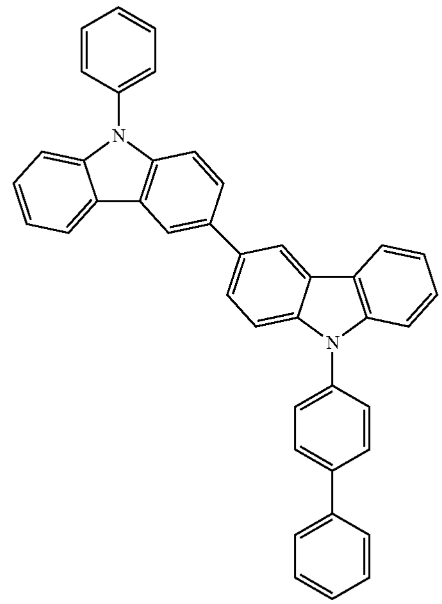
H1-9
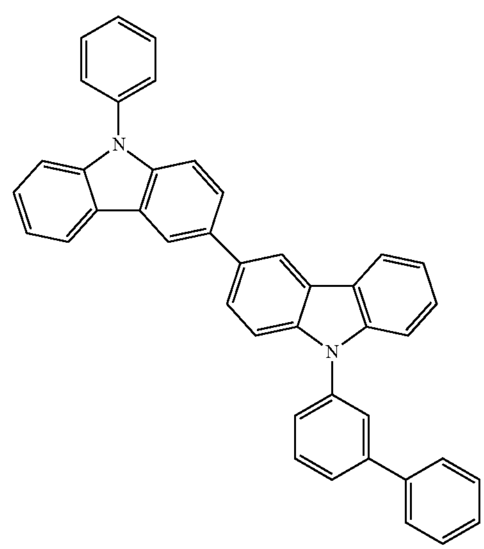

-continued
H1-10
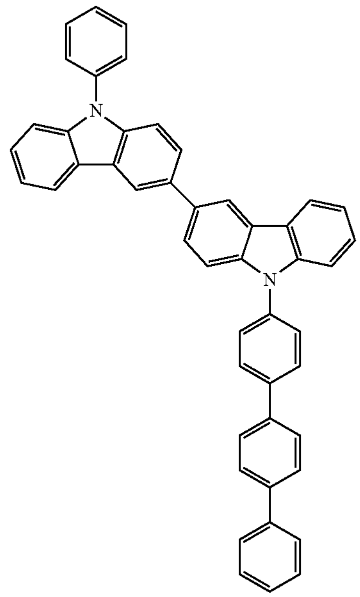
H1-17
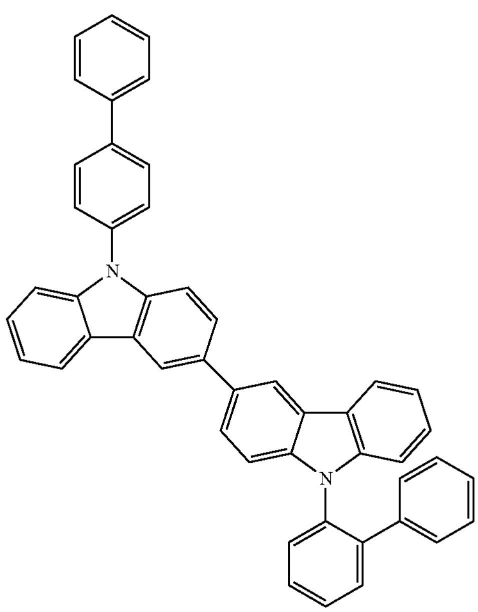
-continued
H1-18
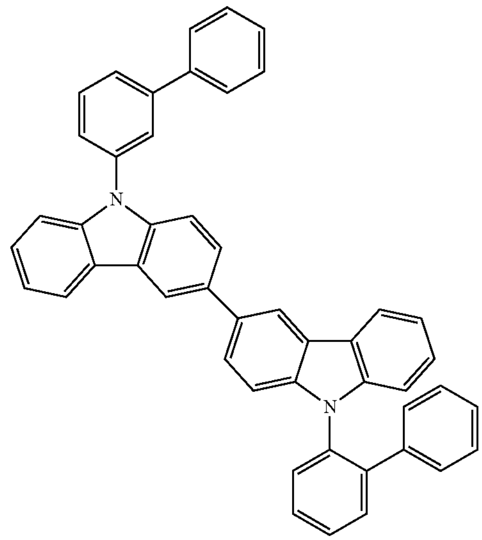
H1-19
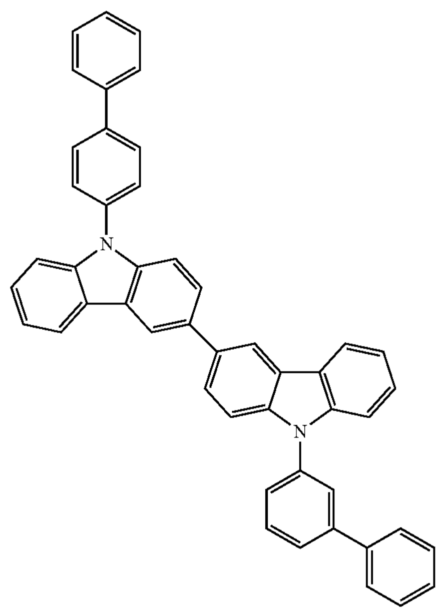
H1-20
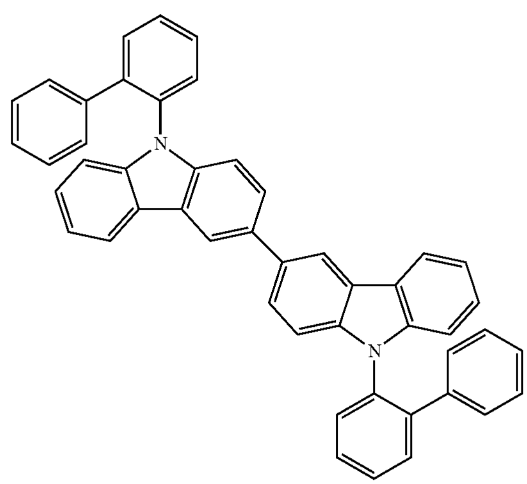

-continued
H1-21
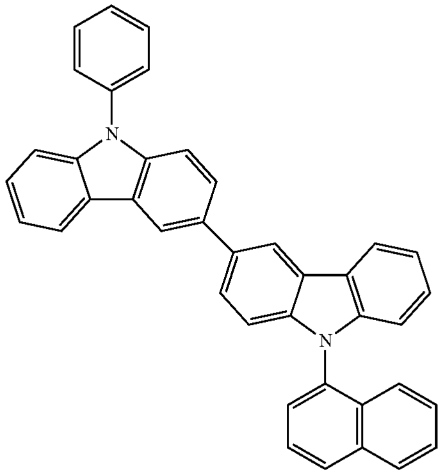
H1-22
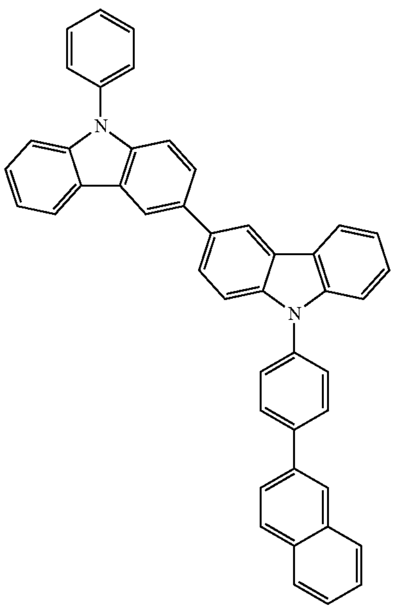
H1-23
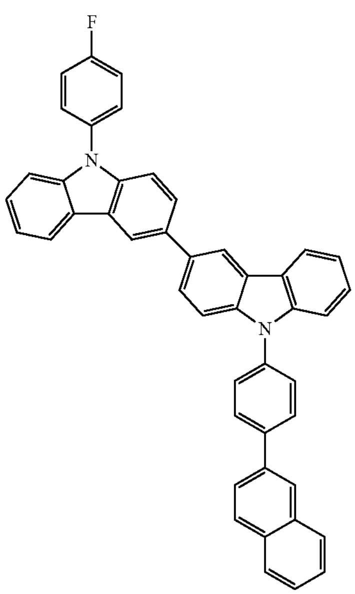
-continued
H1-24
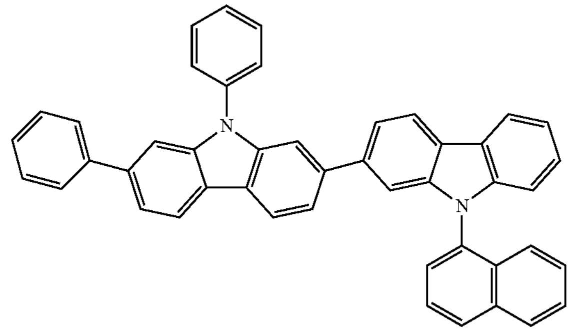
H1-25
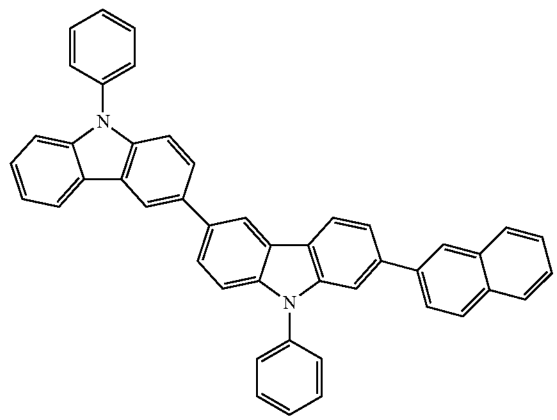
H1-26
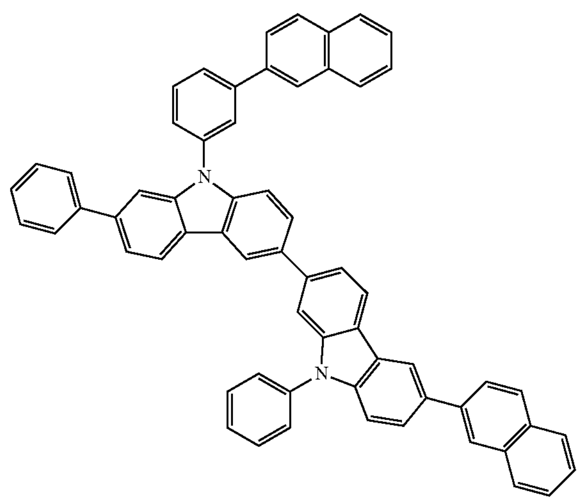

-continued
H1-27
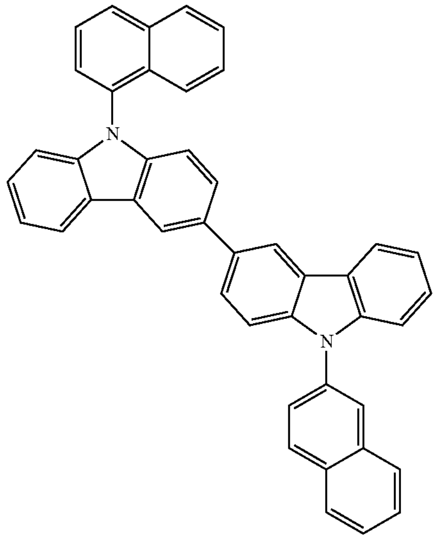
H1-28
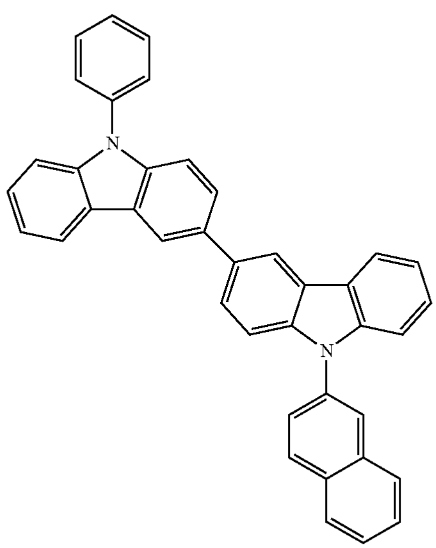
-continued
H1-29
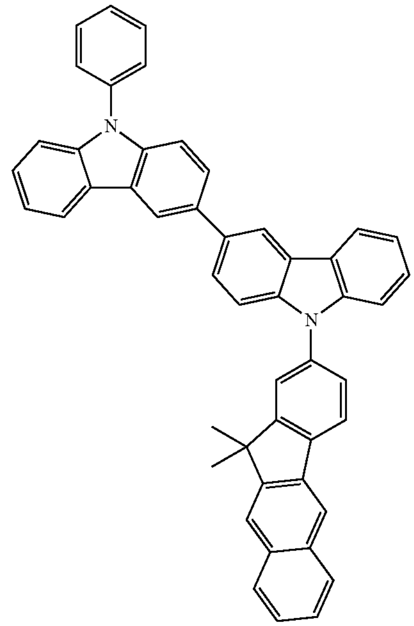
H1-30
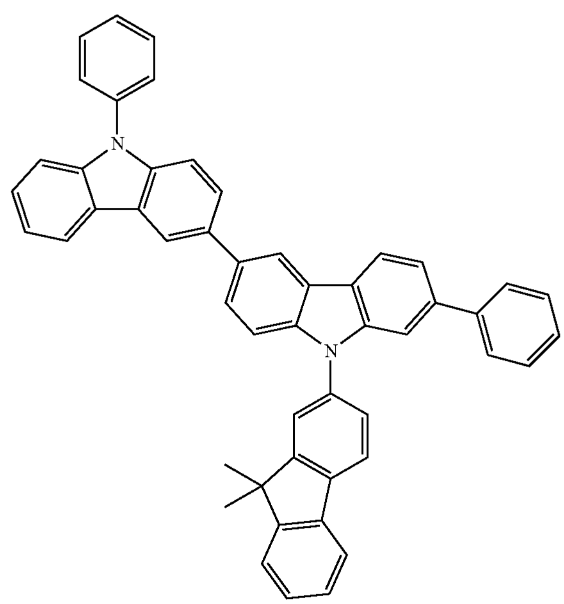

-continued
H1-31
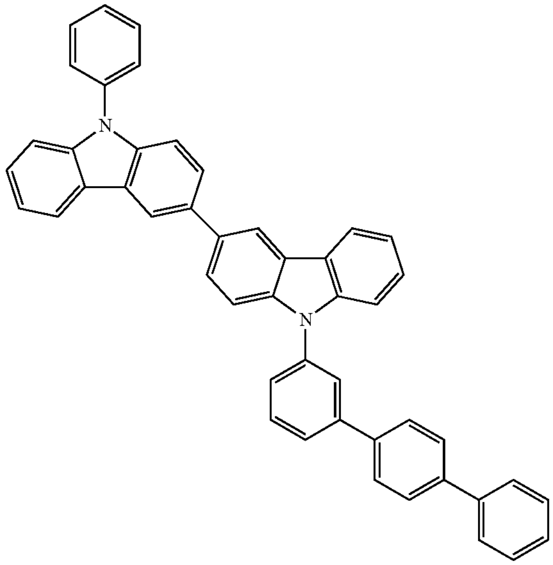
H1-32
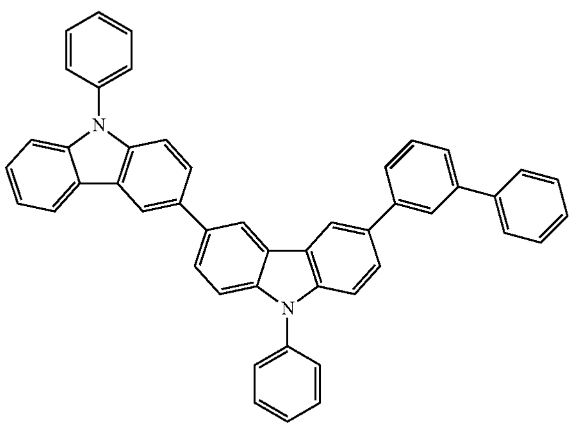
H1-33
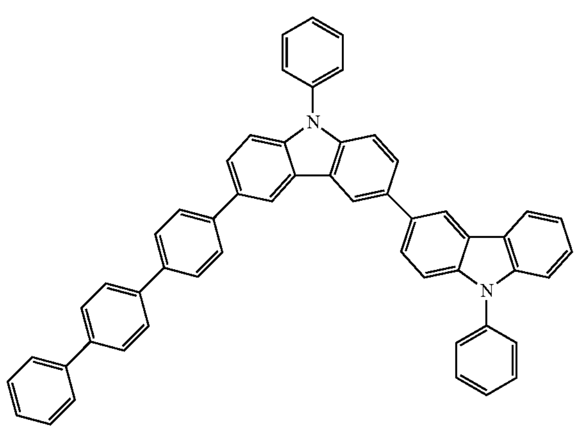
-continued
H1-34
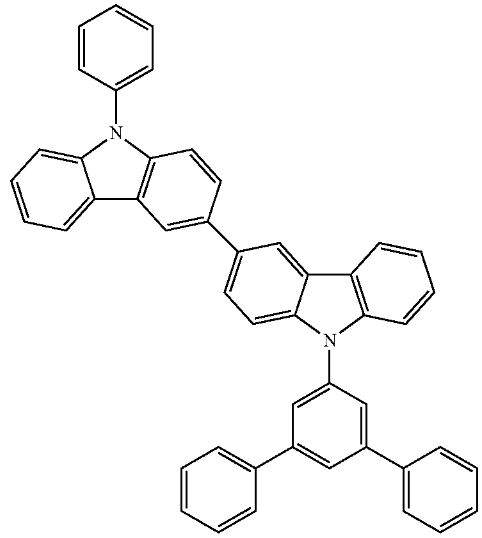
H1-35
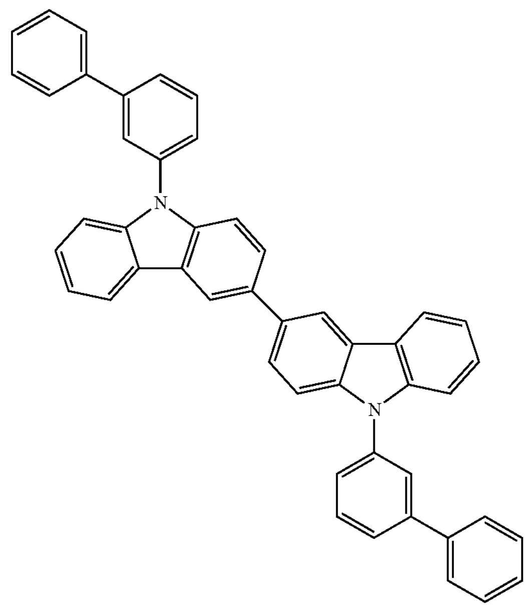
H1-36
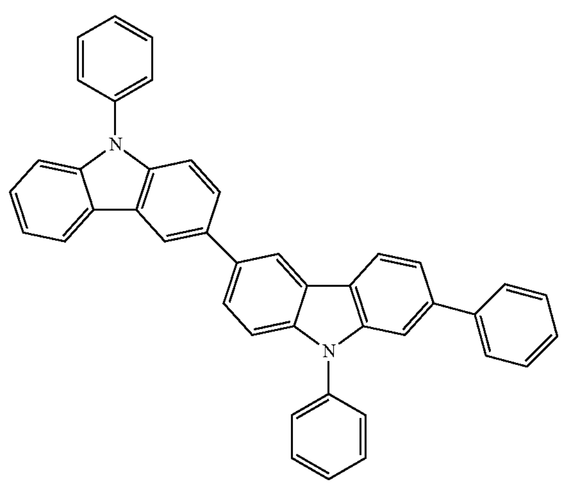

-continued
H1-37
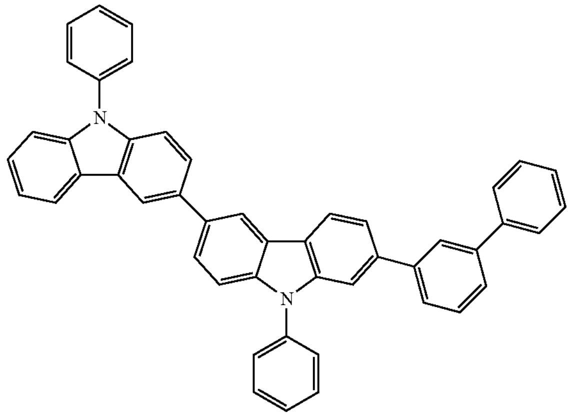
H1-38
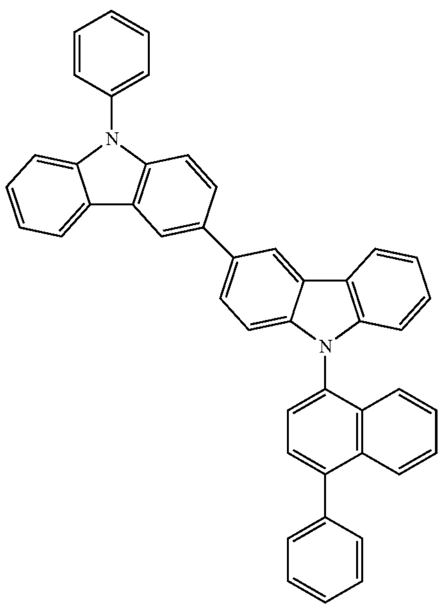
H1-39
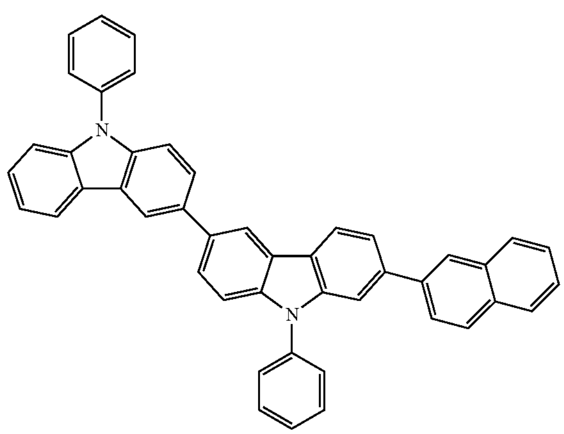
-continued
H1-40
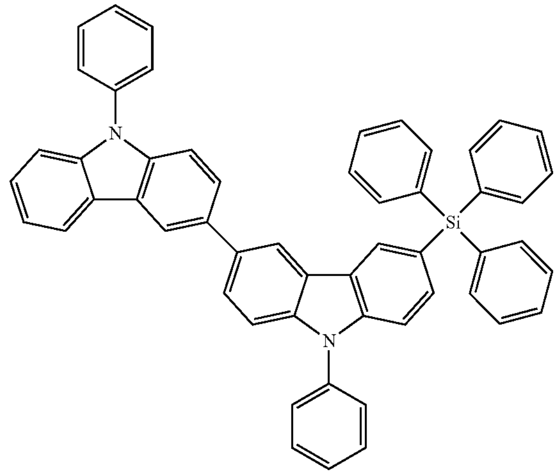
H1-41
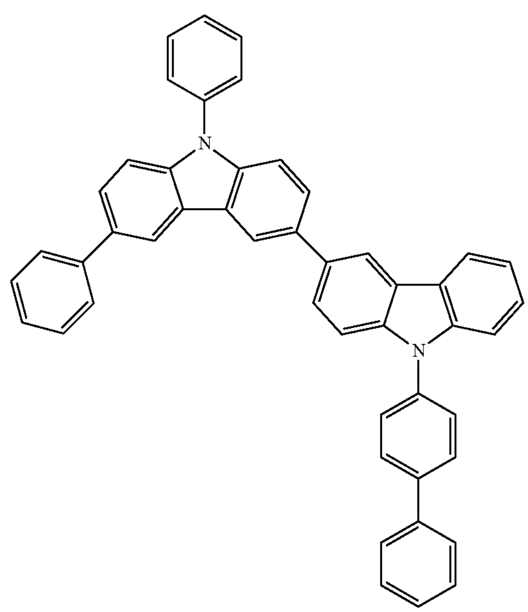

-continued
H1-42
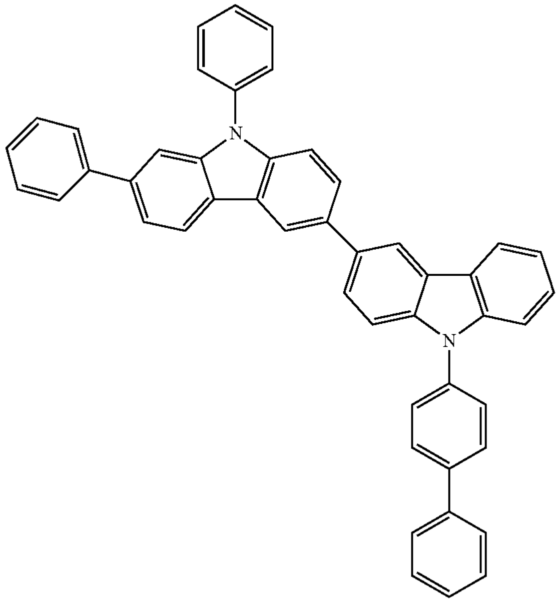
H1-43
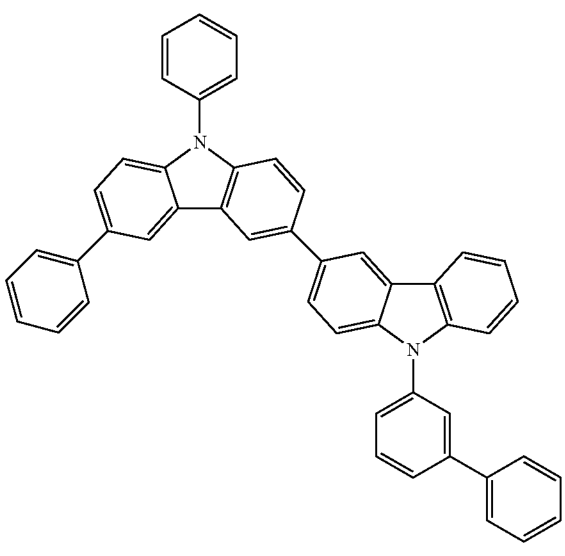
-continued
H1-44
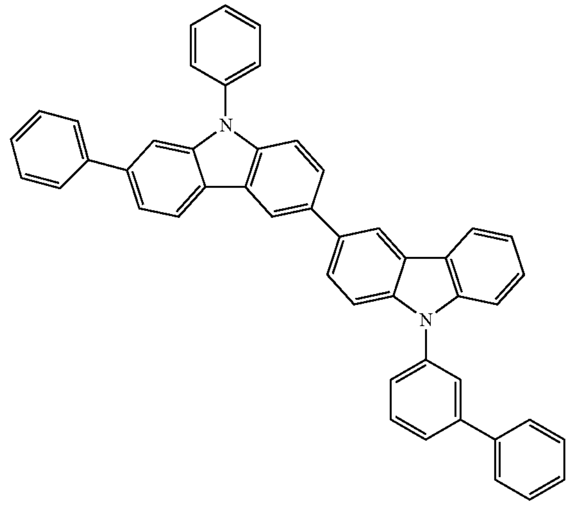
H1-45
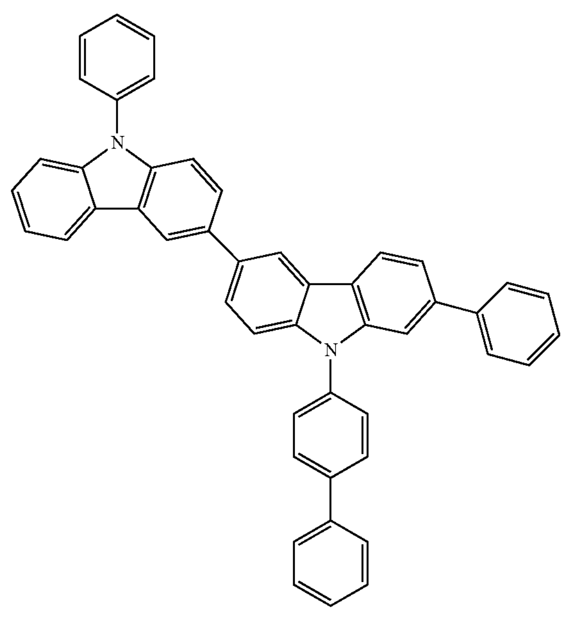

-continued
H1-46
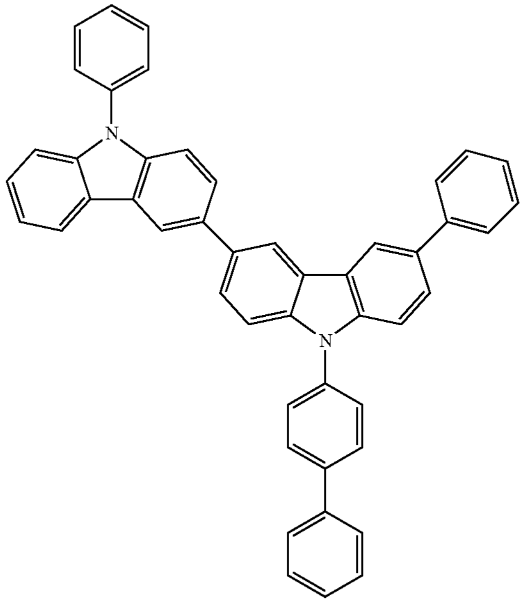
H1-47
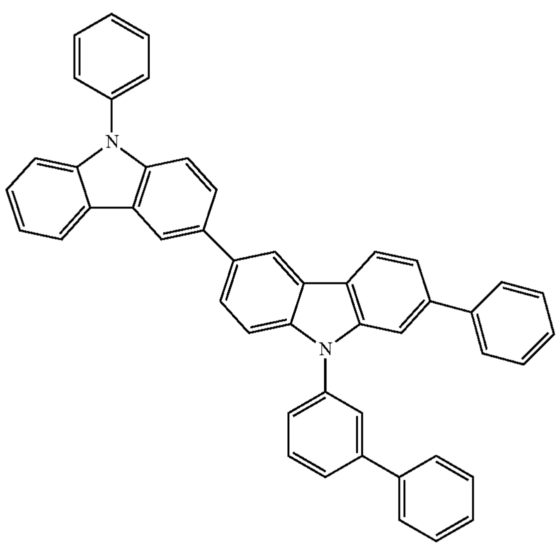
-continued
H1-48
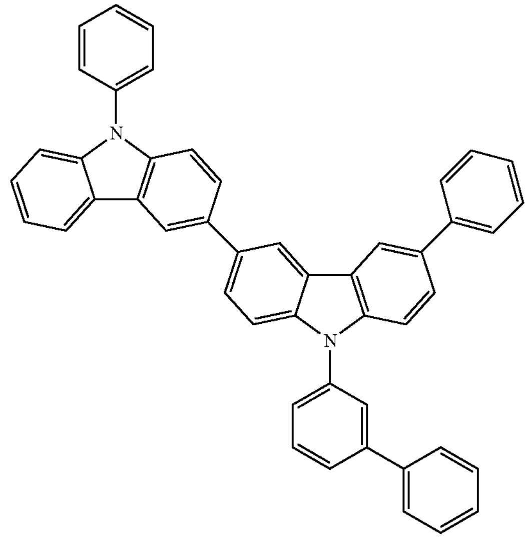
H1-49
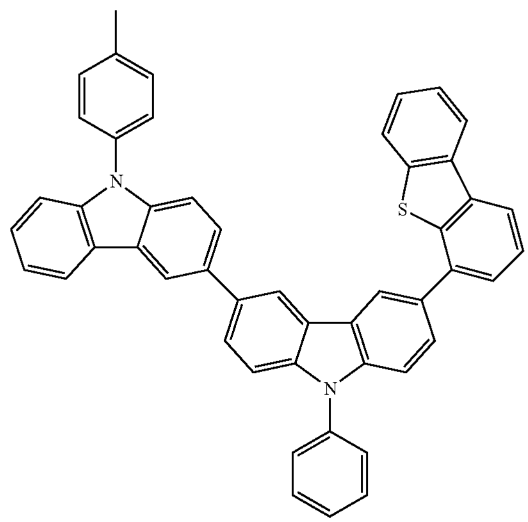
H1-50
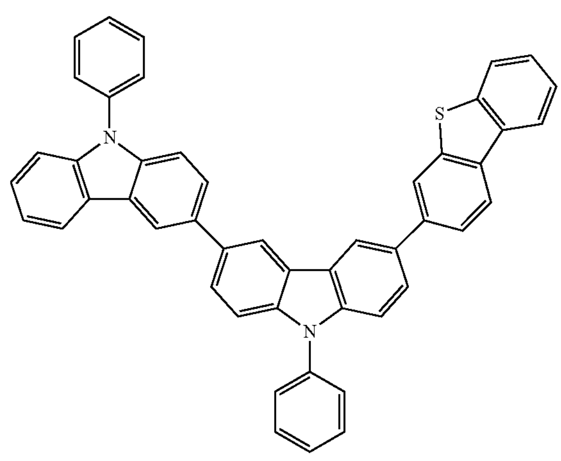

-continued
H1-51
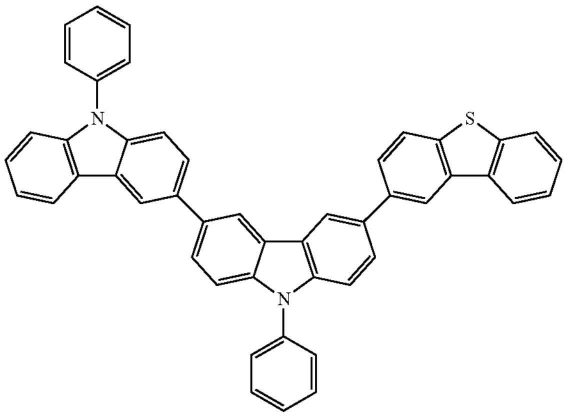
H1-52
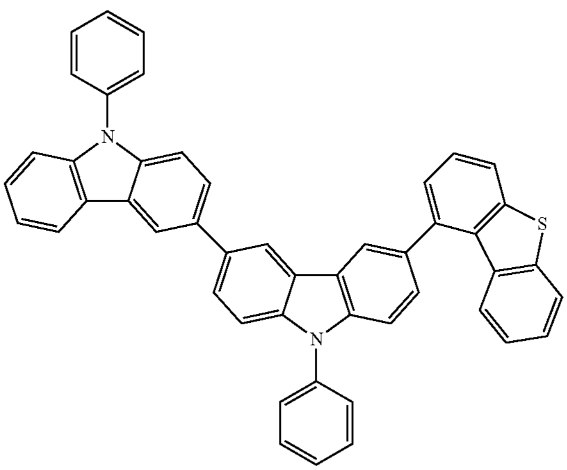
H1-53
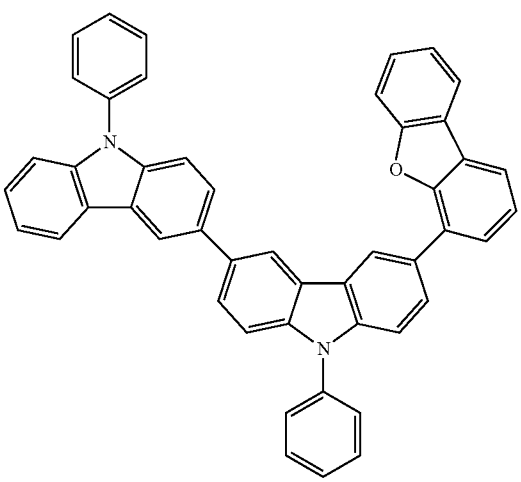
-continued
H1-54
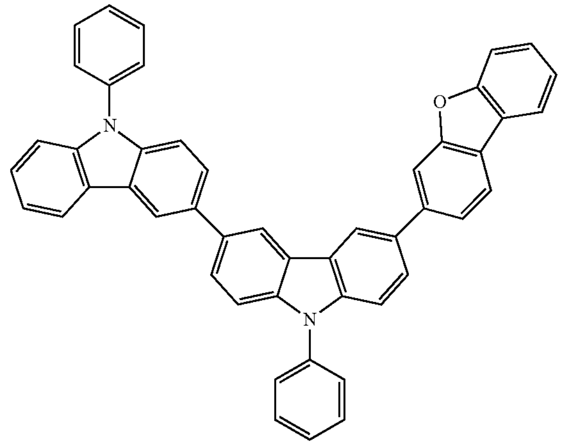
H1-55
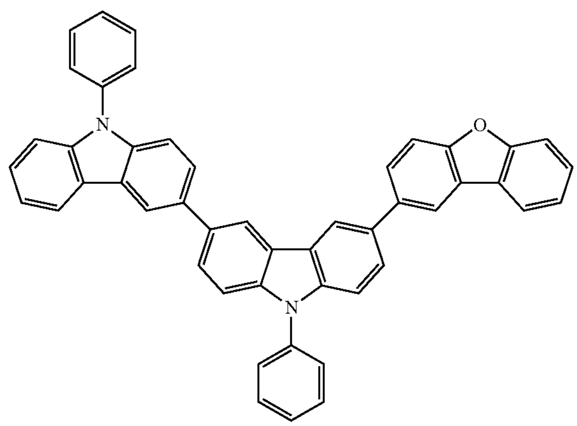
H1-56
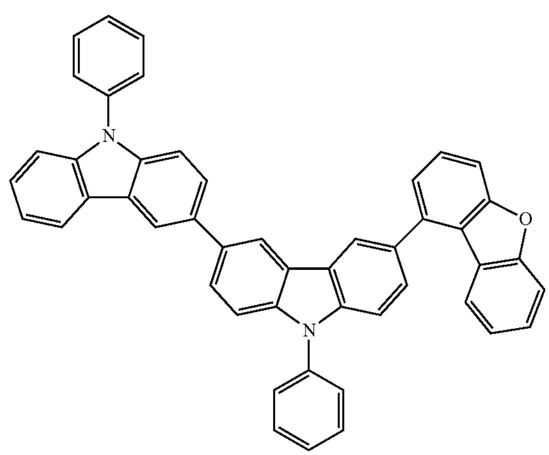

-continued
H1-57
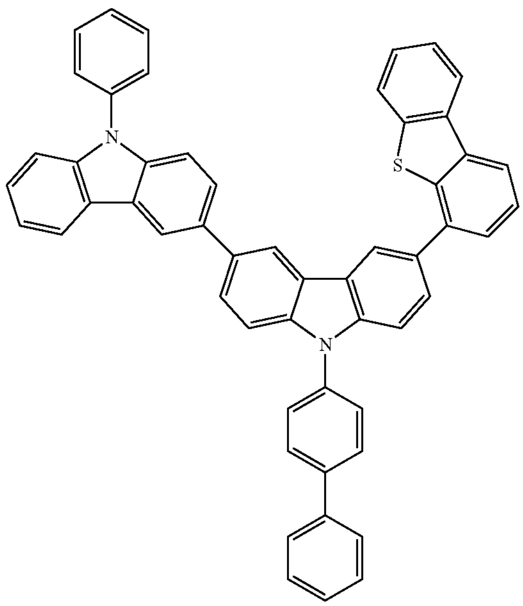
-continued
H1-59
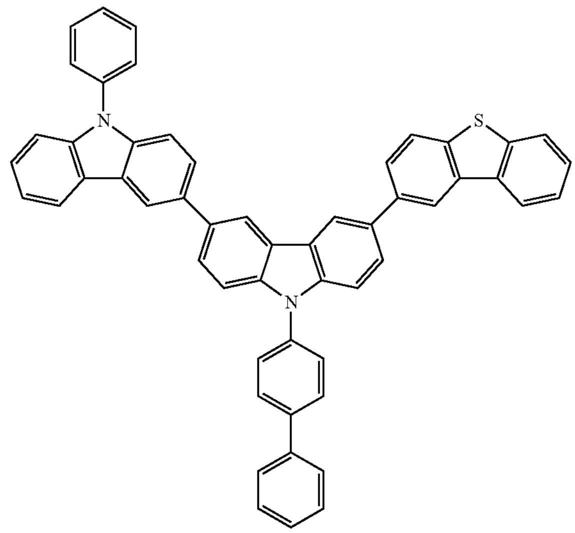
H1-58
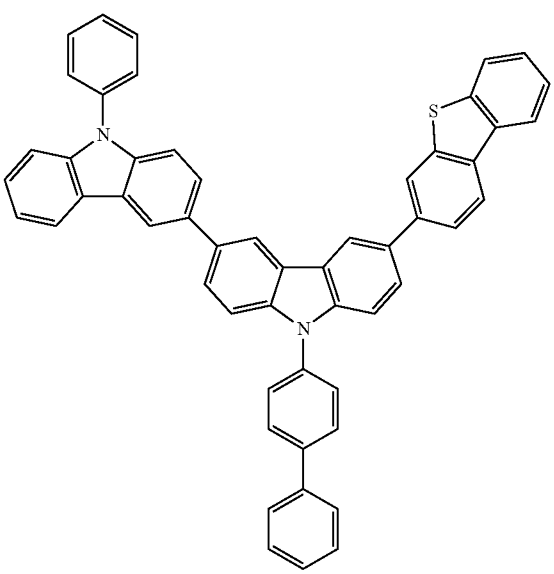
H1-60
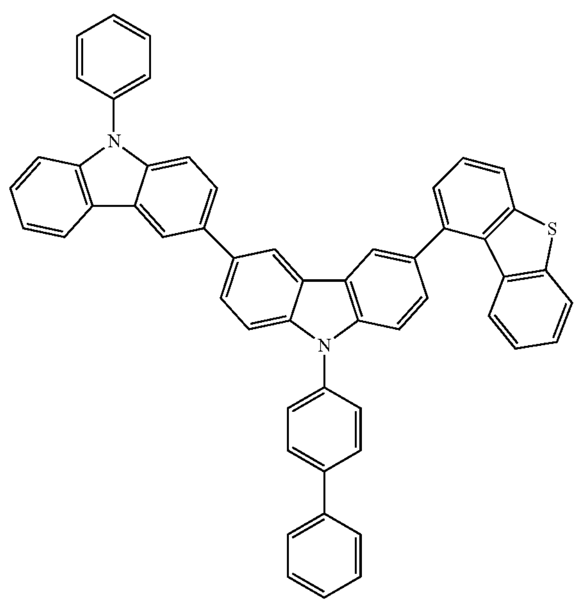

-continued
H1-61
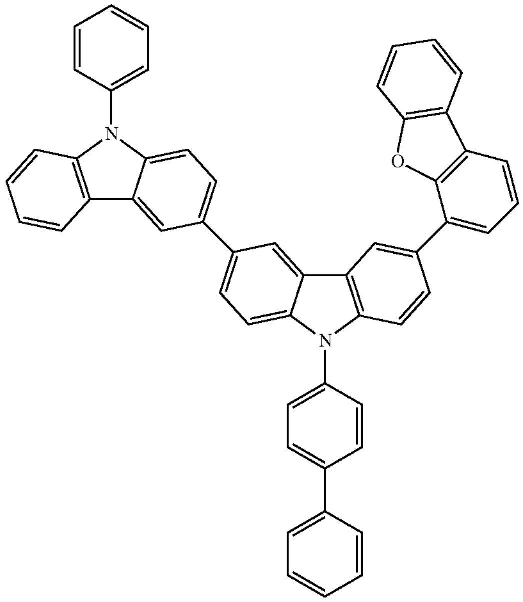
H1-62
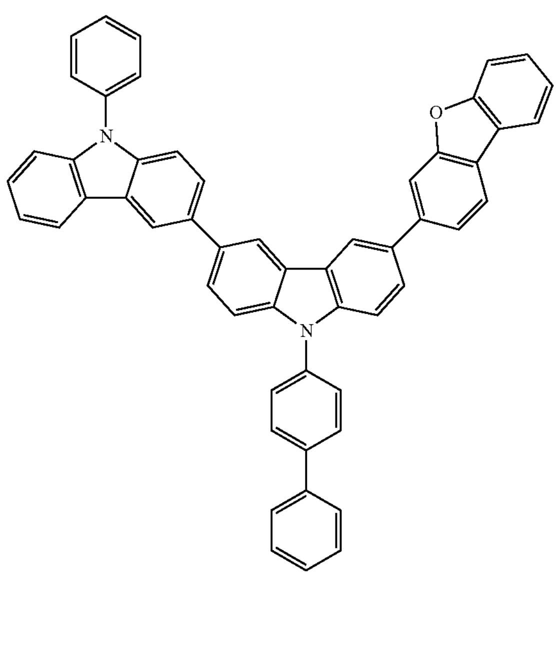
-continued
H1-63
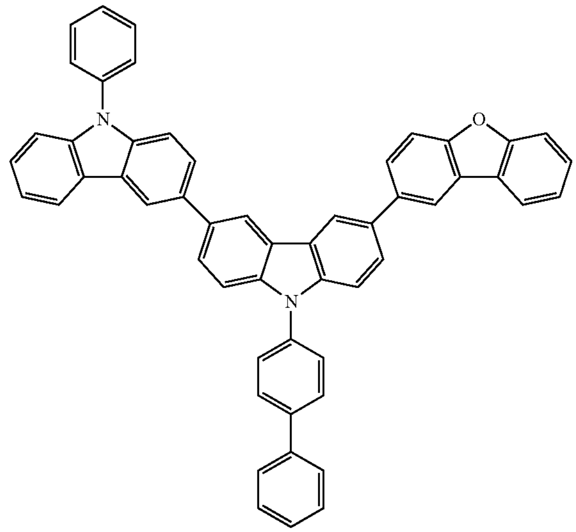
H1-64
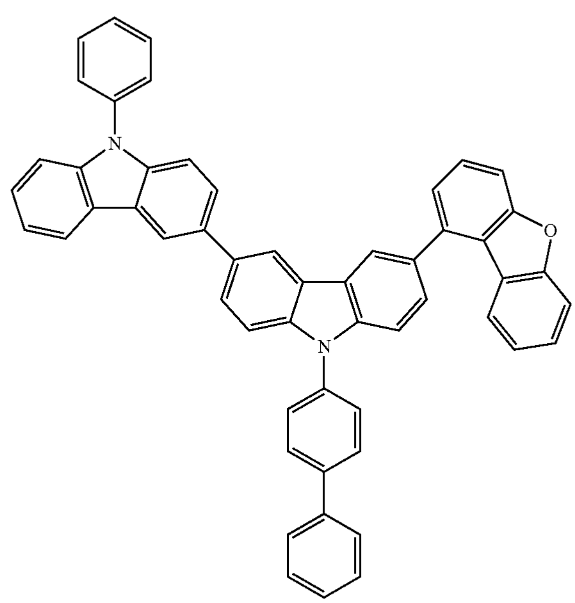

-continued
H1-65
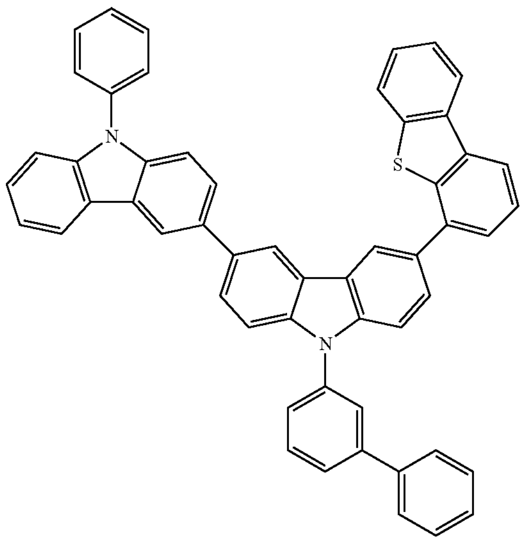
H1-66
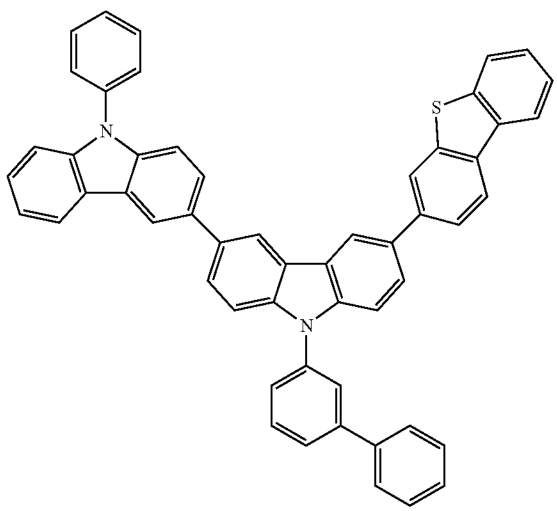
H1-67
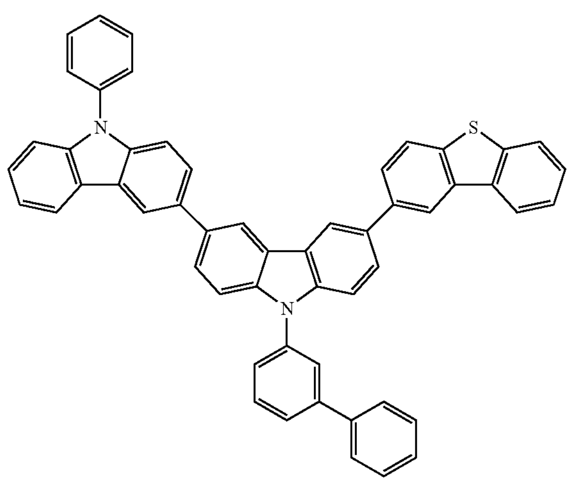
-continued
H1-68
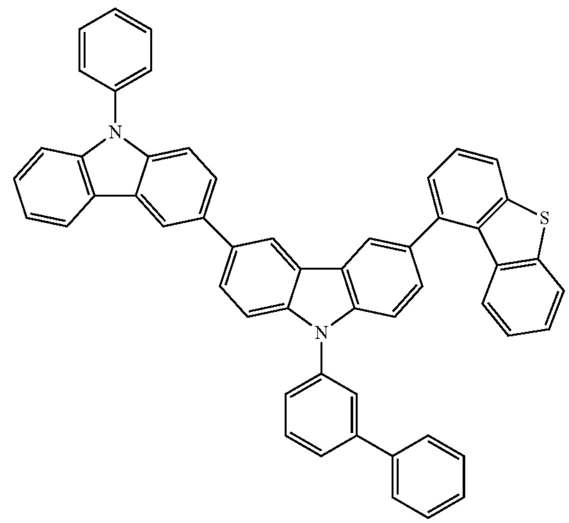
H1-69
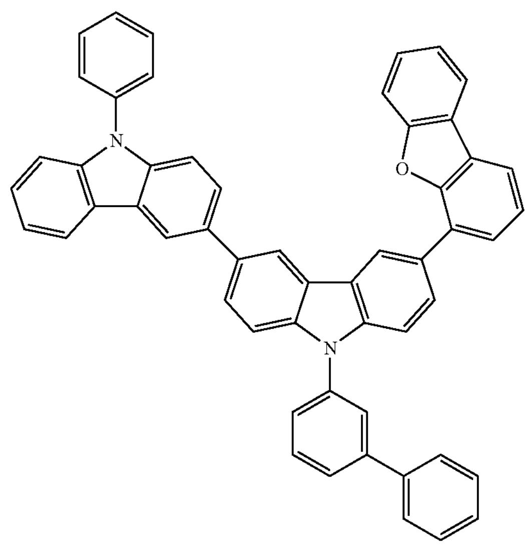
H1-70
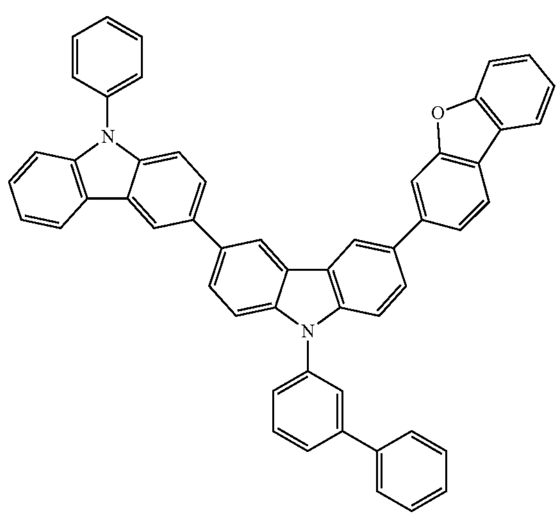

-continued
H1-71
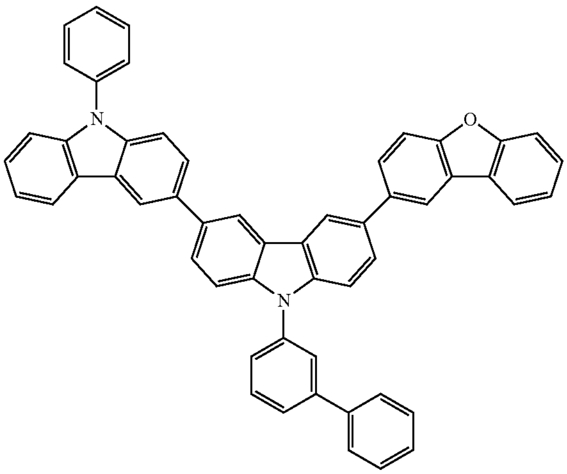
H1-72
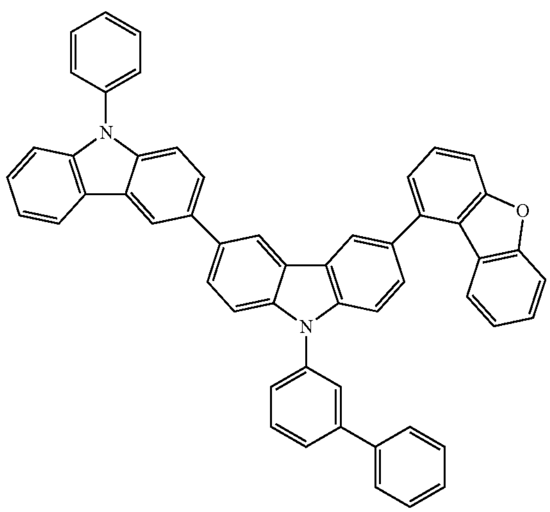
H1-73
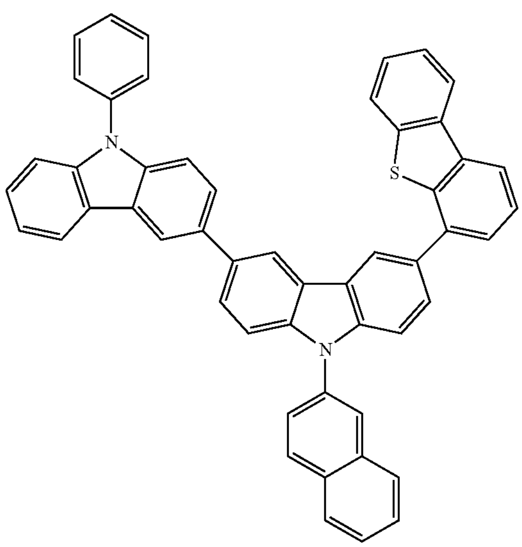
-continued
H1-74
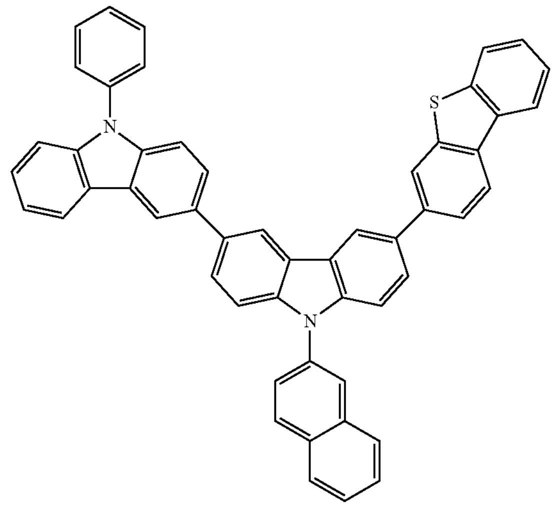
H1-75
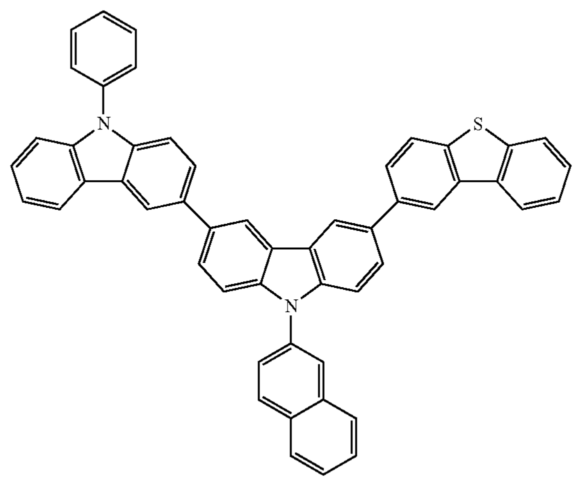
H1-76
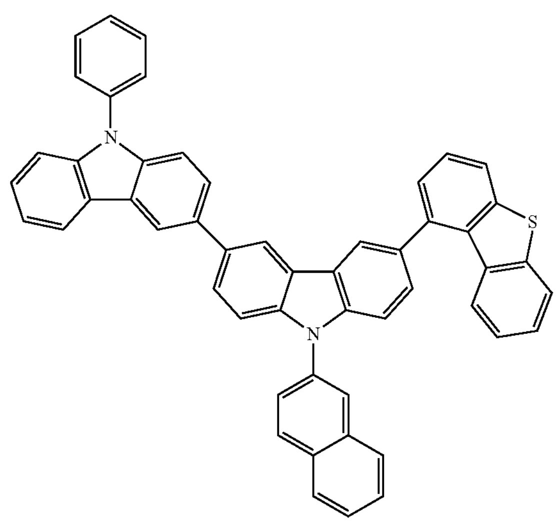

-continued
H1-77
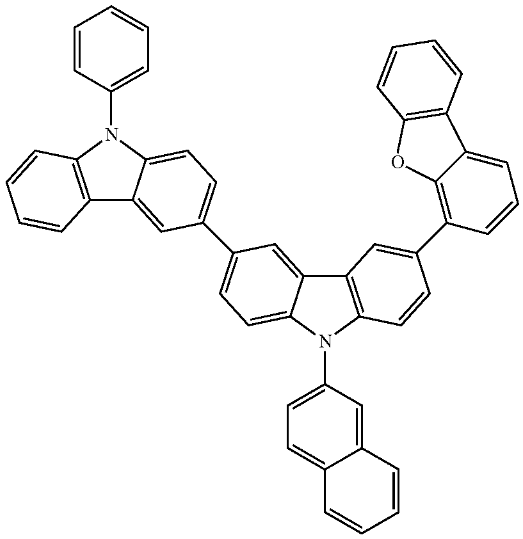
H1-78
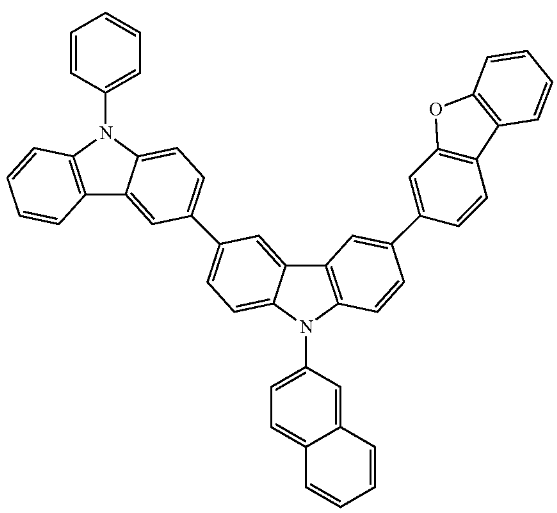
H1-79
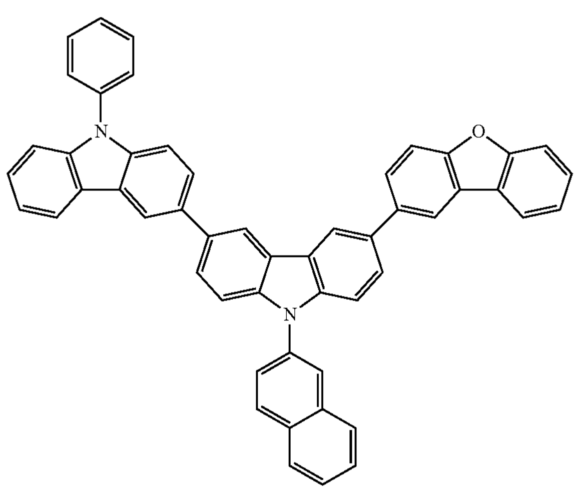
-continued
H1-80
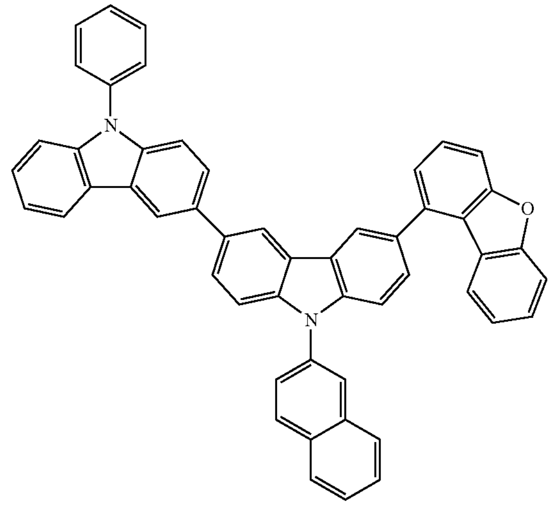
H1-81
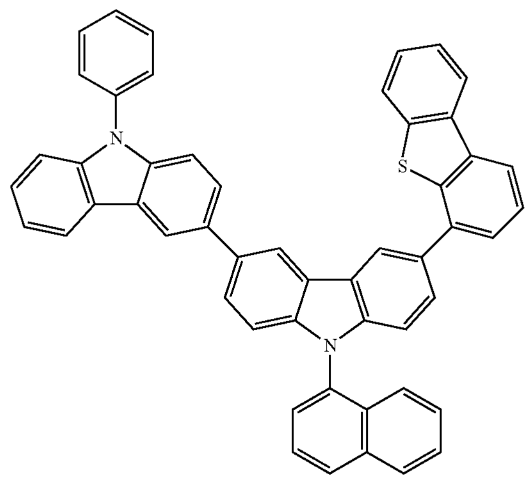
H1-82
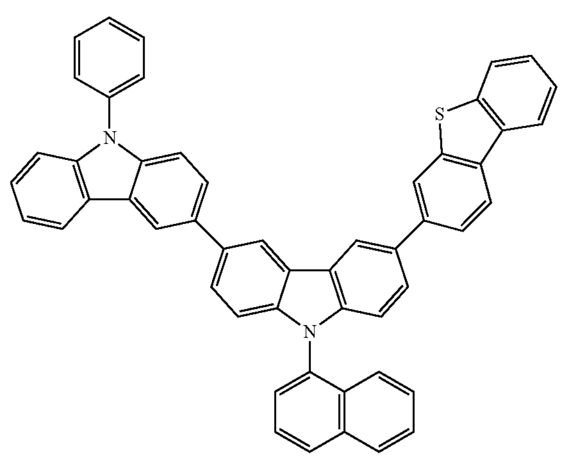

-continued
H1-83
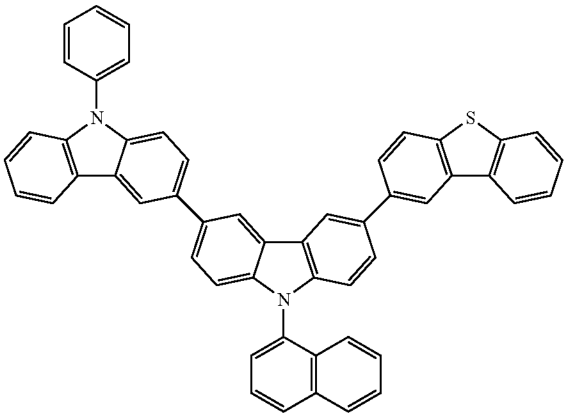
H1-84
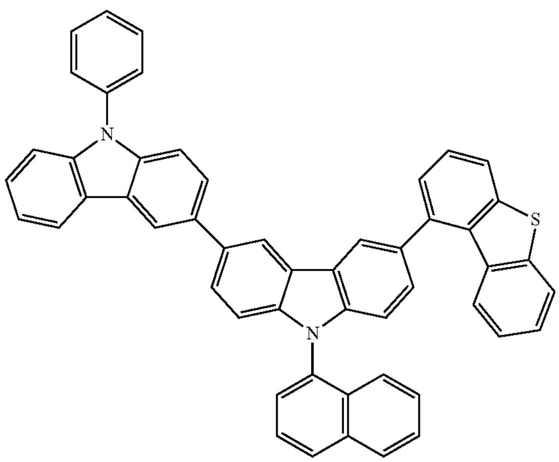
H1-85
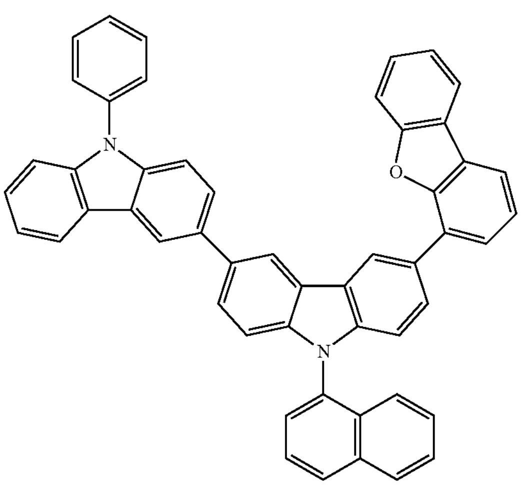
-continued
H1-86
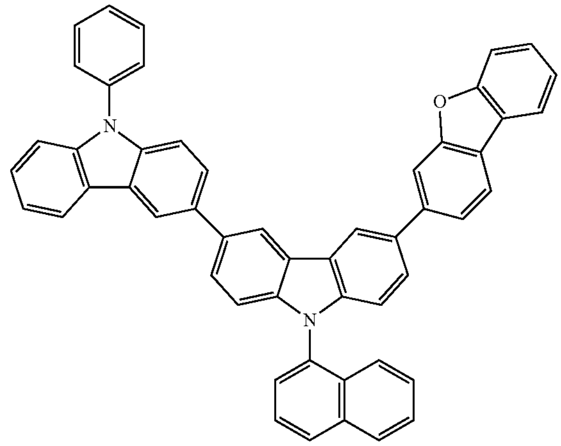
H1-87
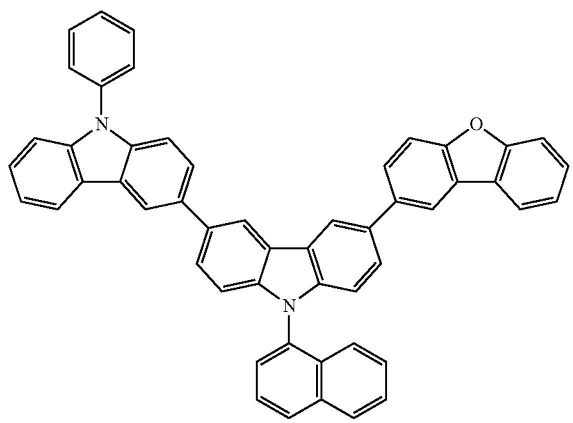
H1-88
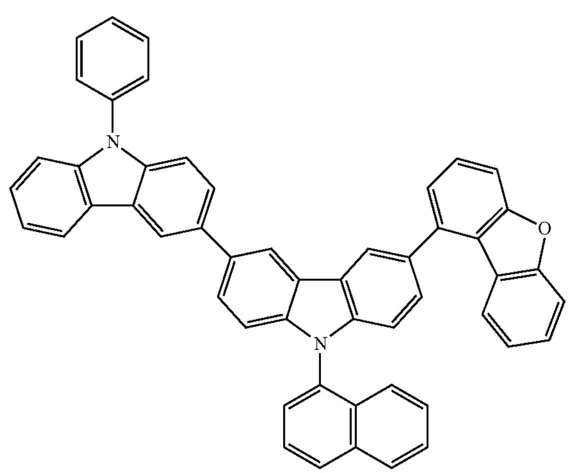

-continued
H1-89
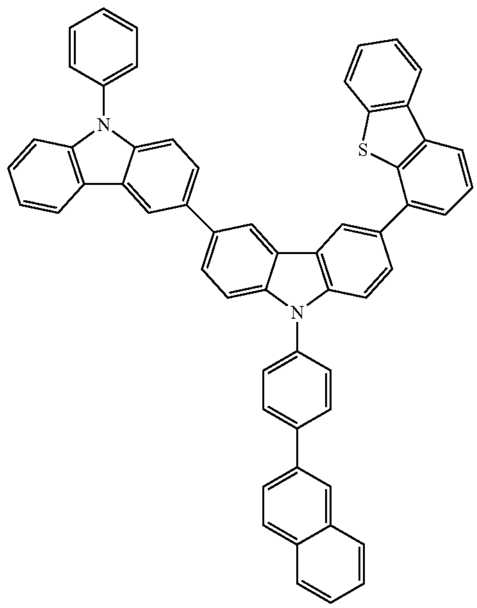
H1-90
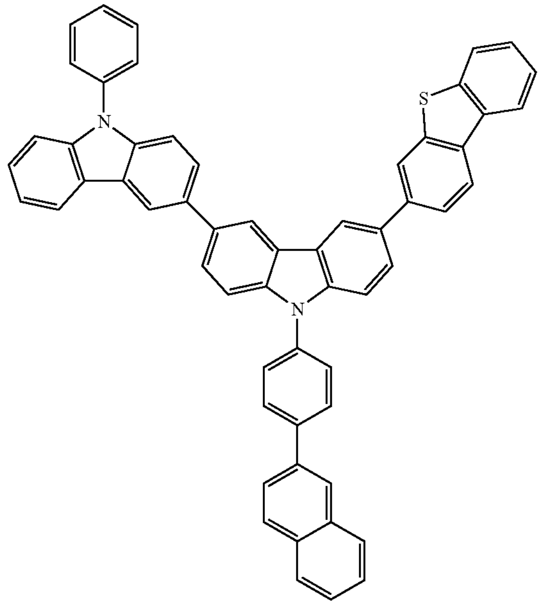
-continued
H1-91
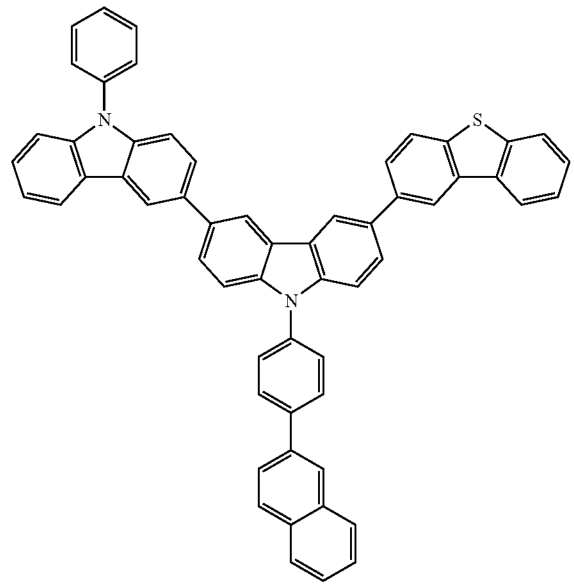
H1-92
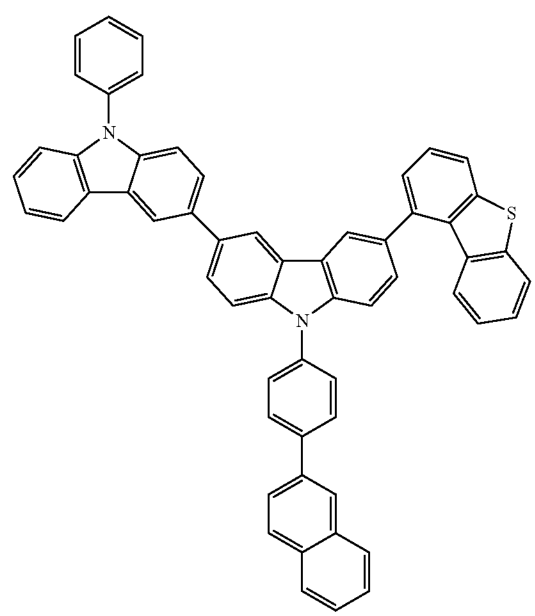

-continued
H1-93
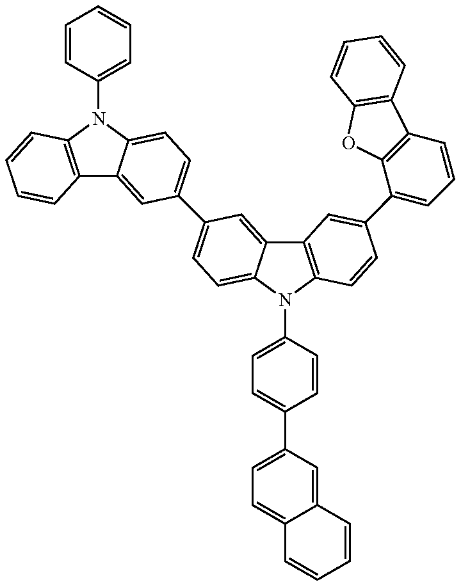
H1-94
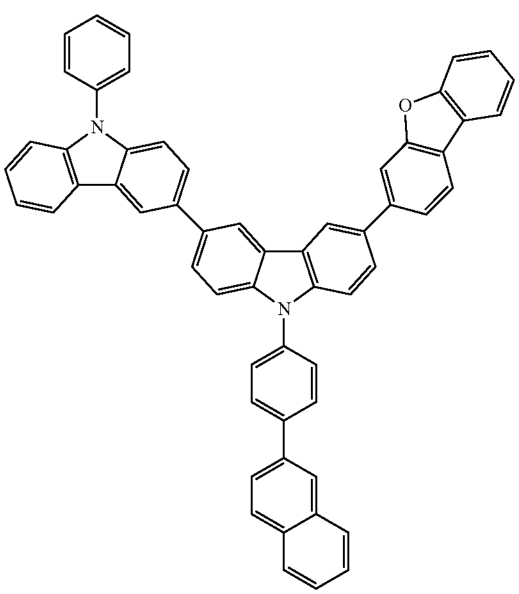
-continued
H1-95
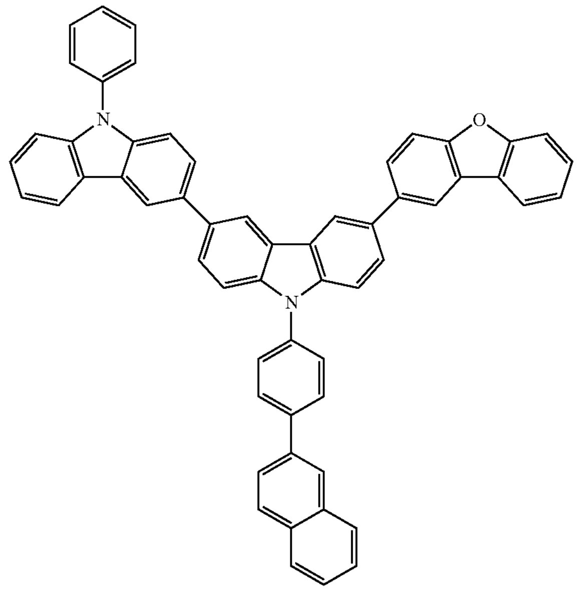
H1-96
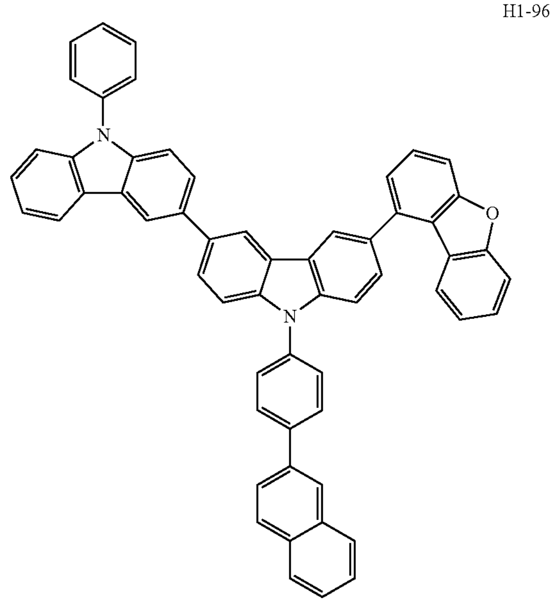

-continued
H1-97
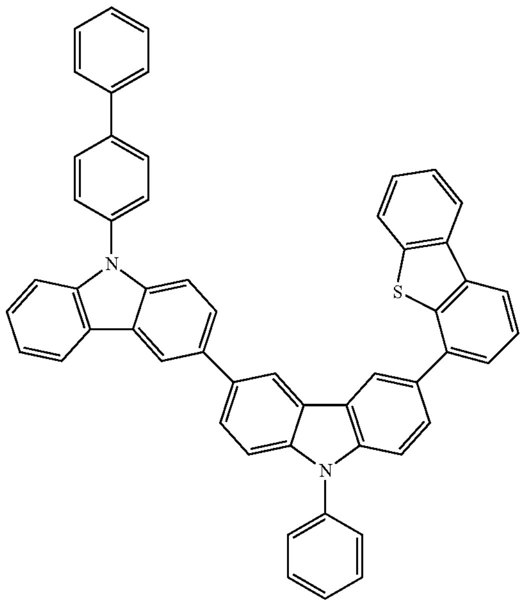
H1-98
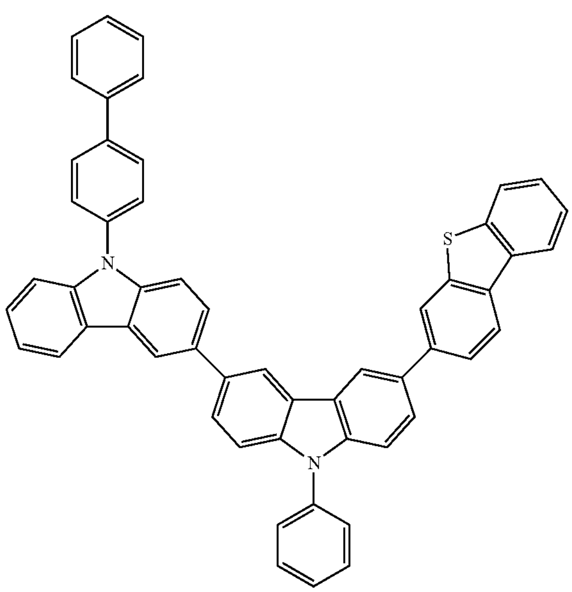
-continued
H1-99
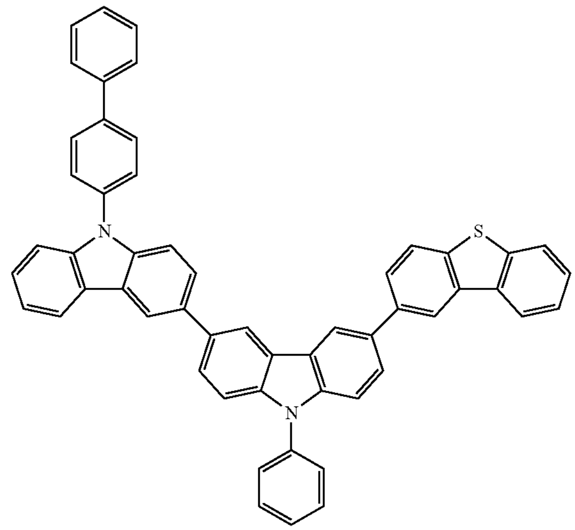
H1-100
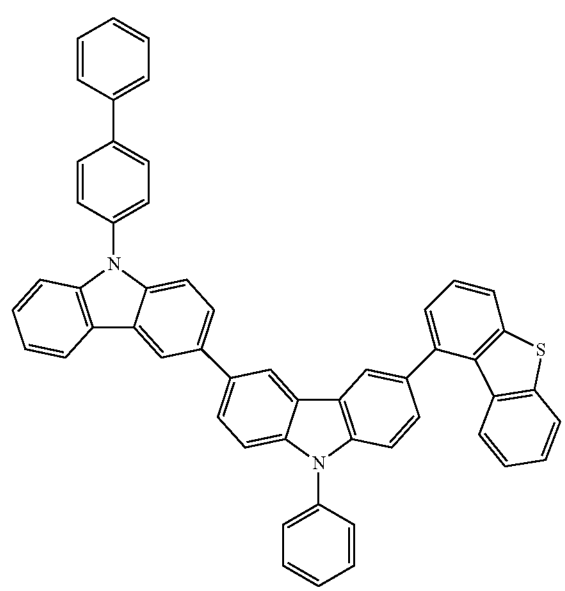

-continued
H1-101
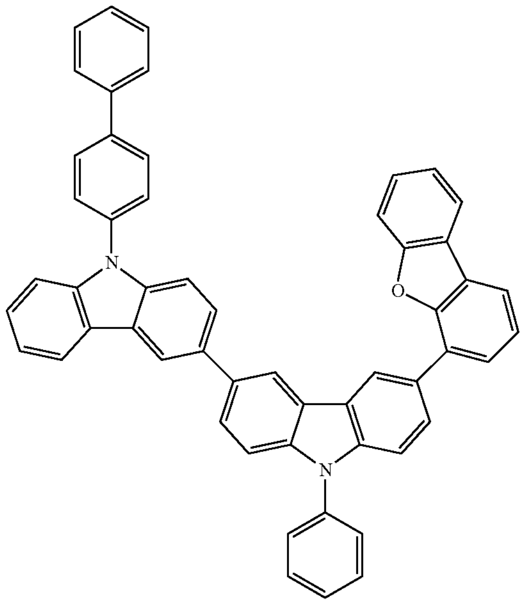
H1-102
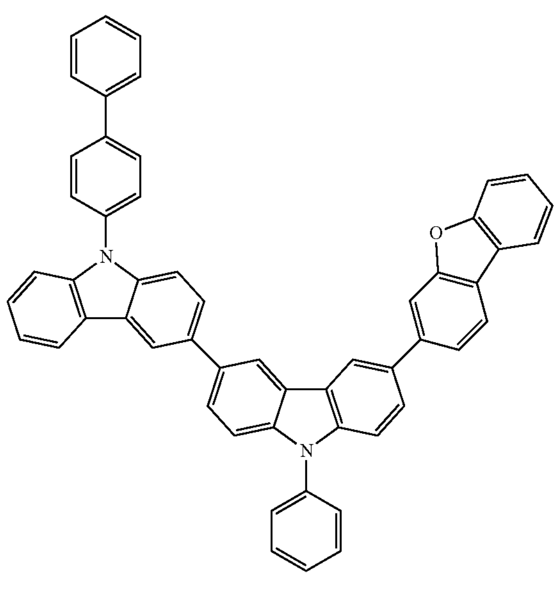
-continued
H1-103
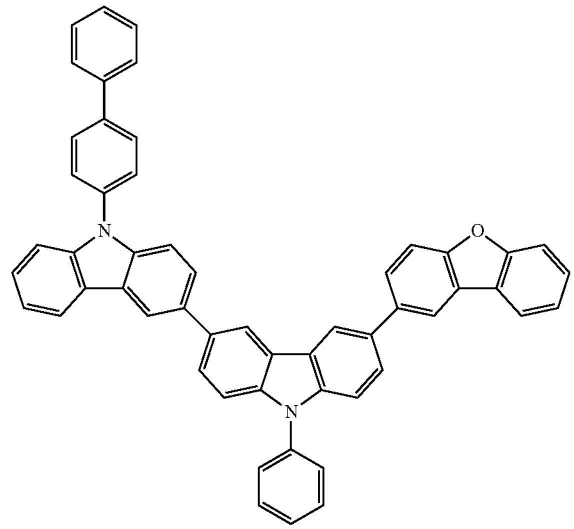
H1-104
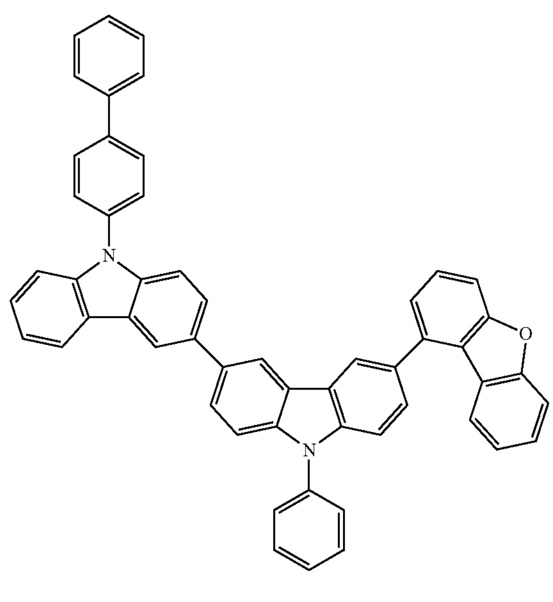

-continued
H1-105
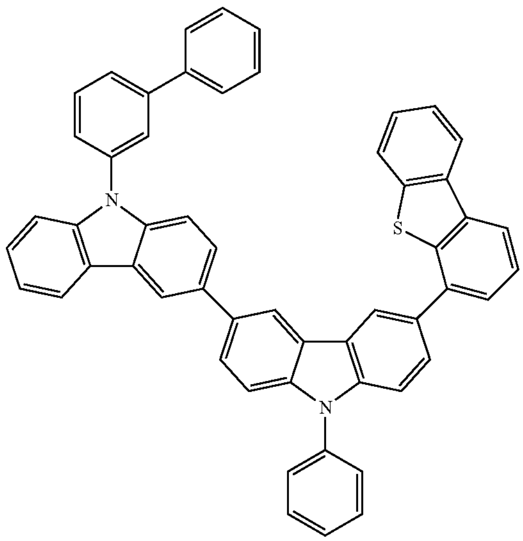
H1-106
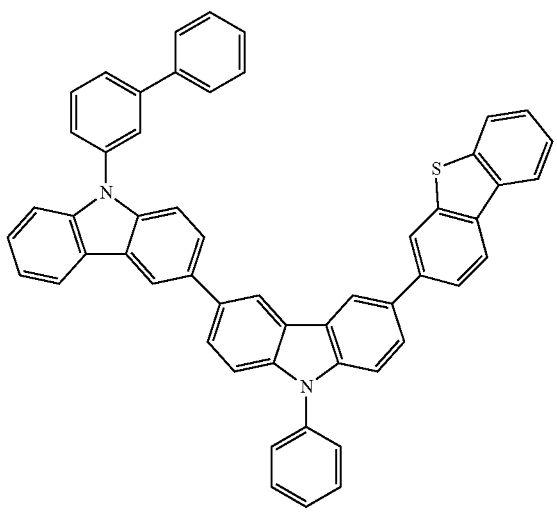
H1-107
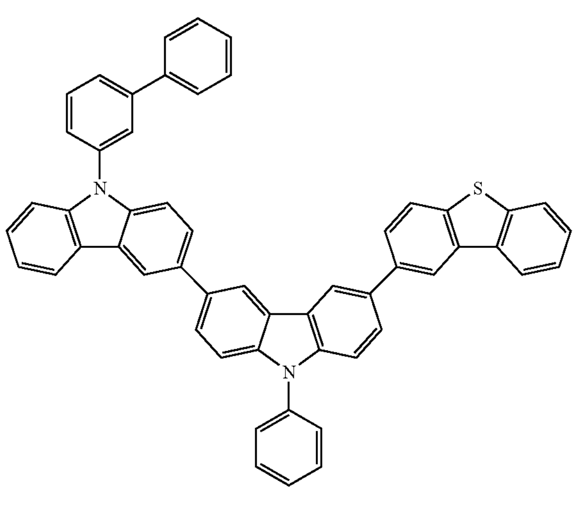
-continued
H1-108
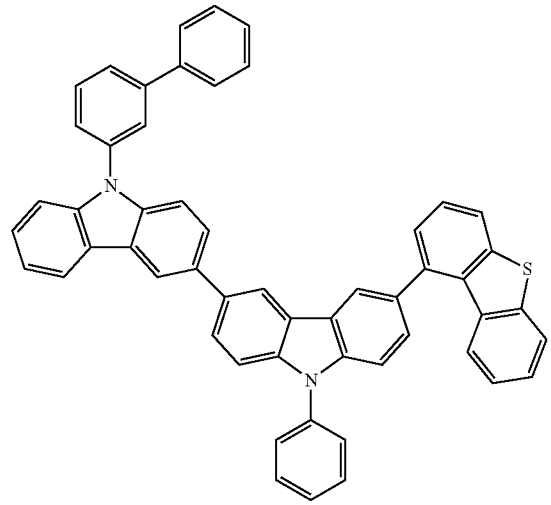
H1-109
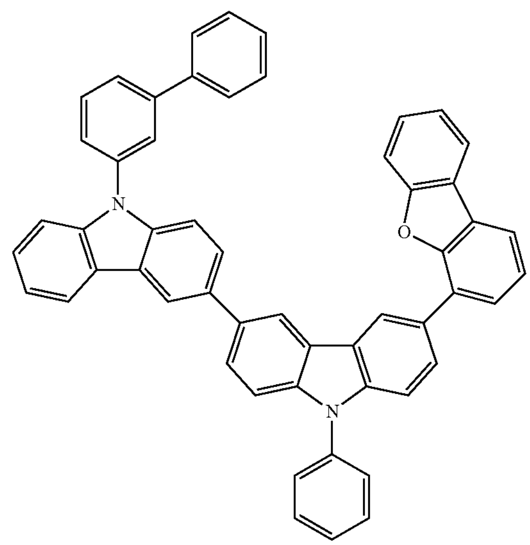
H1-110
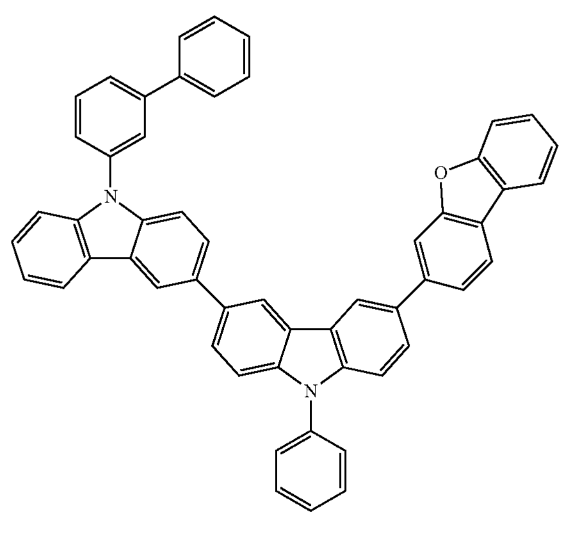

-continued
H1-111
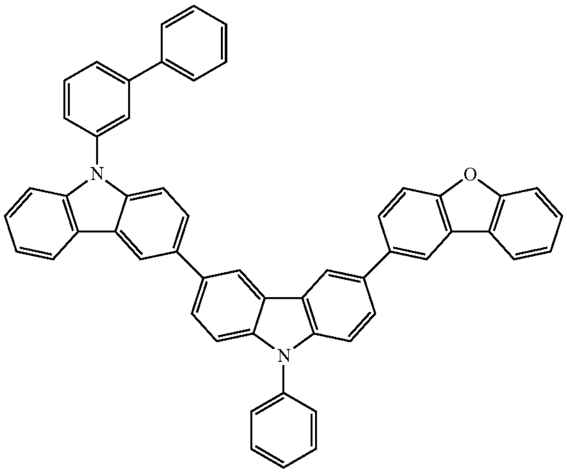
H1-112
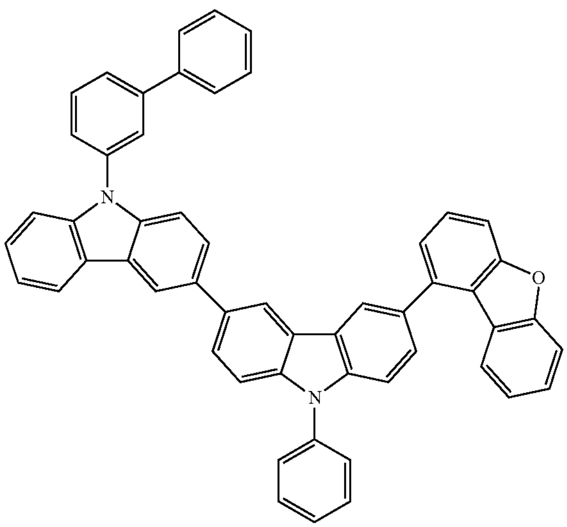
H1-113
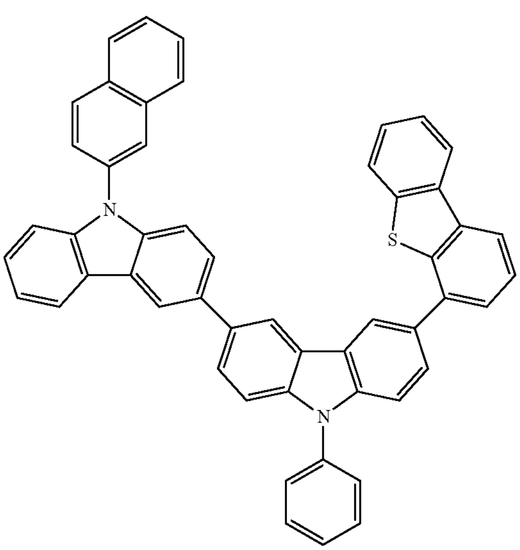
-continued
H1-114
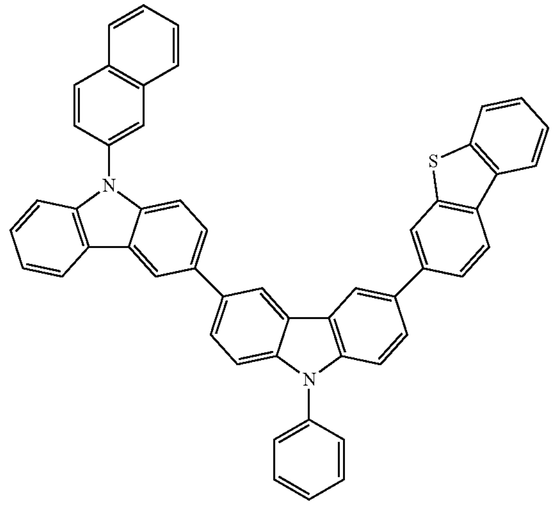
H1-115
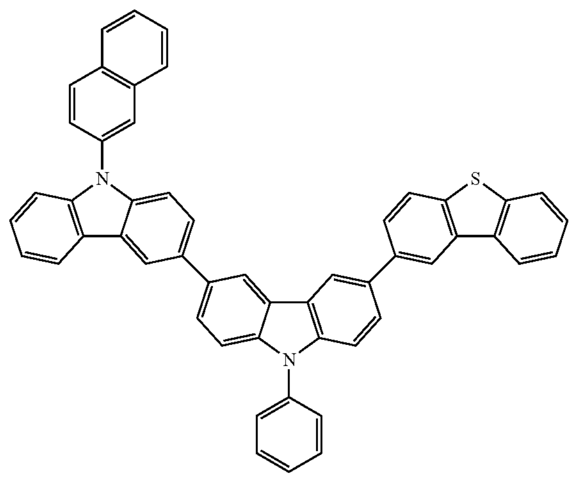
H1-116
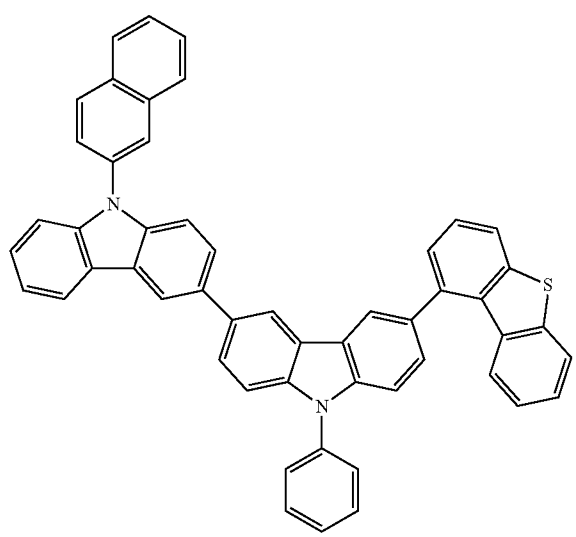

H1-117
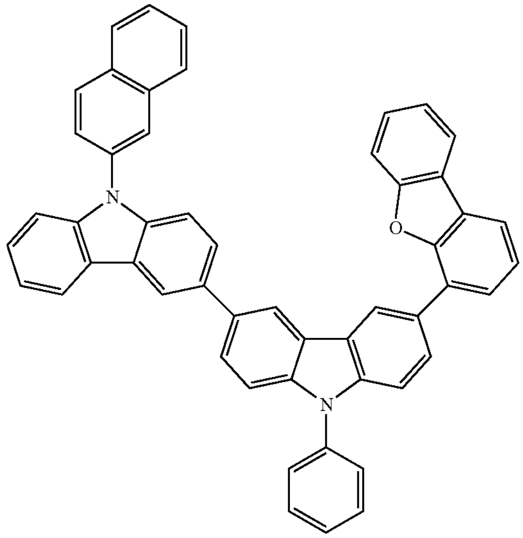
H1-118
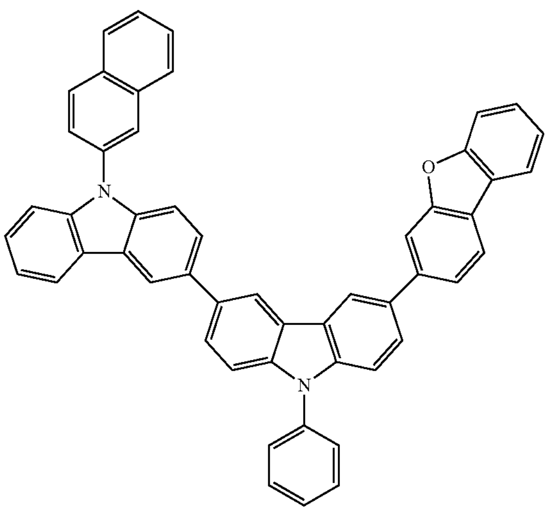
H1-119
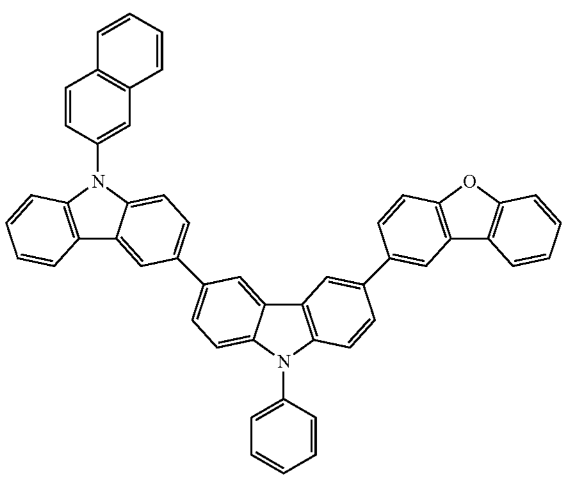
H1-120
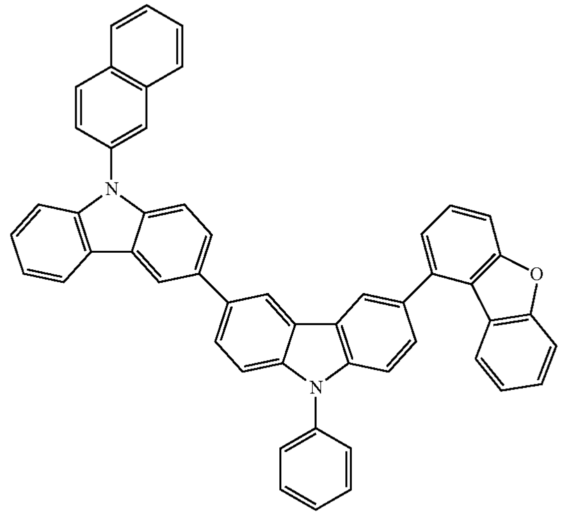
H1-121
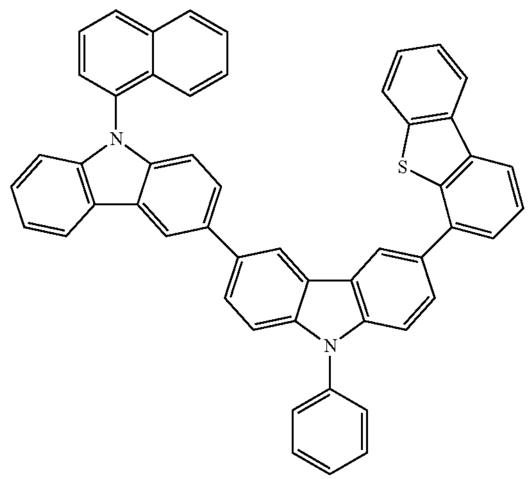
H1-122
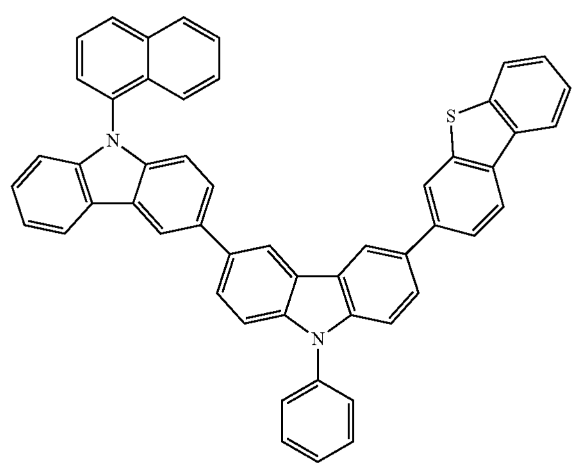

H1-123
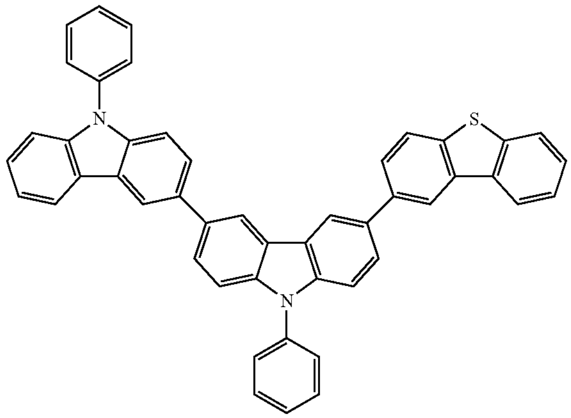
H1-124
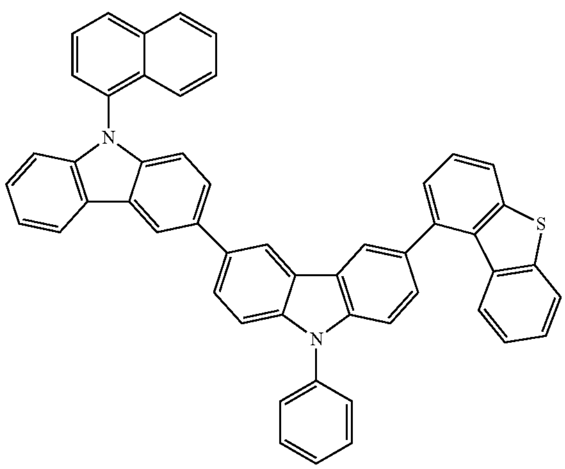
H1-125
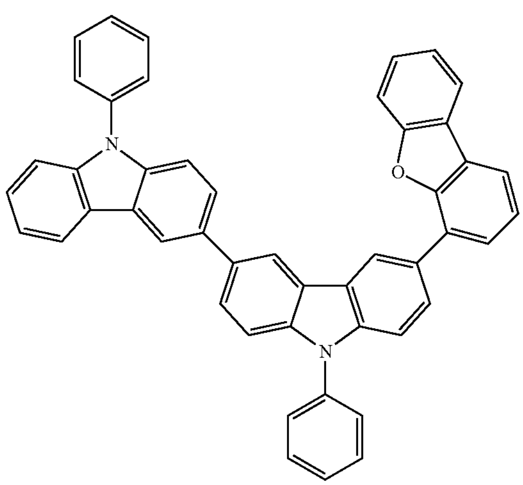
H1-126
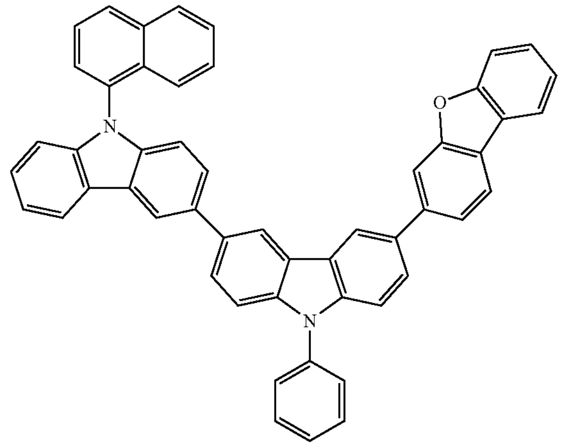
H1-127
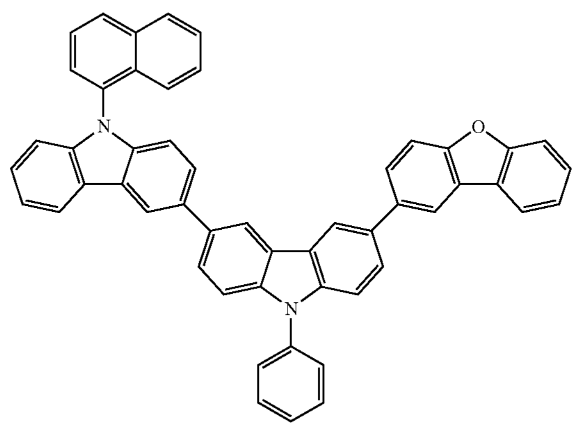
H1-128
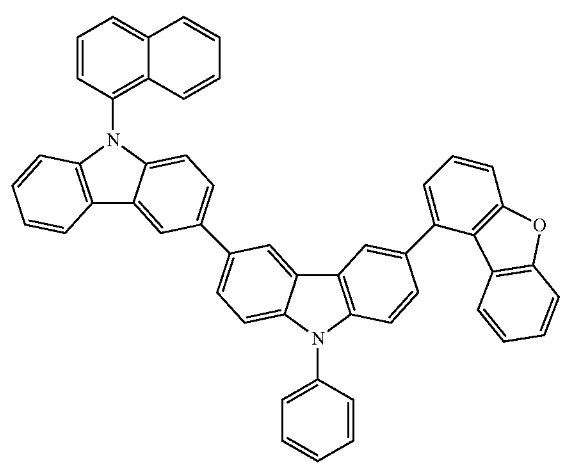

-continued
H1-129
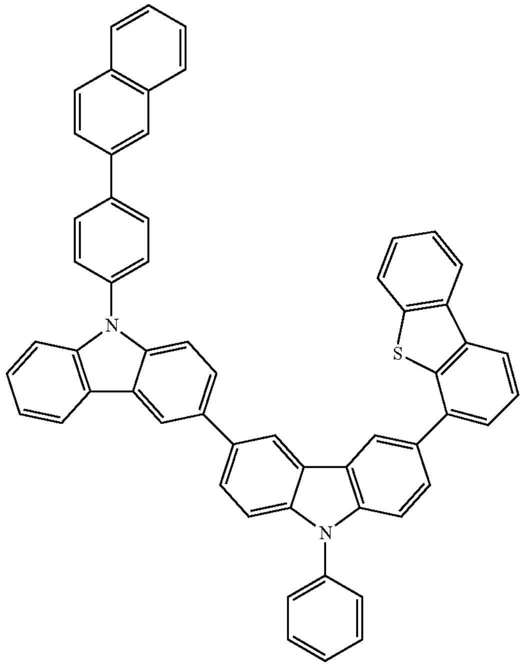
H1-131
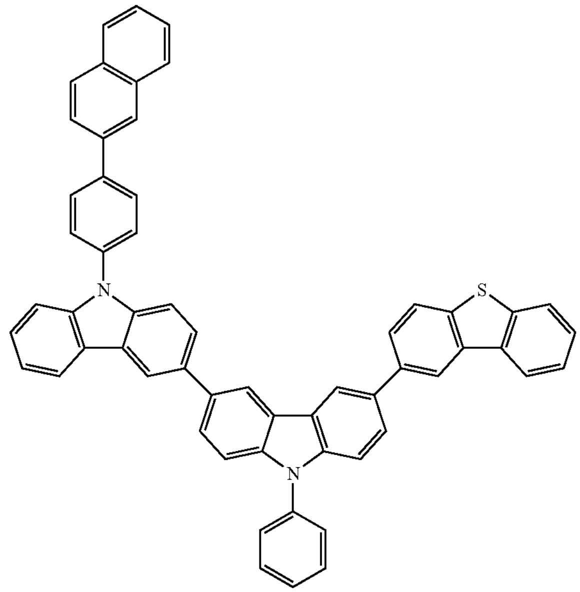
H1-130
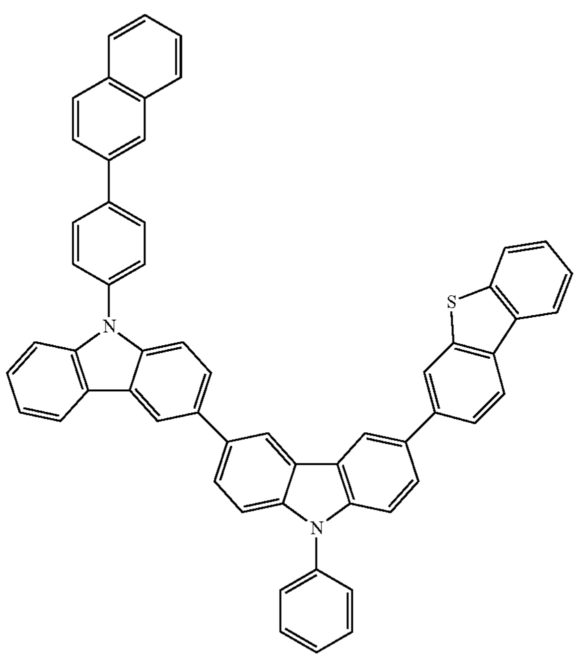
H1-132
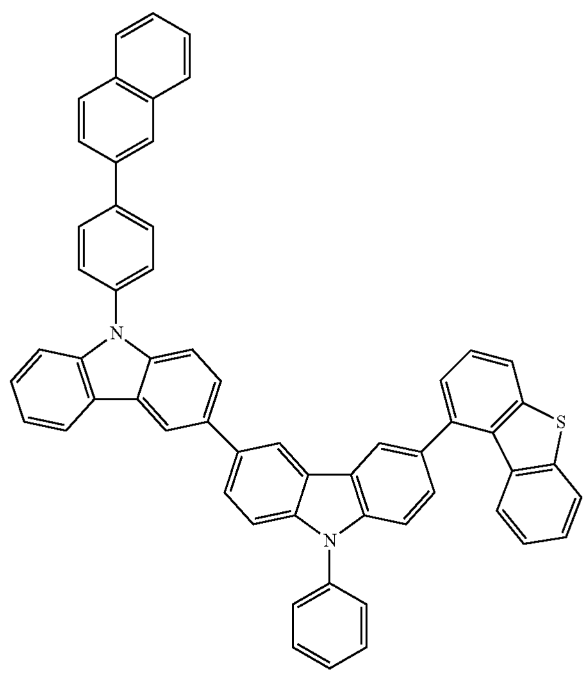

-continued
H1-133
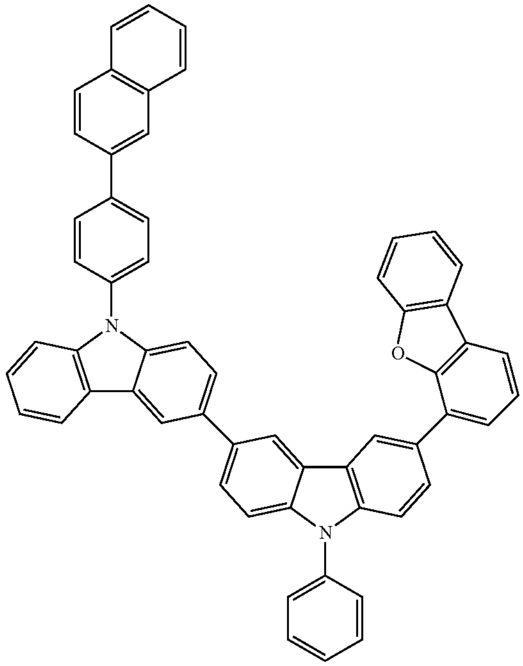
H1-134
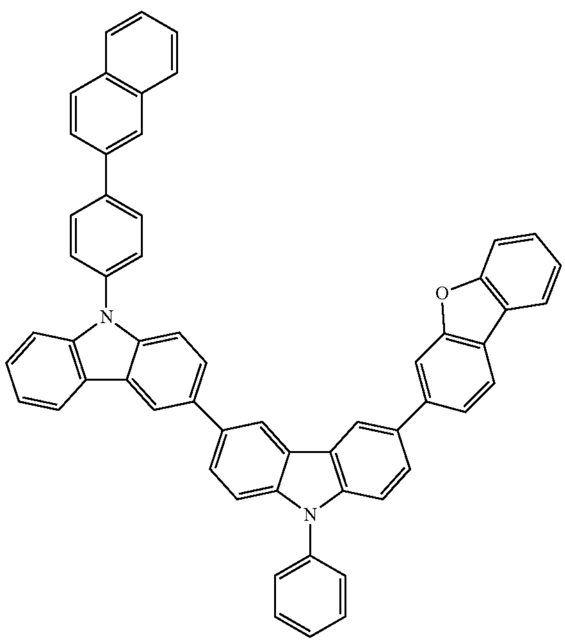
-continued
H1-135
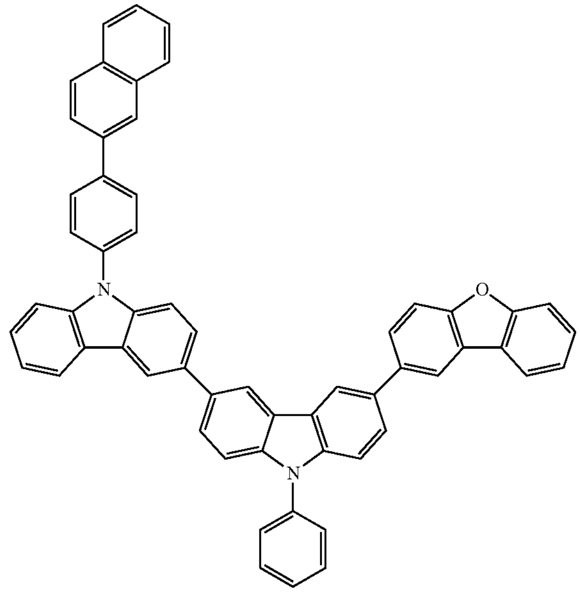
H1-136
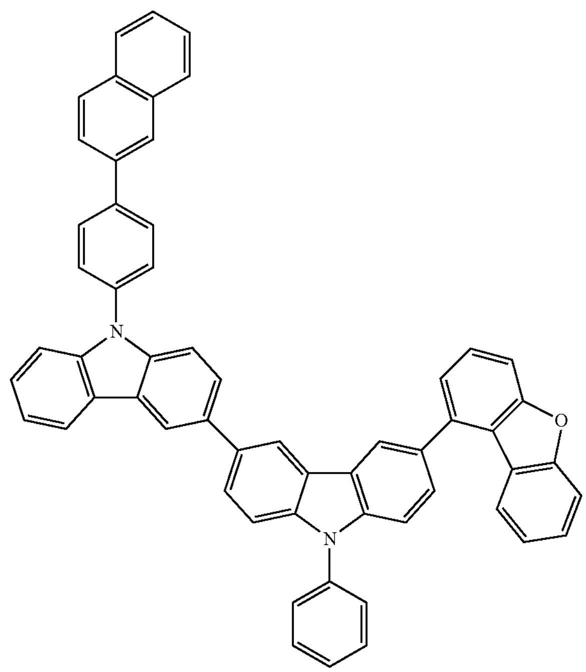

-continued
H1-137
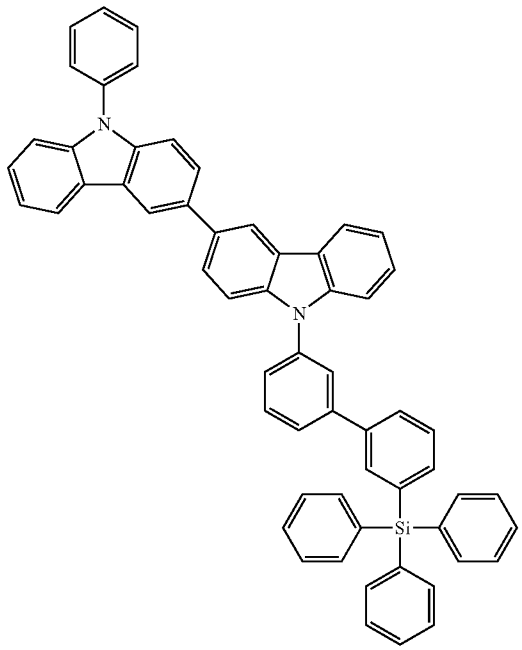
H1-138
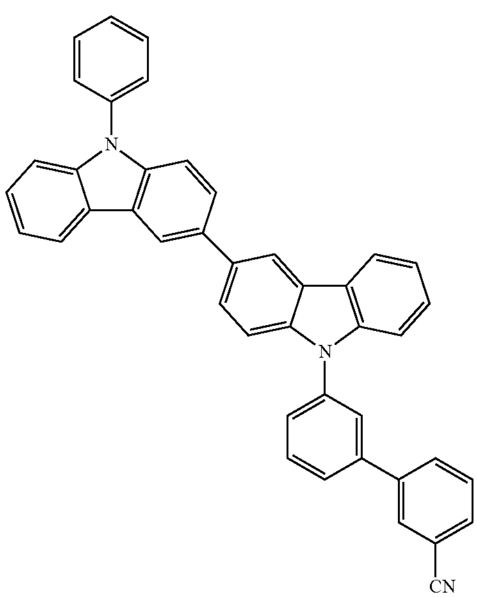
-continued
H1-139
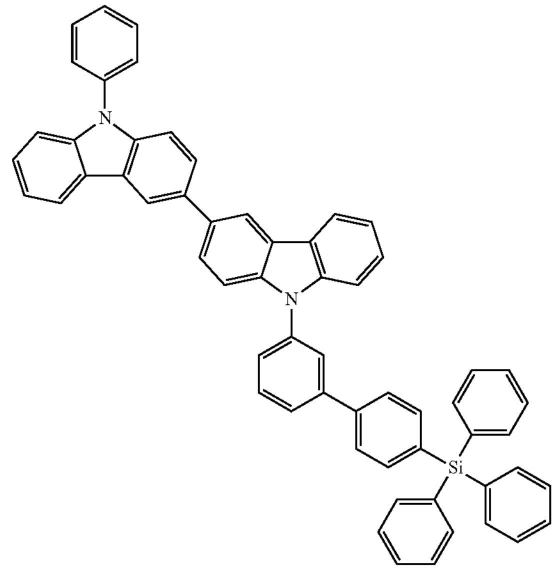
H1-140
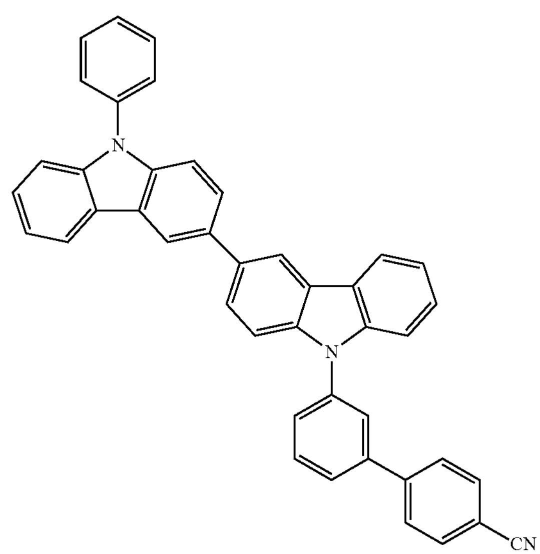

-continued
H1-141
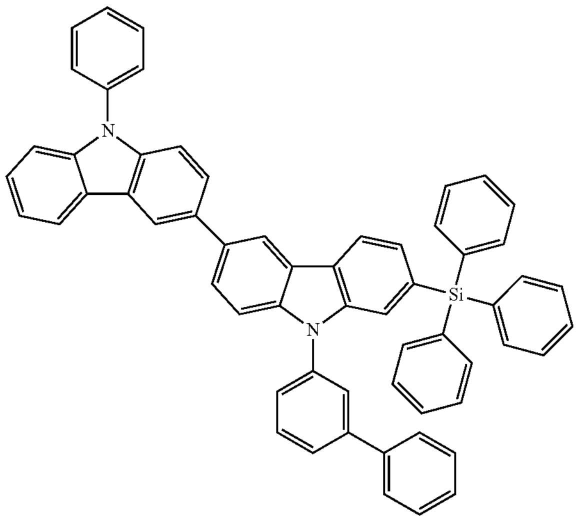
H1-142
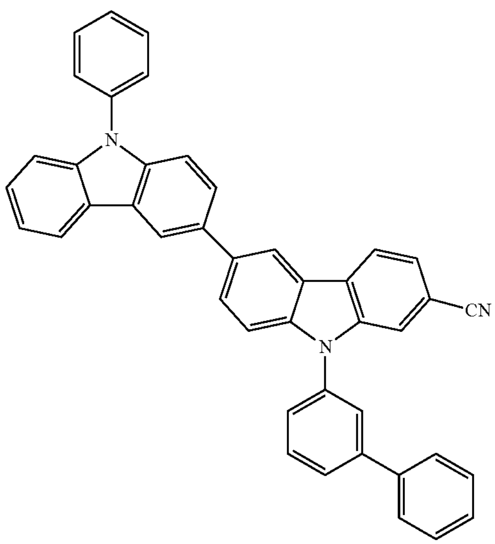
H1-143
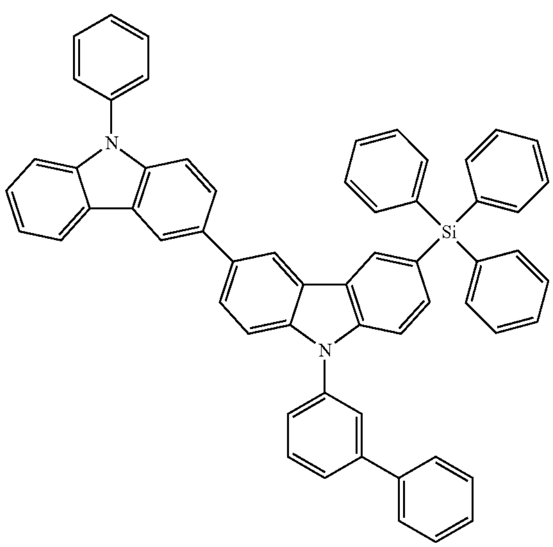
-continued
H1-144
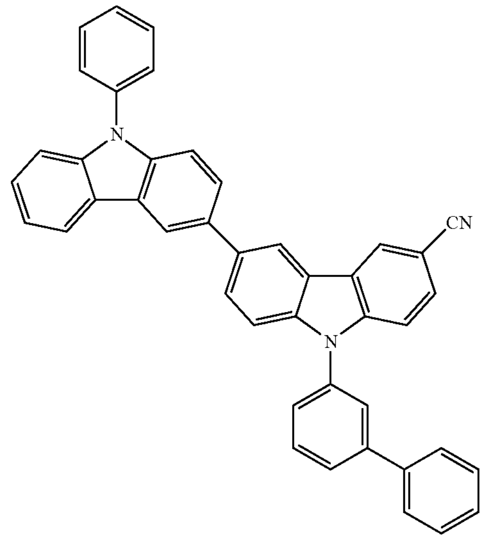
H1-145
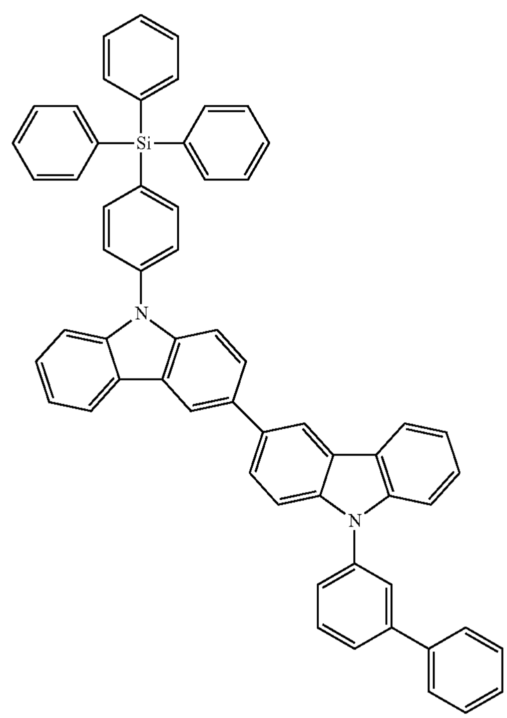

-continued
H1-146
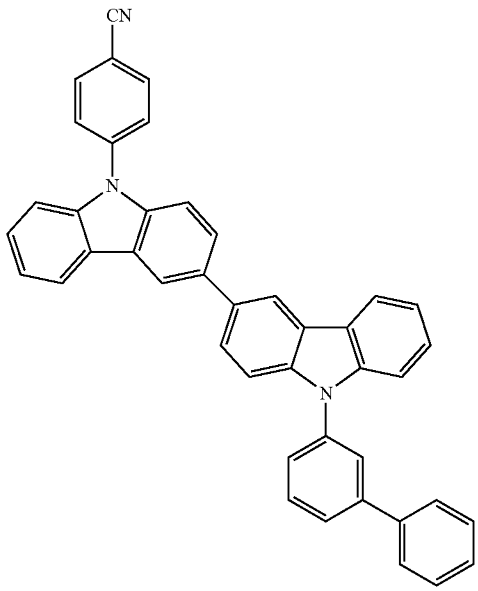
H1-147
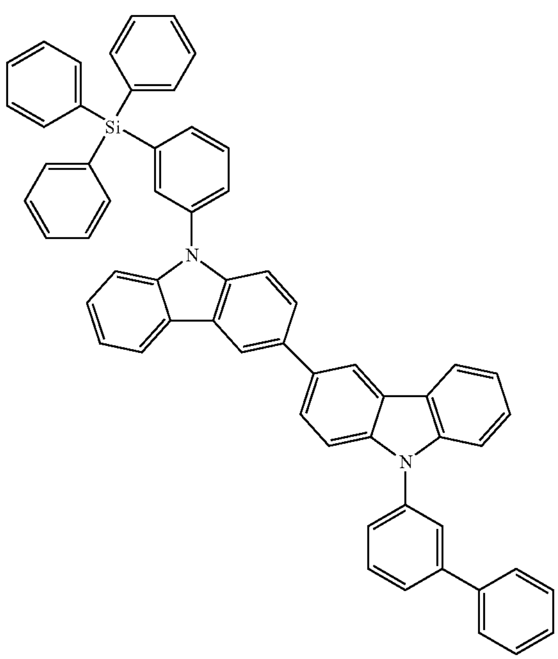
-continued
H1-148
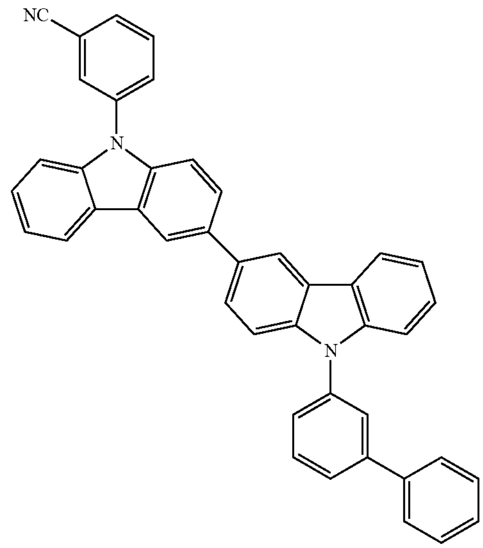
H1-149
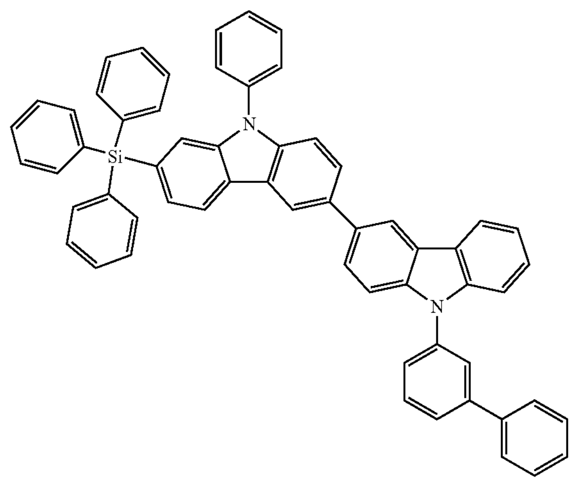
H1-150
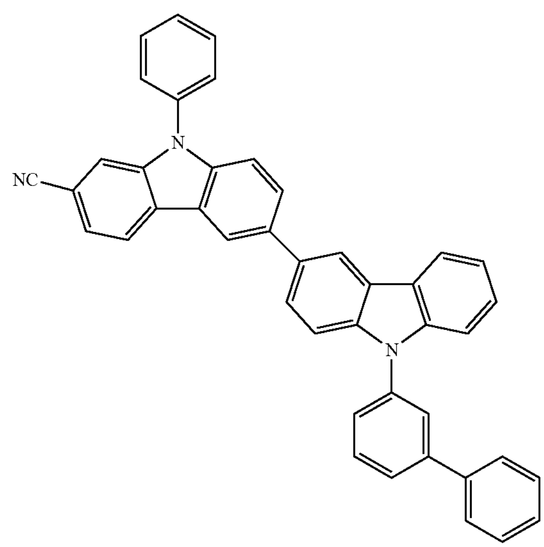

-continued
H1-151
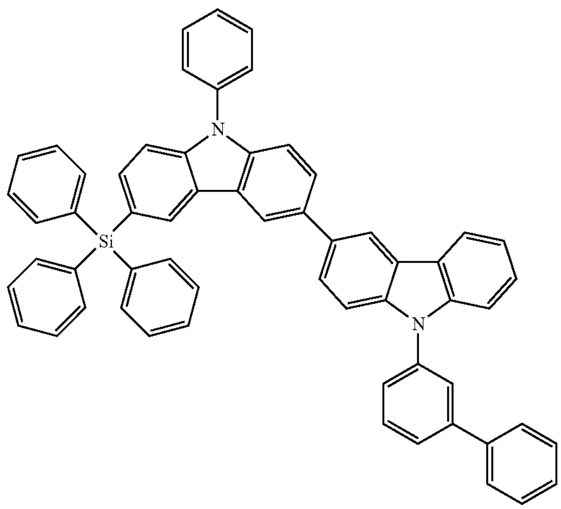
H1-152
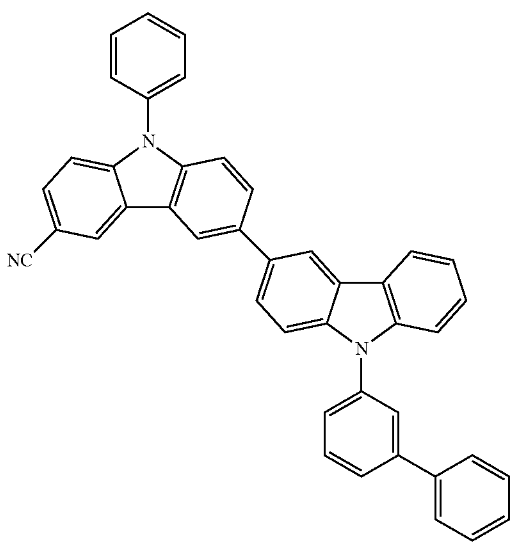
H1-153
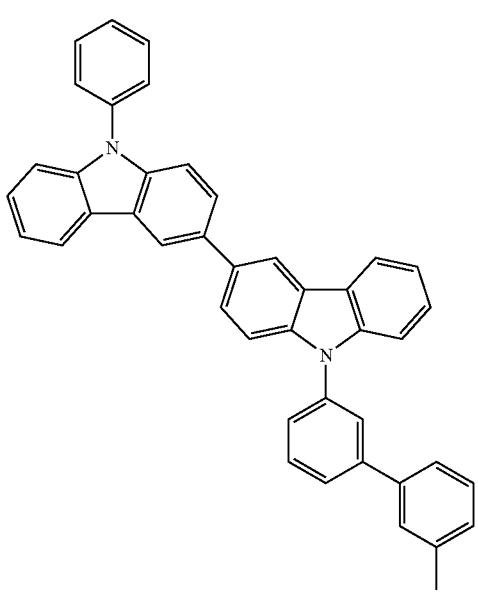
-continued
H1-154
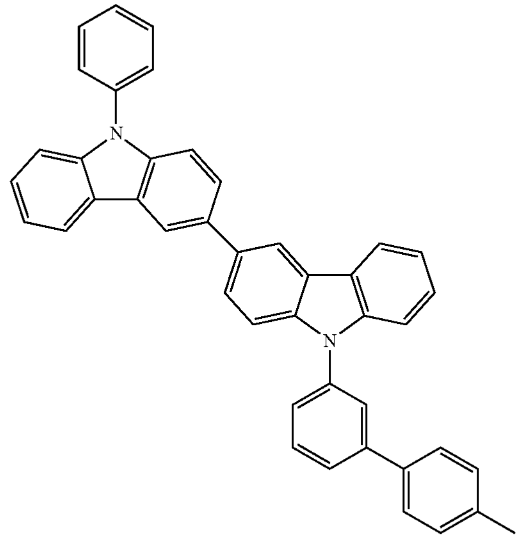
H1-155
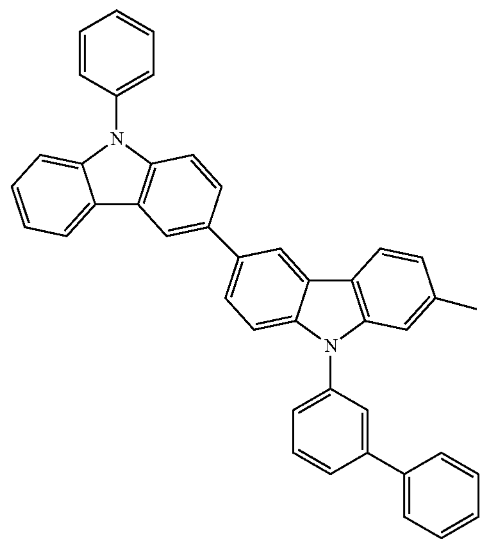
H1-156
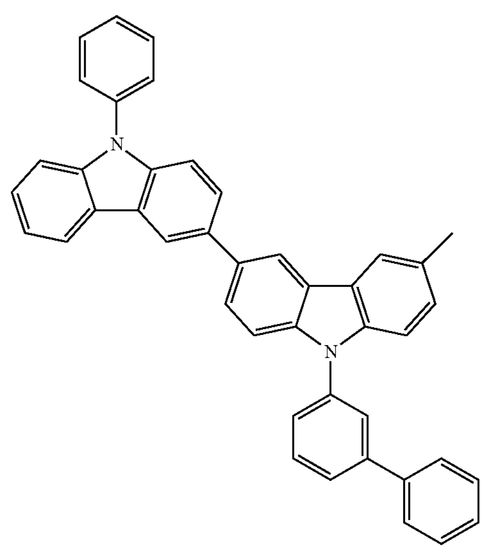

-continued
H1-157
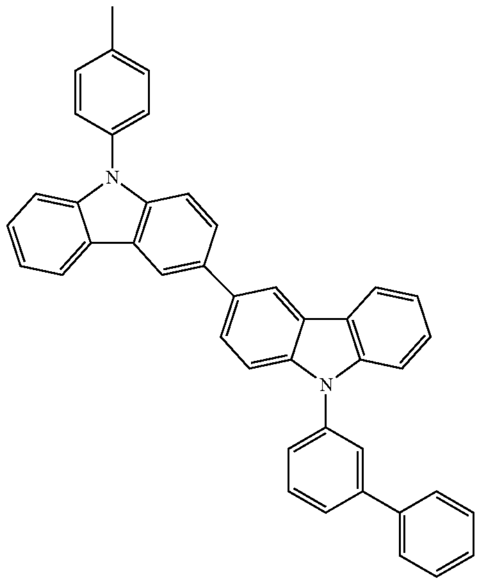
H1-158
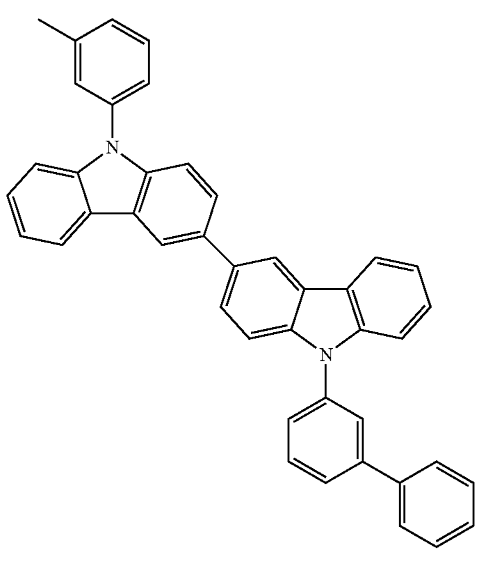
-continued
H1-159
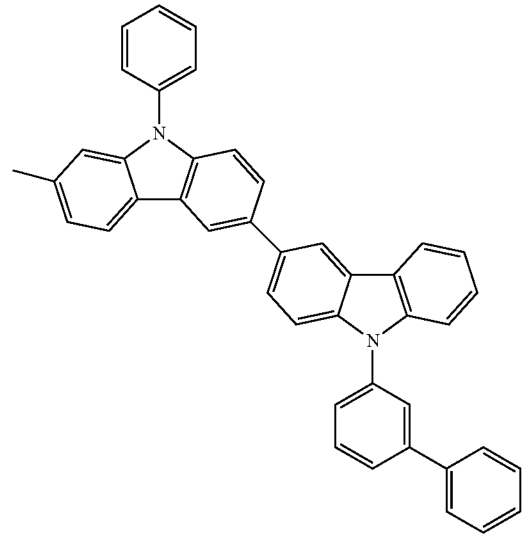
H1-160
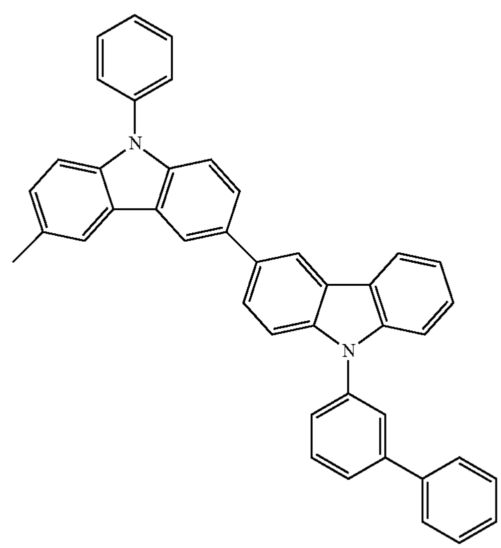

-continued
H1-161
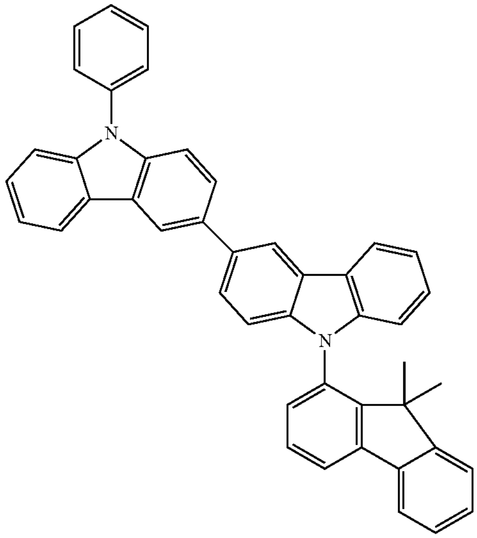
H1-162
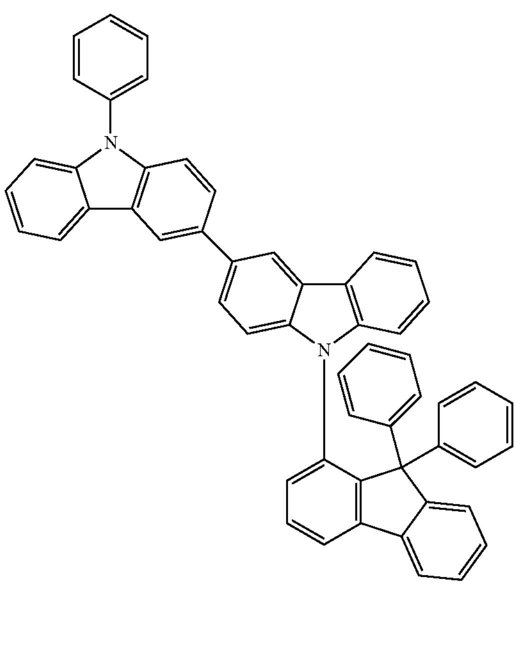
-continued
H1-163
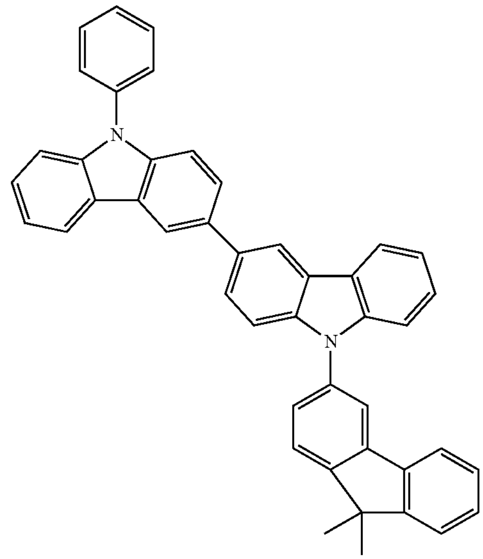
H1-164
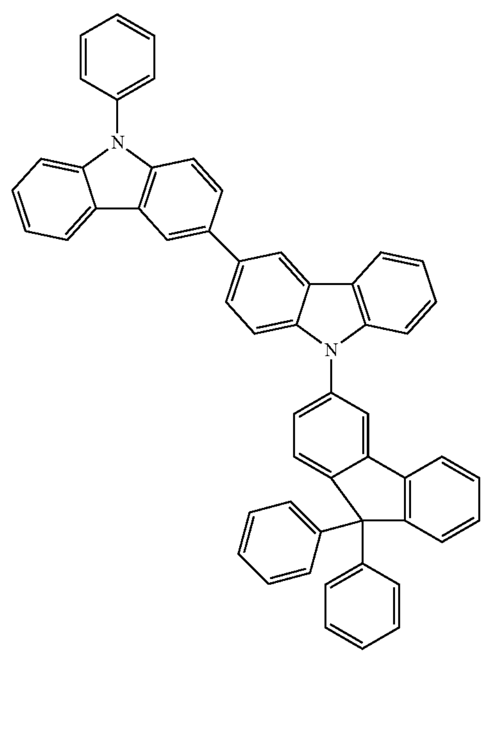

H1-165
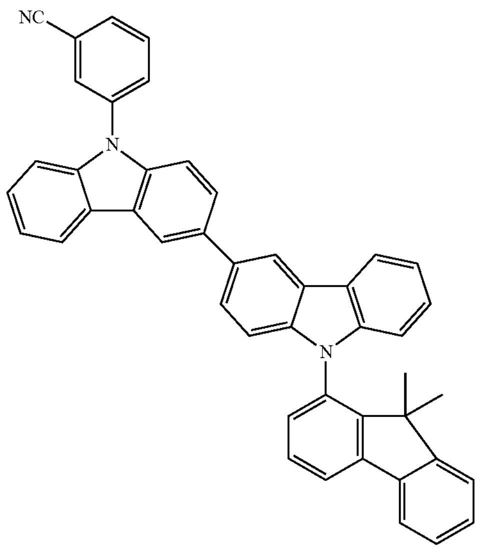
H1-166
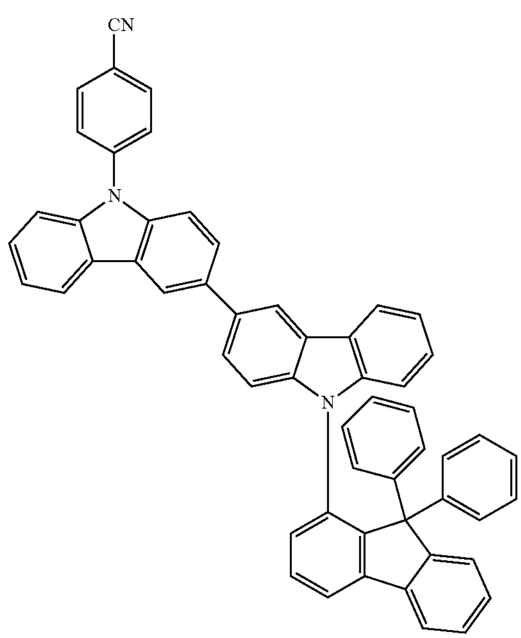
H1-167
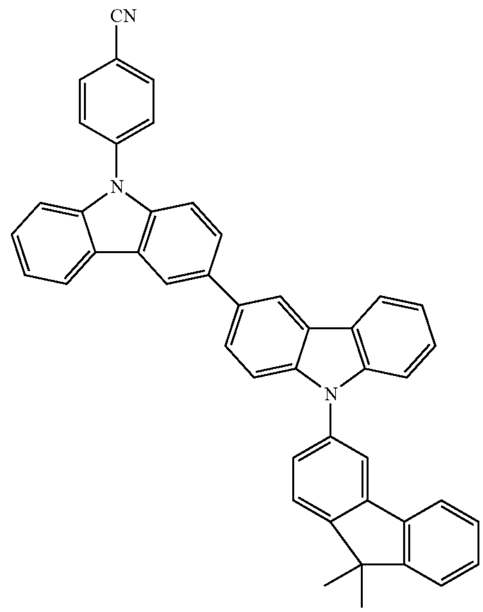
H1-168
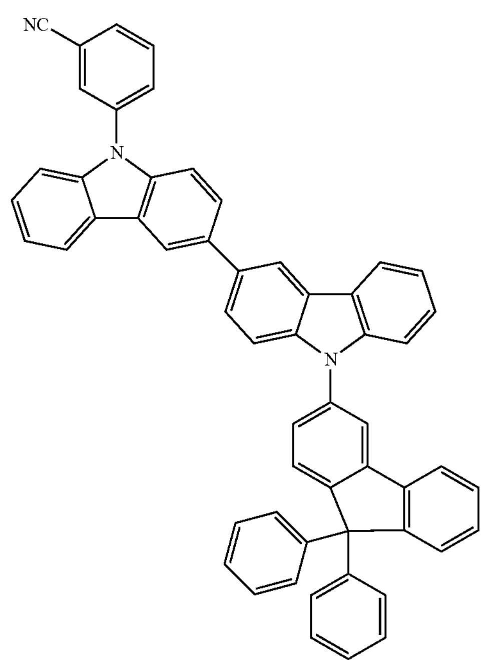

-continued
H1-169
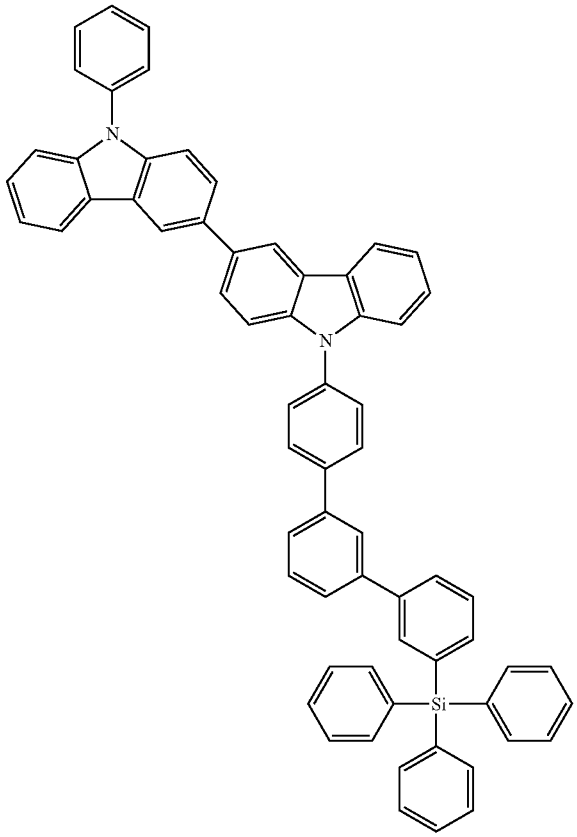
H1-170
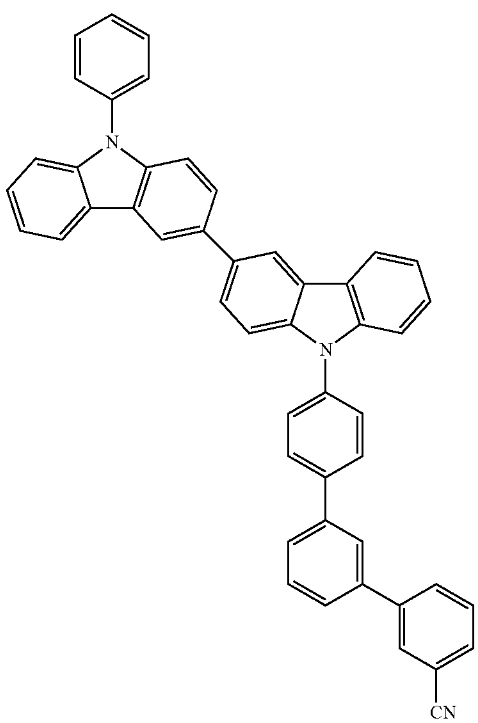
-continued
H1-171
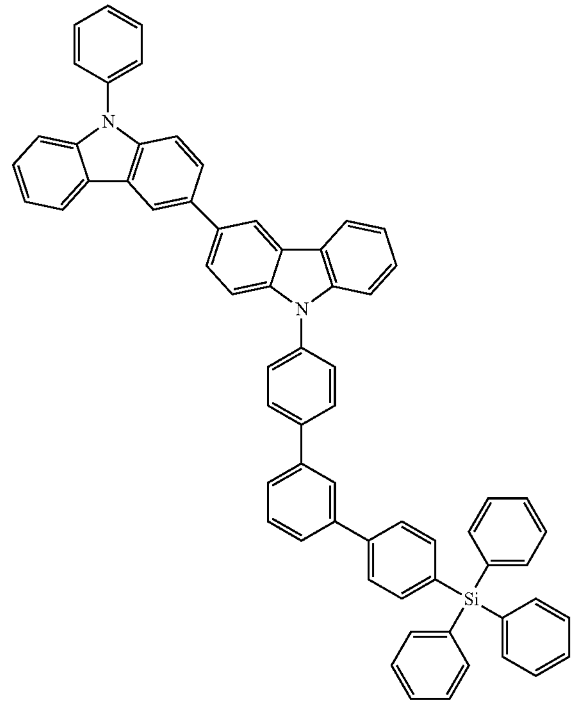
H1-172
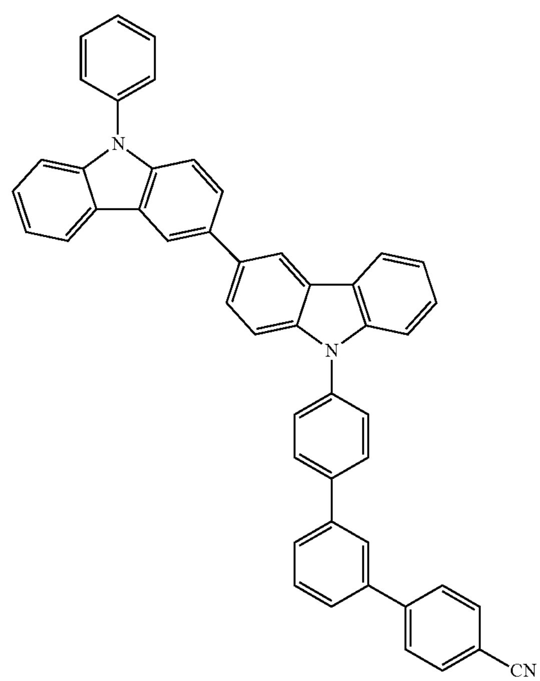

-continued
H1-173
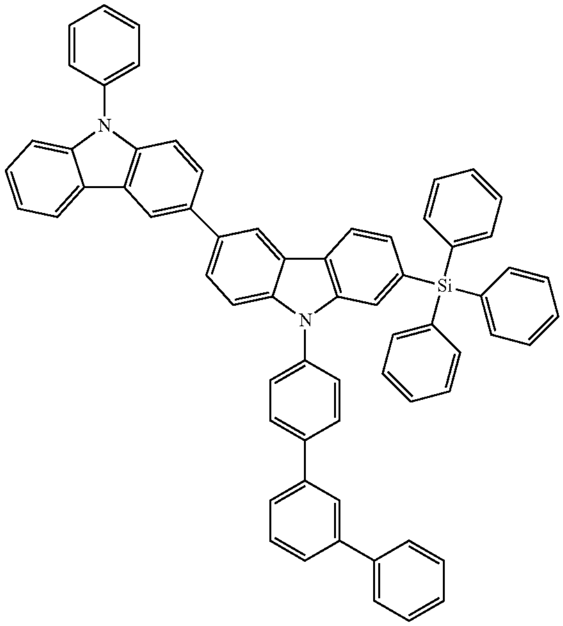
H1-174
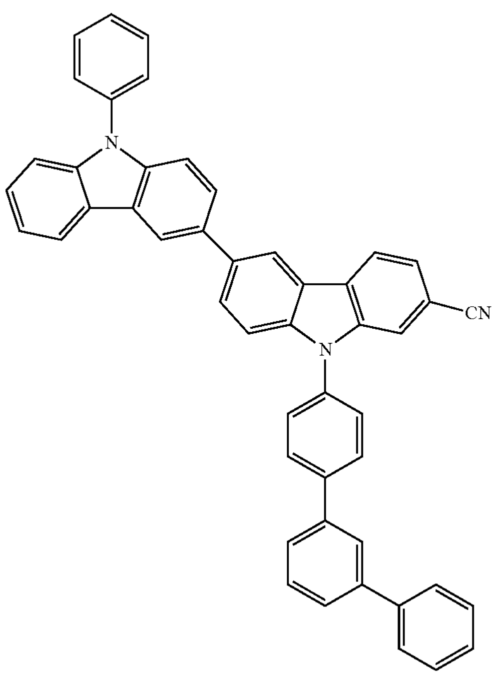
-continued
H1-175
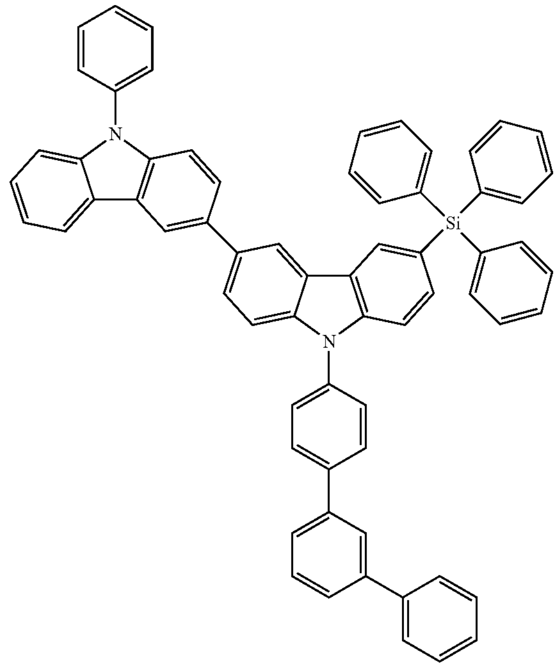
H1-176
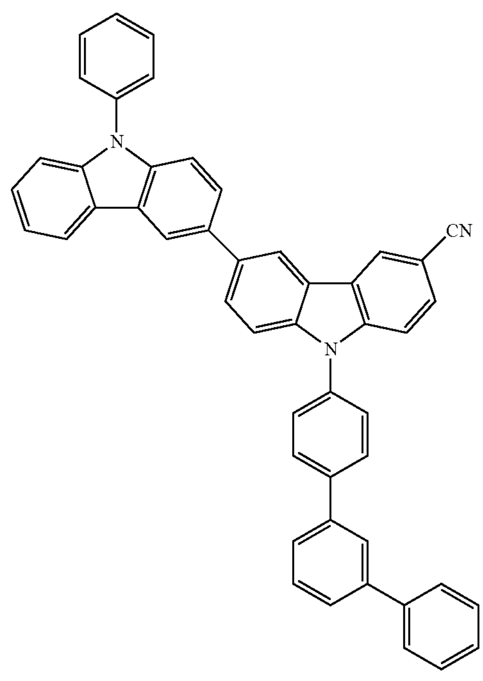

-continued
H1-177
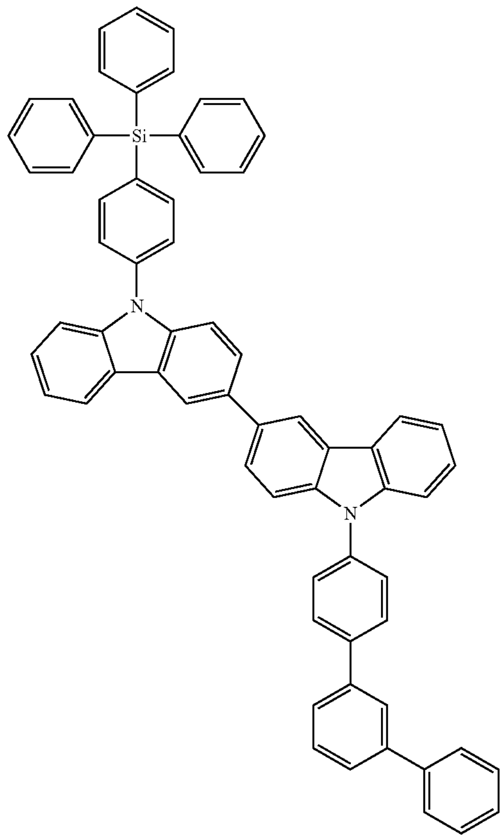
H1-178
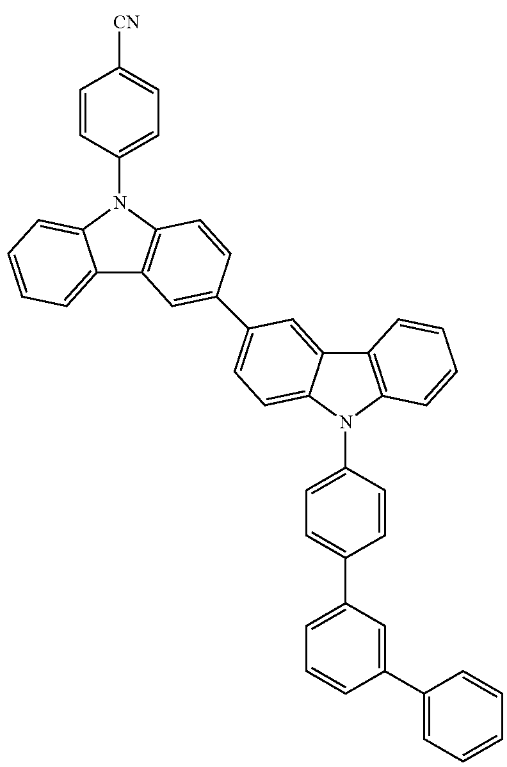
-continued
H1-179
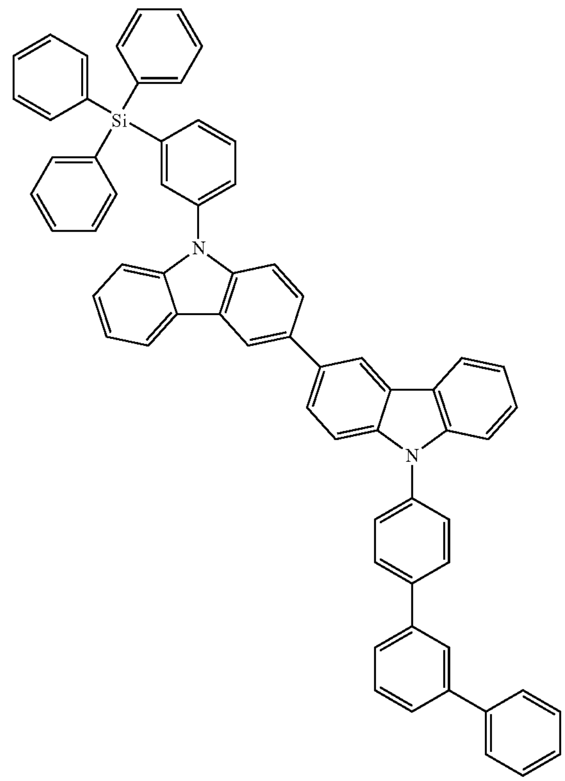
H1-180
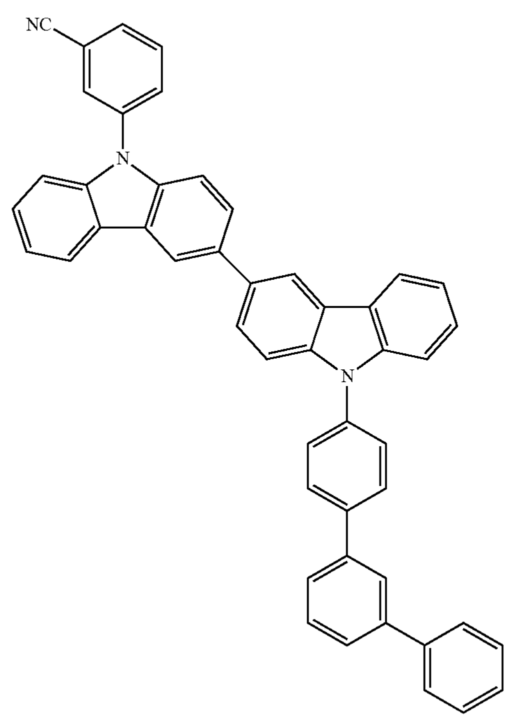

-continued
H1-181
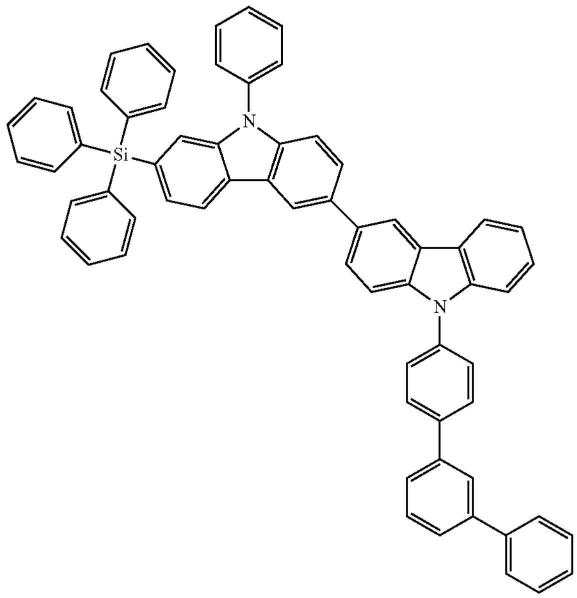
H1-182
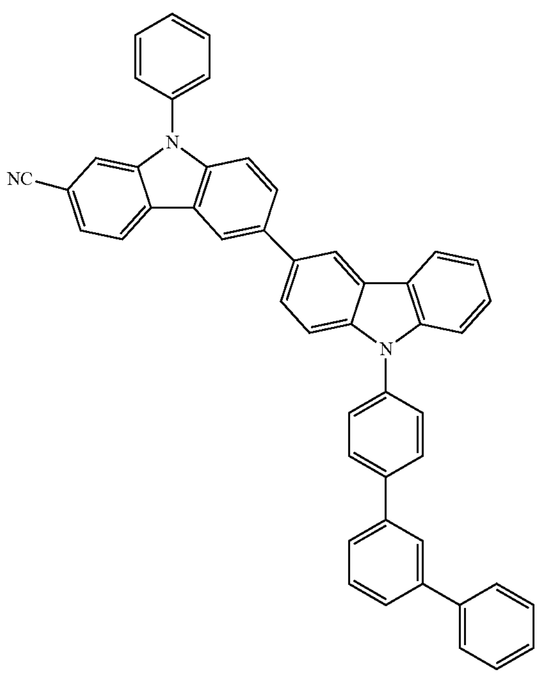
-continued
HI-183
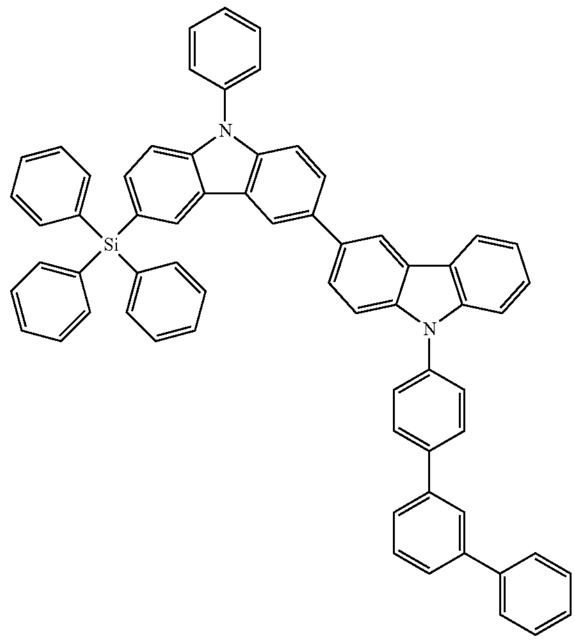
H1-184
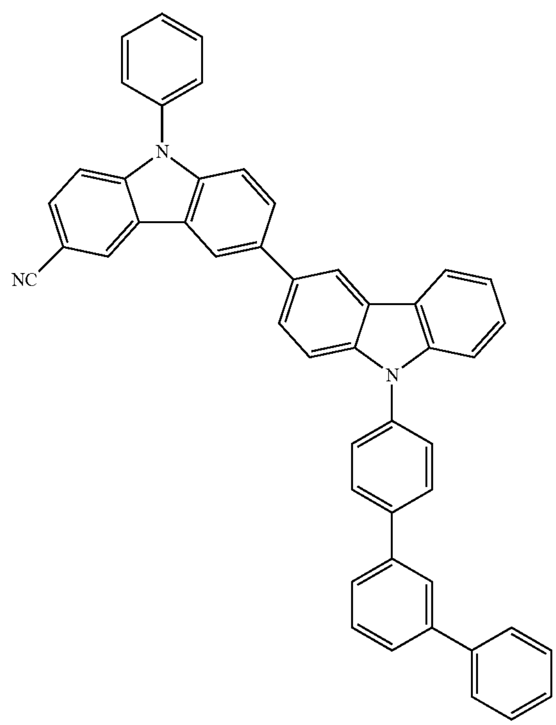

-continued
H1-185
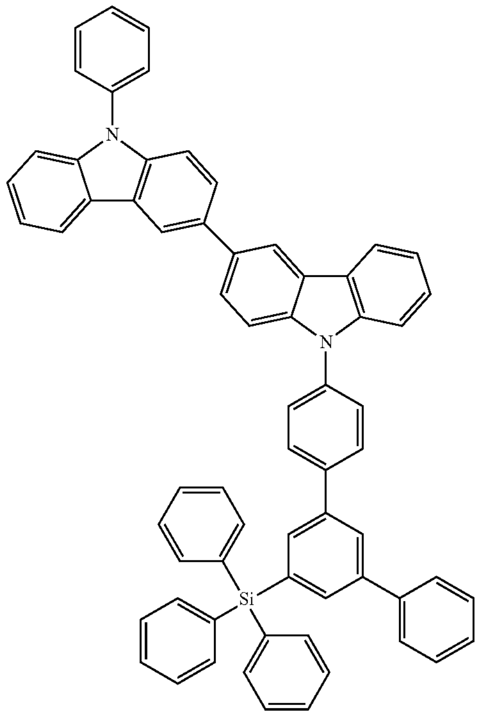
H1-186
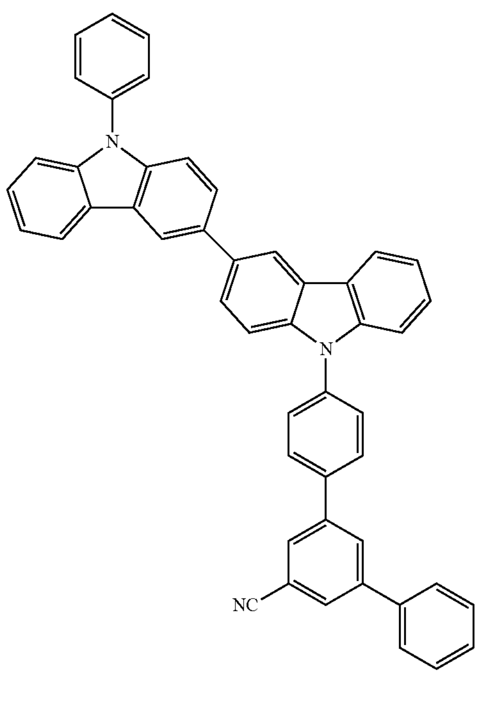
-continued
H1-187
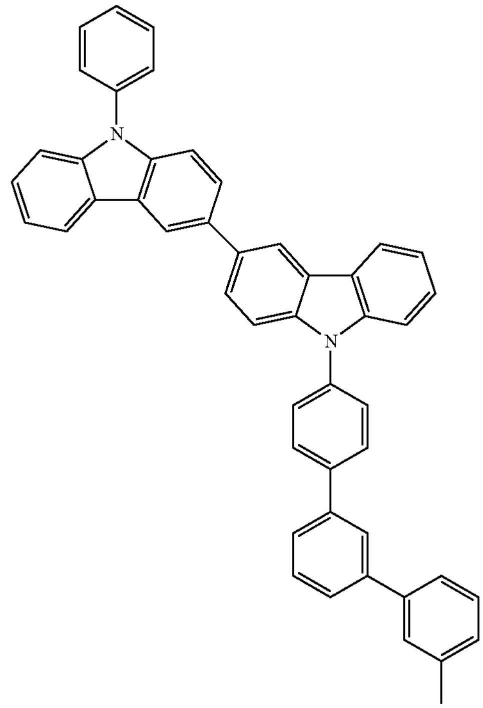
H1-188
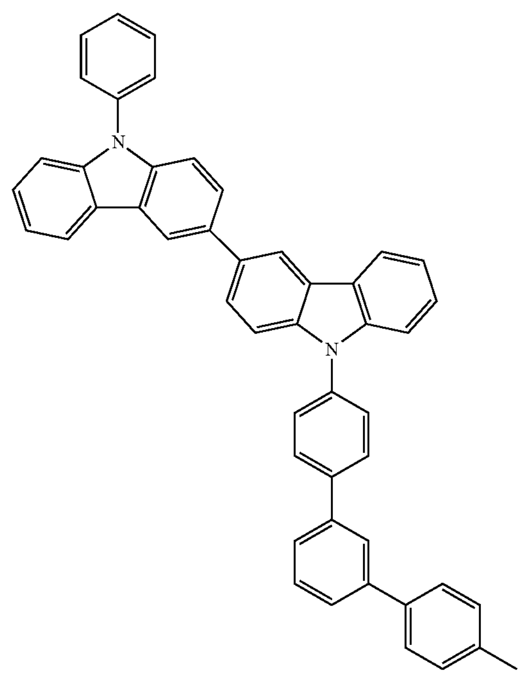

-continued
H1-189
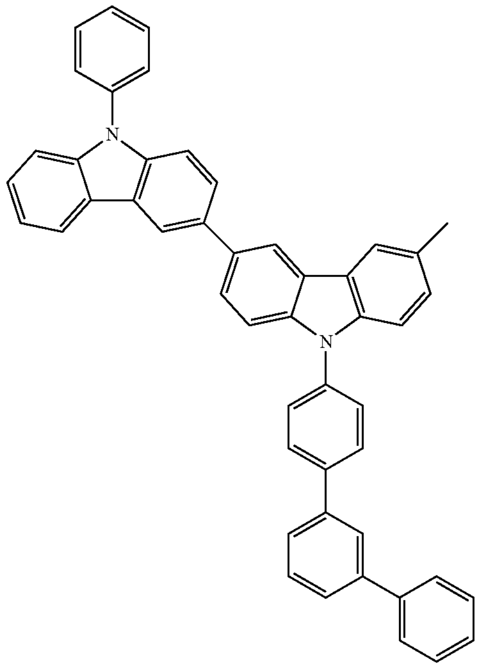
H1-190
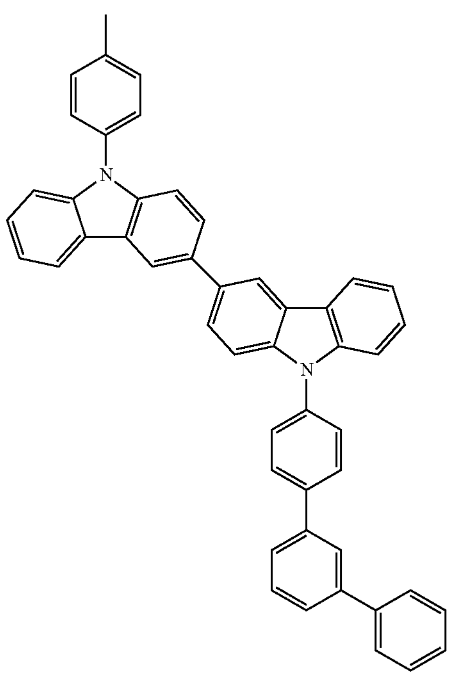
-continued
H1-191
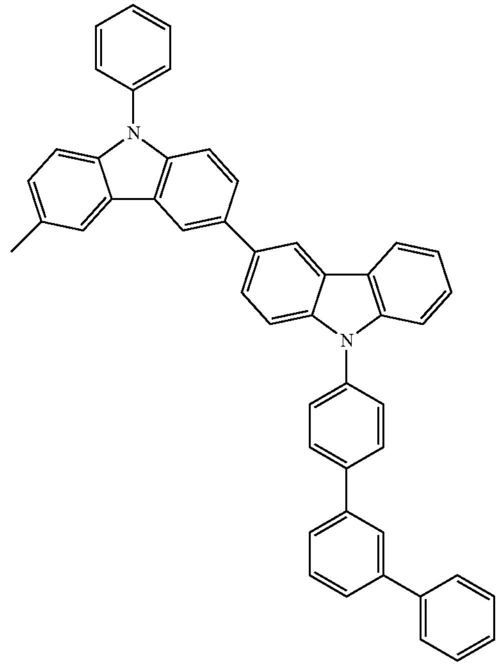
H1-192
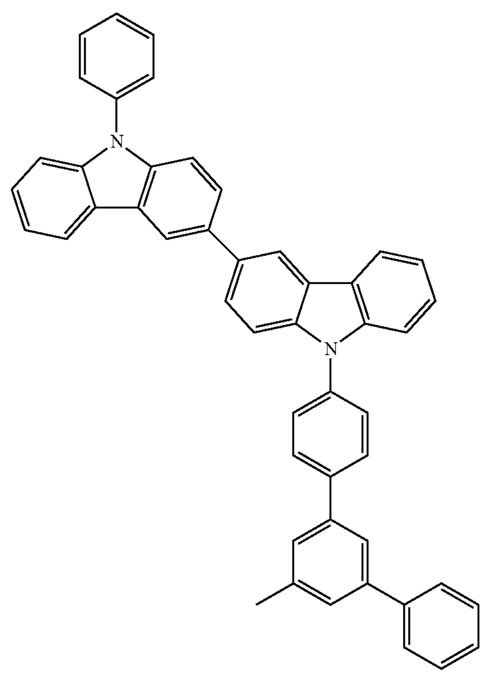

-continued
H1-193
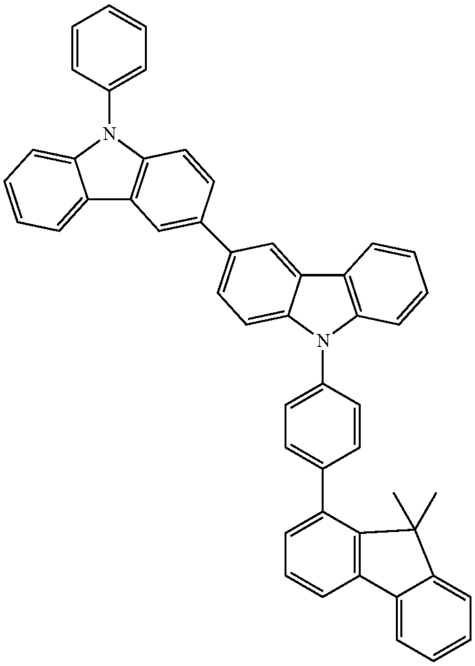
H1-194
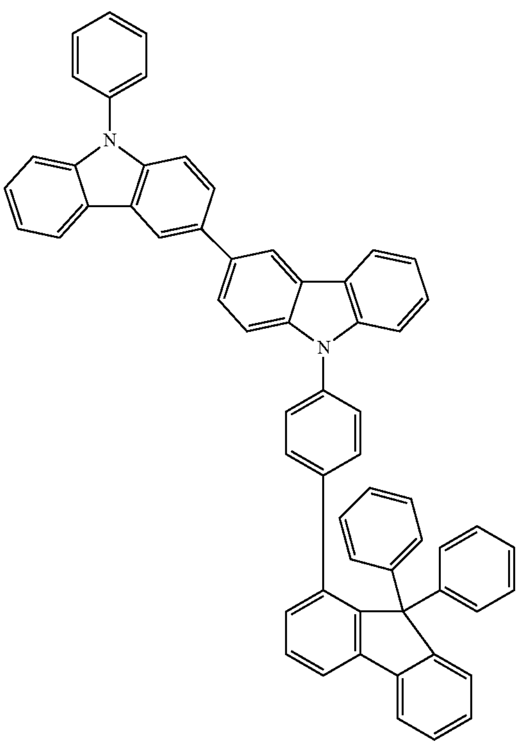
-continued
H1-195
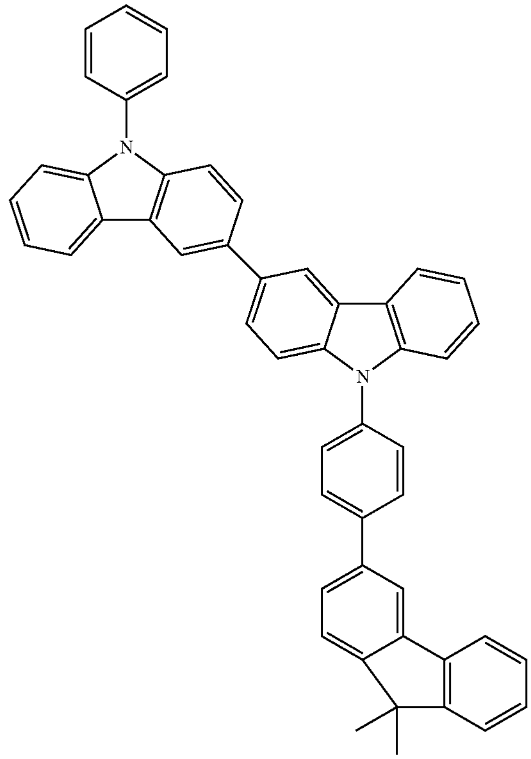
H1-196
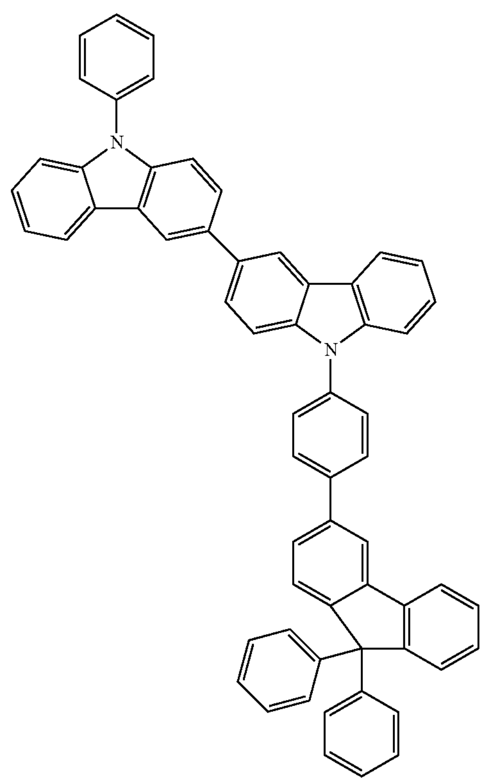

H1-197
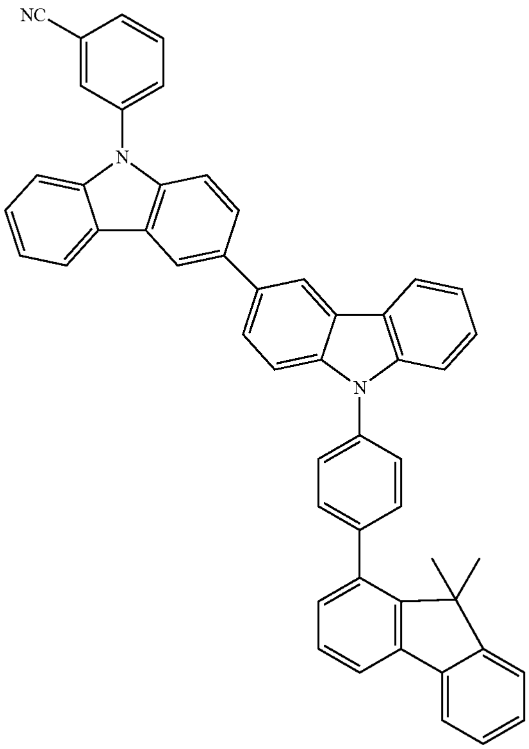
H1-198
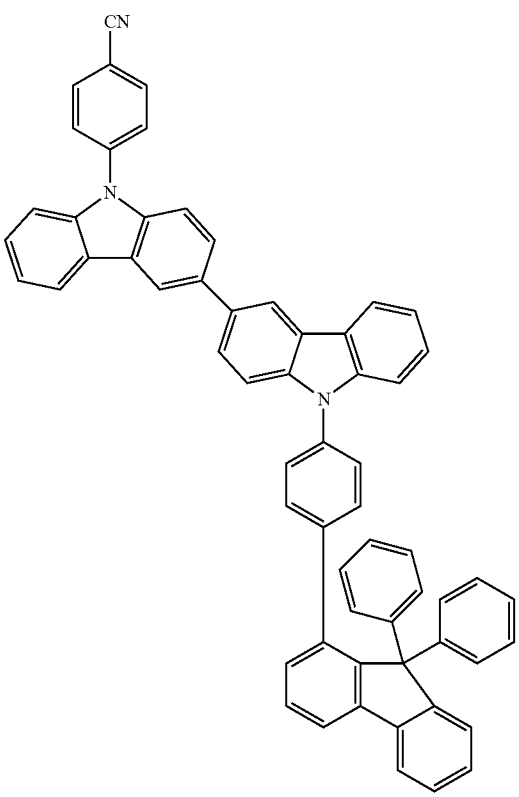
H1-199
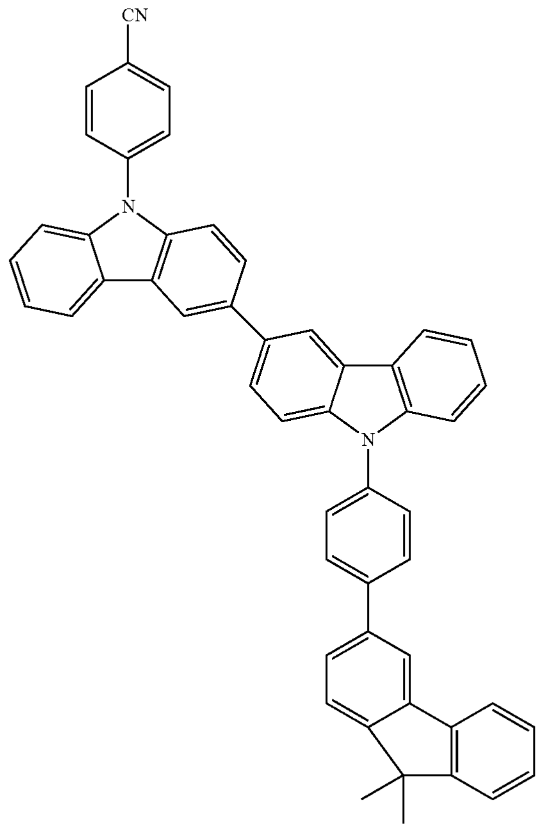
H1-200
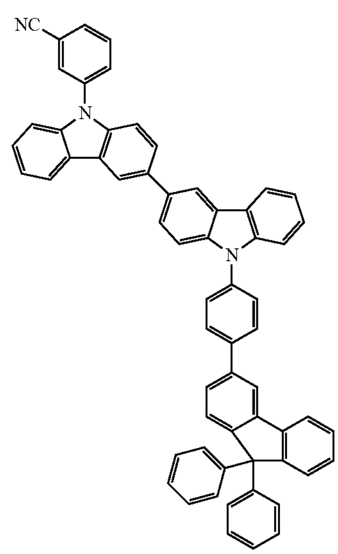

H1-201
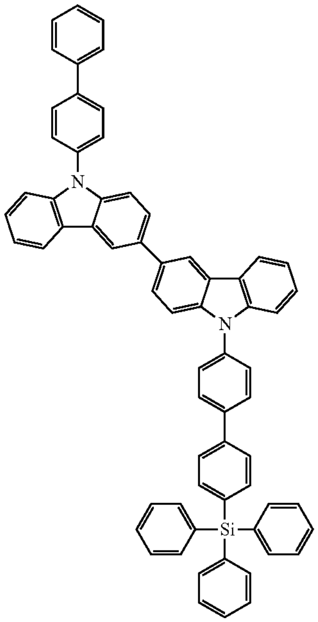
H1-202
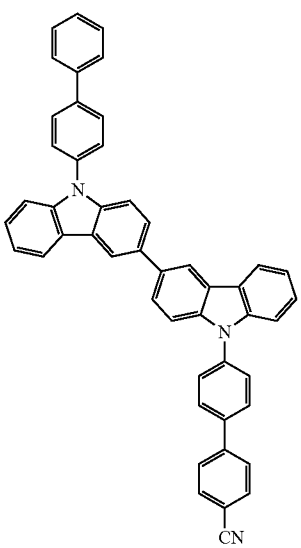
H1-203
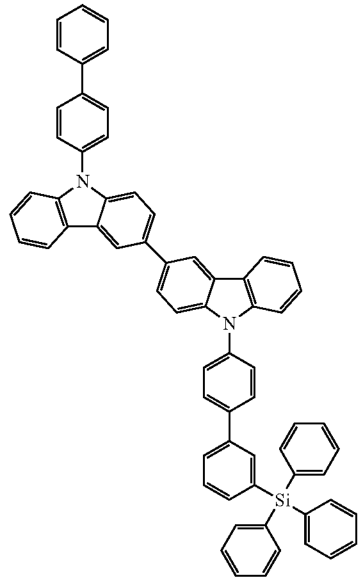
H1-204
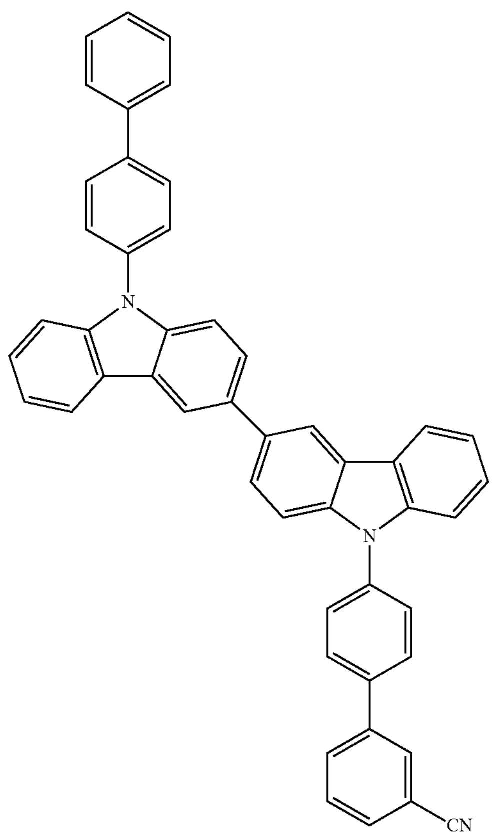

-continued
H1-205
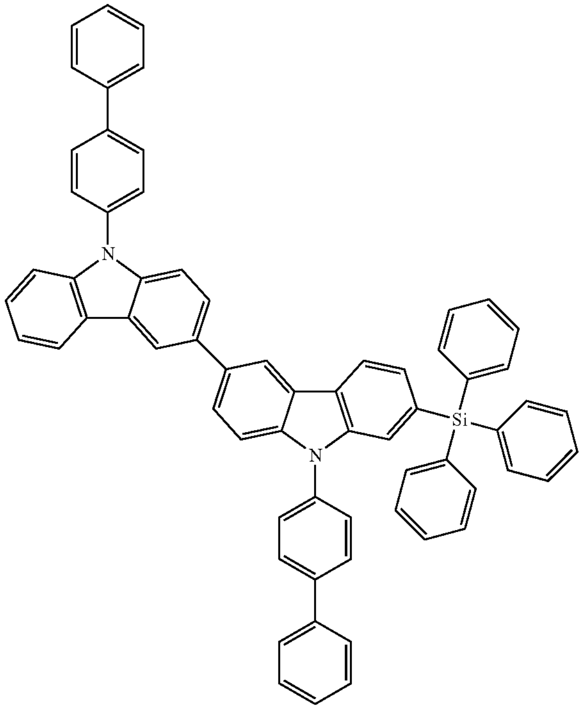
H1-206
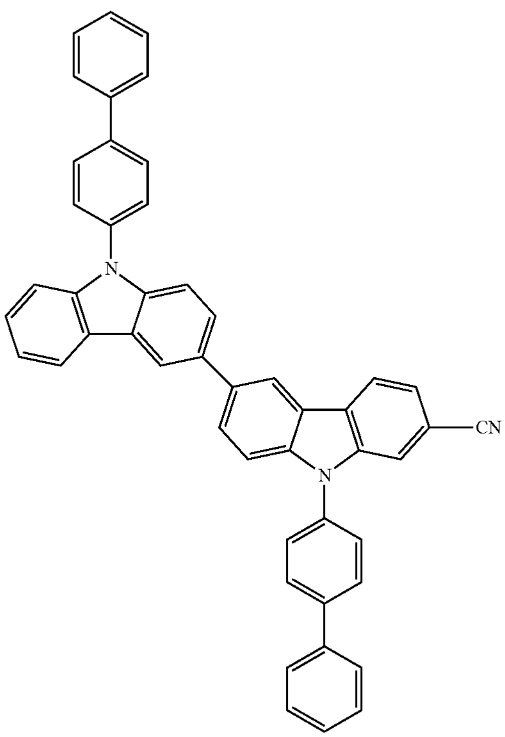
-continued
H1-207
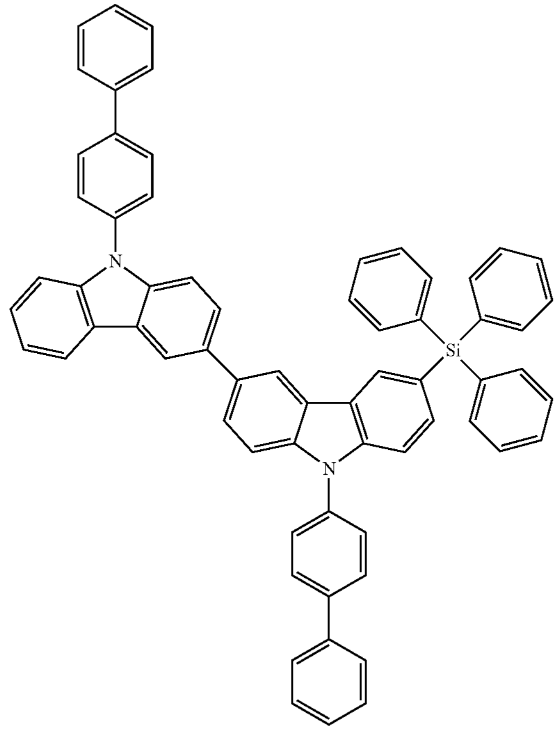
H1-208
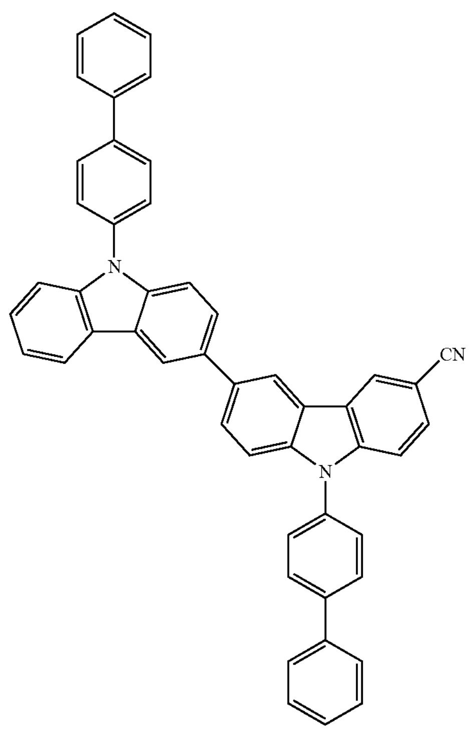

-continued
H1-209
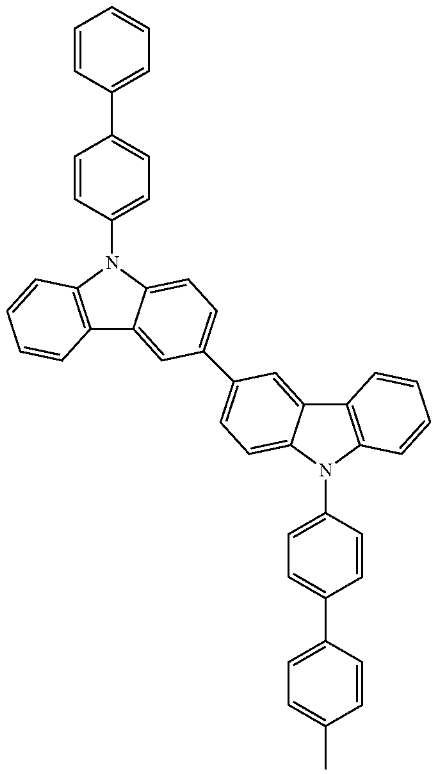
H1-210
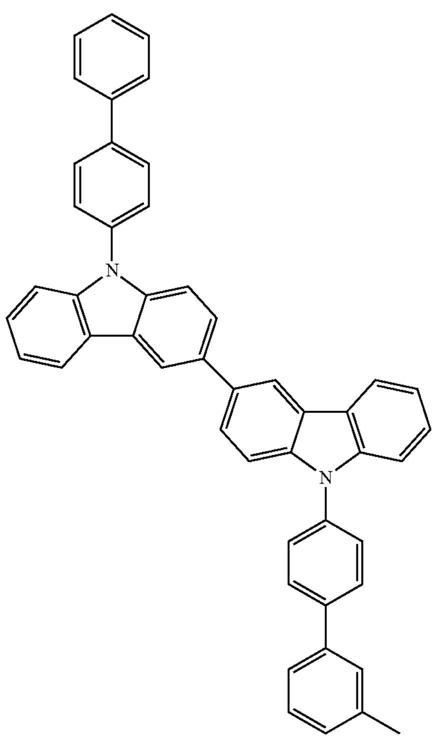
-continued
H1-211
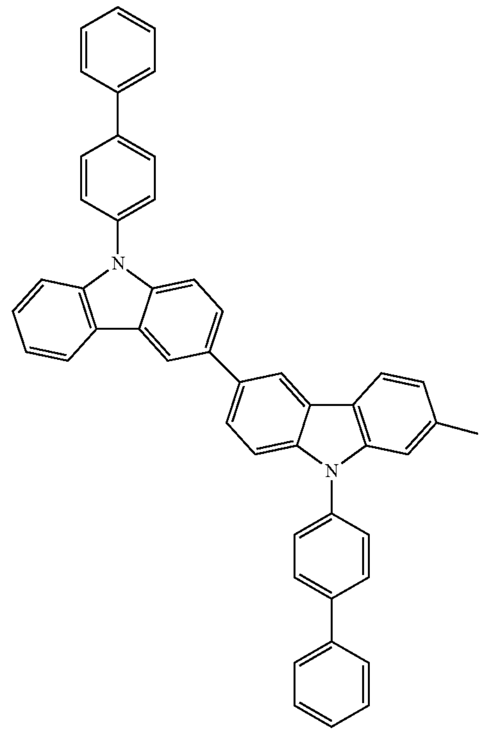
H1-212
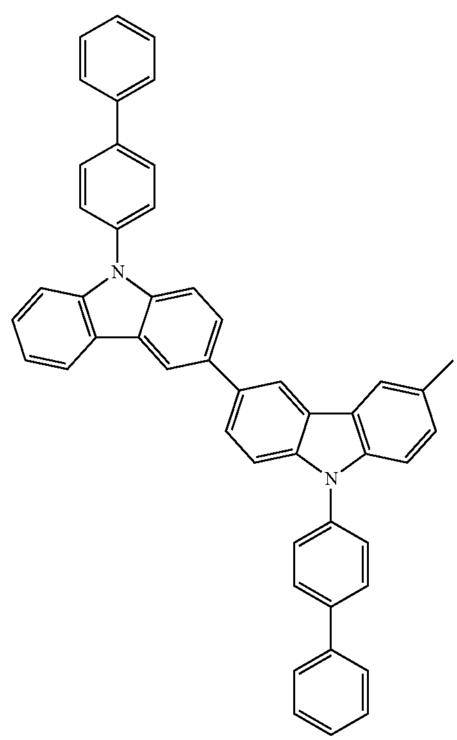

-continued
H1-213
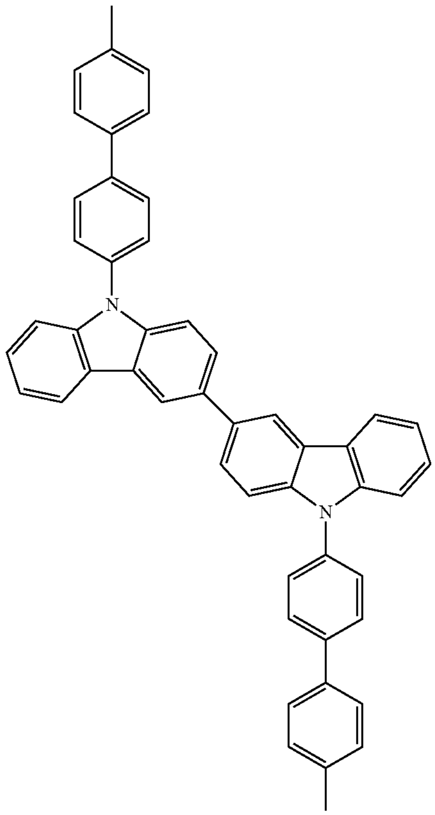
H1-214
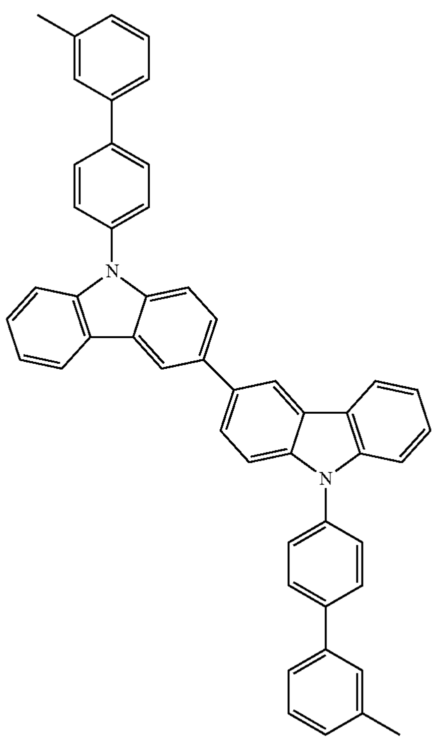
-continued
H1-215
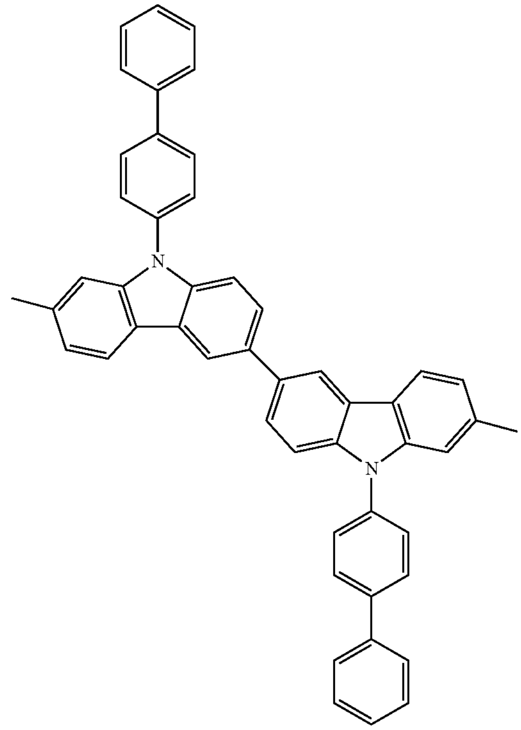
H1-216
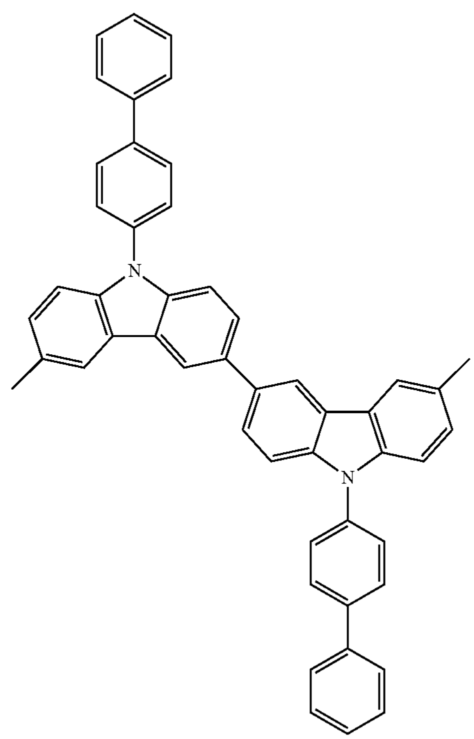

-continued
H1-217
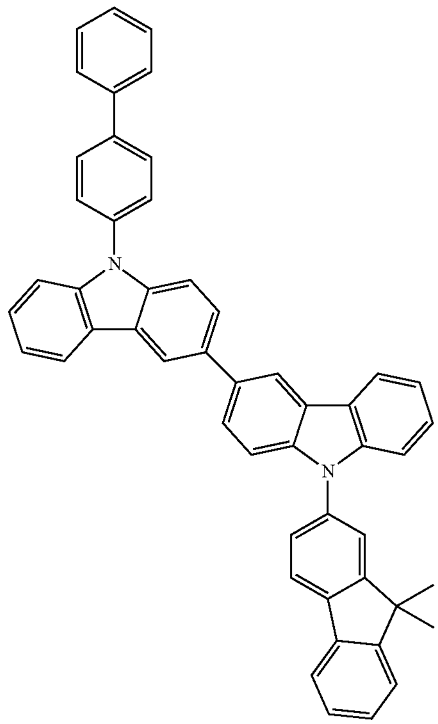
H1-218
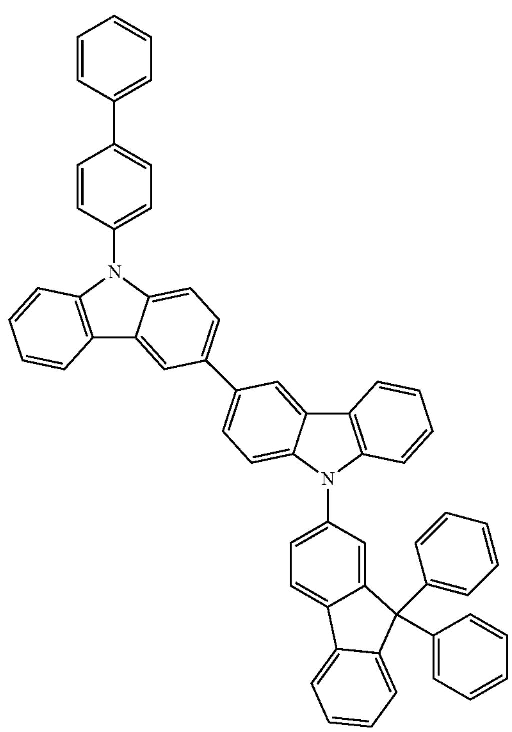
-continued
H1-219
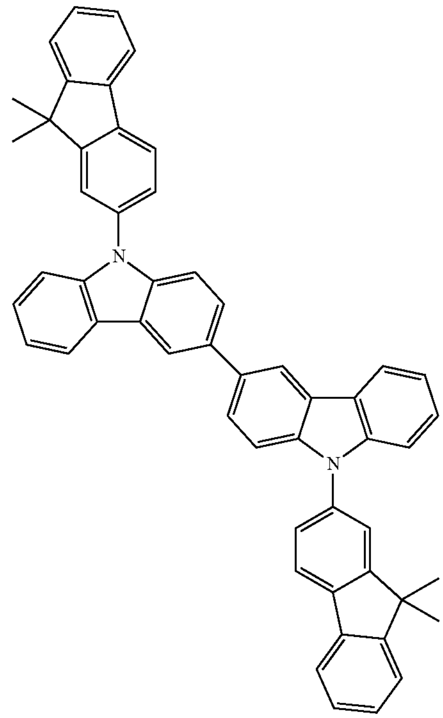
H1-220
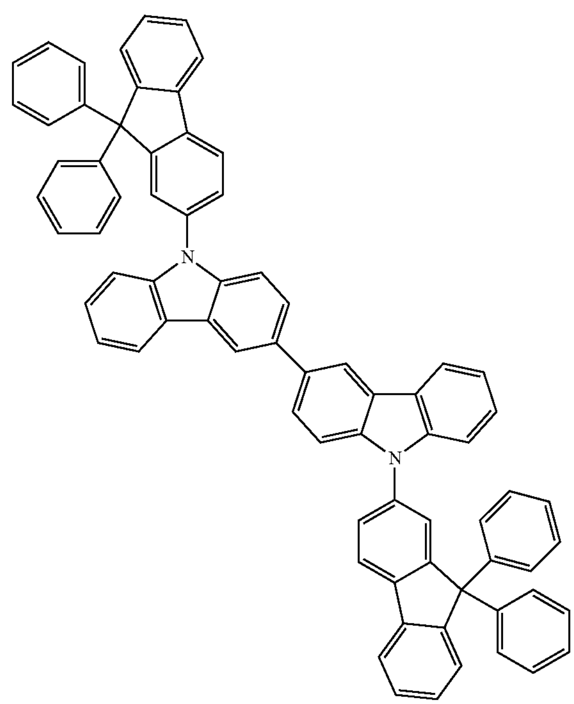

-continued
H1-221
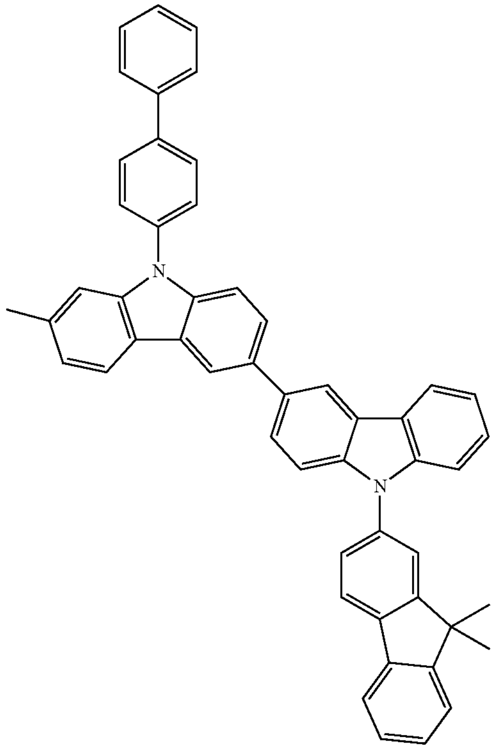
H1-222
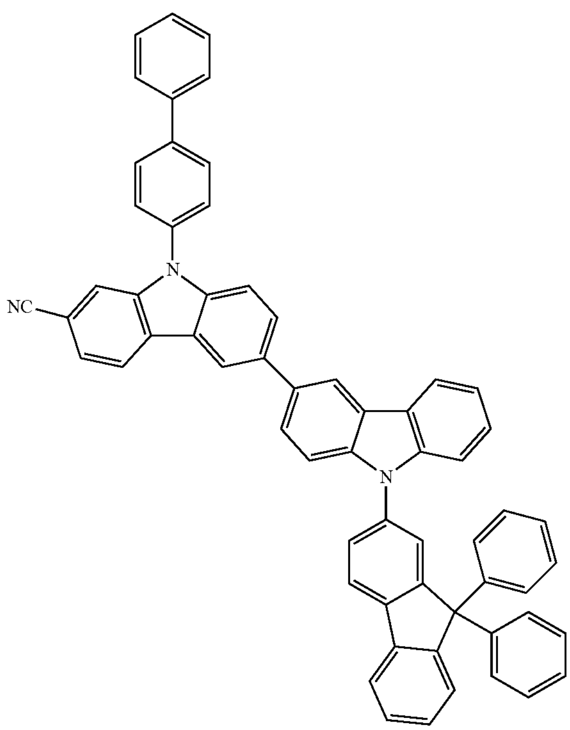
-continued
H1-223
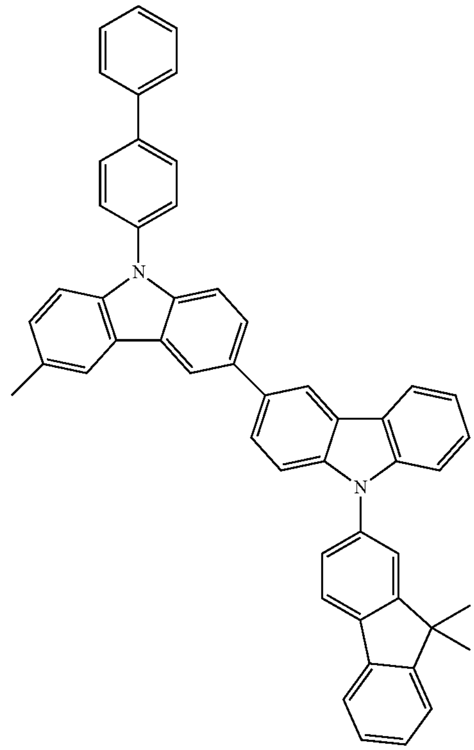
H1-224
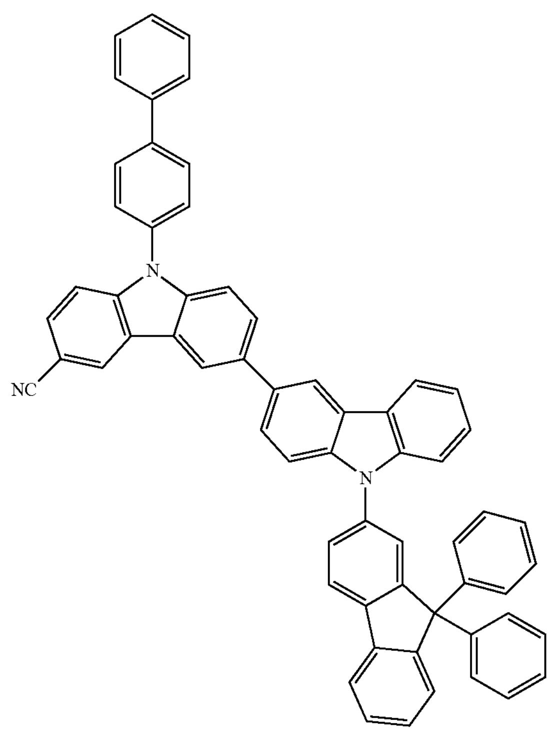

-continued
H1-225
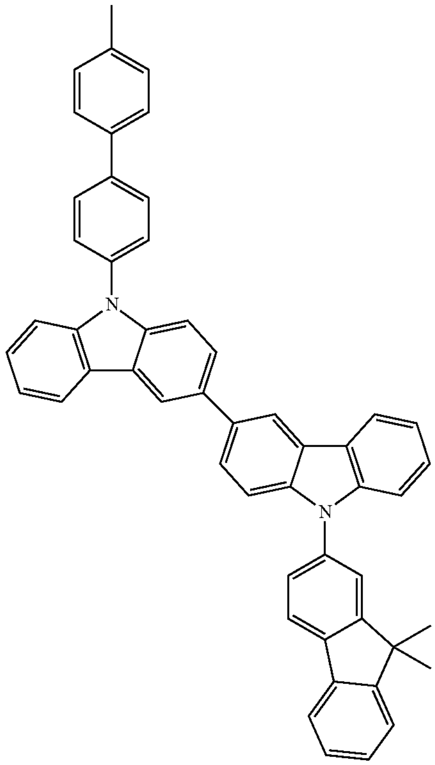
H1-226
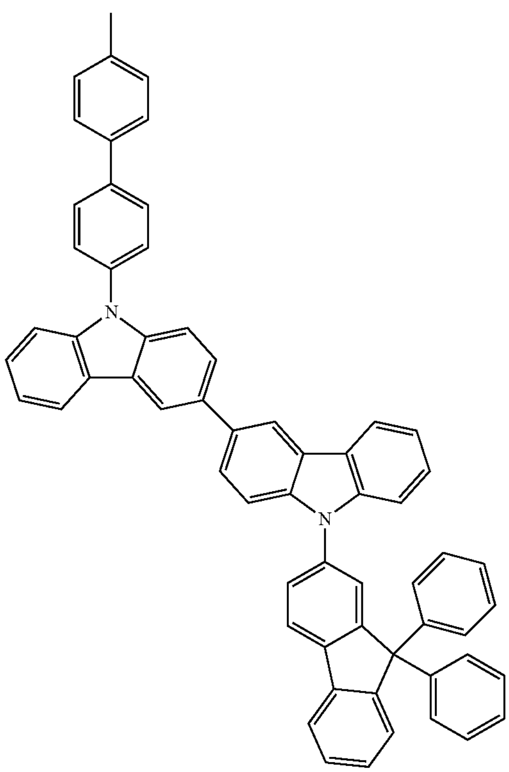
-continued
H1-227
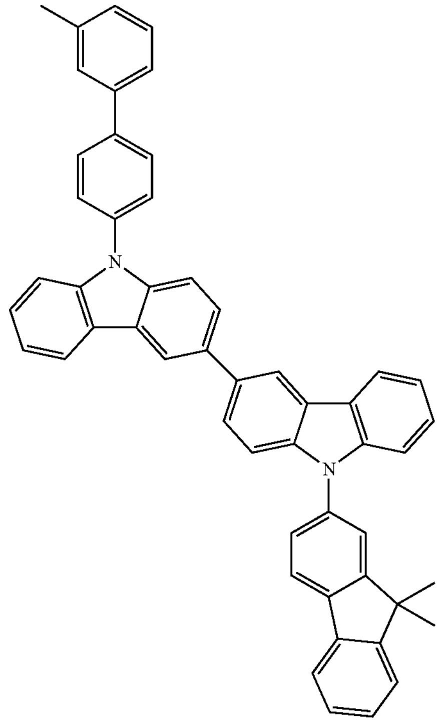
H1-228
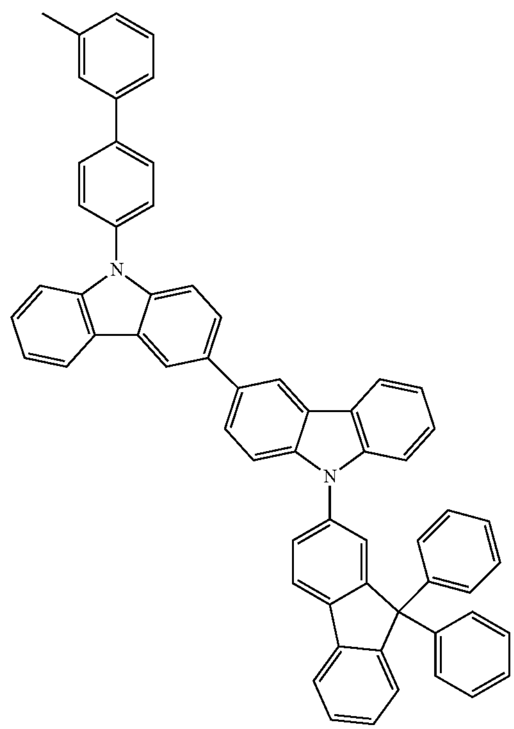

H1-229
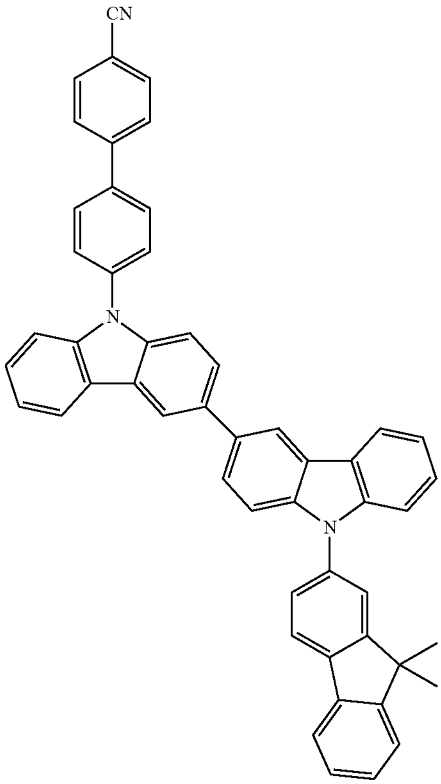
H1-230
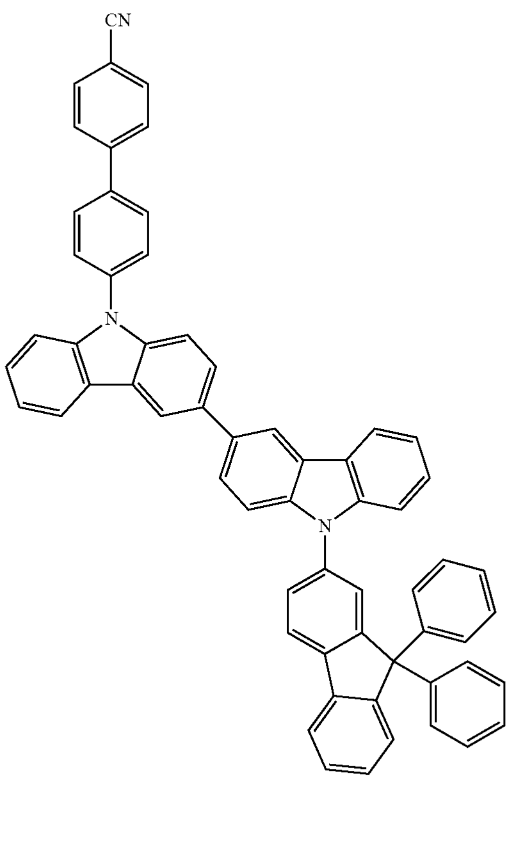
H1-231
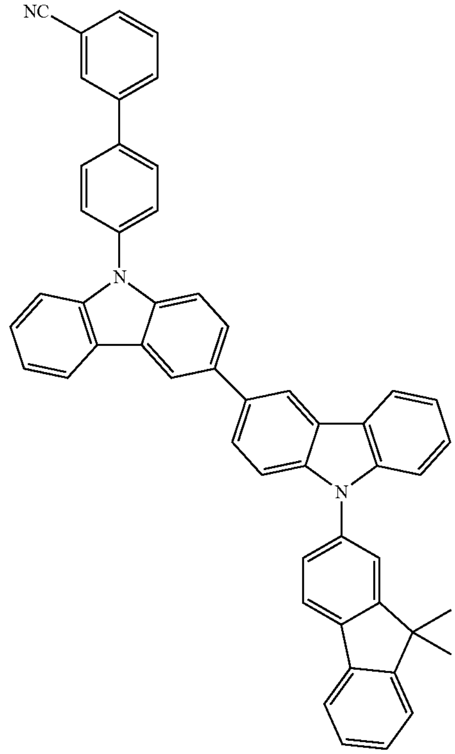
H1-232
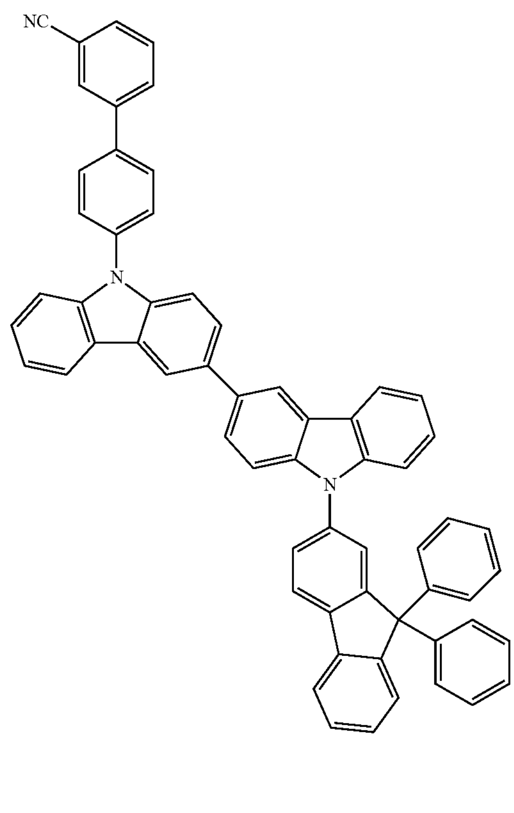

-continued
H1-233
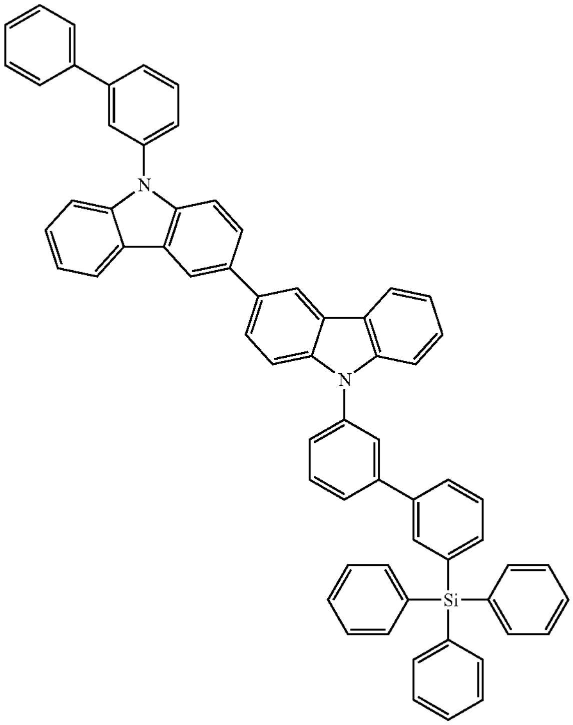
H1-234
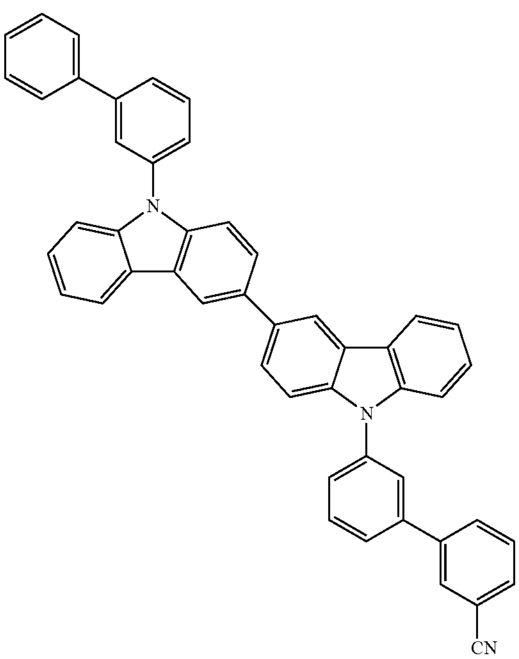
-continued
H1-235
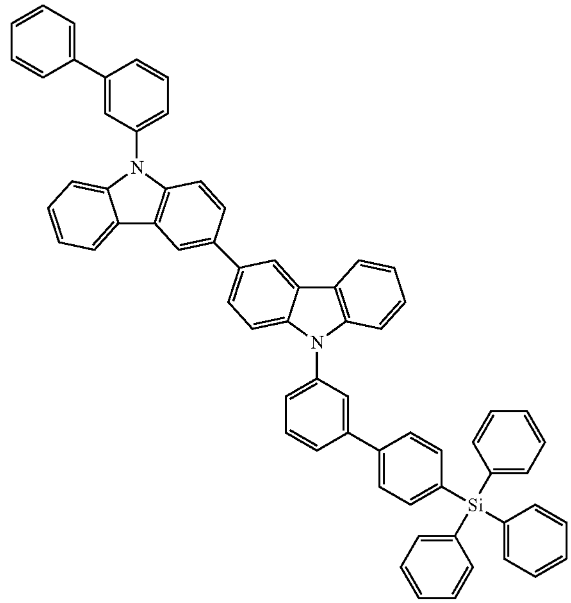
H1-236
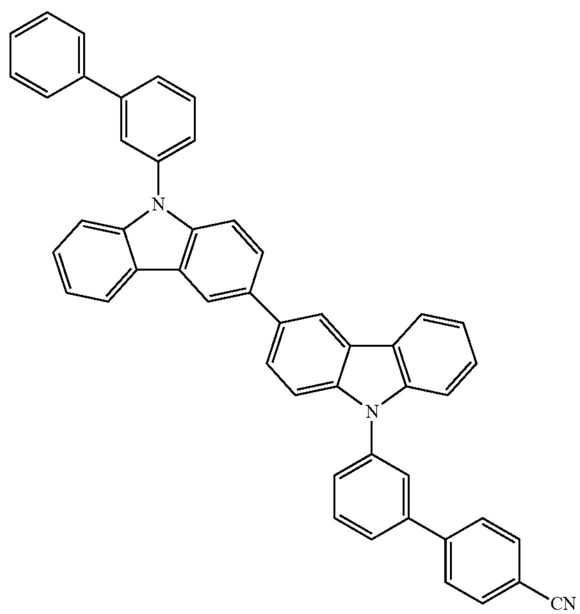

-continued
H1-237
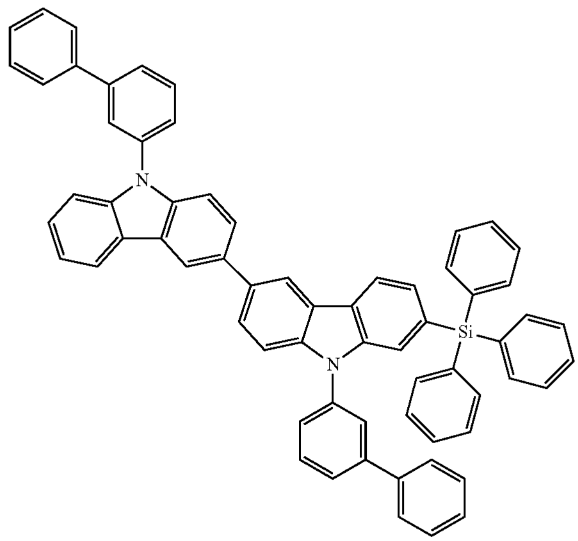
H1-238
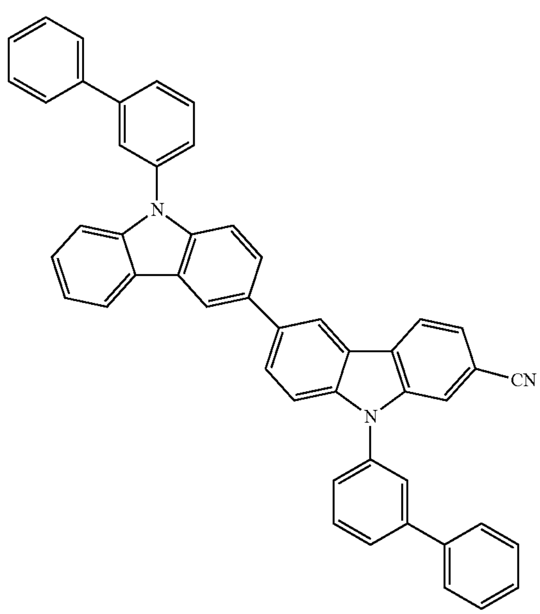
-continued
H1-239
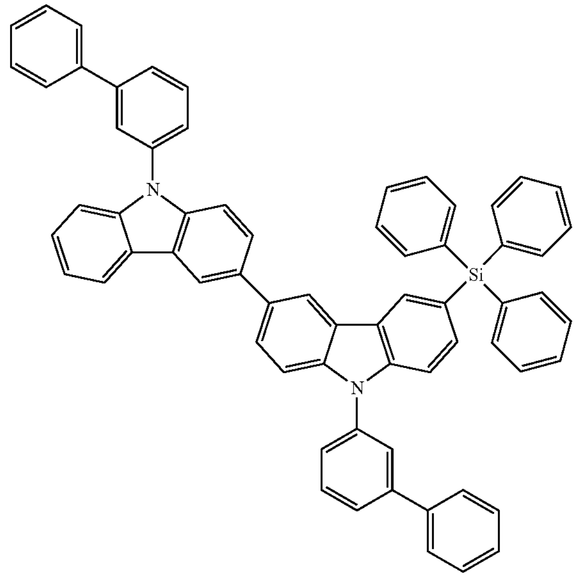
H1-240
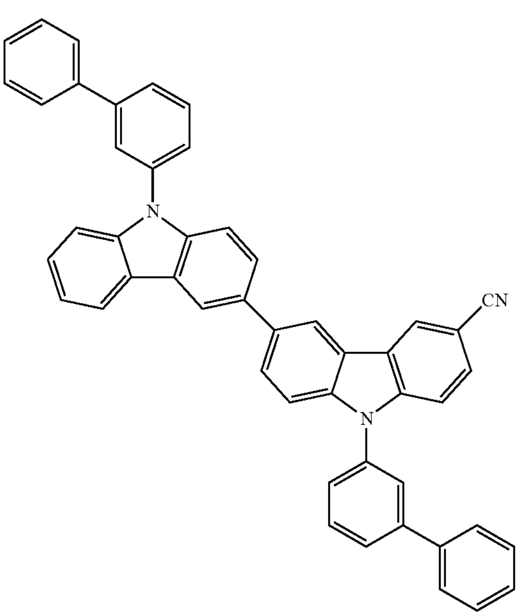

H1-241
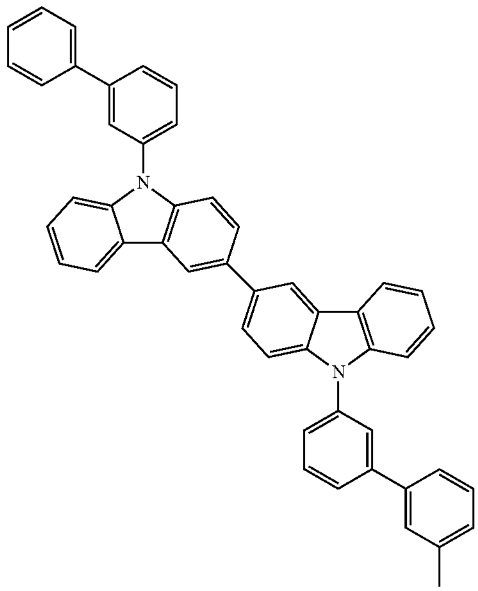
H1-243
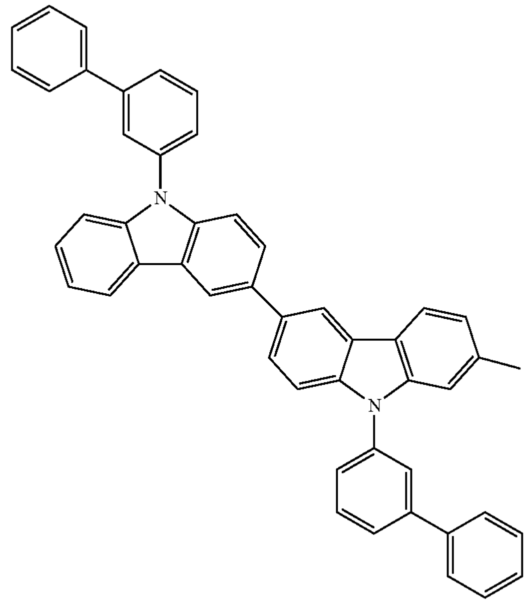
H1-242
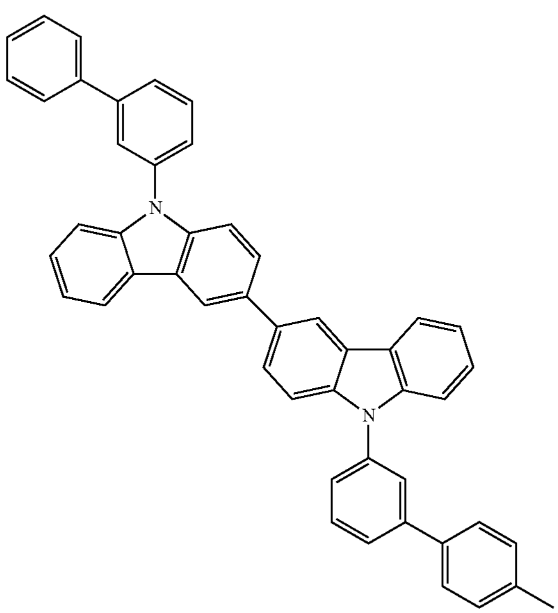
H1-244
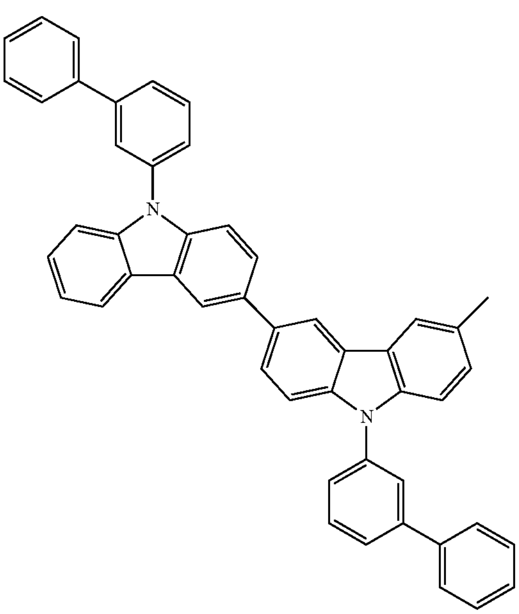

H1-245
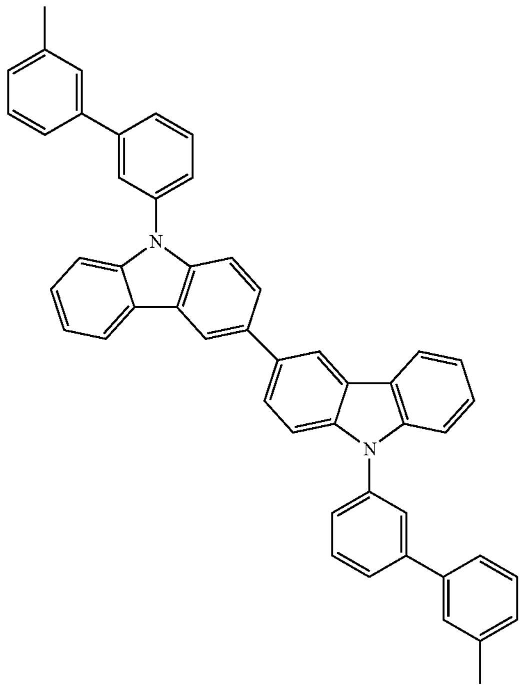
H1-246
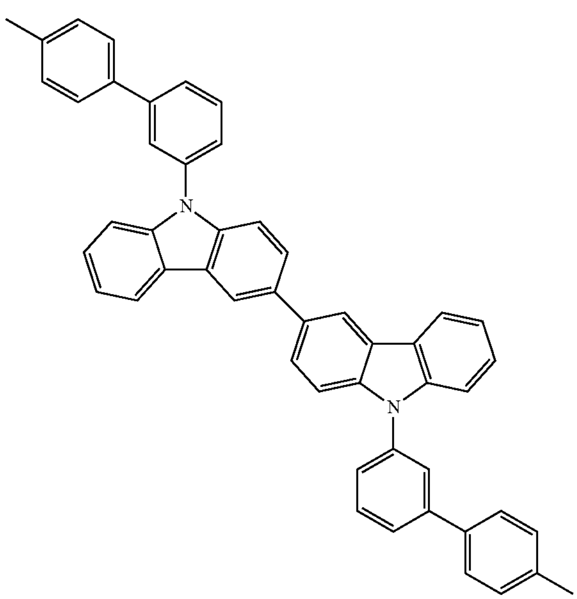
H1-247
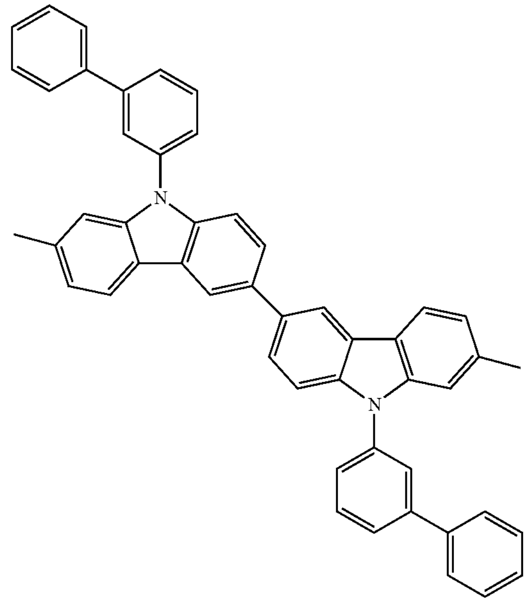
H1-248
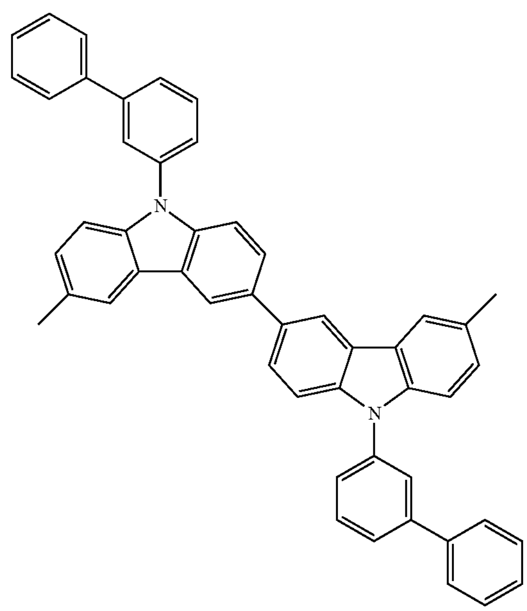

-continued
H1-249
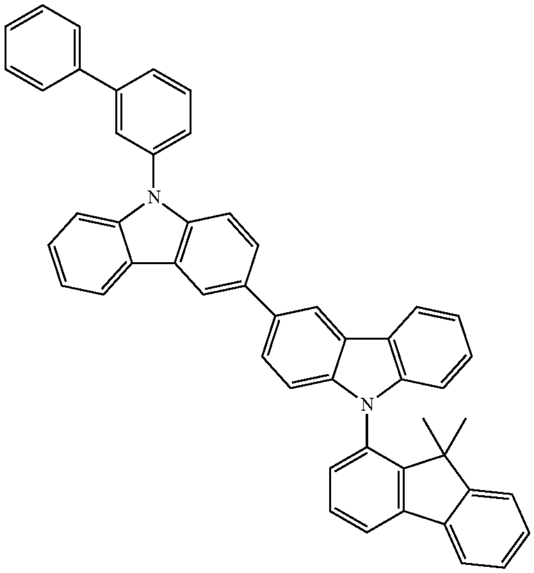
H1-250
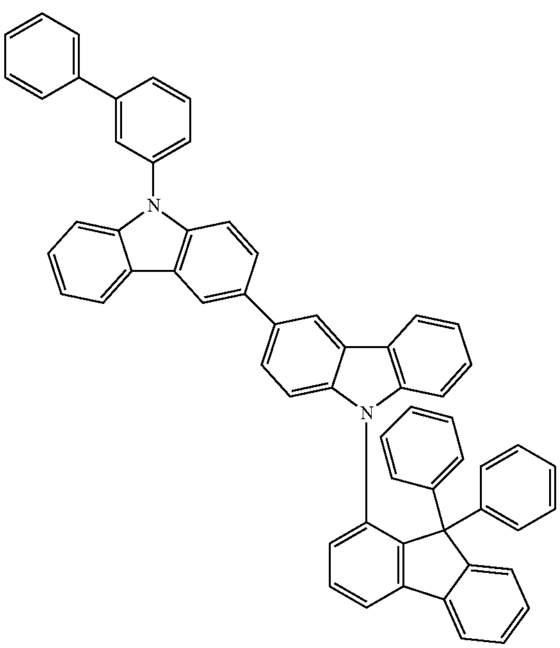
-continued
H1-251
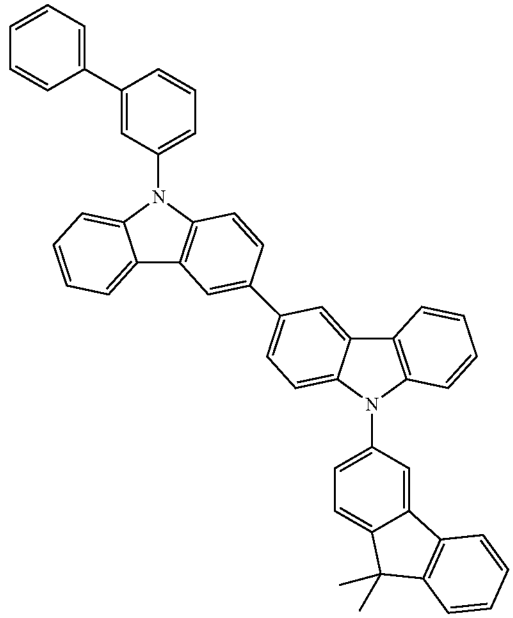
H1-252
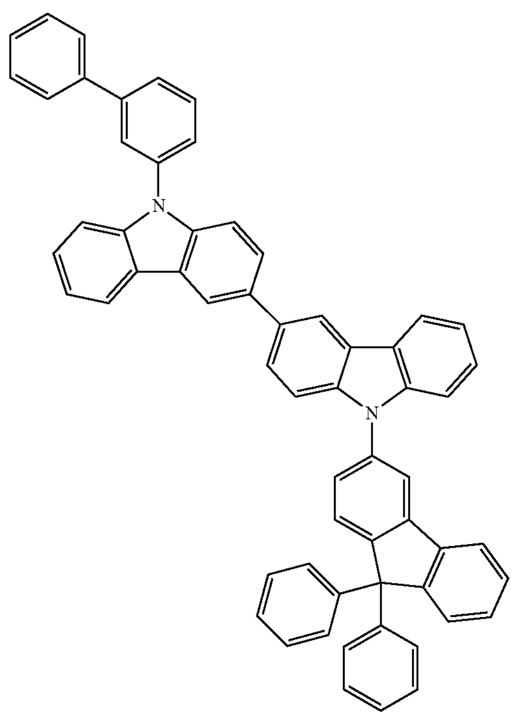

-continued
H1-253
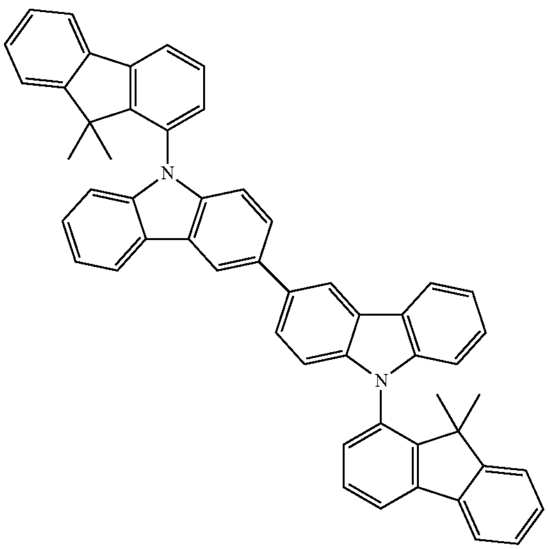
H1-254
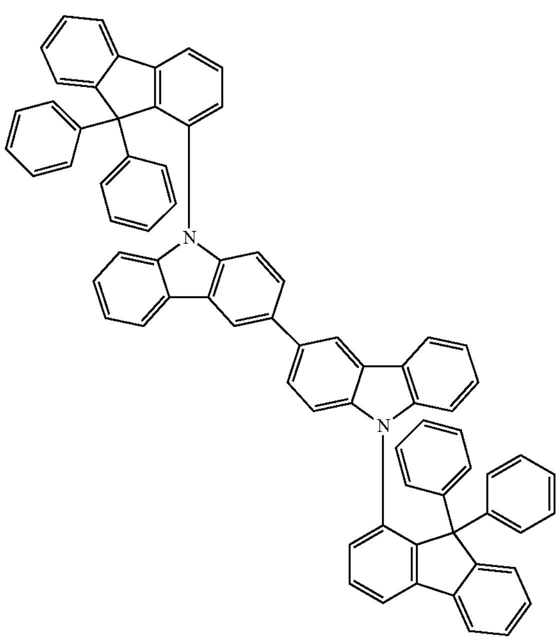
-continued
H1-255
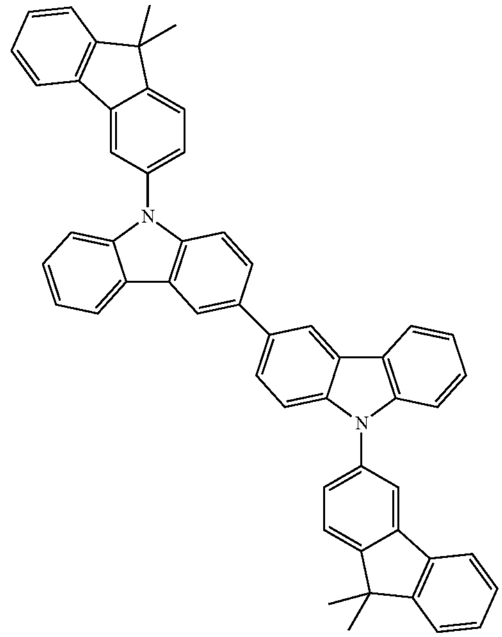
H1-256
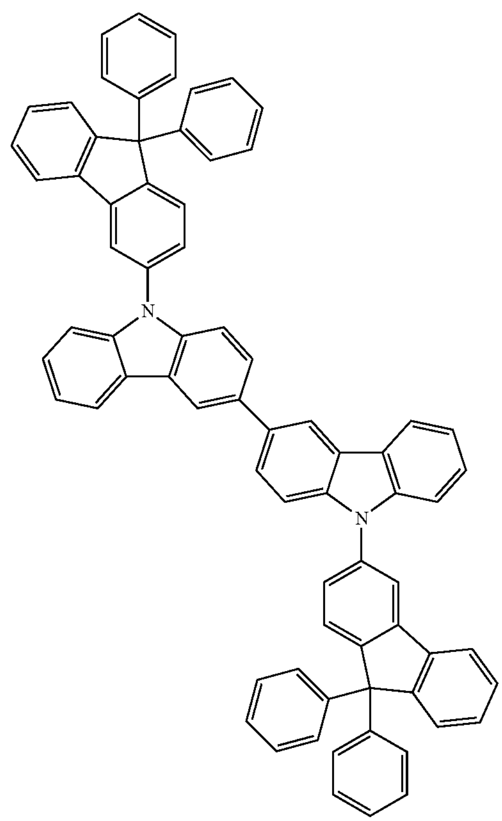

H1-257
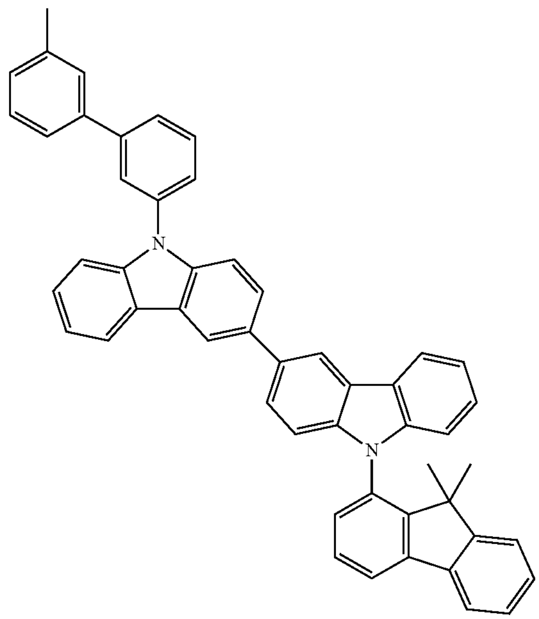
H1-258
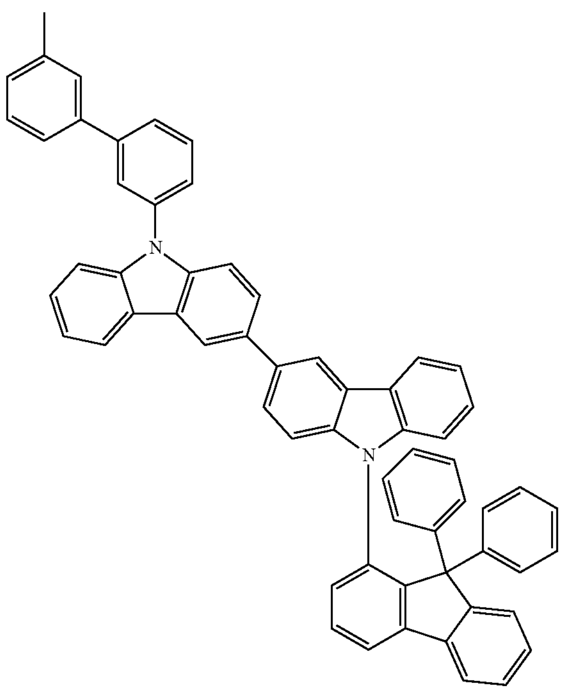
H1-259
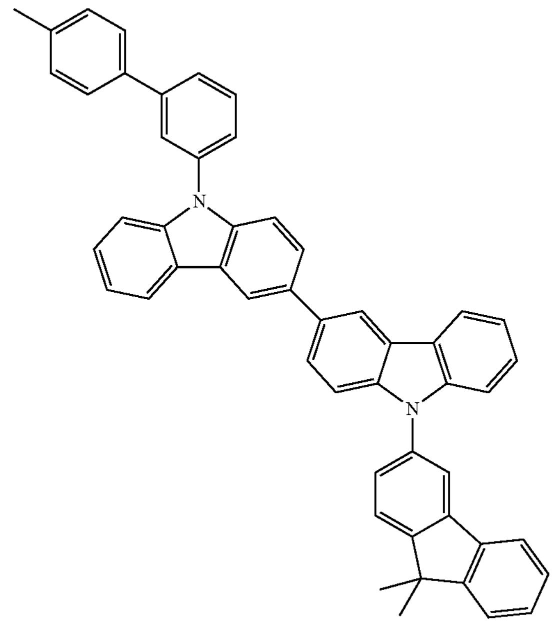
H1-260
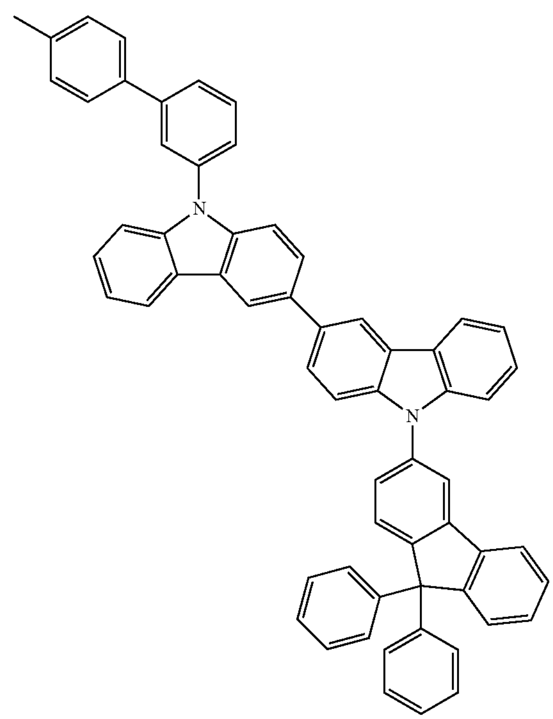

-continued
H1-261
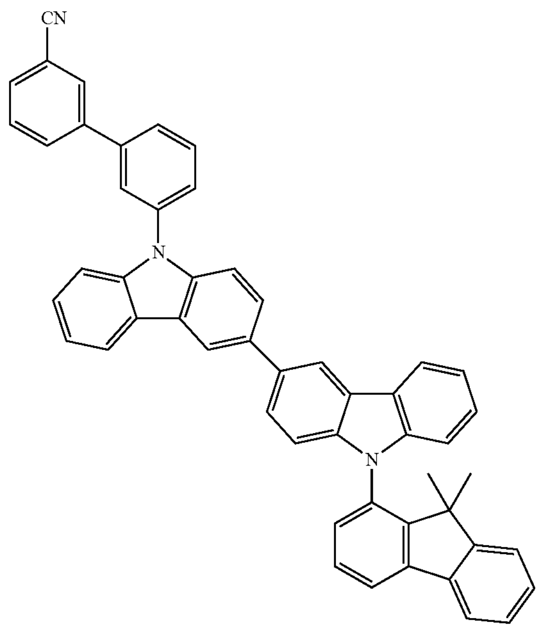
H1-262
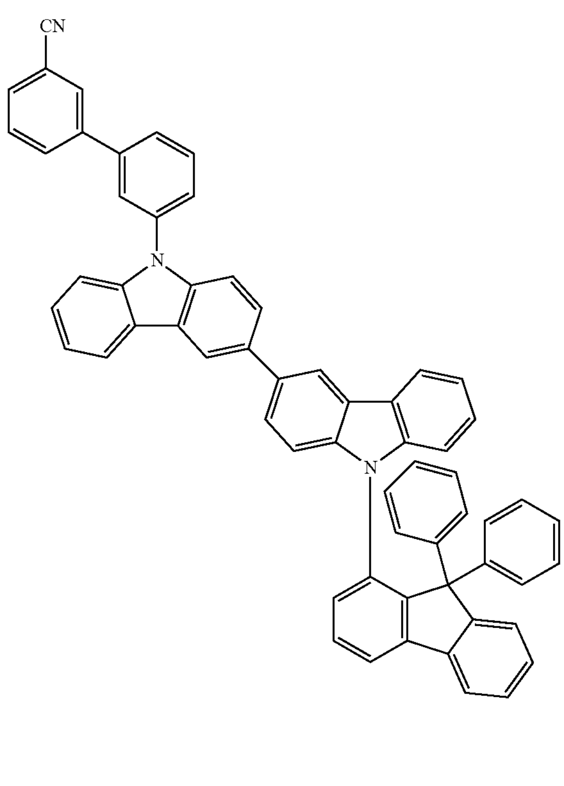
-continued
H1-263
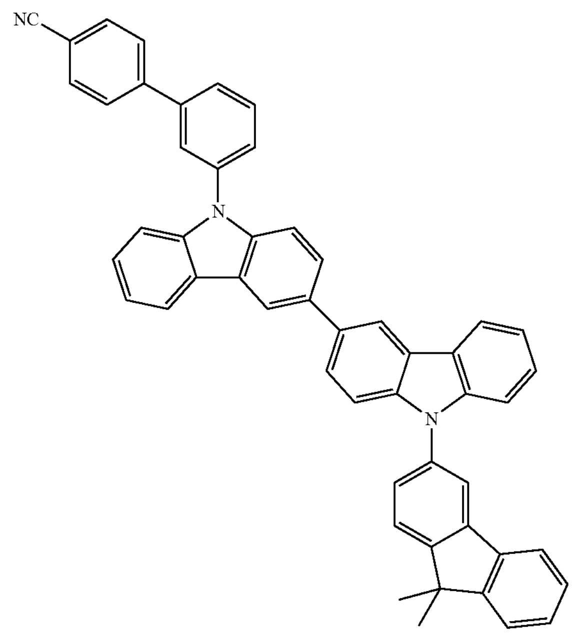
H1-264
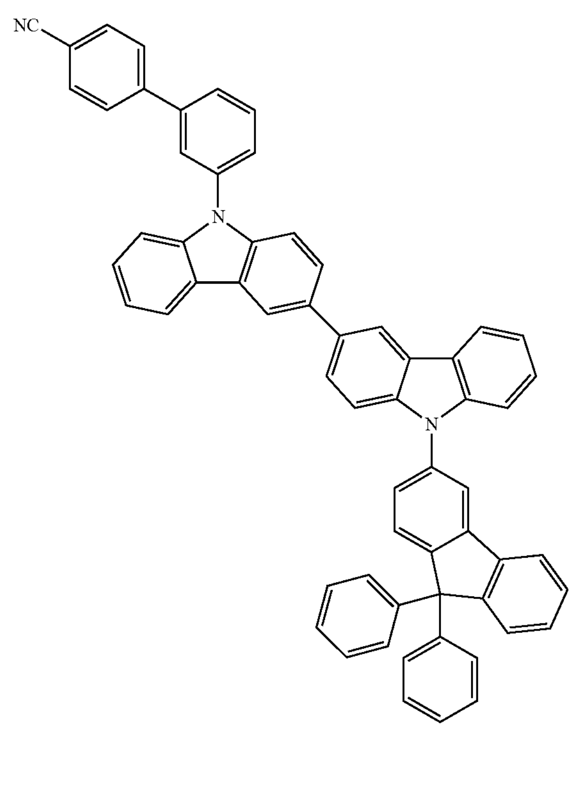

-continued
H1-265
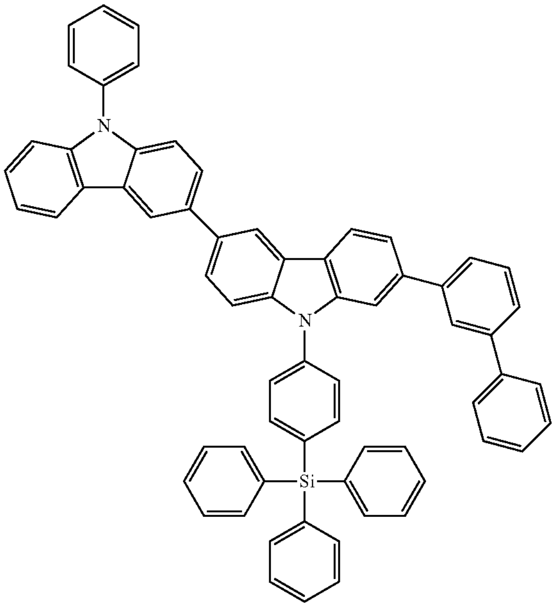
H1-266
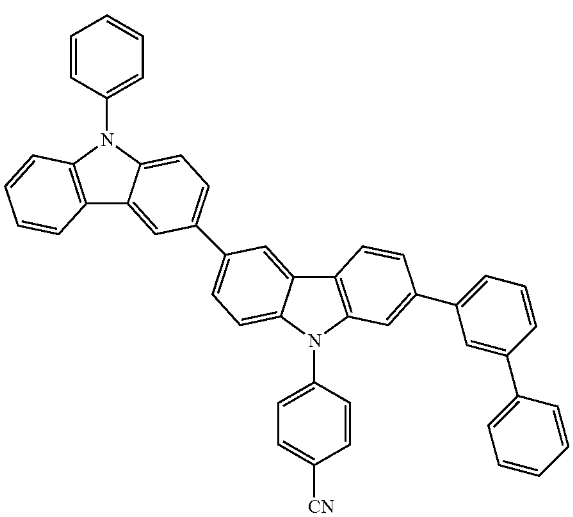
-continued
H1-267
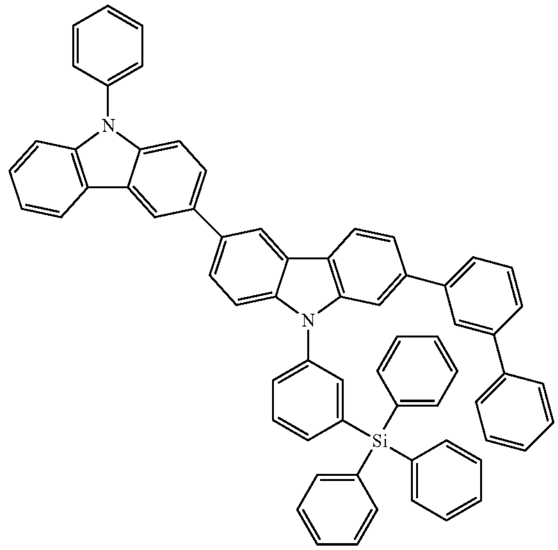
H1-268
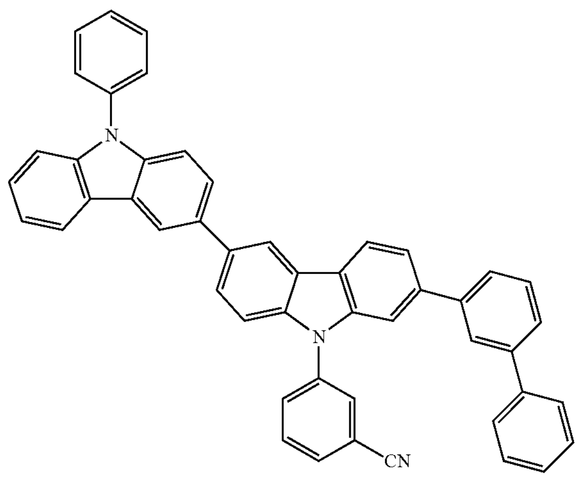
H1-269
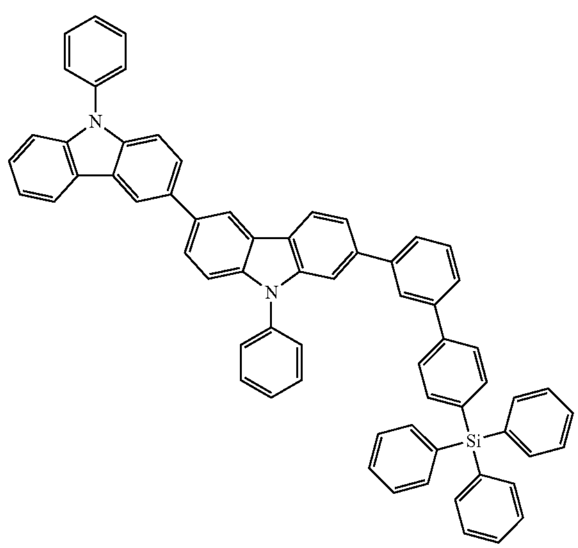

-continued
H1-270
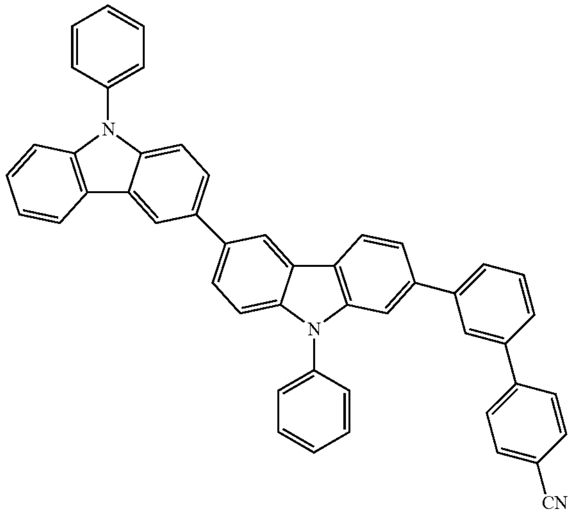
H1-271
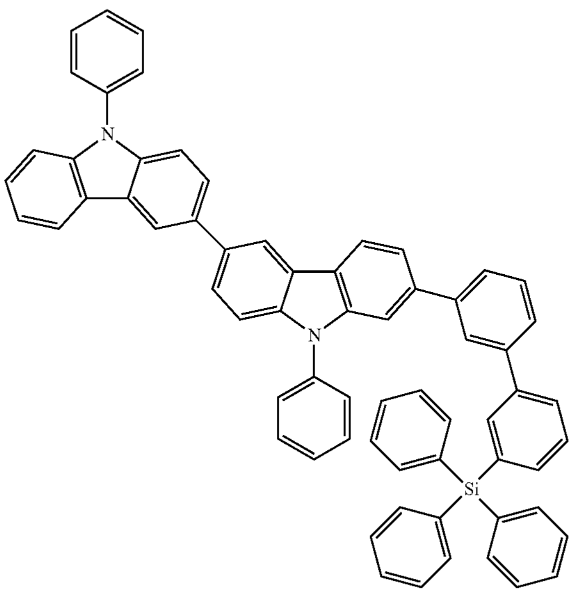
H1-272
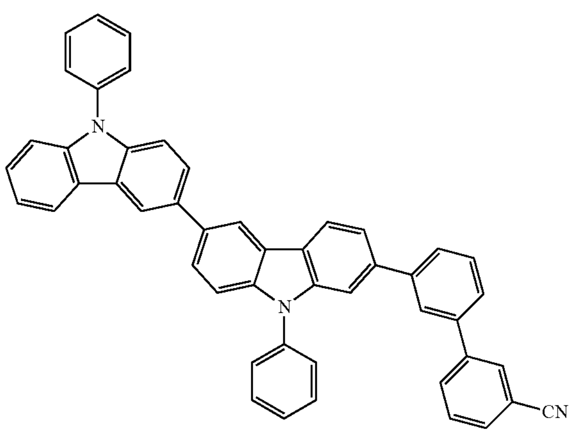
-continued
H1-273
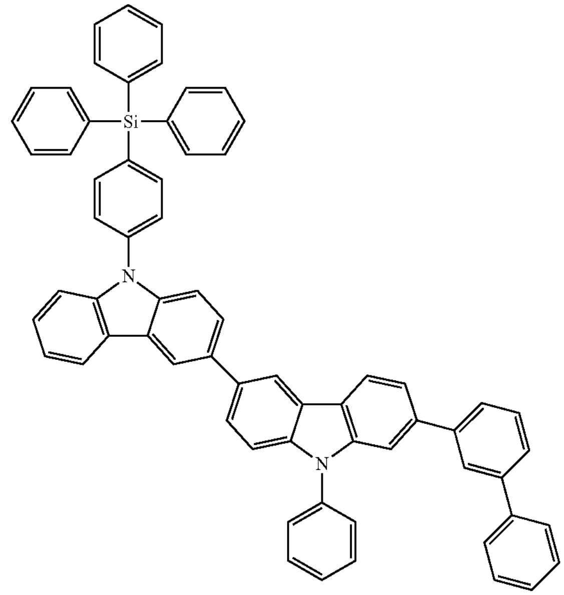
H1-274
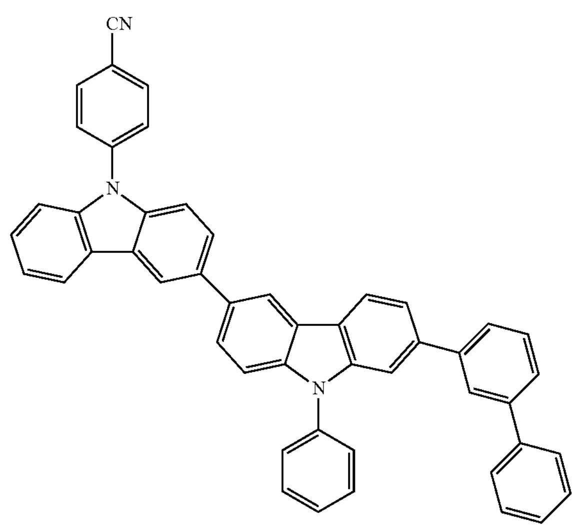

-continued
H1-275
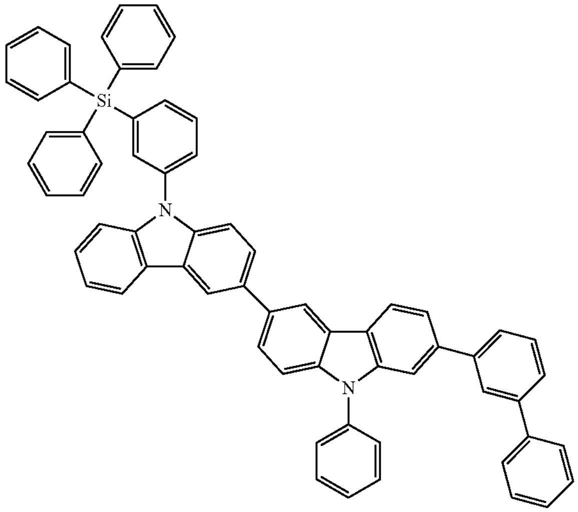
H1-276
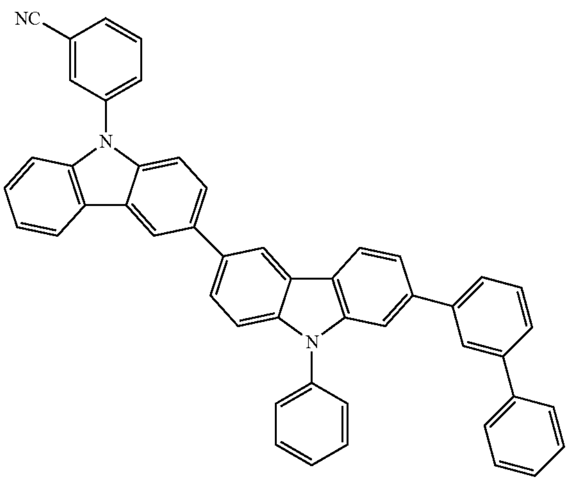
H1-277
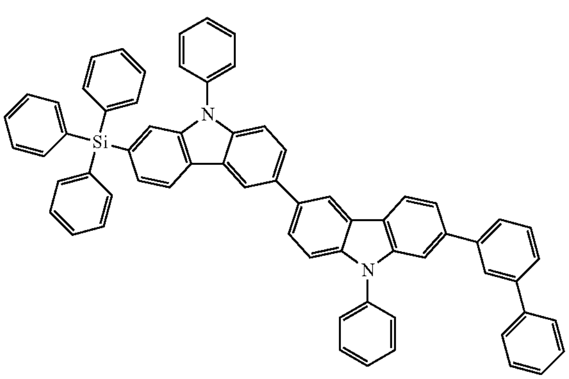
-continued
H1-278
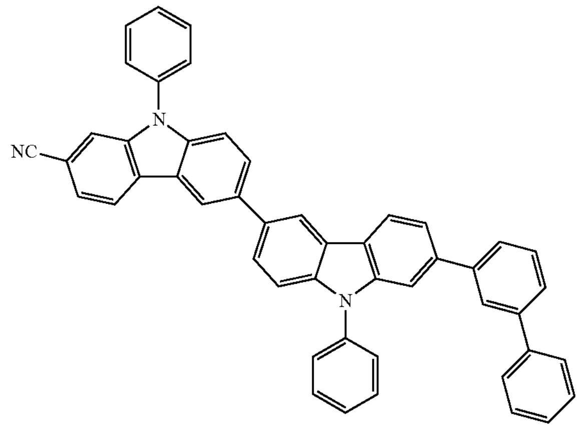
H1-279
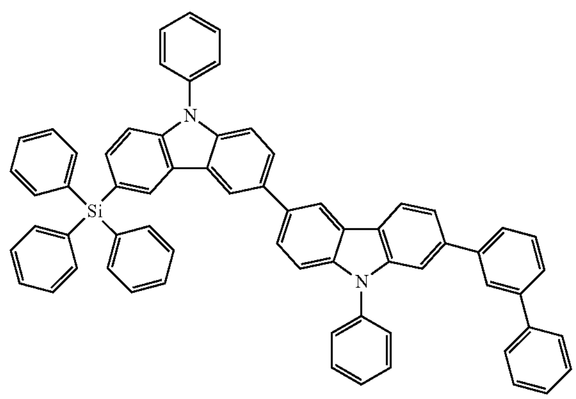
H1-280
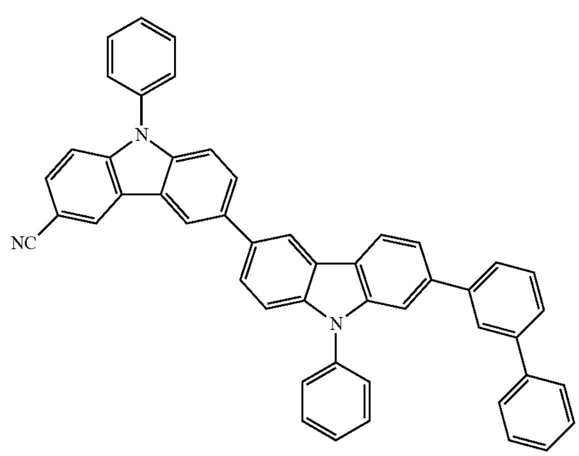

-continued
H1-281
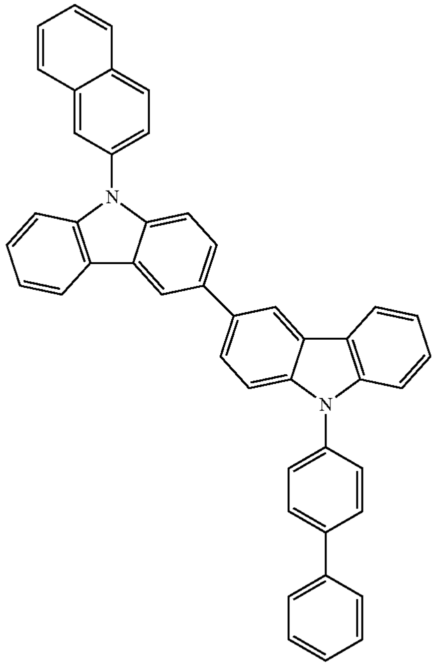
H1-282
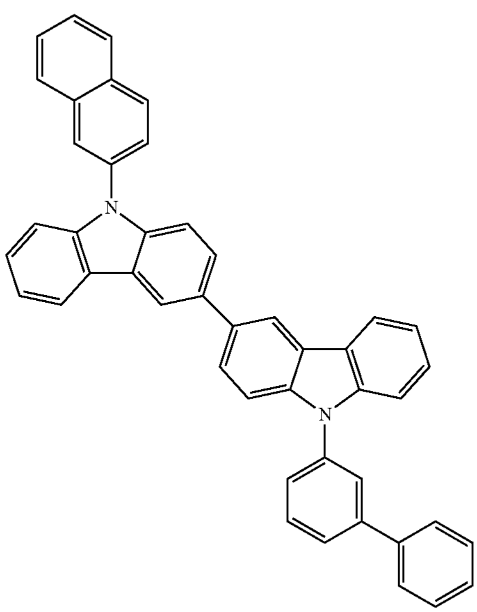
-continued
H1-283
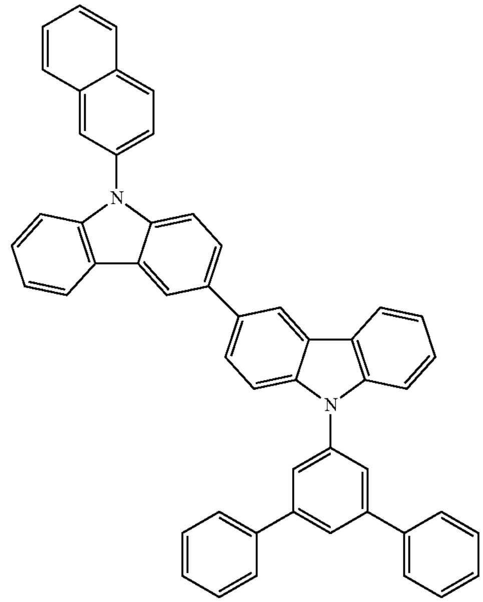
H1-284
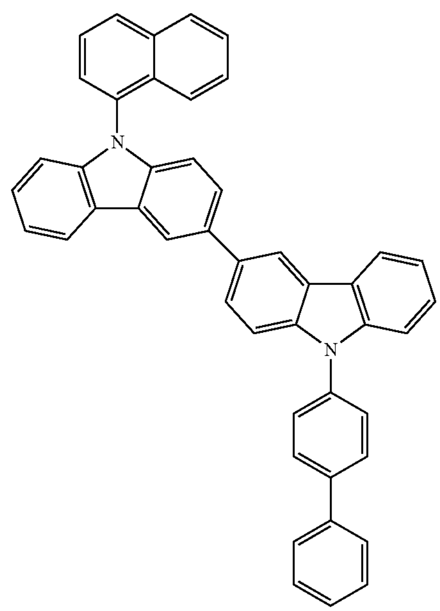

-continued
H1-285
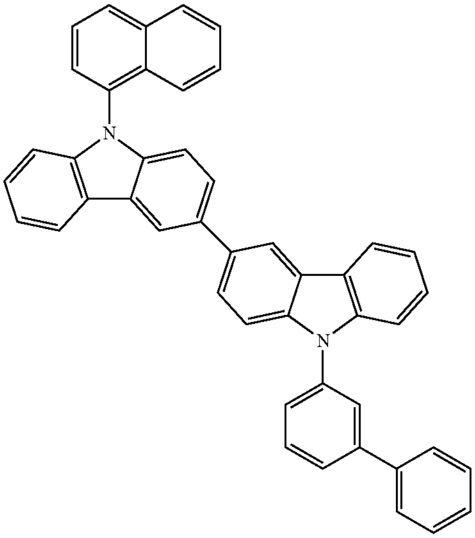
H1-286
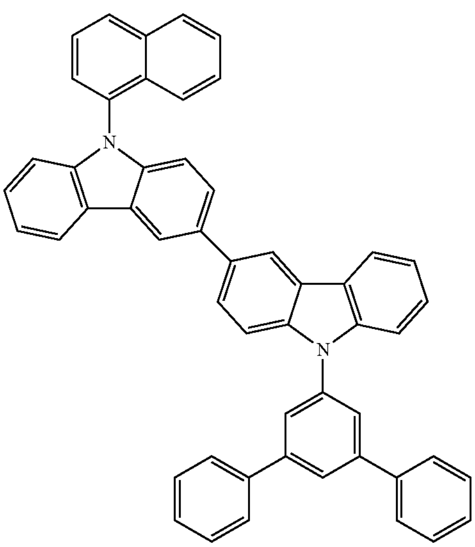
-continued
H1-287
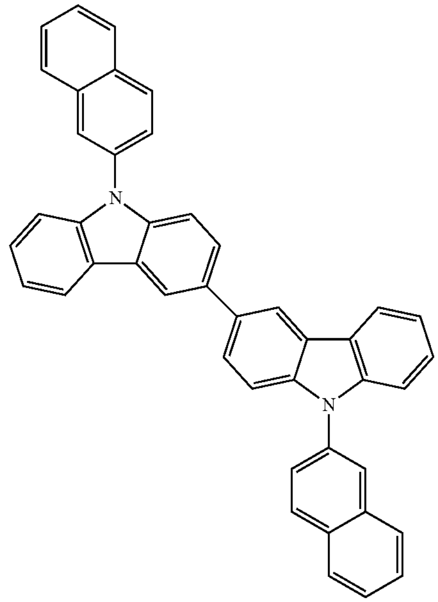
H1-288
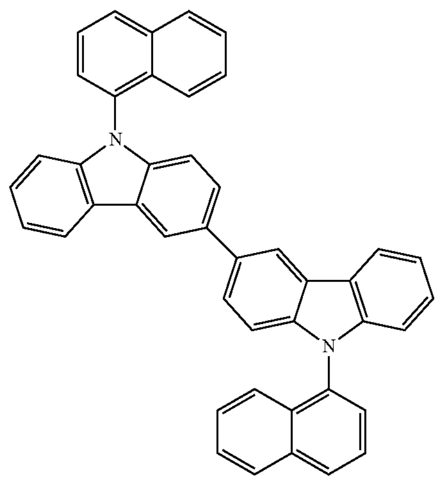
H1-290
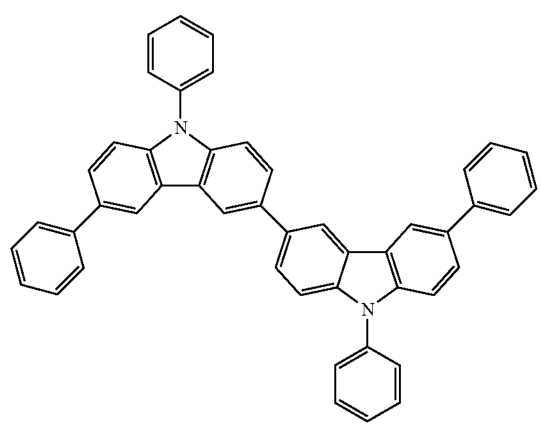

-continued
H1-291
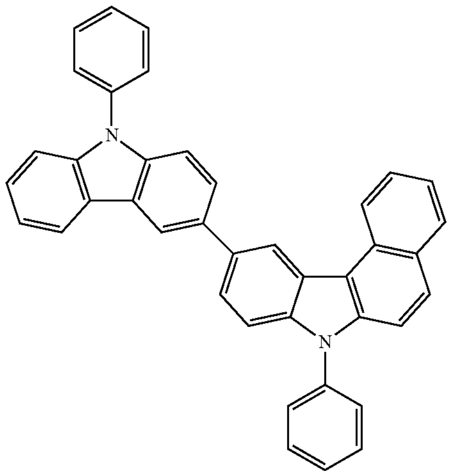
H1-292
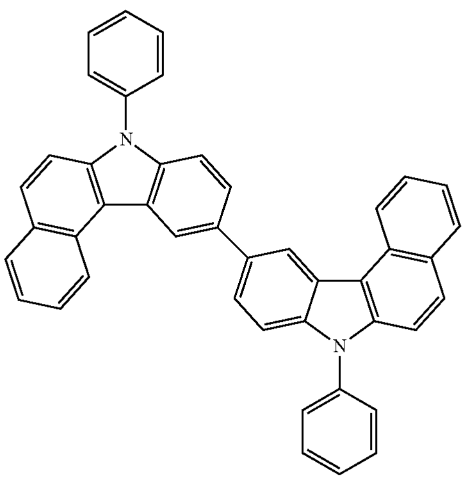
H1-293
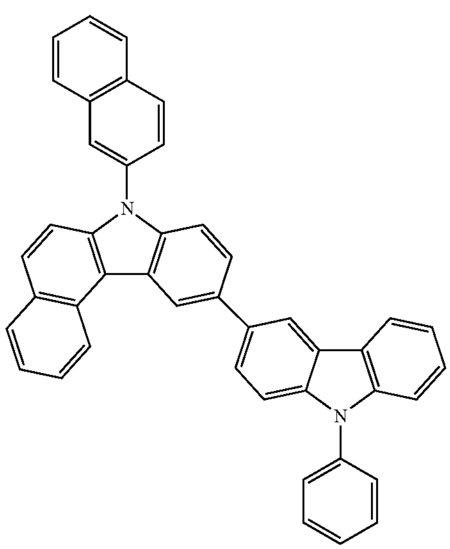
-continued
H1-294
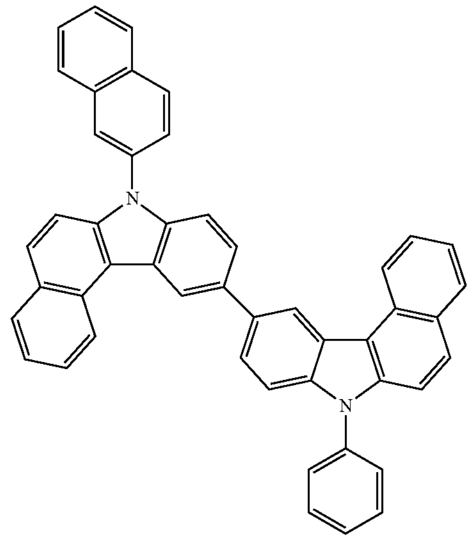
H1-295
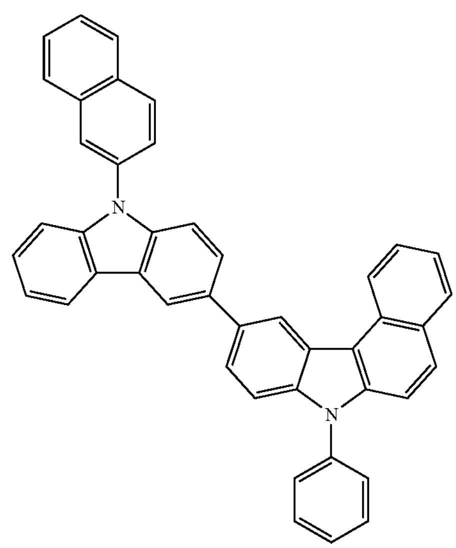

-continued
H1-296
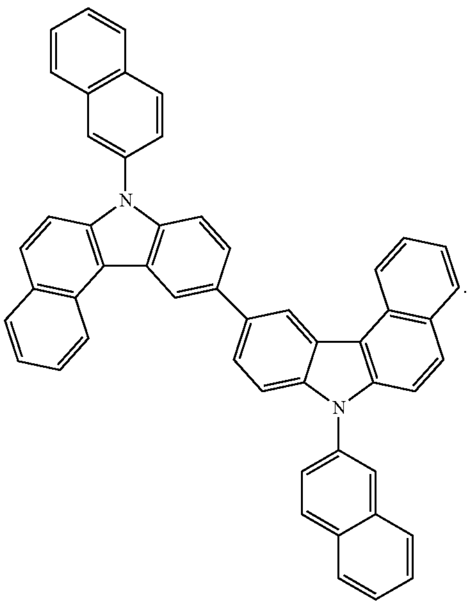
The compound of formula 2 as a second host compound may be selected from the group consisting of following compounds, but is not limited thereto:
H2-1
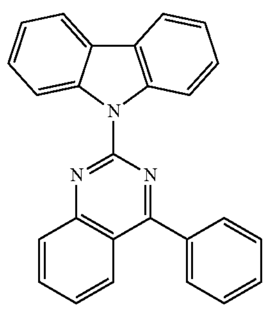
H2-2
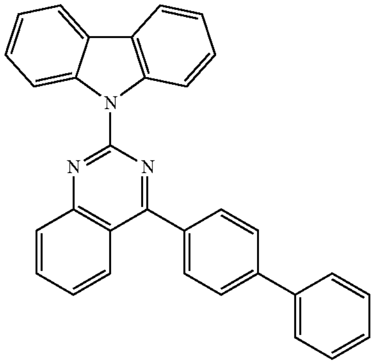
-continued
H2-3
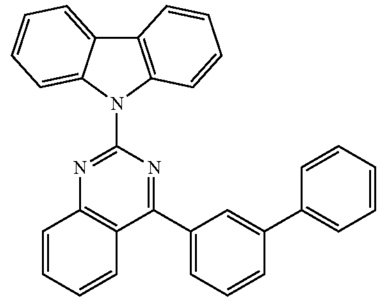
H2-4
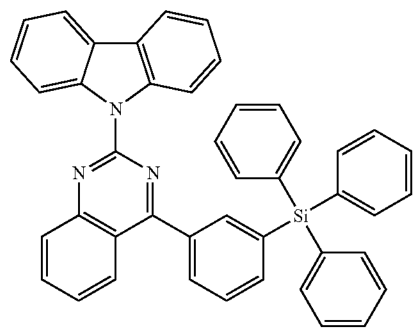
H2-5
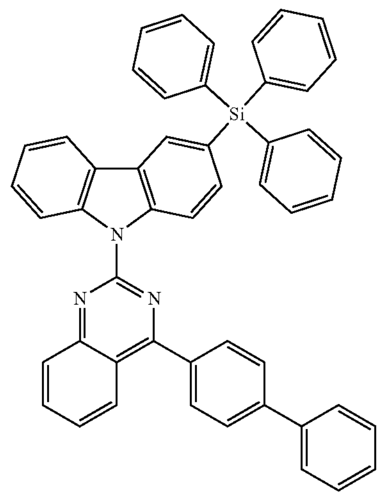
H2-6
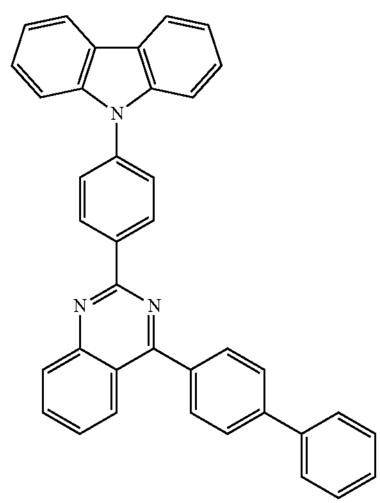

H2-7
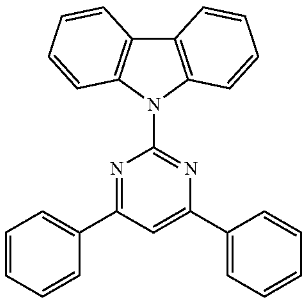
H2-8
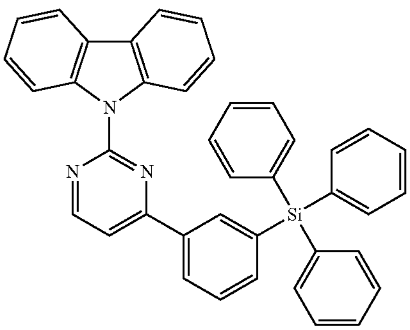
H2-9
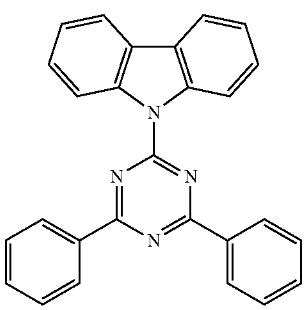
H2-10
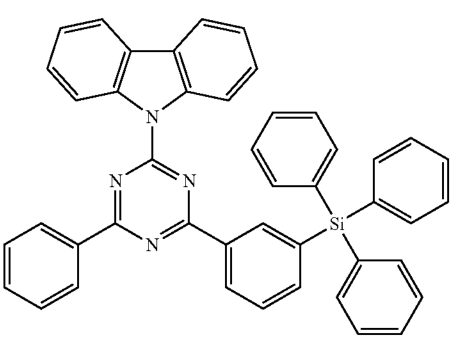
H2-11
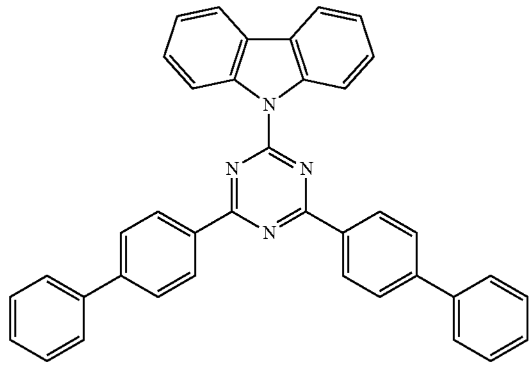
H2-12
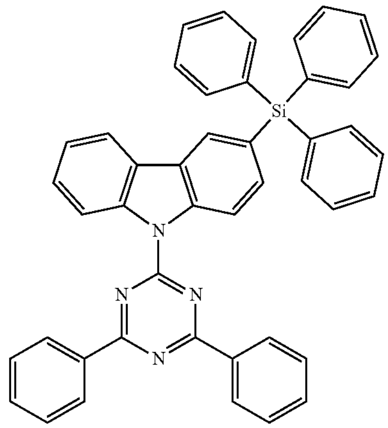
H2-13
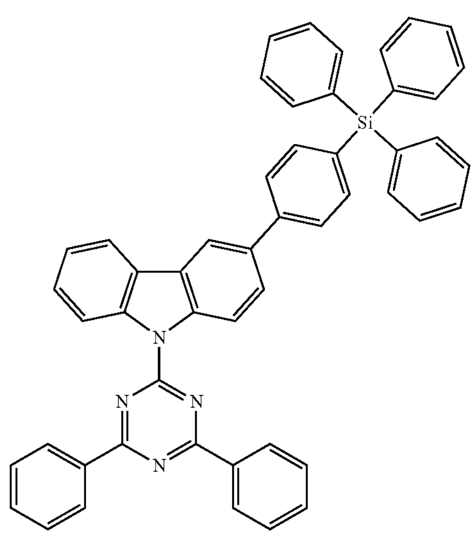

-continued
H2-14
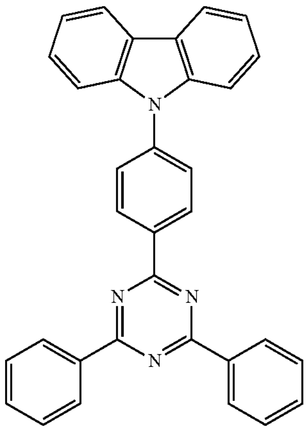
H2-15
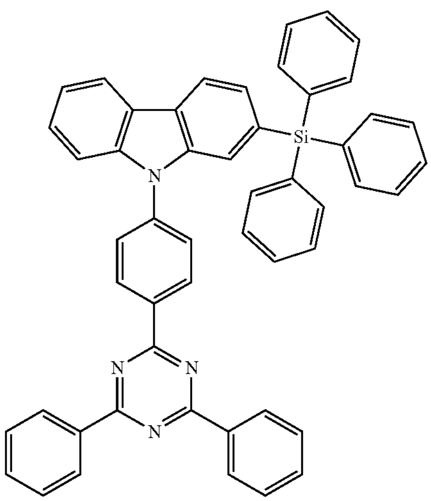
H2-16
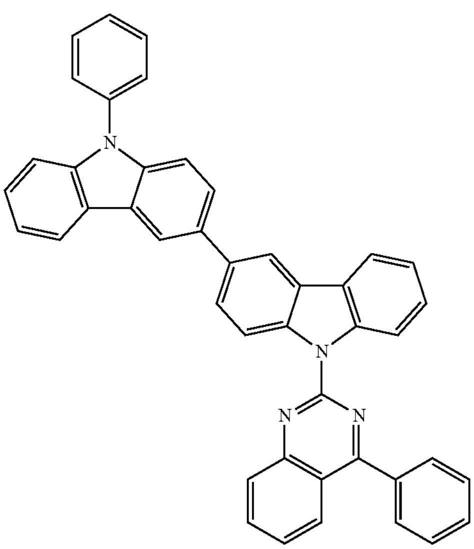
-continued
H2-17
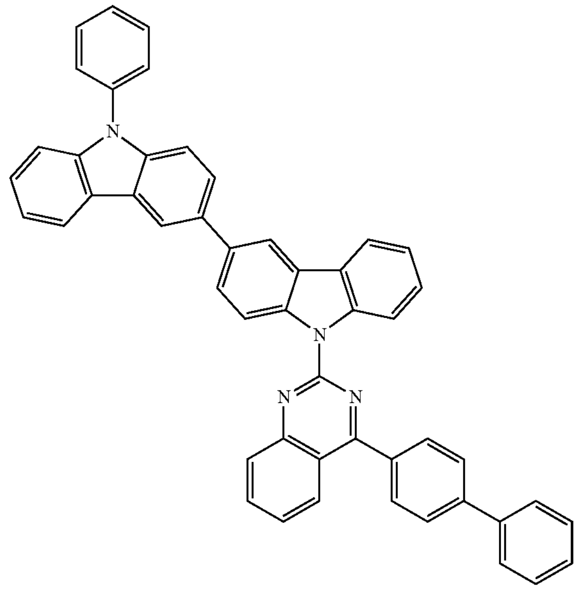
H2-18
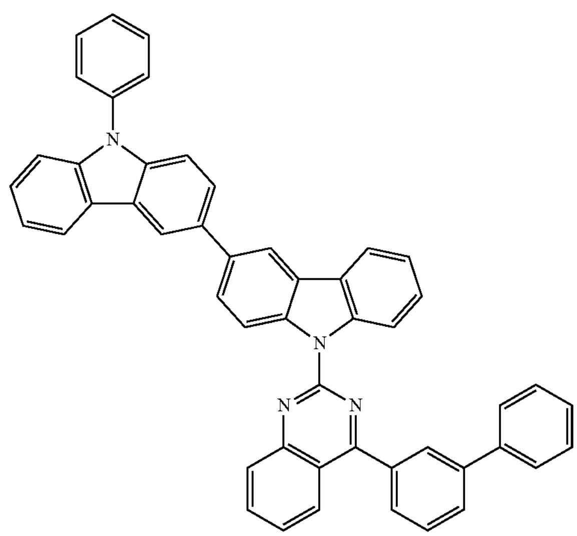

-continued
H2-19
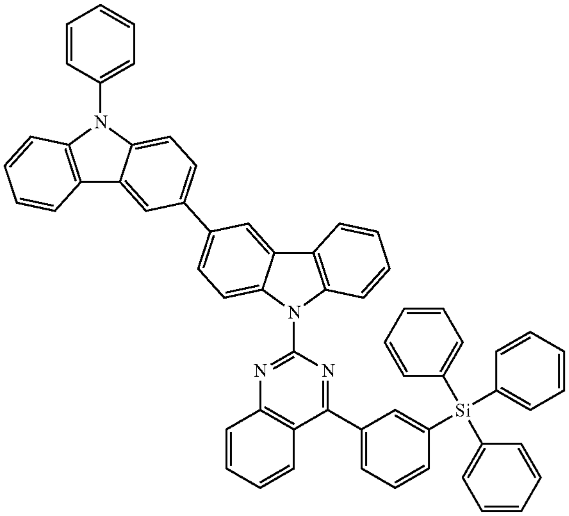
H2-20
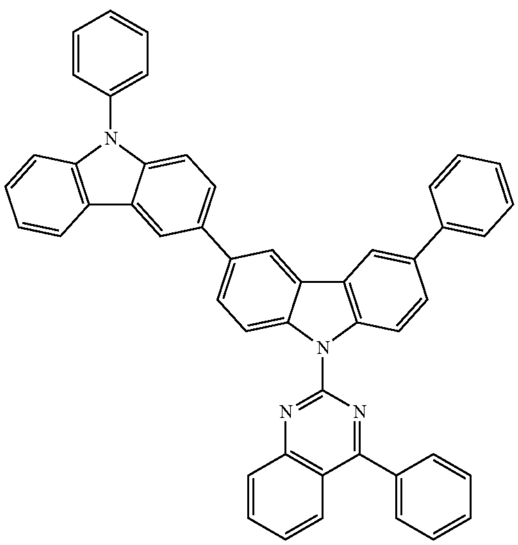
H2-21
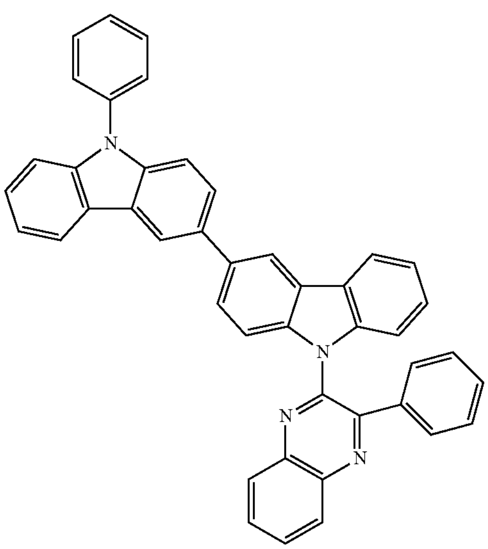
-continued
H2-22
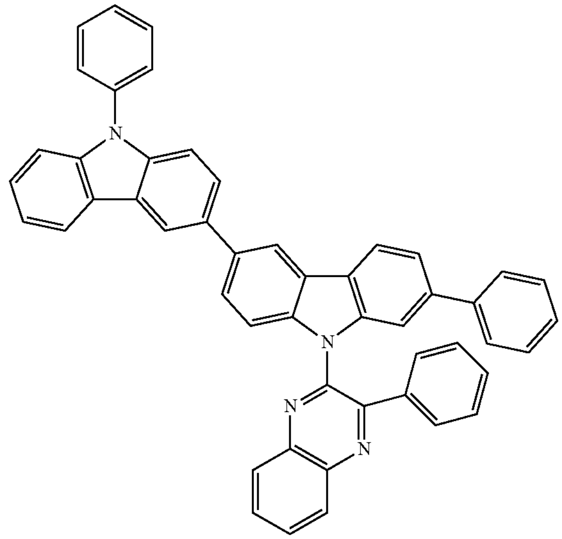
H2-23
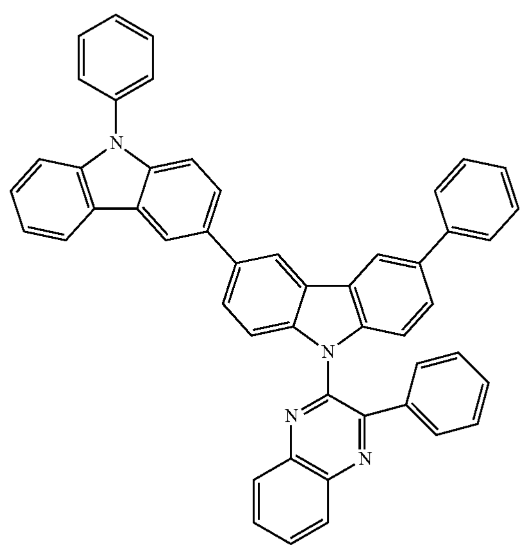

H2-24
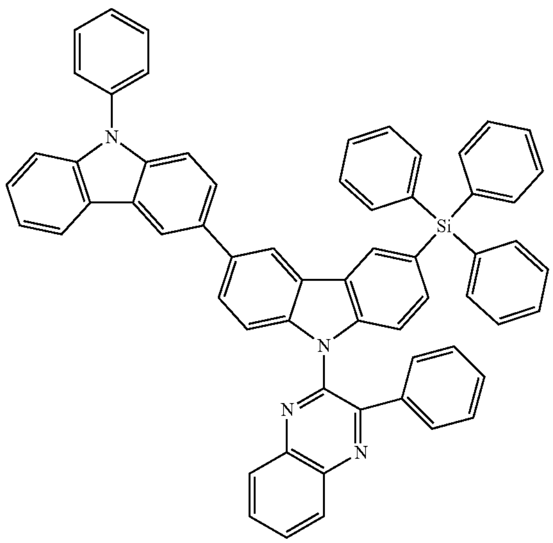
H2-25
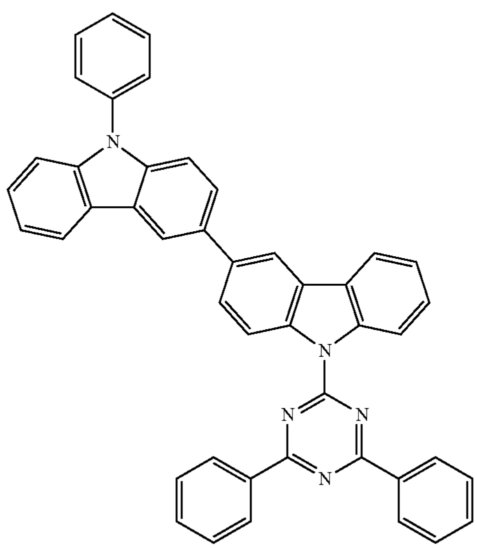
H2-26
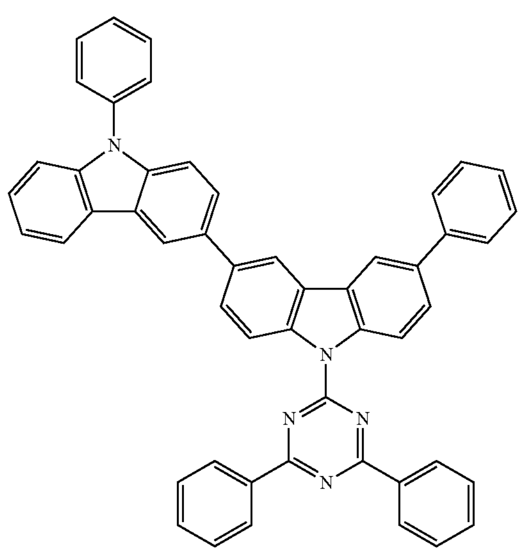
H2-27
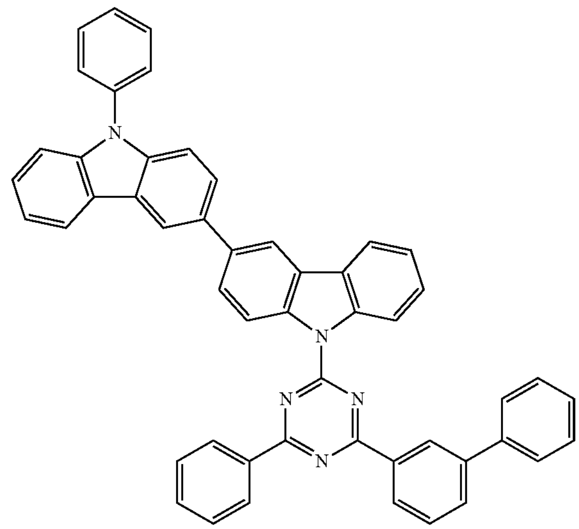
H2-28
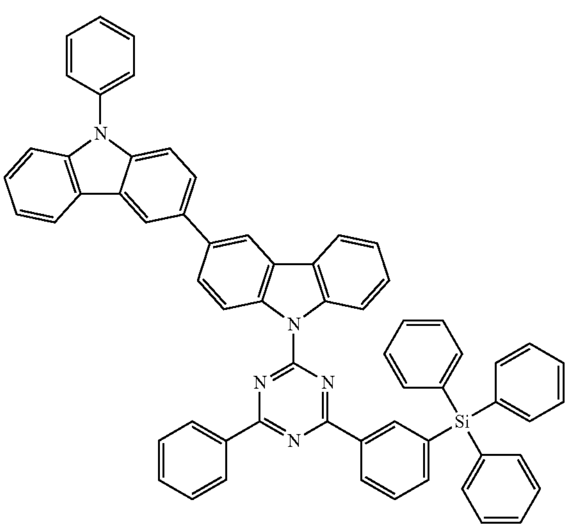

-continued
H2-29
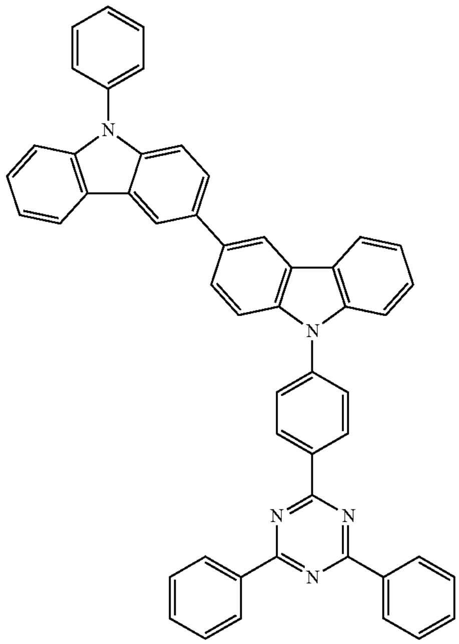
H2-30
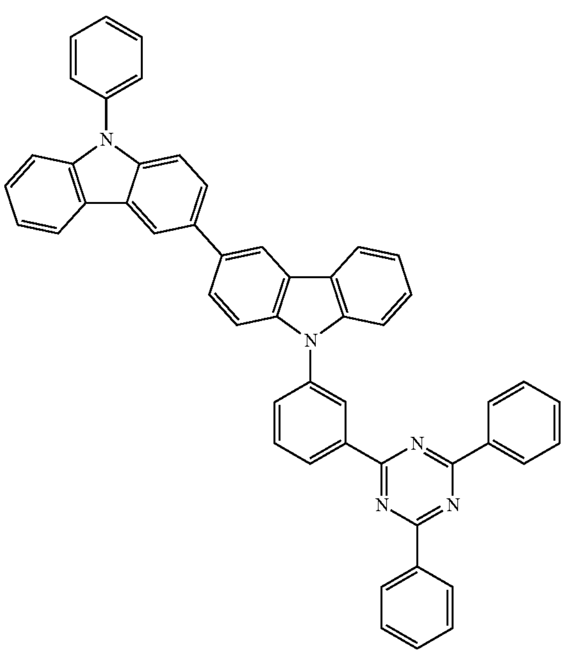
-continued
H2-31
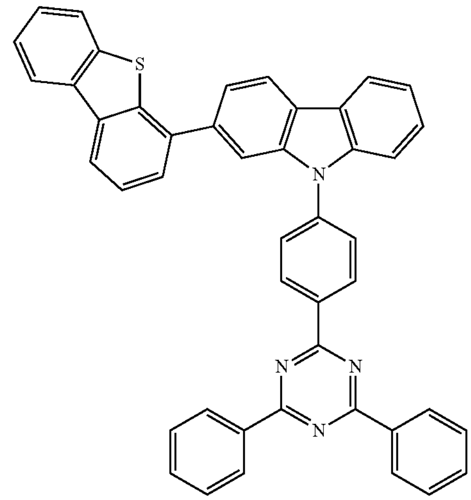
H2-32
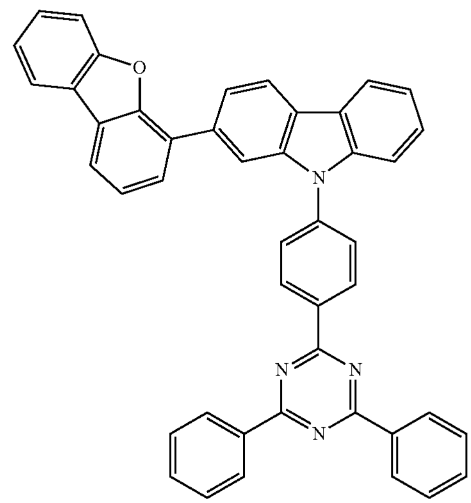
H2-33
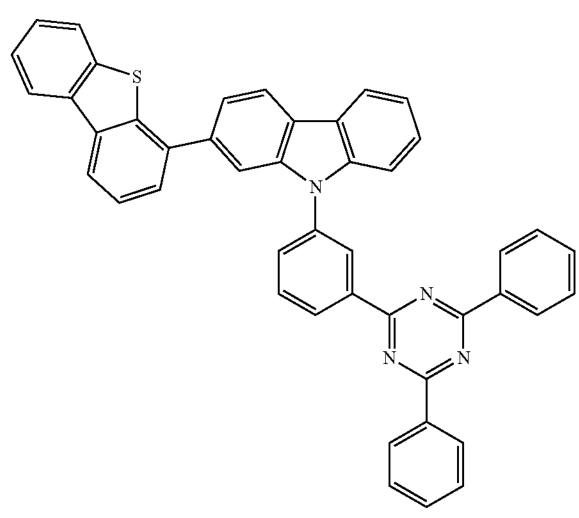

H2-34
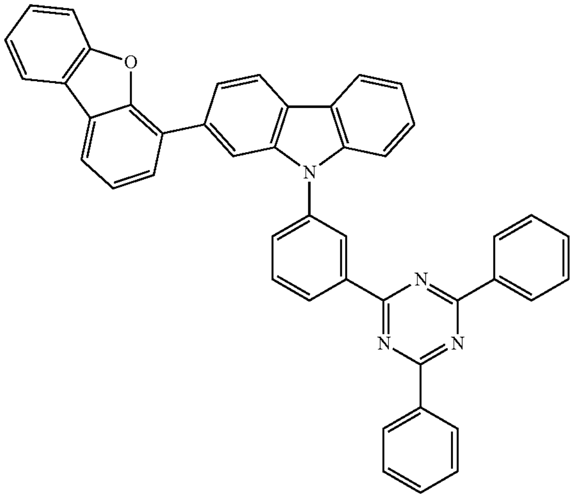
H2-35
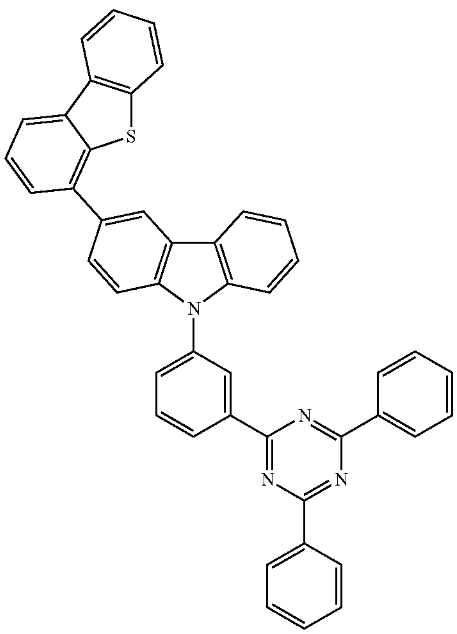
H2-36
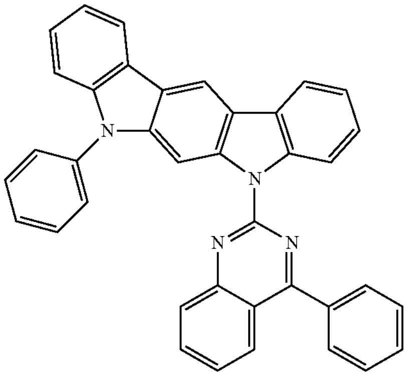
H2-37
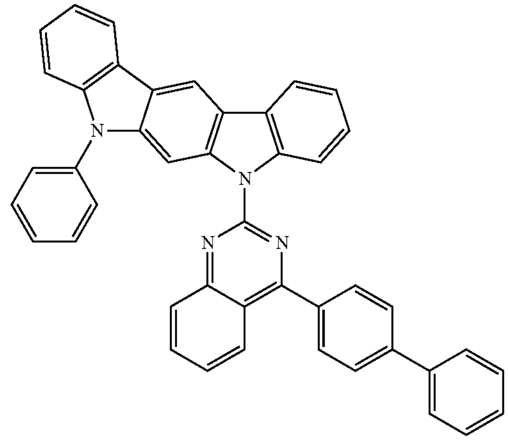
H2-38
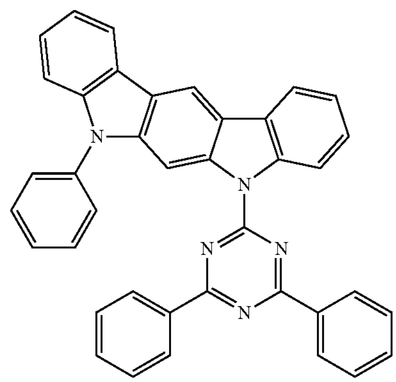
H2-39
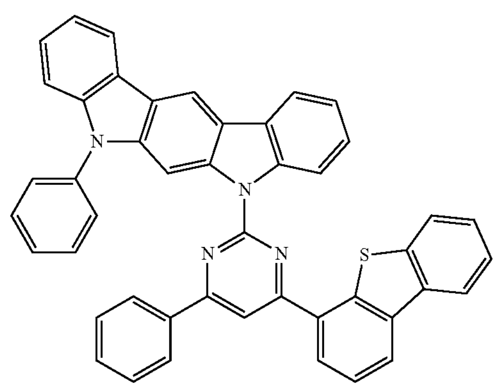

-continued
H2-40
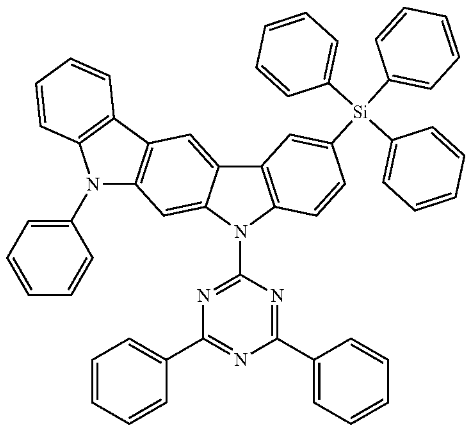
H2-41
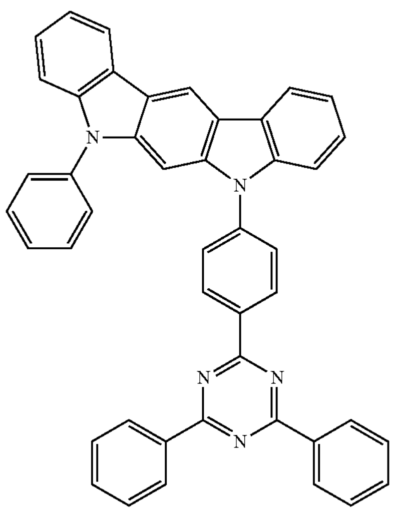
H2-42
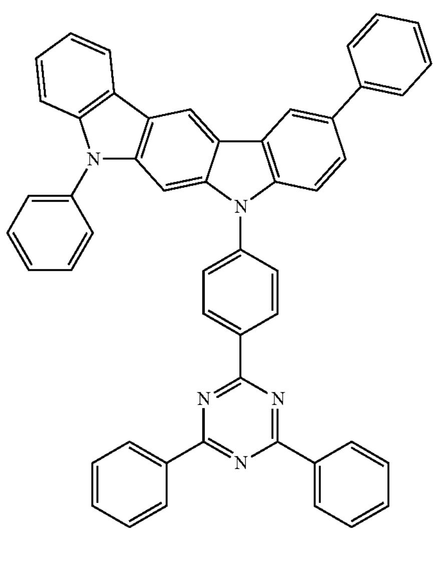
-continued
H2-43
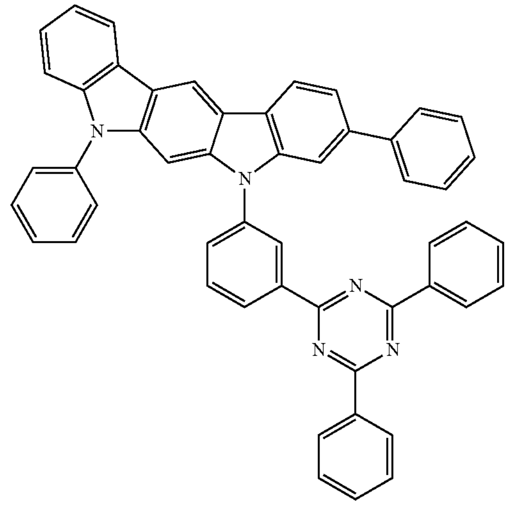
H2-44
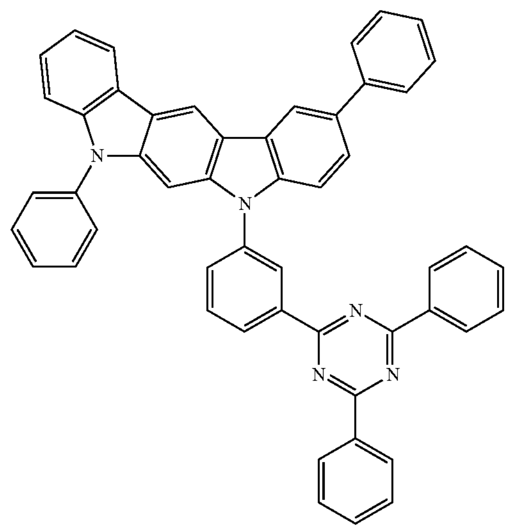
H2-45
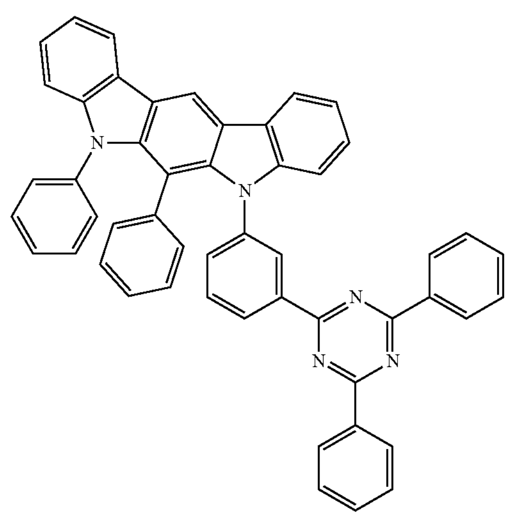

-continued
H2-46
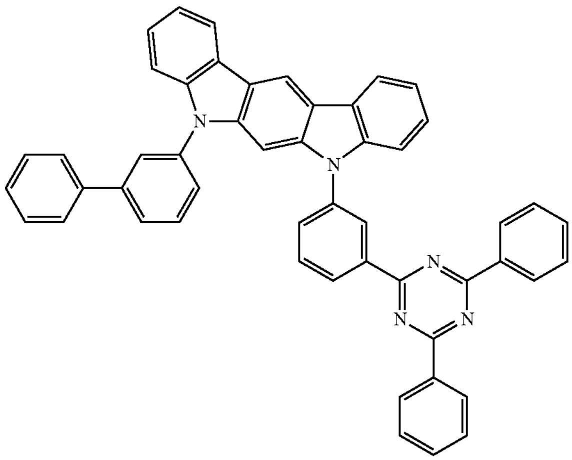
H2-47
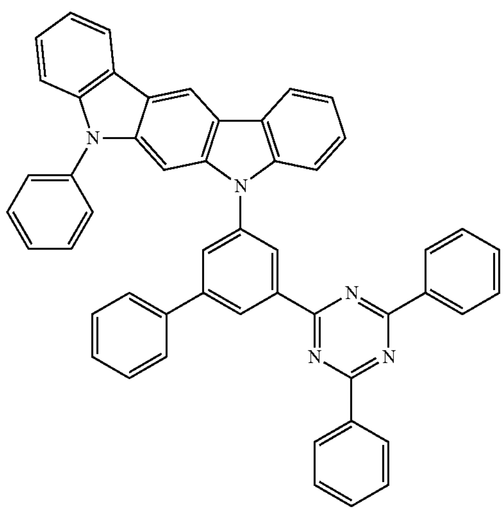
H2-48
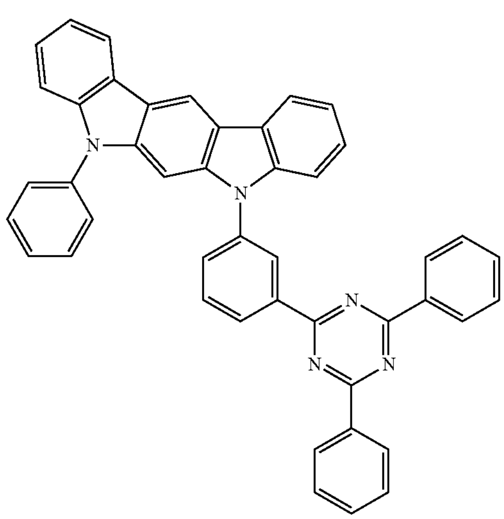
-continued
H2-49
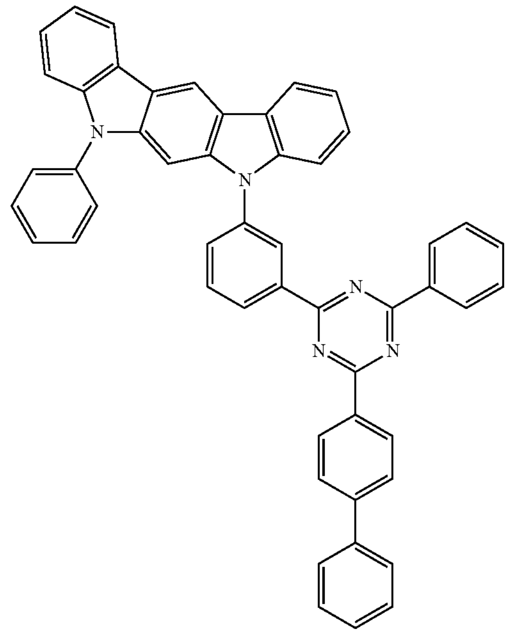
H2-50
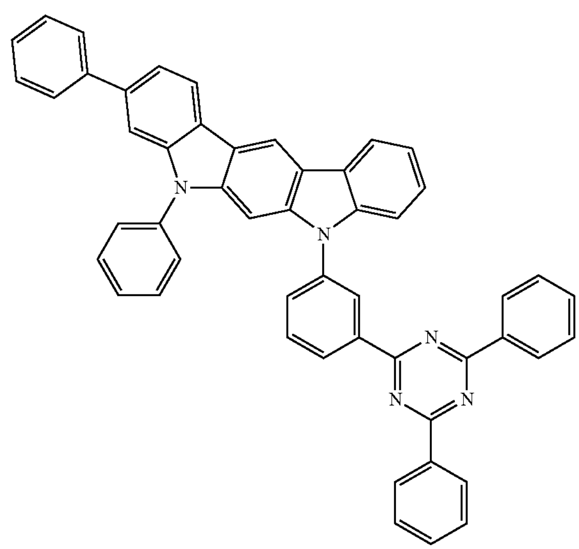

H2-51
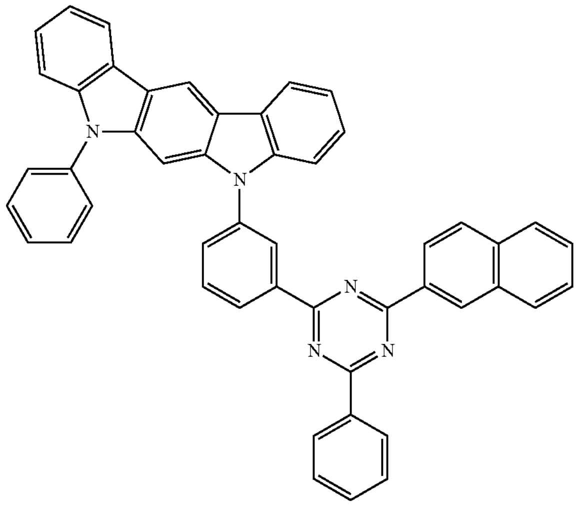
H2-52
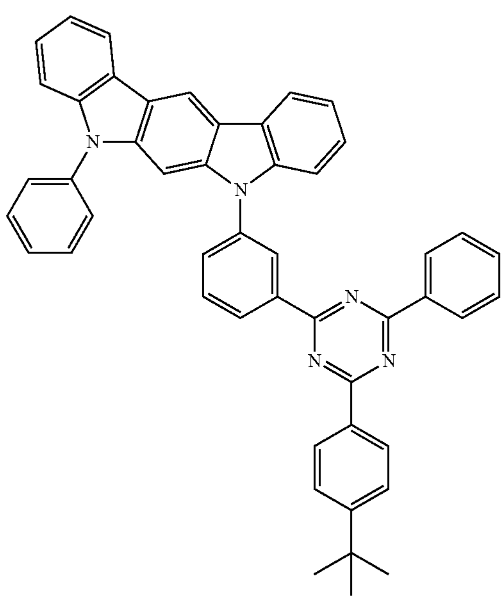
H2-53
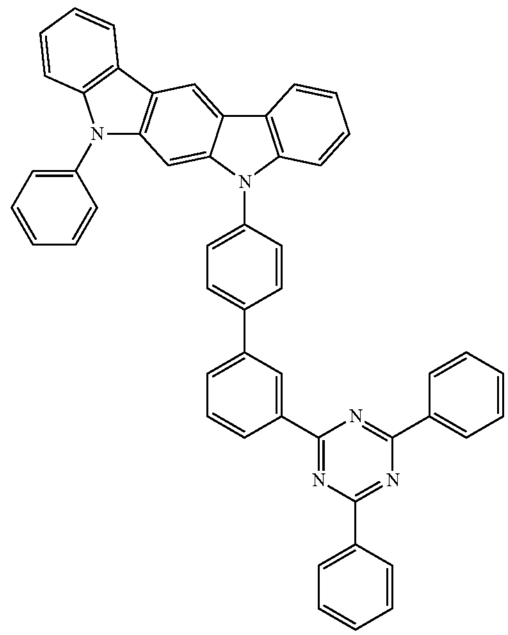
H2-54
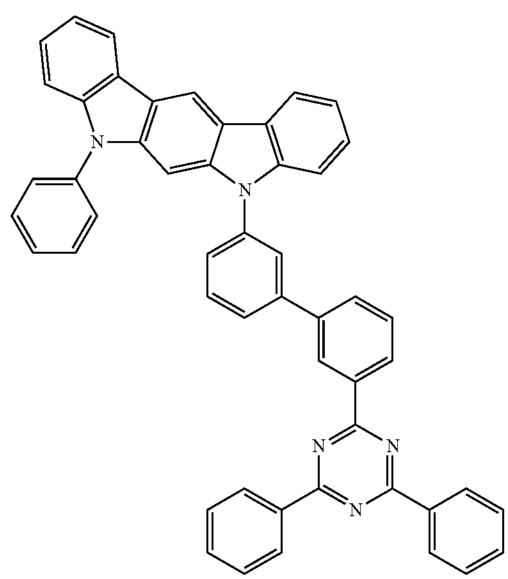

-continued
H2-55
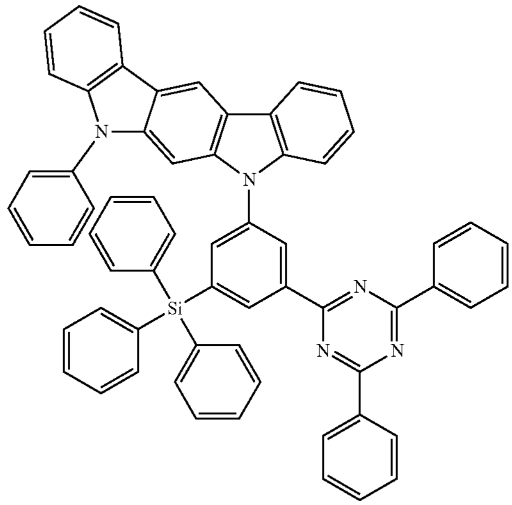
H2-56
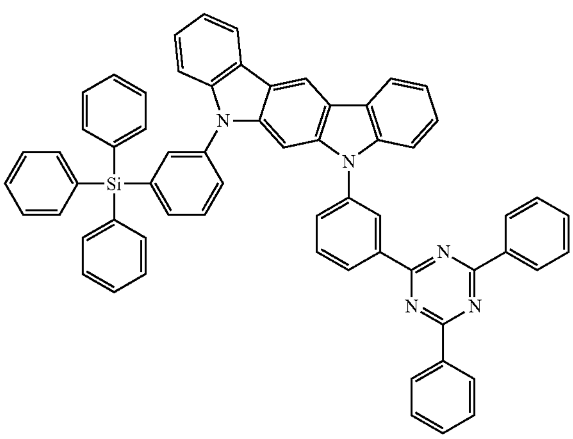
H2-57
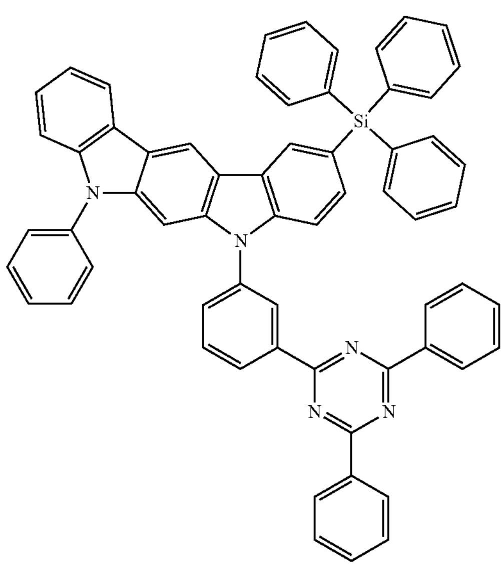
-continued
H2-58
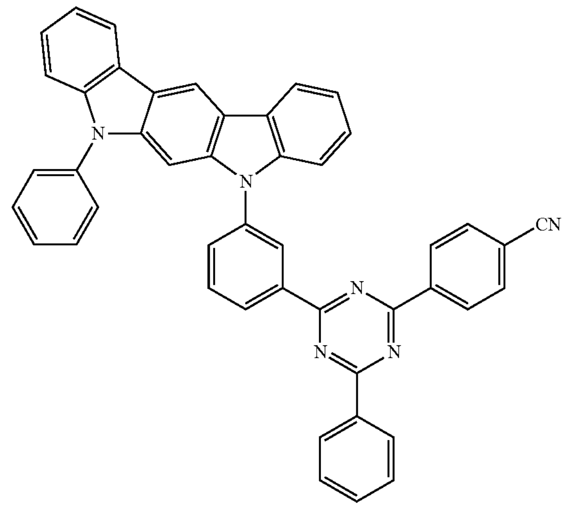
H2-59
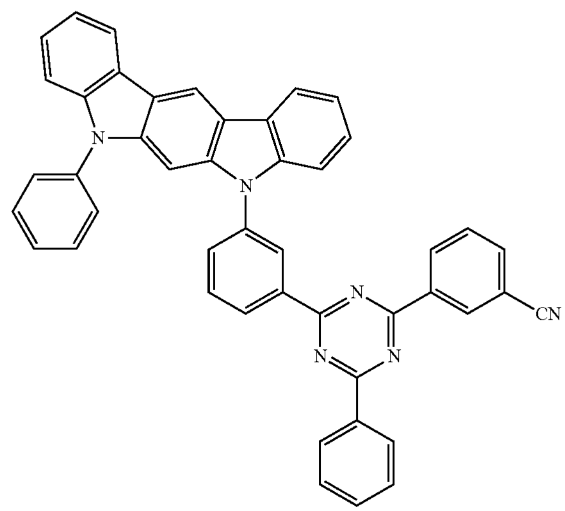
H2-60
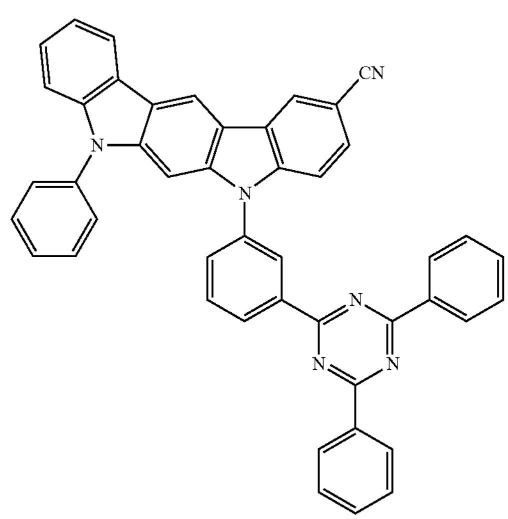

H2-61
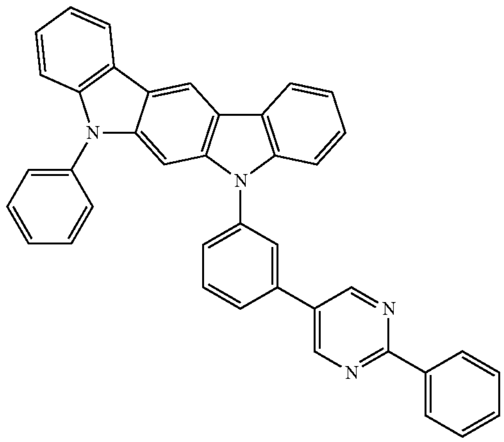
H2-62
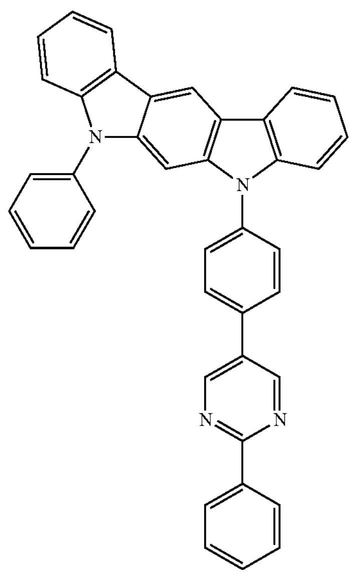
H2-63
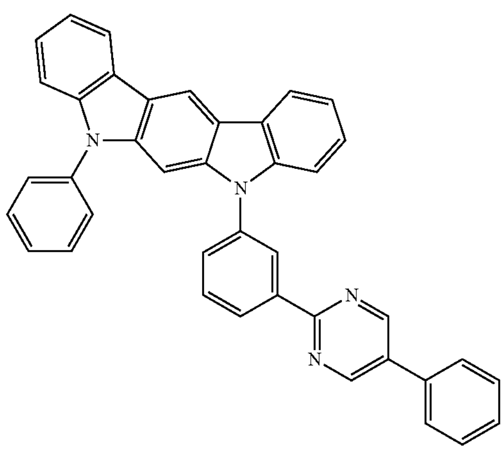
H2-64
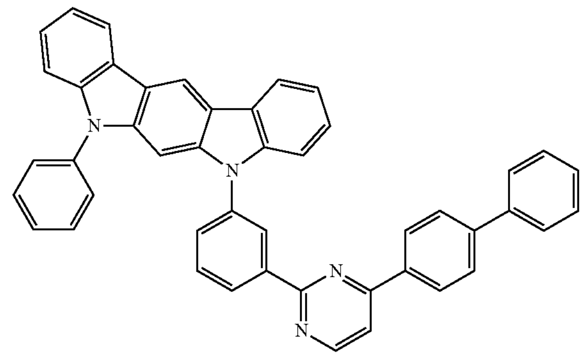
H2-65
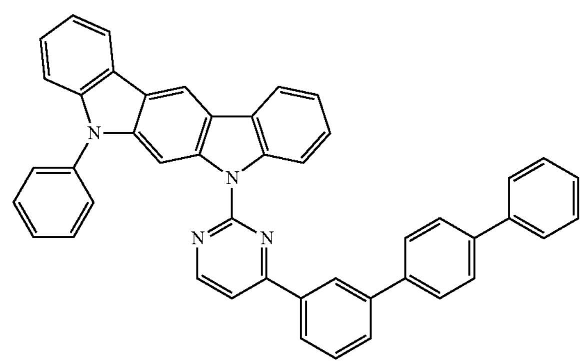
H2-66
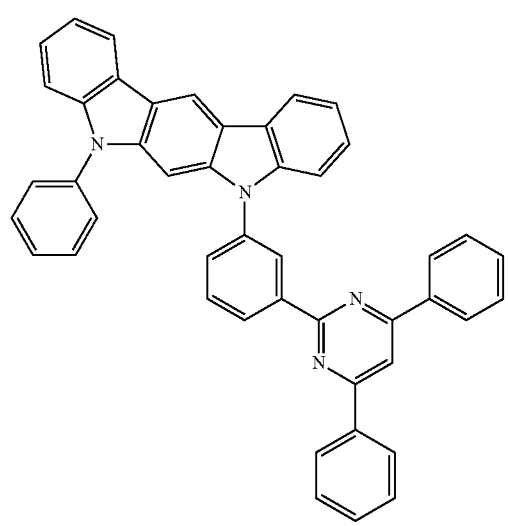

-continued
H2-67
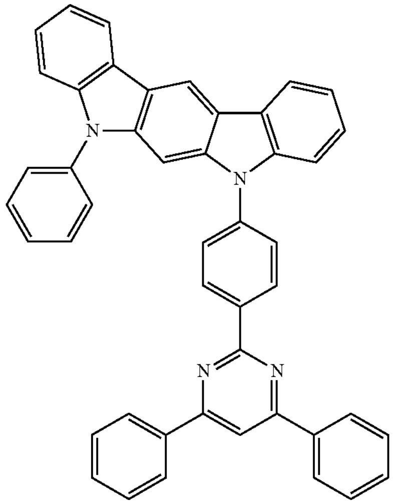
H2-68
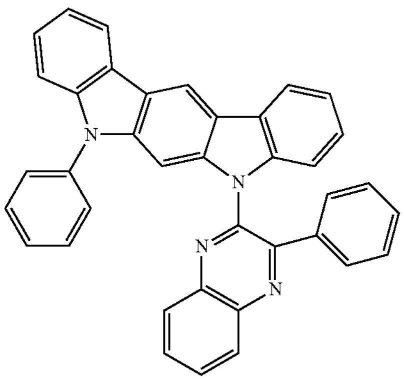
H2-69
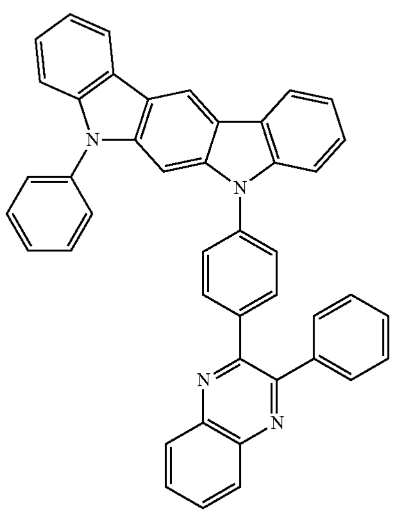
-continued
H2-70
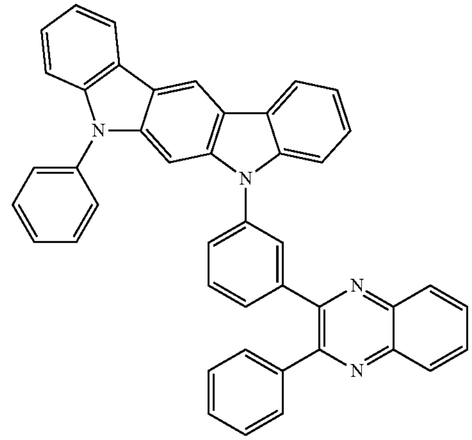
H2-71
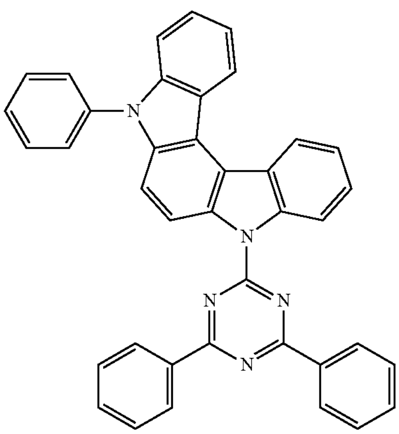
H2-72
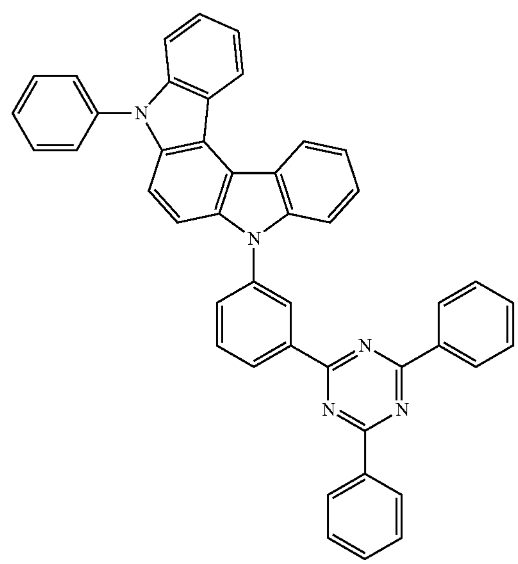

-continued
H2-73
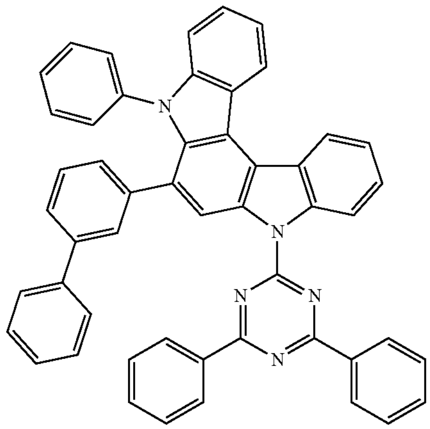
H2-74
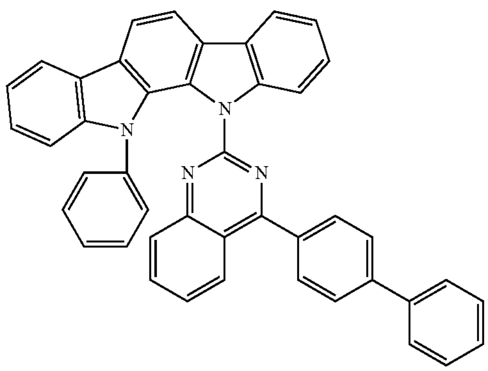
H2-75
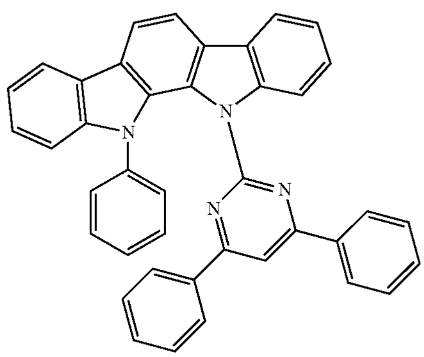
H2-76
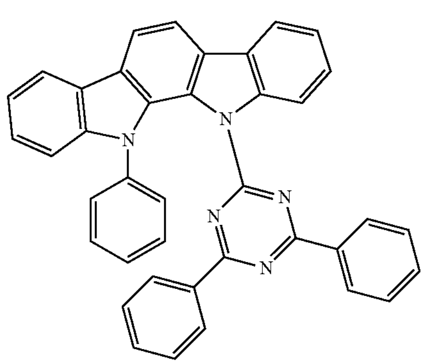
-continued
H2-77
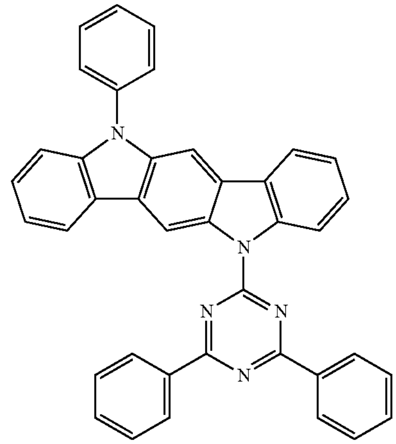
H2-78
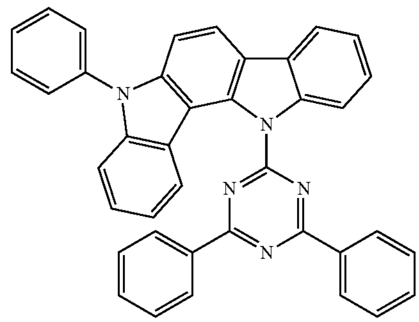
H2-79
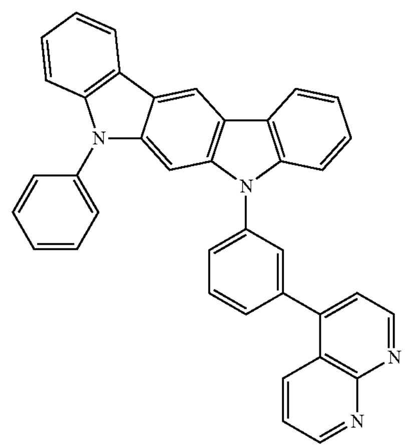
H2-80
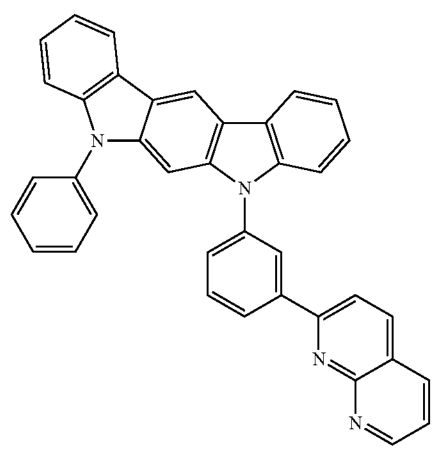

-continued
H2-81
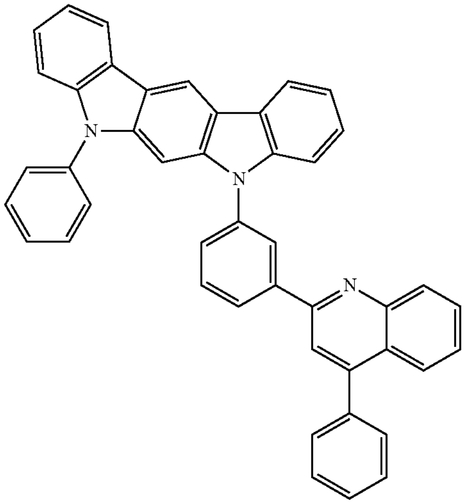
H2-82
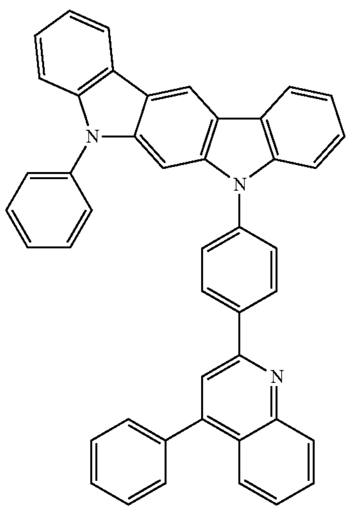
H2-83
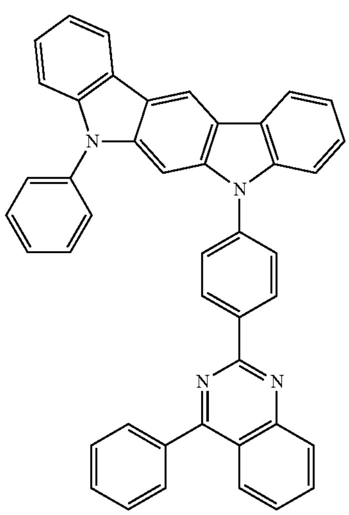
-continued
H2-84
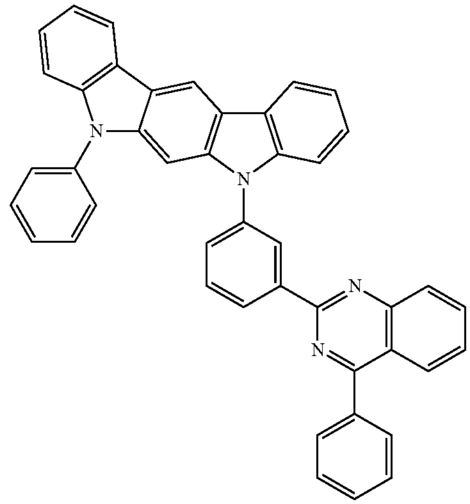
H2-85
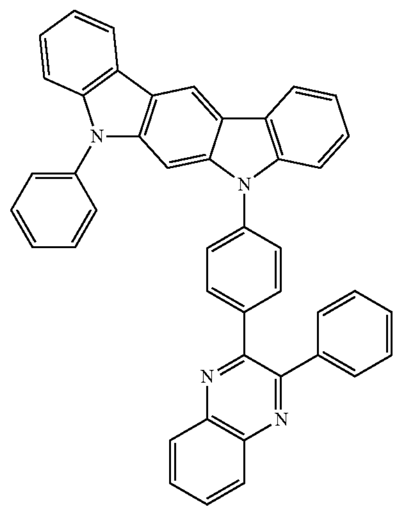
H2-86
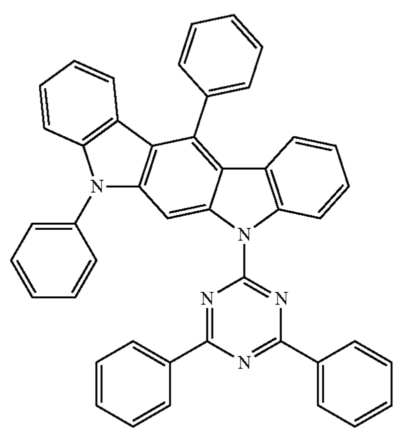

-continued
H2-87
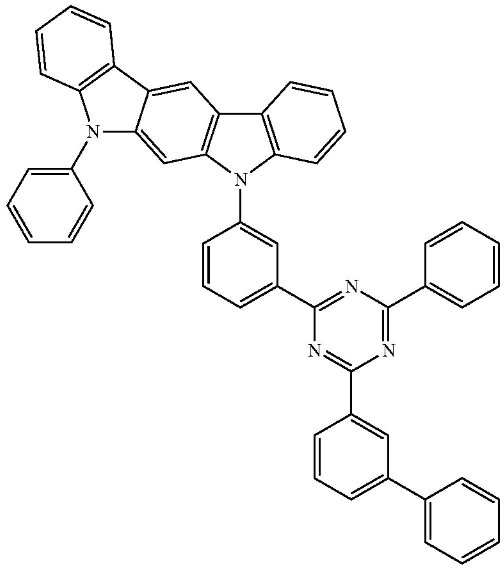
H2-88
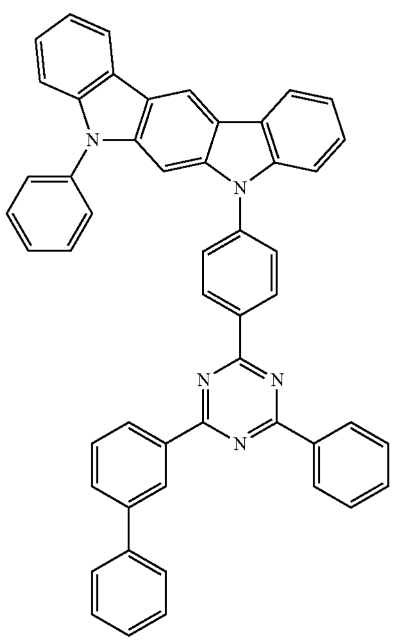
-continued
H2-89
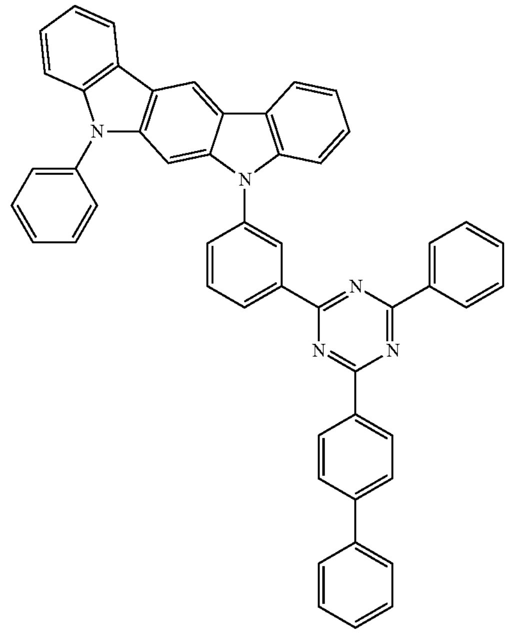
H2-90
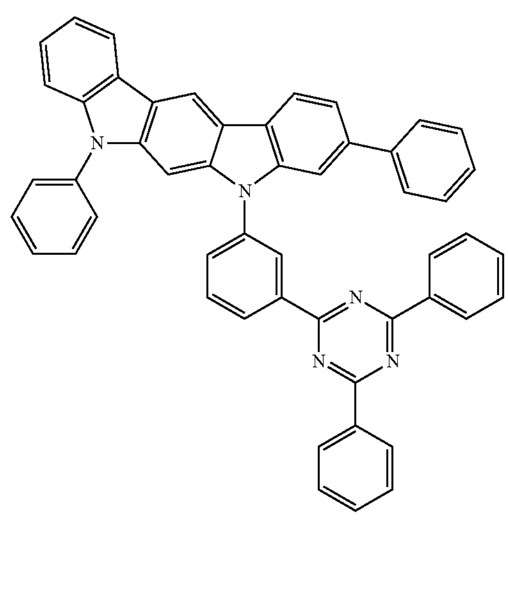

H2-91
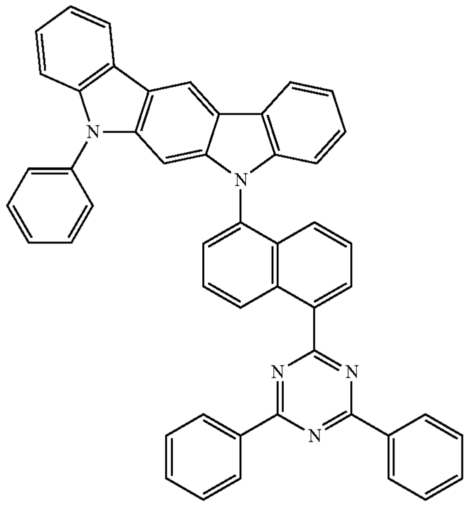
H2-92
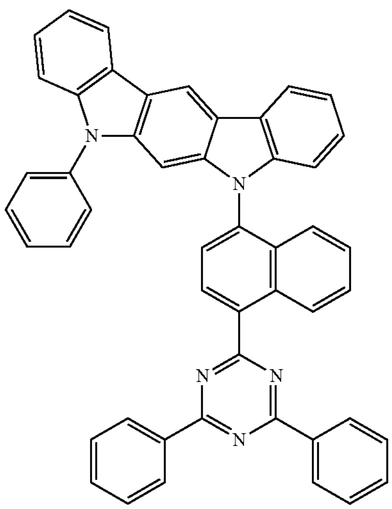
H2-93
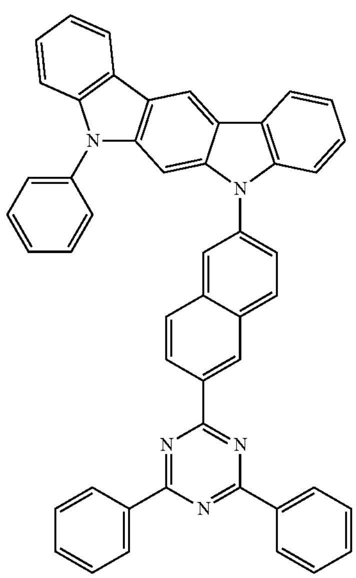
H2-94
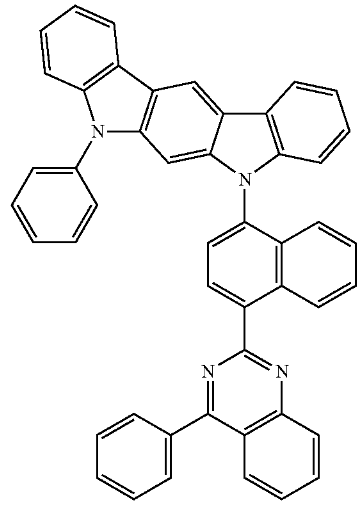
H2-95
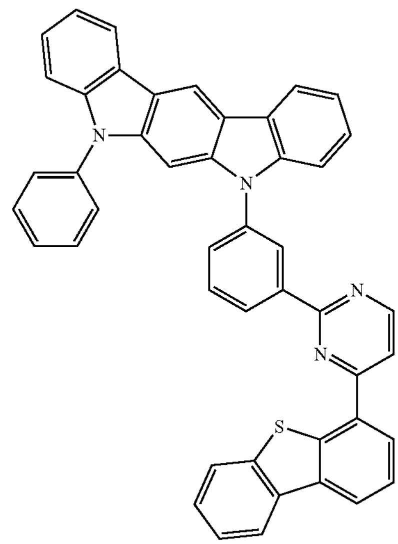
H2-96
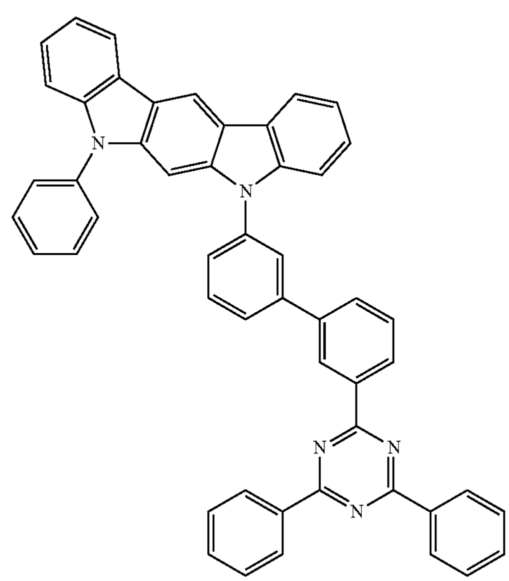

-continued
H2-97
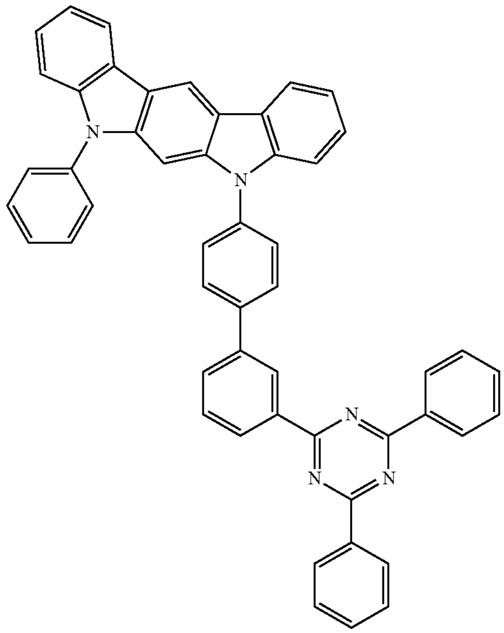
H2-98
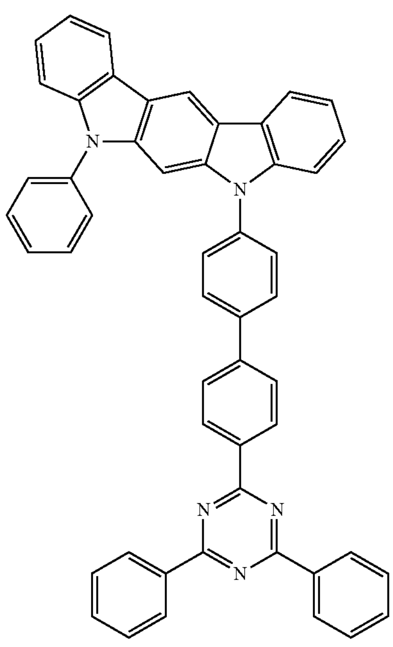
-continued
H2-99
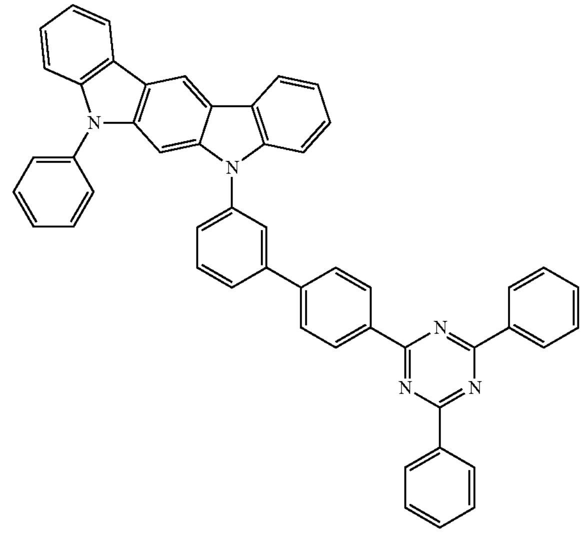
H2-100
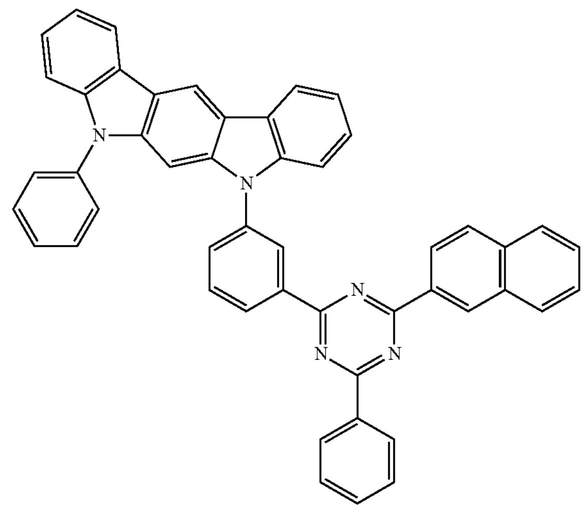
H2-101
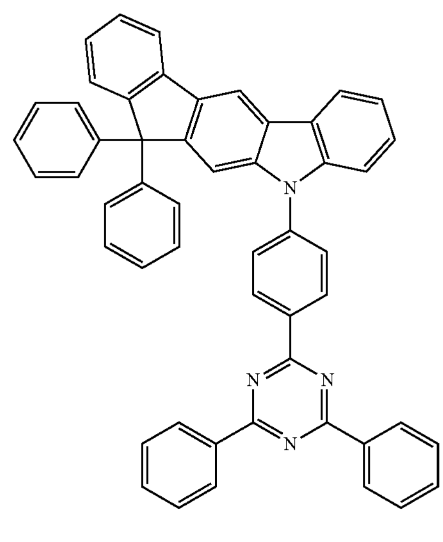

-continued
H2-102
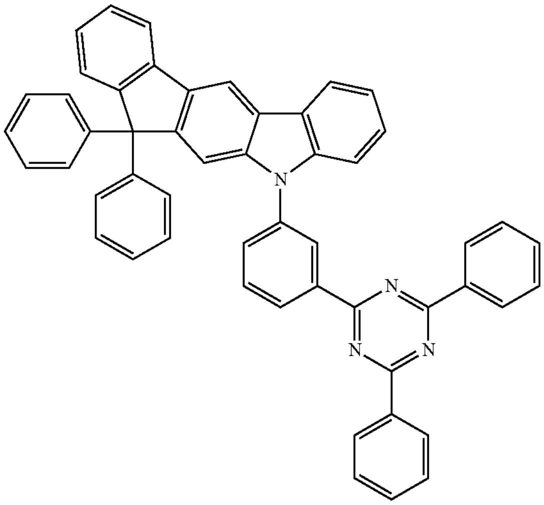
H2-103
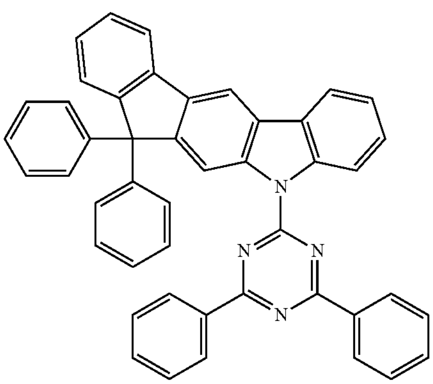
H2-104
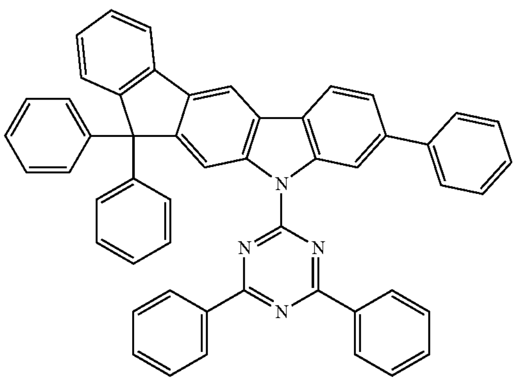
-continued
H2-105
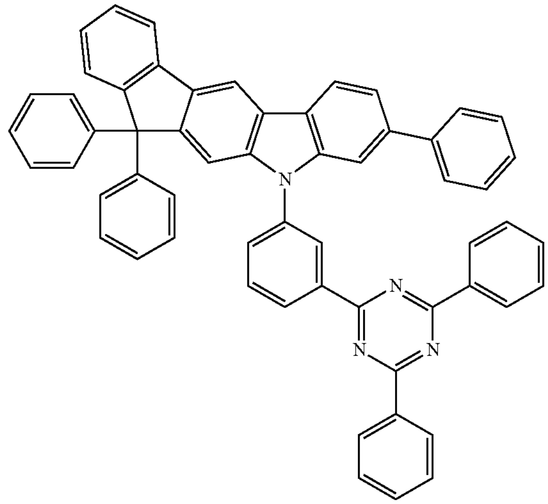
H2-106
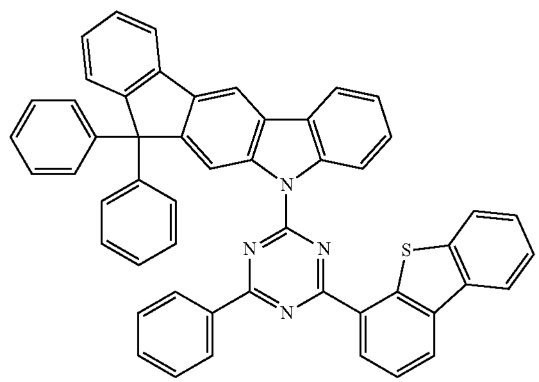
H2-107
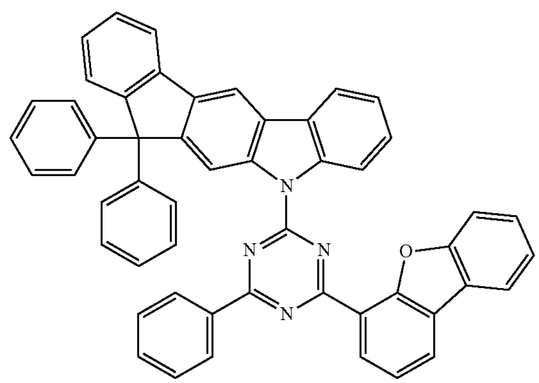

-continued
H2-108
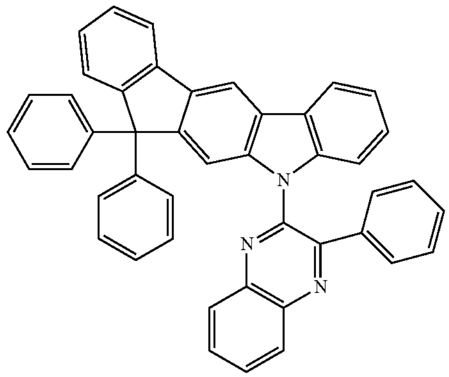
H2-109
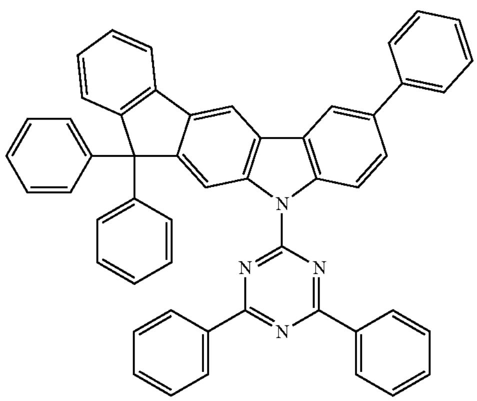
H2-110
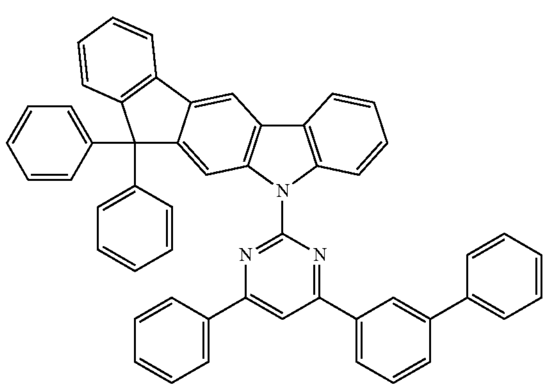
-continued
H2-111
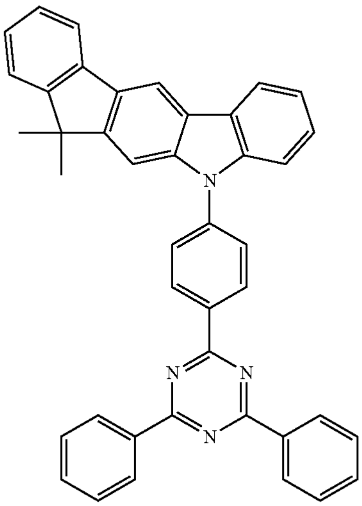
H2-112
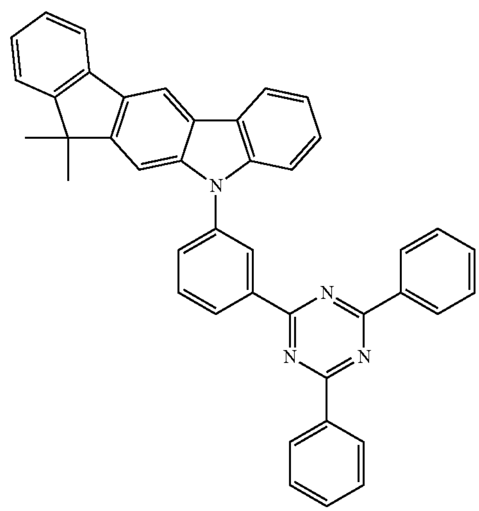
H2-113
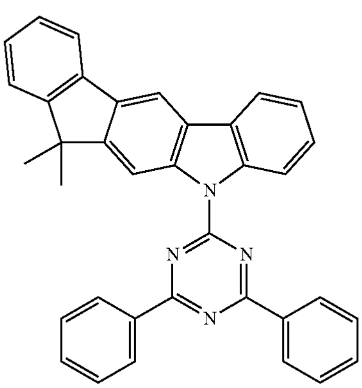

-continued
H2-114
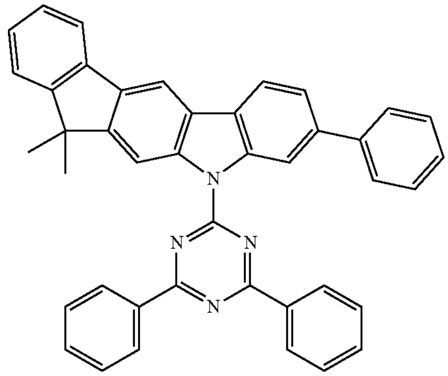
H2-115
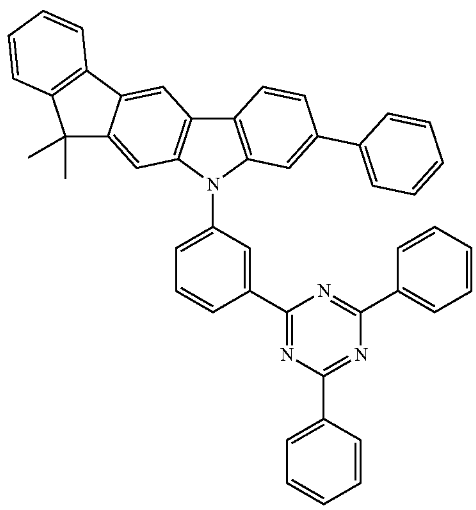
H2-116
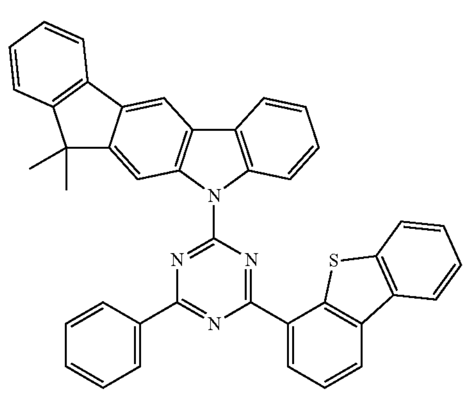
-continued
H2-117
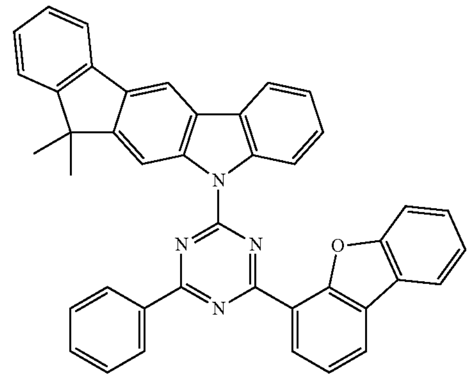
H2-118
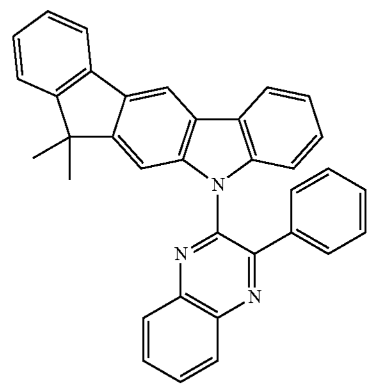
H2-119
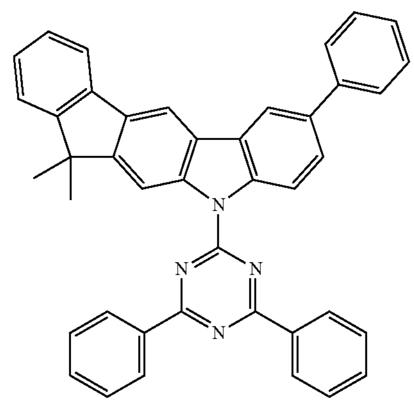
H2-120
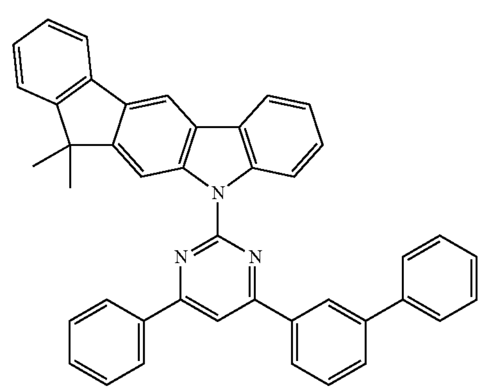

-continued
H2-121
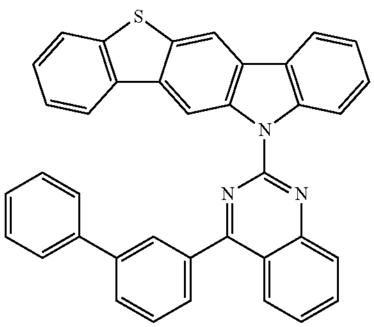
H2-122
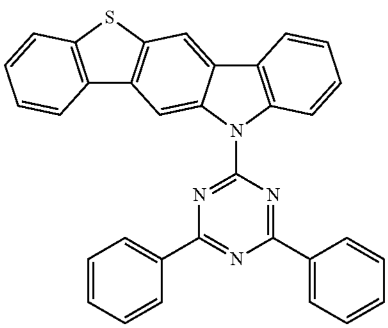
H2-123
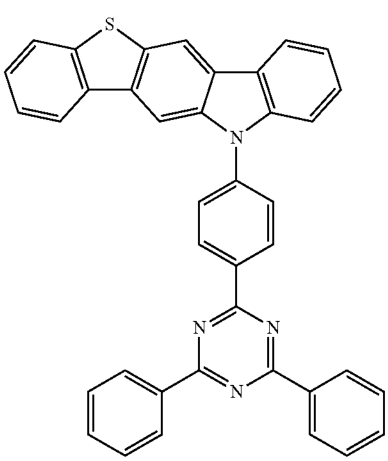
H2-124
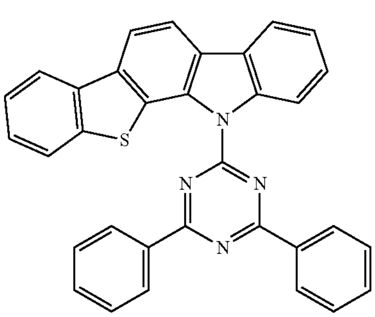
-continued
H2-125
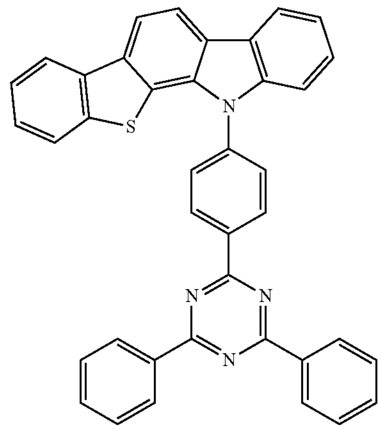
H2-126
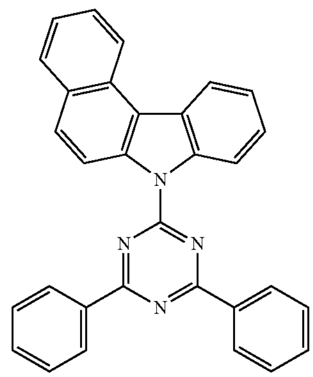
H2-127
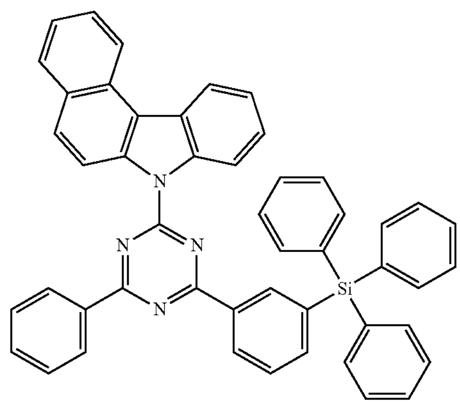
H2-128
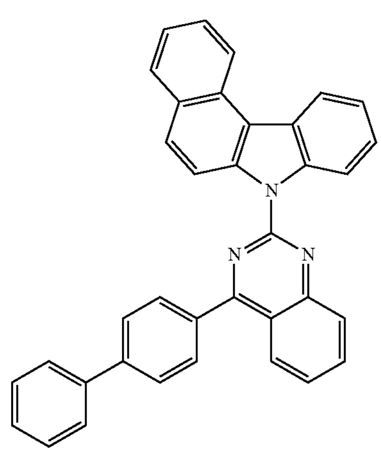

-continued
H2-129
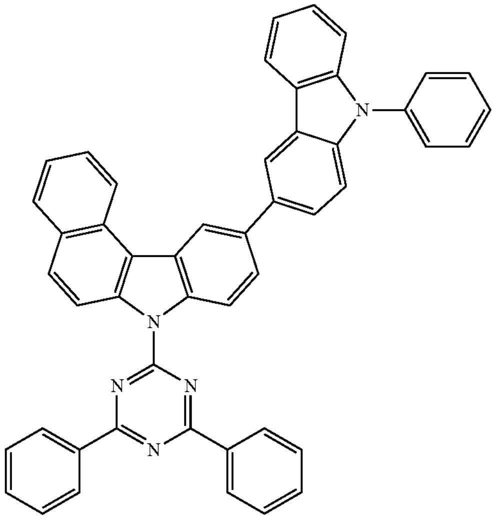
H2-130
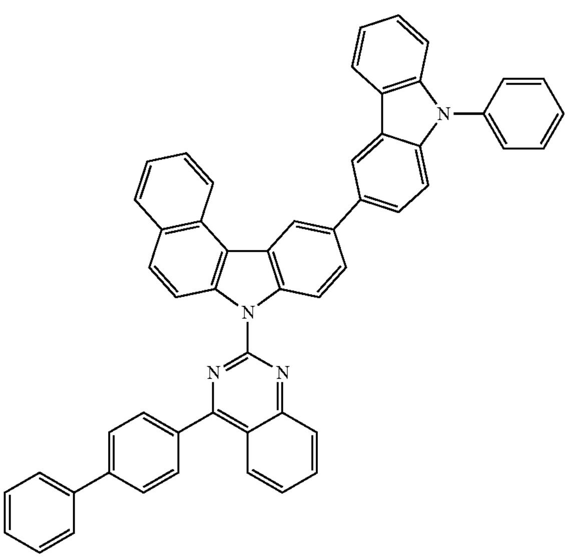
-continued
H2-131
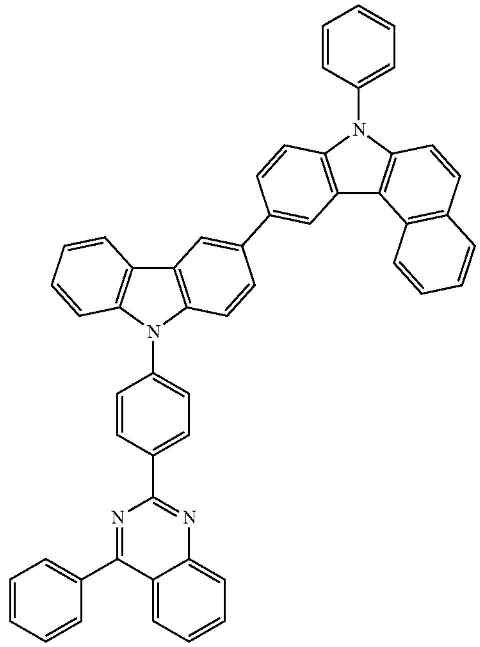
H2-132
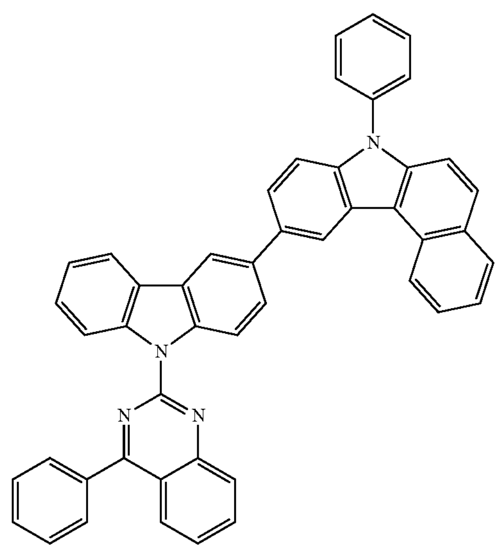

-continued
H2-133
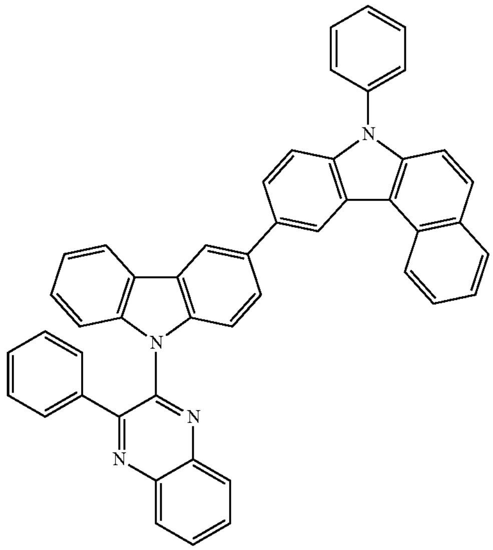
H2-134
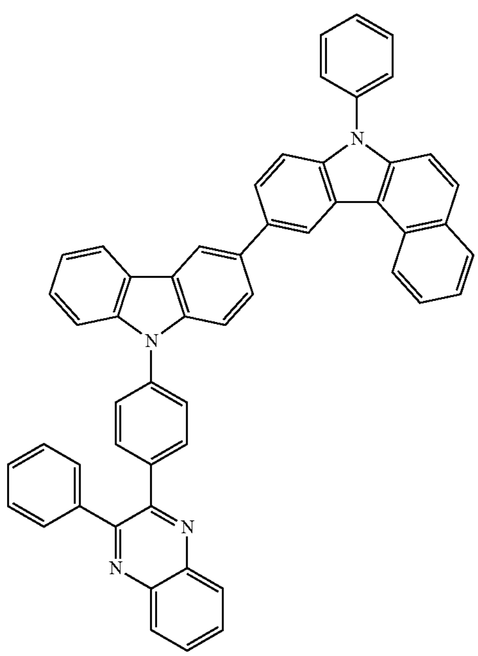
-continued
H2-135
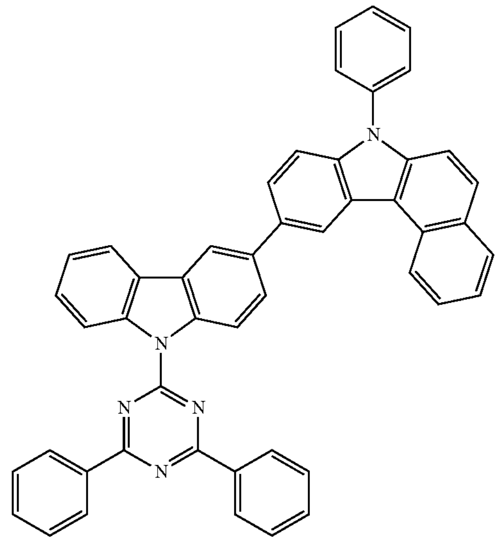
H2-136
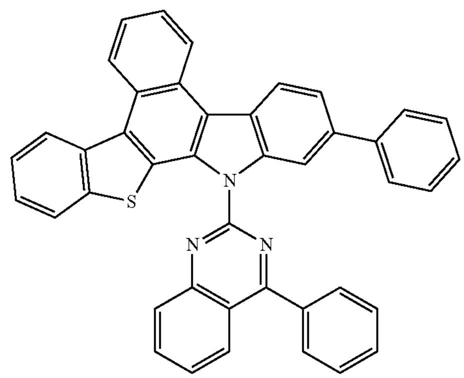
H2-137
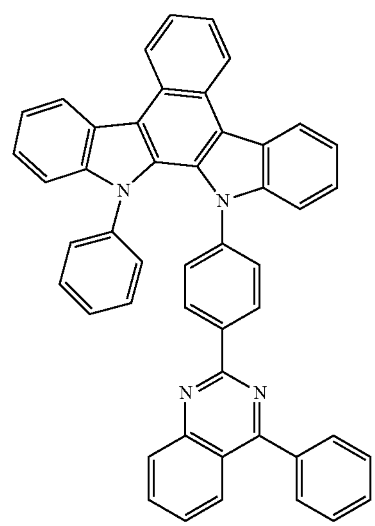

-continued
H2-138
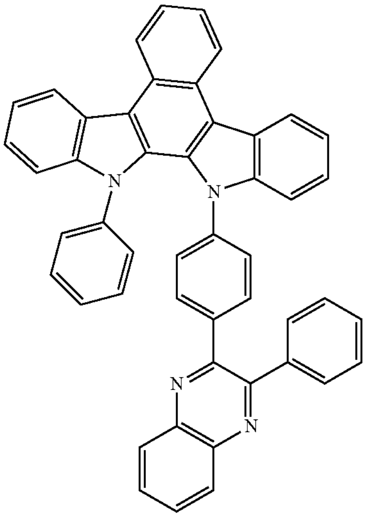
H2-139
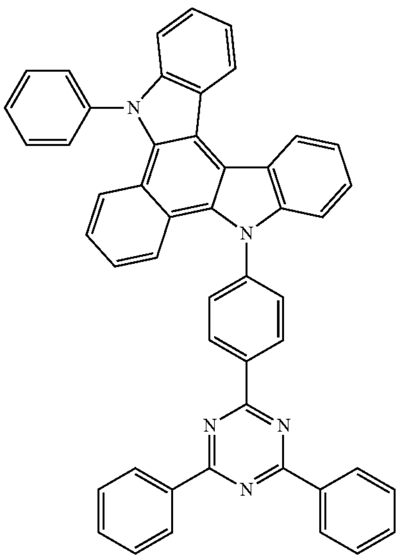
H2-140
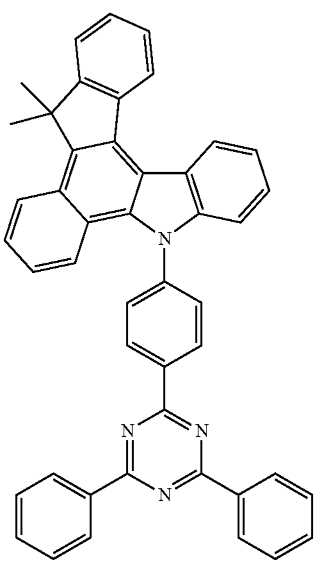
-continued
H2-141
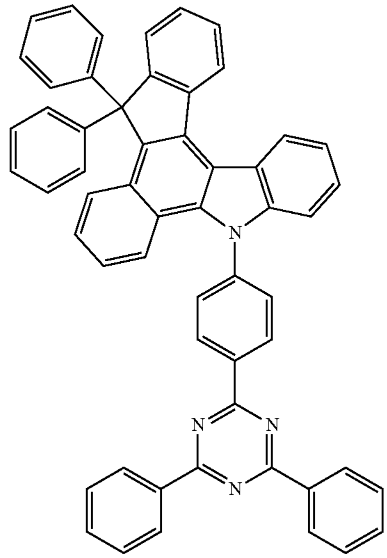
H2-142
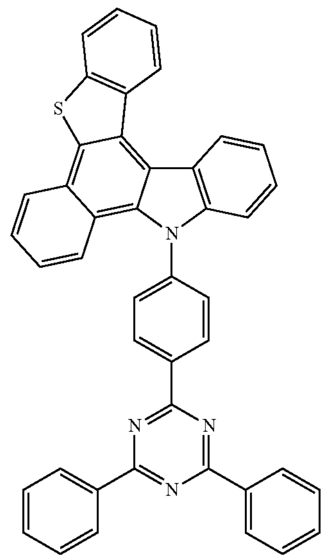
H2-143
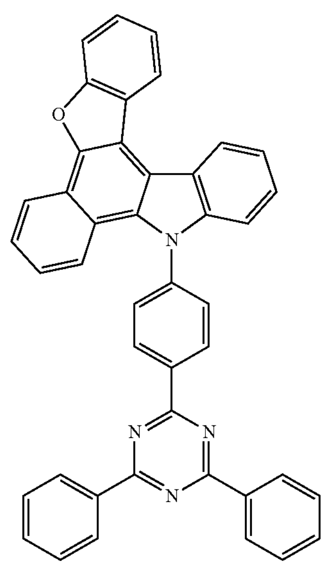

-continued
H2-144
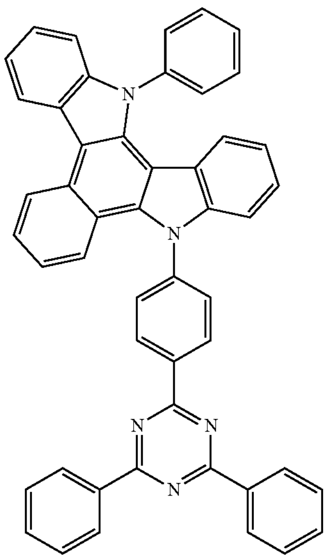
H2-145
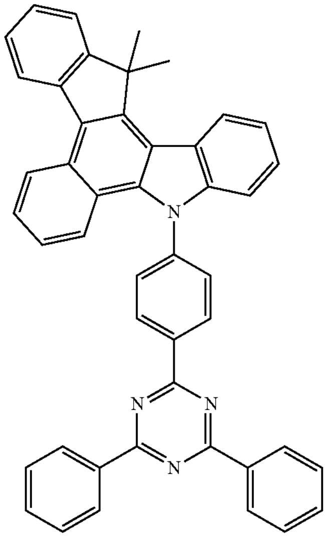
-continued
H2-146
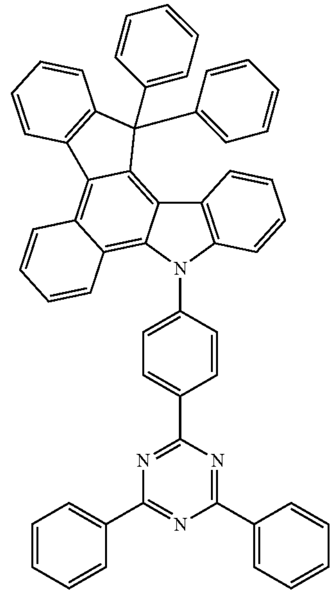
H2-147
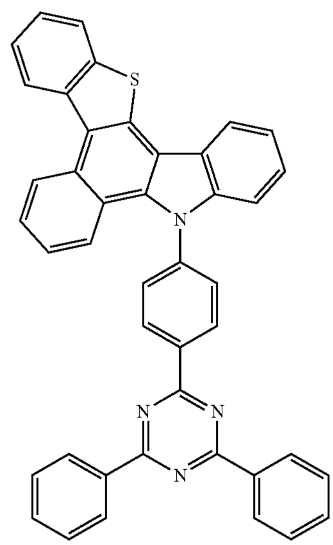
H2-148
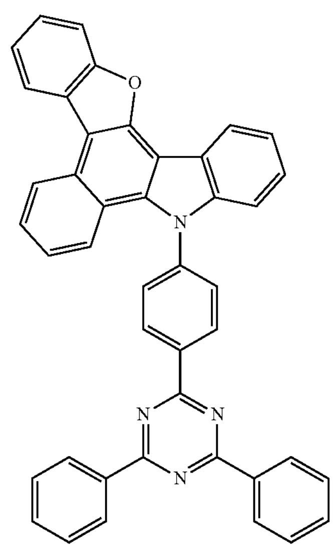

-continued
H2-149
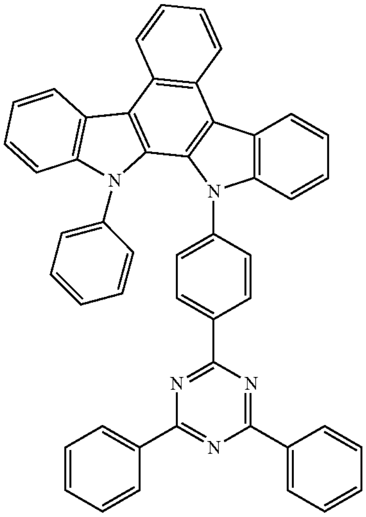
H2-150
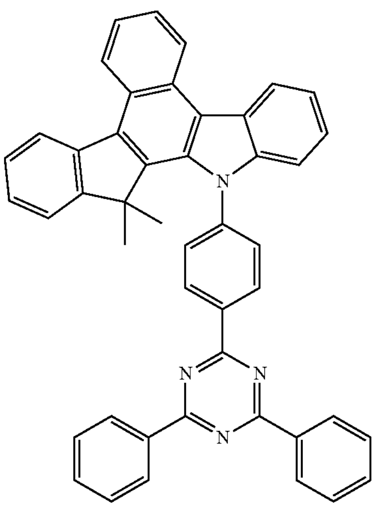
H2-151
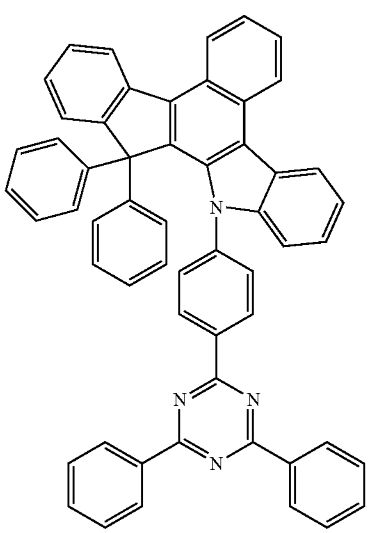
-continued
H2-152
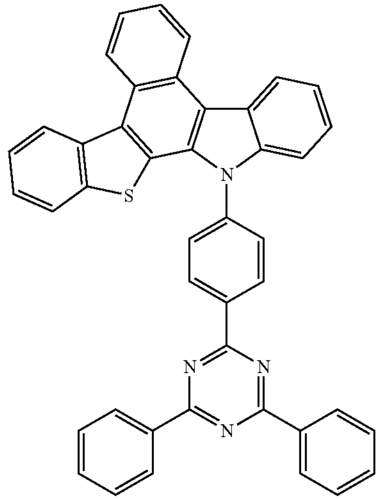
H2-153
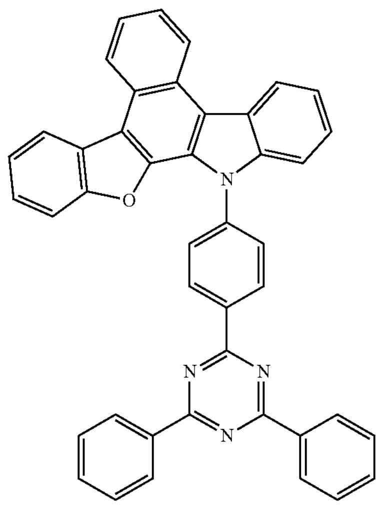
H2-154
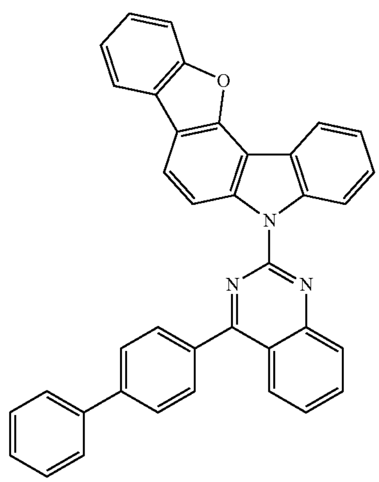

-continued
H2-155
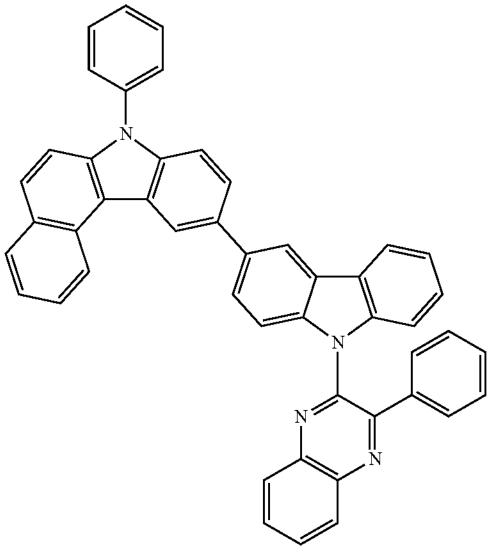
H2-156
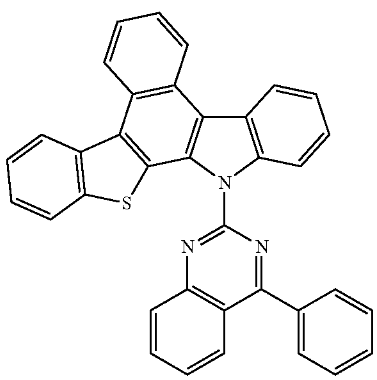
H2-157
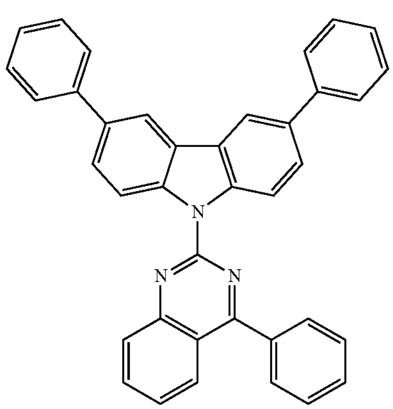
-continued
H2-158
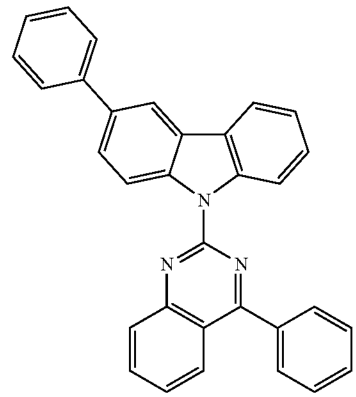
H2-159
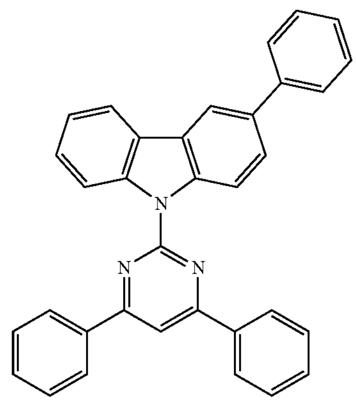
H2-160
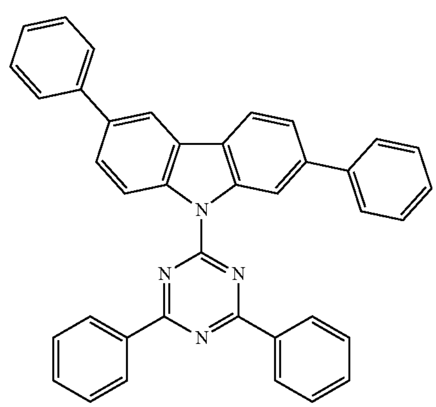

-continued
H2-161
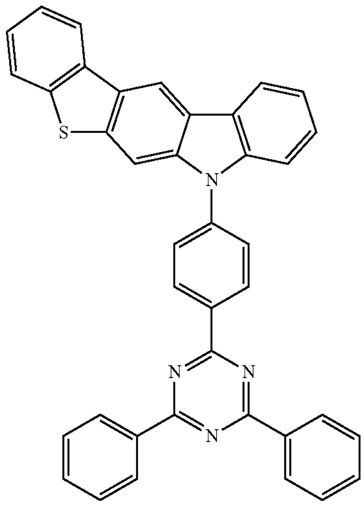
H2-162
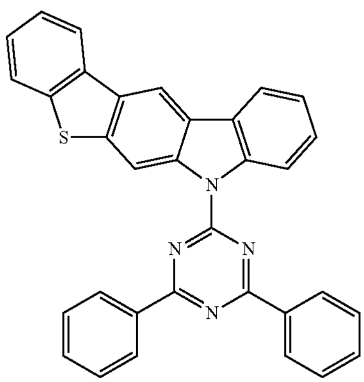
H2-163
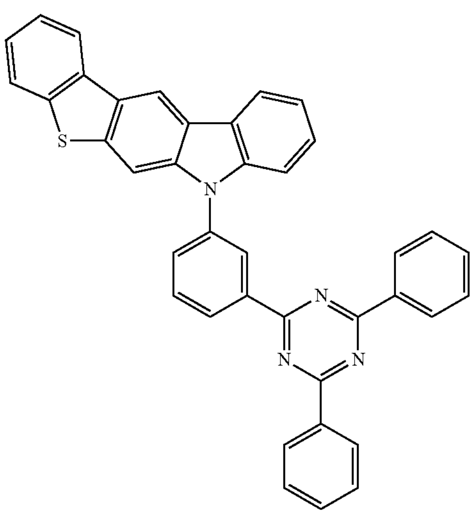
-continued
H2-164
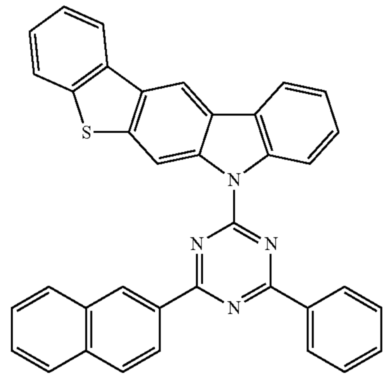
H2-165
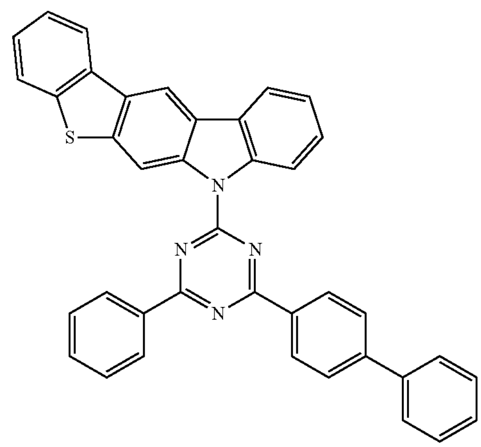
H2-166
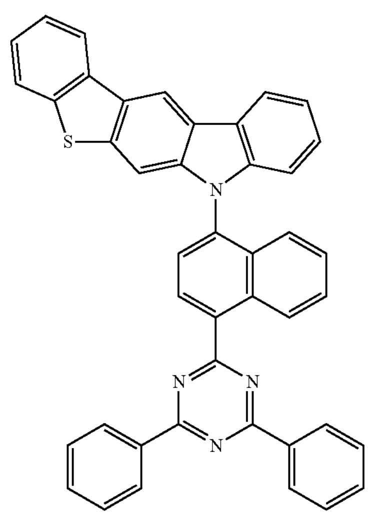

H2-167
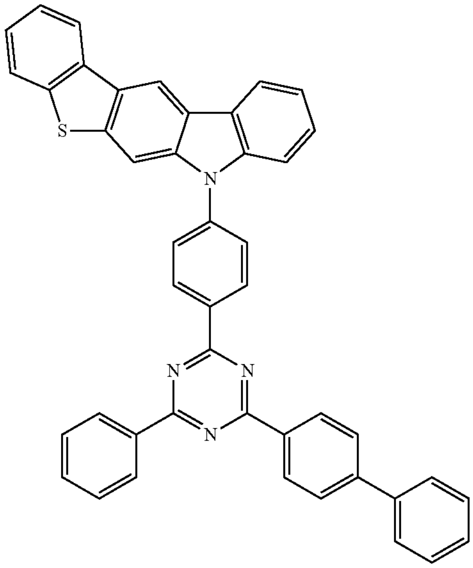
H2-168
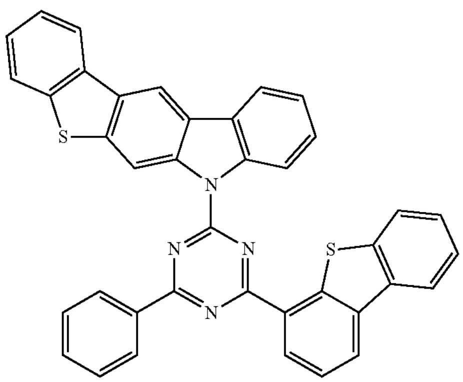
H2-169
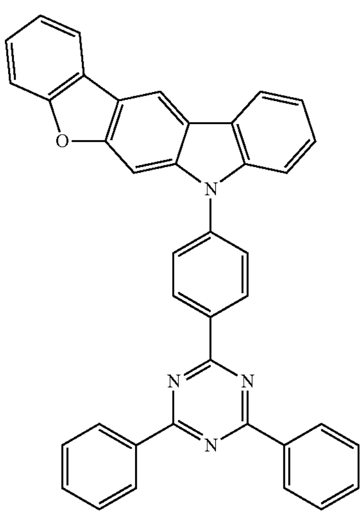
H2-170
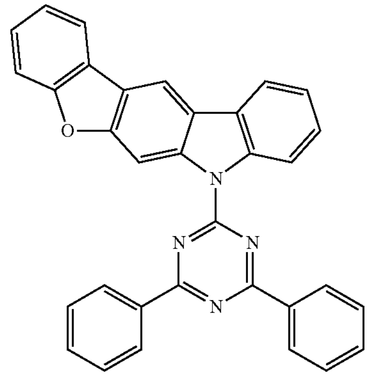
H2-171
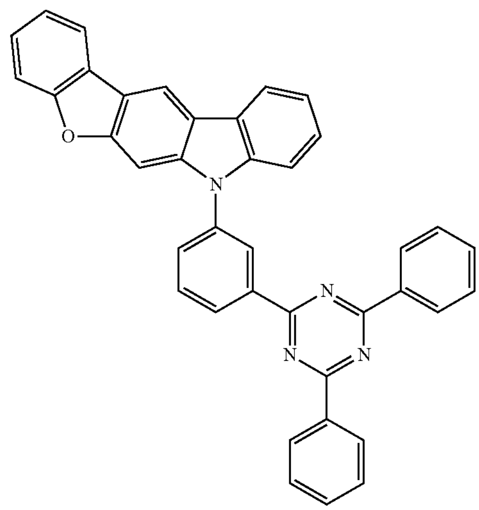
H2-172
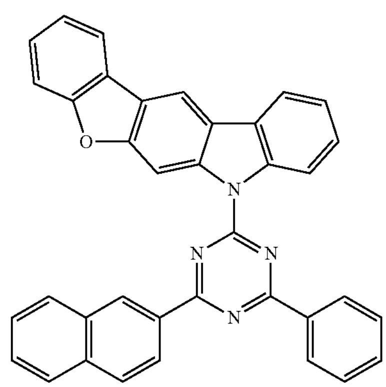

H2-173
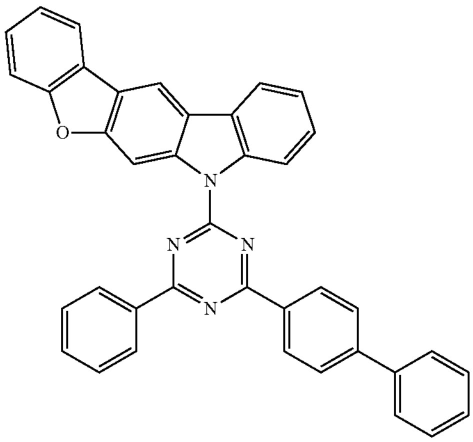
H2-174
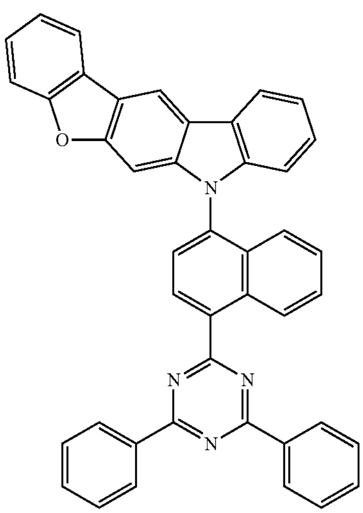
H2-175
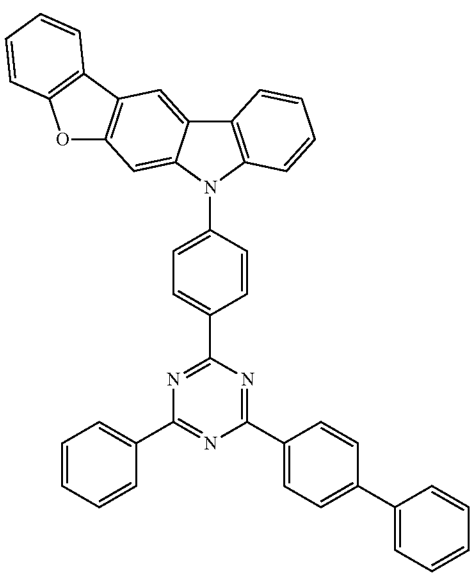
H2-176
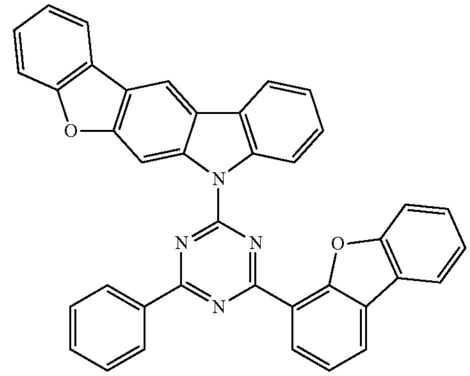
H2-177
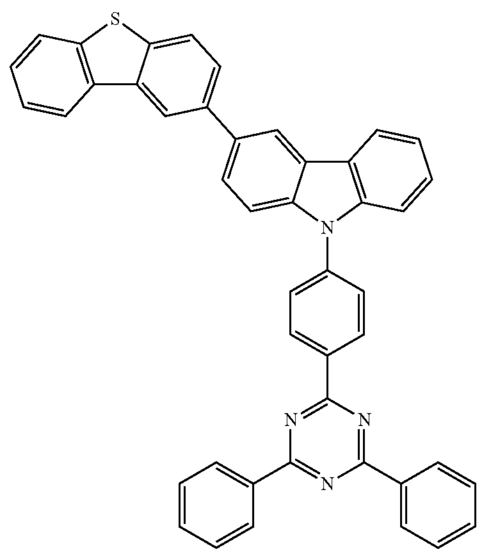
H2-178
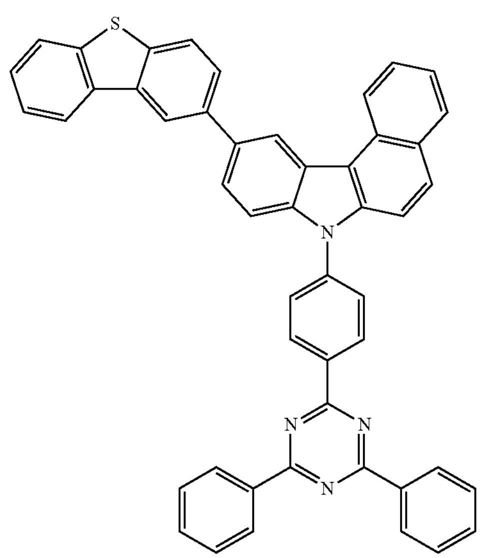

-continued
H2-179
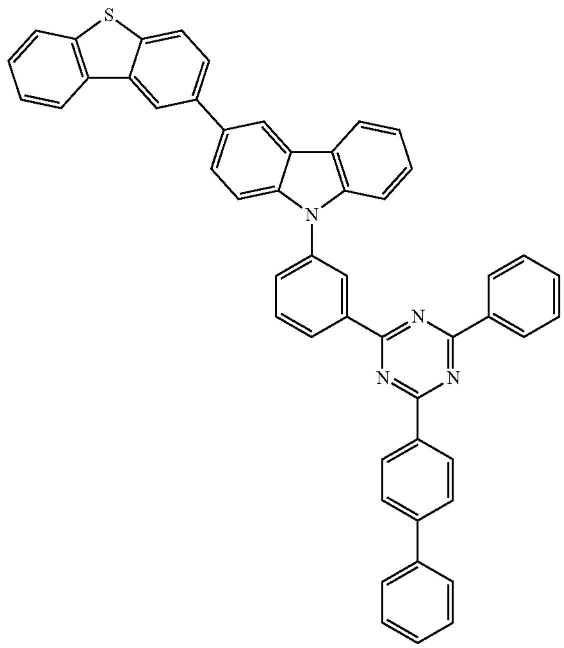
H2-180
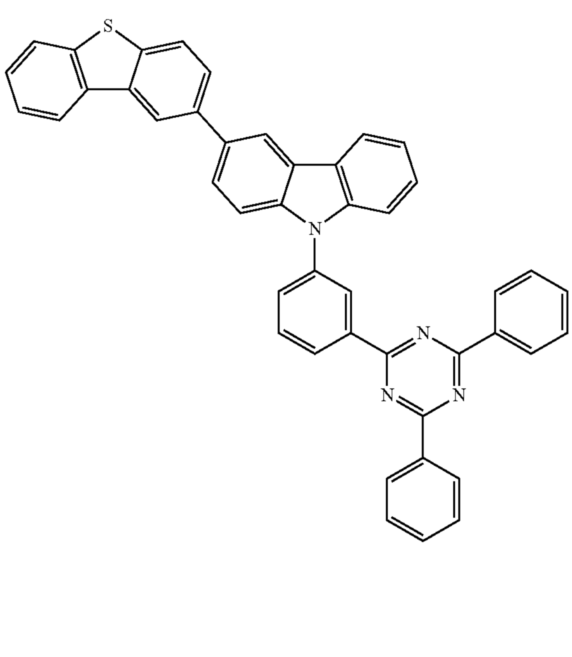
-continued
H2-181
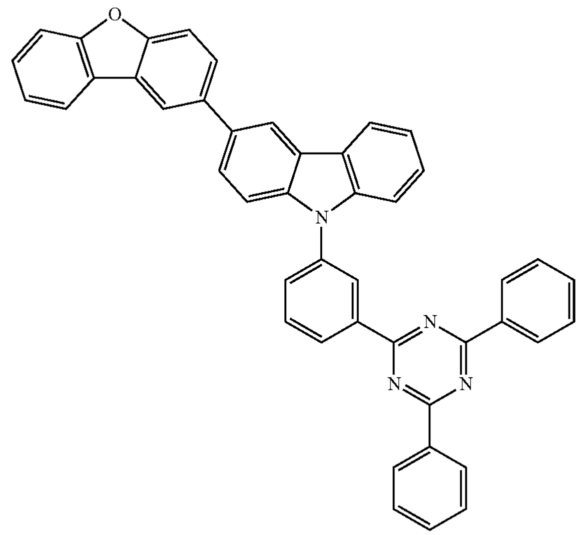
H2-182
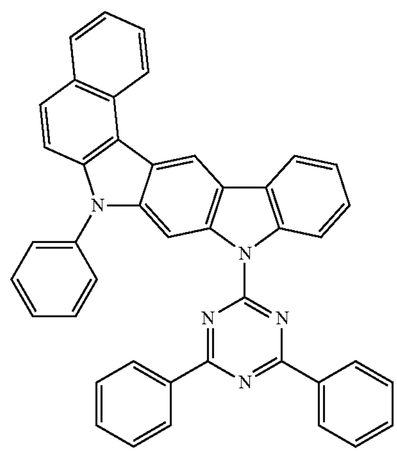
H2-183
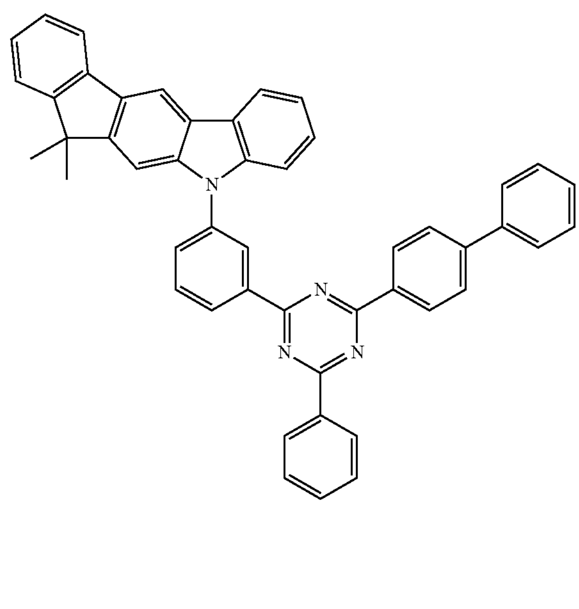

-continued
H2-184
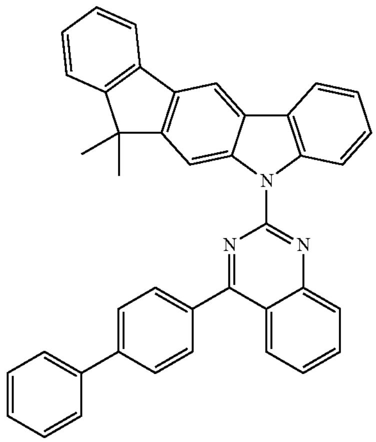
H2-185
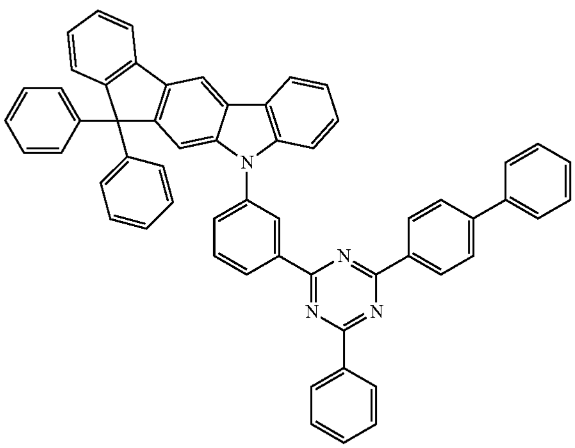
H2-186
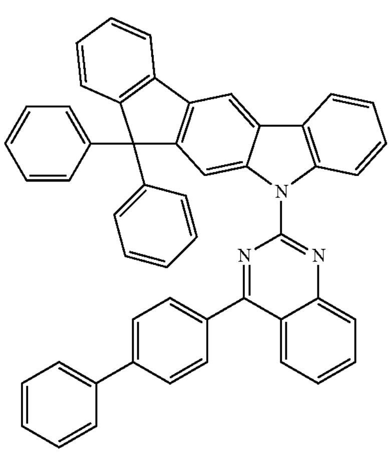
-continued
H2-187
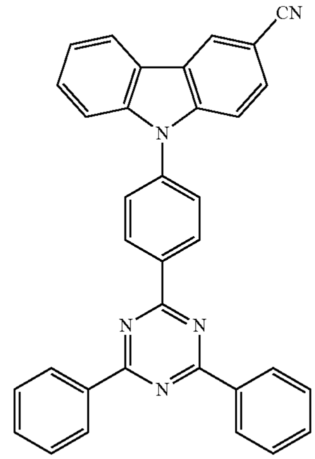
H2-188
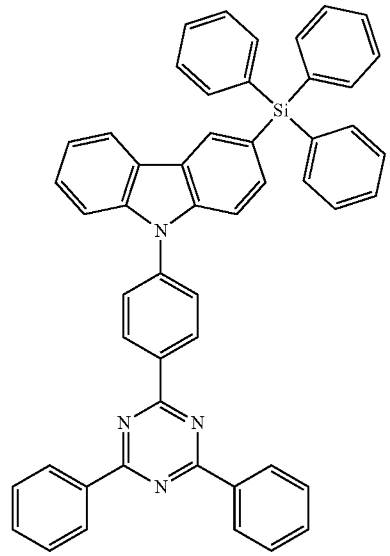
H2-189
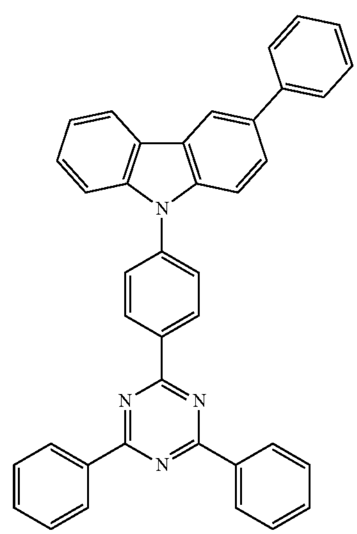

-continued
H2-190
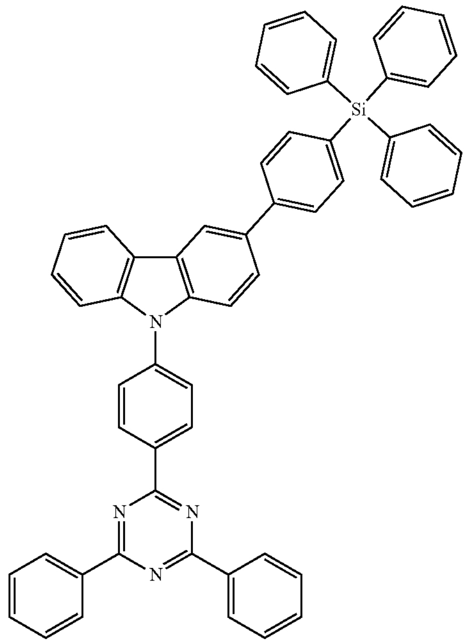
H2-191
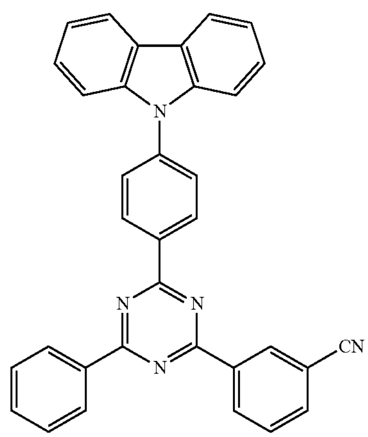
H2-192
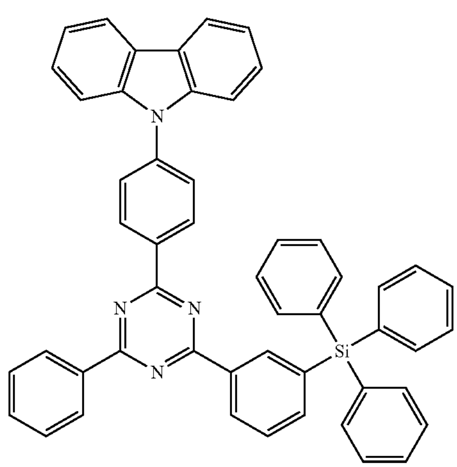
-continued
H2-193
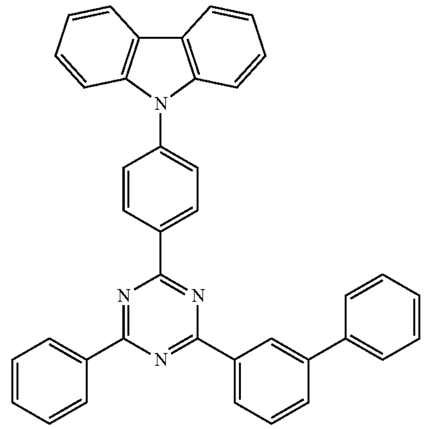
H2-194
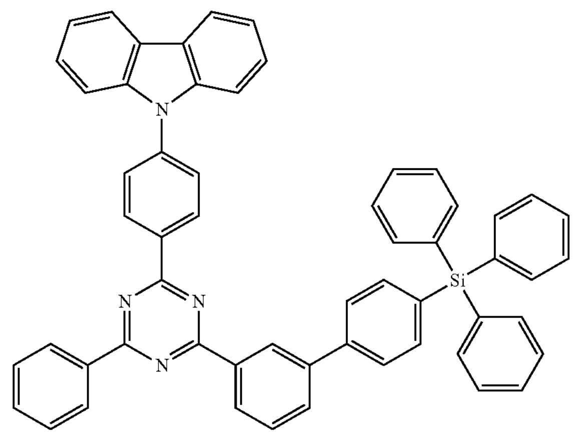
H2-195
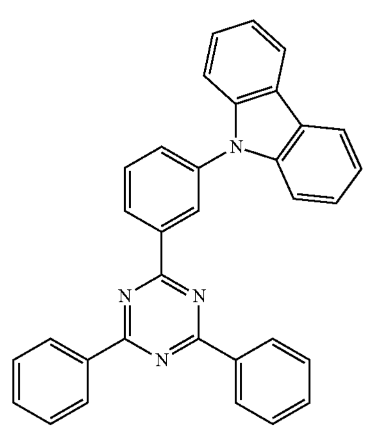

H2-196
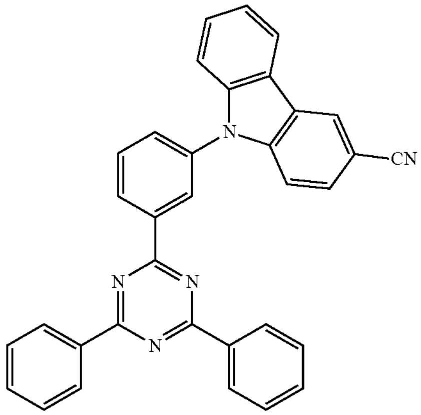
H2-197
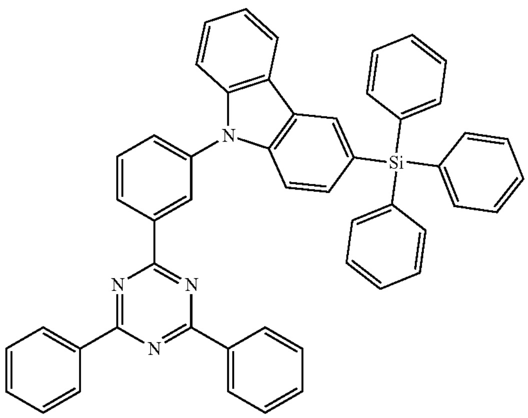
H2-198
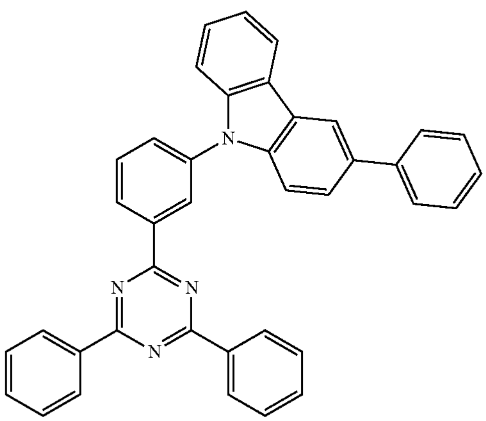
H2-199
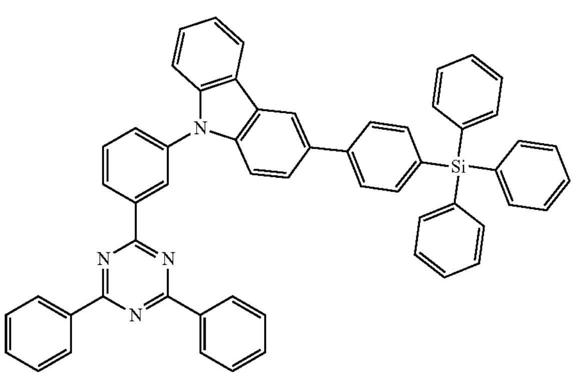
H2-200
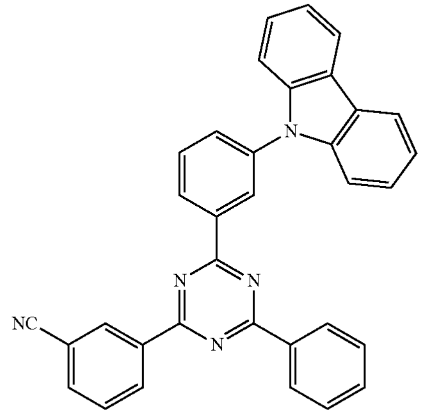
H2-201
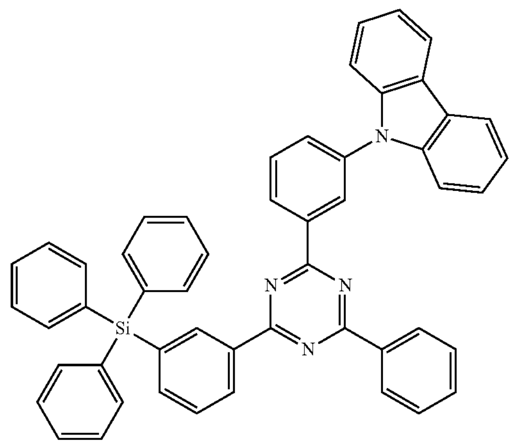
H2-202
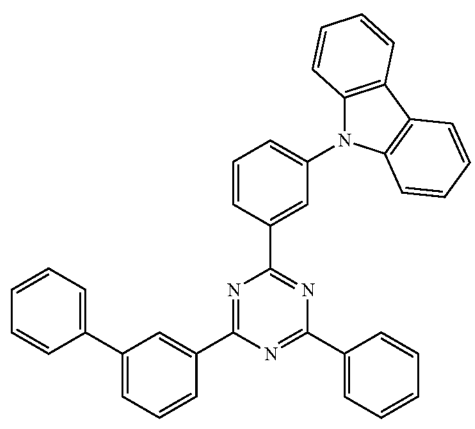

-continued
H2-203
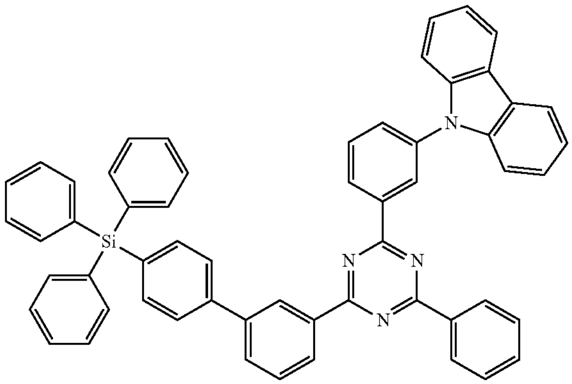
H2-204
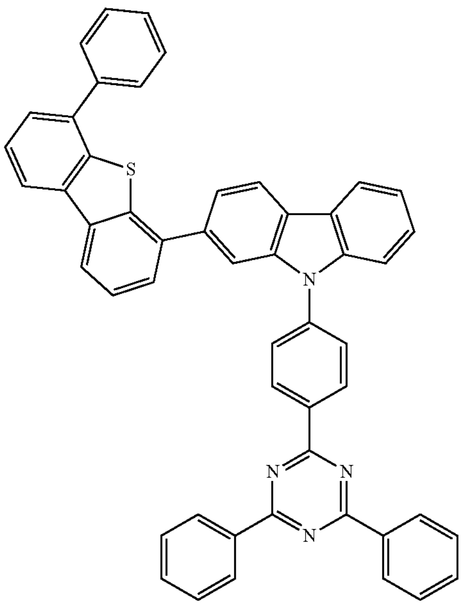
H2-205
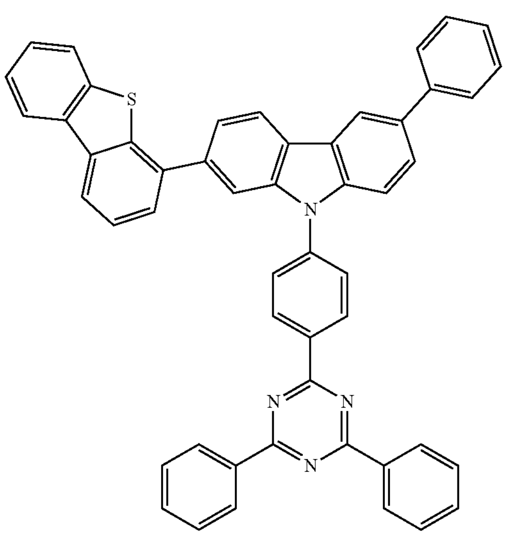
-continued
H2-206
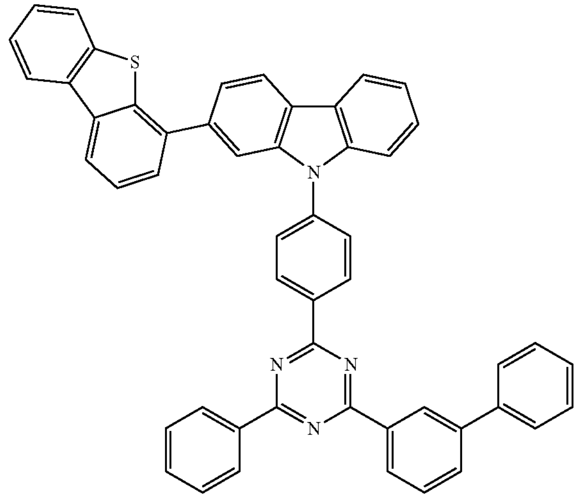
H2-207
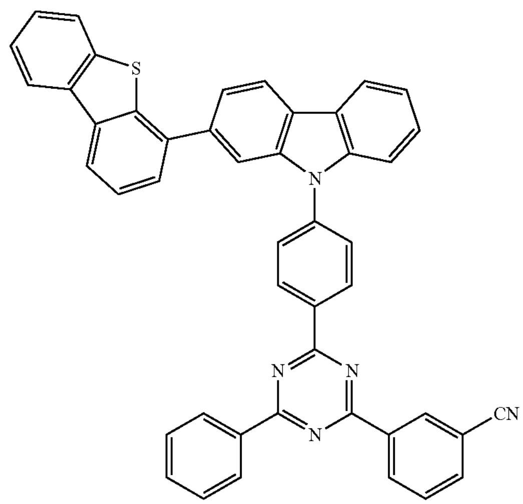
H2-208
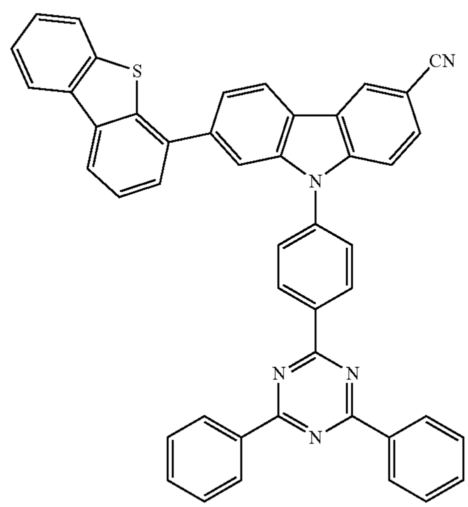

-continued
H2-209
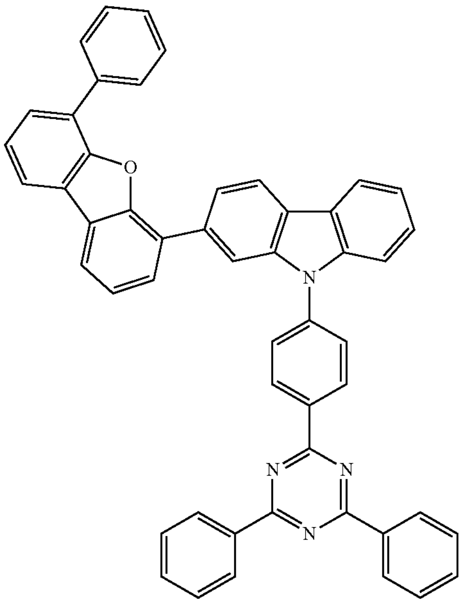
H2-210
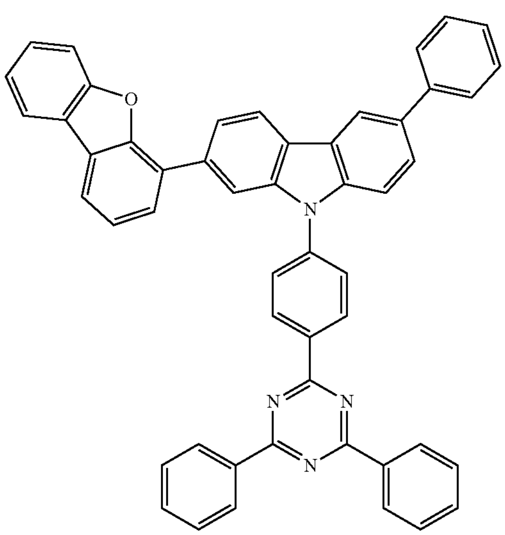
-continued
H2-211
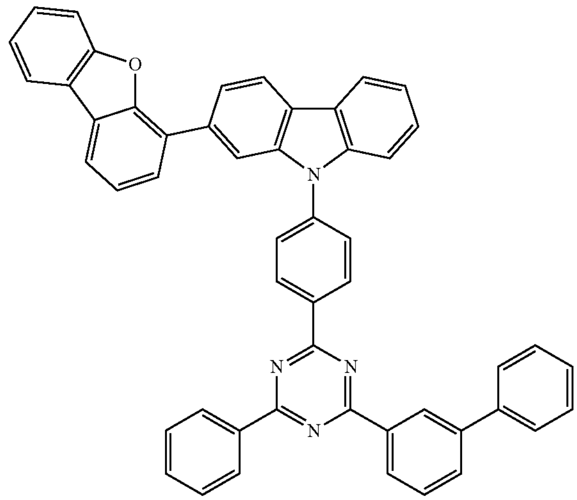
H2-212
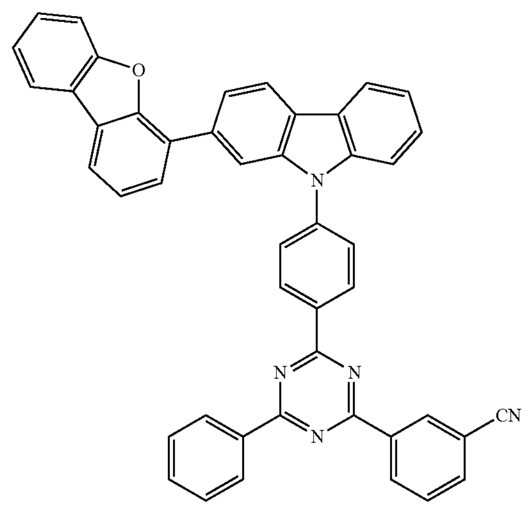
H2-213
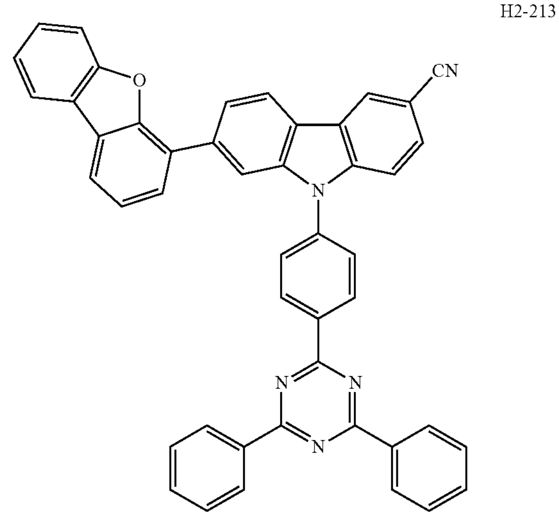

-continued
H2-214
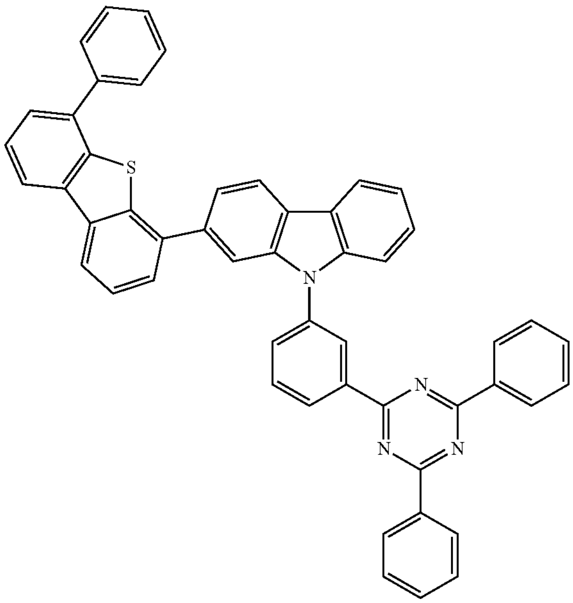
H2-215
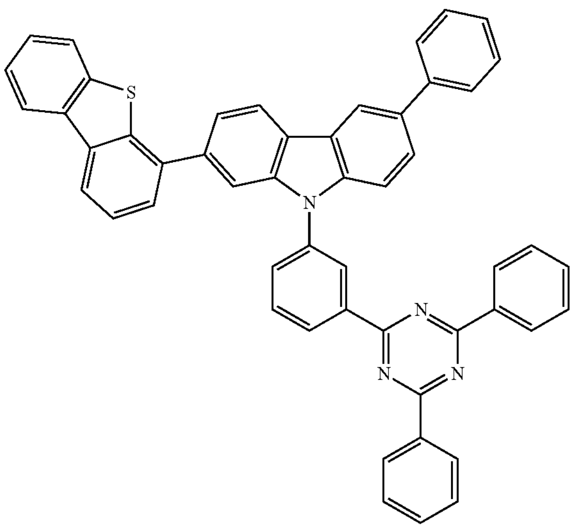
H2-216
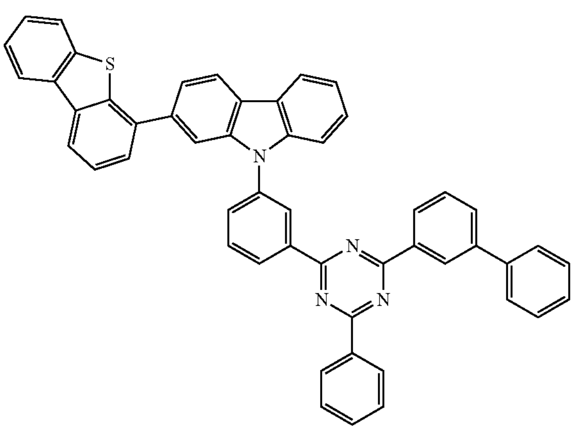
-continued
H2-217
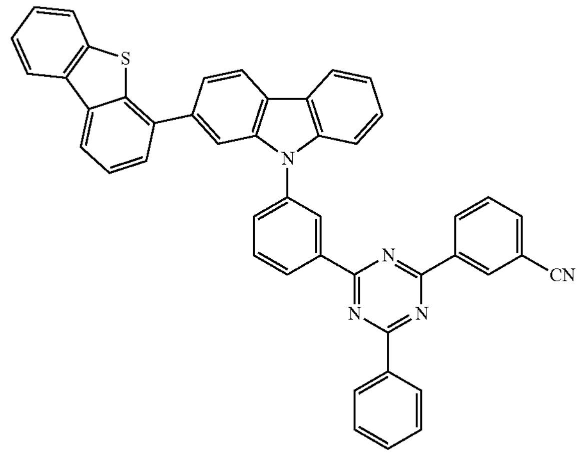
H2-218
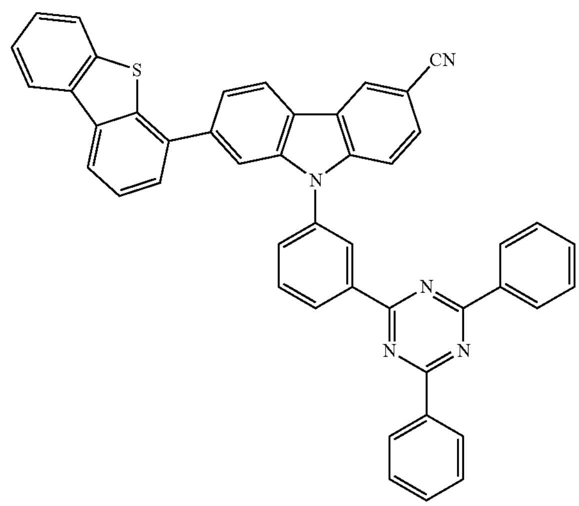
H2-219
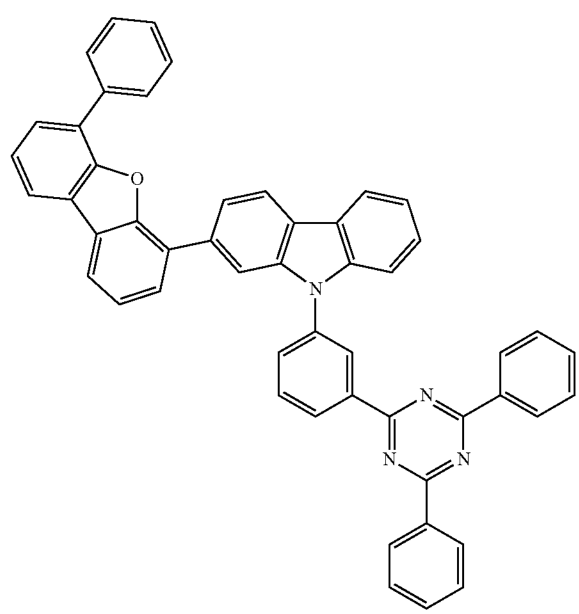

-continued
H2-220
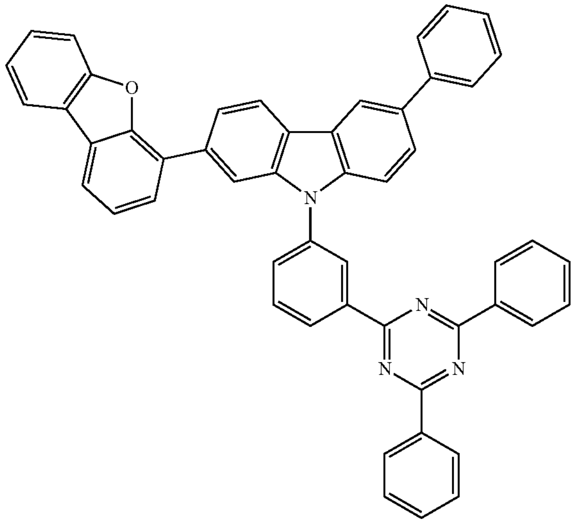
H2-221
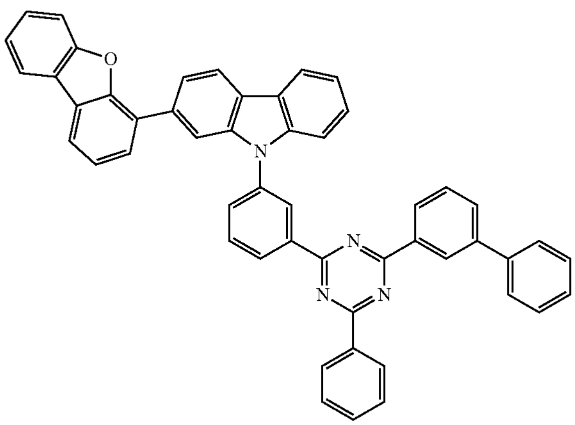
H2-222
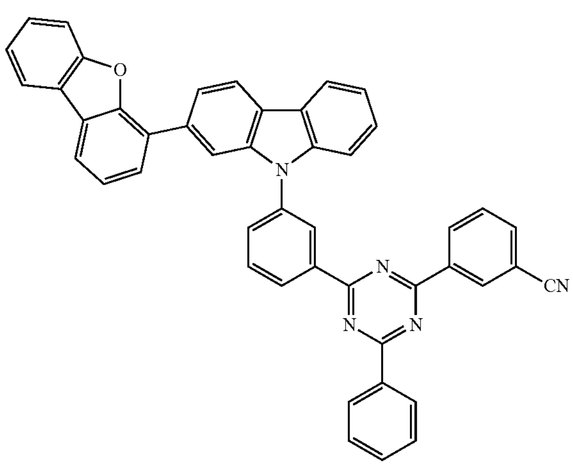
-continued
H2-223
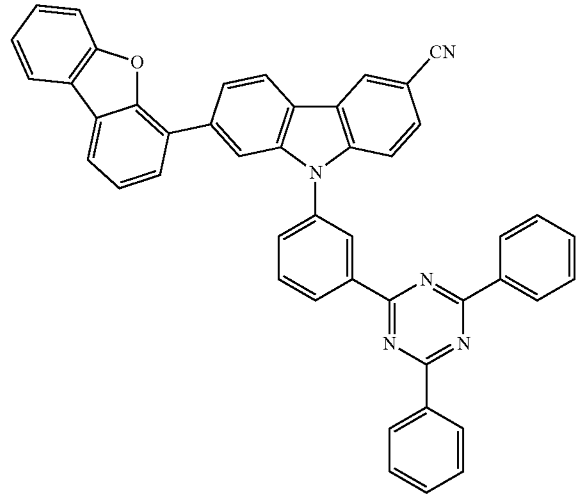
H2-224
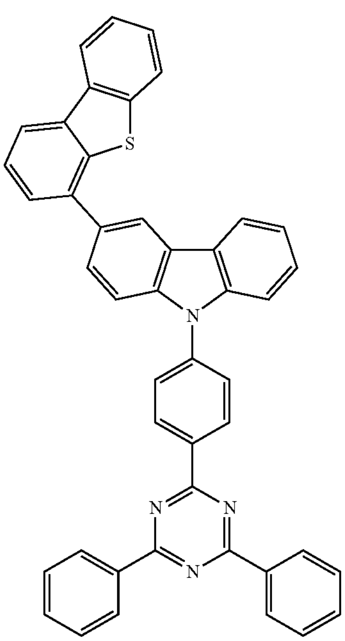

-continued
H2-225
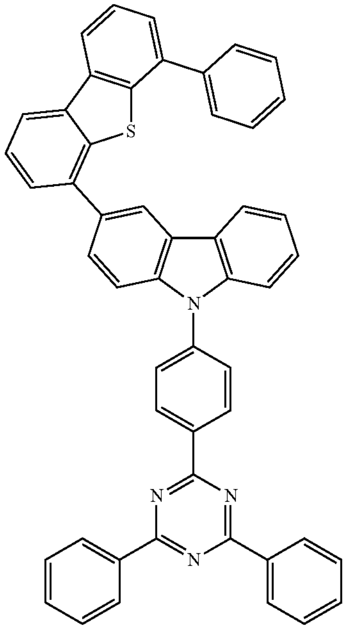
H2-226
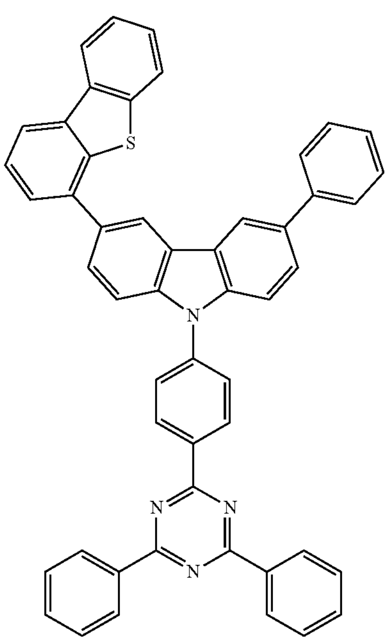
-continued
H2-227
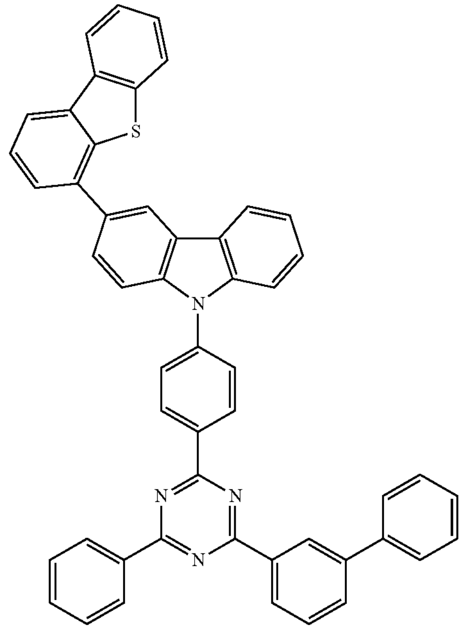
H2-228
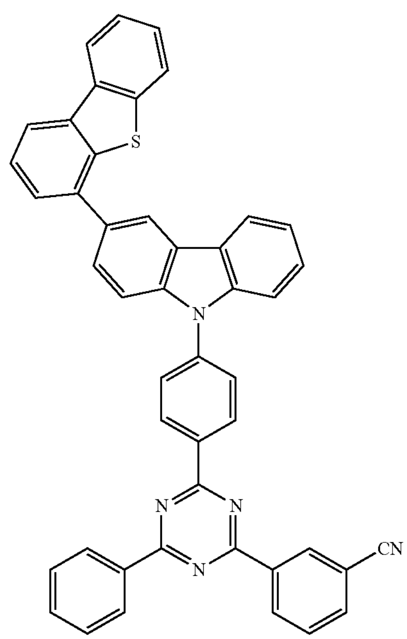

-continued
H2-229
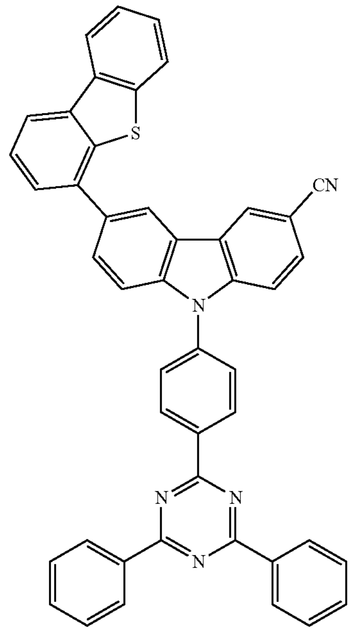
H2-230
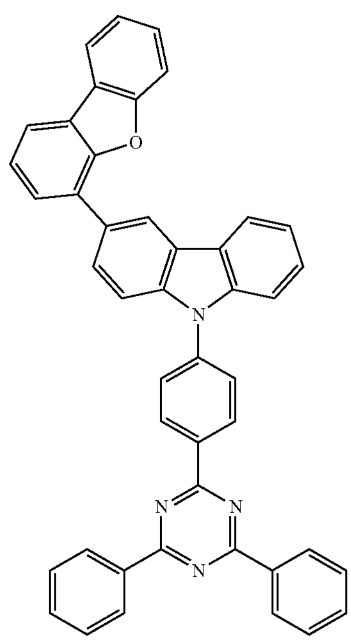
-continued
H2-231
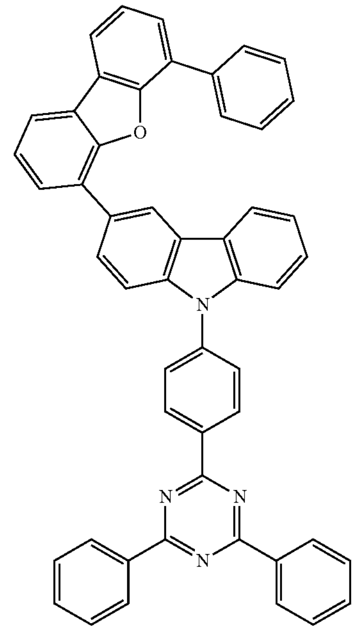
H2-232
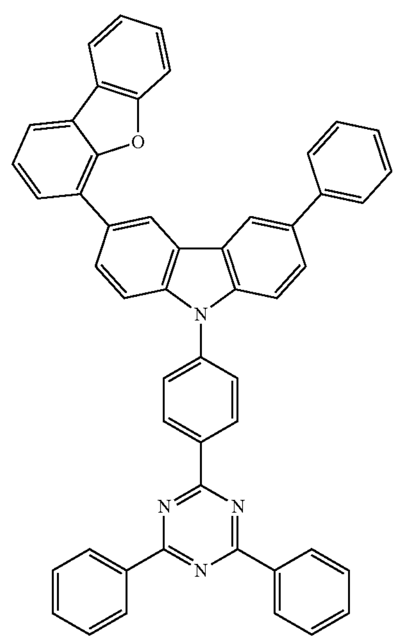

-continued
H2-233
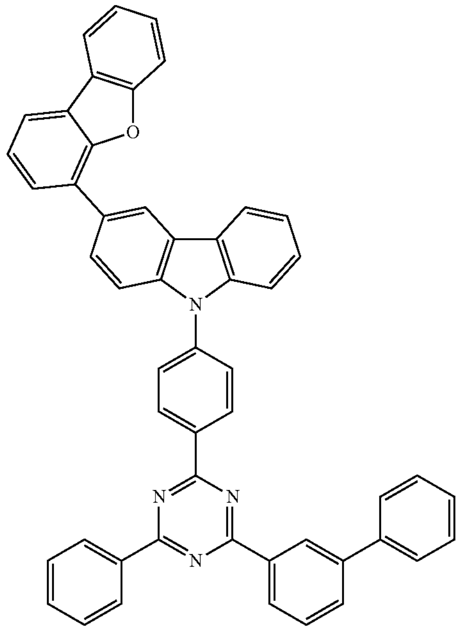
H2-234
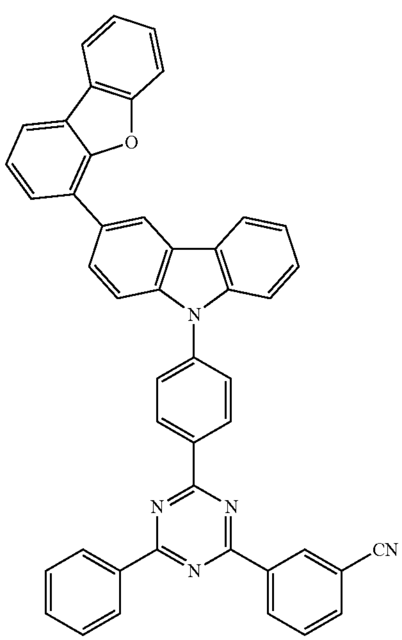
-continued
H2-235
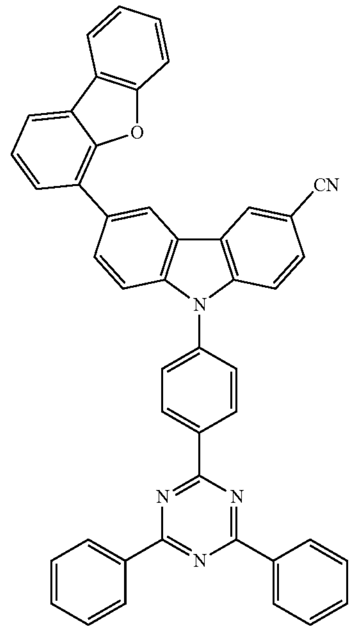
H2-236
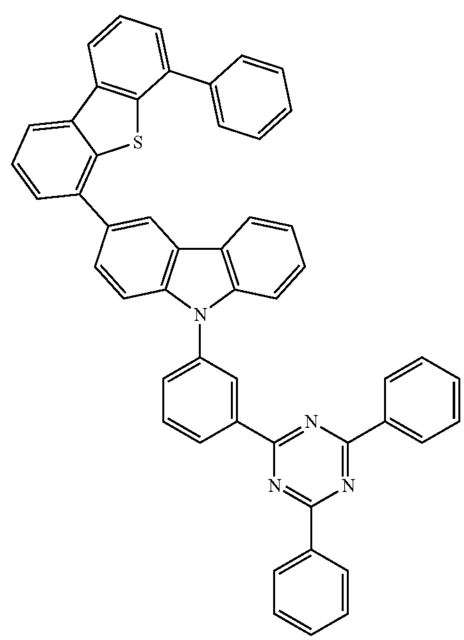

-continued
H2-237
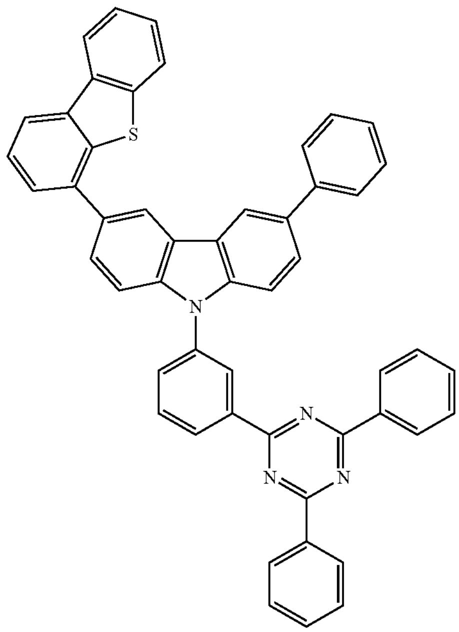
H2-238
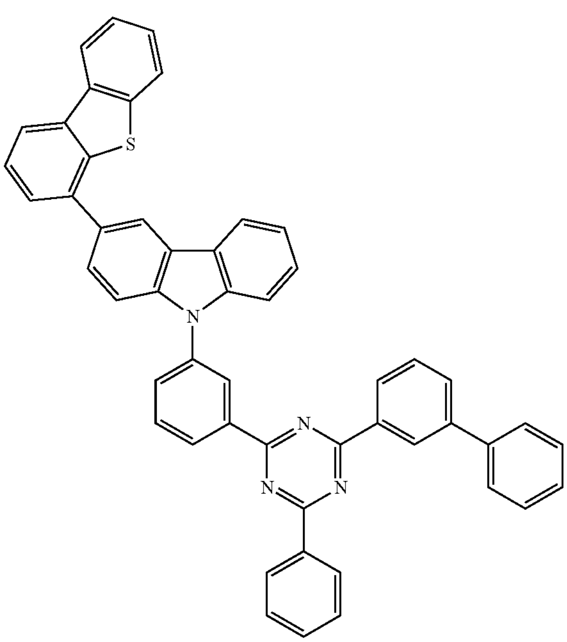
-continued
H2-239
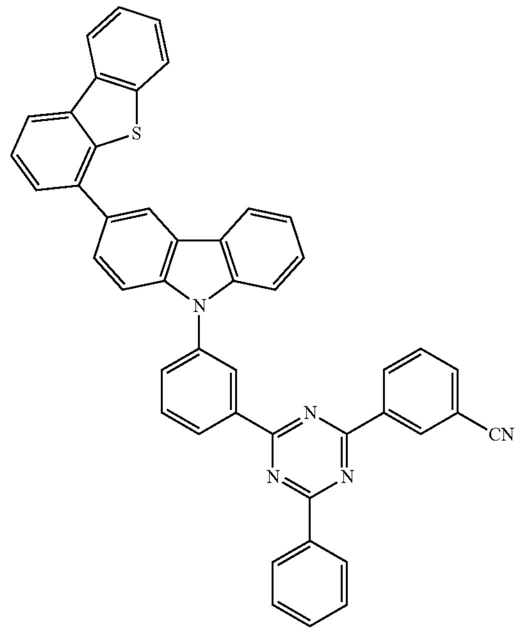
H2-240
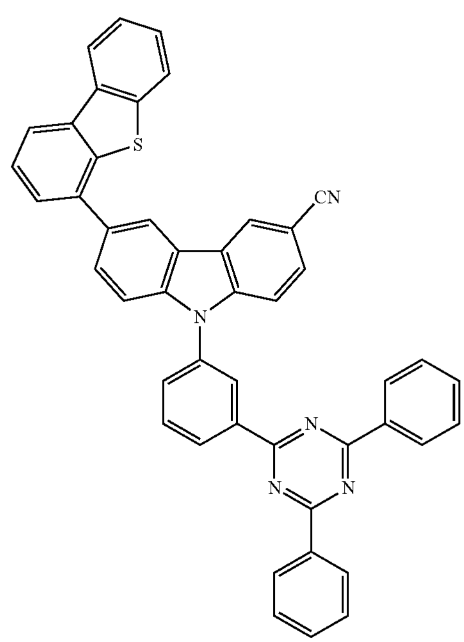

-continued
H2-241
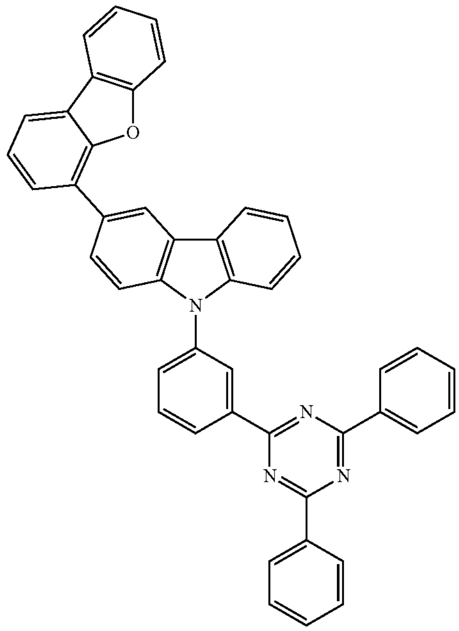
H2-242
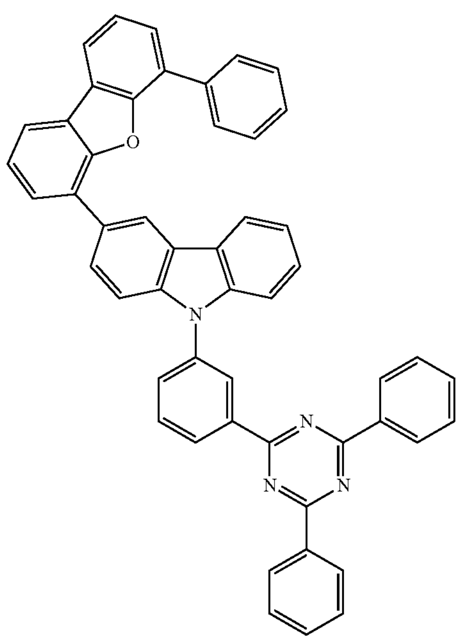
-continued
H2-243
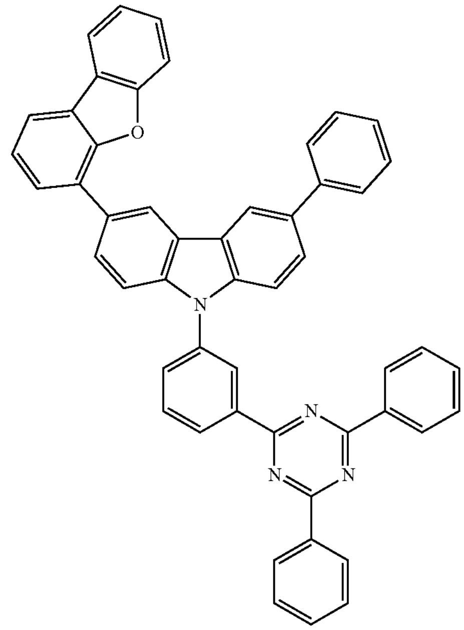
H2-244
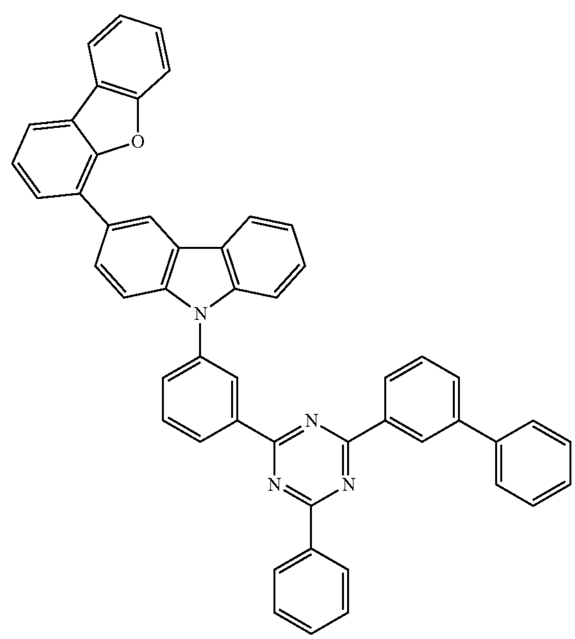

-continued
H2-245
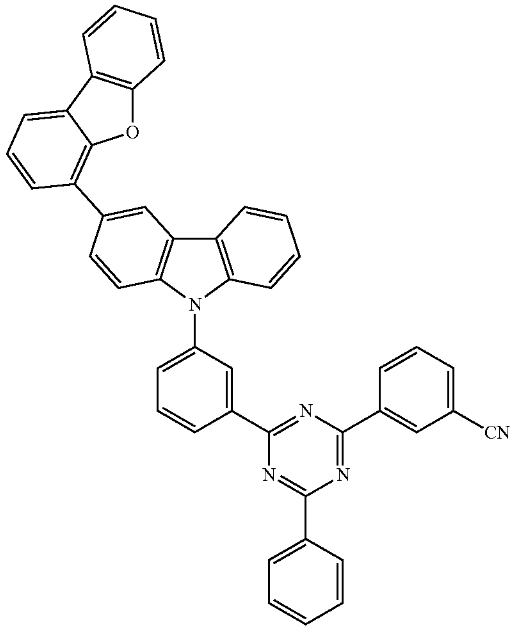
H2-246
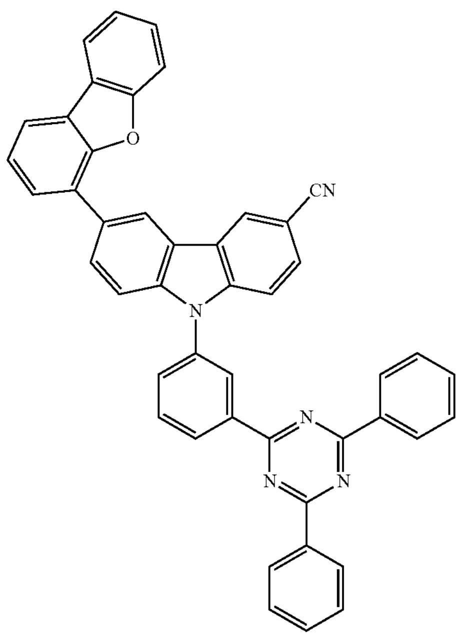
H2-247
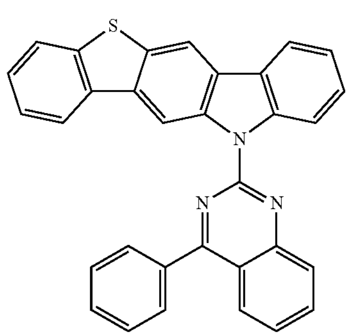
-continued
H2-248
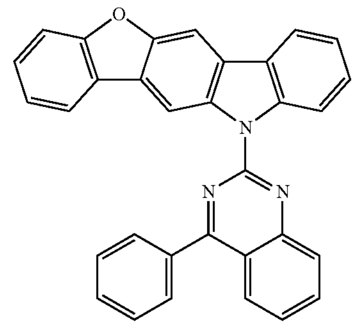
H2-249
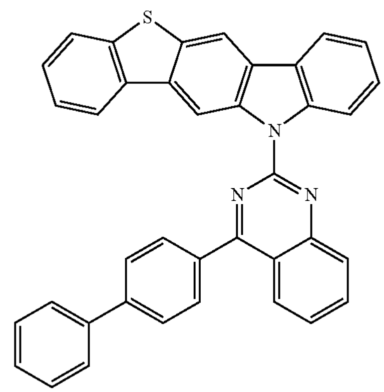
H2-250
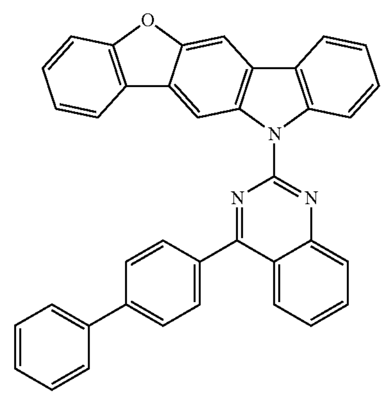
H2-251
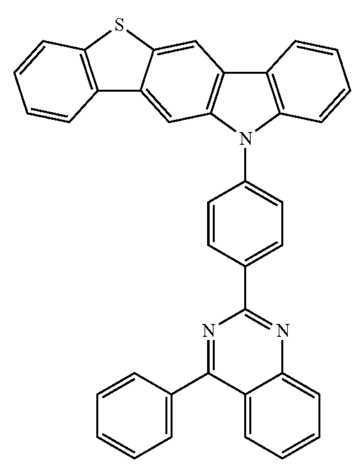

H2-252
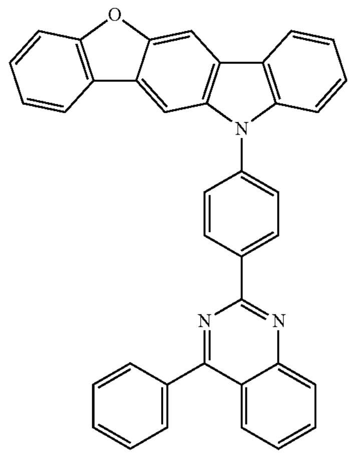
H2-253
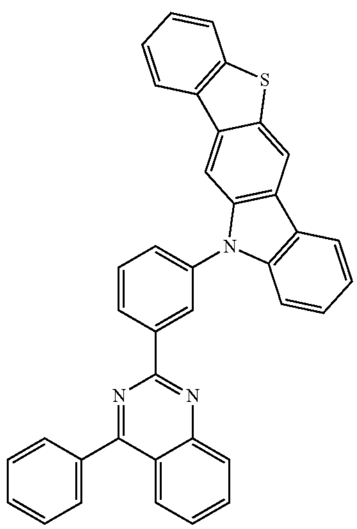
H3-254
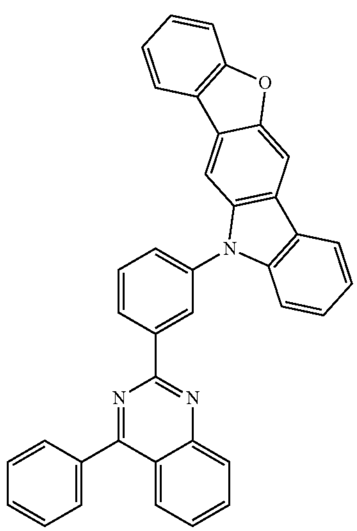
H3-255
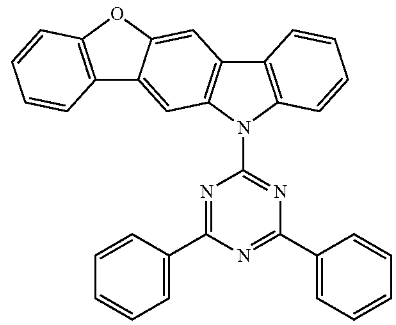
H2-256
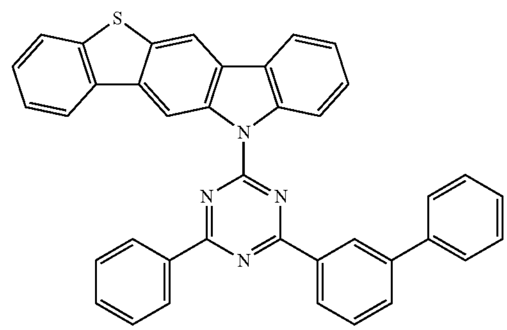
H2-257
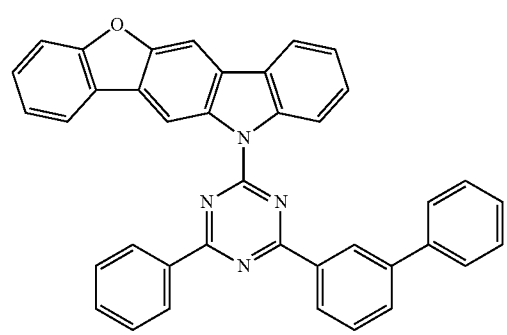
H2-258
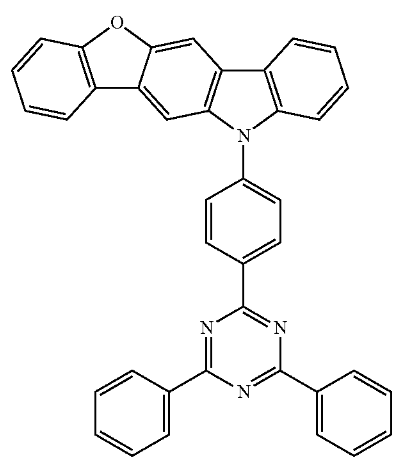

-continued
H2-259
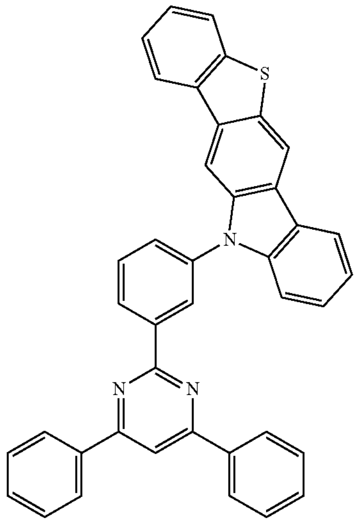
H2-260
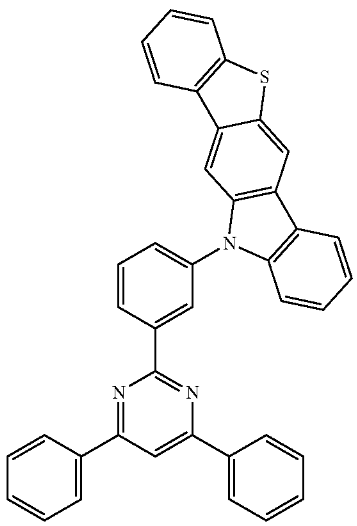
H2-261
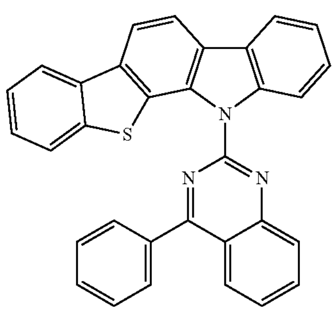
H2-262
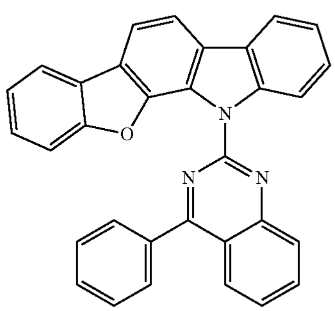
-continued
H2-263
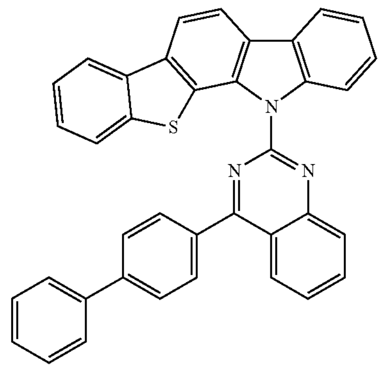
H2-264
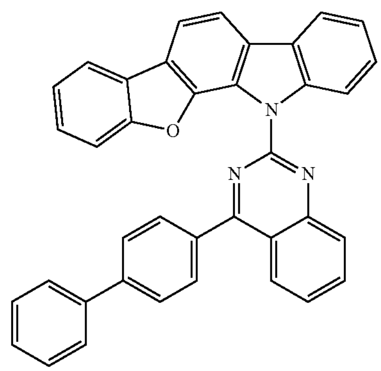
H2-265
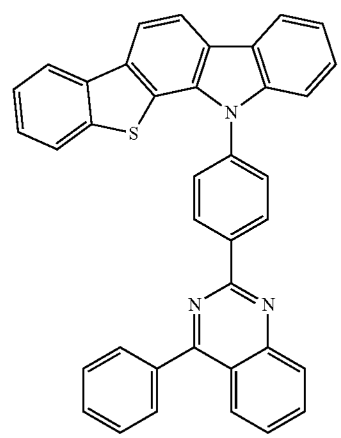
H2-266
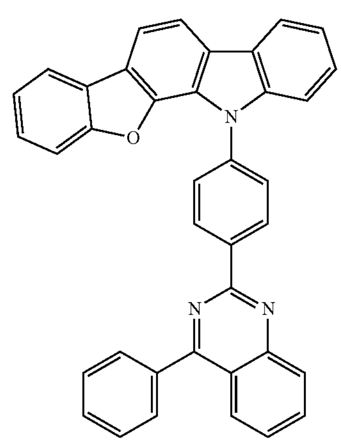

H2-267
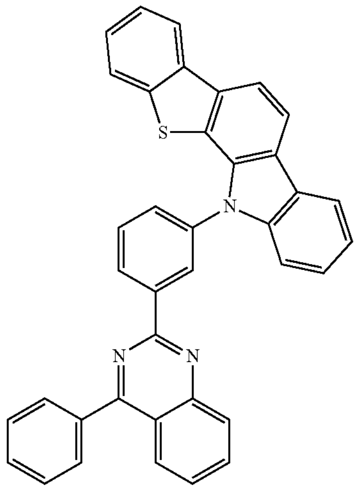
H2-268
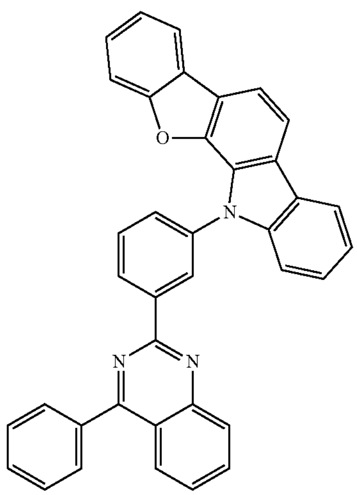
H2-269
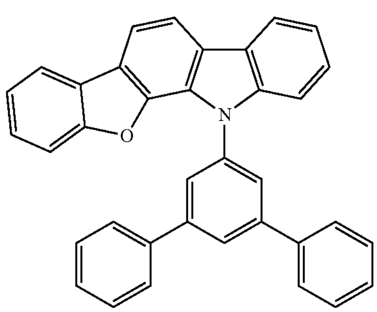
H2-270
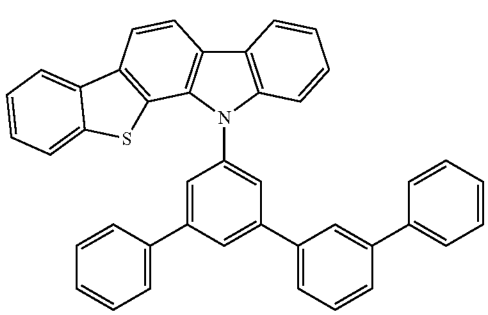
H2-271
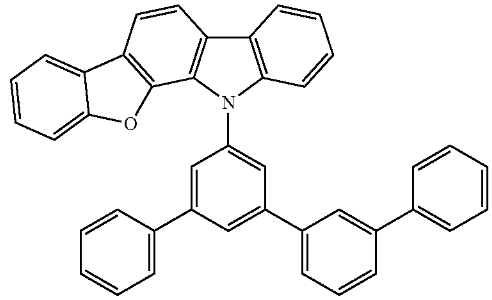
H2-272
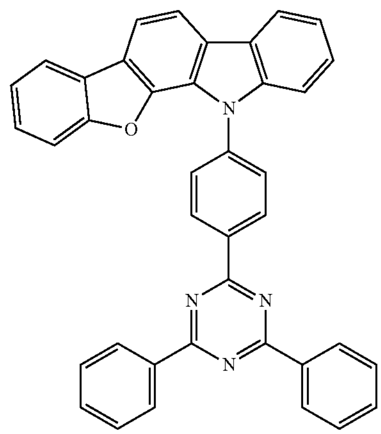
H2-273
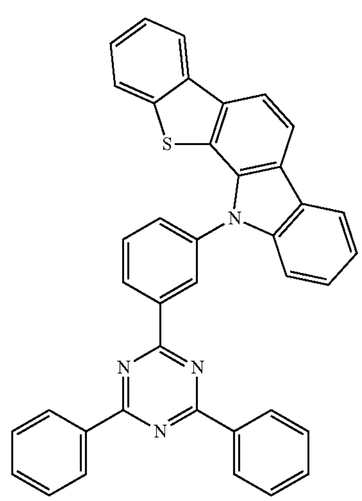

-continued
H2-274
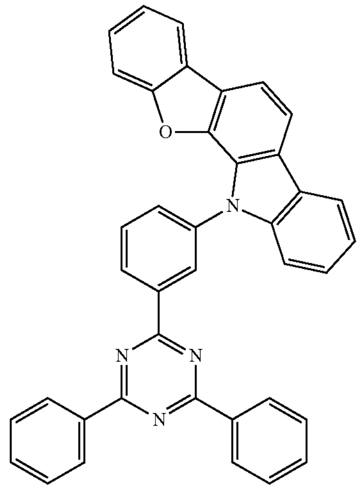
H2-275
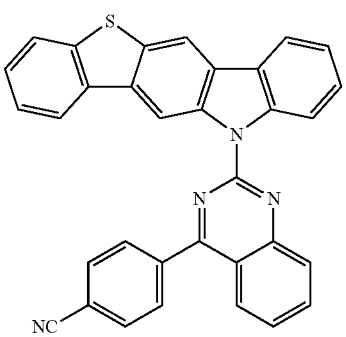
H2-276
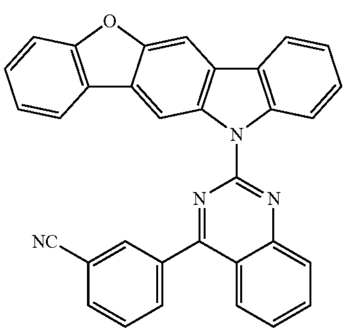
H2-277
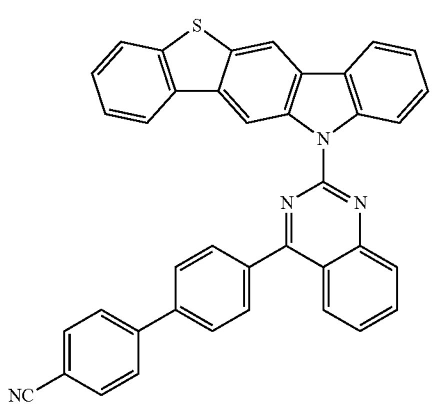
-continued
H2-278
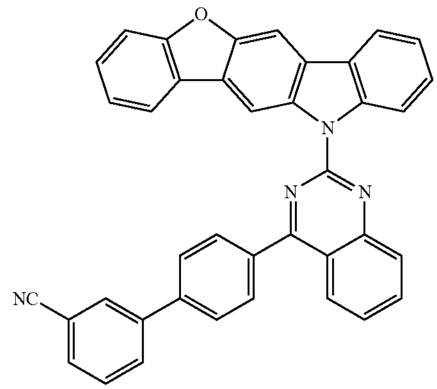
H2-279
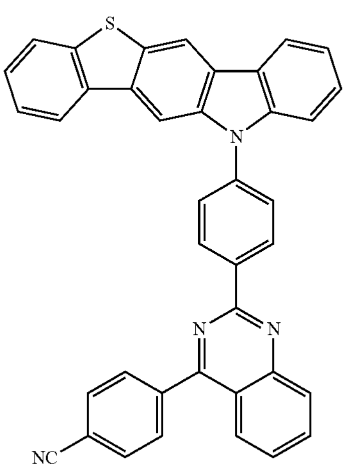
H2-280
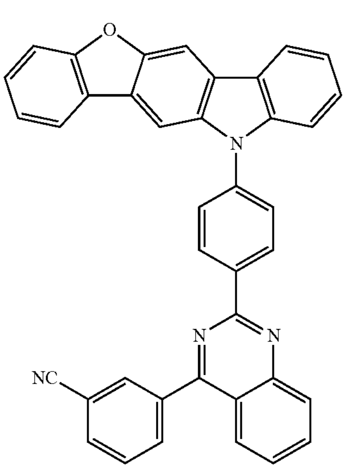

H2-281
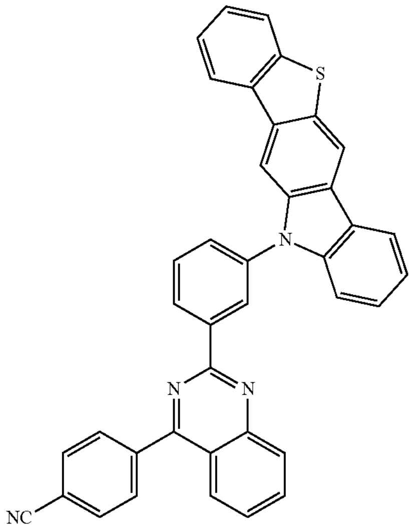
H2-282
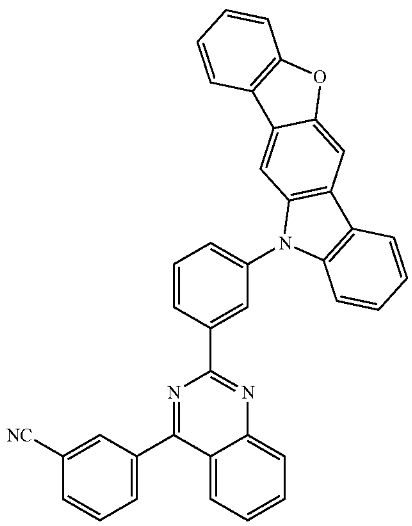
H2-283
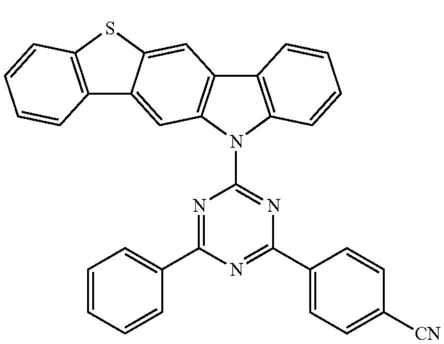
H2-284
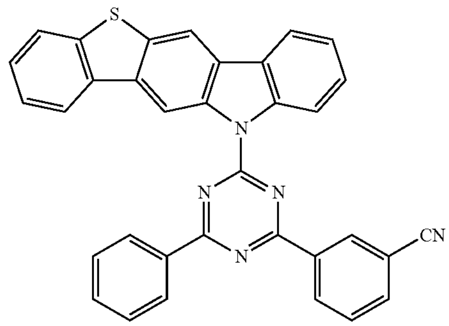
H2-285
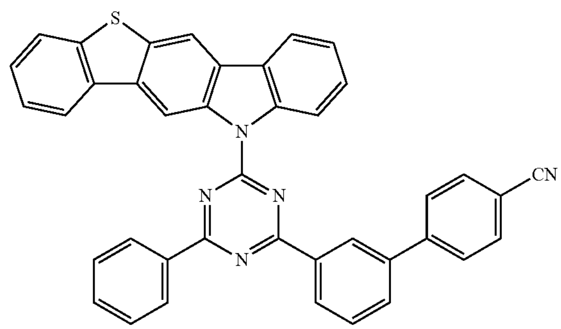
H2-286
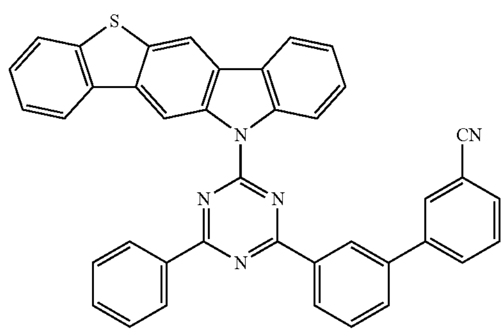
H2-287
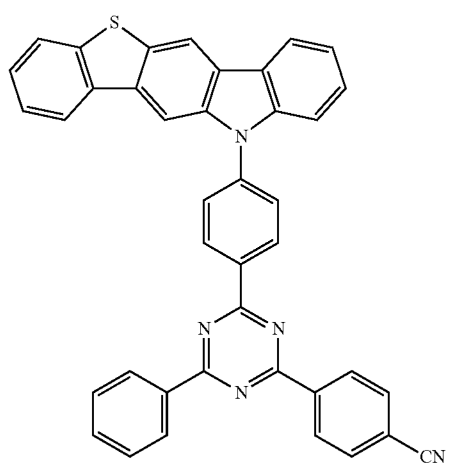

H2-288
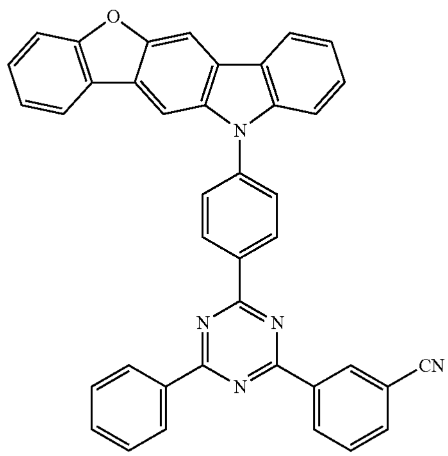
H2-289
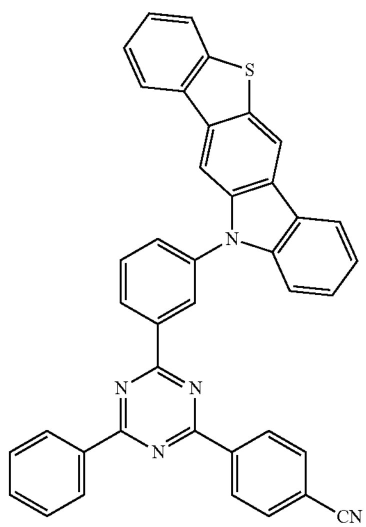
H2-290
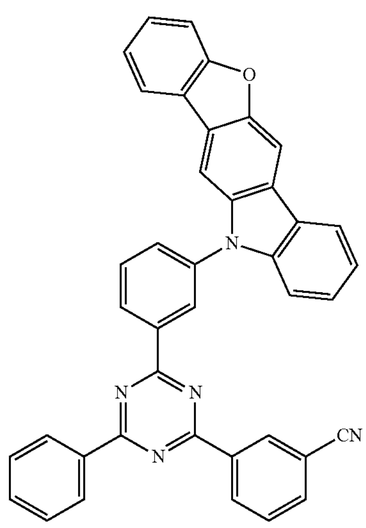
H2-291
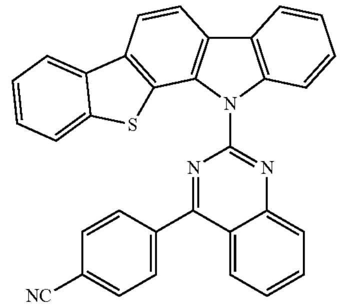
H2-292
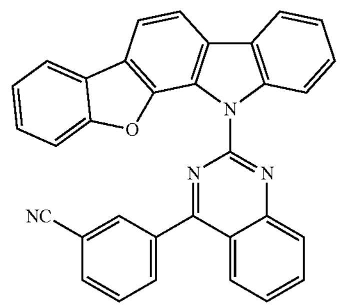
H2-293
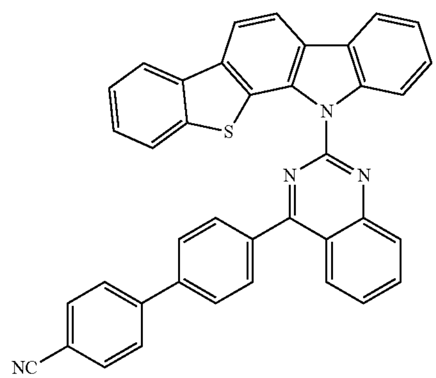
H2-294
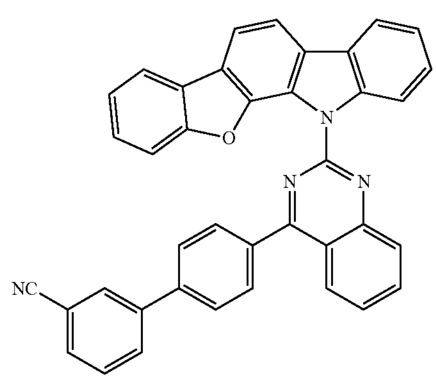

-continued
H2-295
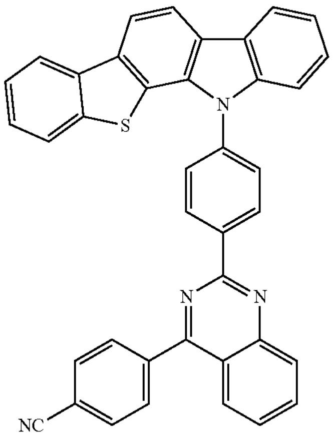
H2-296
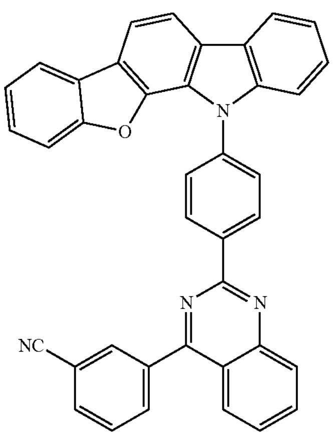
H2-297
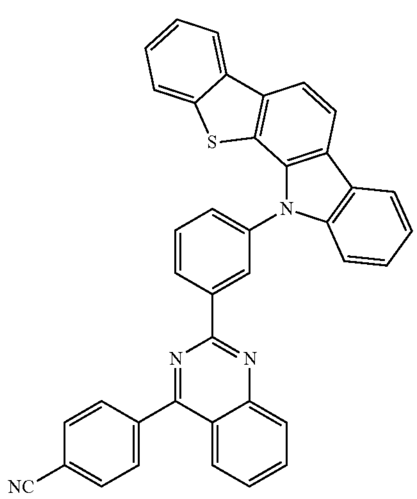
-continued
H2-298
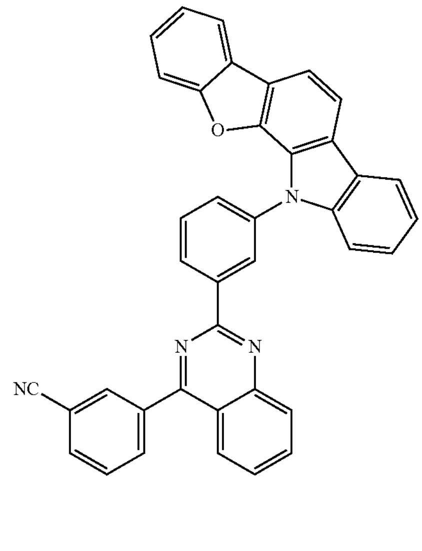
H2-299
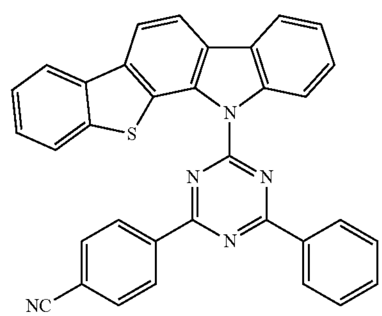
H2-300
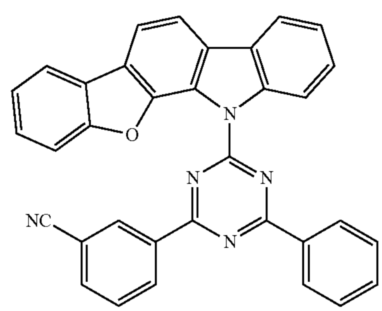
H2-301
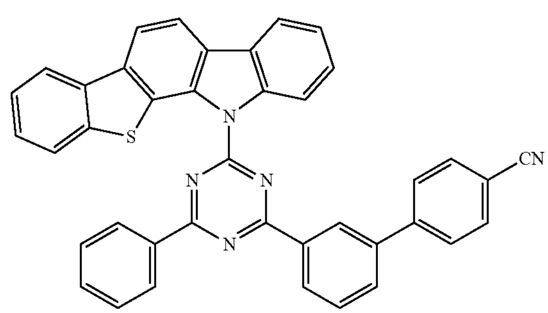

-continued
H2-302
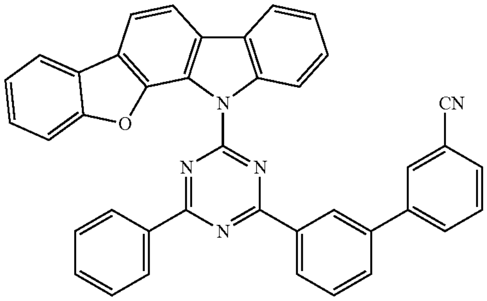
H2-303
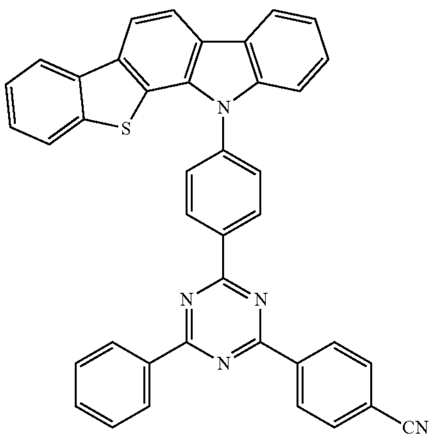
H2-304
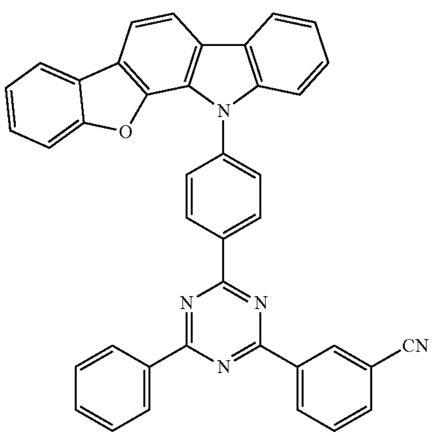
H2-305
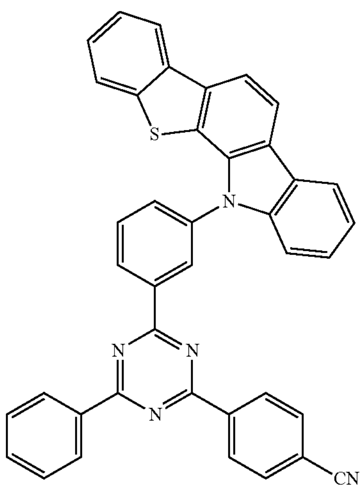
-continued
H2-306
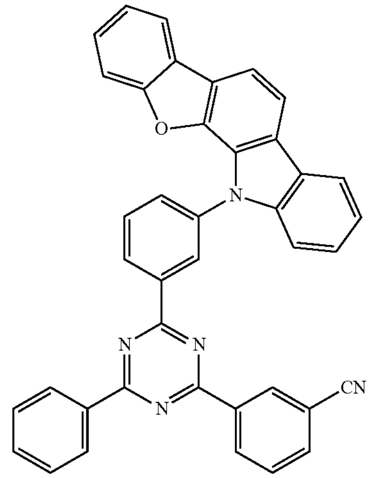
H2-307
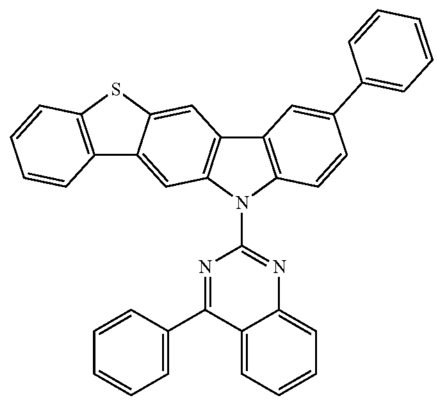
H2-308
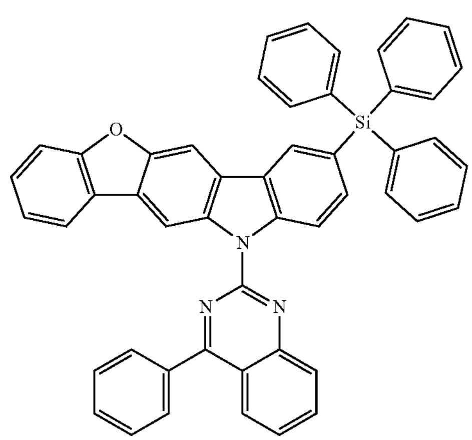

-continued
H2-309
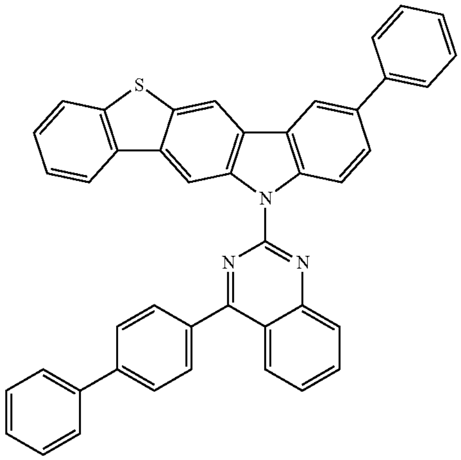
H2-310
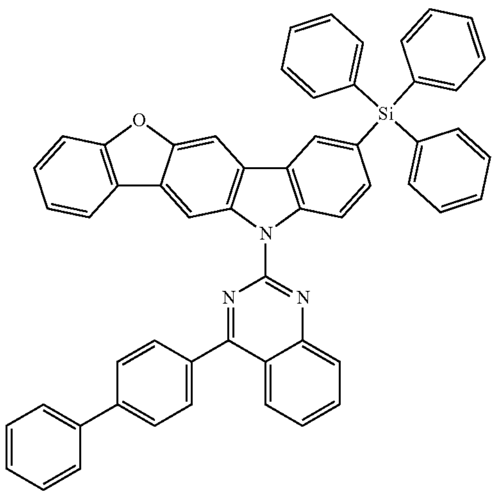
H2-311
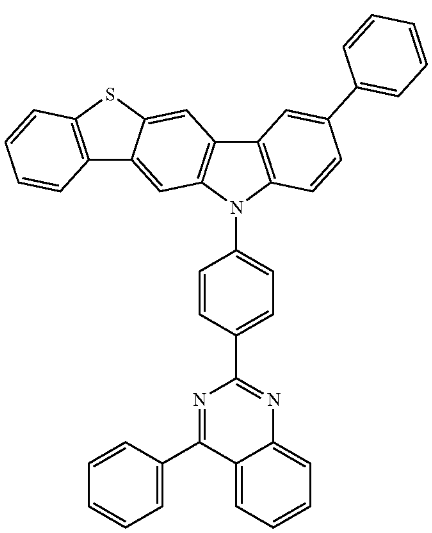
-continued
H2-312
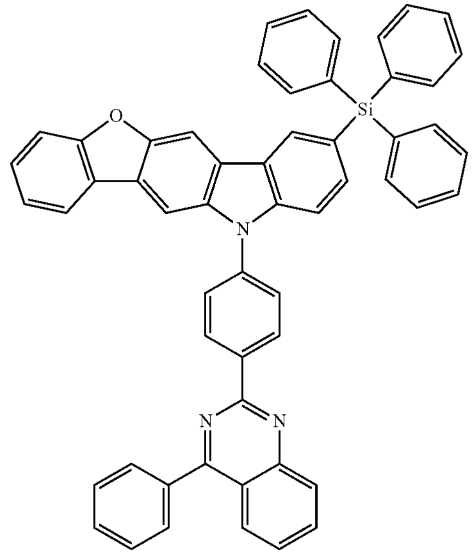
H2-313
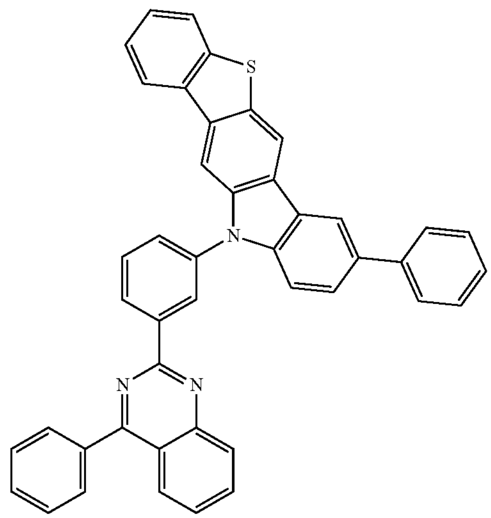
H2-314
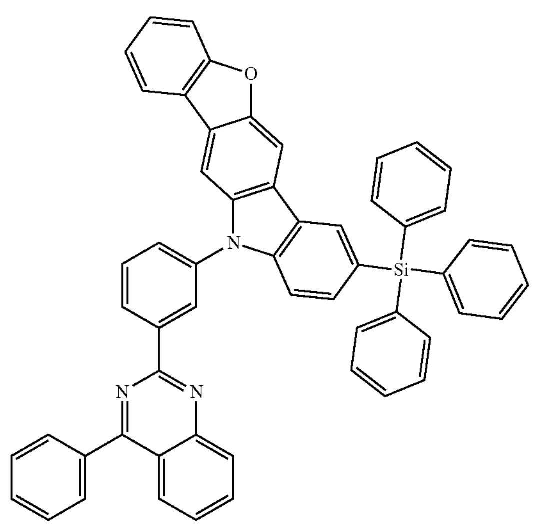

H2-315
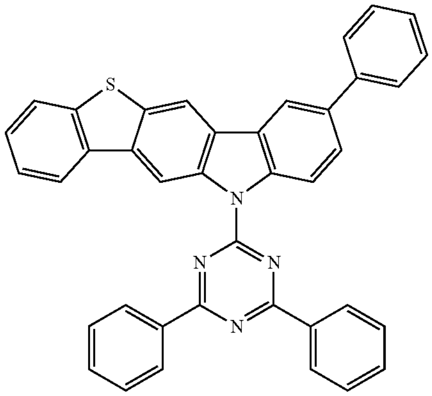
H2-316
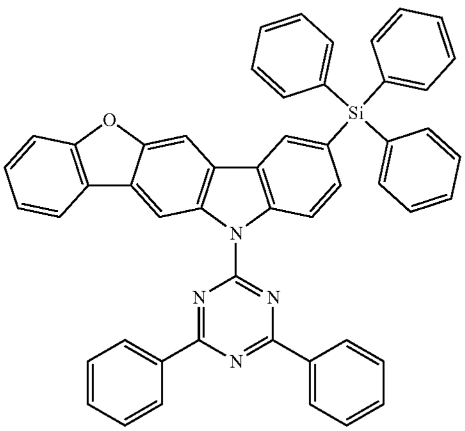
H2-317
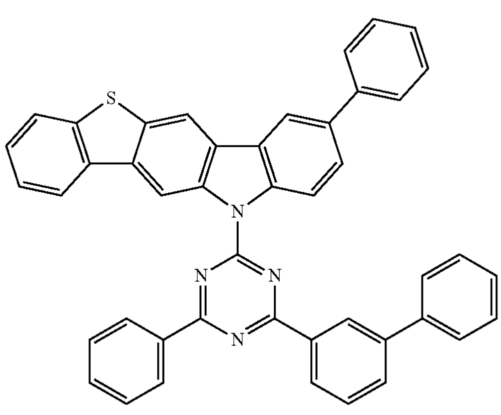
H2-318
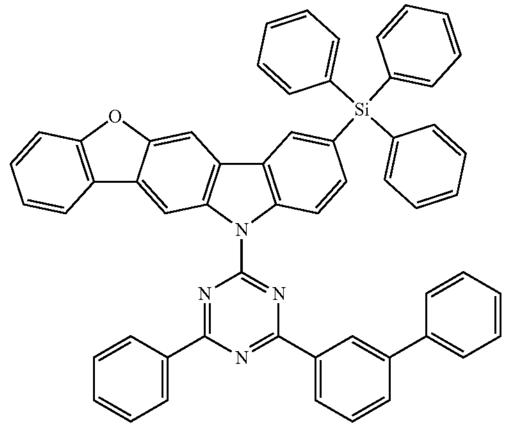
H2-319
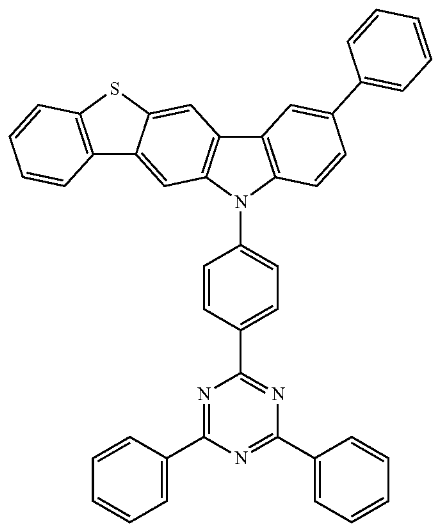
H2-320
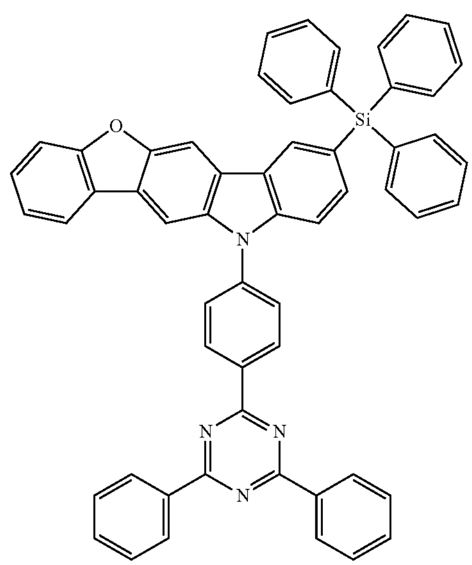

-continued
H2-321
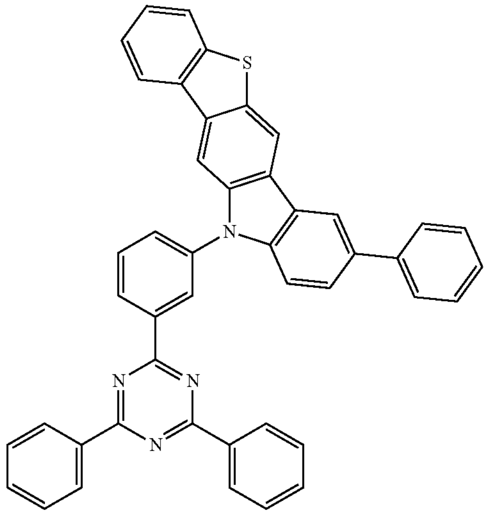
H2-322
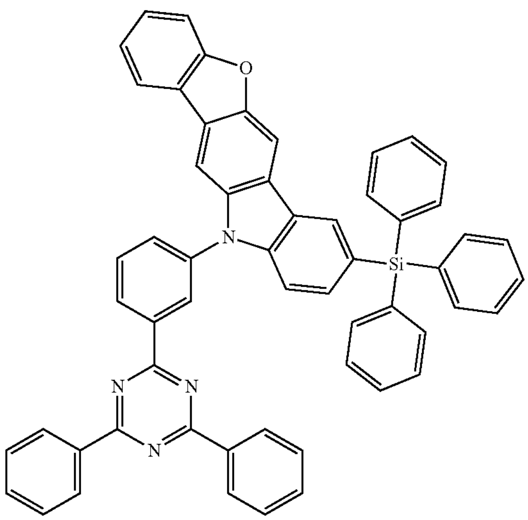
H2-323
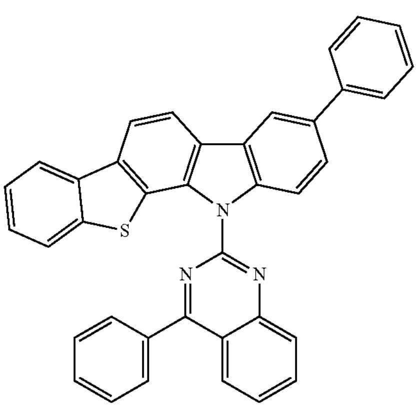
-continued
H2-324
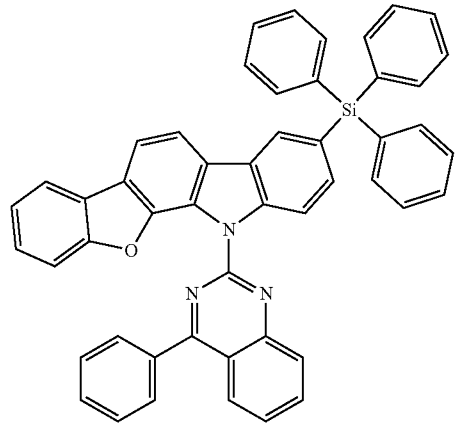
H2-325
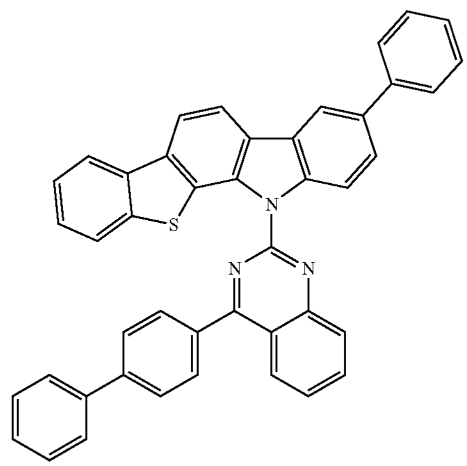
H2-326
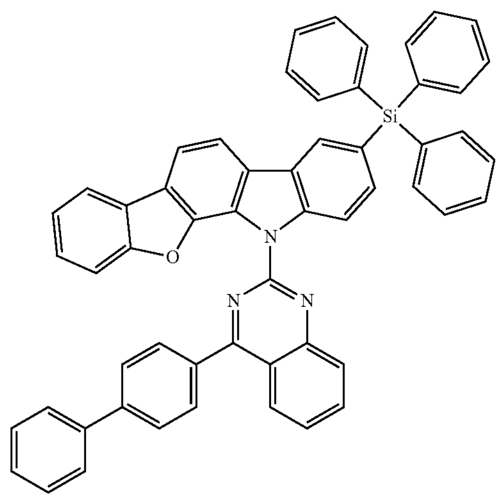

-continued
H2-327
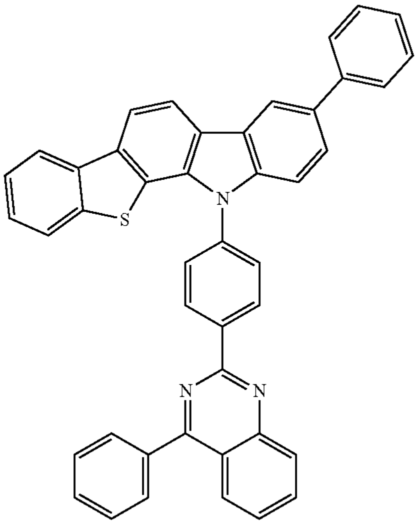
H2-328
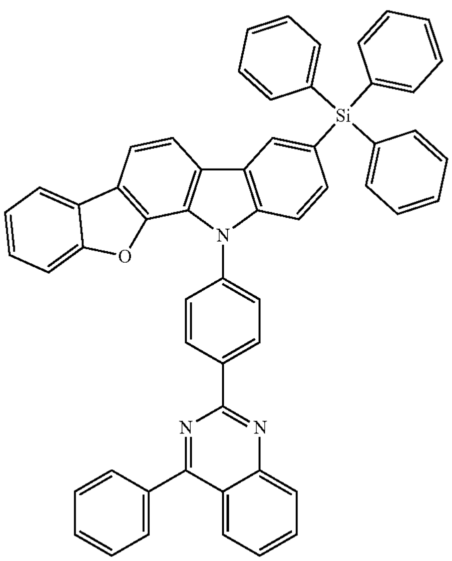
H2-329
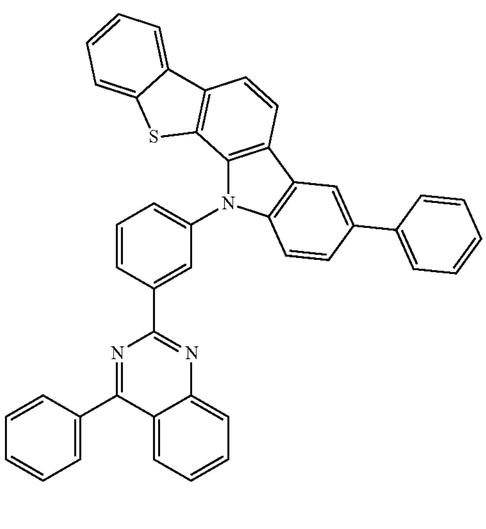
-continued
H2-330
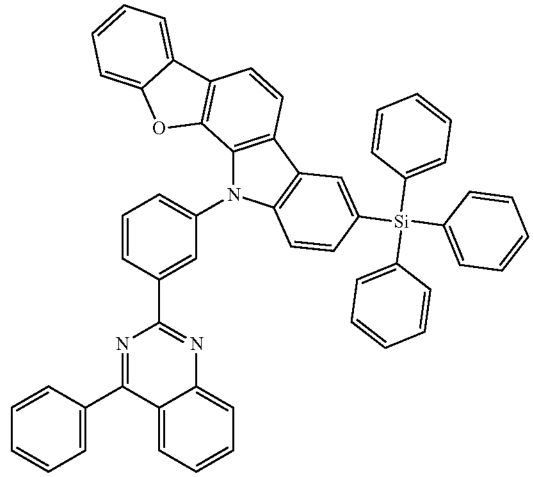
H2-331
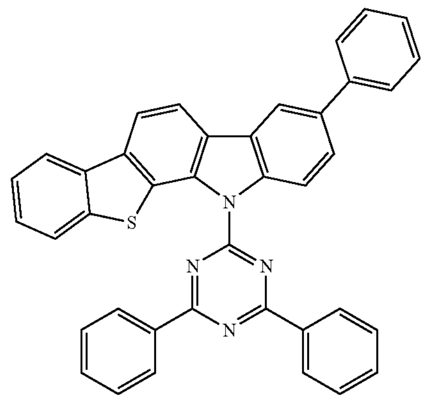
H2-332
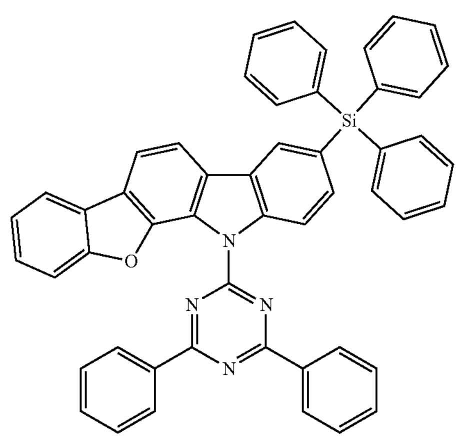

-continued
H2-333
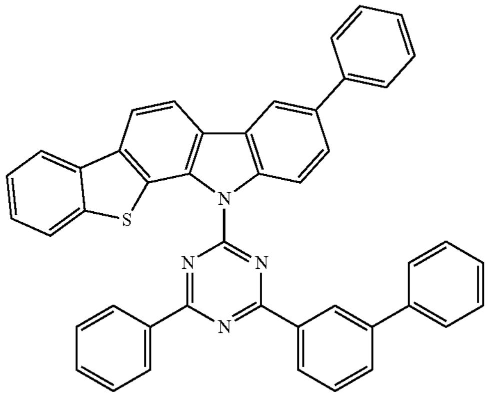
H2-334
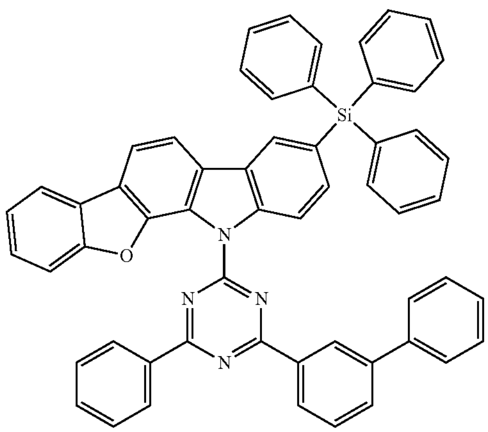
H2-335
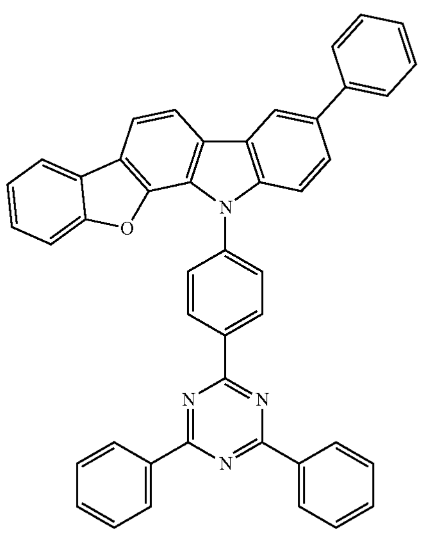
-continued
H2-336
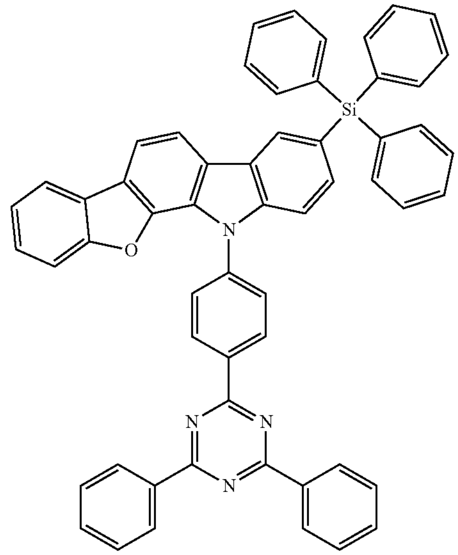
H2-337
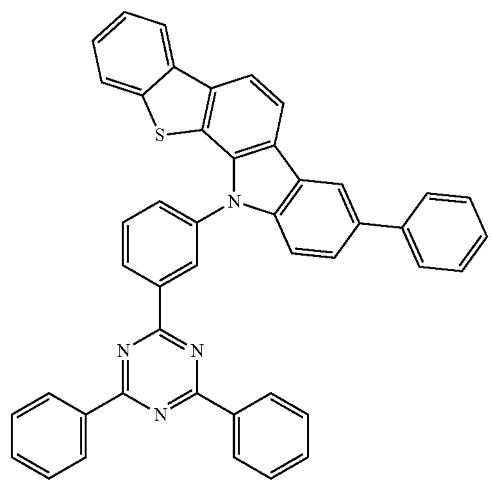
H2-338
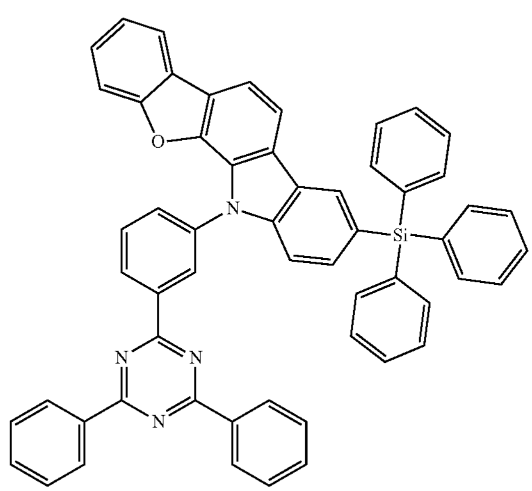

-continued
H2-339
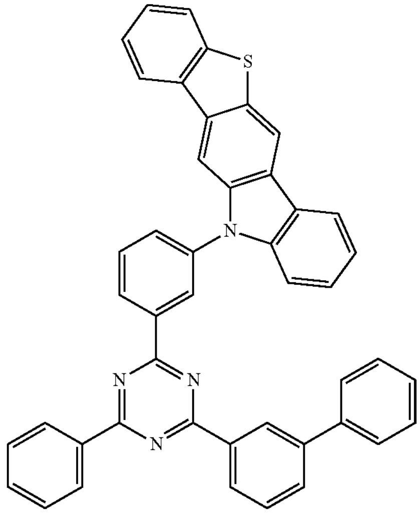
H2-340
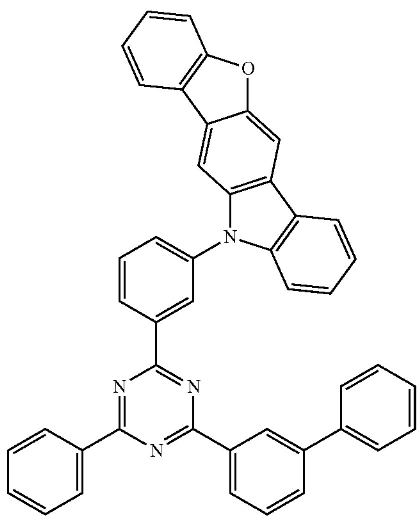
H2-341
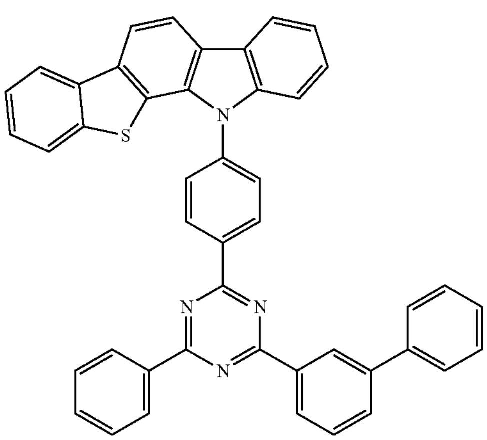
-continued
H2-342
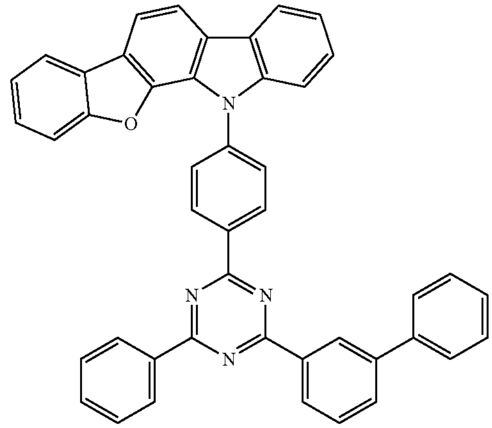
H2-343
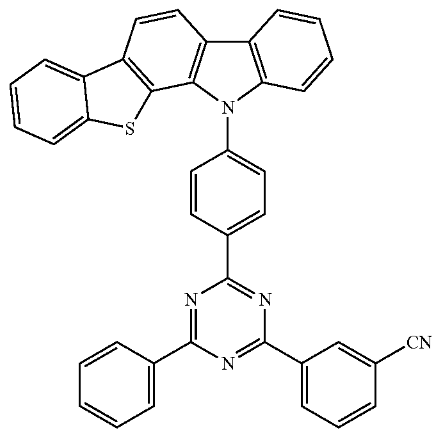
H2-344
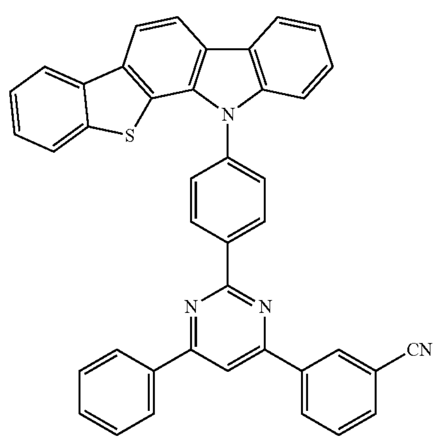

-continued
H2-345
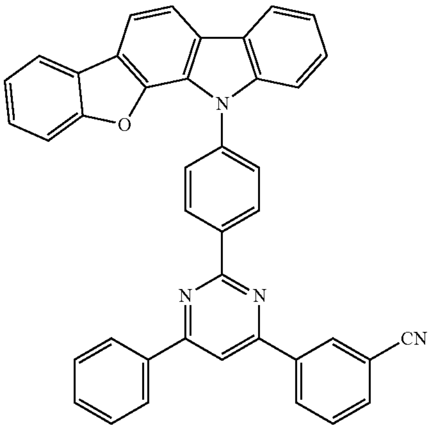
H2-346
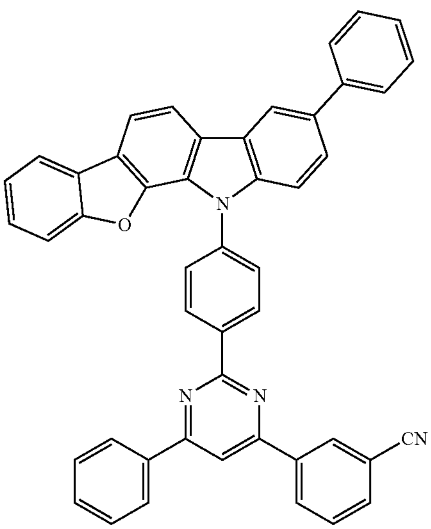
H2-347
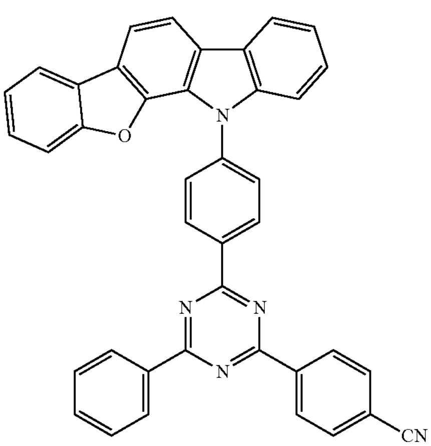
-continued
H2-348
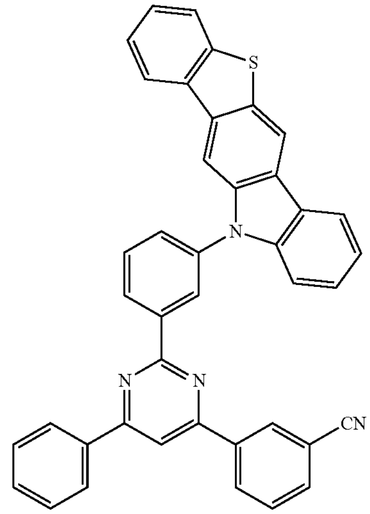
H2-349
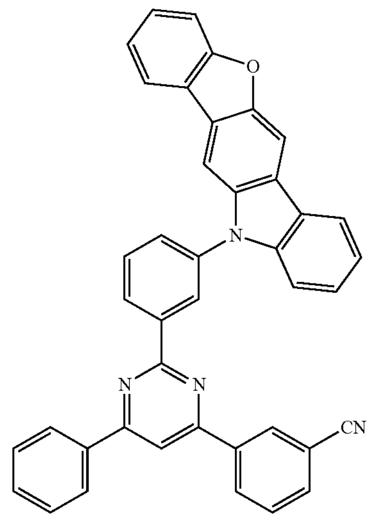
H2-350
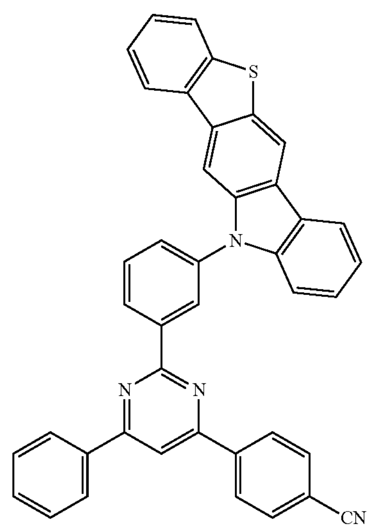

-continued
H2-351
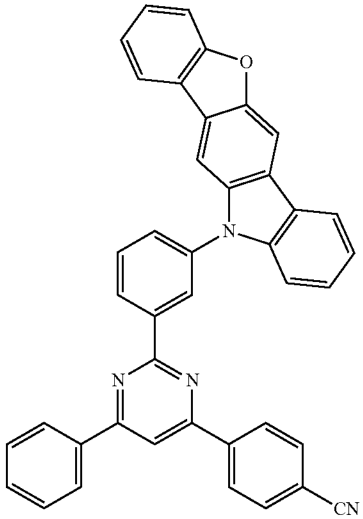
H2-352
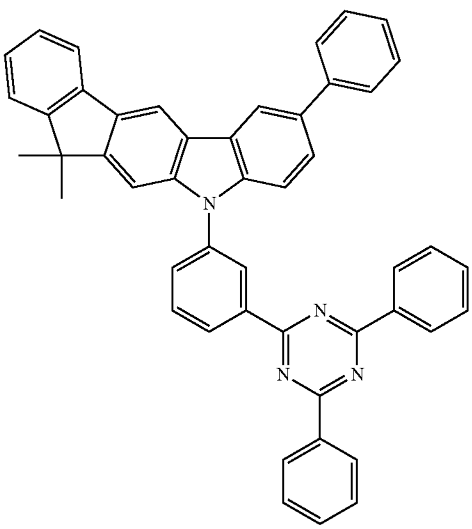
H2-353
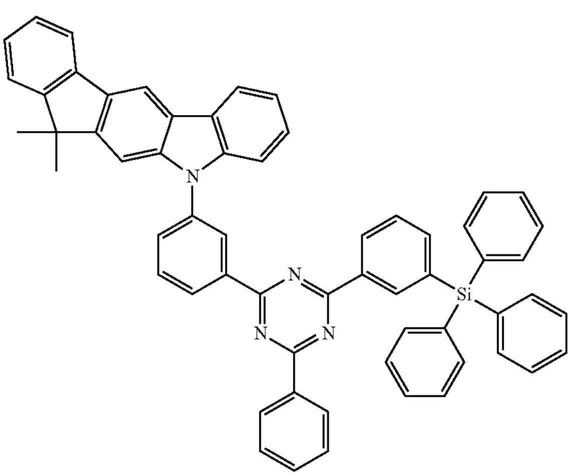
-continued
H2-354
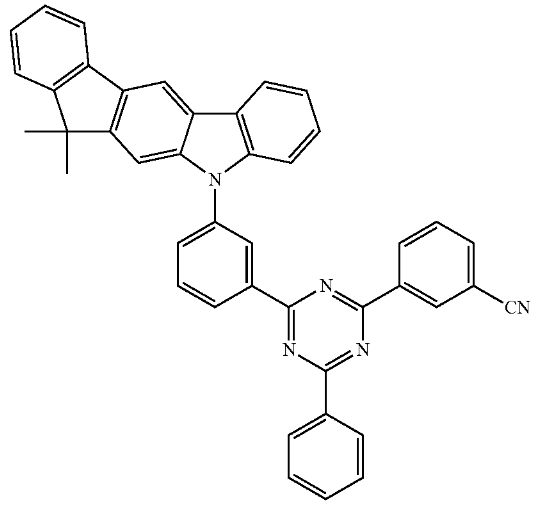
H2-355
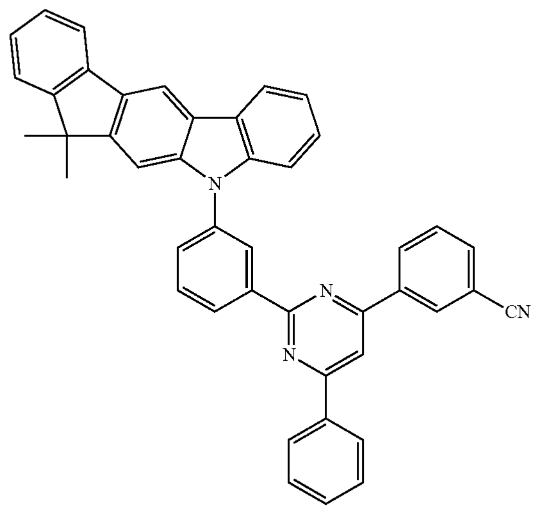
H2-356
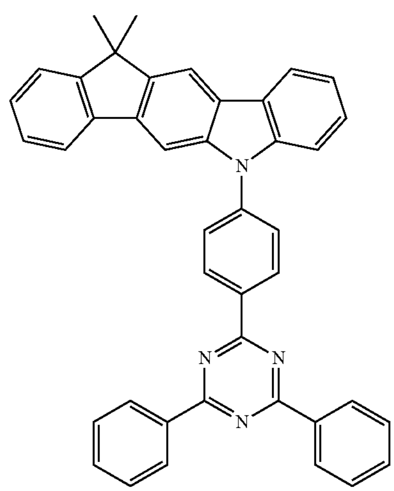

-continued
H2-357
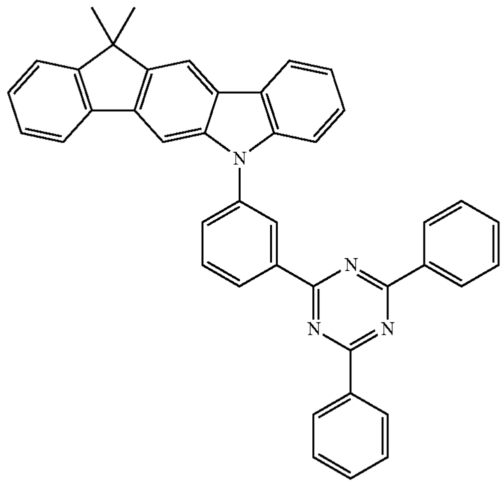
H2-358
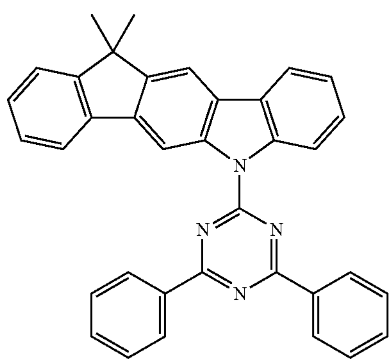
H2-359
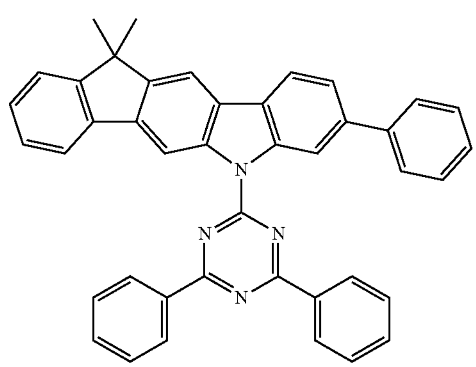
-continued
H2-360
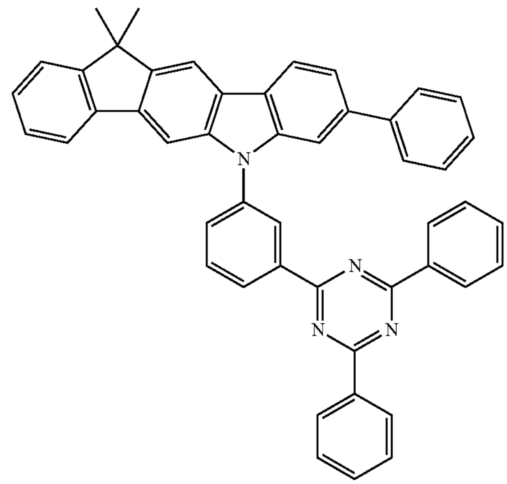
H2-361
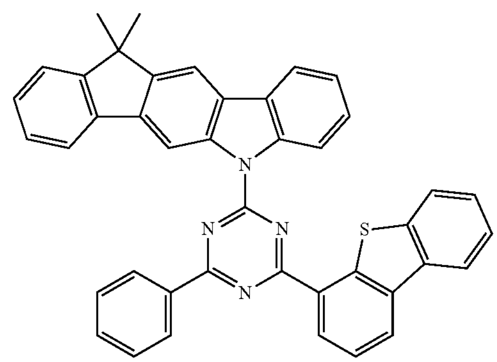
H2-362
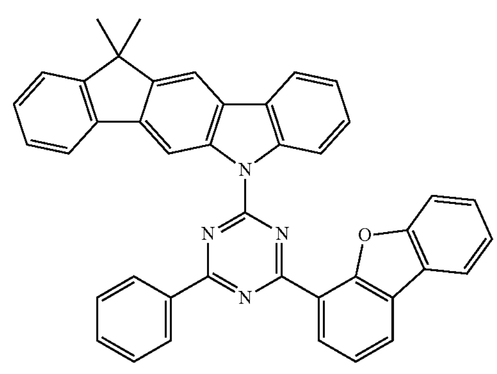
H2-363
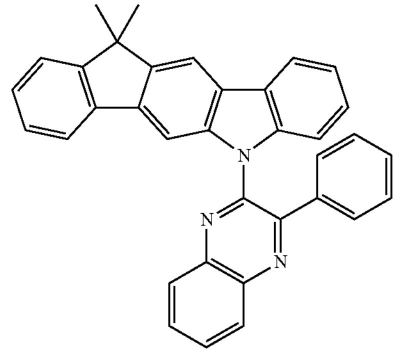

H2-364
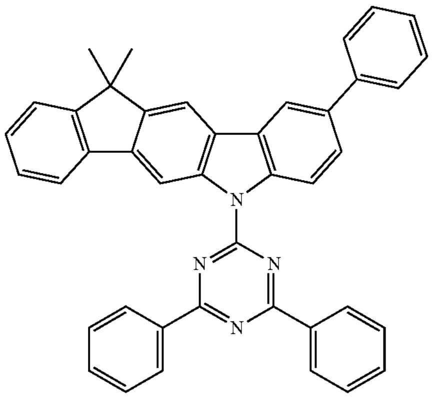
H2-365
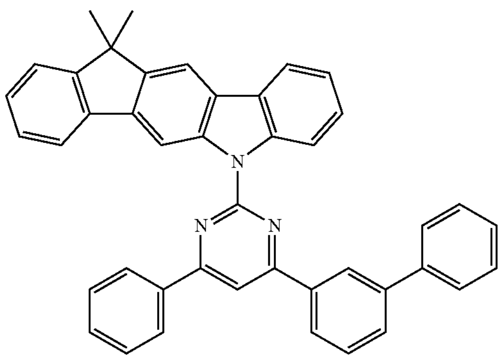
H2-366
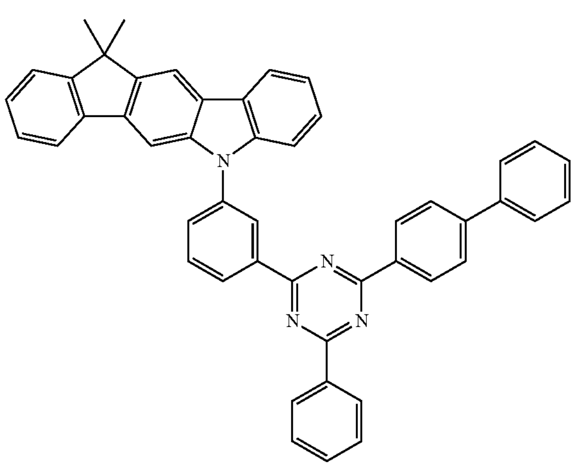
H2-367
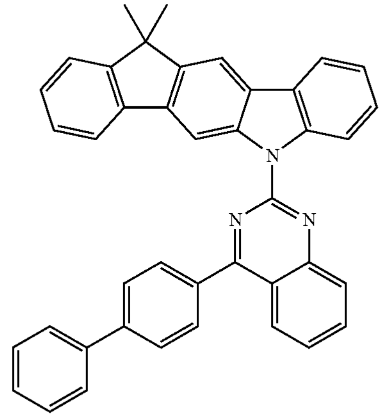
H2-368
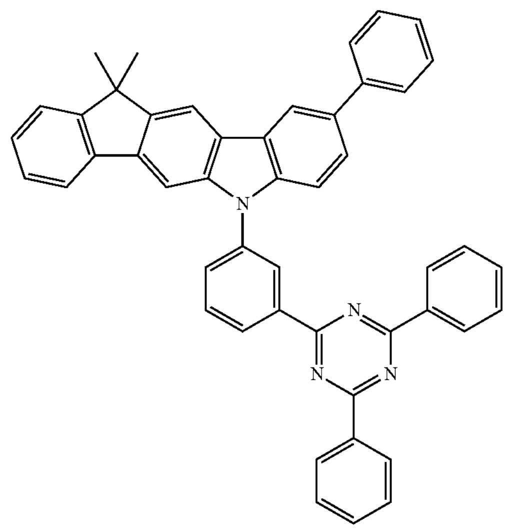
H2-369
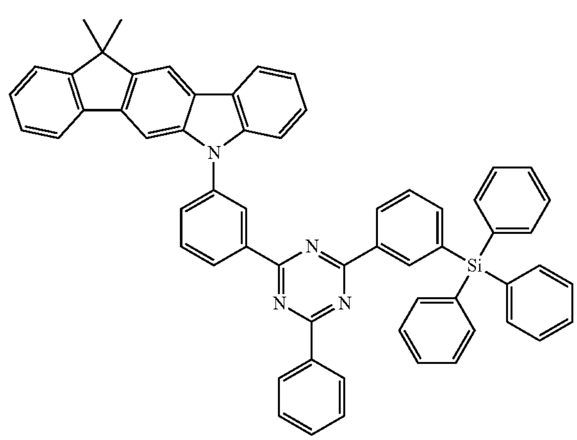

-continued
H2-370
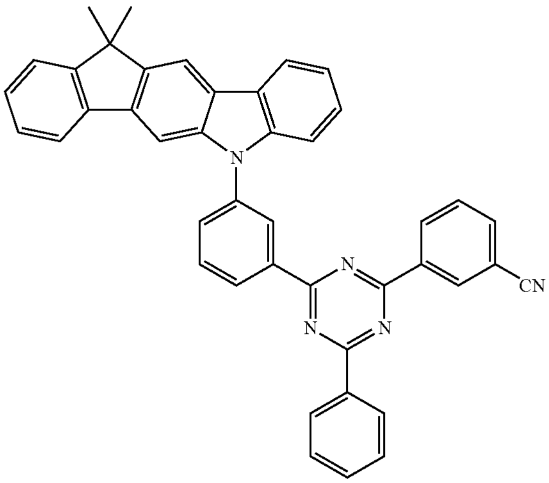
H2-371
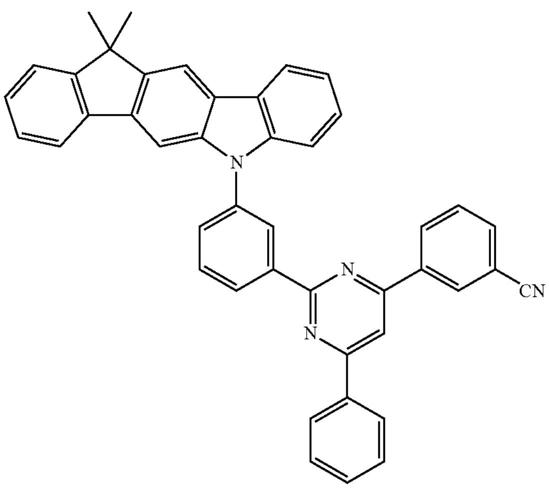
H2-372
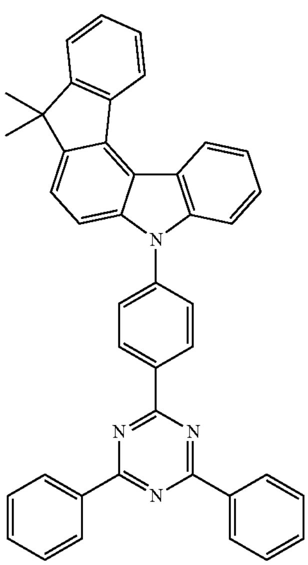
-continued
H2-373
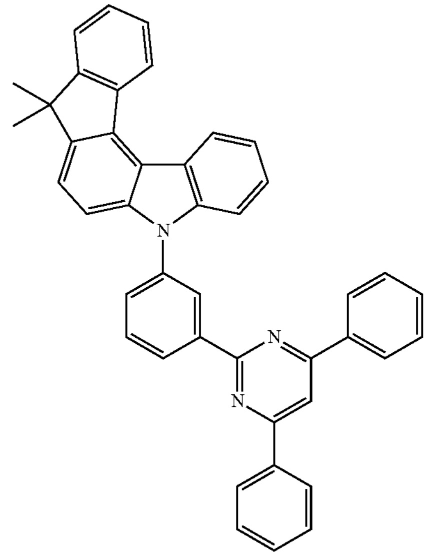
H2-374
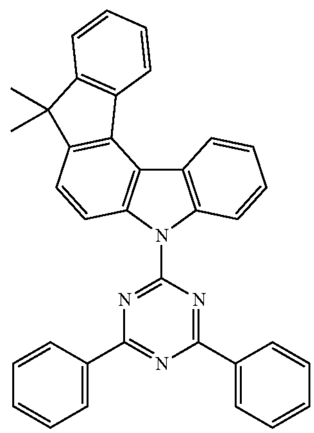
H2-375
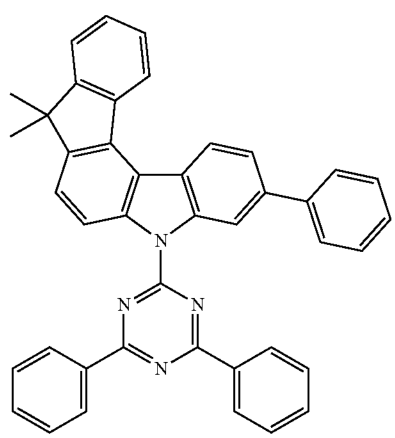

-continued
H2-376
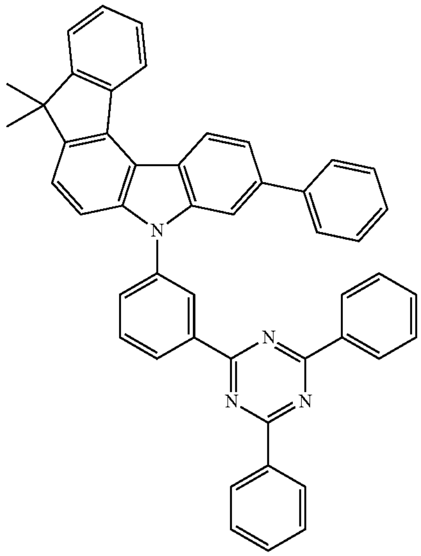
H2-377
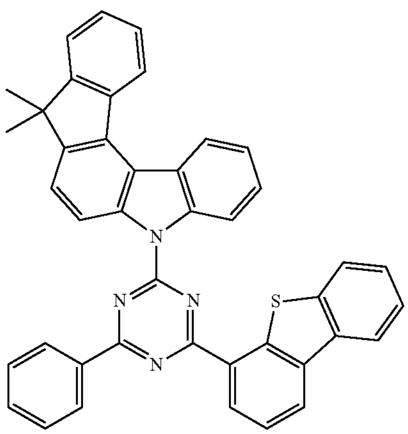
H2-378
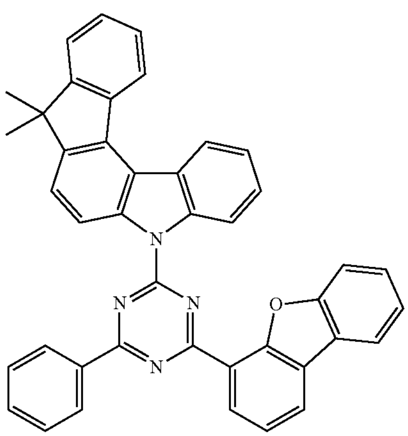
-continued
H2-379
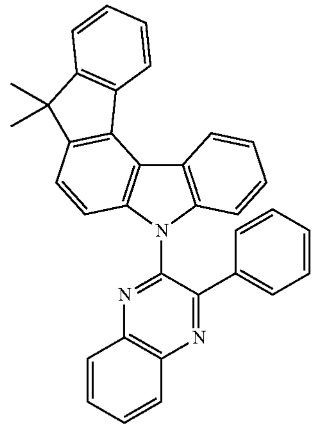
H2-380
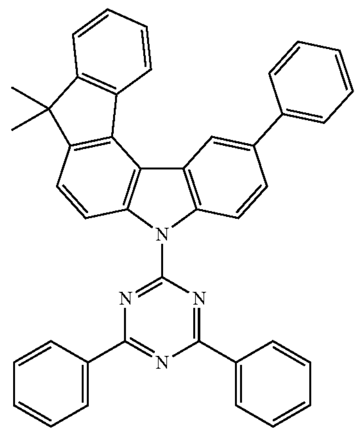
H2-381
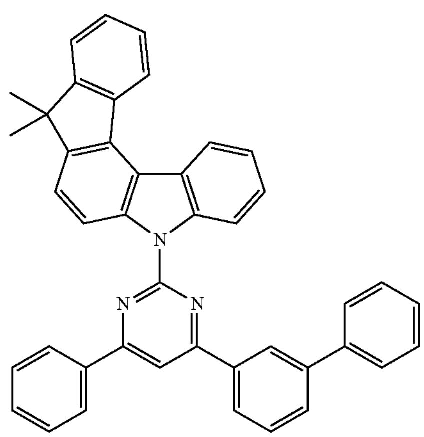

H2-382
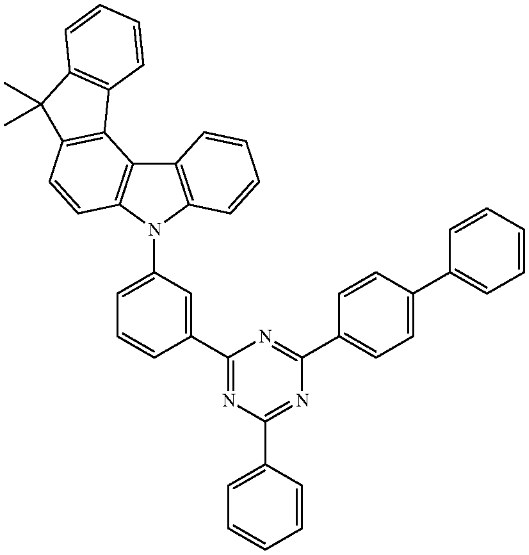
H2-383
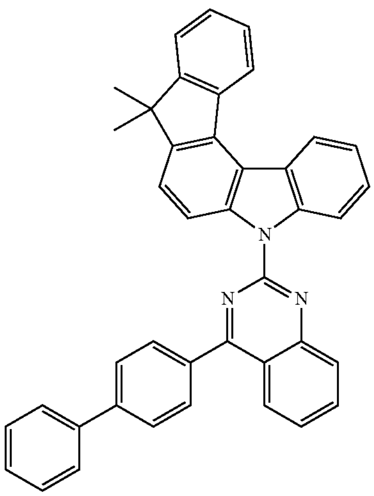
H2-384
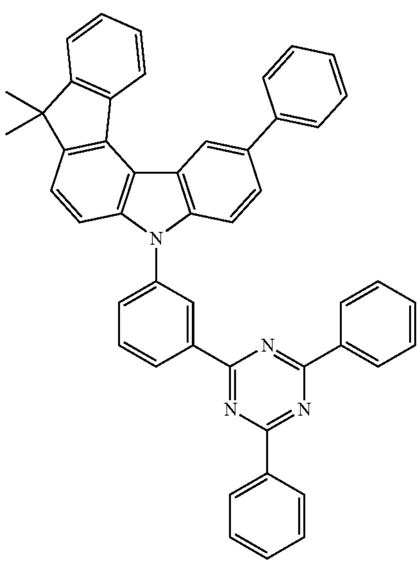
H2-385
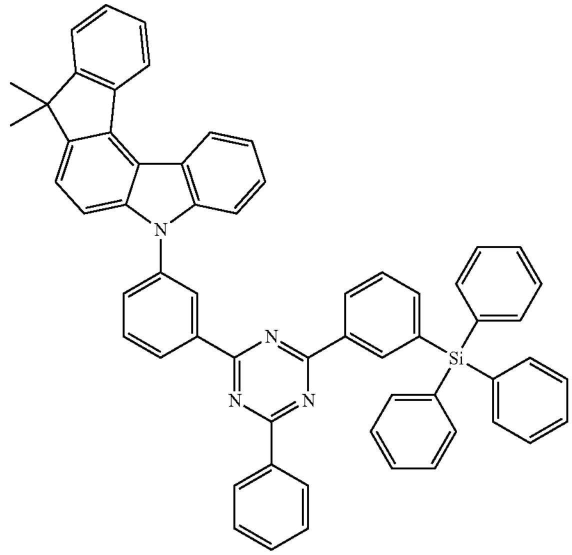
H2-386
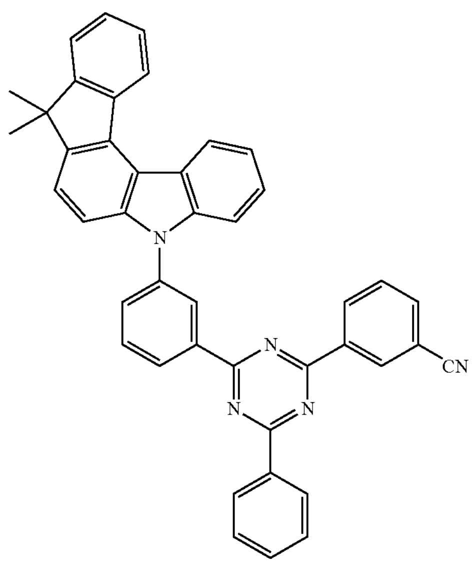

H2-387
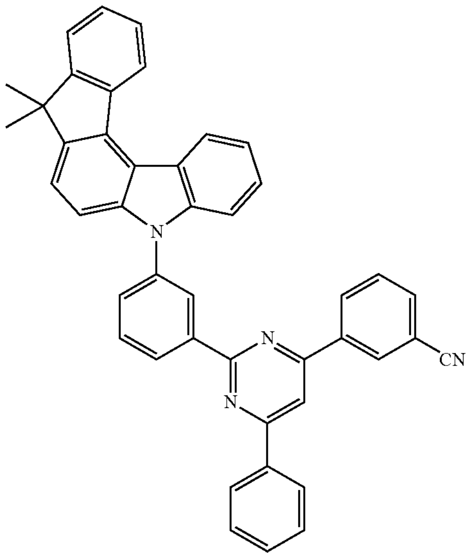
H2-388
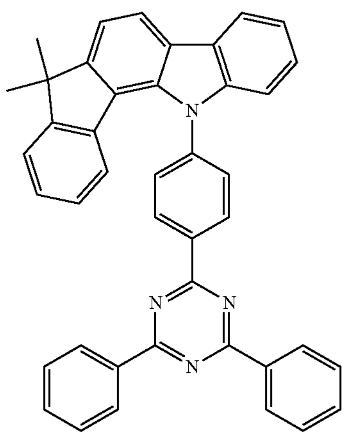
H2-389
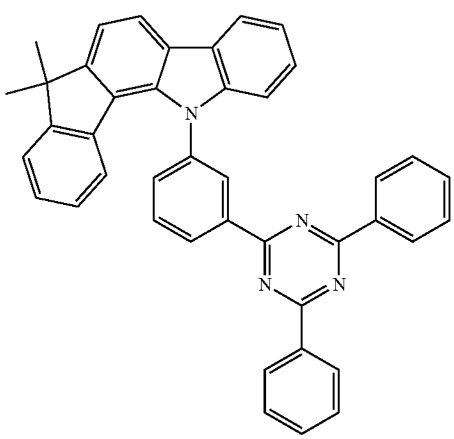
H2-390
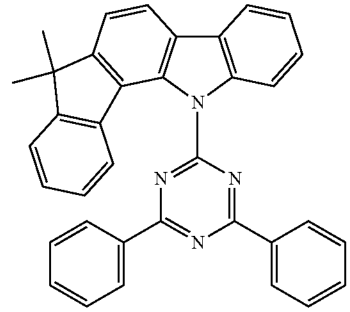
H2-391
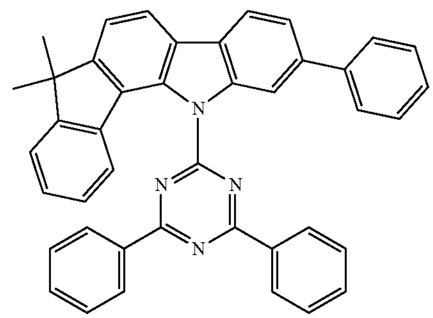
H2-392
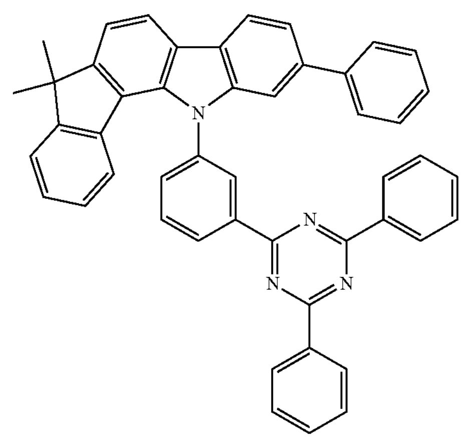
H2-393
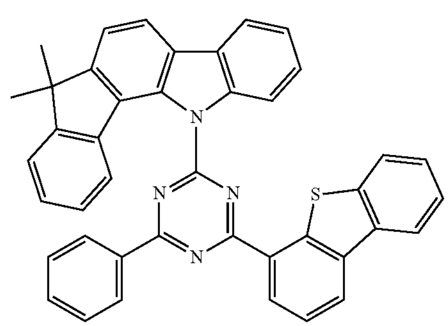

-continued
H2-394
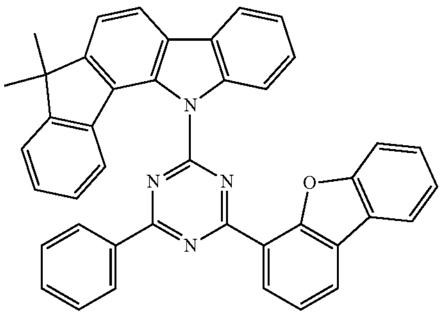
H2-395
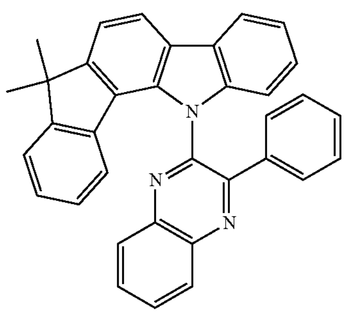
H2-396
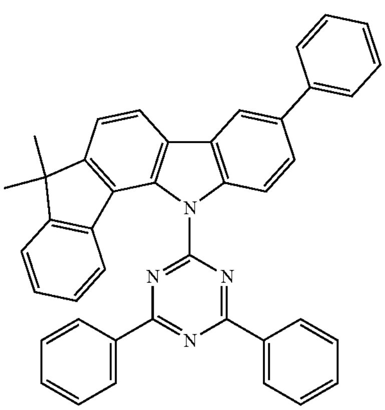
H2-397
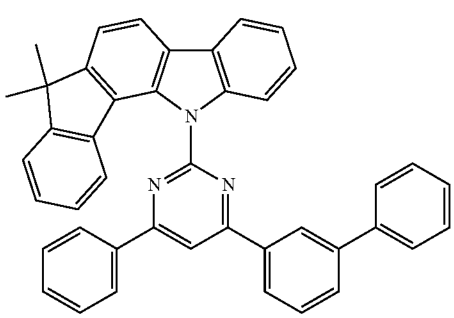
-continued
H2-398
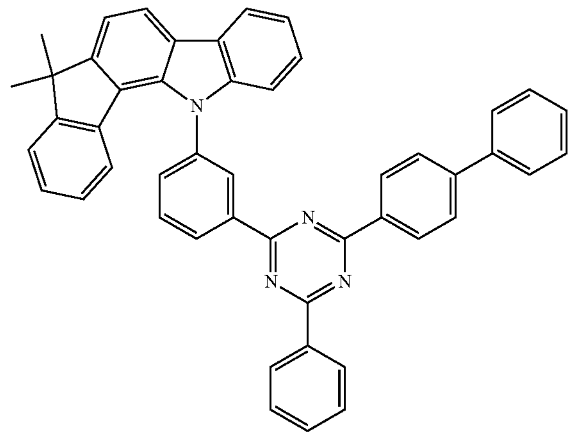
H2-399
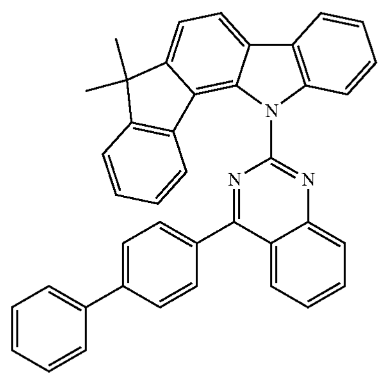
H2-400
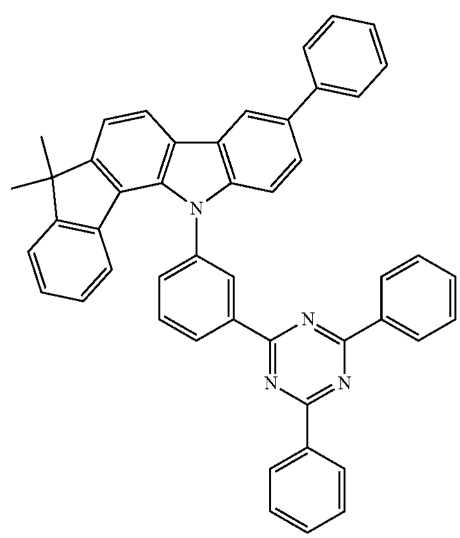

-continued
H2-401
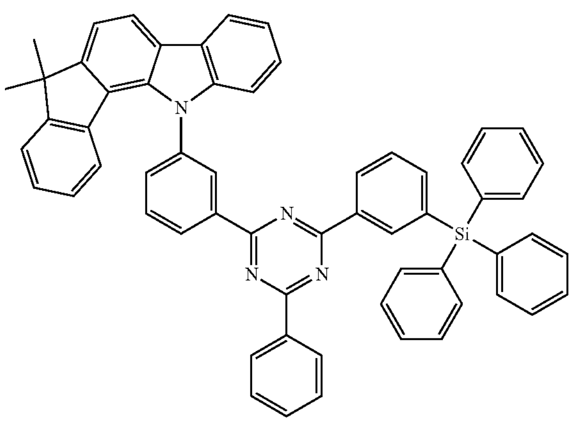
H2-402
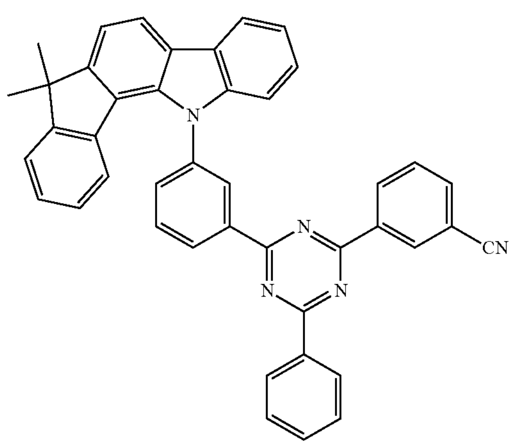
H2-403
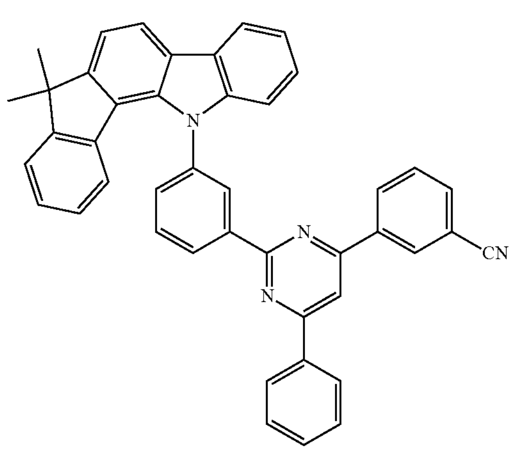
-continued
H2-404
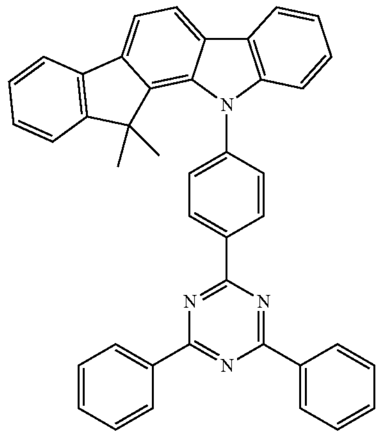
H2-405
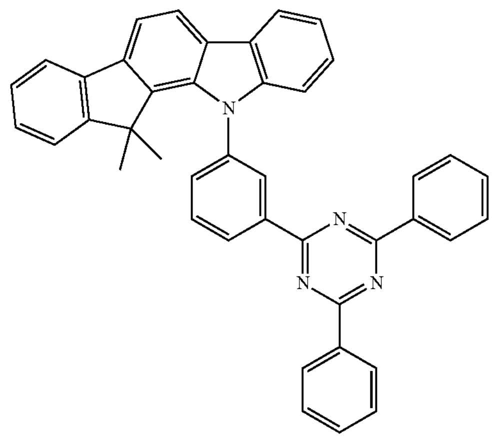
H2-406
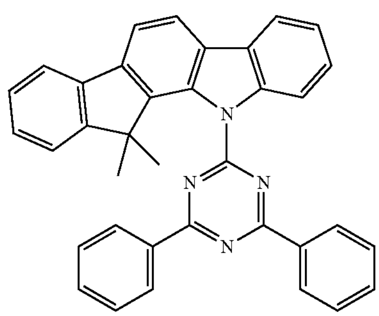
H2-407
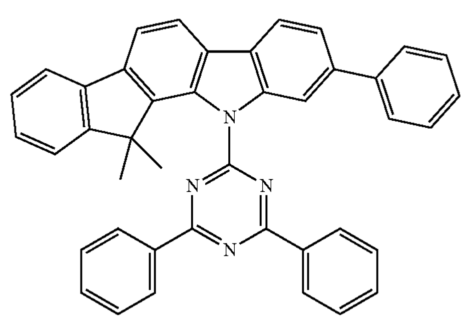

-continued
H2-408
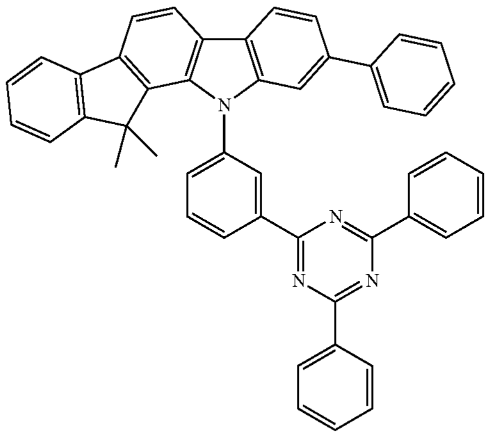
H2-409
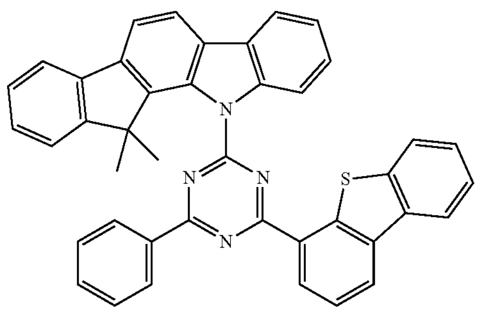
H2-410
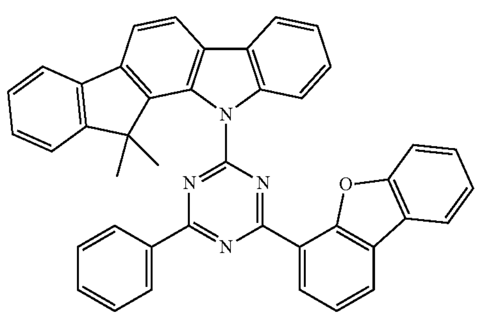
H2-411
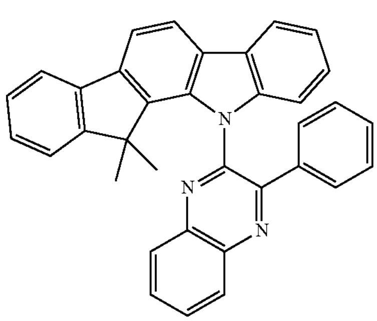
-continued
H2-412
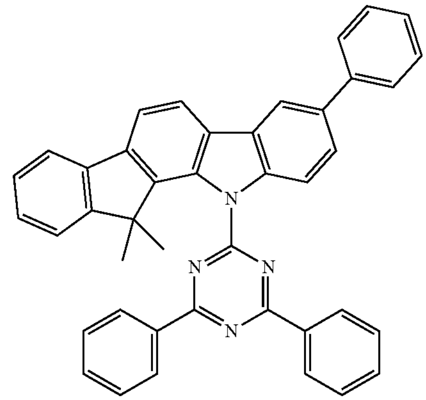
H2-413
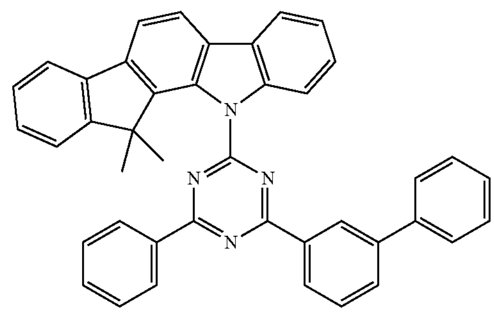
H2-414
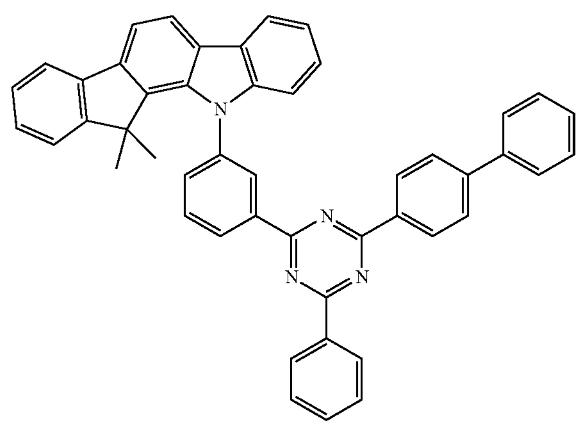
H2-415
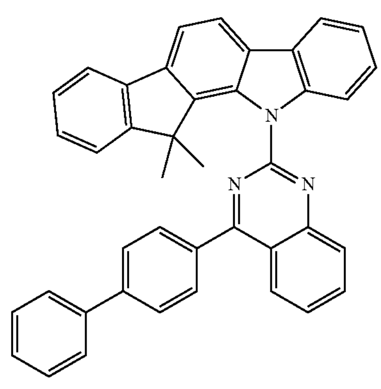

-continued
H2-416
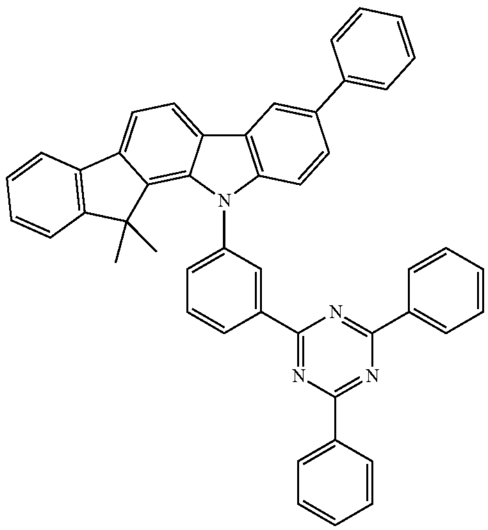
H2-417
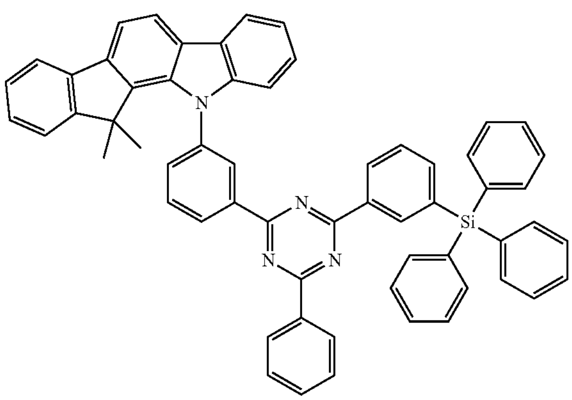
H2-418
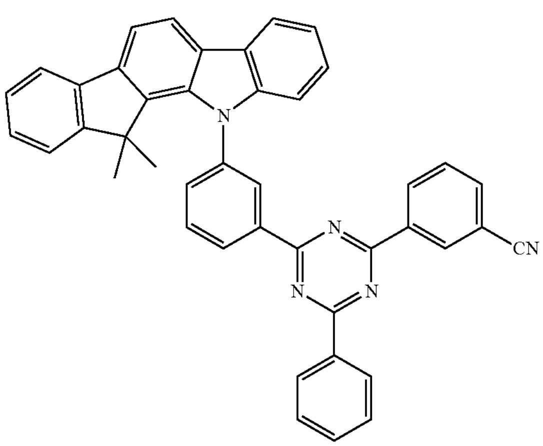
-continued
H2-419
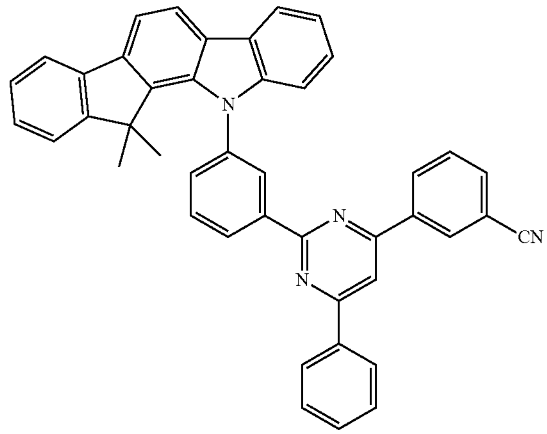
H2-420
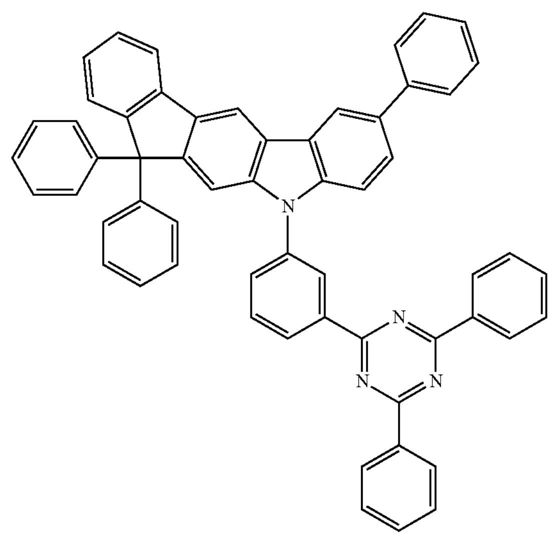
H2-421
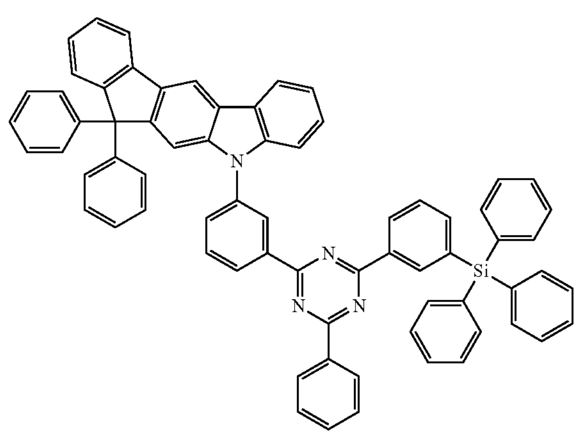

-continued
H2-422
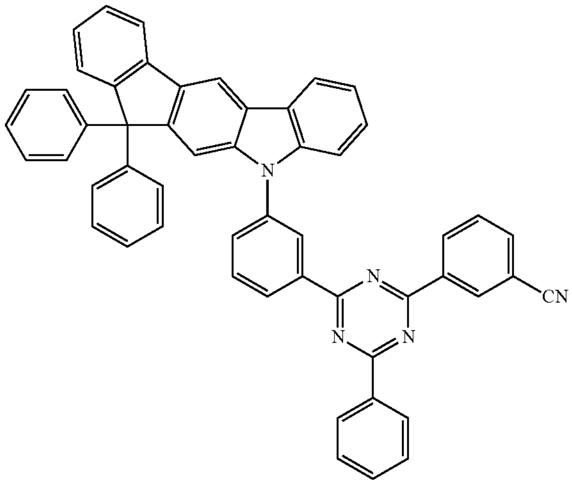
H2-423
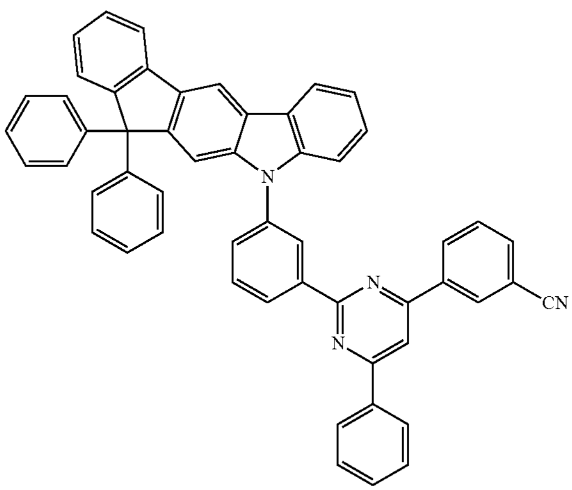
H2-424
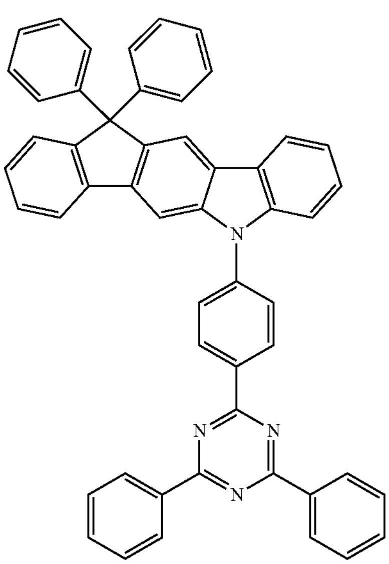
-continued
H2-425
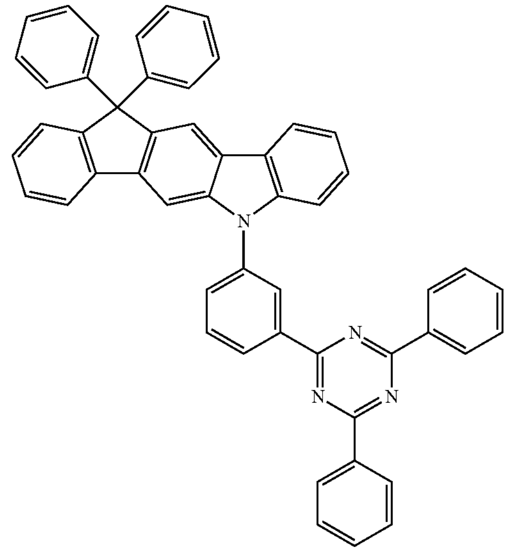
H2-426
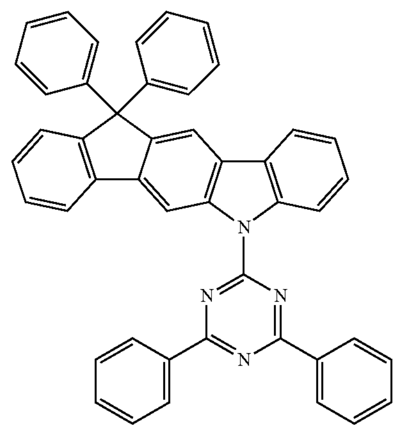
H2-427
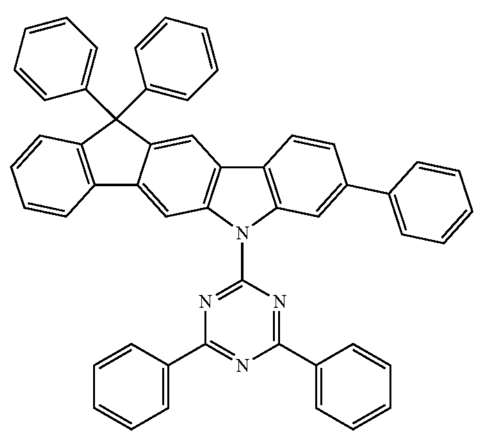

H2-428
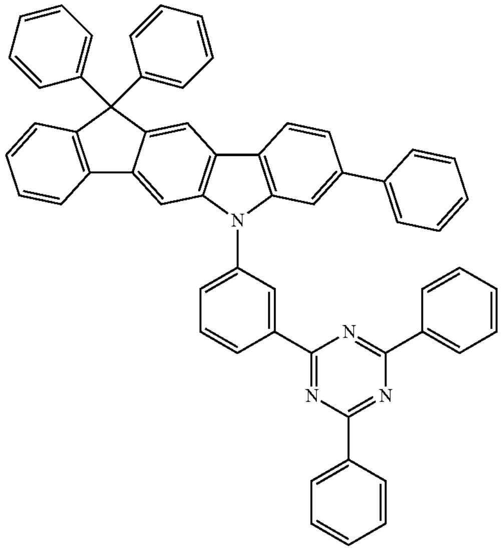
H2-429
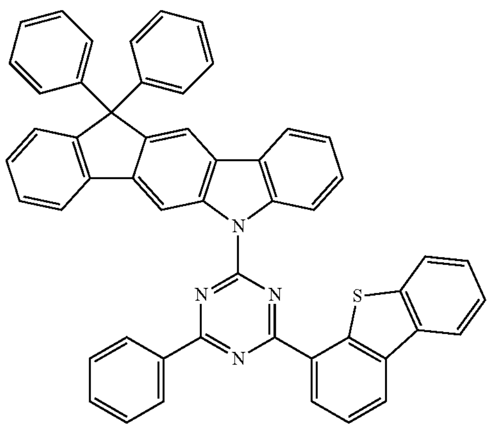
H2-430
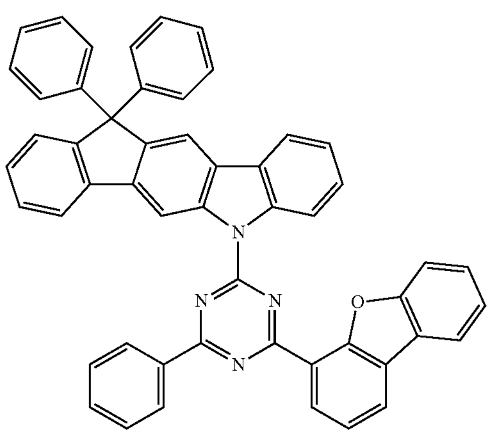
H2-431
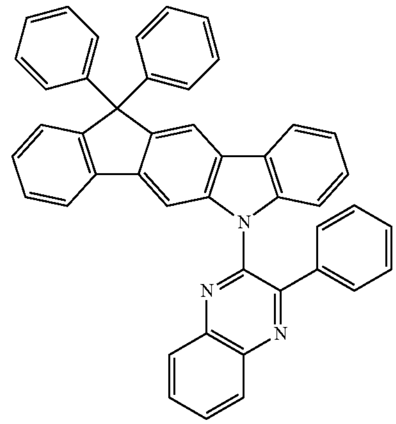
H2-432
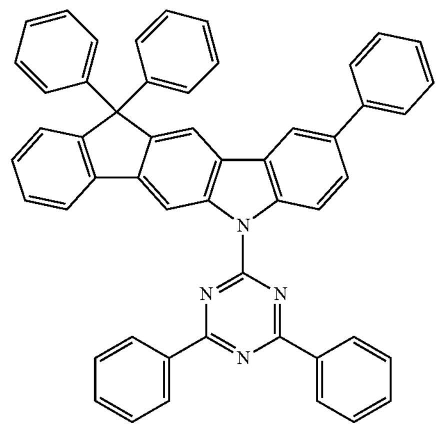
H2-433
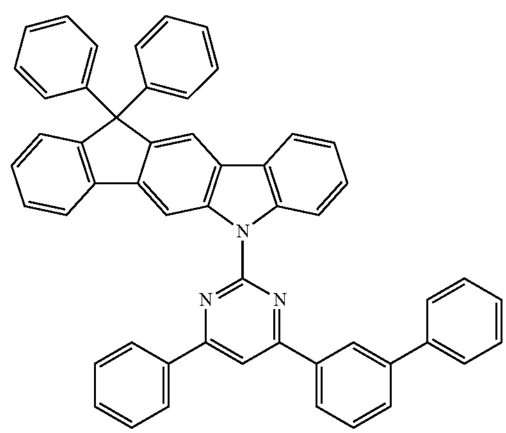

H2-434
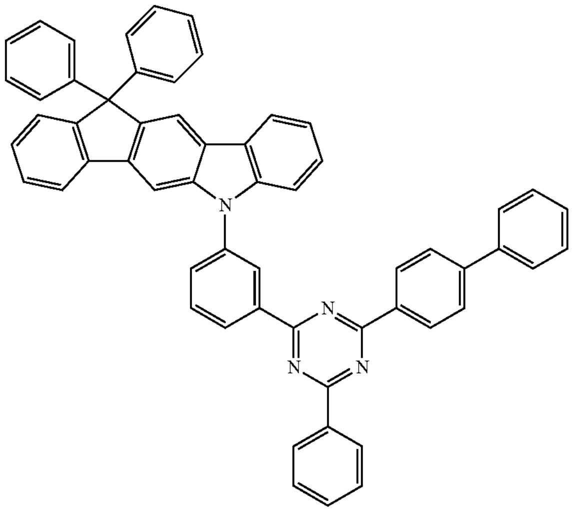
H2-435
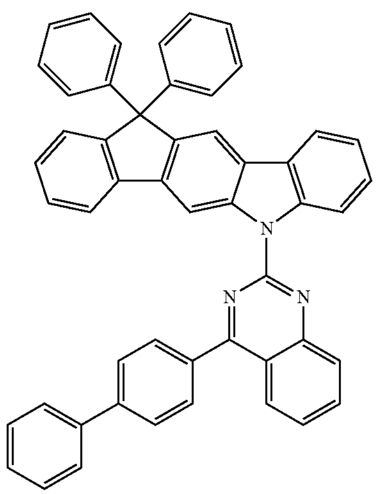
H2-436
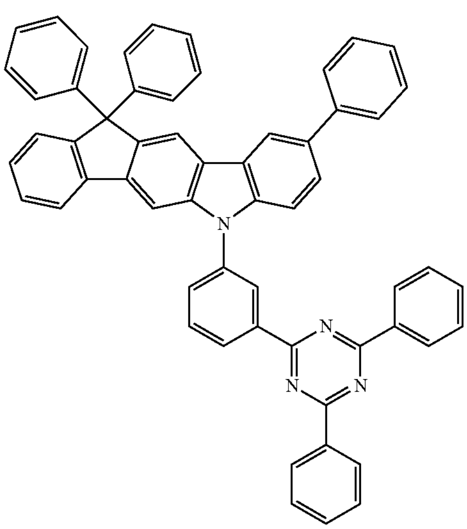
H2-437
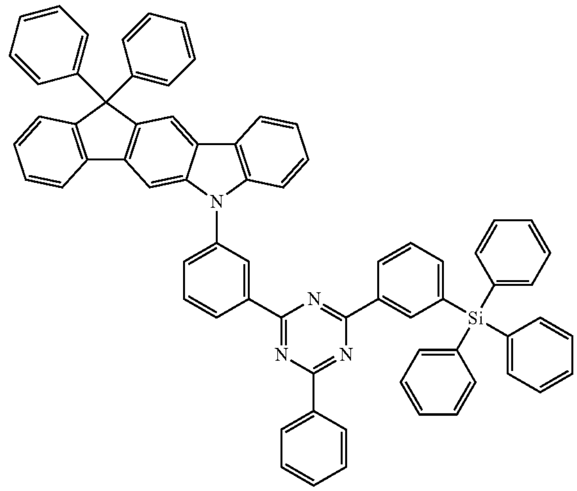
H2-438
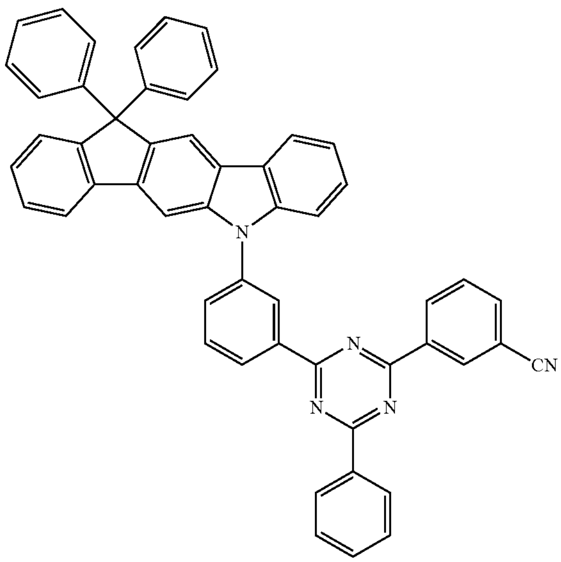
H2-439
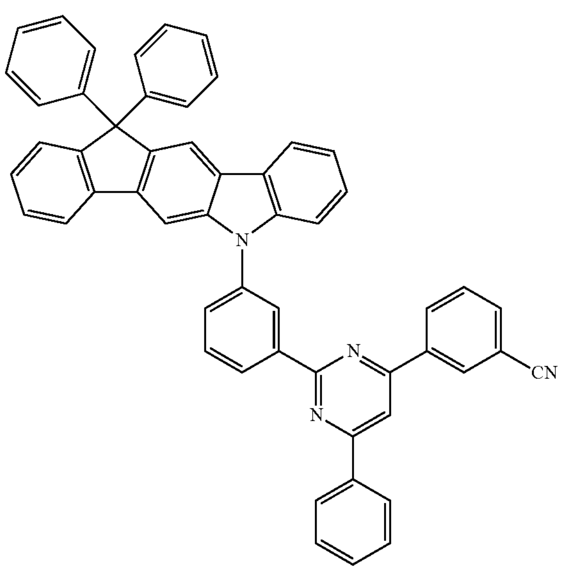

-continued
H2-440
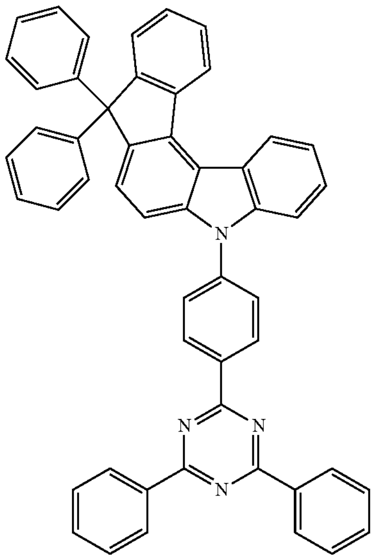
H2-441
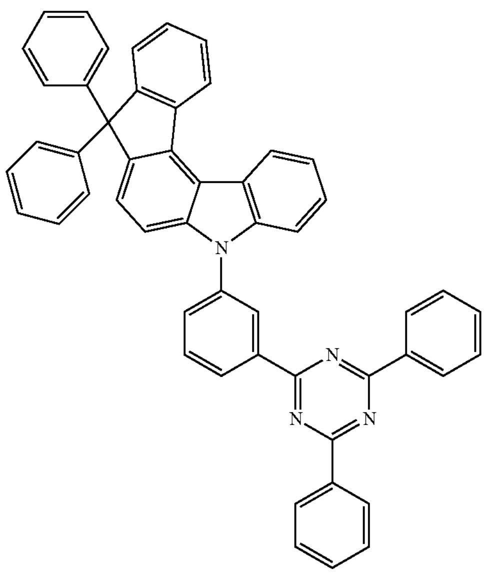
H2-442
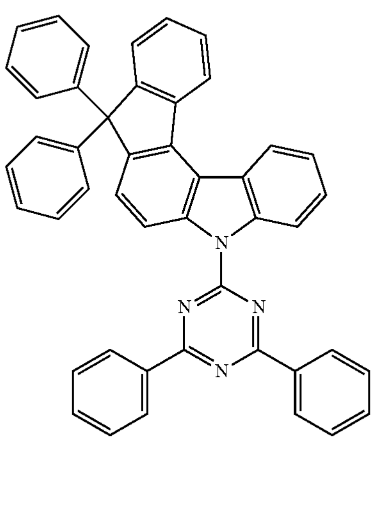
-continued
H2-443
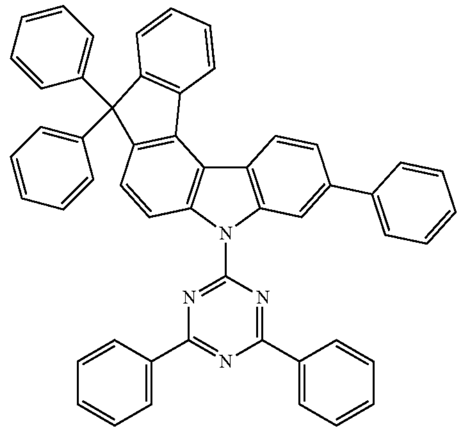
H2-444
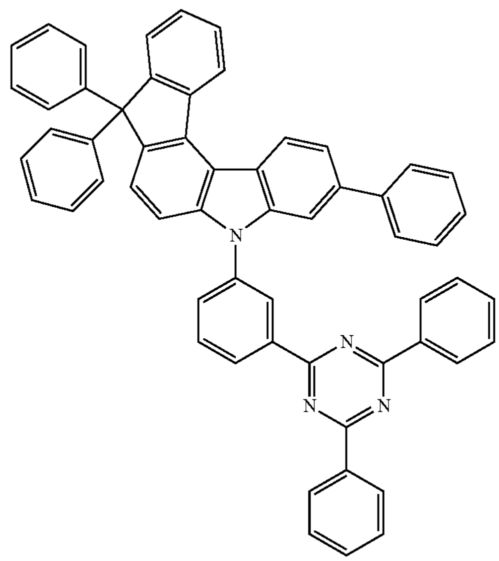
H2-445
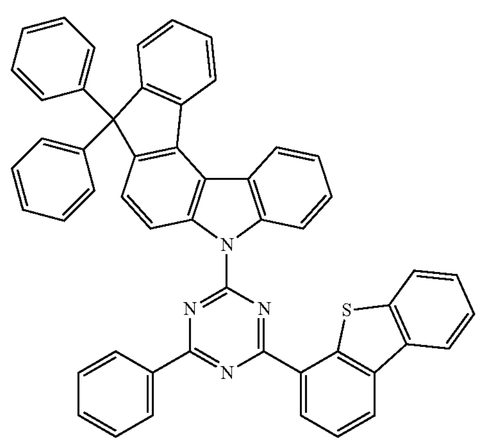

-continued
H2-446
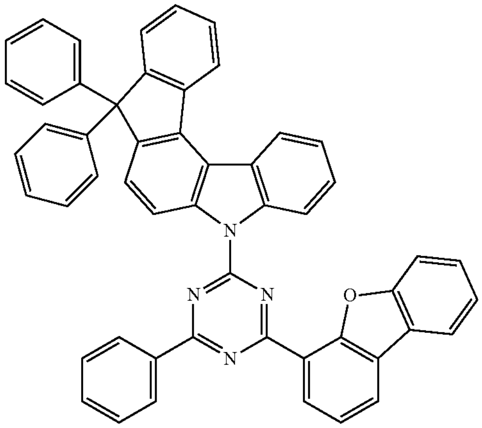
H2-447
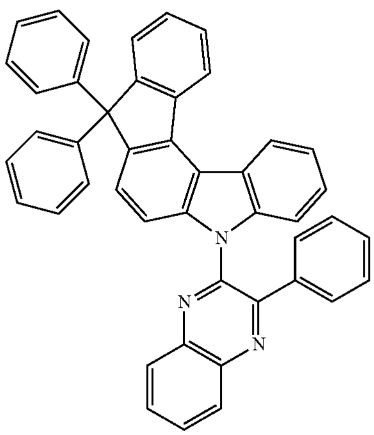
H2-448
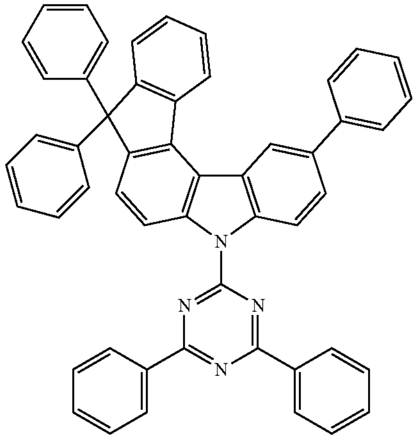
-continued
H2-449
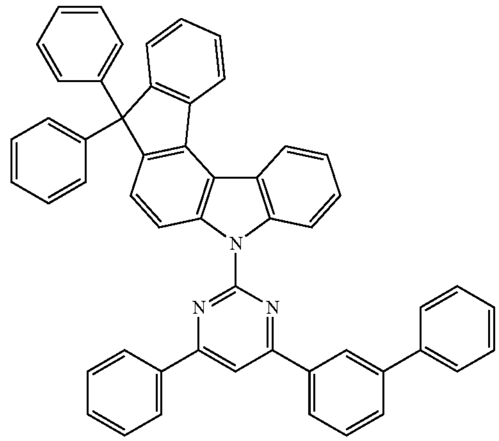
H2-450
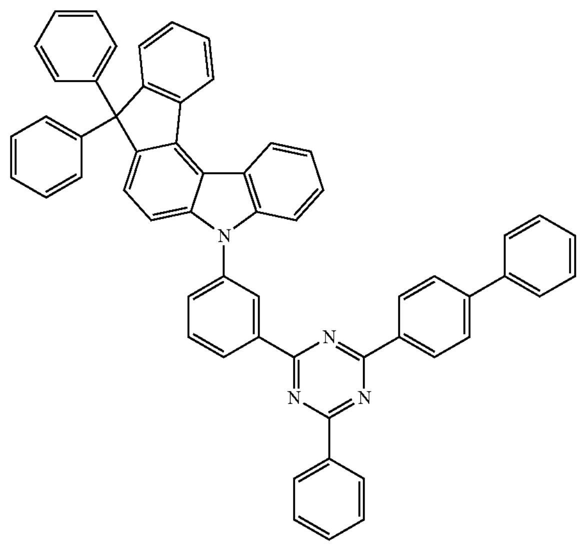
H2-451
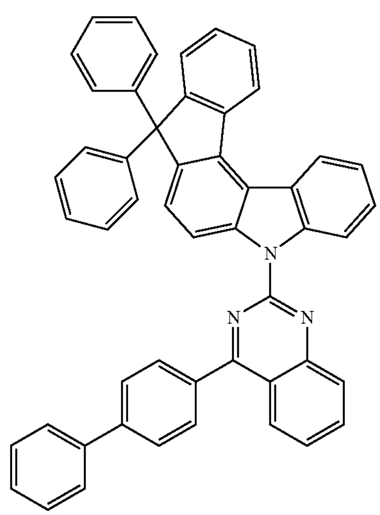

-continued
H2-452
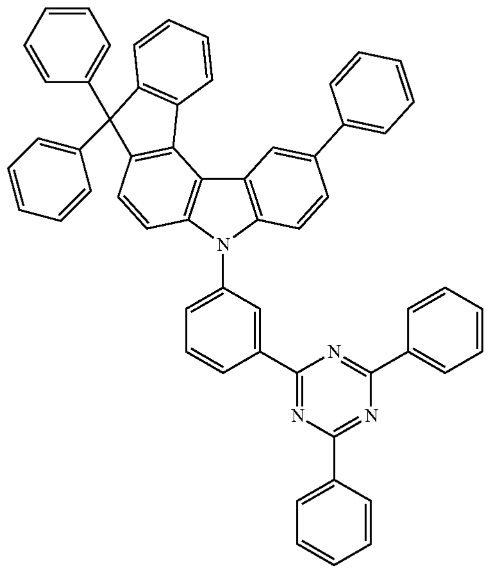
H2-453
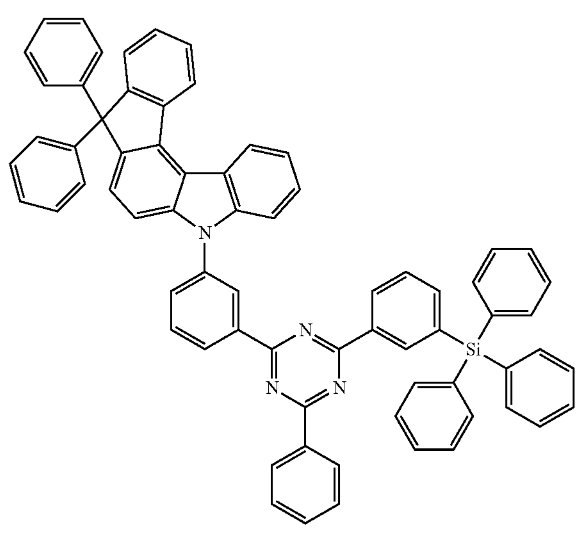
-continued
H2-454
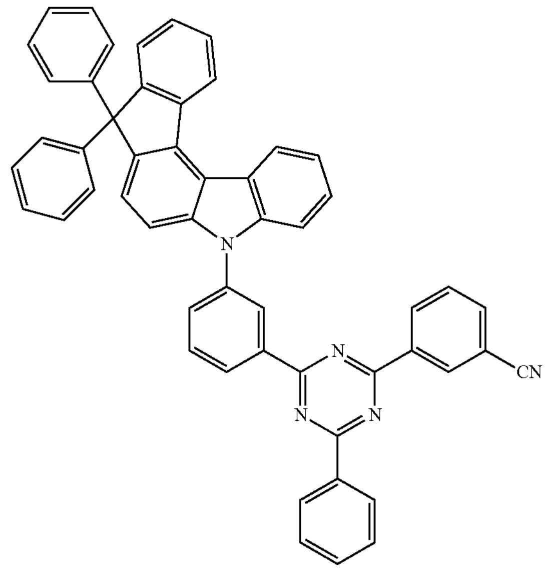
H2-455
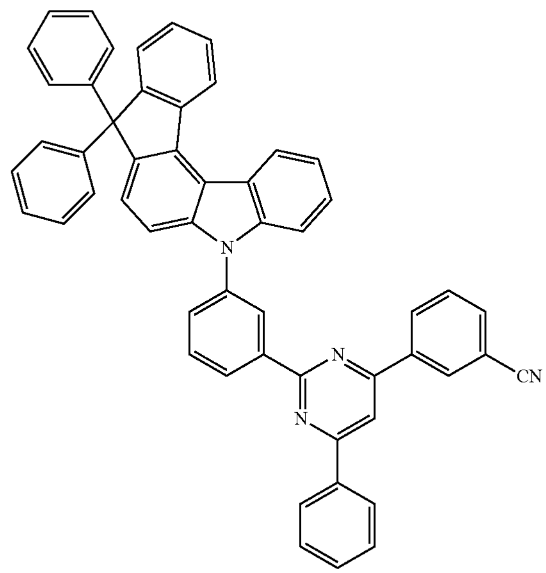
H2-456
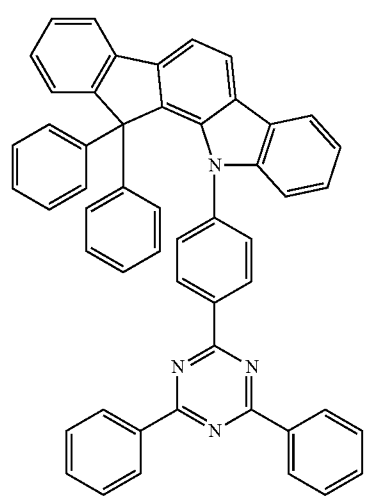

-continued
H2-457
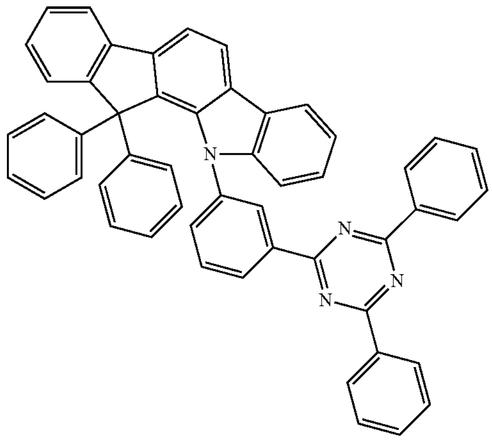
H2-458
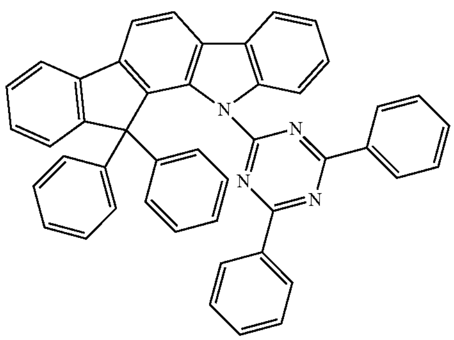
H2-459
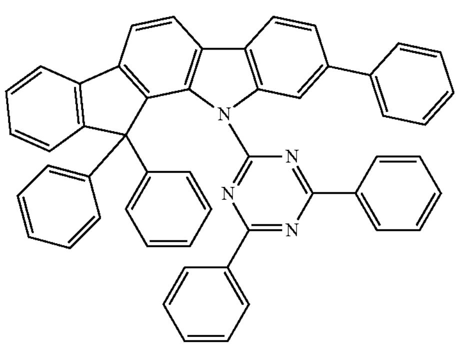
H2-460
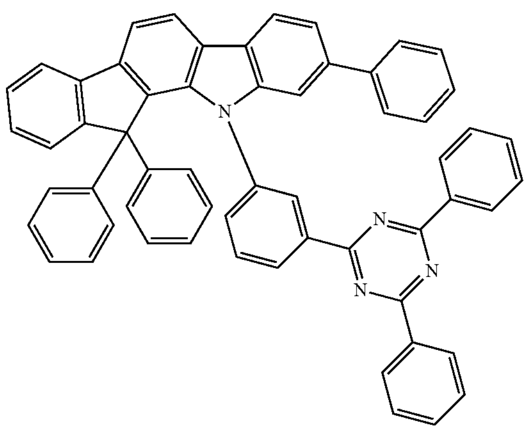
-continued
H2-461
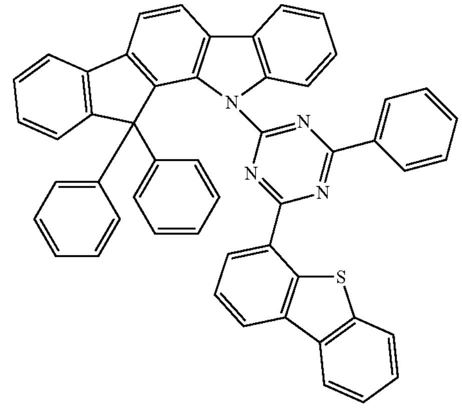
H2-462
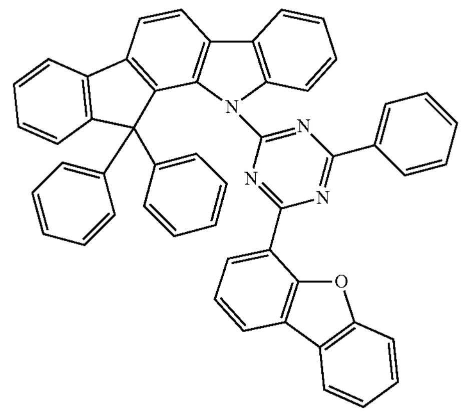
H2-463
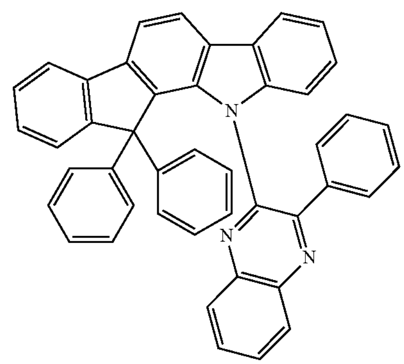
H2-464
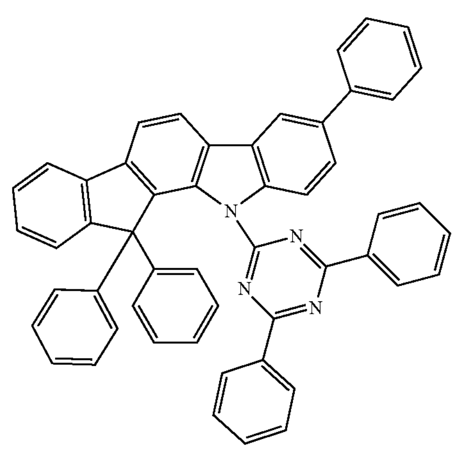

-continued
H2-465
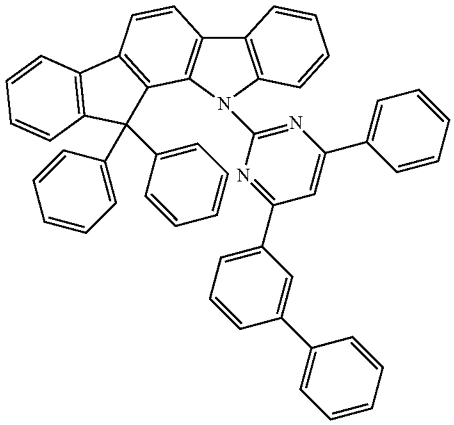
H2-466
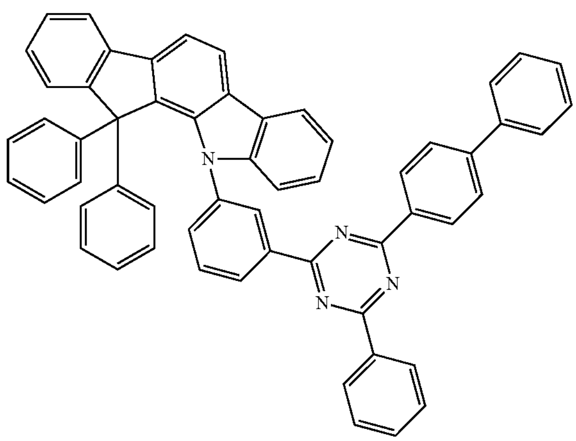
H2-467
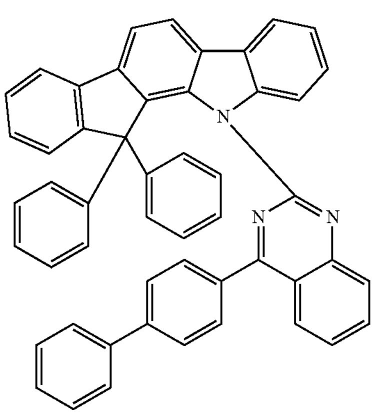
-continued
H2-468
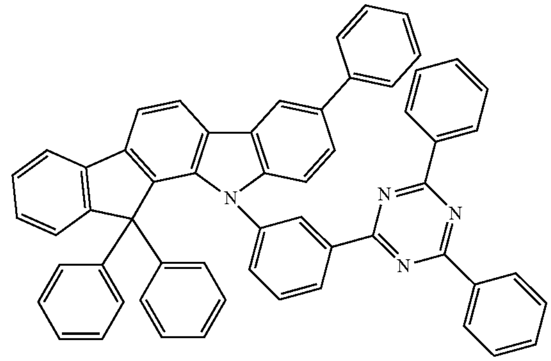
H2-469
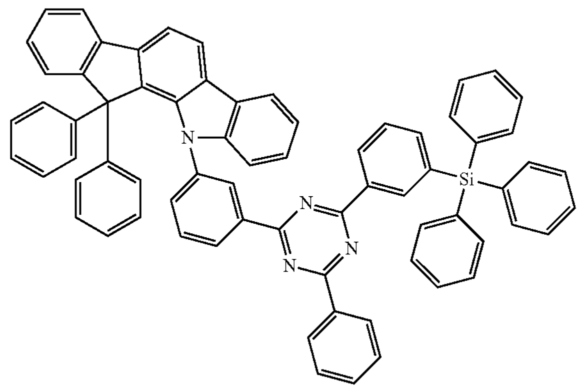
H2-470
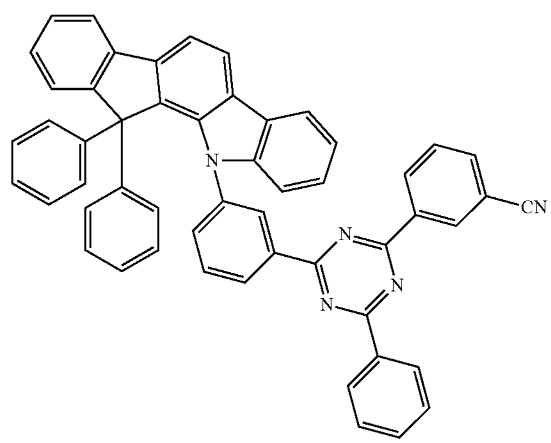

-continued
H2-471
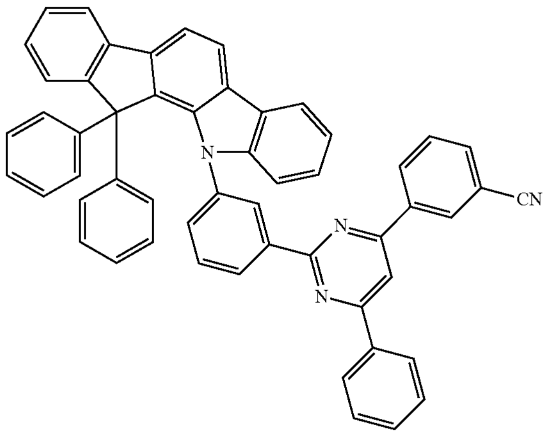
H2-472
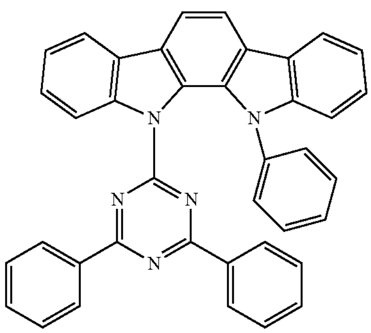
H2-473
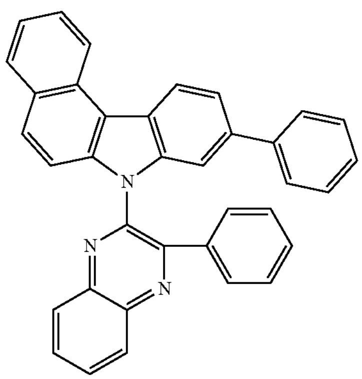
H2-474
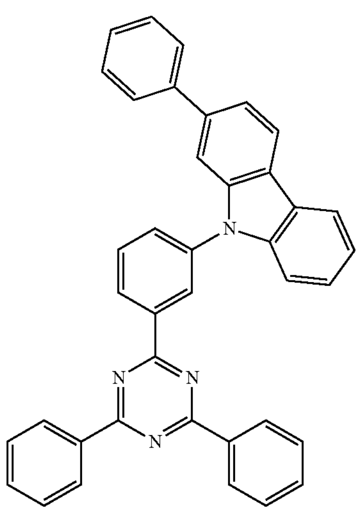
-continued
H2-475
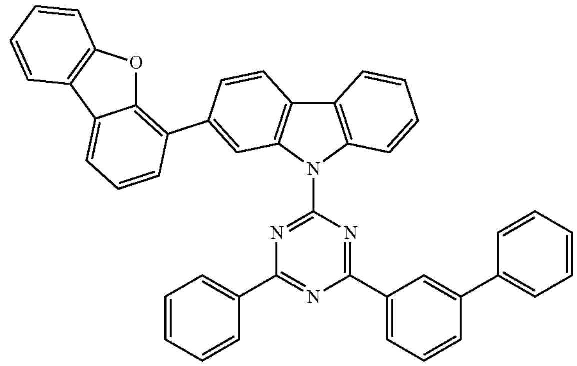
H2-476
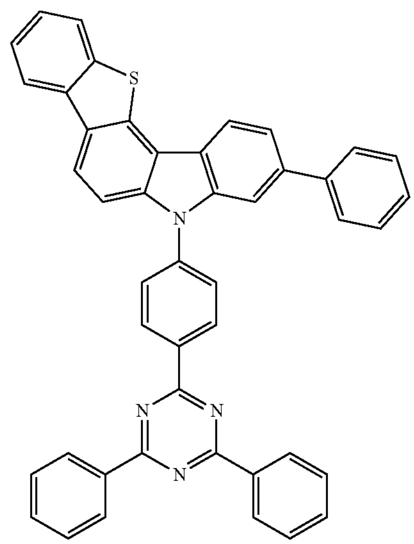
H2-477
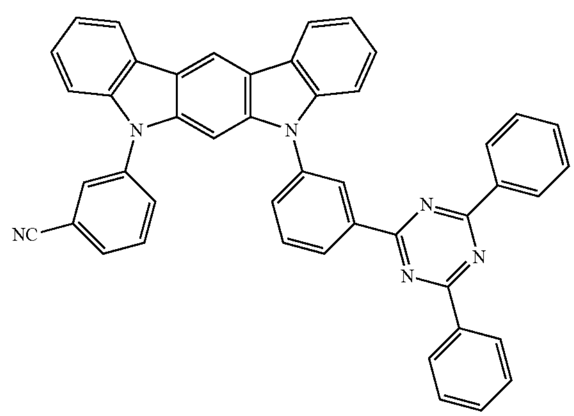

H2-478
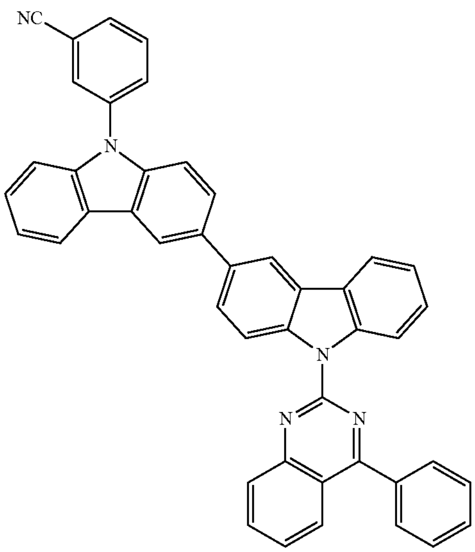
H2-479
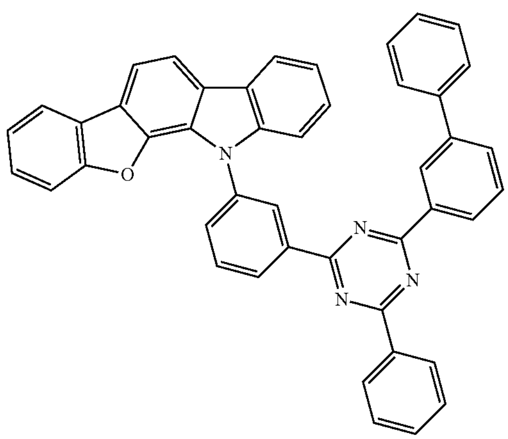
H2-480
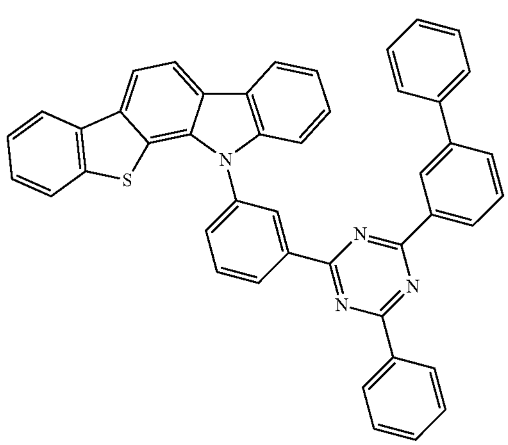
H2-481
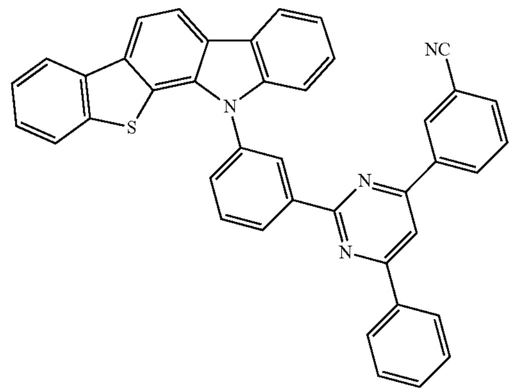
H2-482
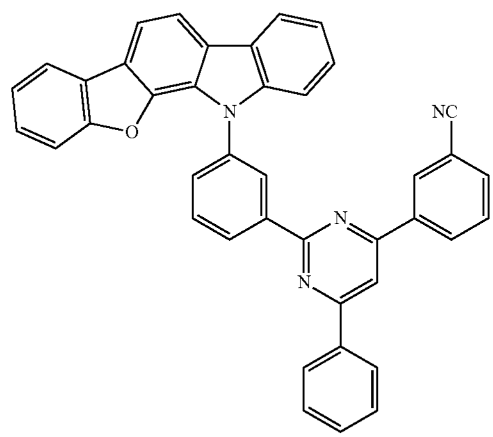
H2-483
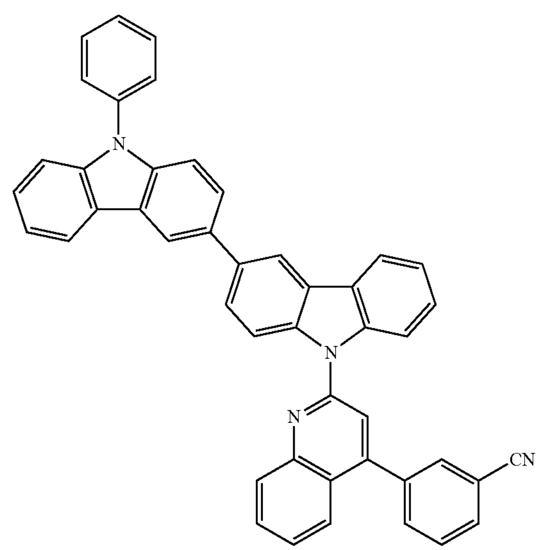

-continued
H2-484
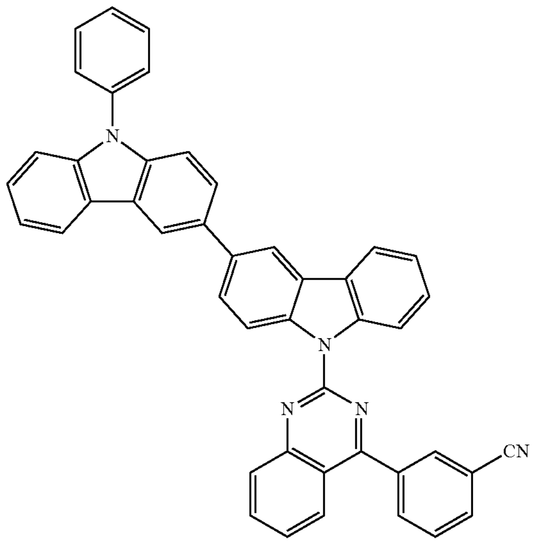
H2-485
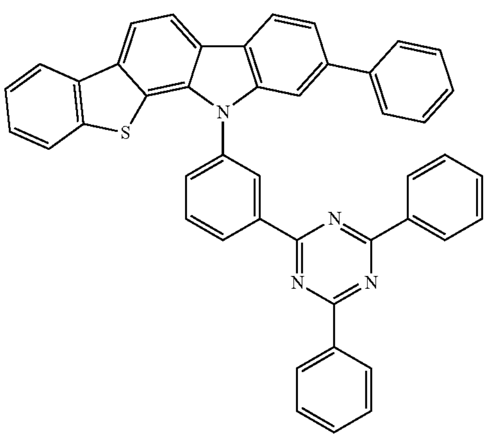
H2-486
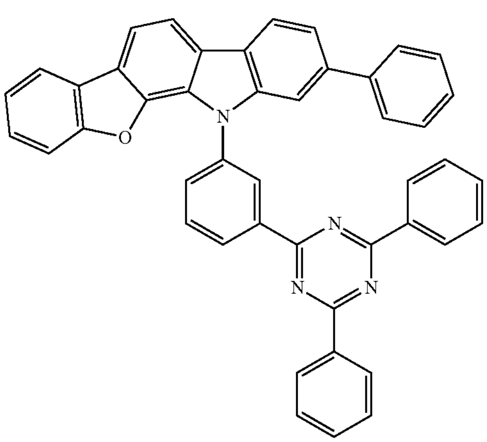
-continued
H2-487
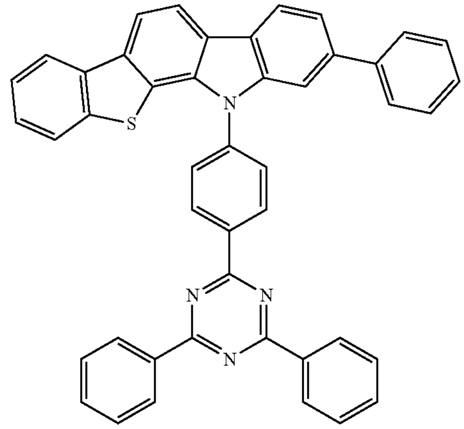
H2-488
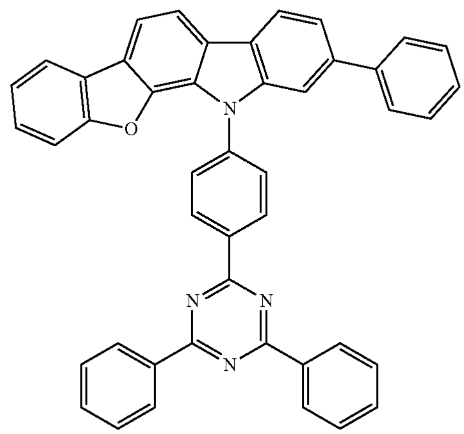
H2-489
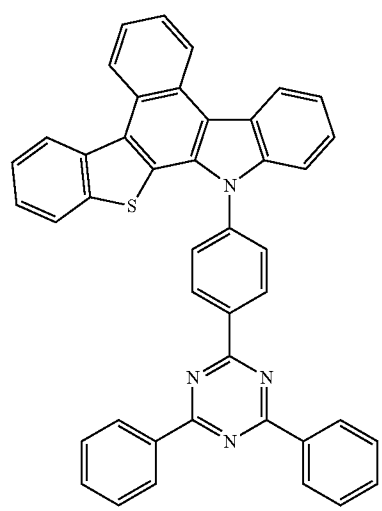

-continued
H2-490
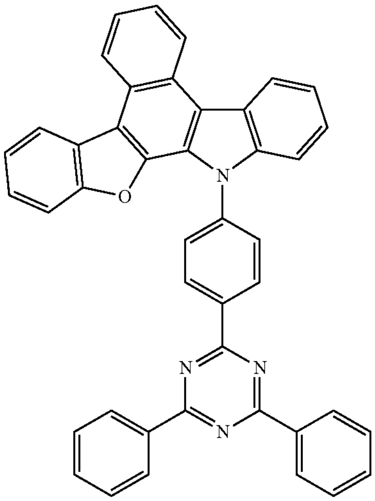
H2-491
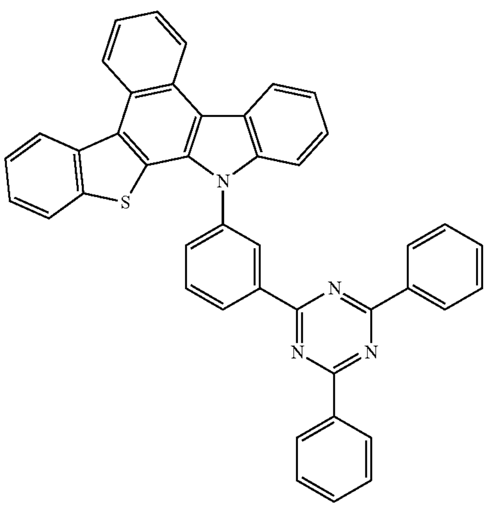
H2-492
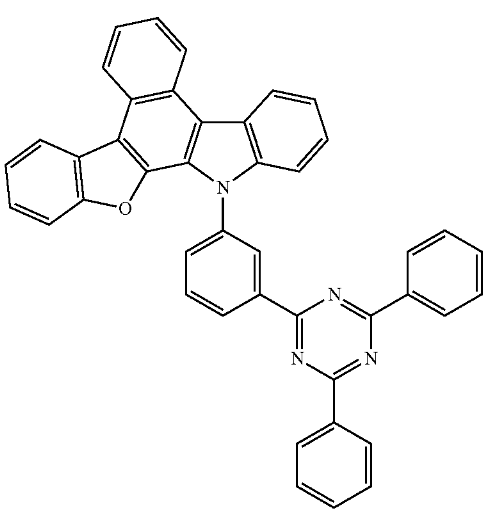
-continued
H2-493
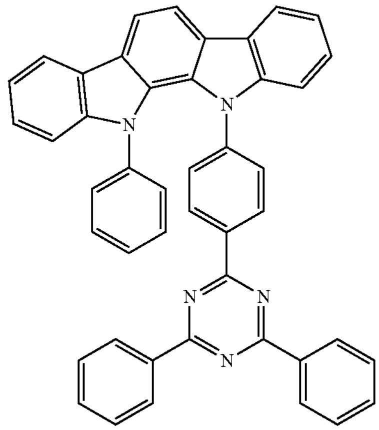
H2-494
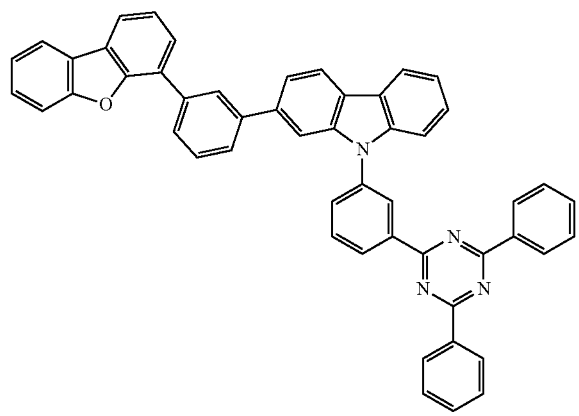
H2-495
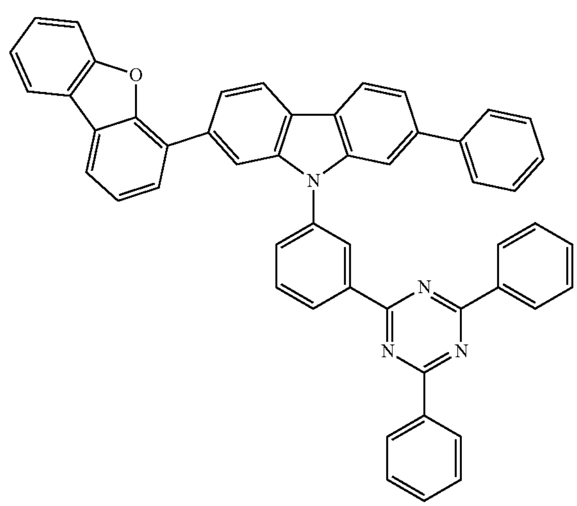

-continued
H2-496
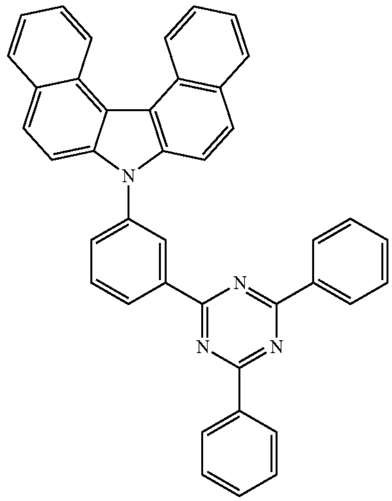
H2-497
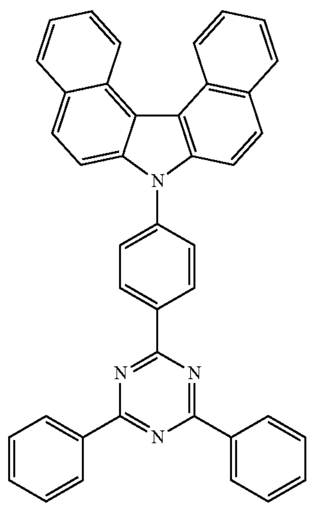
H2-498
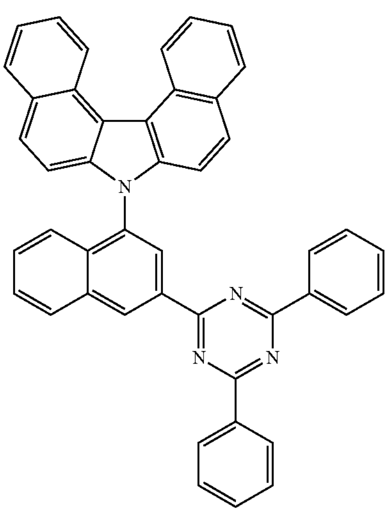
-continued
H2-499
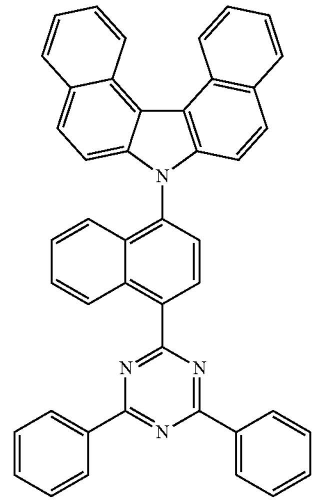
H2-500
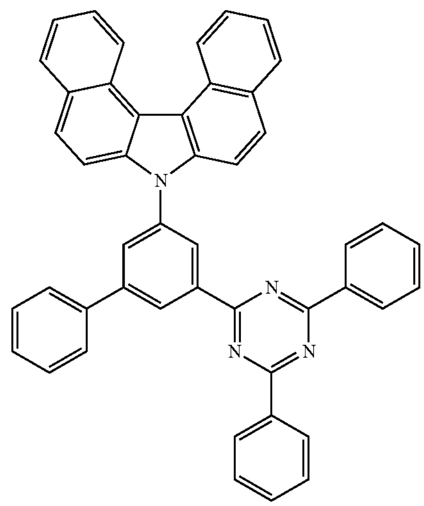
H2-501
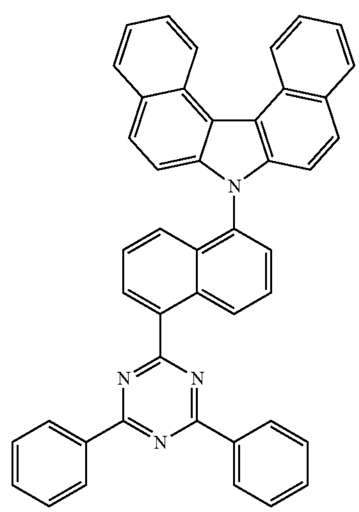

-continued
H2-502
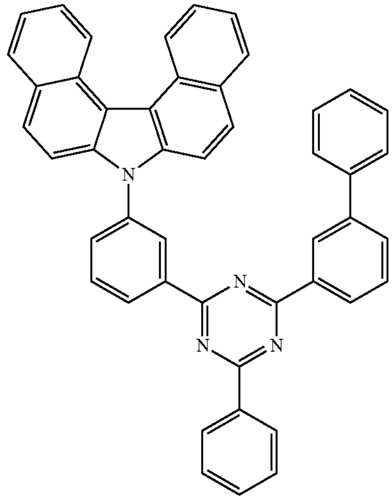
H2-503
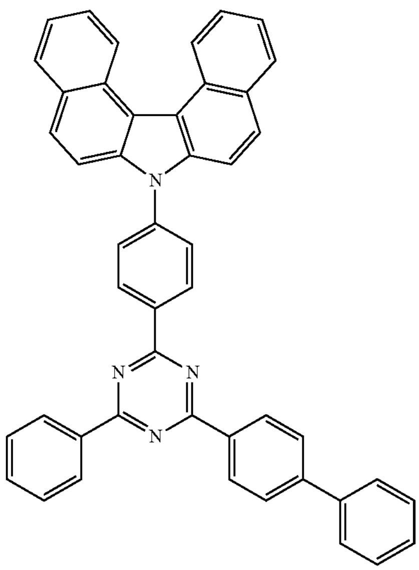
H2-504
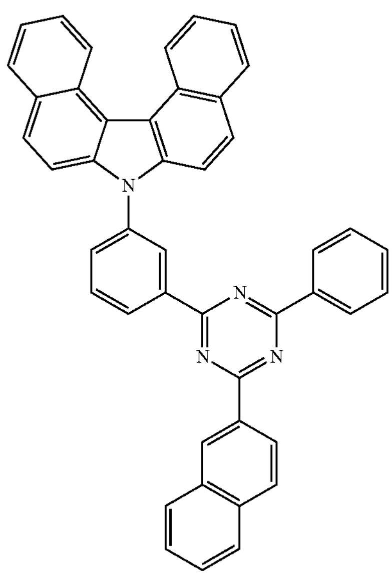
-continued
H2-505
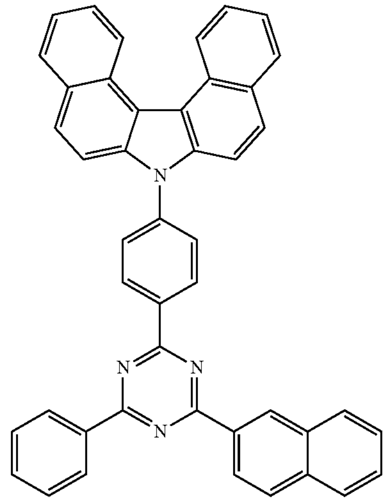
H2-506
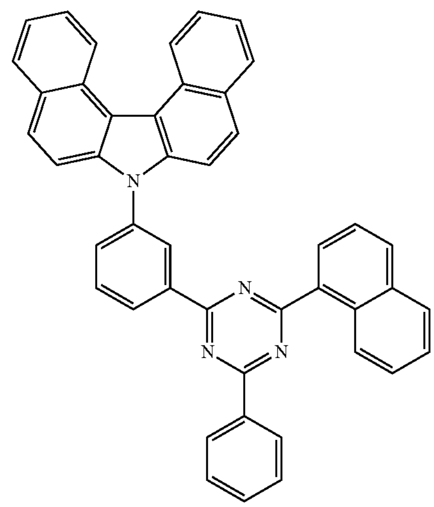
H2-507
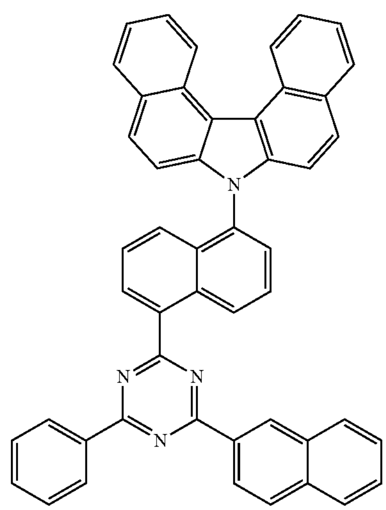

-continued
H2-508
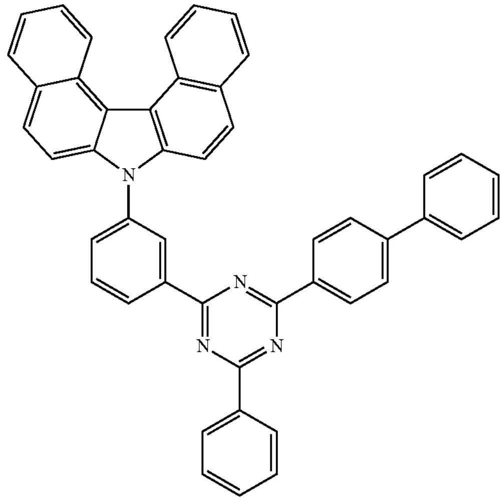
H2-509
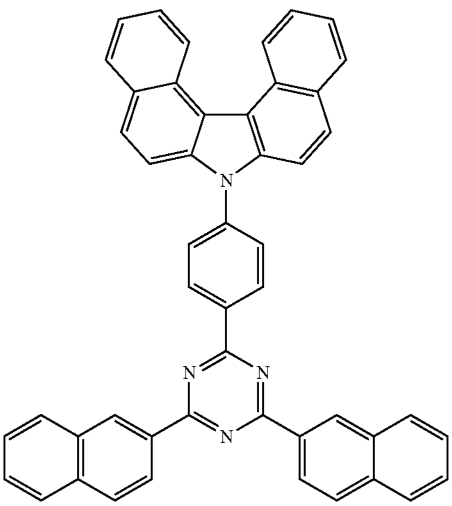
H2-510
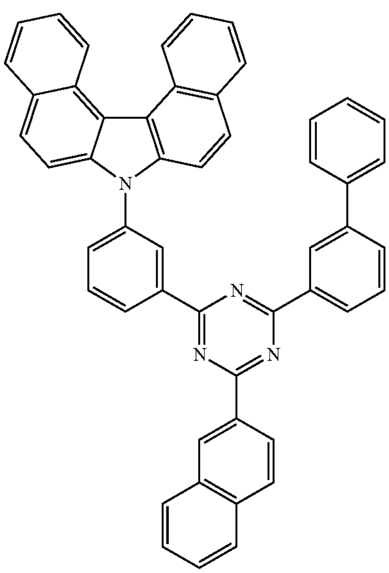
-continued
H2-511
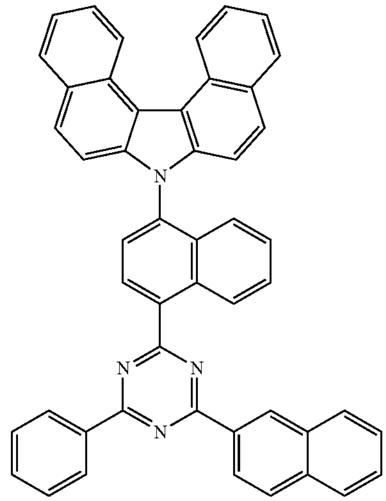
H2-512
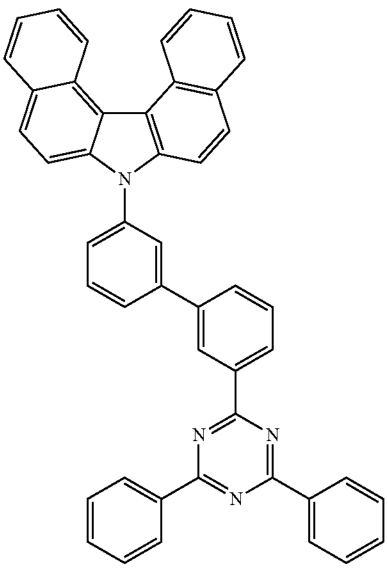
H2-513
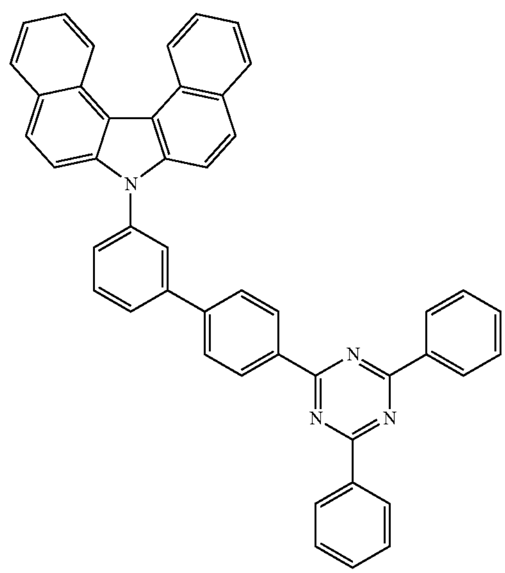

-continued
H2-514
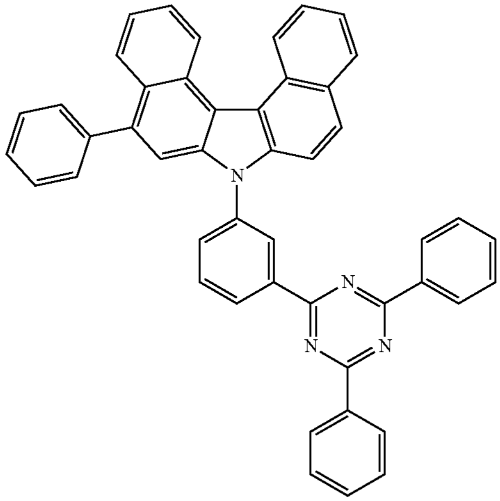
H2-515
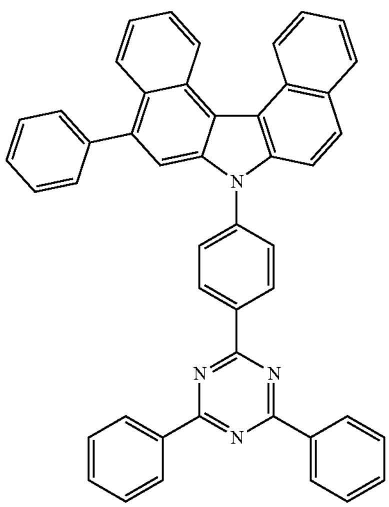
H2-516
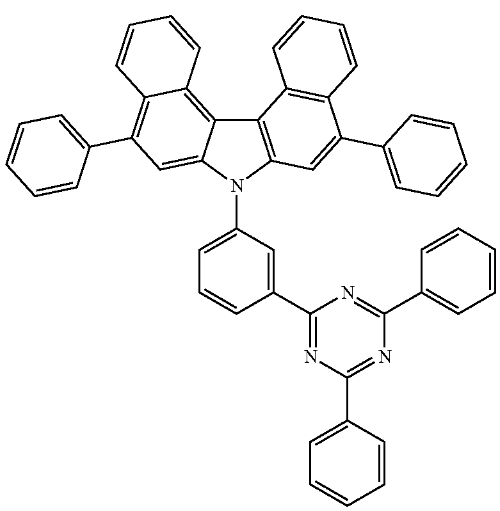
-continued
H2-517
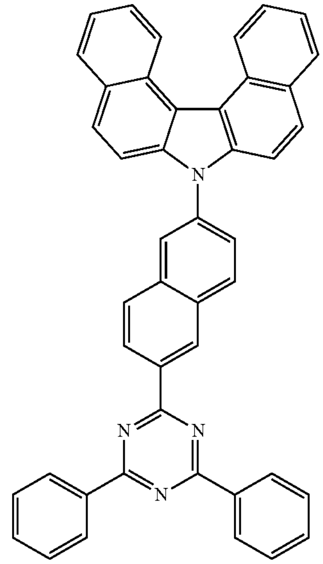
H2-518
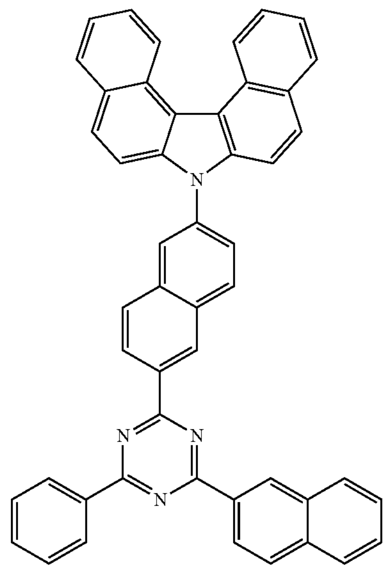
H2-519
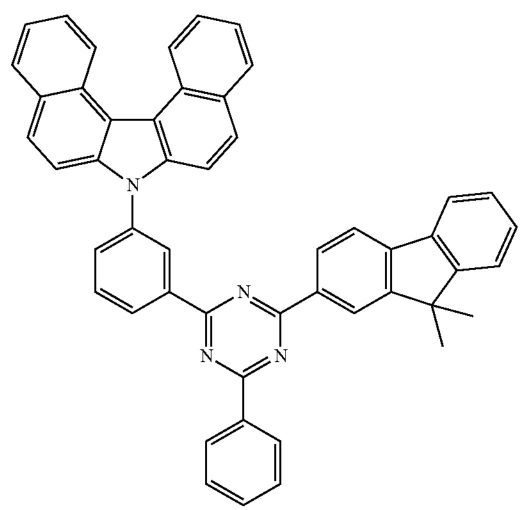

-continued
H2-520
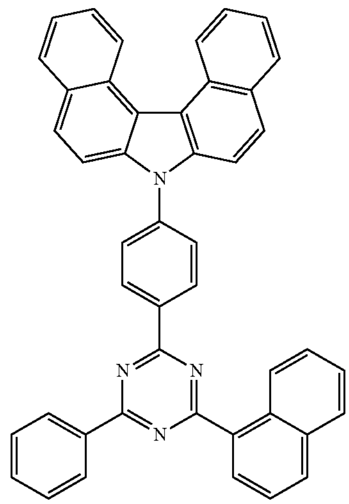
H2-521
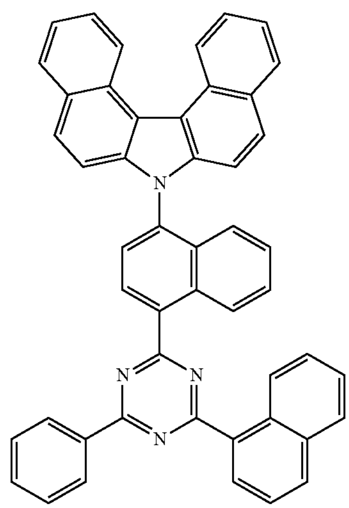
H2-522
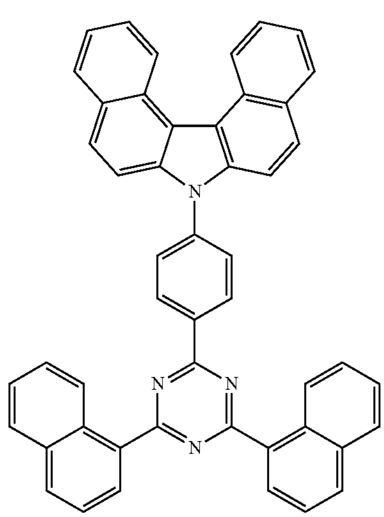
-continued
H2-523
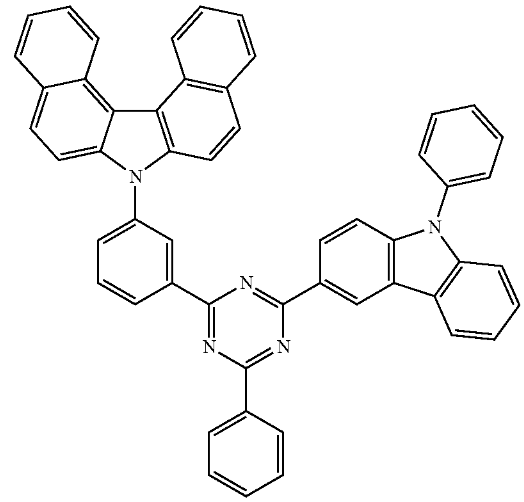
H2-524
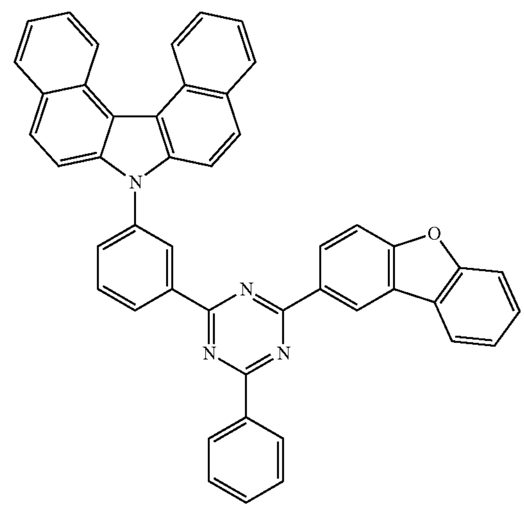
H2-525
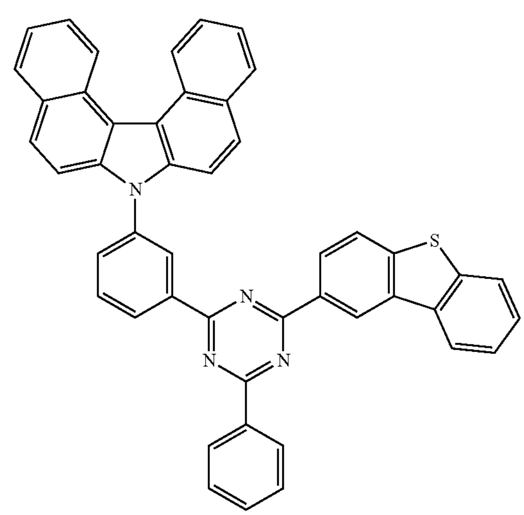

H2-526
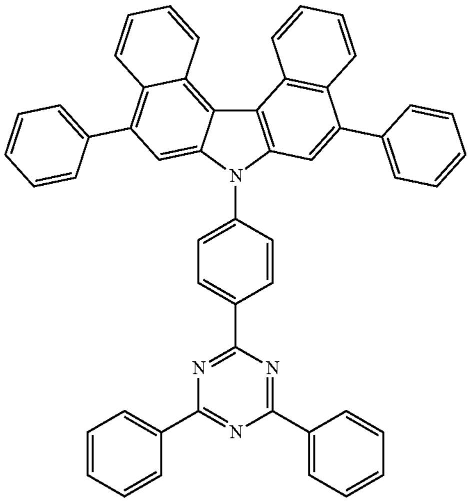
H2-527
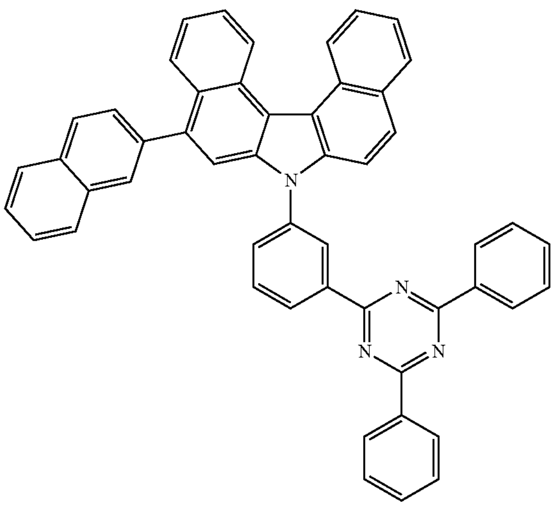
H2-528
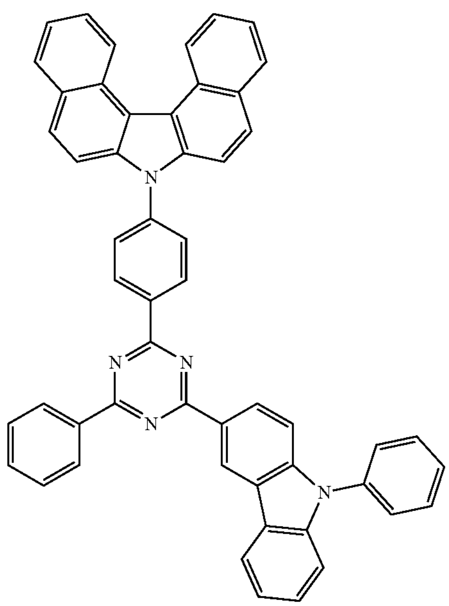
H2-529
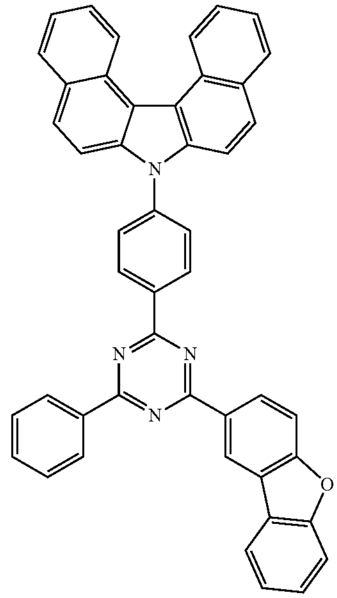
H2-530
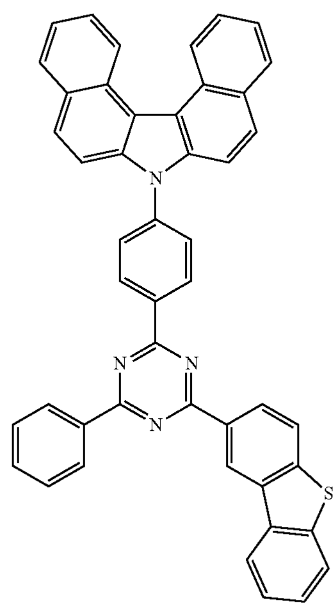

-continued
H2-531
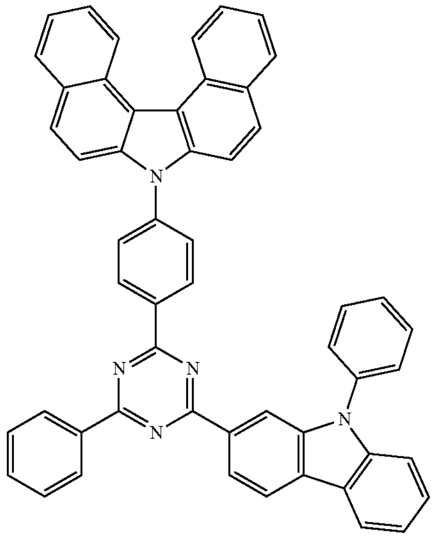
H2-532
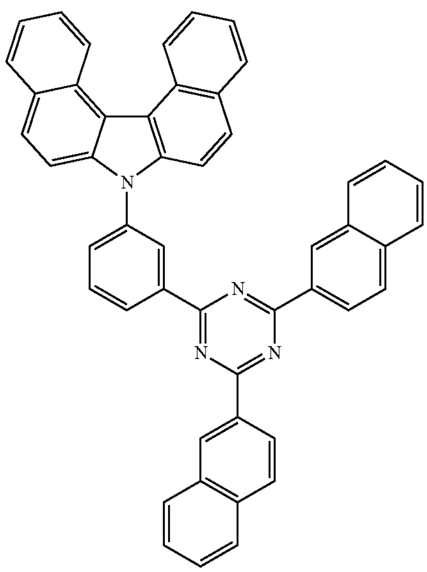
H2-533
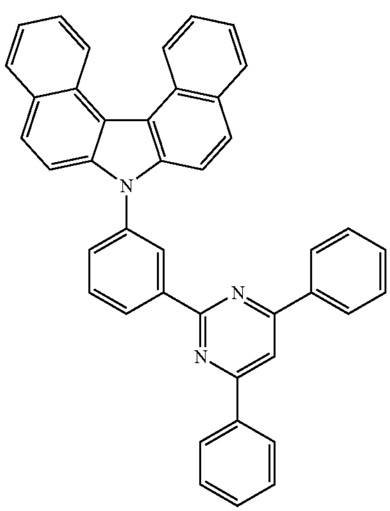
-continued
H2-534
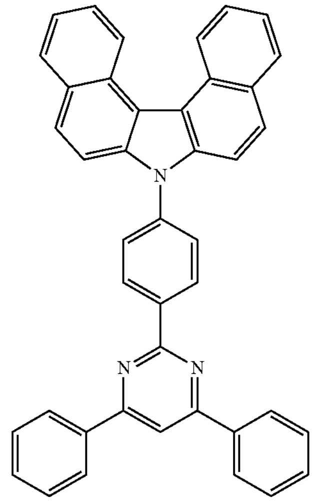
H2-535
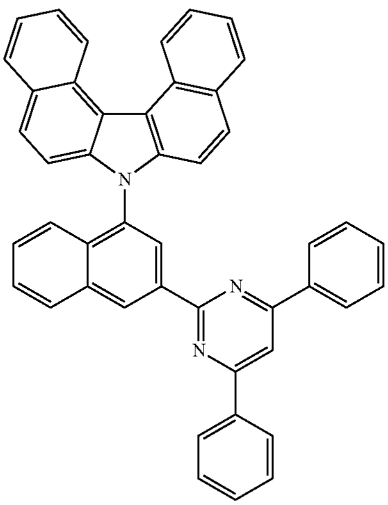
H2-536
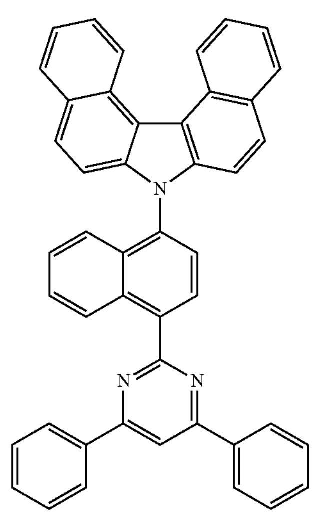

H2-537
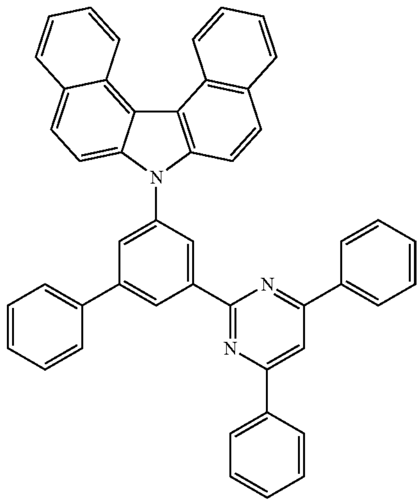
H2-538
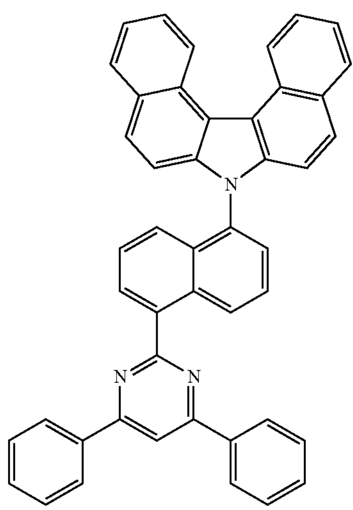
H2-539
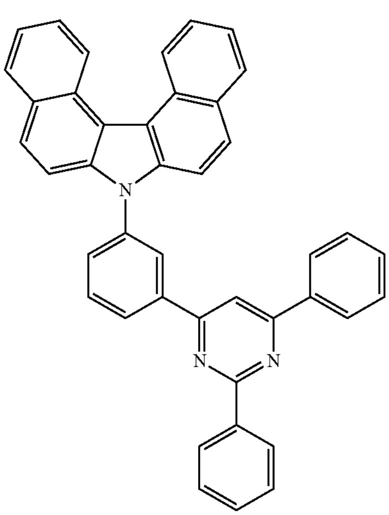
H2-540
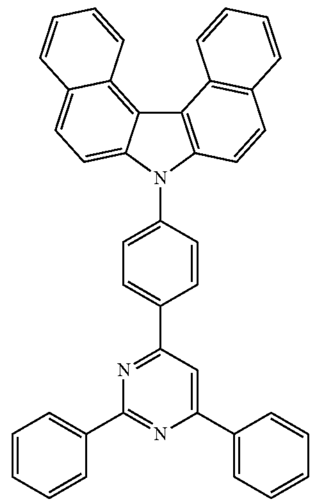
H2-541
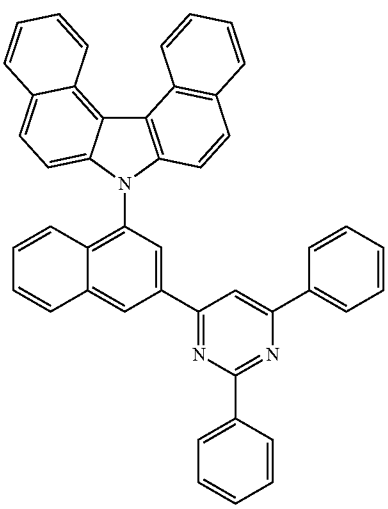
H2-542
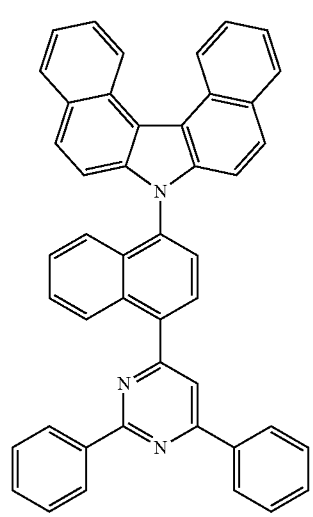

-continued
H2-543
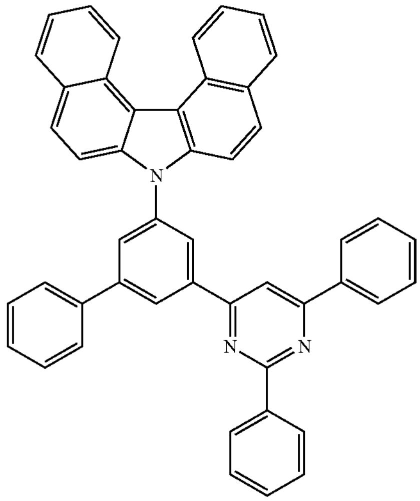
H2-544
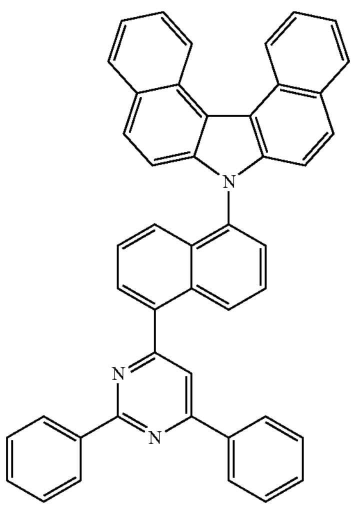
H2-545
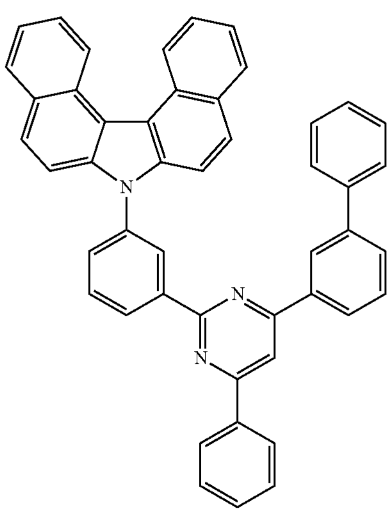
-continued
H2-546
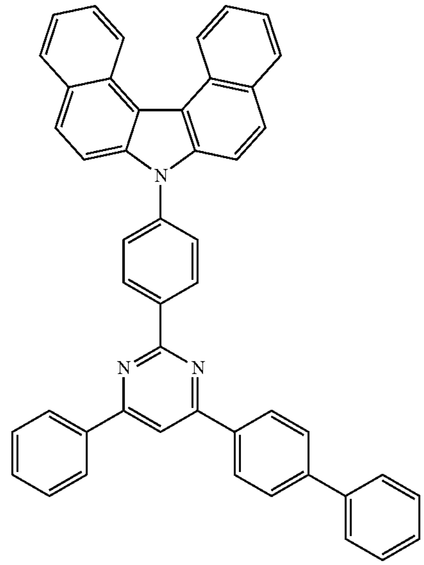
H2-547
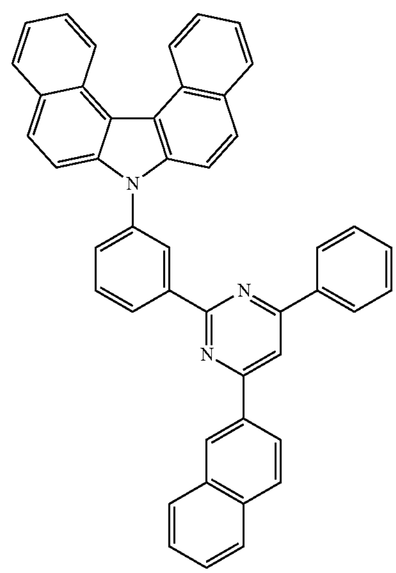

-continued
H2-548
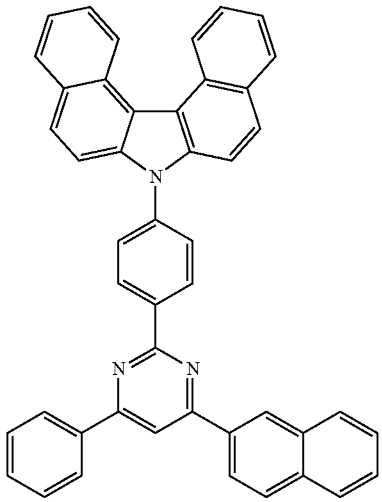
H2-549
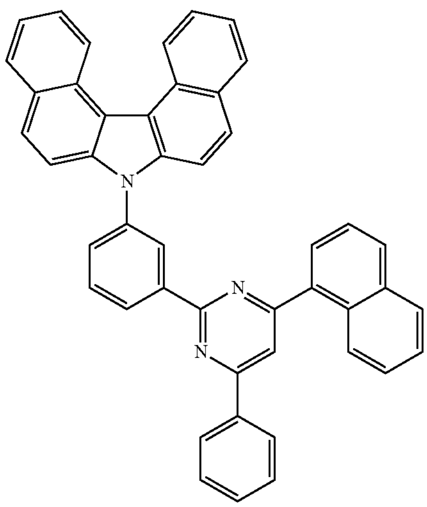
H2-550
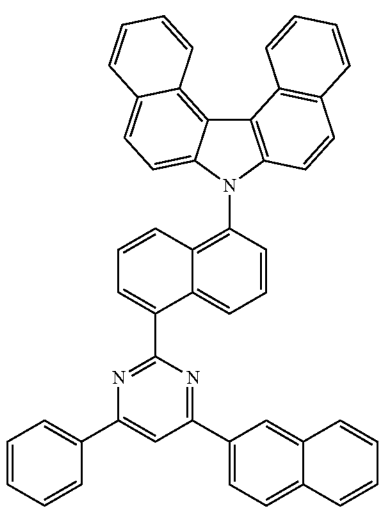
-continued
H2-551
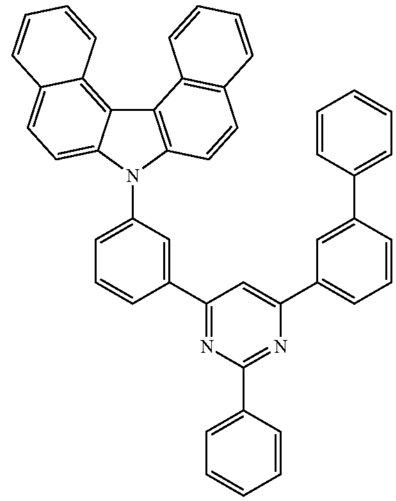
H2-552
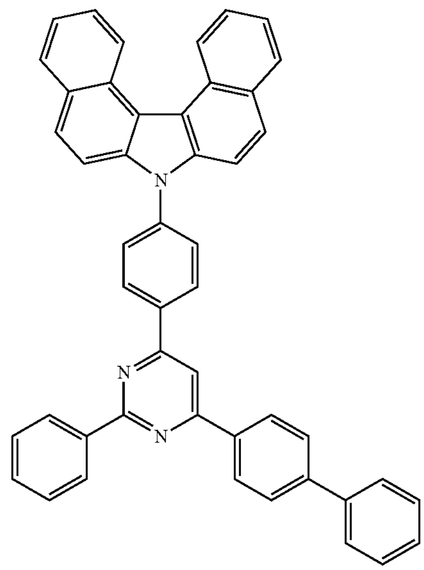
H2-553
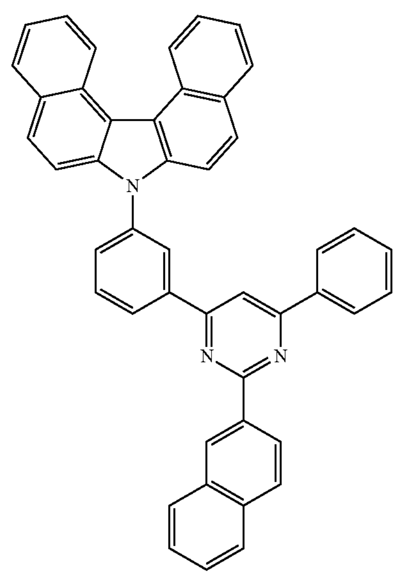

-continued
H2-554
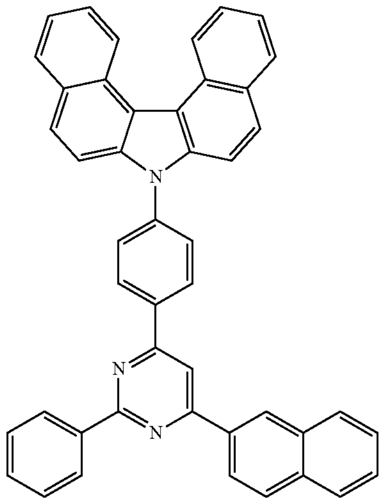
H2-555
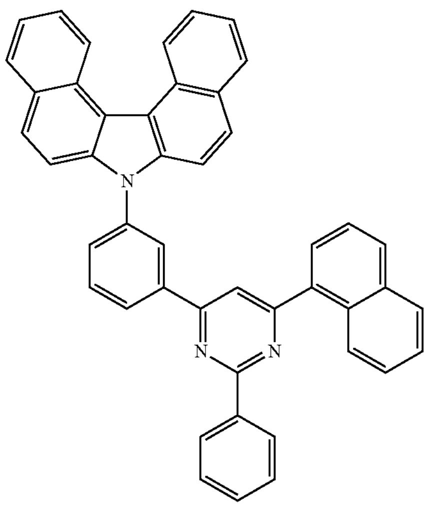
H2-556
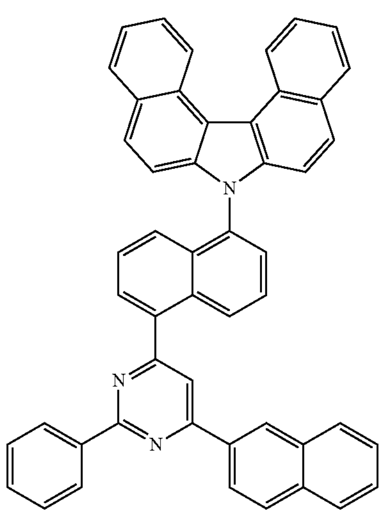
-continued
H2-557
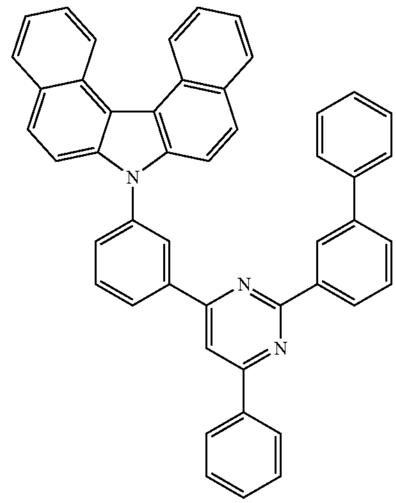
H2-558
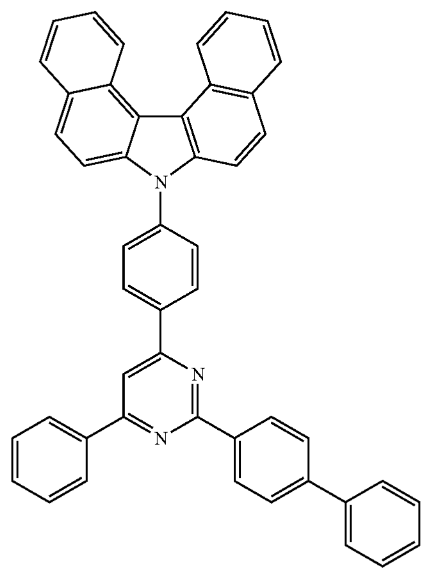
H2-559
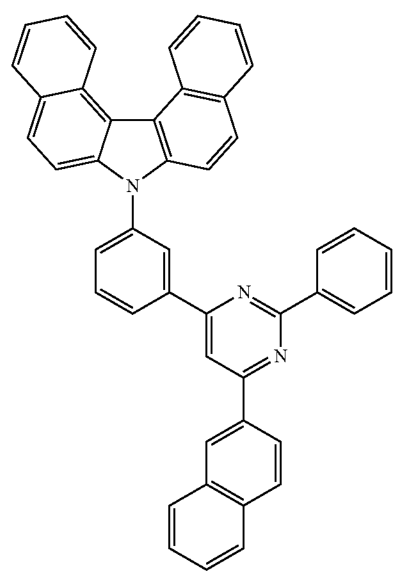

-continued
H2-560
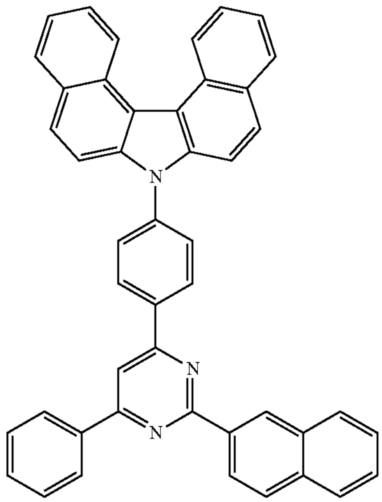
H2-561
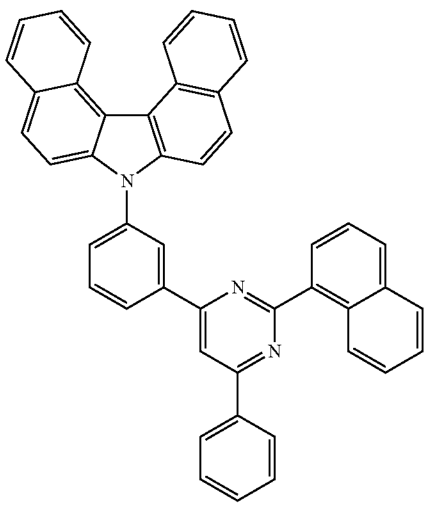
H2-562
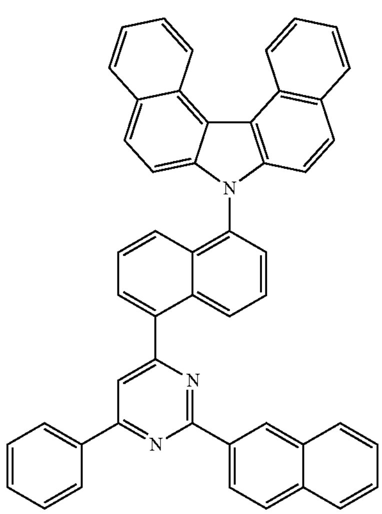
-continued
H2-563
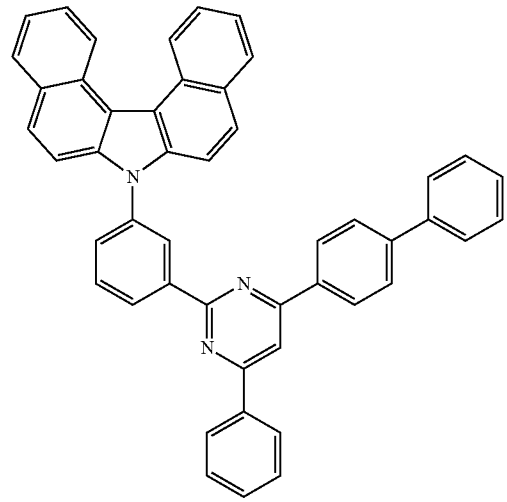
H2-564
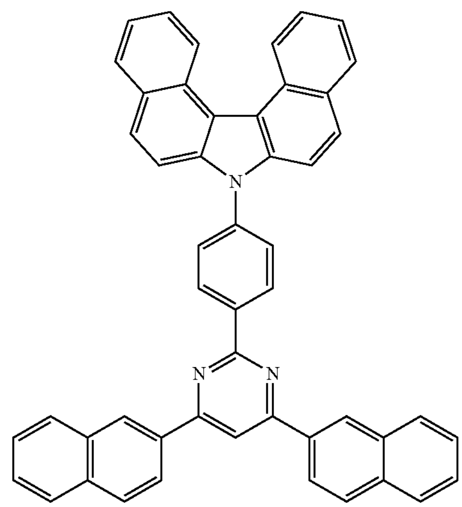
H2-565
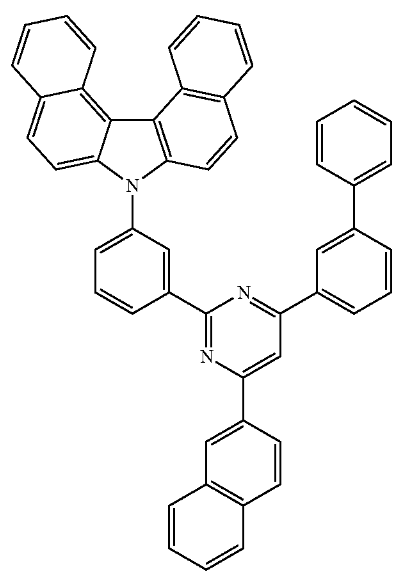

-continued
H2-566
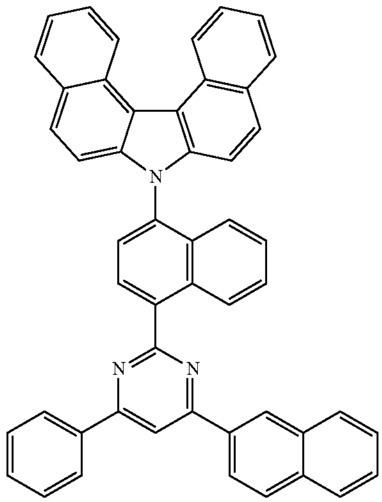
H2-567
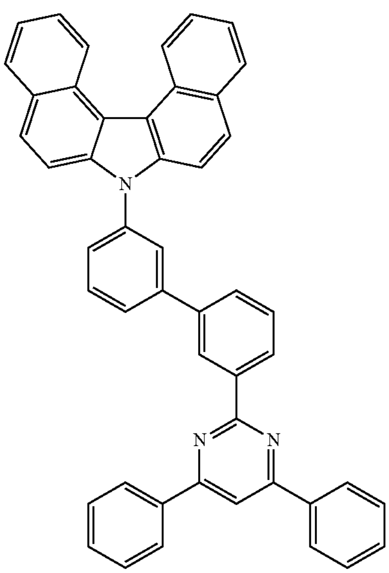
-continued
H2-568
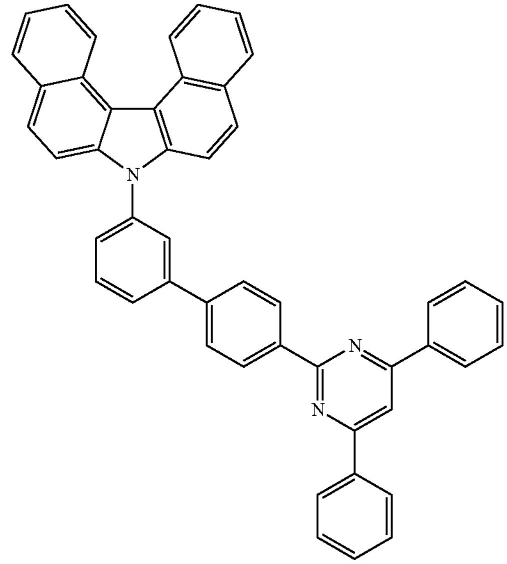
H2-569
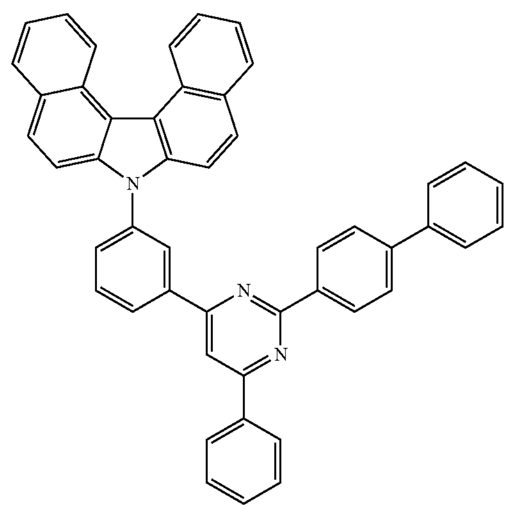

-continued
H2-570
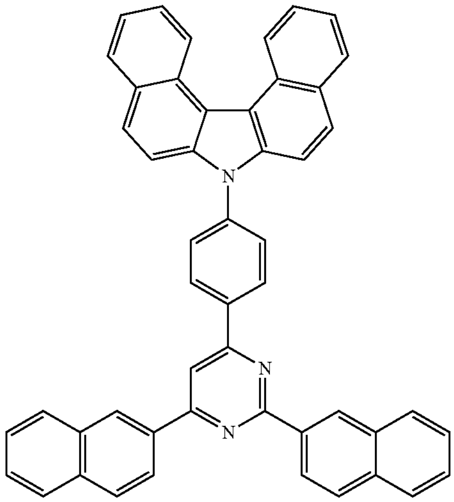
H2-571
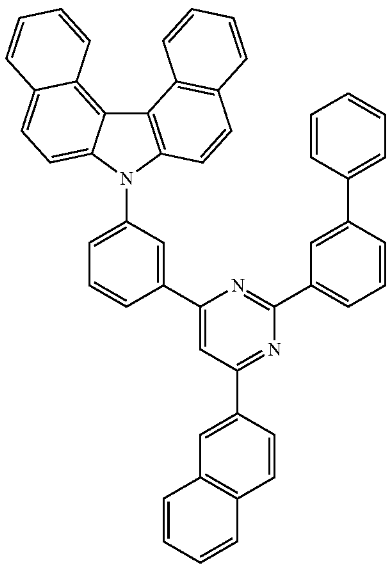
H2-572
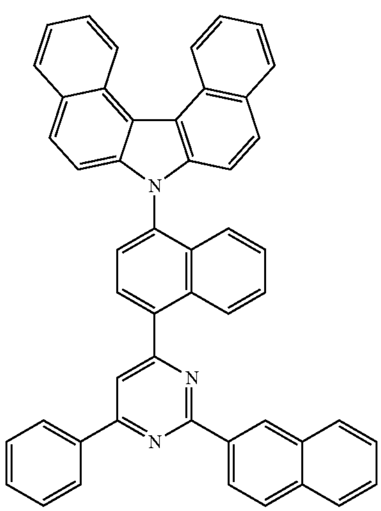
-continued
H2-573
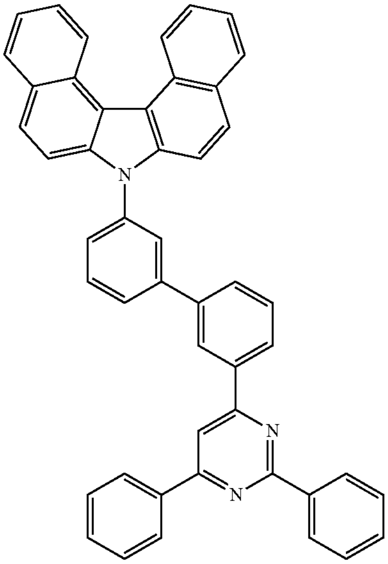
H2-574
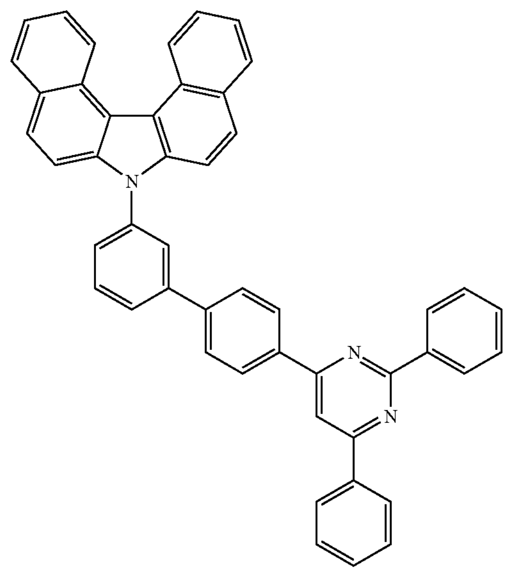
H2-575
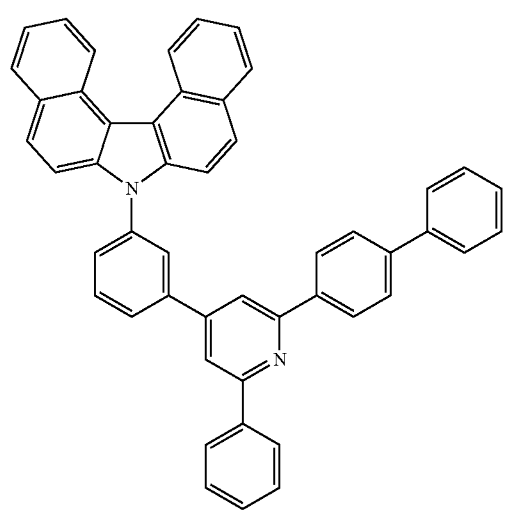

-continued
H2-576
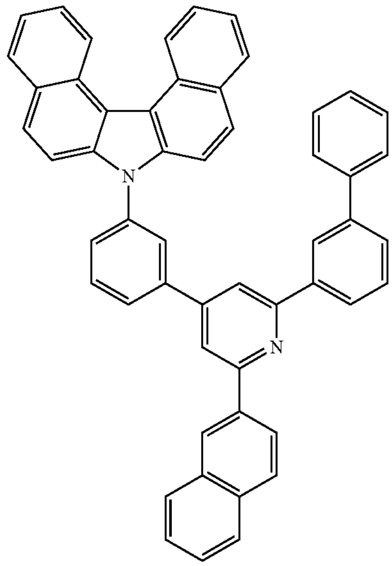
H2-577
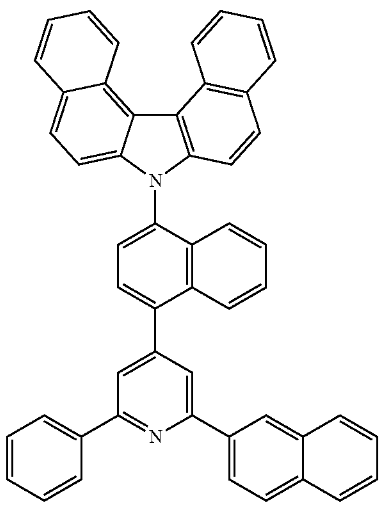
H2-578
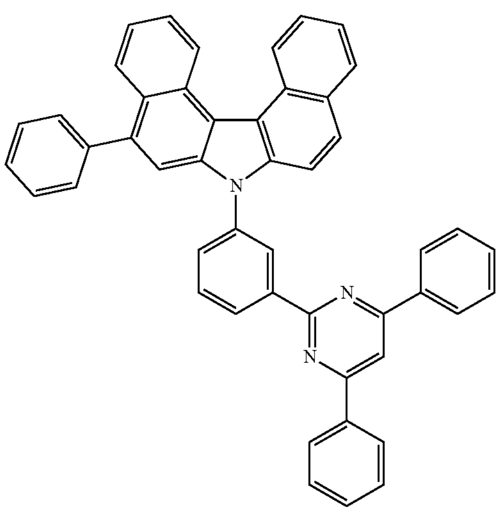
-continued
H2-579
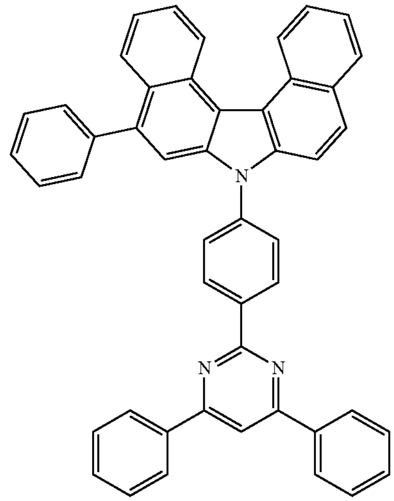
H2-580
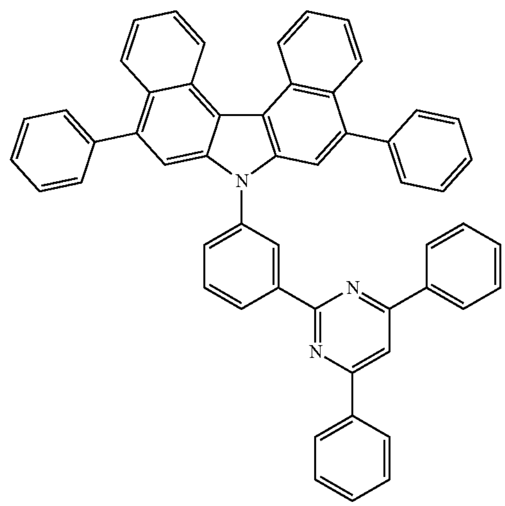
H2-581
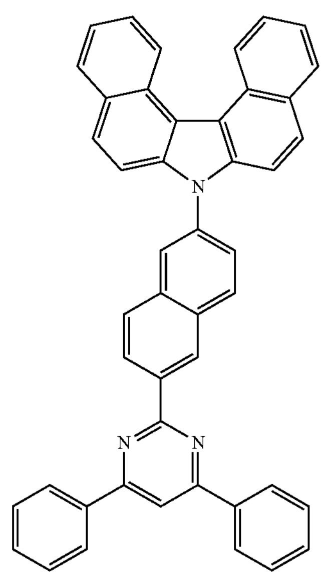

-continued
H2-582
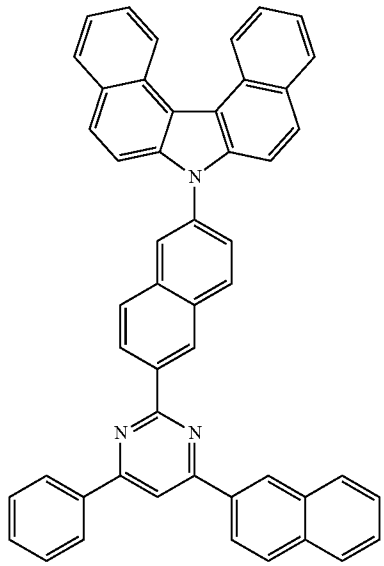
H2-583
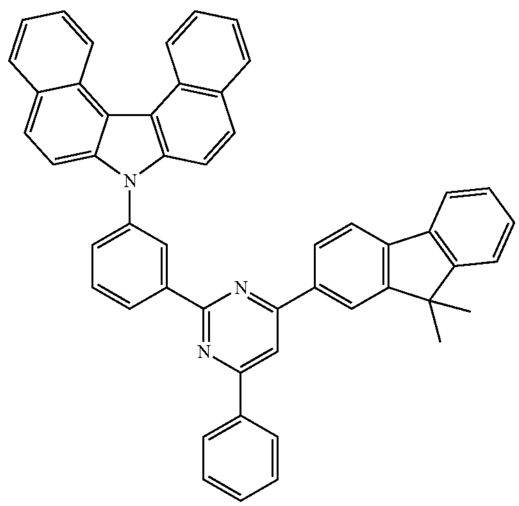
H2-584
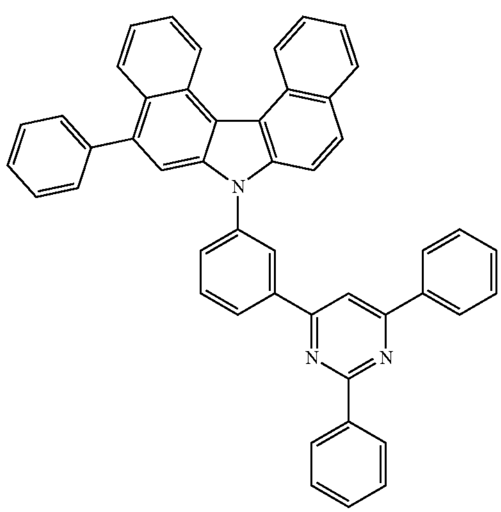
-continued
H2-585
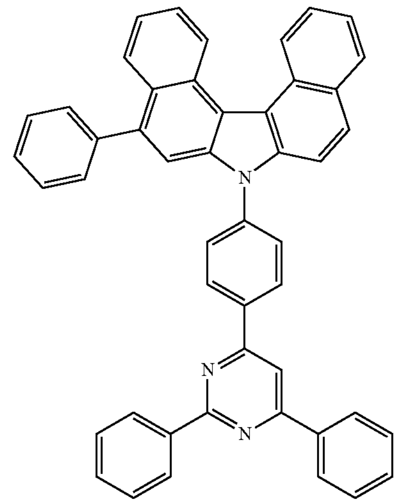
H2-586
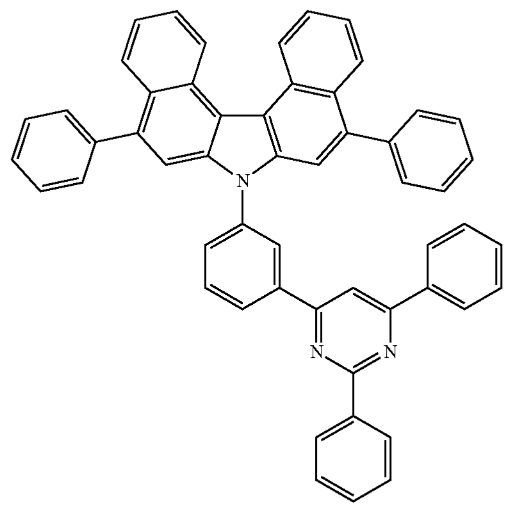
H2-587
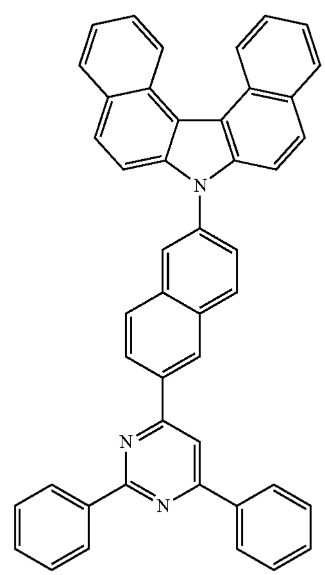

-continued
H2-588
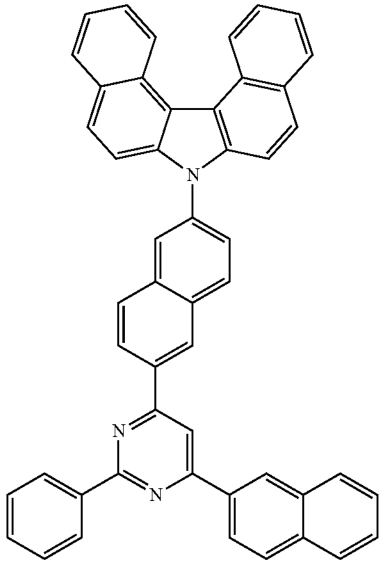
H2-589
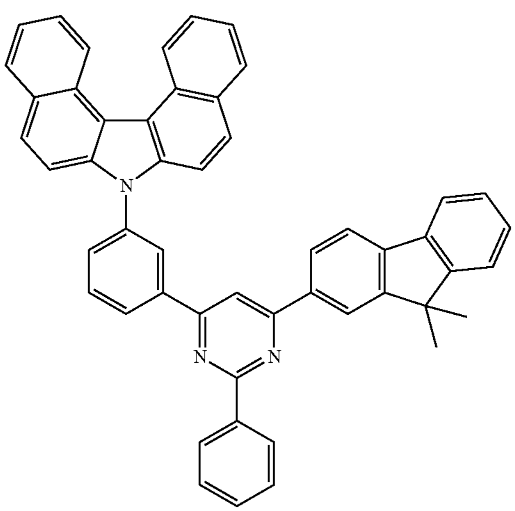
-continued
H2-590
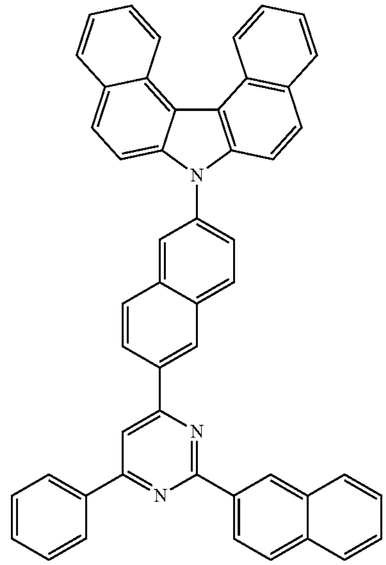
H2-591
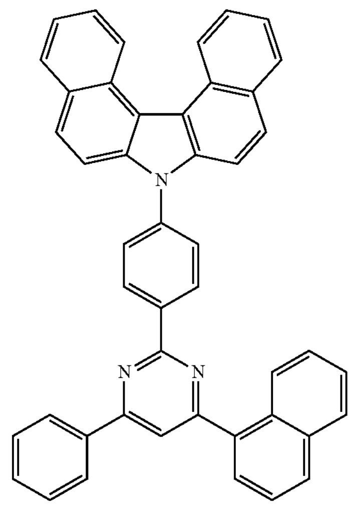
H2-592
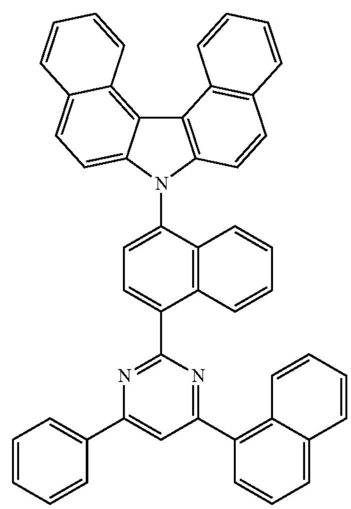

H2-593
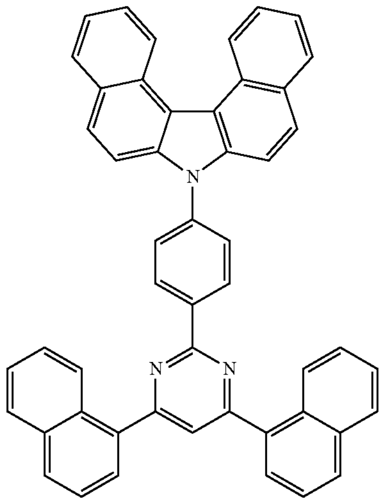
H2-594
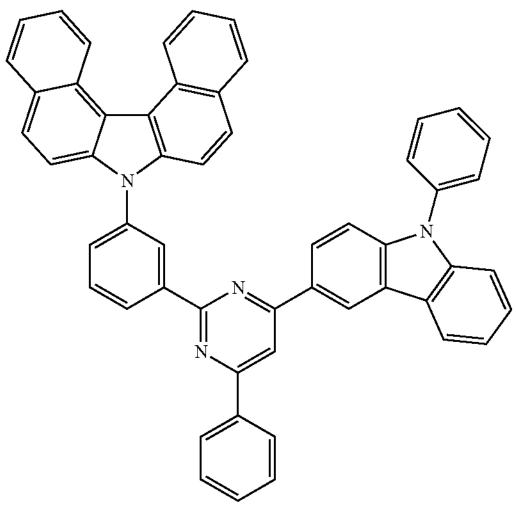
H2-595
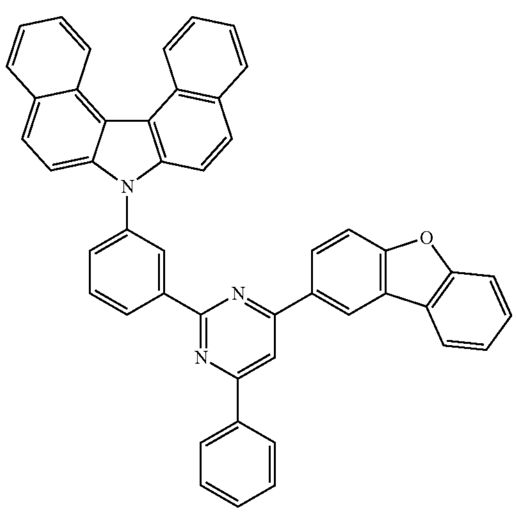
H2-596
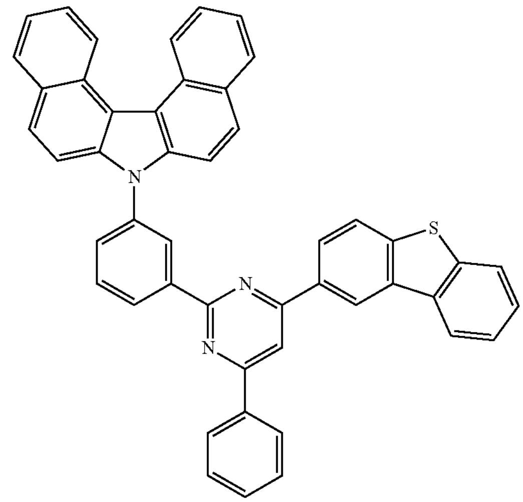
H2-597
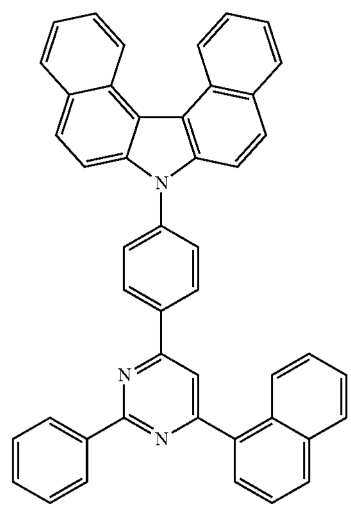
H2-598
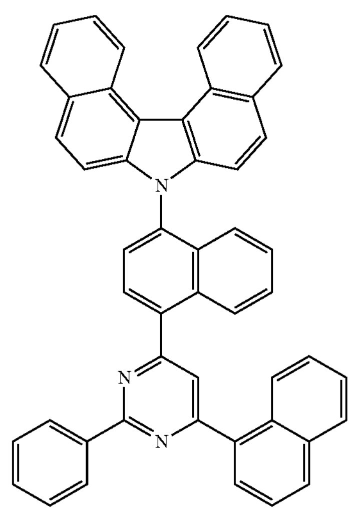

H2-599
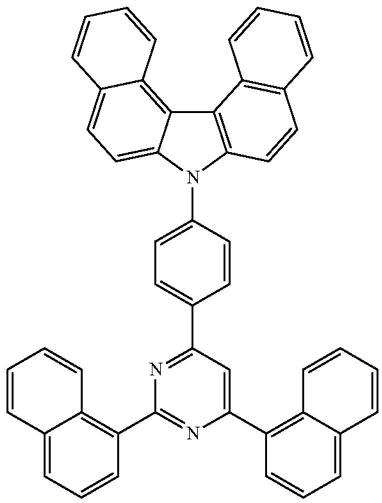
H2-600
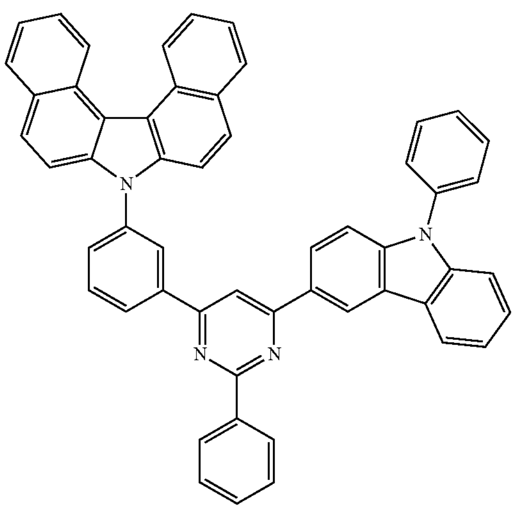
H2-601
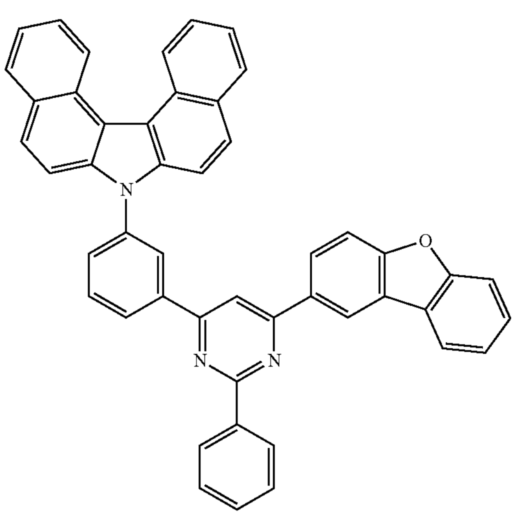
H2-602
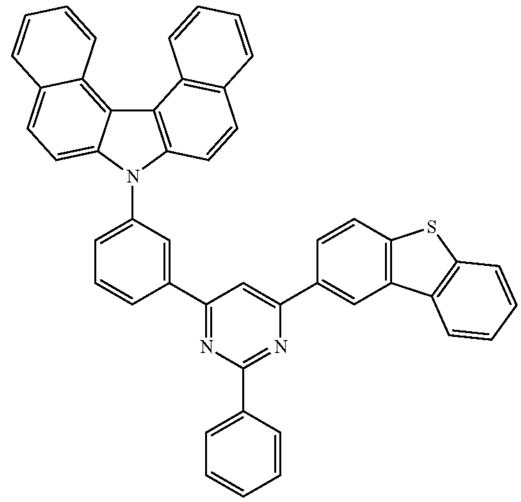
H2-603
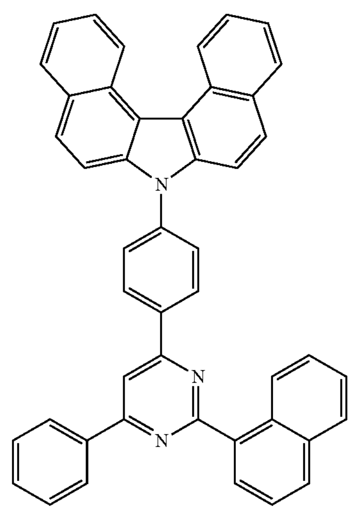
H2-604
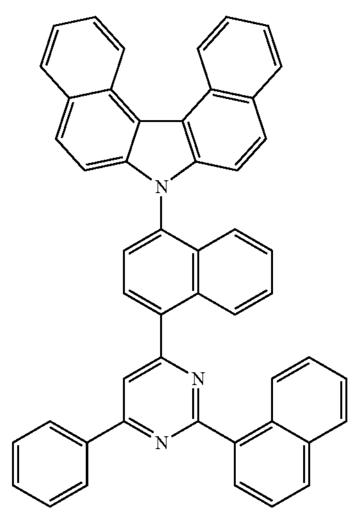

-continued
H2-605
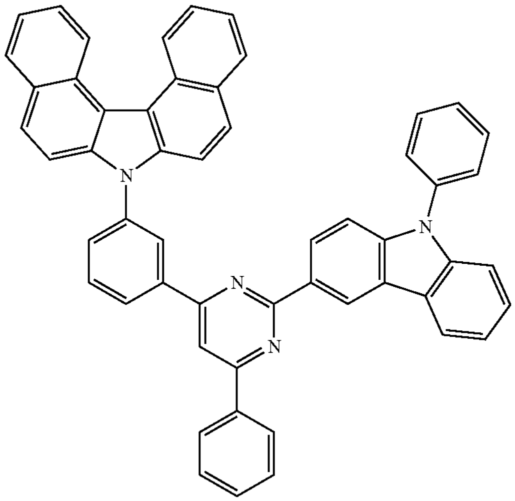
H2-606
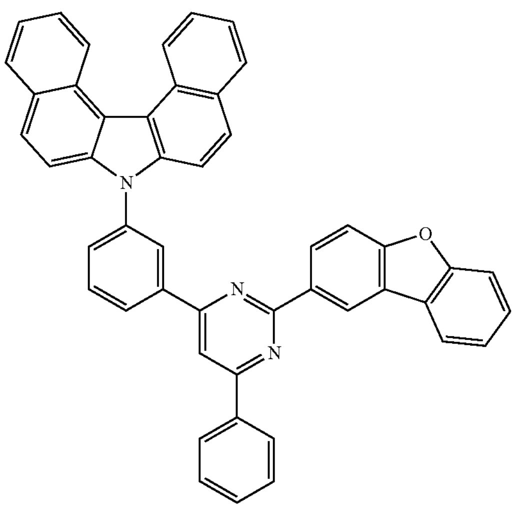
H2-607
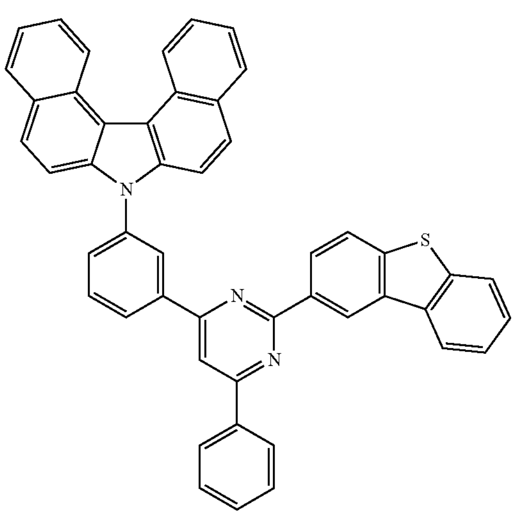
-continued
H2-608
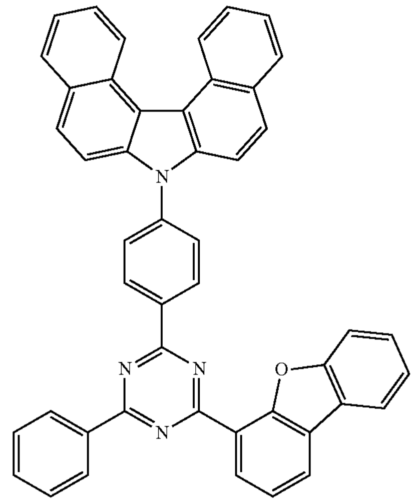
H2-609
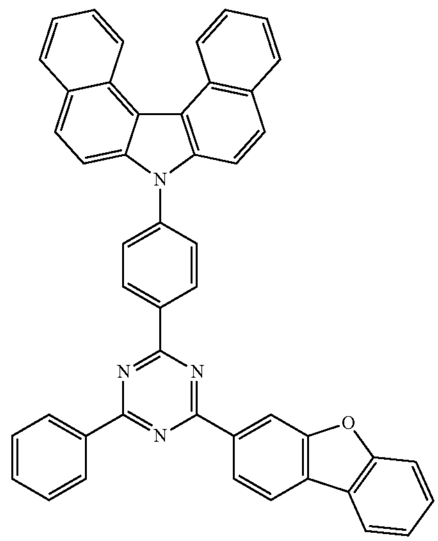
H2-610
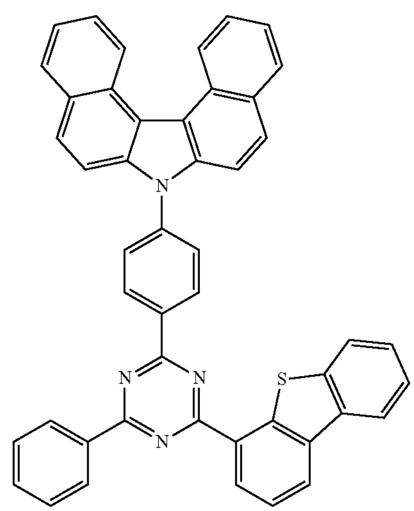

-continued
H2-611
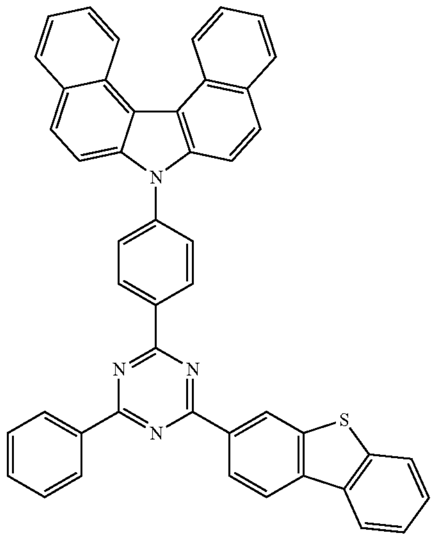
H2-612
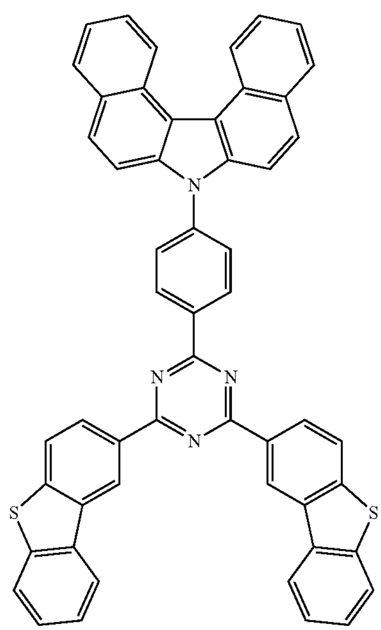
-continued
H2-613
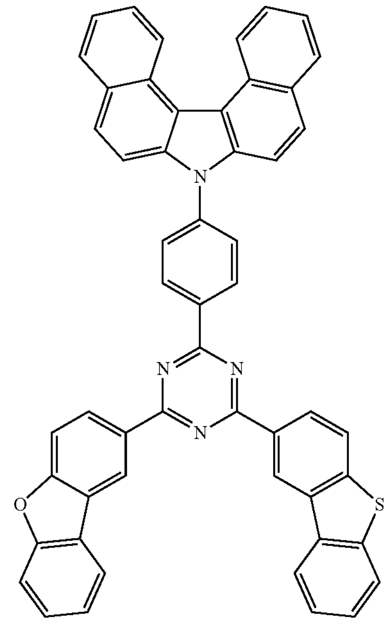
H2-614
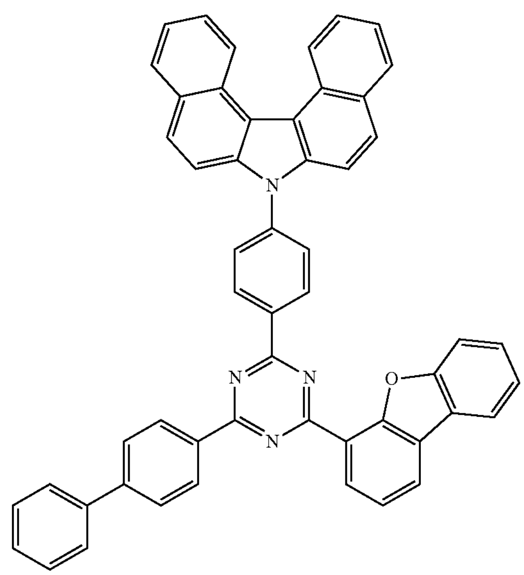

-continued
H2-615
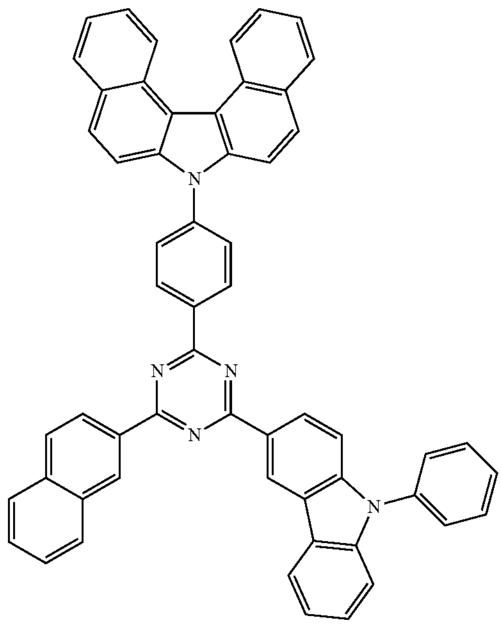
H2-616
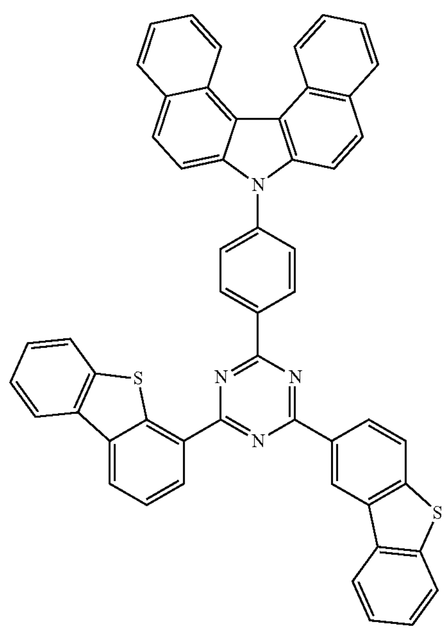
-continued
H2-617
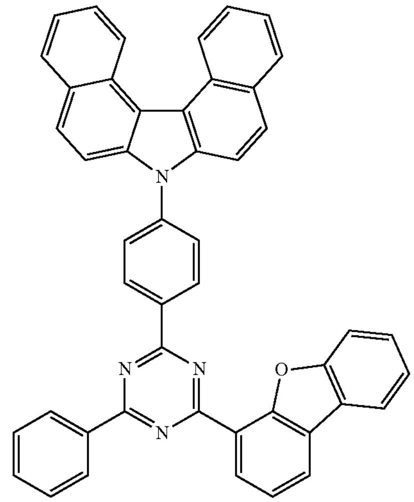
H2-618
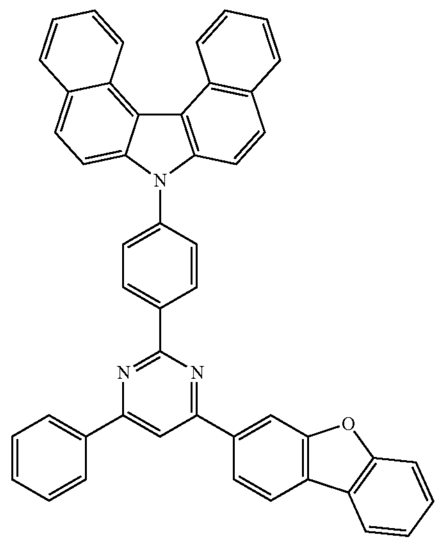
H2-619
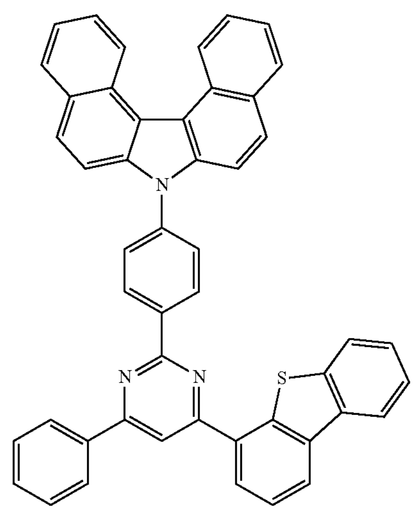

H2-620
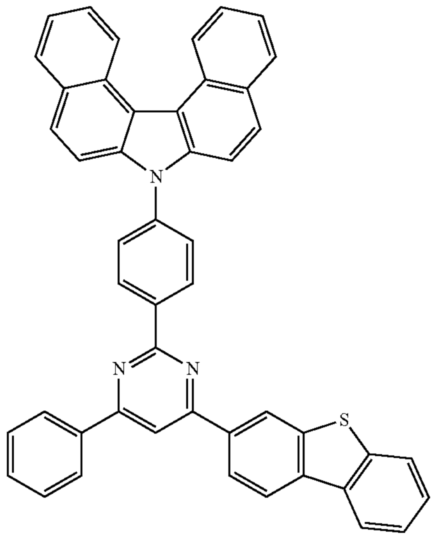
H2-621
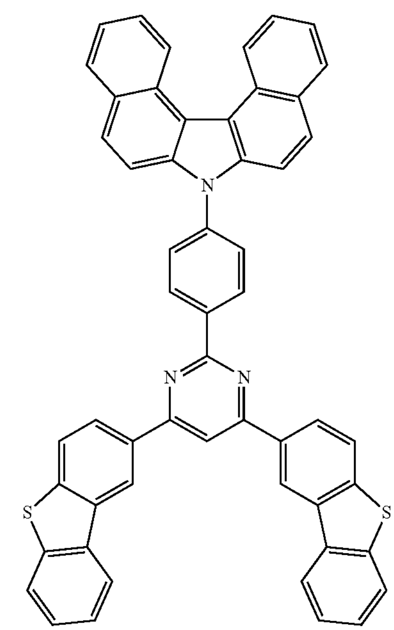
H2-622
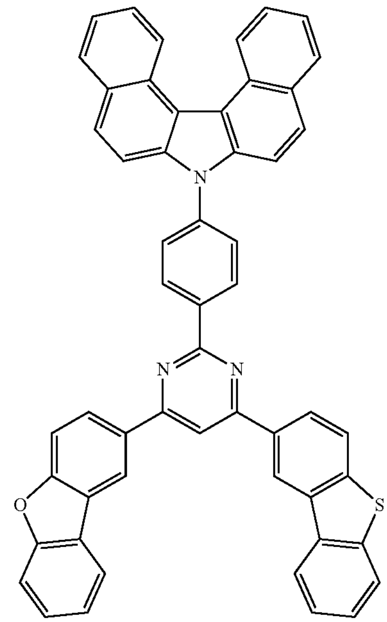
H2-623
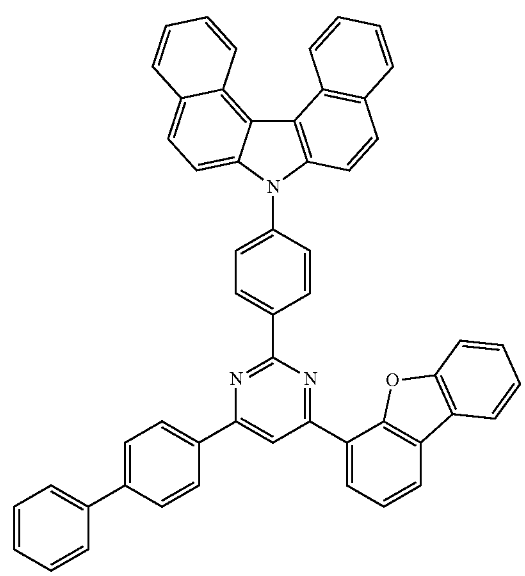

-continued
H2-624
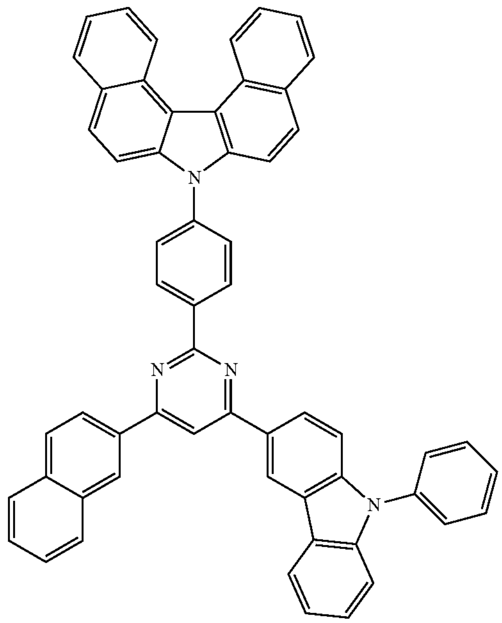
H2-625
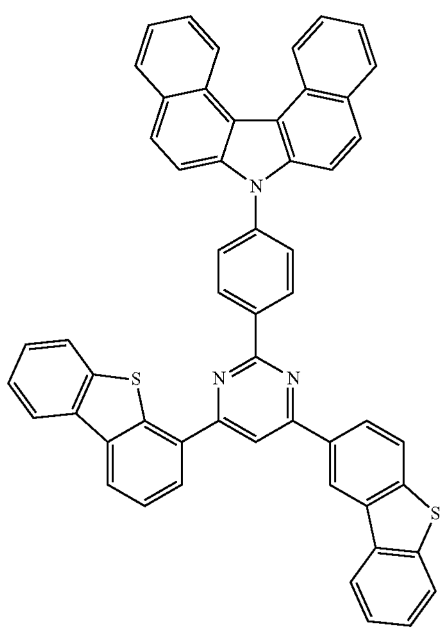
-continued
H2-626
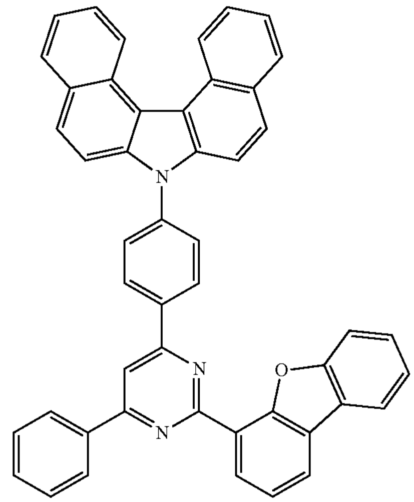
H2-627
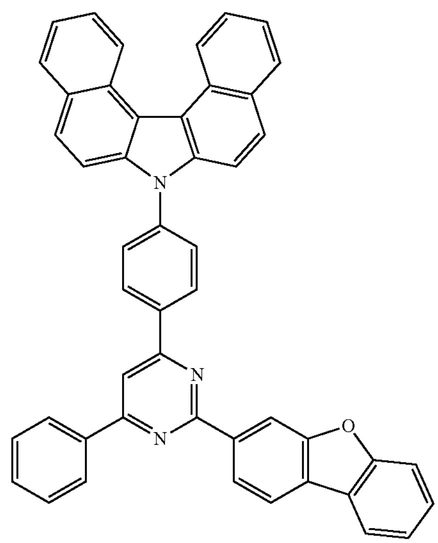
H2-628
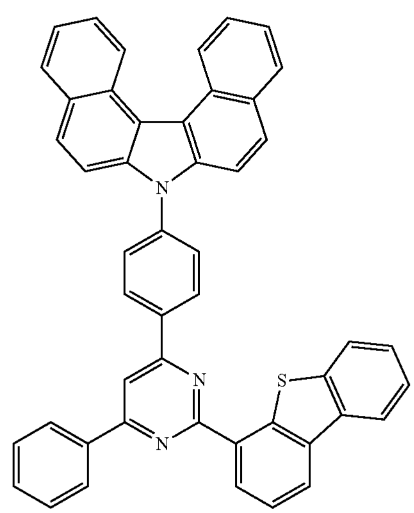

-continued
H2-629
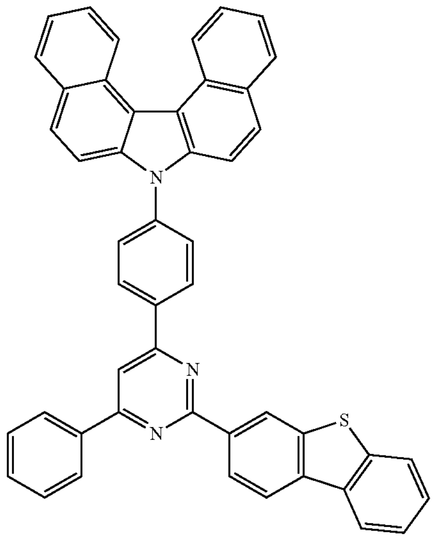
H2-630
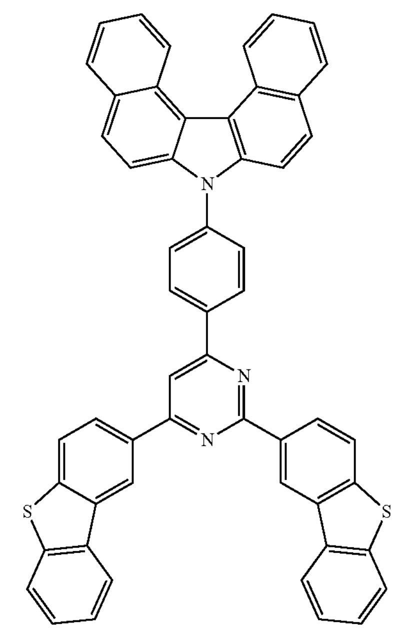
-continued
H2-631
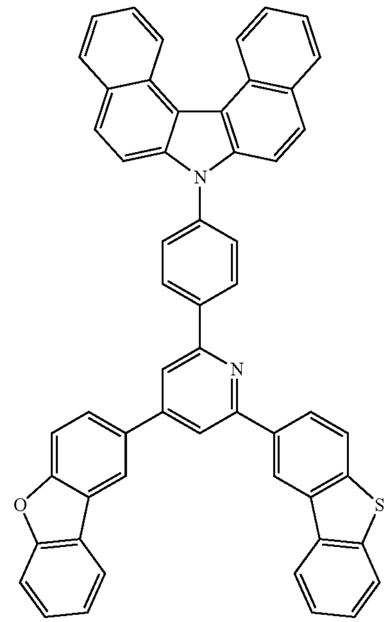
H2-632
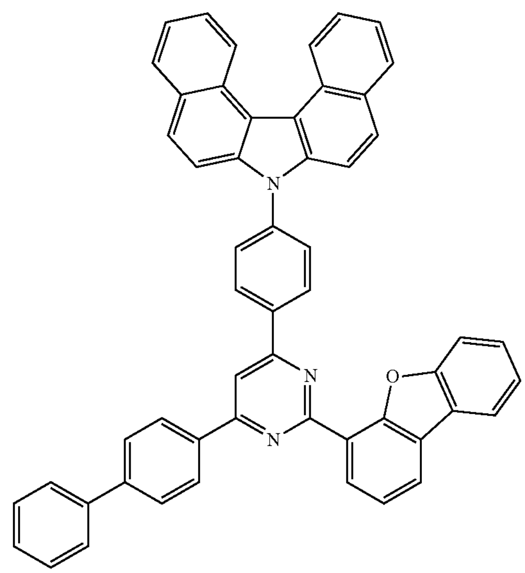

H2-633
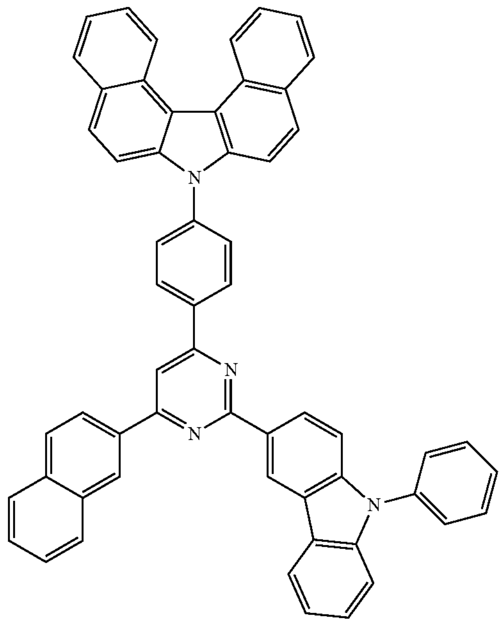
H2-634
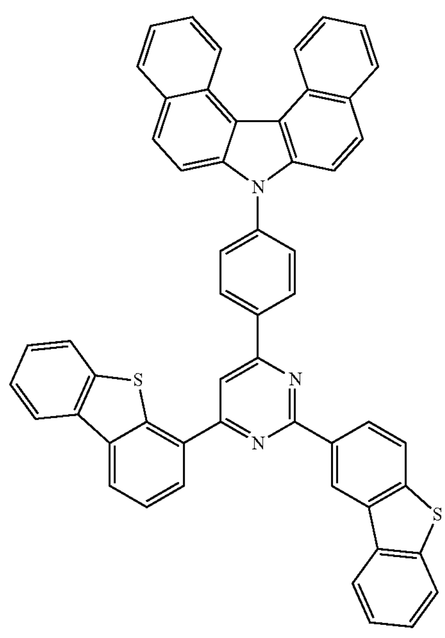
H2-635
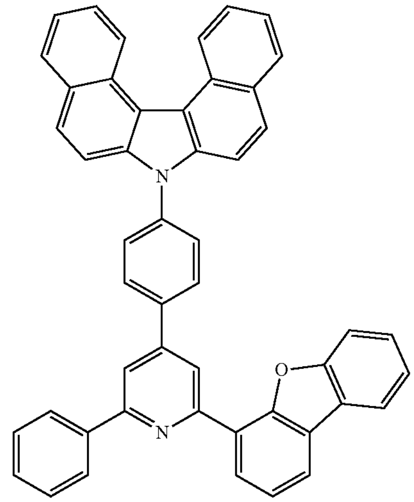
H2-636
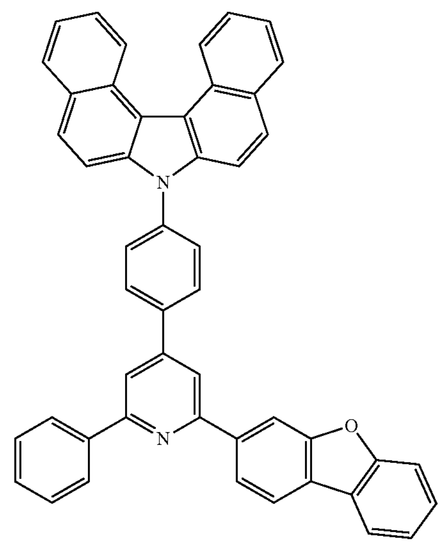
H2-637
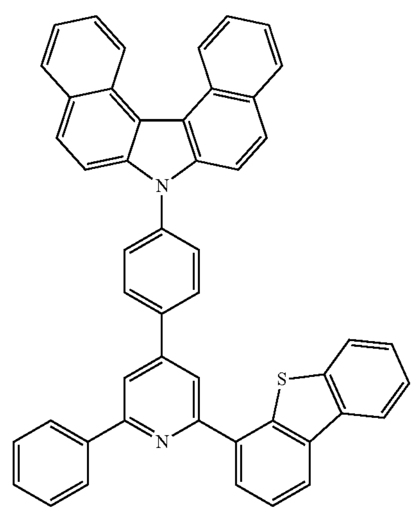

-continued
H2-638
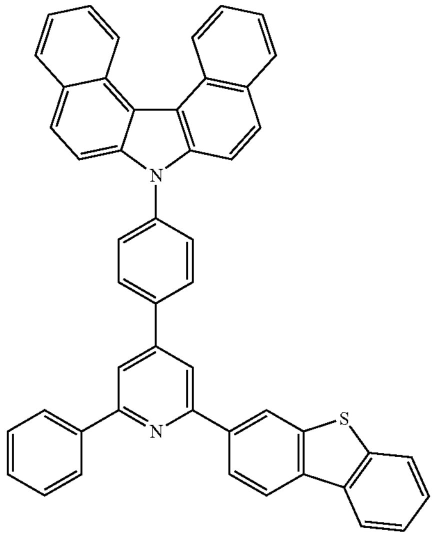
H2-639
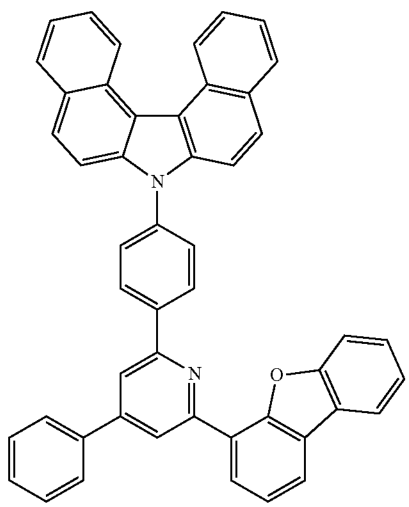
H2-640
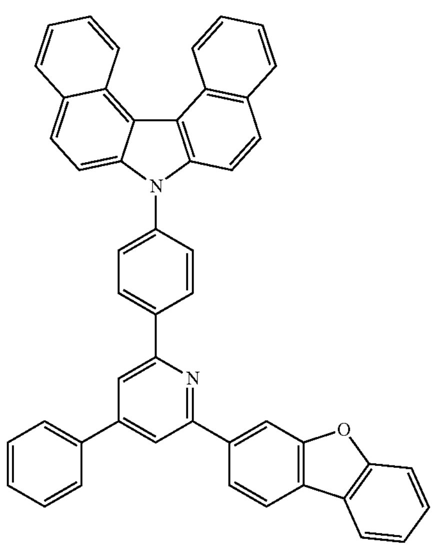
-continued
H2-641
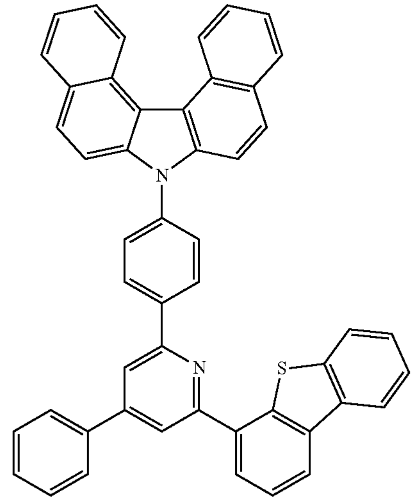
H2-642
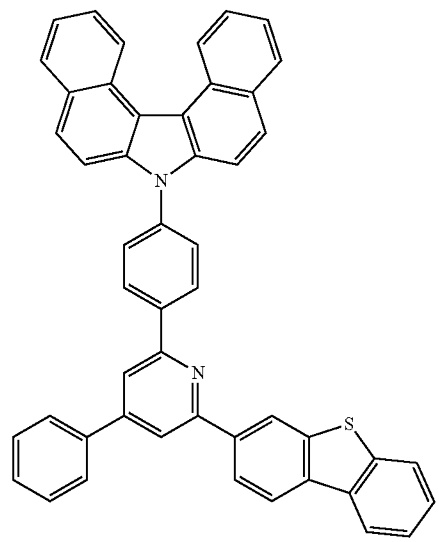
H2-643
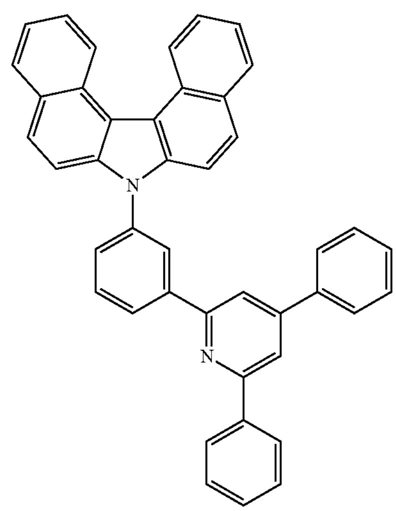

-continued
H2-644
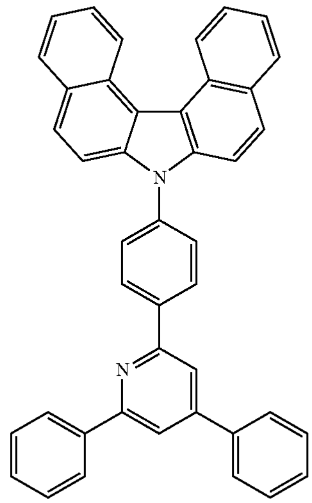
H2-645
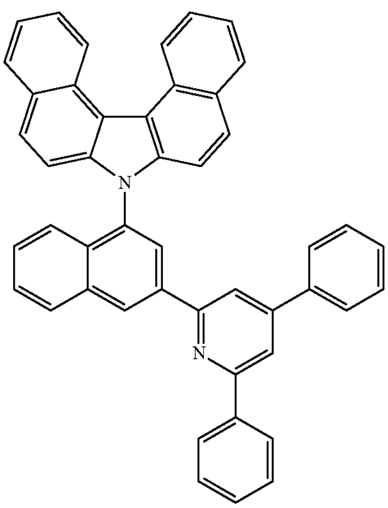
H2-646
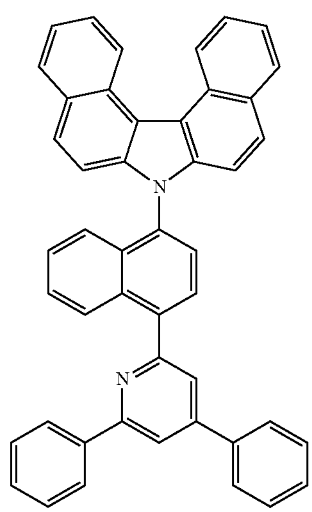
-continued
H2-647
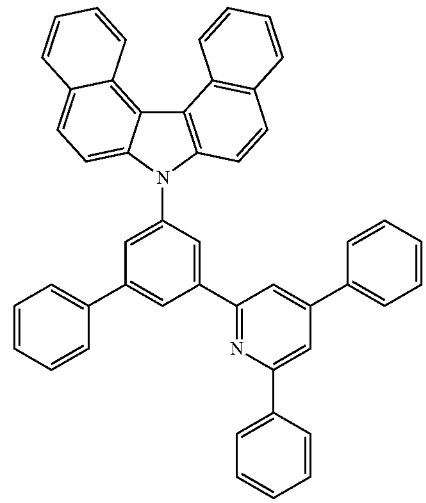
H2-648
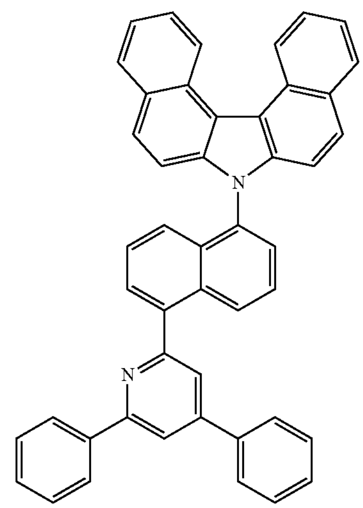
H2-649
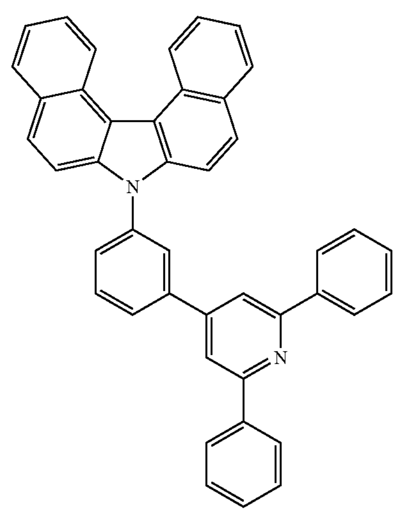

H2-650
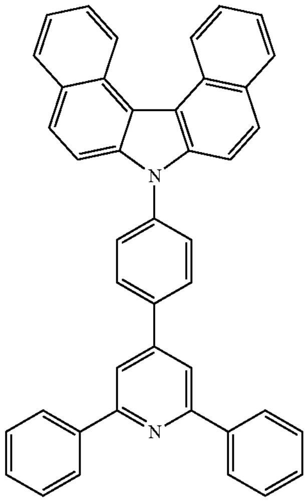
H2-651
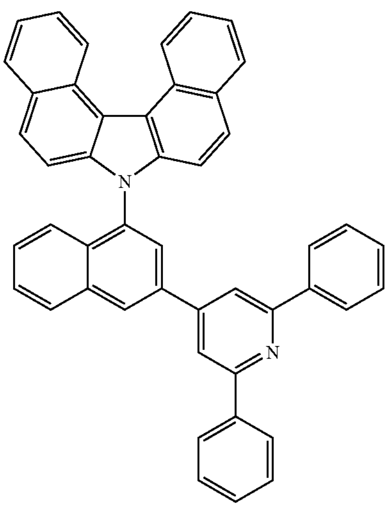
H2-652
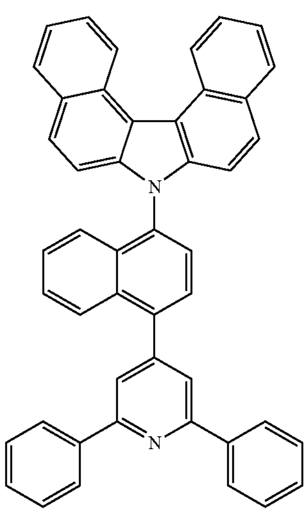
H2-653
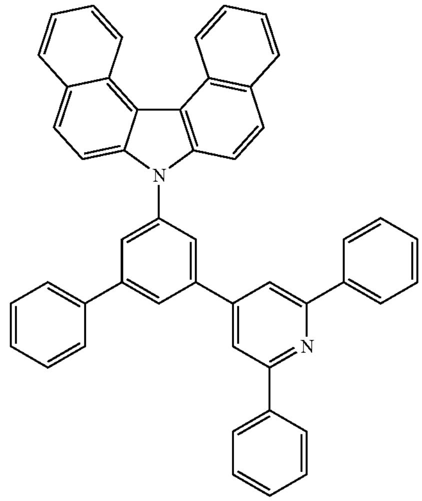
H2-654
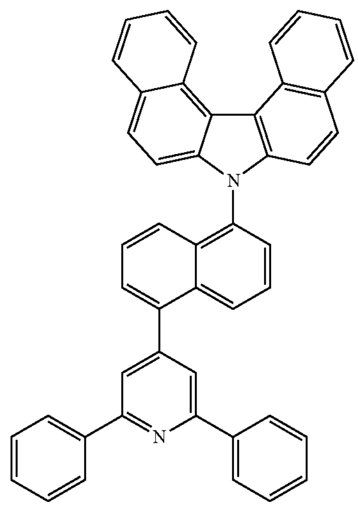
H2-655
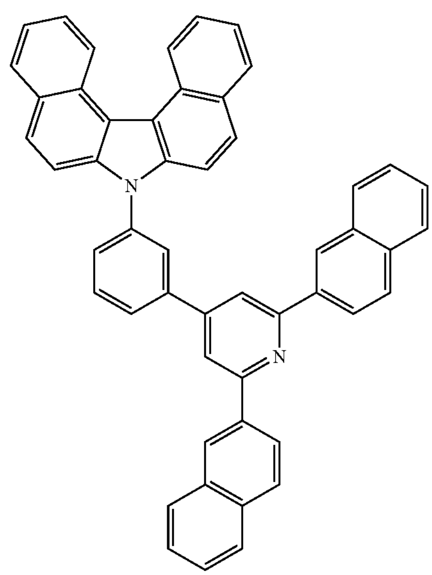

-continued
H2-656
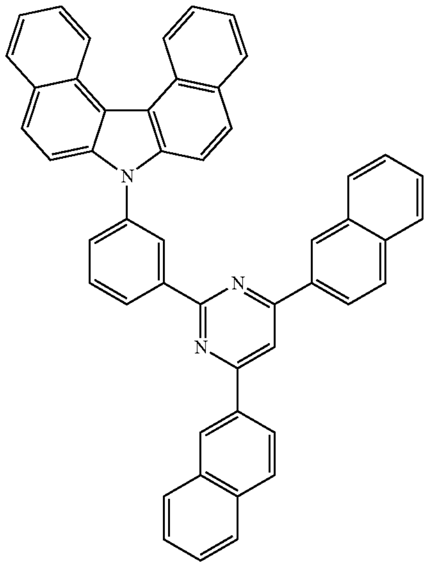
H2-657
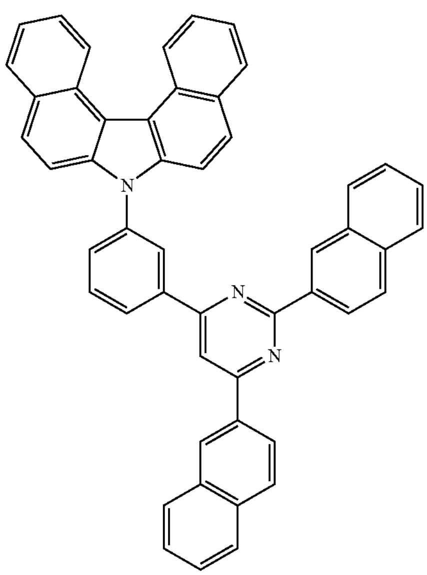
-continued
H2-658
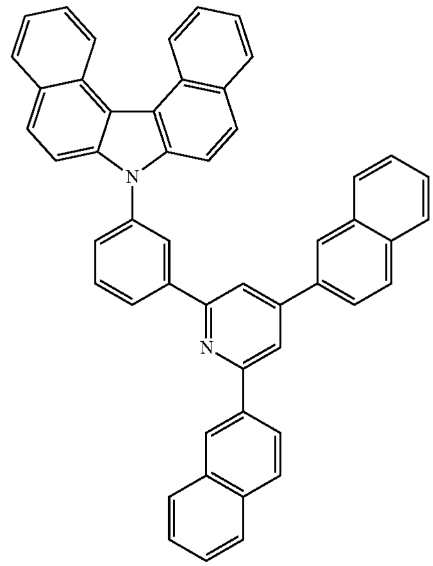
H2-659
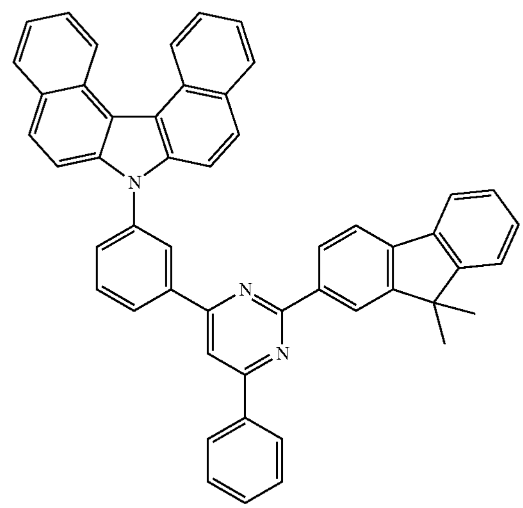
H2-660
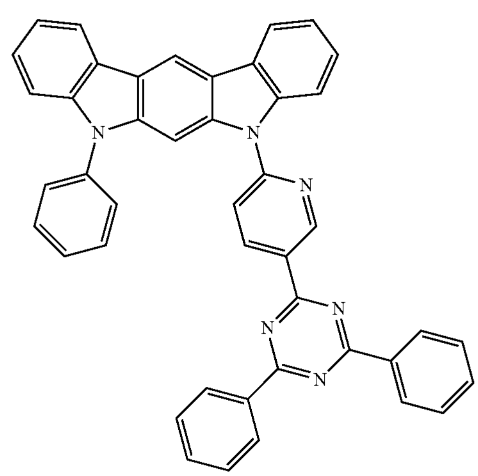

-continued
H2-661
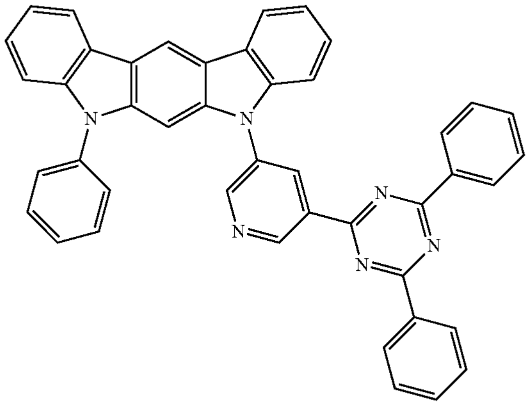
H2-662
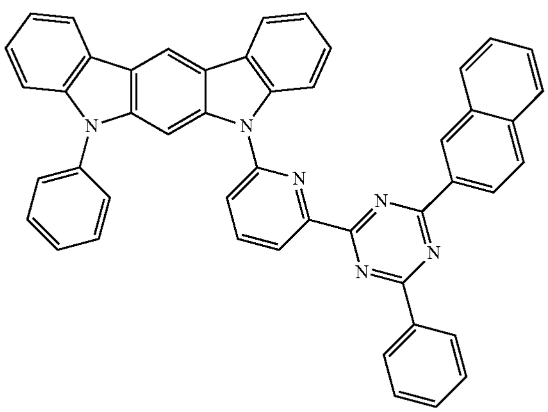
H2-663
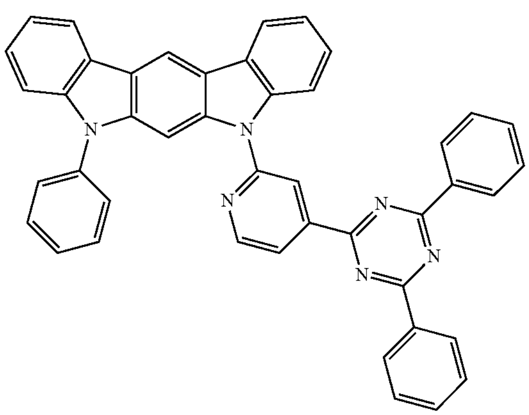
-continued
H2-664
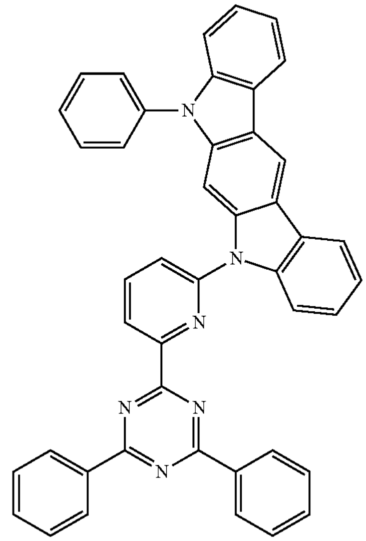
H2-665
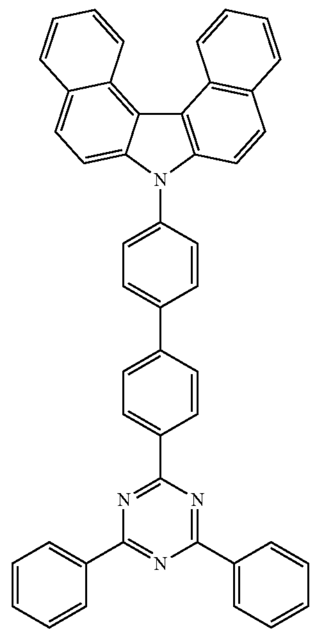
H2-666
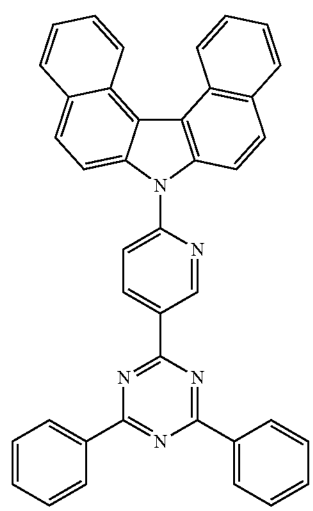

-continued

H2-667

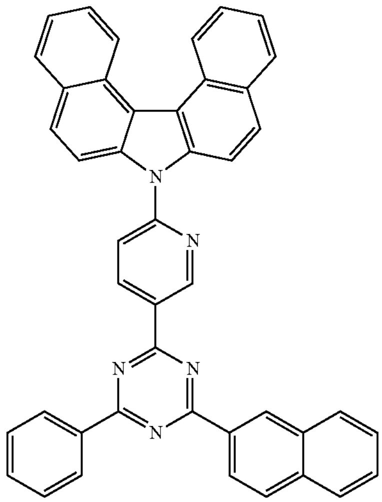

H2-668

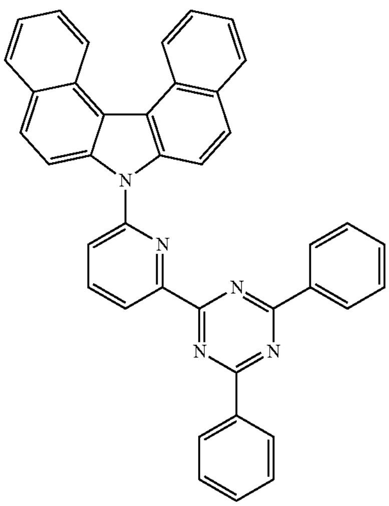

H2-669

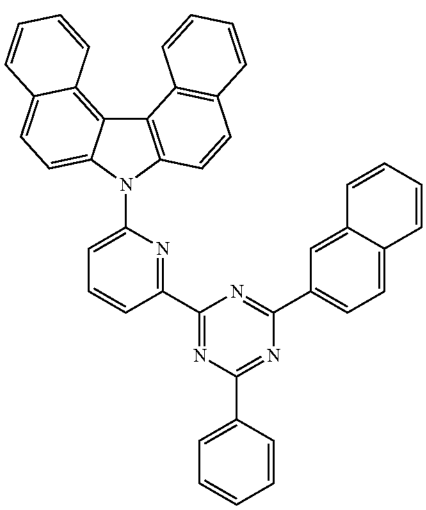

-continued

H2-670

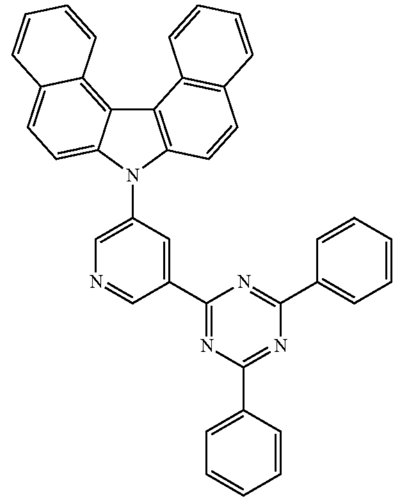

H2-671

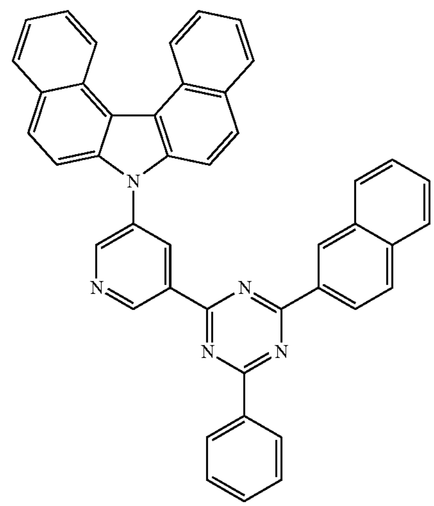

The organic EL device according to the present invention may comprise an anode, a cathode, and at least one organic layer between the two electrodes, wherein the organic layer comprises a light-emitting layer, the light-emitting layer comprises a host and a phosphorescent dopant; the host consists of multi-component host compounds; at least a first host compound of the multi-component host compounds is represented by formula 1 which is a specific bicarbazole derivative containing an aryl group, and a second host compound is represented by formula 2 which is a specific carbazole derivative including a nitrogen-containing heteroaryl group The light-emitting layer means a layer emitting light and may be a single layer or multi-layers consisting of two or more layers. The doping concentration of dopant compounds to host compounds in the light-emitting layer is preferably less than 20 wt %.

The dopants included in the organic EL device of the present invention are preferably one or more phosphorescent dopants. The phosphorescent dopant material applied to the organic electroluminescent device of the present invention is not specifically limited, but preferably may be selected from complex compounds of iridium (Ir), osmium (Os), copper (Cu), and platinum (Pt), more preferably ortho metallated complex compounds of iridium (Ir), osmium (Os), copper (Cu), and platinum (Pt), and even more preferably ortho metallated iridium complex compounds.

The phosphorescent dopants may be selected from the group consisting of the compounds represented by the following formulae 101 to 103:

(101)

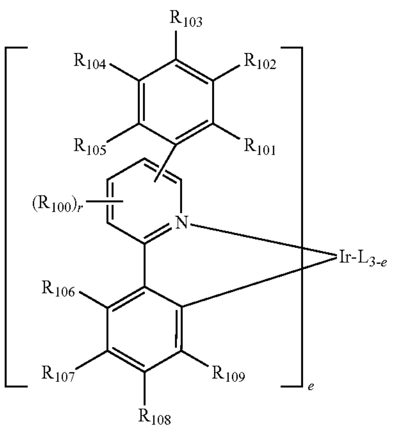

(102)

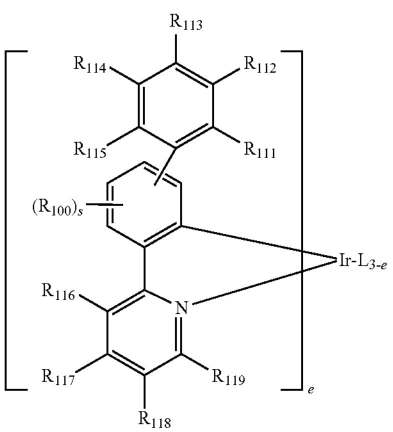

(103)

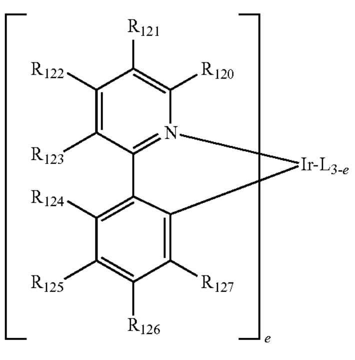

wherein

L is selected from the following structures:

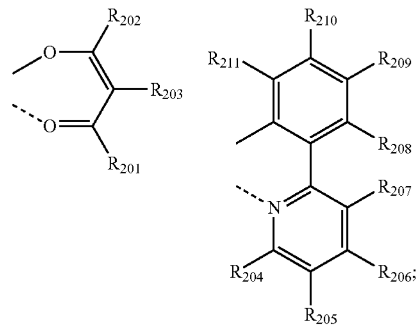

$R_{100}$ represents hydrogen, or a substituted or unsubstituted (C1-C30)alkyl group; $R_{101}$ to $R_{109}$ and $R_{111}$ to $R_{123}$ each independently represent hydrogen, deuterium, a halogen; a (C1-C30)alkyl group unsubstituted or substituted with halogen(s); a cyano group, a substituted or unsubstituted (C1-C30)alkoxy group, a substituted or unsubstituted (C6-C30)aryl group, or a substituted or unsubstituted (C3-C30)cycloalkyl group; $R_{120}$ to $R_{123}$ are linked to an adjacent substituent(s) to form a substituted or unsubstituted mono- or polycyclic, (C3-C30) alicyclic or aromatic ring, for example, quinoline; $R_{124}$ to $R_{127}$ each independently represent hydrogen, deuterium, a halogen, a substituted or unsubstituted (C1-C30)alkyl group, or a substituted or unsubstituted (C6-C30)aryl group; when $R_{124}$ to $R_{127}$ are aryl groups, they are linked to an adjacent substituent(s) to form a substituted or unsubstituted mono- or polycyclic, (C3-C30) alicyclic or aromatic ring, or a heteroaromatic ring, for example, fluorene, dibenzothiophene, or dibenzofuran; $R_{201}$ to $R_{211}$ each independently represent hydrogen, deuterium, a halogen, a (C1-C30)alkyl group unsubstituted or substituted with halogen(s), or a substituted or unsubstituted (C6-C30)aryl group; $R_{208}$ to $R_{211}$ may be linked to an adjacent substituent(s) to form a substituted or unsubstituted mono- or polycyclic, (C3-C30) alicyclic or aromatic ring, or a heteroaromatic ring, for example, fluorene, dibenzothiophene, or dibenzofuran; r and s each independently represent an integer of 1 to 3; where r or s is an integer of 2 or more, each of $R_{100}$ may be the same or different; and e represents an integer of 1 to 3.

The phosphorescent dopant material includes the following:

D-1

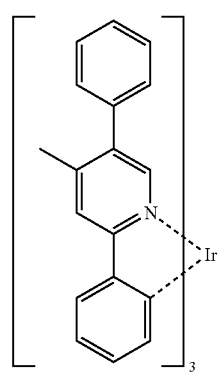

-continued
D-2
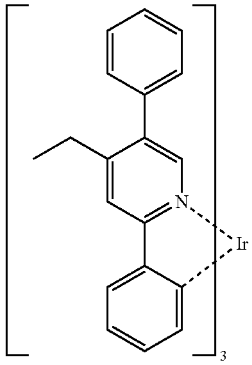
D-3
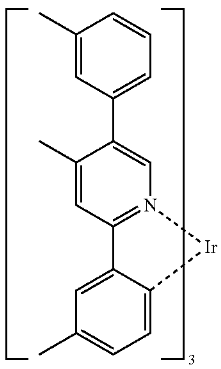
D-4
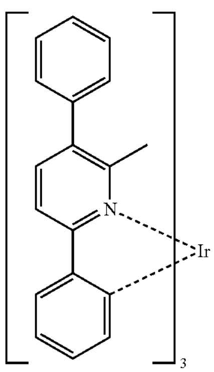
D-5
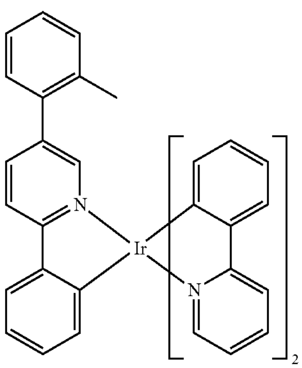
-continued
D-6
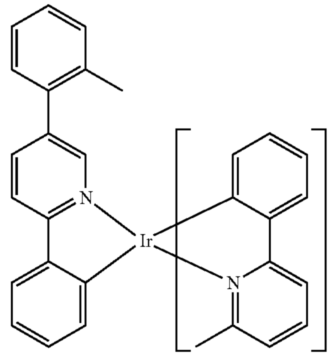
D-7
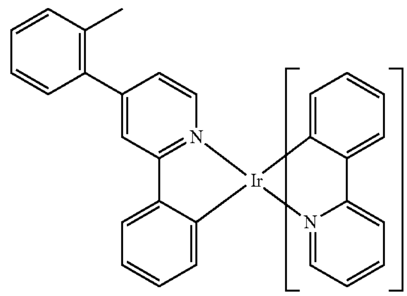
D-8
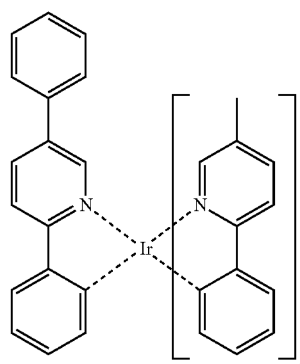
D-9
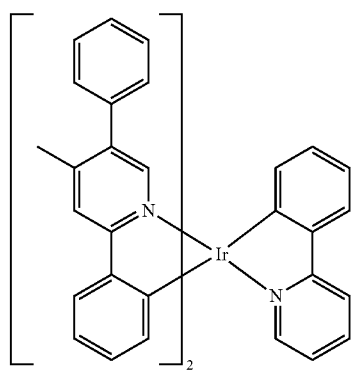

-continued
D-10
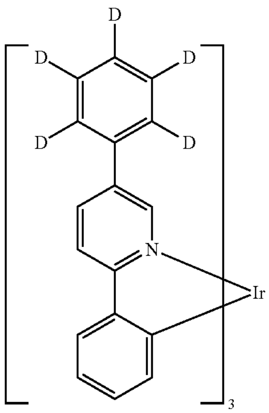
D-11
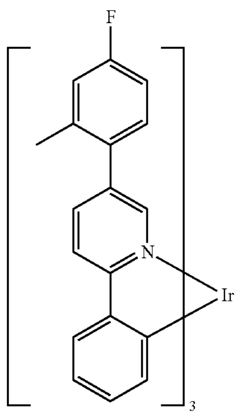
D-12
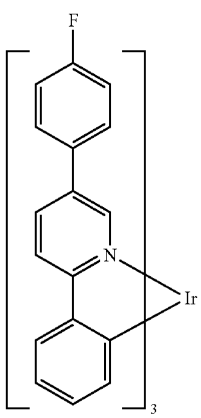
D-13
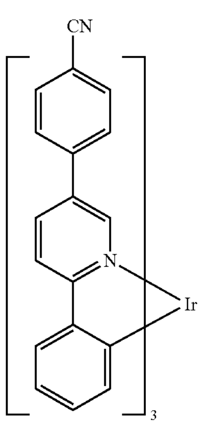
-continued
D-14
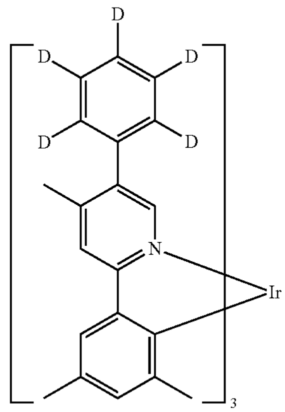
D-15
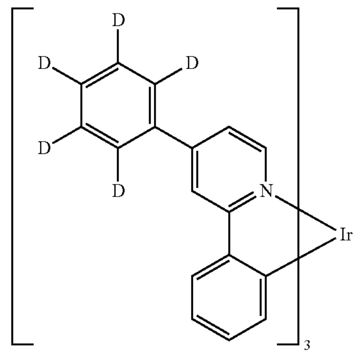
D-16
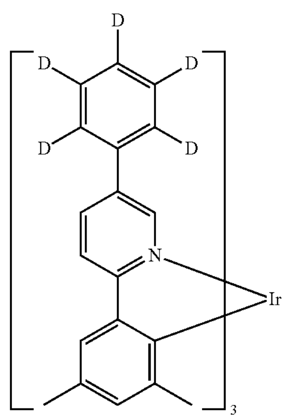
D-17
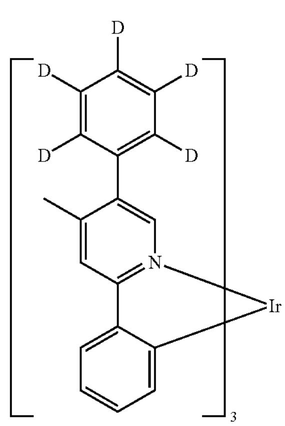

-continued
D-18
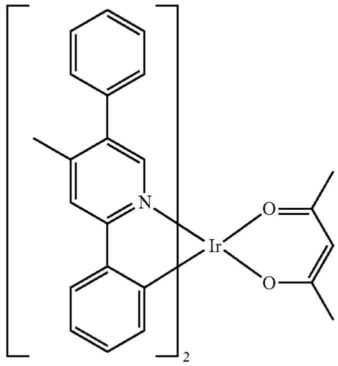
D-19
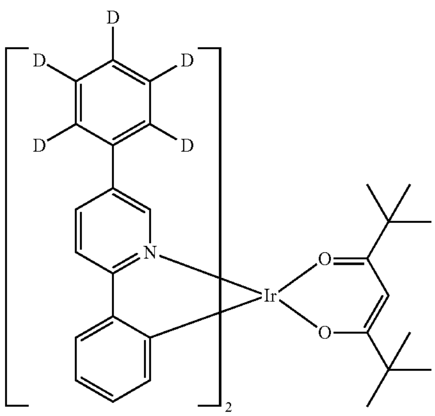
D-20
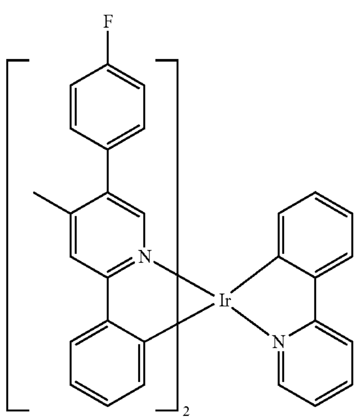
D-21
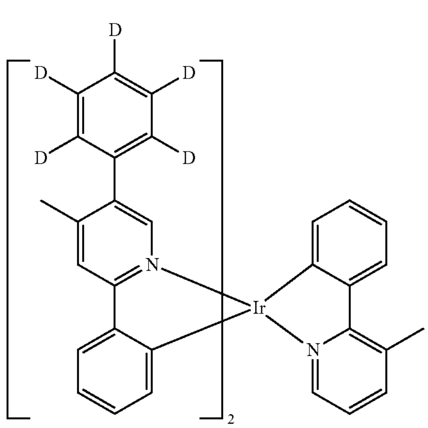
-continued
D-22
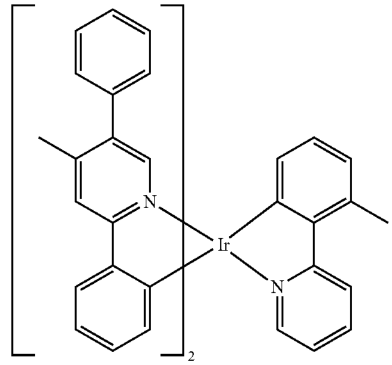
D-23
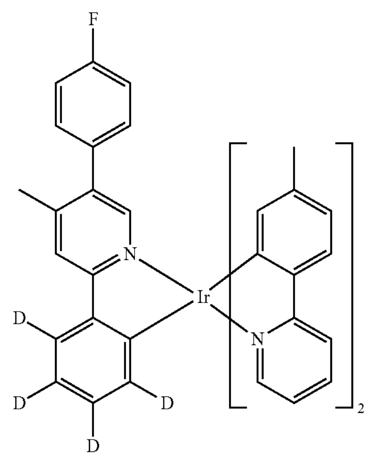
D-24
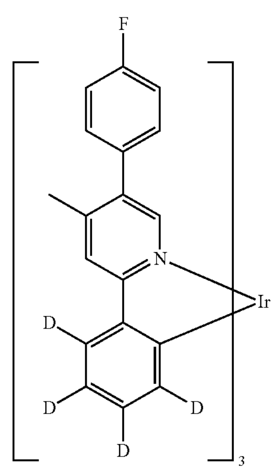
D-25
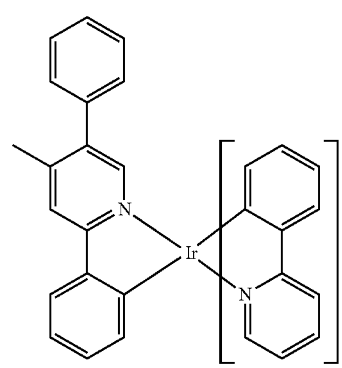

-continued
D-26
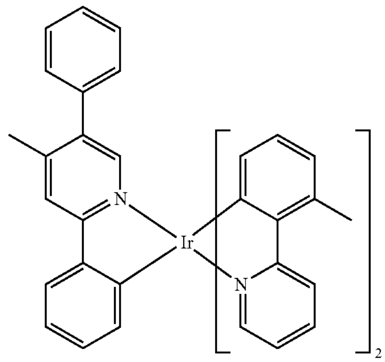
D-27
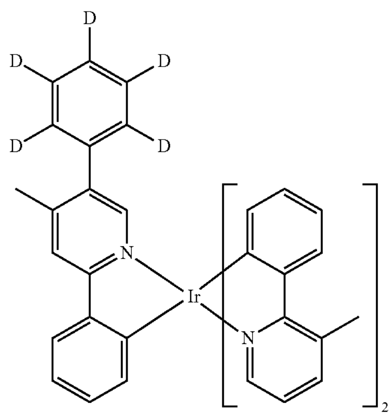
D-28
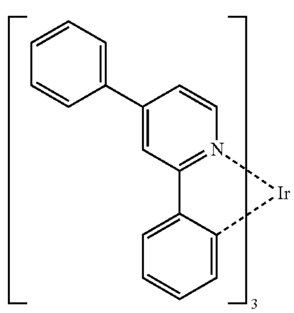
D-29
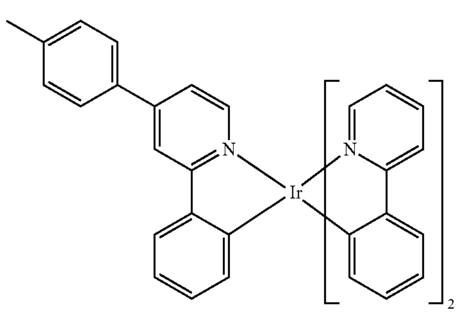
-continued
D-30
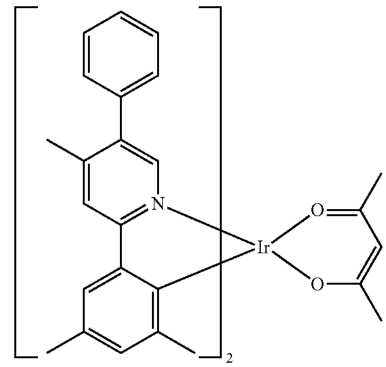
D-31
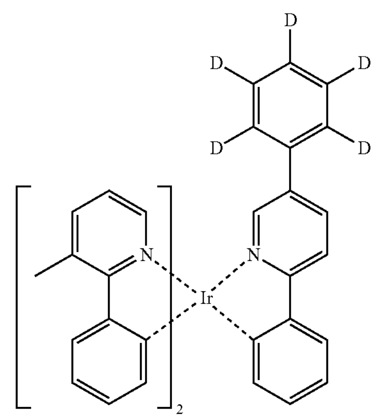
D-32
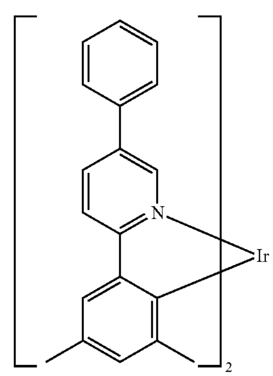
D-33
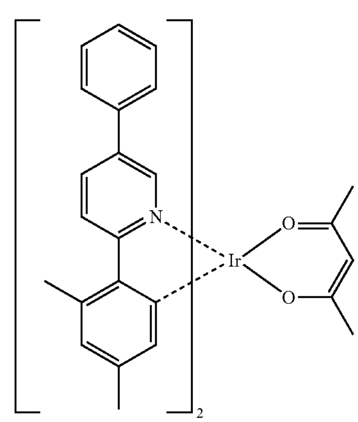

D-34
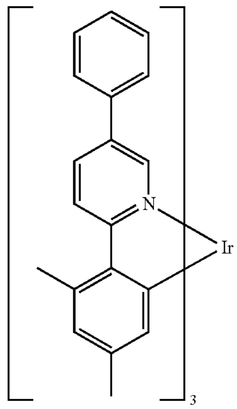
D-35
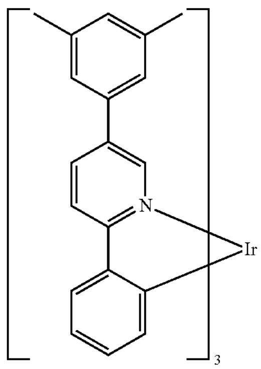
D-36
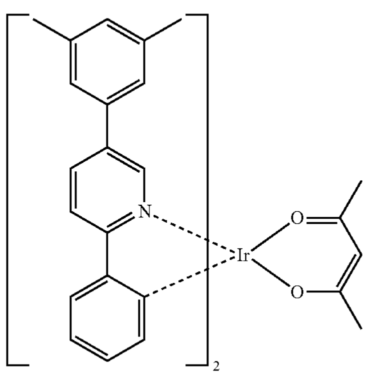
D-37
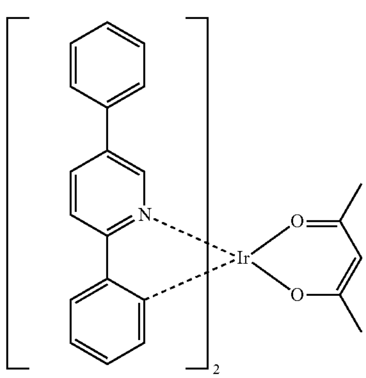
D-38
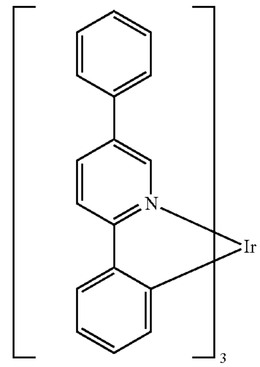
D-39
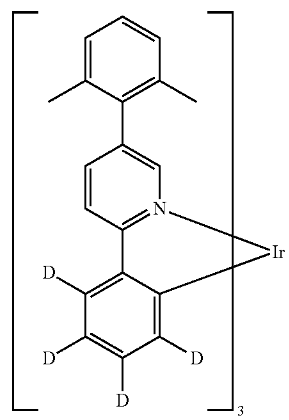
D-40
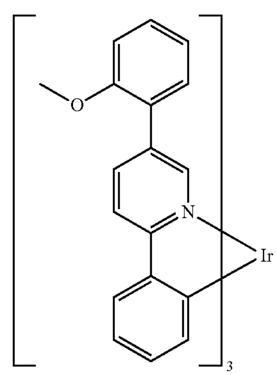
D-41
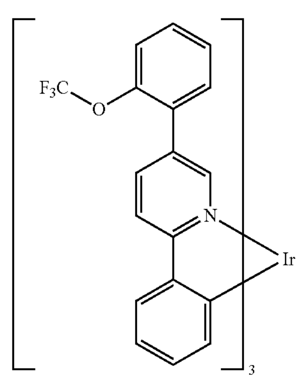

-continued
D-42
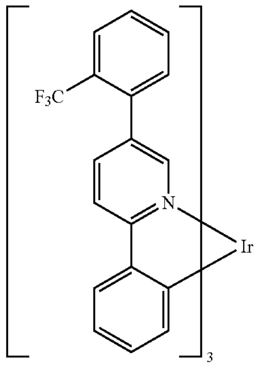
D-43
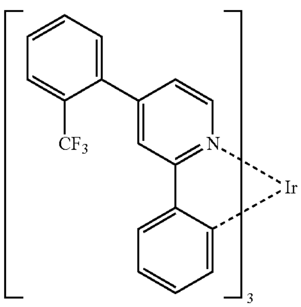
D-44
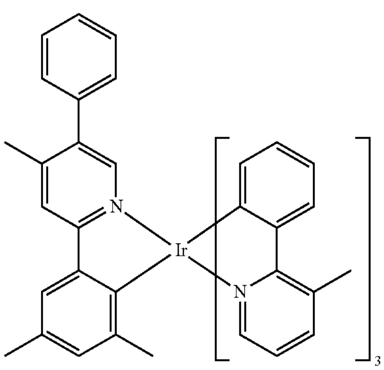
D-45
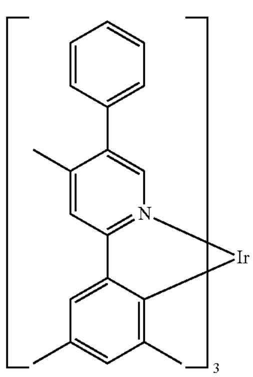
-continued
D-46
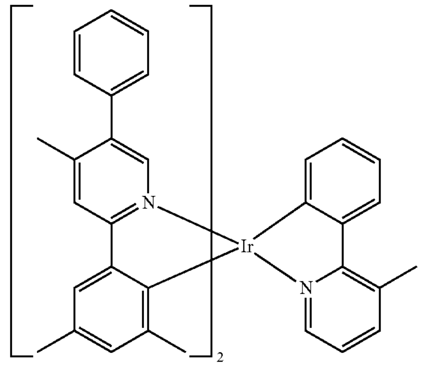
D-47
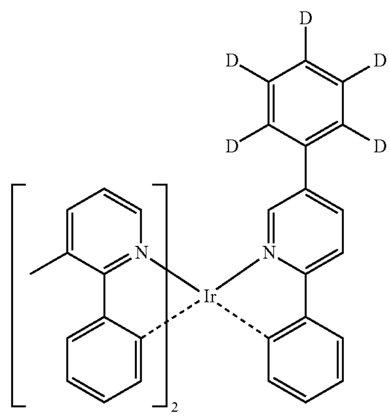
D-48
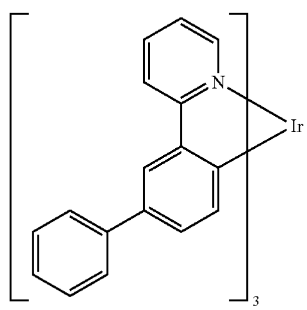
D-49
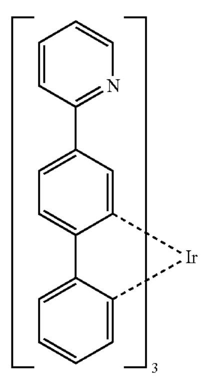

-continued
D-50
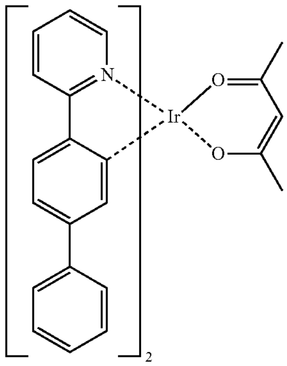
D-51
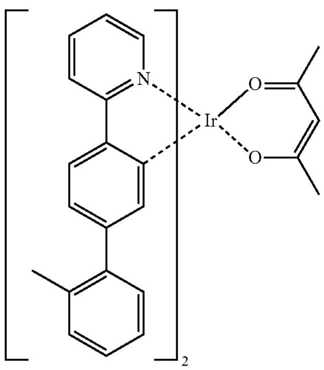
D-52
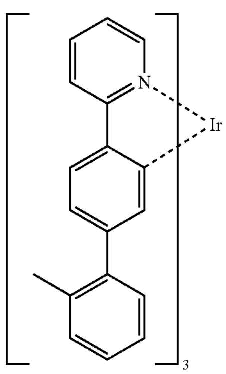
D-53
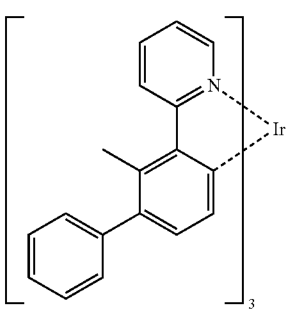
-continued
D-54
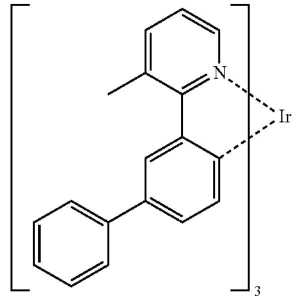
D-55
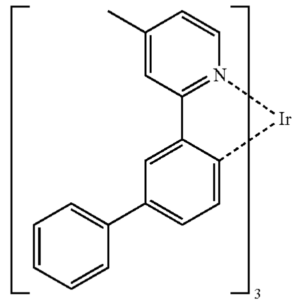
D-56
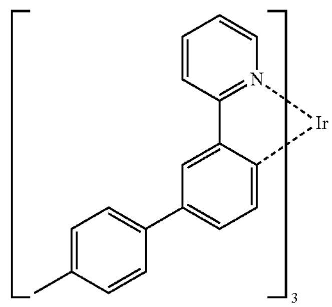
D-57
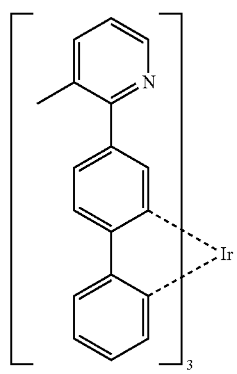
D-58
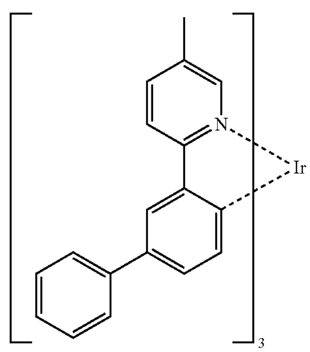

-continued
D-59
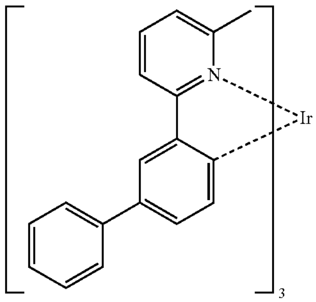
D-60
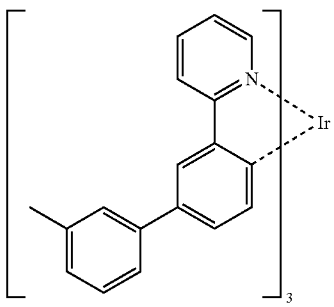
D-61
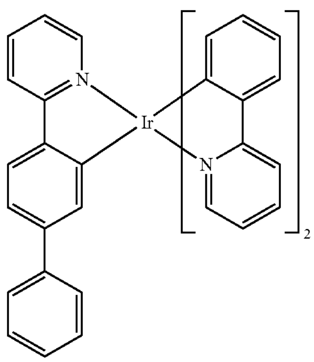
D-62
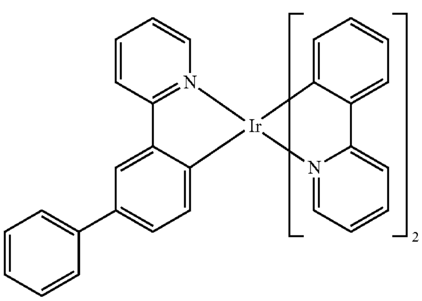
D-63
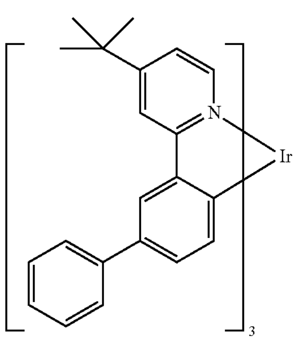
-continued
D-64
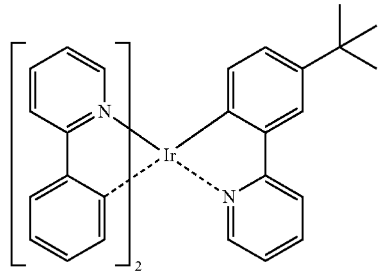
D-65
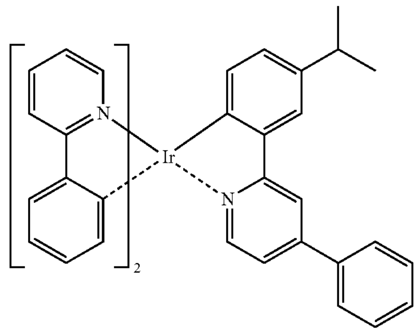
D-66
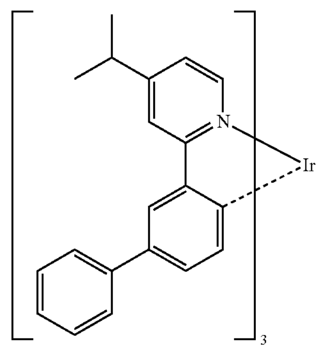
D-67
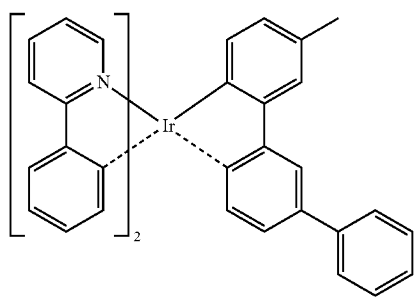
D-68
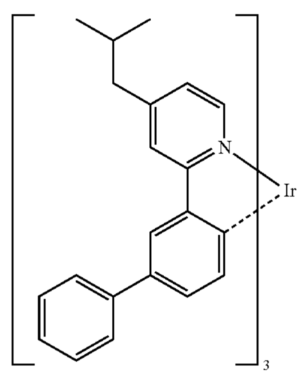

-continued
D-69
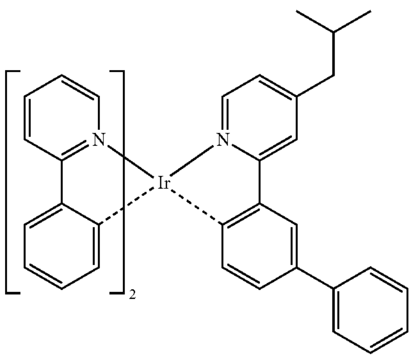
D-70
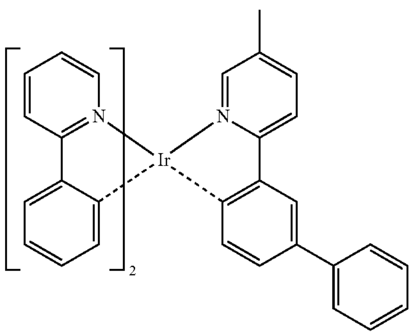
D-71
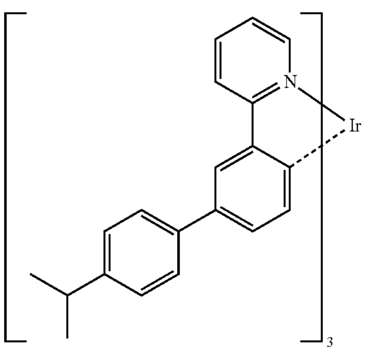
D-72
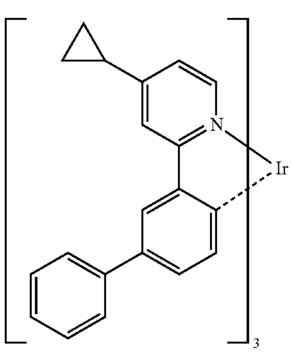
-continued
D-73
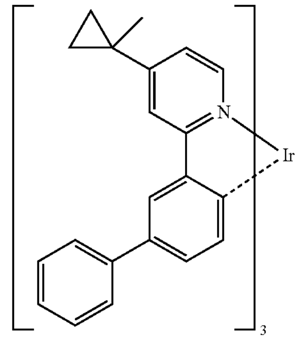
D-74
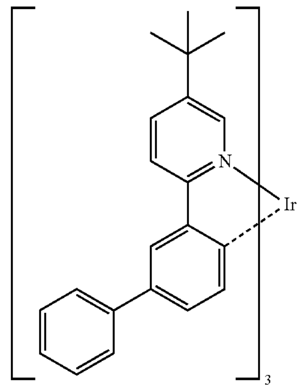
D-75
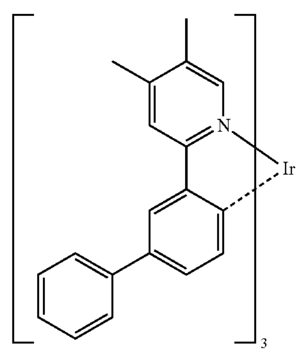
D-76
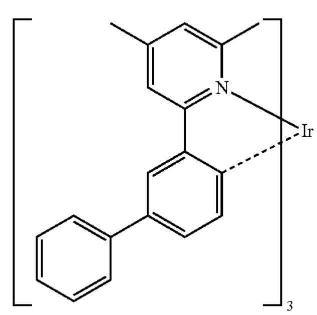

-continued
D-77
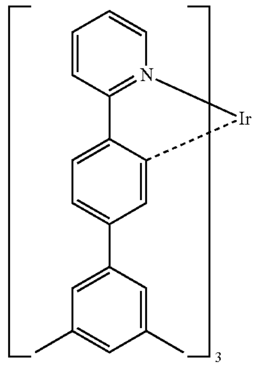
D-78
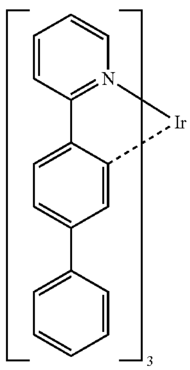
D-79
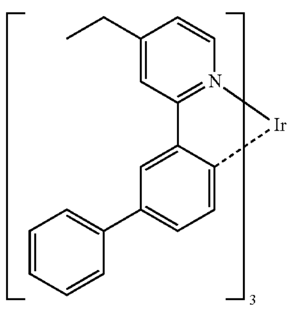
D-80
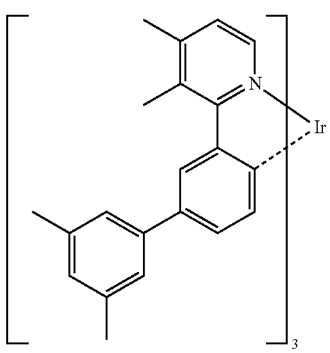
-continued
D-81
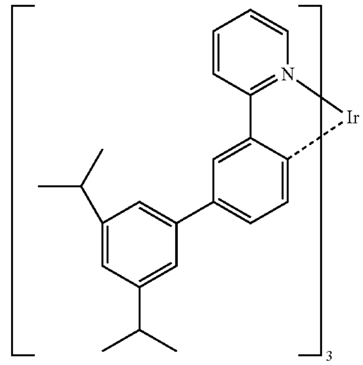
D-82
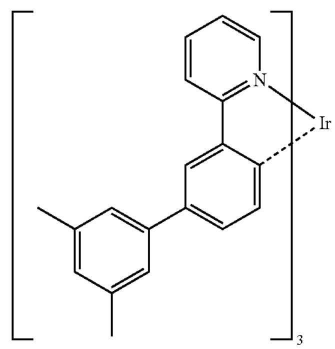
D-83
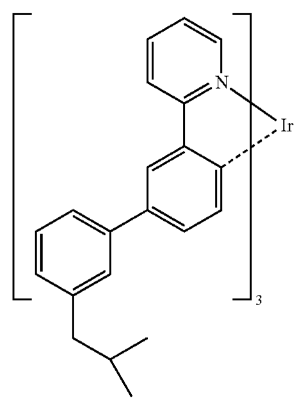
D-84
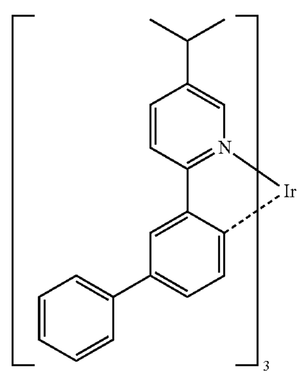

-continued
D-85
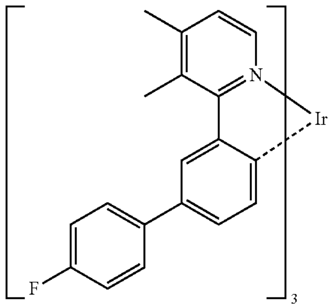
D-86
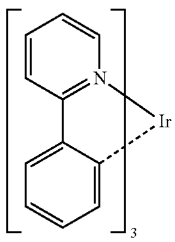
D-87
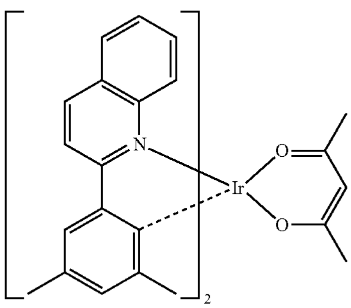
D-88
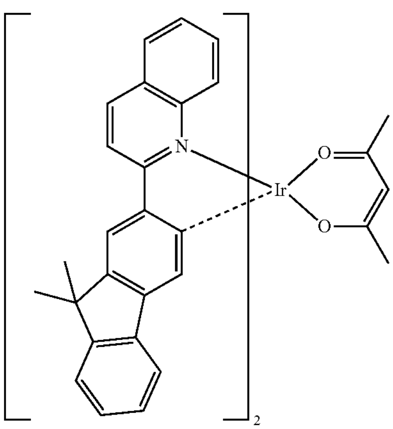
D-89
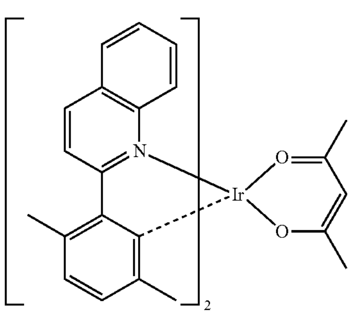
-continued
D-90
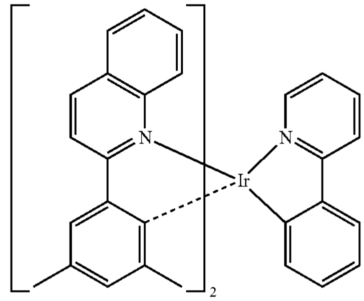
D-91
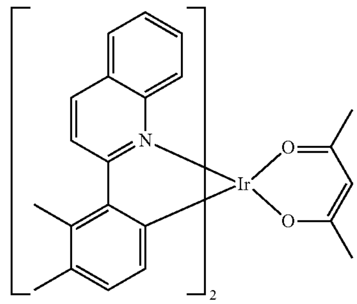
D-92
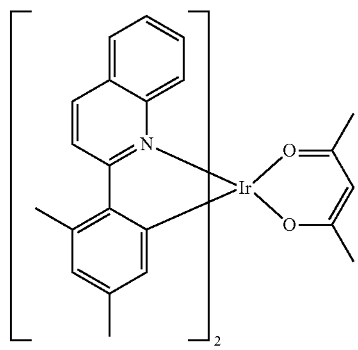
D-93
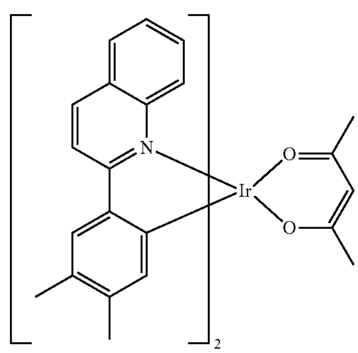

D-94
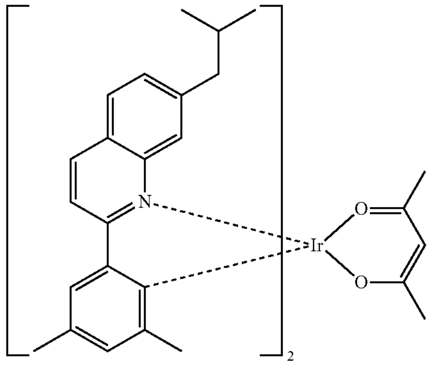
D-95
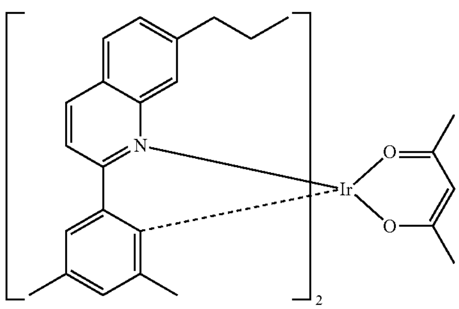
D-96
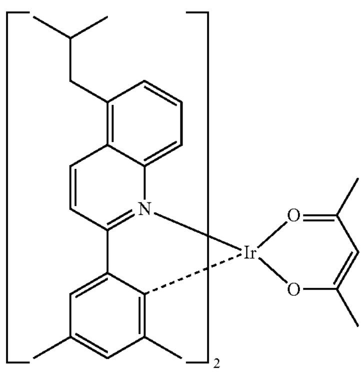
D-97
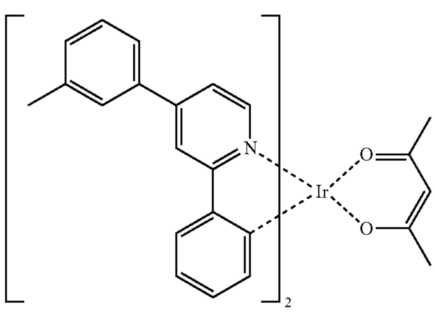
D-98
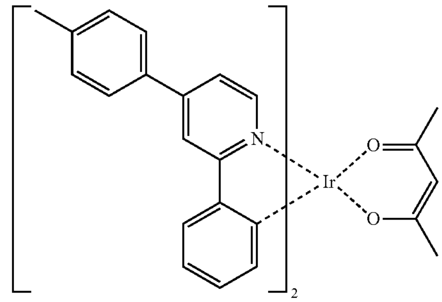
D-99
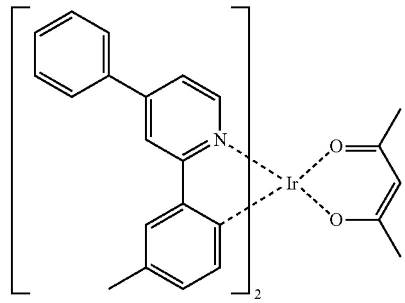
D-100
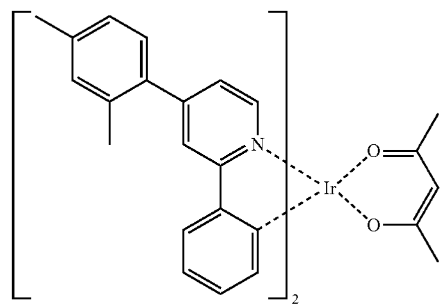
D-101
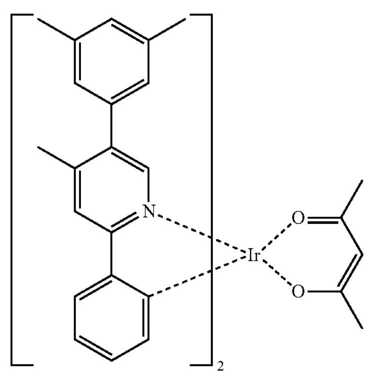
D-102
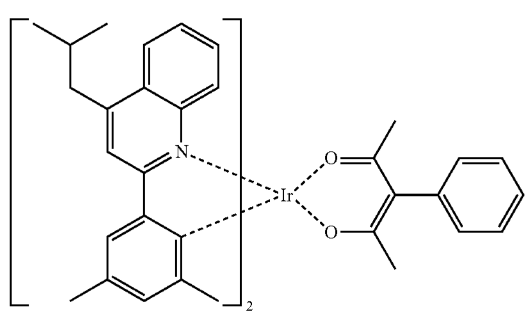

D-103
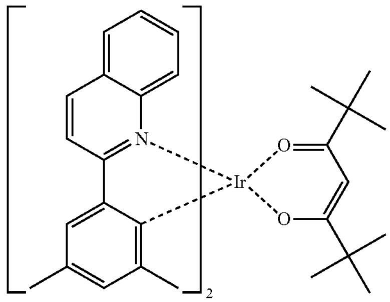
D-104
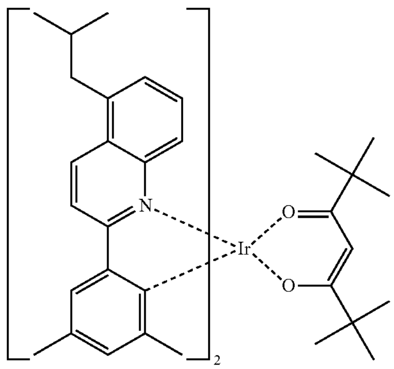
D-105
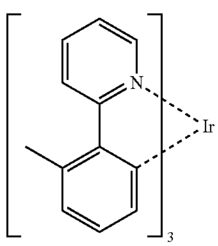
D-106
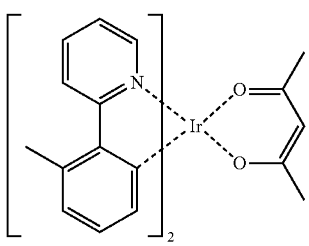
D-107
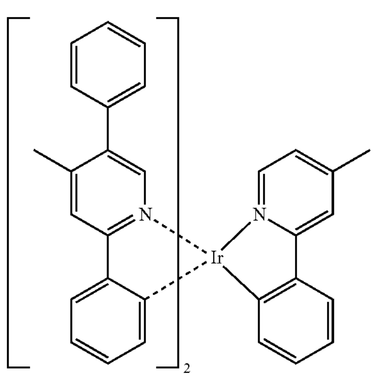
D-108
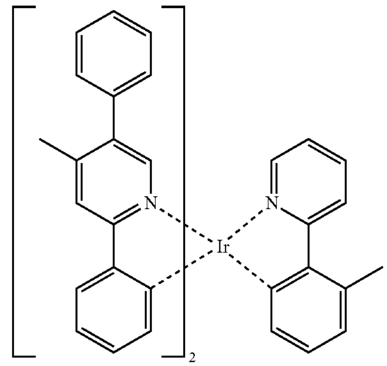
D-109
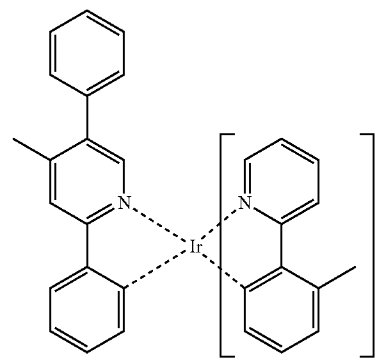
D-110
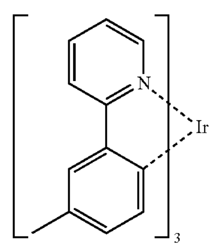
D-111
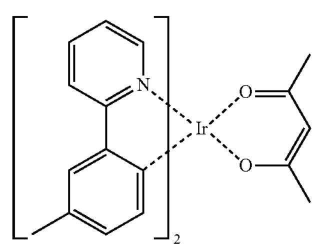
D-112
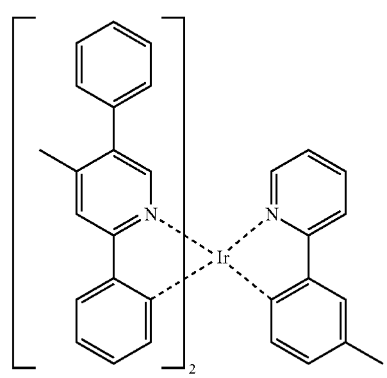

-continued
D-113
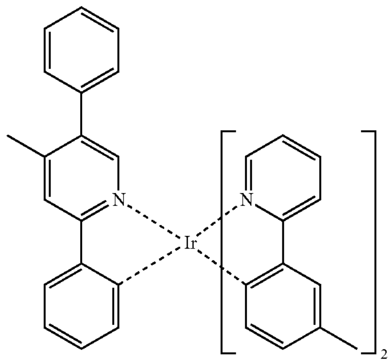
D-114
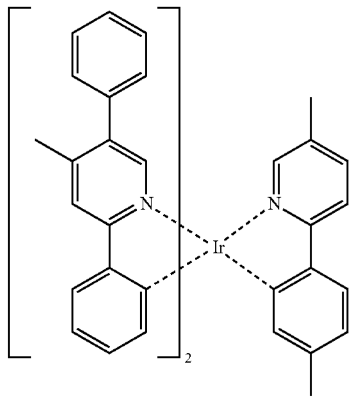
D-115
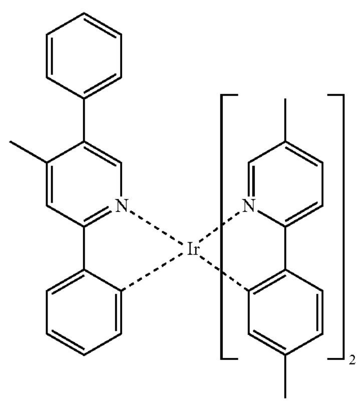
D-116
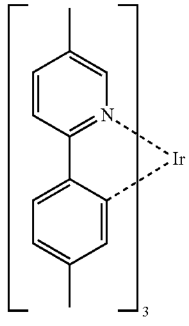
-continued
D-117
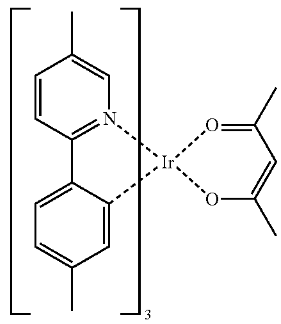
D-118
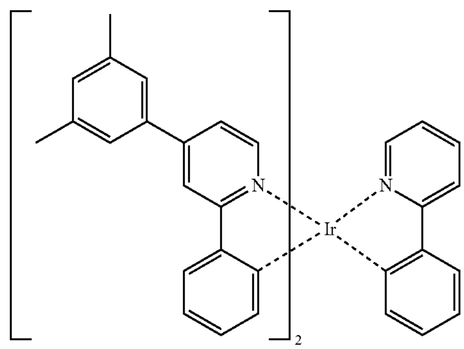
D-119
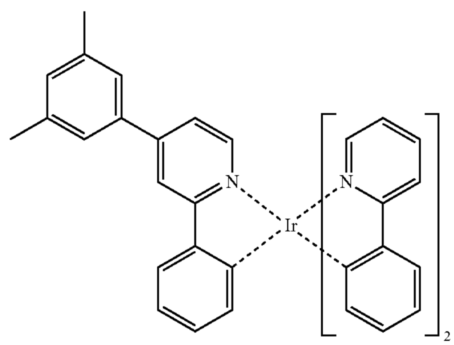
D-120
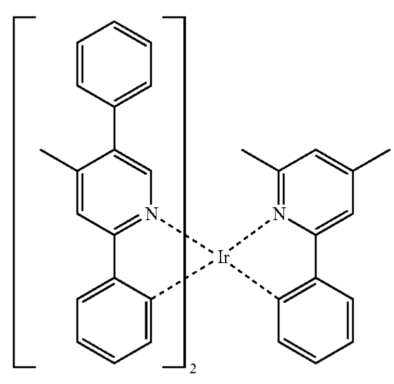

D-121
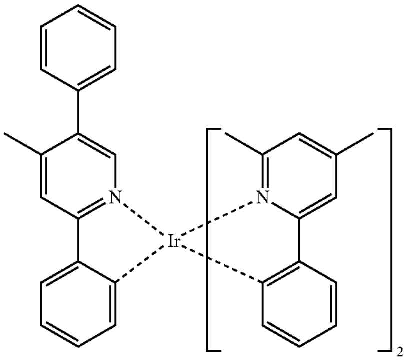
D-122
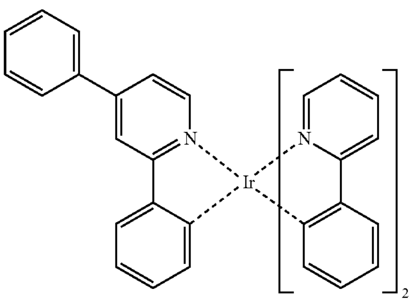
D-123
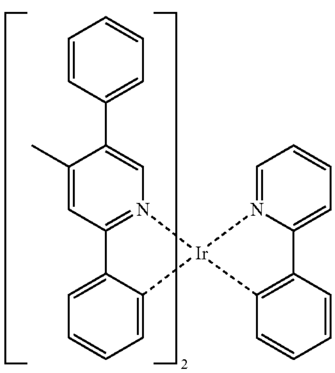
D-124
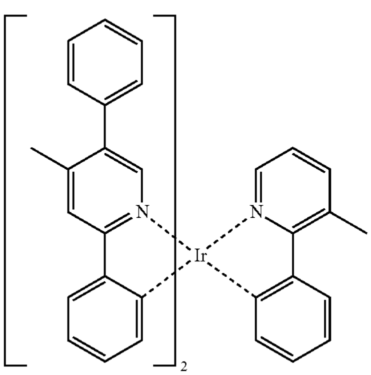
D-125
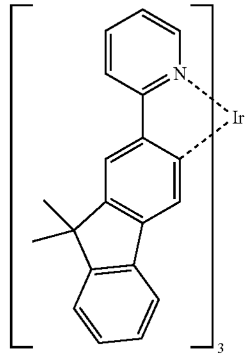
D-126
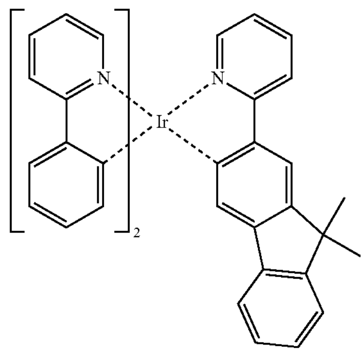
D-127
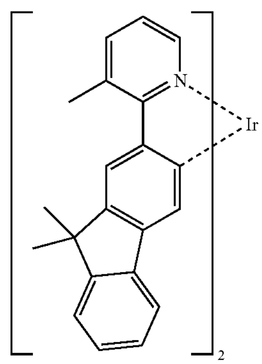
D-128
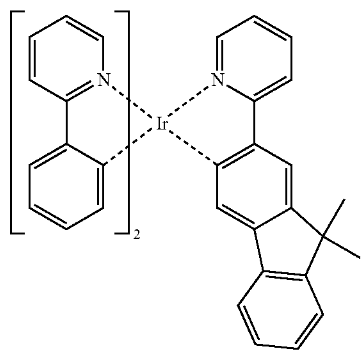

D-129
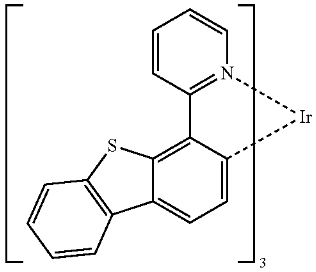
D-130
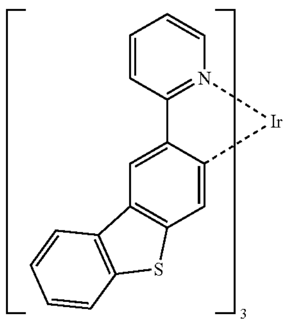
D-131
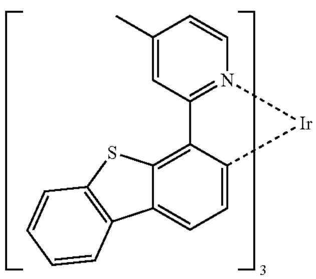
D-132
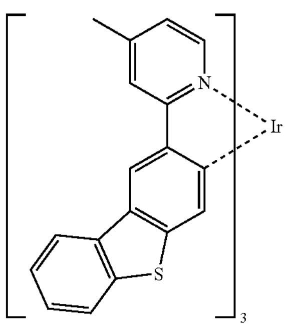
D-133
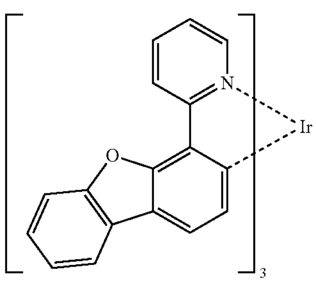
D-134
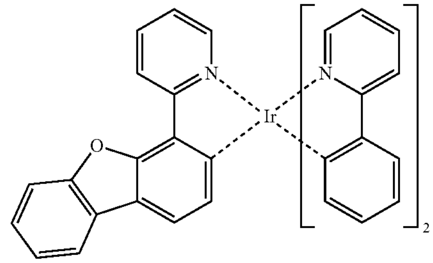
D-135
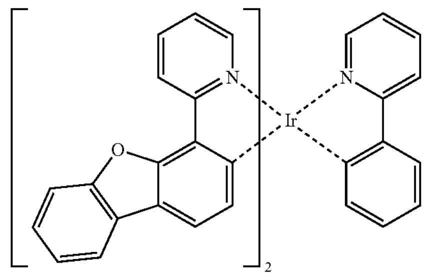
D-136
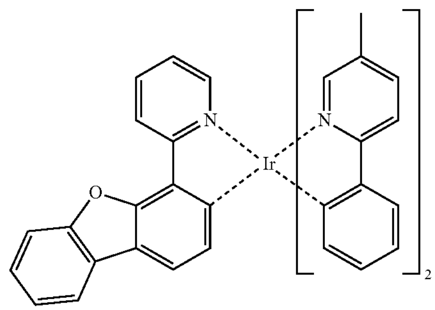
D-137
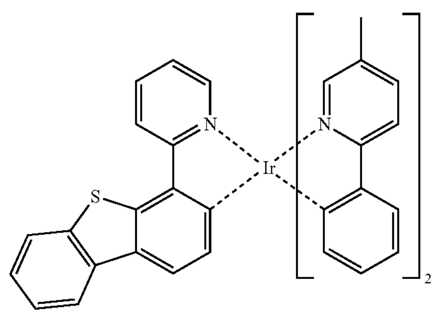
D-138
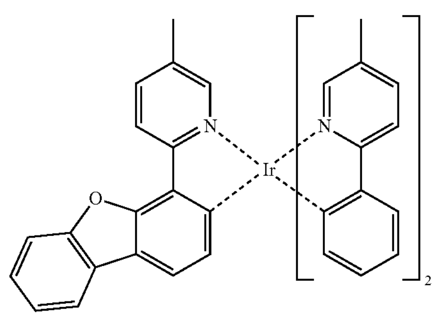

-continued
D-139
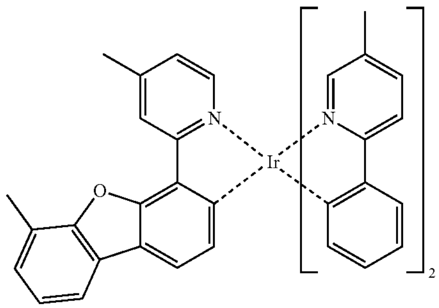
D-140
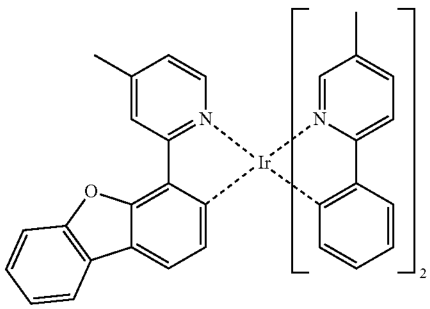
D-141
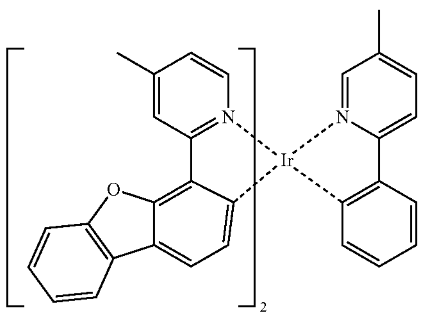
D-142
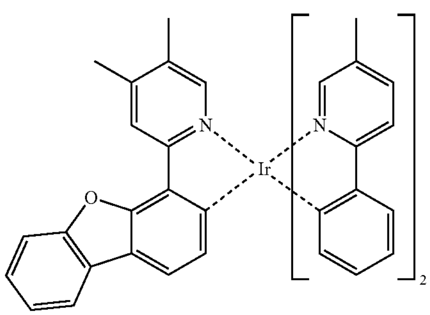
D-143
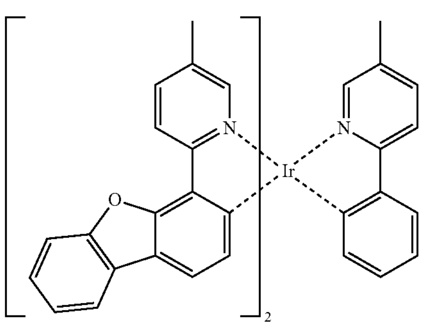
-continued
D-144
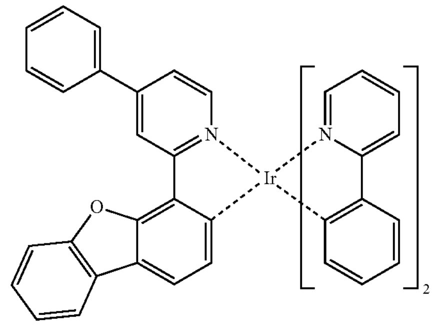
D-145
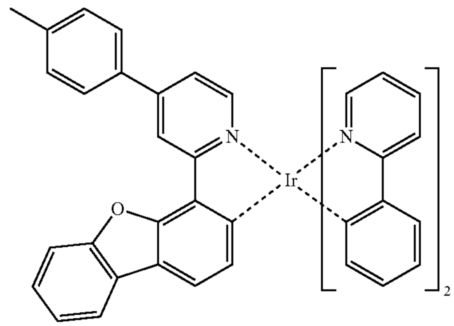
D-146
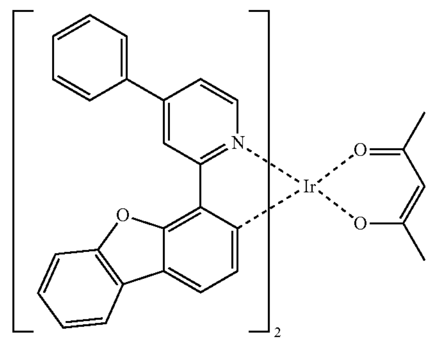
D-147
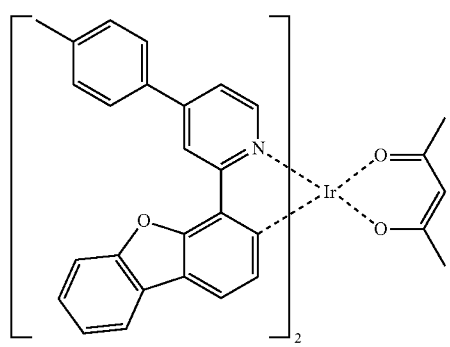

D-148
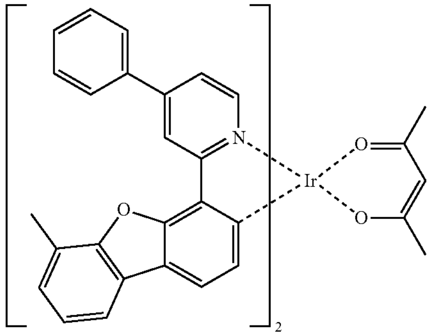
D-149
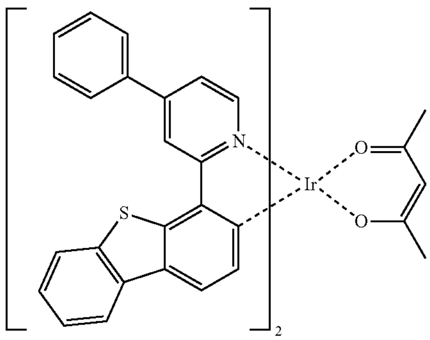
D-150
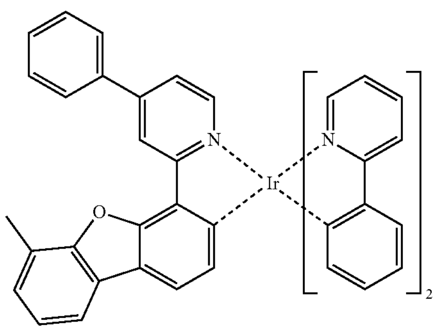
D-151
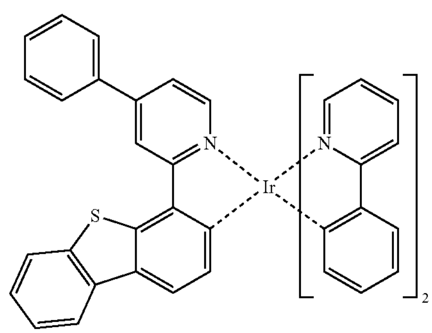
D-152
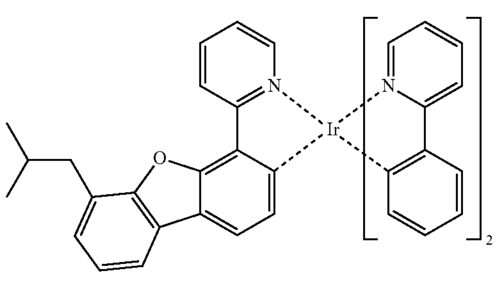
D-153
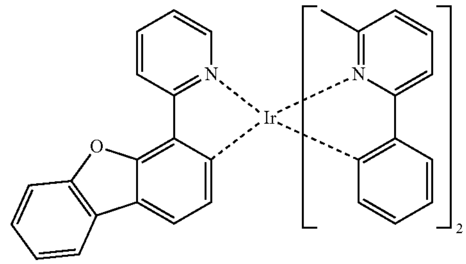
D-154
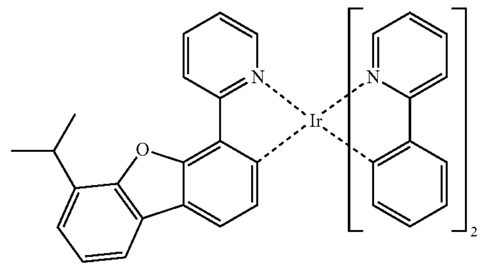
D-155
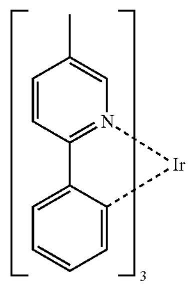
D-156
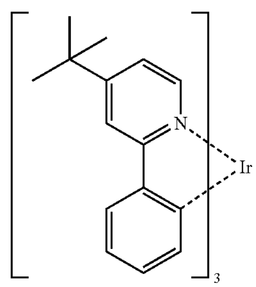
D-157
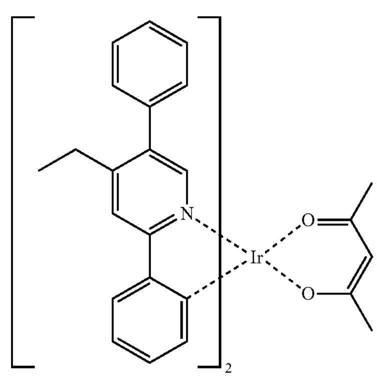

-continued
D-158
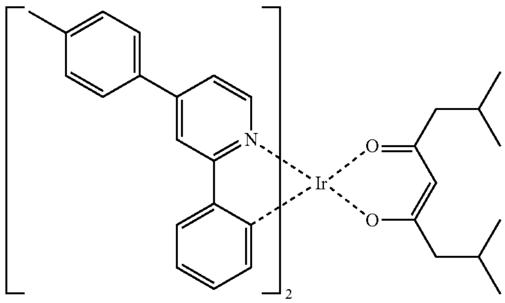
D-159
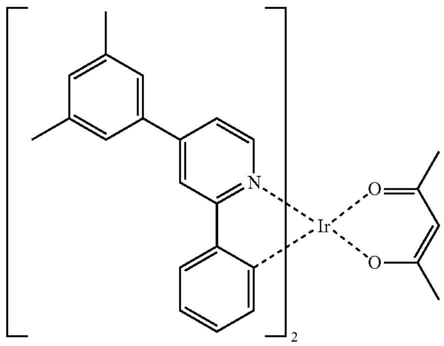
D-160
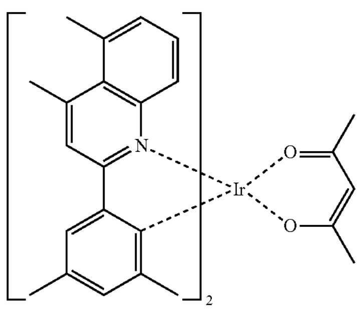
D-161
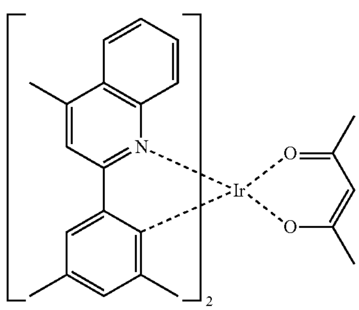
D-162
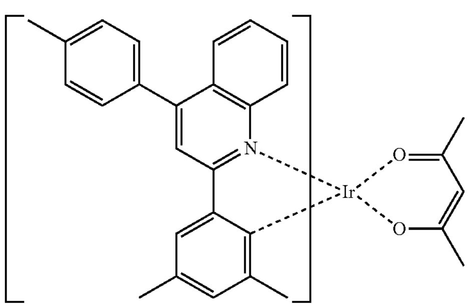
-continued
D-163
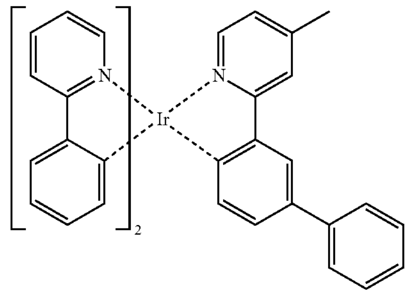
D-164
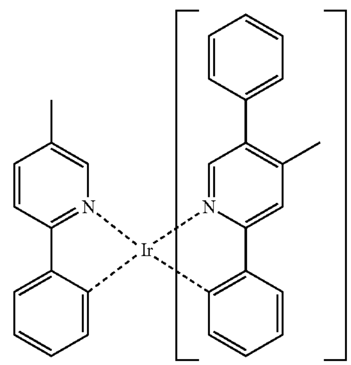
D-165
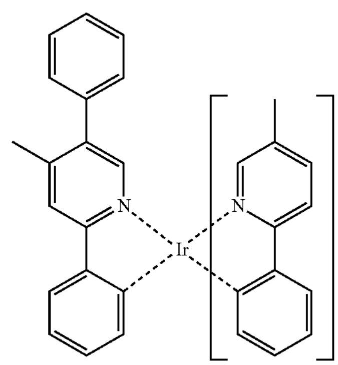
D-166
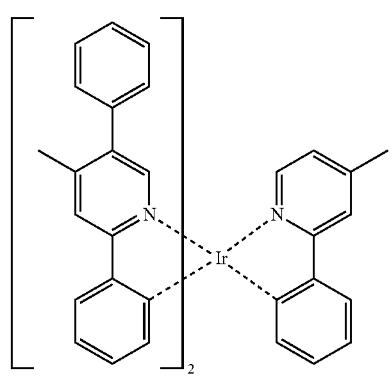

-continued
D-167
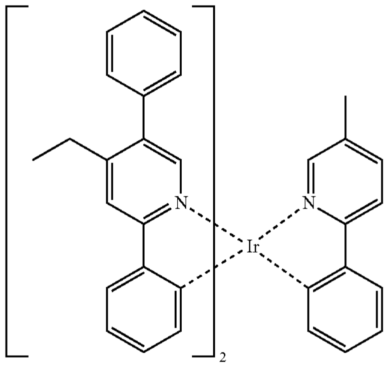
D-168
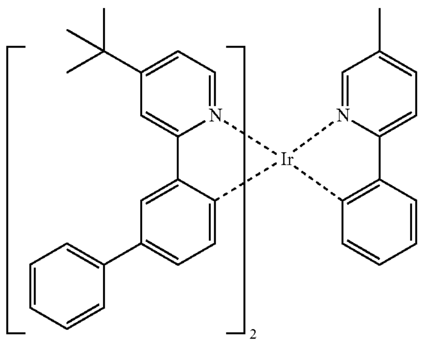
D-169
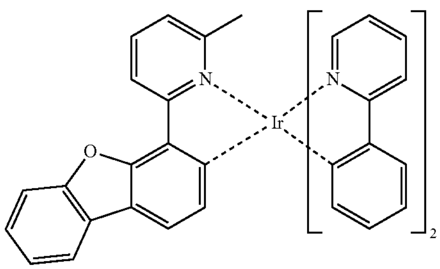
D-170
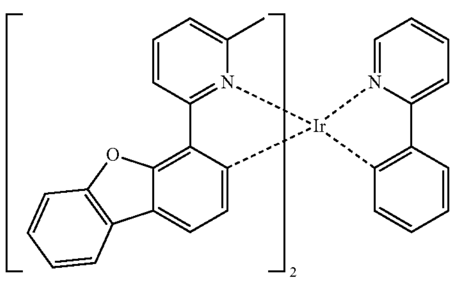
D-171
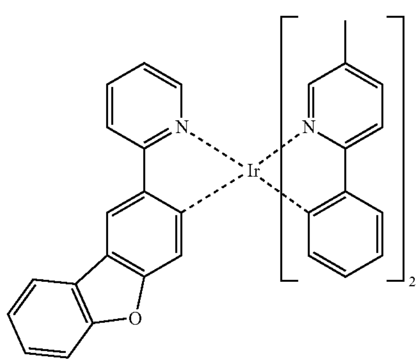
-continued
D-172
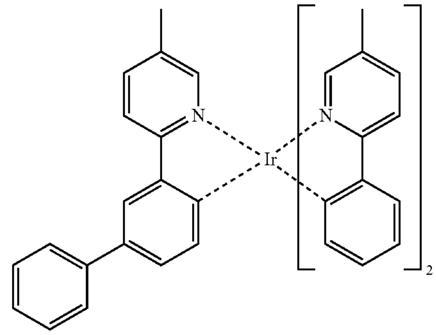
D-173
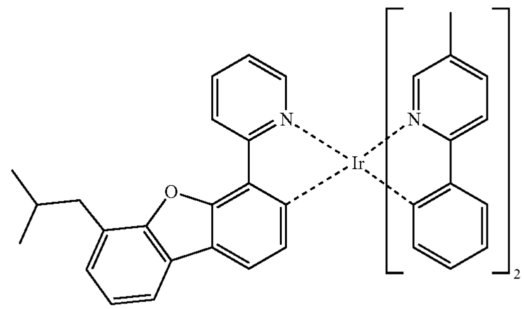
D-174
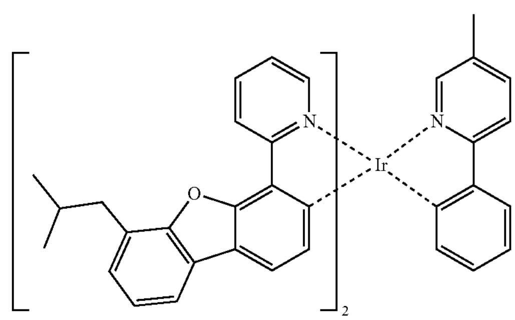
D-175
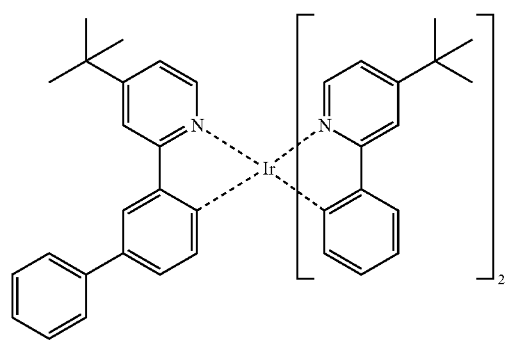

-continued
D-176
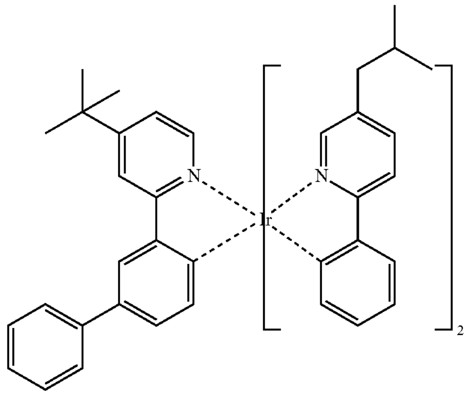
D-177
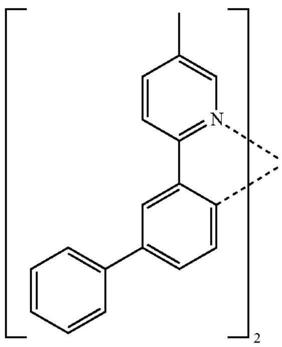
D-178
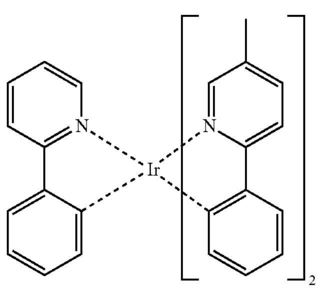
D-179
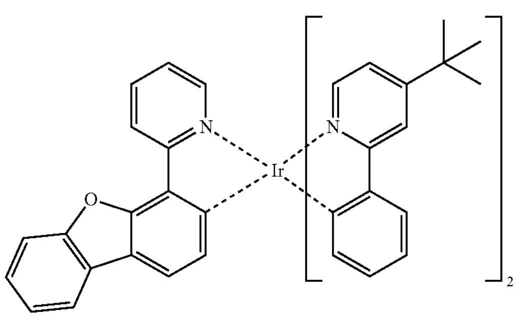
-continued
D-180
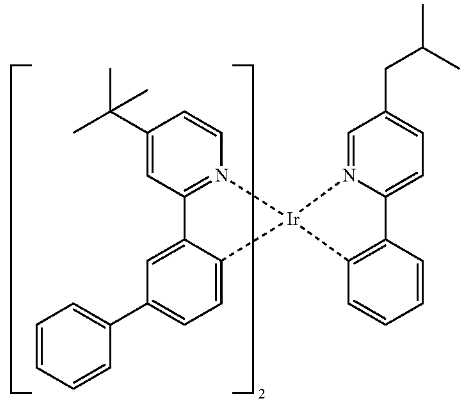
D-181
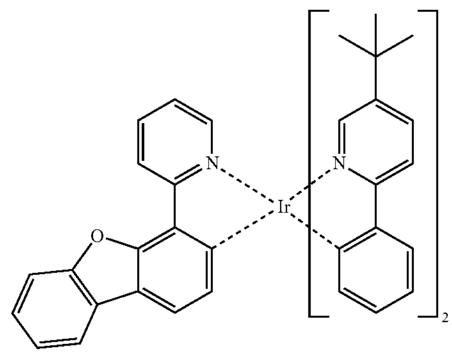
D-182
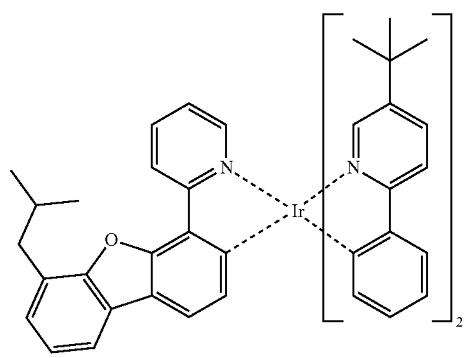
D-183
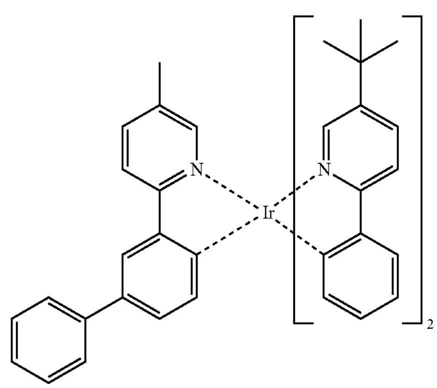

-continued
D-184
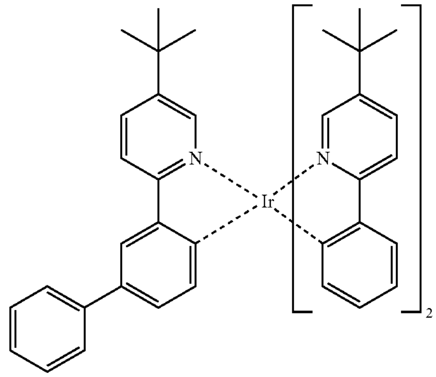
D-185
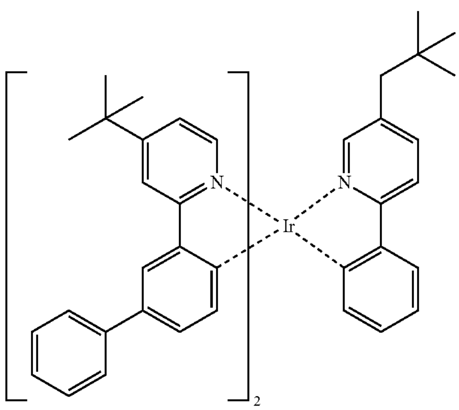
D-186
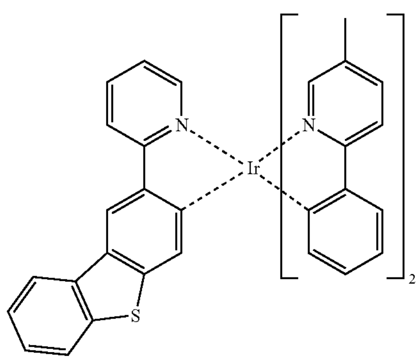
D-187
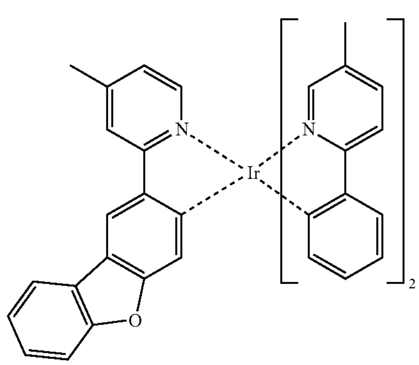
-continued
D-188
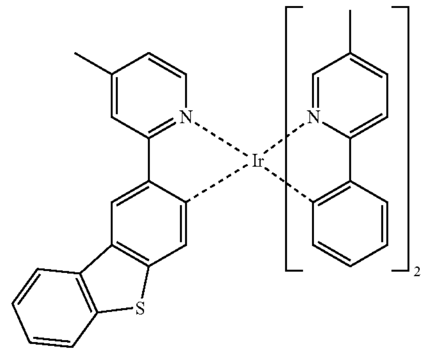
D-189
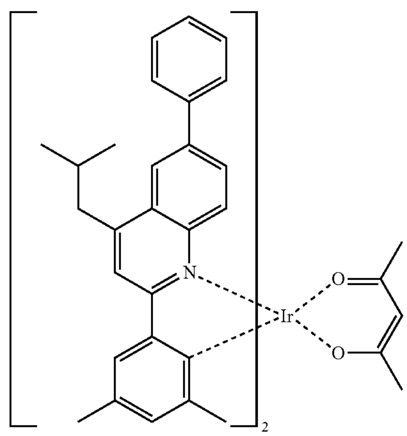
D-190
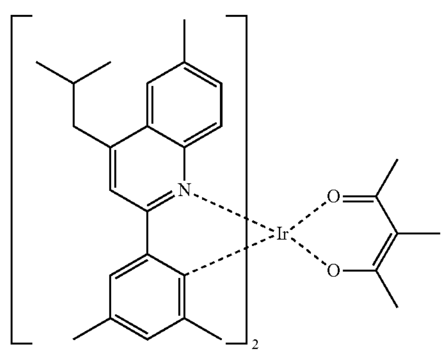
D-191
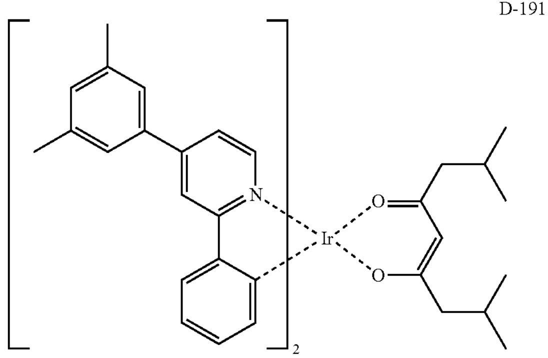

-continued
D-192
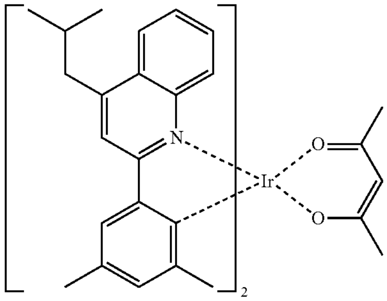
D-193
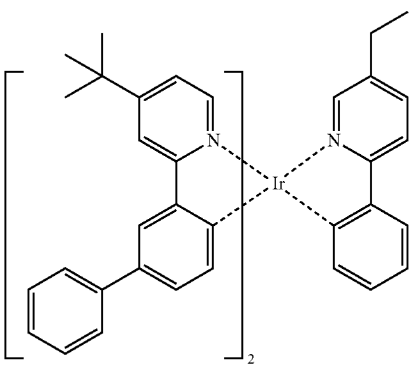
D-194
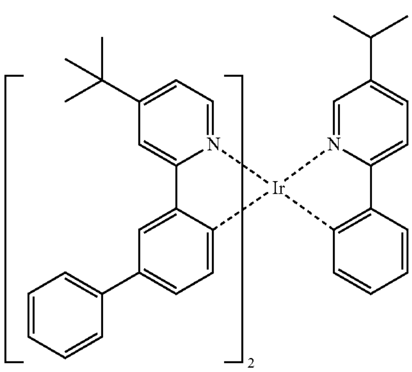
D-195
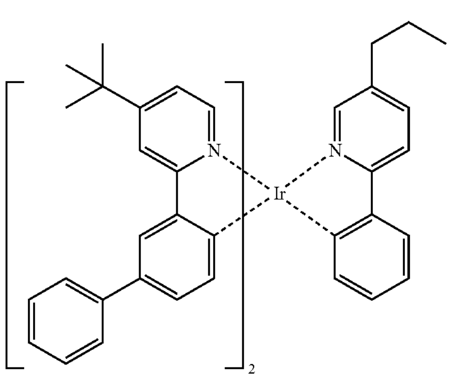
-continued
D-196
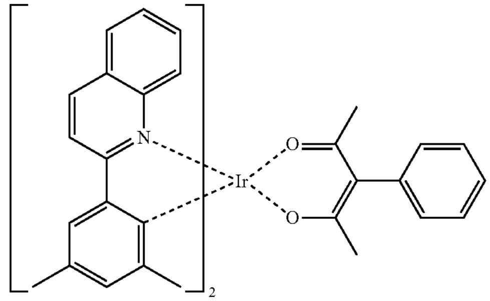
D-197
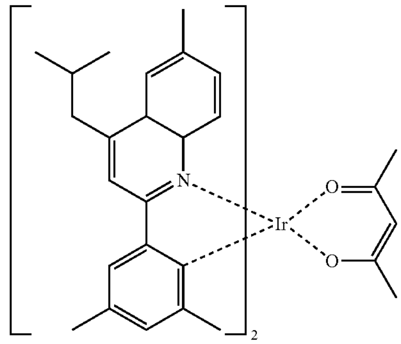
D-198
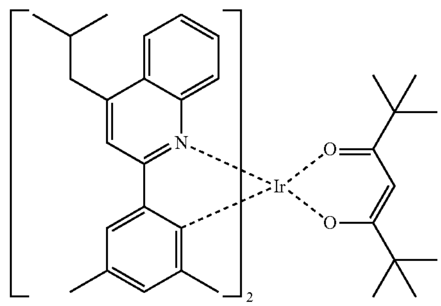
D-199
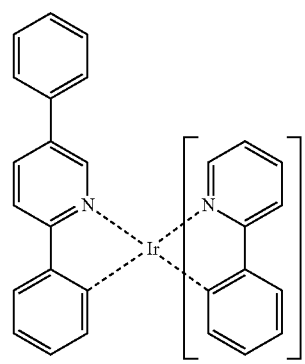
D-200
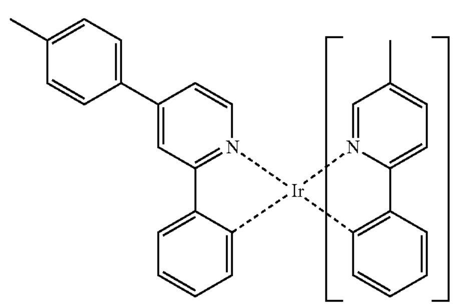

-continued
D-201
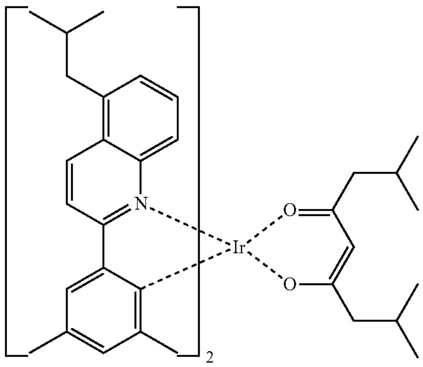
D-202
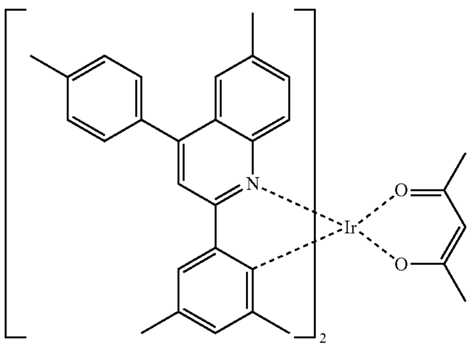
D-203
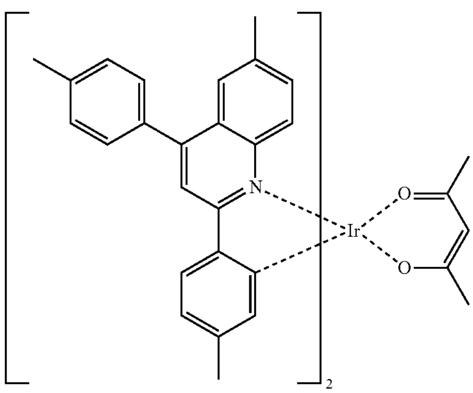
D-204
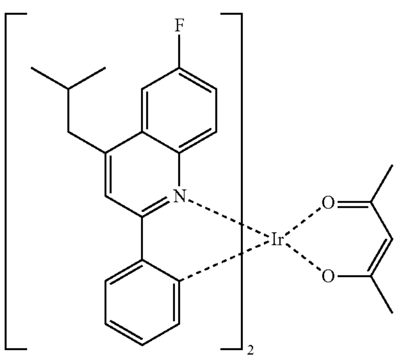
-continued
D-205
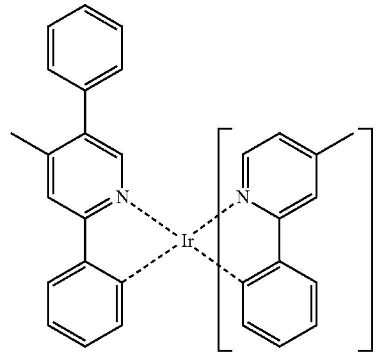
D-206
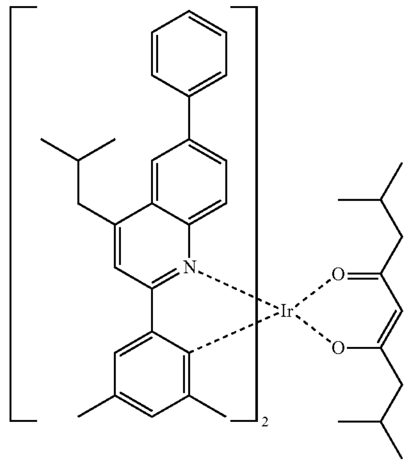
D-207
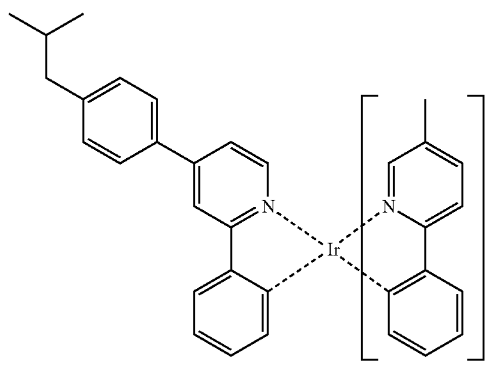
D-208
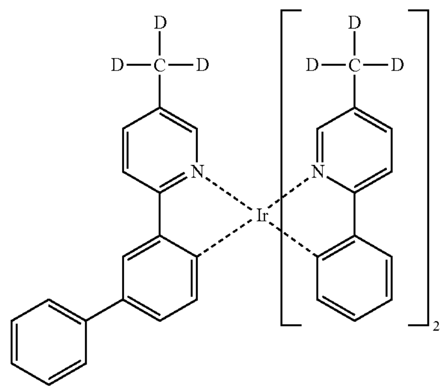

-continued

D-209

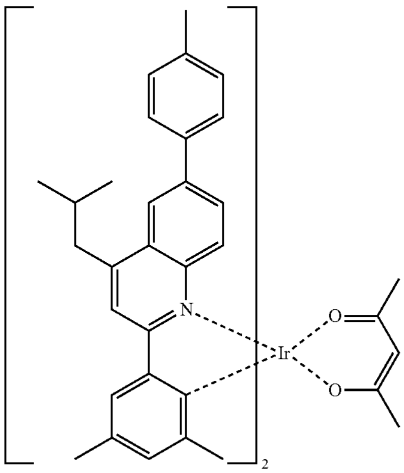

D-210

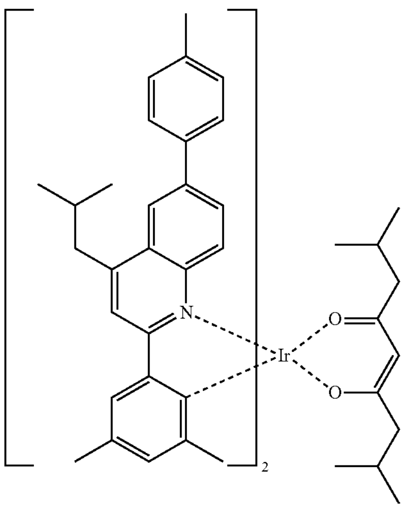

D-211

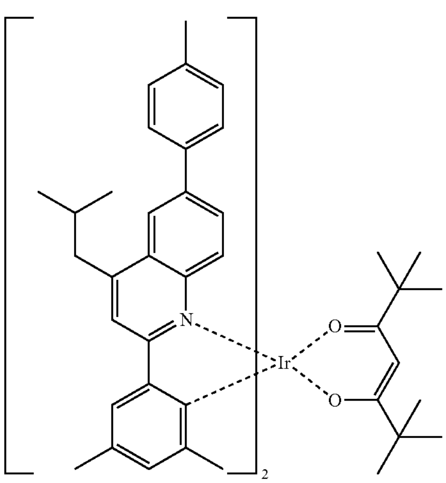

-continued

D-212

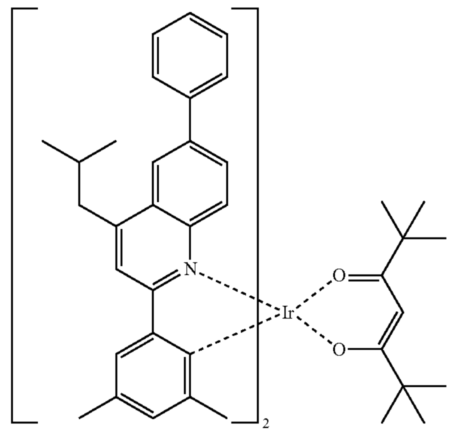

The organic EL device of the present invention may further include at least one compound selected from the group consisting of arylamine-based compounds and styrylarylamine-based compounds in the organic layer.

In the organic EL device of the present invention, the organic layer may further comprise at least one metal selected from the group consisting of metals of Group 1, metals of Group 2, transition metals of the $4^{th}$ period, transition metals of the $5^{th}$ period, lanthanides, and organic metals of d-transition elements of the Periodic Table, or at least one complex compound comprising the metal.

Preferably, in the organic electroluminescent device of the present invention, at least one layer (hereinafter, "a surface layer") selected from a chalcogenide layer, a metal halide layer and a metal oxide layer may be placed on an inner surface(s) of one or both electrode(s). Specifically, it is preferred that a chalcogenide (including oxides) layer of silicon or aluminum is placed on an anode surface of a light-emitting medium layer, and a metal halide layer or metal oxide layer is placed on a cathode surface of an electroluminescent medium layer. The surface layer provides operating stability for the organic electroluminescent device. Preferably, the chalcogenide includes $SiO_X$($1 \leq X \leq 2$), $AlO_X$($1 \leq X \leq 1.5$), SiON, SiAlON, etc.; the metal halide includes LiF, $MgF_2$, $CaF_2$, a rare earth metal fluoride, etc.; and the metal oxide includes $Cs_2O$, $Li_2O$, MgO, SrO, BaO, CaO, etc.

A hole injection layer, a hole transport layer, an electron blocking layer, or their combinations can be used between an anode and a light-emitting layer. The hole injection layer may be multi-layers in order to lower a hole injection barrier (or hole injection voltage) from an anode to a hole transport layer or an electron blocking layer, wherein each of the multi-layers simultaneously uses two compounds. The hole transport layer or the electron blocking layer may also be multi-layers.

An electron buffer layer, a hole blocking layer, an electron transport layer, an electron injection layer, or their combinations can be used between a light-emitting layer and a cathode. The electron buffer layer may be multi-layers in order to control the injection of an electron and improve interface properties between the light-emitting layer and the electron injection layer, wherein each of the multi-layers simultaneously uses two compounds. The hole blocking layer or the electron transport layer may also be multi-layers, wherein each of the multi-layers may use a multi-component of compounds.

Preferably, in the organic electroluminescent device of the present invention, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to a light-emitting medium. Further, the hole transport compound is oxidized to a cation, and thus it becomes easier to inject and transport holes from the mixed region to a light-emitting medium. Preferably, the oxidative dopant includes various Lewis acids and acceptor compounds; and the reductive dopant includes alkali metals, alkali metal compounds, alkaline earth metals, rare-earth metals, and mixtures thereof. A reductive dopant layer may be employed as a charge-generating layer to prepare an organic electroluminescent device having two or more light-emitting layers and emitting white light.

In order to form each layer constituting the organic electroluminescent device of the present invention, dry film-forming methods, such as vacuum deposition, sputtering, plasma, ion plating methods, etc., or wet film-forming methods, such as spin coating, dip coating, flow coating methods, etc., can be used. When forming a layer by using a first host and a second host according to the present invention, co-deposition or mixed-deposition may be used.

When using a wet film-forming method, a thin film is formed by dissolving or dispersing the material constituting each layer in suitable solvents, such as ethanol, chloroform, tetrahydrofuran, dioxane, etc. The solvents are not specifically limited as long as the material constituting each layer is soluble or dispersible in the solvents, which do not cause any problems in forming a layer.

Furthermore, a display device or a light device can be produced by using the organic EL device of the present invention.

Hereinafter, the preparation methods of devices by using host compounds and dopant compounds of the present invention will be explained in detail with reference to the following examples:

Device Example 1-1: Production of an OLED Device by Co-Deposition of the First Host Compound and the Second Host Compound According to the Present Invention as a Host An OLED device comprising the organic electroluminescent compound of the present invention was produced as follows: A transparent electrode indium tin oxide (ITO) thin film (10 Ω/sq) on a glass substrate for an OLED device (Samsung Corning, Republic of Korea) was subjected to an ultrasonic washing with trichloroethylene, acetone, ethanol, and distilled water, sequentially, and was then stored in isopropanol. Next, the ITO substrate was mounted on a substrate holder of a vacuum vapor depositing apparatus. $N^4$,$N^{4'}$-diphenyl-$N^4$,$N^{4'}$-bis(9-phenyl-9H-carbazole-3-yl)-[1,1'-biphenyl]-4,4'-diamine as HI-1 was introduced into a cell of the vacuum vapor depositing apparatus, and the pressure in the chamber of the apparatus was then controlled to $10^{-6}$ torr. Thereafter, an electric current was applied to the cell to evaporate the introduced material, thereby forming a hole injection layer 1 having a thickness of 80 nm on the ITO substrate. 1,4,5,8,9,12-hexaazatriphenylene hexacarbonitrile as HI-2 was then introduced into another cell of the vacuum vapor depositing apparatus, and an electric current was applied to the cell to evaporate the introduced material, thereby forming a hole injection layer 2 having a thickness of 5 nm on hole injection layer 1. N-([1,1'-biphenyl]-4-yl)-9,9-dimethyl-N-(4-(9-phenyl-9H-carbazole-3-yl)phenyl)-9H-fluorene-2-amine as HT-1 was introduced into one cell of the vacuum vapor depositing apparatus. Thereafter, an electric current was applied to the cell to evaporate the introduced material, thereby forming a hole transport layer 1 having a thickness of 10 nm on hole injection layer 2. N,N-di([1,1'-biphenyl]-4-yl)-4'-(9H-carbazole-9-yl)-[1,1'-biphenyl]-4-amine as HT-2 was then introduced into another cell of the vacuum vapor depositing apparatus, and an electric current was applied to the cell to evaporate the introduced material, thereby forming a hole transport layer 2 having a thickness of 60 nm on hole transport layer 1. Thereafter, compounds H1-1 and H2-2 as hosts were respectively introduced into two cells of the vacuum vapor depositing apparatus and compound D-96 as a dopant was introduced into another cell. The two host materials were evaporated at the same rates of 1:1, and the dopant was evaporated at a different rate and deposited in a doping amount of 3 wt %, based on the total weight of the host and dopant, to form a light-emitting layer having a thickness of 40 nm on the hole transport layer. Next, 2,4-bis(9,9-dimethyl-9H-fluorene-2yl)-6-(naphthalene-2-yl)-1,3,5-triazine as ET-1 and lithium quinolate as EI-1 were evaporated at the same rates of 1:1 on another two cells to form an electron transport layer having a thickness of 30 nm on the light-emitting layer. After depositing lithium quinolate of EI-1 having a thickness of 2 nm as an electron injection layer on the electron transport layer, an Al cathode having a thickness of 80 nm was then deposited by another vacuum vapor deposition apparatus on the electron injection layer. Thus, an OLED device was produced.

The produced OLED device showed the driving voltage at a luminance of 1,000 nit, luminescent efficiency, CIE color coordinate, and the lifespan taken to be reduced from 100% to 90% of the constant current at a luminance of 5,000 nit as provided in Table 1 below.

HI-1

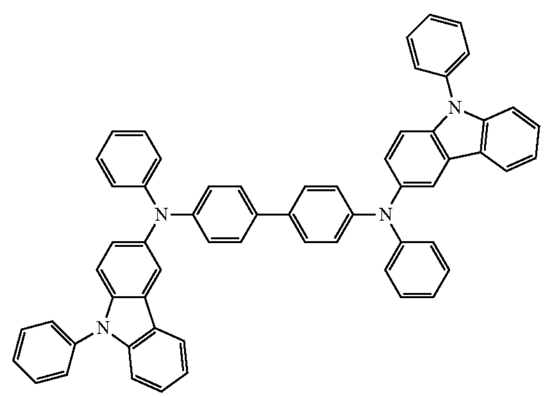

HI-2

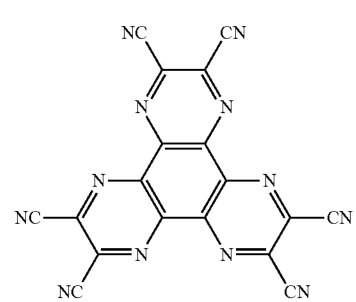

-continued

HT-1

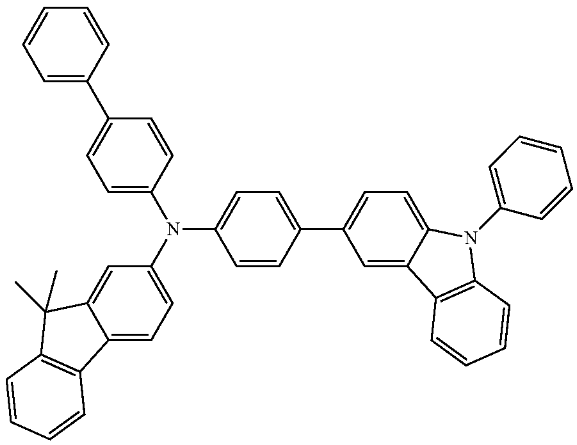

HT-2

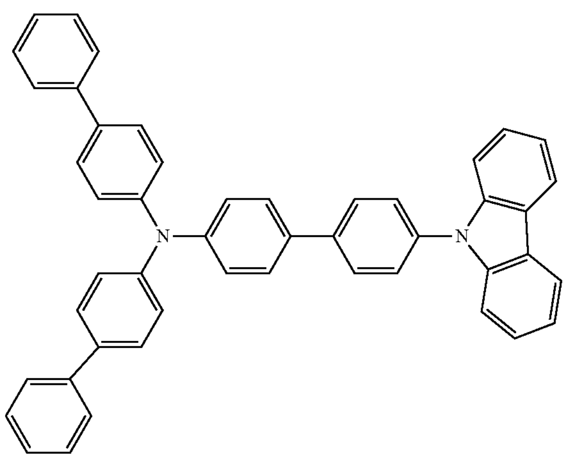

-continued

HT-3

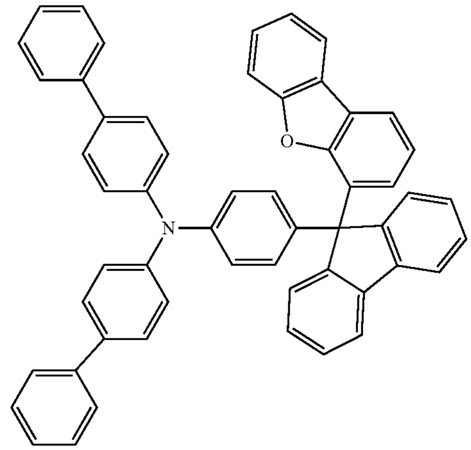

ET-1

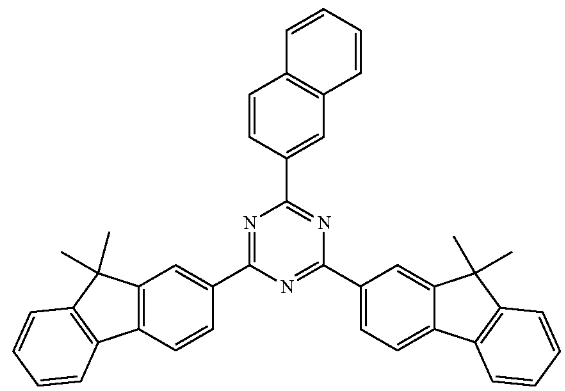

EI-1

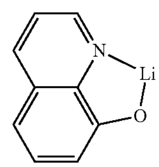

Comparative Example 1-1: Production of an OLED Device by Using Only the Second Host Compound According to the Present Invention as a Host An OLED device was produced in the same manner as in Device Example 1-1, except that only the second host compound was used as a host in a light-emitting layer.

The luminescent properties of the OLED devices produced in Device Example 1-1 and Comparative Example 1-1 are provided in Table 1 below.

TABLE 1

| | Hole Transport Layer | Host | Dopant | Voltage (V) | Efficiency (cd/A) | Color Coordinate (x, y) | T90 lifespan (hr) |
|---|---|---|---|---|---|---|---|
| Device Example 1-1 | HT-1/HT-2 | H1-1:H2-2 | D-96 | 4.3 | 25.5 | 0.663, 0.336 | 360 |
| Comparative Example 1-1 | HT-1/HT-2 | H2-2 | D-96 | 4.1 | 28.2 | 0.662, 0.337 | 100 |

Device Examples 2-1 to 2-13: Production of an OLED Device by Co-Deposition of the First Host Compound and the Second Host Compound According to the Present Invention as a Host An OLED device was produced in the same manner as in Device Example 1-1, except that hole injection layer 2 has a thickness of 3 nm, hole transport layer 1 has a thickness of 40 nm, hole transport layer 2 is not present, D-25 as a dopant was deposited in a doping amount on 15 wt % in a light-emitting layer, the electron transport layer having a thickness of 35 nm was deposited via the evaporation rate of 4:6, the combinations of the first host compound and the second host compound used as hosts in a light-emitting layer are based on Device Examples 2-1 to 2-13 as provided in Table 2 below, and the lifespan taken to be reduced from 100% to 90% of the constant current at a luminance of 15,000 nit as provided in Table 2 below.

Device Examples 2-14 To 2-18: Production of an OLED Device by Co-Deposition of the First Host Compound and the Second Host Compound According to the Present Invention as a Host An OLED device was produced in the same manner as in Device Examples 2-1 to 2-13, except that hole injection layer 2 has a thickness of 3 nm, hole transport layer 1 has a thickness of 40 nm, hole transport layer 2 is not present, D-1 as a dopant was used in a light-emitting layer, the electron transport layer having a thickness of 35 nm was deposited via the evaporation rate of 4:6, the combinations of the first host compound and the second host compound used as hosts in a light-emitting layer are based on Device Examples 2-14 to 2-18 as provided in Table 2 below, and the lifespan taken to be reduced from 100% to 90% of the constant current at a luminance of 15,000 nit as provided in Table 2 below.

Device Examples 3-1 To 3-8: Production of an OLED Device by Co-Deposition of the First Host Compound and the Second Host Compound According to the Present Invention as a Host An OLED device was produced in the same manner as in Device Examples 2-1 to 2-13, except that hole transport layer 1 has a thickness of 10 nm, hole transport layer 2 of HT-3 has a thickness of 30 nm, D-136 as a dopant was used in a light-emitting layer, and the combinations of the first host compound and the second host compound used as hosts in a light-emitting layer are based on Device Examples 3-1 to 3-8 as provided in Table 2 below.

Device Example 3-9: Production of an OLED Device by Co-Deposition of the First Host Compound and the Second Host Compound According to the Present Invention as a Host An OLED device was produced in the same manner as in Device Examples 2-1 to 2-13, except that hole transport layer 1 has a thickness of 10 nm, hole transport layer 2 of HT-3 has a thickness of 30 nm, D-164 as a dopant was used in a light-emitting layer, and the combinations of the first host compound and the second host compound used as hosts in a light-emitting layer are based on Device Example 3-9 as provided in Table 2 below.

Device Examples 3-10 to 3-12: Production of an OLED Device by Co-Deposition of the First Host Compound and the Second Host Compound According to the Present Invention as a Host An OLED device was produced in the same manner as in Device Examples 2-1 to 2-13, except that hole transport layer 1 has a thickness of 10 nm, hole transport layer 2 of HT-3 has a thickness of 30 nm, D-168 as a dopant was used in a light-emitting layer, and the combinations of the first host compound and the second host compound used as hosts in a light-emitting layer are based on Device Examples 3-10 to 3-12 as provided in Table 2 below.

Device Example 3-13: Production of an OLED Device by Co-Deposition of the First Host Compound and the Second Host Compound According to the Present Invention as a Host An OLED device was produced in the same manner as in Device Examples 2-1 to 2-13, except that hole transport layer 1 has a thickness of 10 nm, hole transport layer 2 of HT-3 has a thickness of 30 nm, D-180 as a dopant was used in a light-emitting layer, and the combinations of the first host compound and the second host compound used as hosts in a light-emitting layer are based on Device Example 3-13 as provided in Table 2 below.

Comparative Examples 2-1 To 2-3: Production of an OLED Device by Using Only the First Host Compound According to the Present Invention as a Host An OLED device was produced in the same manner as in Device Examples 2-1 to 2-13, except that the first host compound used as hosts in a light-emitting layer is based on Comparative Examples 2-1 to 2-3 as provided in Table 2 below.

Comparative Examples 3-1 To 3-9: Production of an OLED Device by Using Only the Second Host Compound According to the Present Invention as a Host An OLED device was produced in the same manner as in Device Examples 2-1 to 2-13, except that the second host compound used as hosts in a light-emitting layer is based on Comparative Examples 3-1 to 3-9 as provided in Table 2 below.

Comparative Example 4-1: Production of an OLED Device by Using Only the Second Host Compound According to the Present Invention as a Host An OLED device was produced in the same manner as in Device Examples 3-1 to 3-8, except that the second host compound used as hosts in a light-emitting layer is based on Comparative Example 4-1 as provided in Table 2 below.

The luminescent properties of the OLED devices produced in the above Device Examples and Comparative Examples are provided in Table 2 below.

TABLE 2

| | Hole Transport Layer | Host | Dopant | Voltage [V] | Efficiency [cd/A] | Color Coordinate (x, y) | T90 lifespan [hr] |
|---|---|---|---|---|---|---|---|
| Device Example 2-1 | HT-1 | H1-1:H2-25 | D-25 | 3.3 | 43.2 | 0.297, 0.660 | 100 |
| Device Example 2-2 | HT-1 | H1-1:H2-31 | D-25 | 3 | 58.8 | 0.303, 0.657 | 143 |
| Device Example 2-3 | HT-1 | H1-1:H2-48 | D-25 | 2.8 | 55.3 | 0.302, 0.657 | 124 |
| Device Example 2-4 | HT-1 | H1-1:H2-34 | D-25 | 3 | 55.7 | 0.302, 0.657 | 127 |
| Device Example 2-5 | HT-1 | H1-11:H2-31 | D-25 | 2.9 | 56.9 | 0.306, 0.656 | 147 |
| Device Example 2-6 | HT-1 | H1-12:H2-31 | D-25 | 2.9 | 54.5 | 0.304, 0.657 | 206 |
| Device Example 2-7 | HT-1 | H1-14:H2-31 | D-25 | 3.1 | 49.1 | 0.306, 0.655 | 124 |
| Device Example 2-8 | HT-1 | H1-4:H2-31 | D-25 | 2.9 | 55.2 | 0.300, 0.657 | 131 |
| Device Example 2-9 | HT-1 | H1-35:H2-31 | D-25 | 2.9 | 55.6 | 0.303, 0.656 | 161 |
| Device Example 2-10 | HT-1 | H1-1:H2-101 | D-25 | 3 | 55.6 | 0.303, 0.656 | 124 |
| Device Example 2-11 | HT-1 | H1-9:H2-31 | D-25 | 2.9 | 56 | 0.301, 0.657 | 203 |
| Device Example 2-12 | HT-1 | H1-2:H2-31 | D-25 | 2.8 | 54.9 | 0.307, 0.656 | 116 |
| Device Example 2-13 | HT-1 | H1-34:H2-31 | D-25 | 3 | 52.5 | 0.303, 0.657 | 160 |
| Device Example 2-14 | HT-1 | H1-1:H2-31 | D-1 | 2.8 | 57.8 | 0.315, 0.658 | 254 |
| Device Example 2-15 | HT-1 | H1-1:H2-48 | D-1 | 2.8 | 60.2 | 0.316, 0.659 | 240 |
| Device Example 2-16 | HT-1 | H1-11:H2-31 | D-1 | 2.8 | 52.4 | 0.317, 0.658 | 274 |
| Device Example 2-17 | HT-1 | H1-11:H2-48 | D-1 | 2.7 | 54.3 | 0.316, 0.659 | 272 |
| Device Example 2-18 | HT-1 | H1-11:H2-87 | D-1 | 2.9 | 51.9 | 0.319, 0.655 | 240 |
| Device Example 3-1 | HT-1/HT-3 | H1-1:H2-30 | D-136 | 3.3 | 63.9 | 0.324, 0.660 | 240 |
| Device Example 3-2 | HT-1/HT-3 | H1-1:H2-31 | D-136 | 3.2 | 71.2 | 0.326, 0.659 | 265 |
| Device Example 3-3 | HT-1/HT-3 | H1-1:H2-48 | D-136 | 3.1 | 68 | 0.325, 0.659 | 265 |
| Device Example 3-4 | HT-1/HT-3 | H1-1:H2-87 | D-136 | 3.3 | 67.4 | 0.327, 0.658 | 290 |
| Device Example 3-5 | HT-1/HT-3 | H1-11:H2-31 | D-136 | 3.1 | 69.2 | 0.327, 0.658 | 292 |
| Device Example 3-6 | HT-1/HT-3 | H1-11:H2-48 | D-136 | 3.2 | 64 | 0.326, 0.658 | 322 |
| Device Example 3-7 | HT-1/HT-3 | H1-11:H2-87 | D-136 | 3.1 | 65.2 | 0.327, 0.657 | 367 |
| Device Example 3-8 | HT-1/HT-3 | H1-35:H2-125 | D-136 | 3.1 | 65.2 | 0.330, 0.655 | 408 |
| Device Example 3-9 | HT-1/HT-3 | H1-35:H2-31 | D-164 | 3.2 | 61.5 | 0.316, 0.656 | 241 |
| Device Example 3-10 | HT-1/HT-3 | H1-1:H2-31 | D-168 | 3.2 | 62.1 | 0.281, 0.665 | 148 |
| Device Example 3-11 | HT-1/HT-3 | H1-35:H2-31 | D-168 | 3.2 | 59.4 | 0.278, 0.668 | 162 |
| Device Example 3-12 | HT-1/HT-3 | H1-12:H2-125 | D-168 | 3.1 | 56.6 | 0.288, 0.665 | 164 |
| Device Example 3-13 | HT-1/HT-3 | H1-12:H2-125 | D-180 | 3.1 | 49.7 | 0.291, 0.664 | 240 |

TABLE 2-continued

| | Hole Transport Layer | Host | Dopant | Voltage [V] | Efficiency [cd/A] | Color Coordinate (x, y) | T90 lifespan [hr] |
|---|---|---|---|---|---|---|---|
| Comparative Example 2-1 | HT-1 | H1-12 | D-25 | 5.9 | 3.1 | 0.299, 0.656 | x |
| Comparative Example 2-2 | HT-1 | H1-4 | D-25 | 6.7 | 3 | 0.289, 0.658 | x |
| Comparative Example 2-3 | HT-1 | H1-35 | D-25 | 6.6 | 3.9 | 0.395, 0.658 | x |
| Comparative Example 3-1 | HT-1 | H2-25 | D-25 | 3.1 | 54.2 | 0.308, 0.655 | 45 |
| Comparative Example 3-2 | HT-1 | H2-31 | D-25 | 2.9 | 42.8 | 0.314, 0.652 | 39 |
| Comparative Example 3-3 | HT-1 | H2-48 | D-25 | 2.6 | 49.6 | 0.314, 0.652 | 67 |
| Comparative Example 3-4 | HT-1 | H2-101 | D-25 | 2.8 | 50.3 | 0.315, 0.651 | 24 |
| Comparative Example 3-5 | HT-1 | H2-34 | D-25 | 2.7 | 49.2 | 0.312, 0.652 | 38 |
| Comparative Example 3-6 | HT-1 | H2-30 | D-25 | 2.8 | 55.3 | 0.314, 0.652 | 70 |
| Comparative Example 3-7 | HT-1 | H2-31 | D-1 | 2.9 | 33.5 | 0.323, 0.653 | 130 |
| Comparative Example 3-8 | HT-1 | H2-48 | D-1 | 2.6 | 41.2 | 0.325, 0.653 | 124 |
| Comparative Example 3-9 | HT-1 | H2-87 | D-1 | 2.8 | 37.9 | 0.323, 0.653 | 146 |
| Comparative Example 4-1 | HT-1/HT-3 | H2-125 | D-136 | 3.0 | 64.9 | 0.337, 0.649 | 124 |

Device Examples 4-1 To 4-7: Production of an OLED Device By Co-Deposition of the First Host Compound and the Second Host Compound According to the Present Invention as a Host An OLED device was produced in the same manner as in Device Example 1-1, except that HT-4 was used as a hole transport layer 2, the combinations of the first host compound and the second host compound used as hosts in a light-emitting layer are based on Device Examples 4-1 to 4-7 as provided in Table 3 below, and the lifespan taken to be reduced from 100% to 95% of the constant current at a luminance of 5,000 nit as provided in Table 3 below.

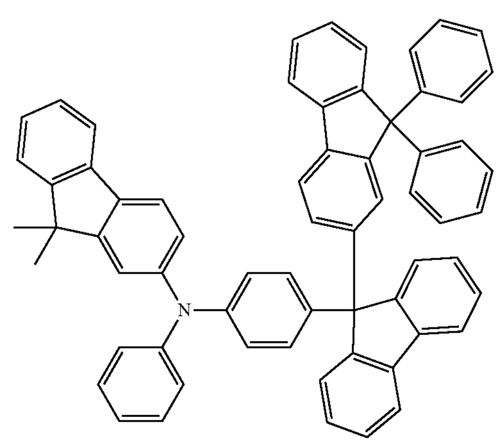

HT-4

Comparative Examples 5-1 And 5-2: Production of an OLED Device by Using Only the Second Host Compound According to the Present Invention as a Host An OLED device was produced in the same manner as in Device Examples 4-1 to 4-7, except that the second host compound used as hosts in a light-emitting layer is based on Comparative Examples 5-1 and 5-2 as provided in Table 3 below.

The luminescent properties of the OLED devices produced in Device Examples 4-1 to 4-7, and Comparative Examples 5-1 and 5-2 are provided in Table 3 below.

Comparative Examples 6-1 And 6-2: Production of an OLED Device by Using Only the First Host Compound According to the Present Invention as a Host An OLED device was produced in the same manner as in Device Examples 5-1 and 5-2, except that the first host compound used as hosts in a light-emitting layer is based on Comparative Examples 6-1 and 6-2 as provided in Table 4 below.

TABLE 3

| | Hole Transport Layer | Host | Dopant | Voltage [V] | Efficiency [cd/A] | Color Coordinate (x, y) | T95 lifespan [hr] |
|---|---|---|---|---|---|---|---|
| Device Example 4-1 | HT-1/ HT-4 | H1-287:H2-496 | D-96 | 3.8 | 30.8 | 0.667, 0.333 | 310 |
| Device Example 4-2 | HT-1/ HT-4 | H1-12:H2-504 | D-96 | 3.5 | 30.7 | 0.667, 0.333 | 390 |
| Device Example 4-3 | HT-1/ HT-4 | H1-9:H2-496 | D-96 | 3.9 | 31.1 | 0.665, 0.335 | 130 |
| Device Example 4-4 | HT-1/ HT-4 | H1-35:H2-496 | D-96 | 3.8 | 31.1 | 0.665, 0.334 | 200 |
| Device Example 4-5 | HT-1/ HT-4 | H1-287:H2-504 | D-96 | 3.7 | 31.3 | 0.666, 0.333 | 200 |
| Device Example 4-6 | HT-1/ HT-4 | H1-282:H2-504 | D-96 | 3.7 | 31.4 | 0.666, 0.334 | 120 |
| Device Example 4-7 | HT-1/ HT-4 | H1-12:H2-496 | D-96 | 3.6 | 29.2 | 0.667, 0.333 | 150 |
| Comparative Example 5-1 | HT-1/ HT-4 | H2-496 | D-96 | 3.7 | 31.0 | 0.665, 0.334 | 90 |
| Comparative Example 5-2 | HT-1/ HT-4 | H2-504 | D-96 | 3.7 | 31 | 0.667, 0.333 | 70 |

Device Examples 5-1 And 5-2: Production of an OLED Device by Co-Deposition of the First Host Compound and the Second Host Compound According to the Present Invention as a Host An OLED device was produced in the same manner as in Device Examples 3-1 to 3-11, except that D-134 was used as a dopant in a light-emitting layer, the combinations of the first host compound and the second host compound used as hosts in a light-emitting layer are based on Device Examples 5-1 and 5-2 as provided in Table 4 below, and the lifespan taken to be reduced from 100% to 97% of the constant current at a luminance of 15,000 nit as provided in Table 4 below.

Comparative Example 7-1: Production of an OLED Device by Using Only the Second Host Compound According to the Present Invention as a Host An OLED device was produced in the same manner as in Device Examples 5-1 and 5-2, except that the second host compound used as hosts in a light-emitting layer is based on Comparative Example 7-1 as provided in Table 4 below.

The luminescent properties of the OLED devices produced in Device Examples 5-1 and 5-2, Comparative Examples 6-1 and 6-2, and Comparative Example 7-1 are provided in Table 4 below.

TABLE 4

| | Hole Transport Layer | Host | Dopant | Voltage [V] | Efficiency [cd/A] | Color Coordinate (x, y) | T97 lifespan [hr] |
|---|---|---|---|---|---|---|---|
| Device Example 5-1 | HT-1/HT-3 | H1-12: H2-660 | D-134 | 3.1 | 63.2 | 0.313, 0.665 | 39 |
| Device Example 5-2 | HT-1/HT-3 | H1-35: H2-660 | D-134 | 3.2 | 64.8 | 0.312, 0.665 | 56 |
| Comparative Example 6-1 | HT-1/HT-3 | H1-12 | D-134 | 6.4 | 2.9 | 0.305, 0.660 | x |

TABLE 4-continued

| | Hole Transport Layer | Host | Dopant | Voltage [V] | Efficiency [cd/A] | Color Coordinate (x, y) | T97 lifespan [hr] |
|---|---|---|---|---|---|---|---|
| Comparative Example 6-2 | HT-1/HT-3 | H1-35 | D-134 | 7.2 | 3.5 | 0.302, 0.664 | x |
| Comparative Example 7-1 | HT-1/HT-3 | H2-660 | D-134 | 3.0 | 55.4 | 0.321, 0.659 | 5 |

The organic electroluminescent device of the present invention provides longer lifespan compared with conventional devices by comprising a light-emitting layer containing a host and a phosphorescent dopant, wherein the host consists of multi-component host compounds, at least a first host compound of the multi-component host compounds has a specific bicarbazole derivative containing an aryl group, and a second host compound has a specific carbazole derivative including a nitrogen-containing heteroaryl group.

The invention claimed is:

1. An organic electroluminescent device comprising at least one light-emitting layer between an anode and a cathode, wherein the light-emitting layer comprises a host and a phosphorescent dopant; the host consists of multi-component host compounds; at least a first host compound of the multi-component host compounds is represented by the following formula 1 which is a bicarbazole derivative containing an aryl group, and a second host compound is represented by the following formula 7 which is a carbazole derivative including a nitrogen-containing heteroaryl group:

(1)

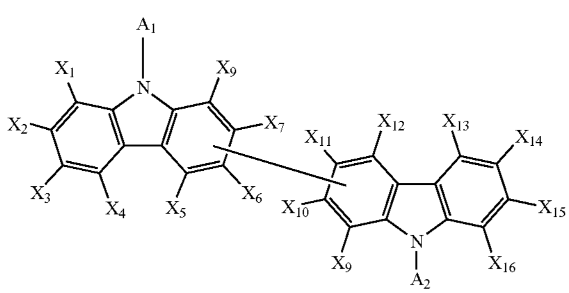

(7)

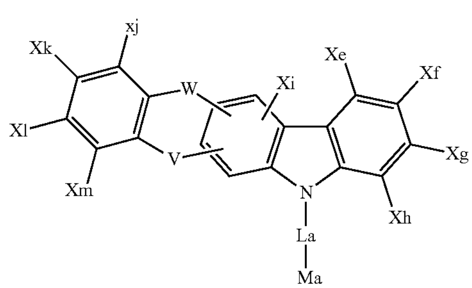

wherein $A_1$ represents a deuterium-substituted or unsubstituted biphenyl, or a deuterium-substituted or unsubstituted terphenyl;

$A_2$ represents a substituted or unsubstituted phenyl, a deuterium-substituted or unsubstituted biphenyl, or a deuterium-substituted or unsubstituted terphenyl;

$X_1$ to $X_{16}$ each independently represent hydrogen, or deuterium;

Ma represents a substituted or unsubstituted triazinyl, wherein the substituents of the substituted triazinyl are selected from the group consisting of a deuterium-substituted or unsubstituted phenyl and a deuterium-substituted or unsubstituted biphenyl;

La represents a single bond,

V and W each independently represent a single bond, or $NR_{15}$, provided that both V and W neither represent a single bond nor represent $NR_{15}$;

Xe to Xm represent hydrogen, or deuterium; and $R_{15}$ represents a deuterium-substituted or unsubstituted biphenyl or a deuterium-substituted or unsubstituted terphenyl.

2. The organic electroluminescent device according to claim 1, wherein the compound of formula 1 is represented by the following formula 3, 4, 5, or 6:

(3)

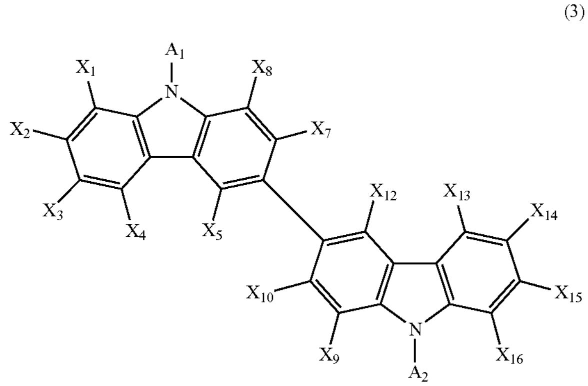

-continued
(4)
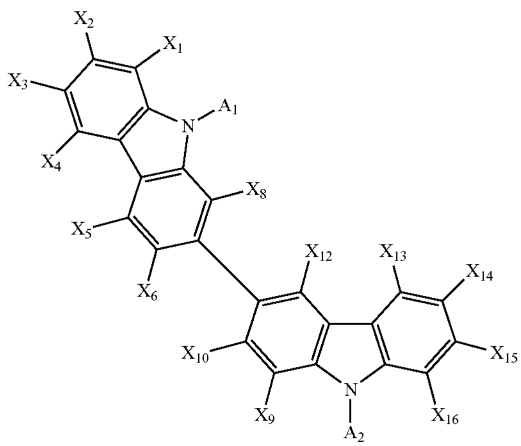
(5)
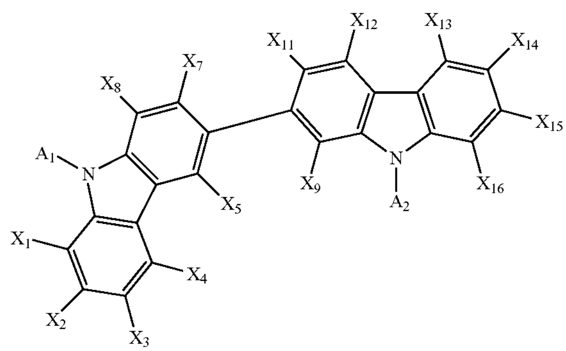
(6)
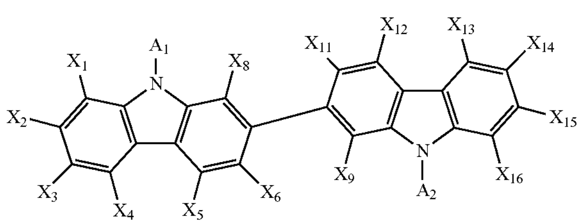
wherein
$A_1$ and $A_2$, $X_1$ to $X_{16}$ are as defined in formula 1.
3. The organic electroluminescent device according to claim 1, wherein the compound represented by formula 1 is selected from the group consisting of the following compounds:
H1-8
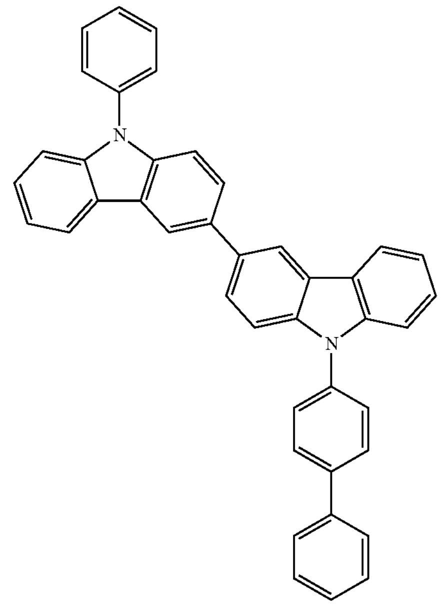
H1-9
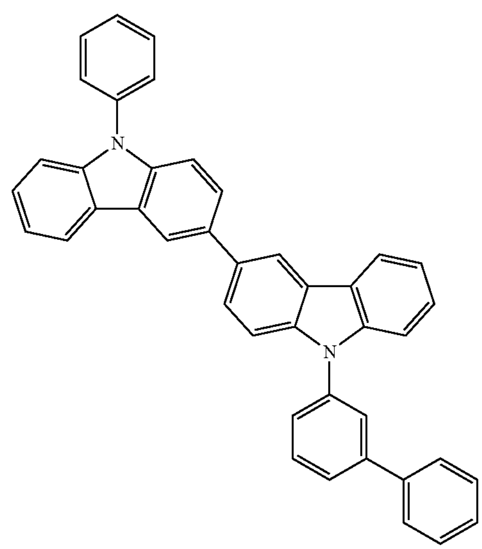

-continued
H1-10
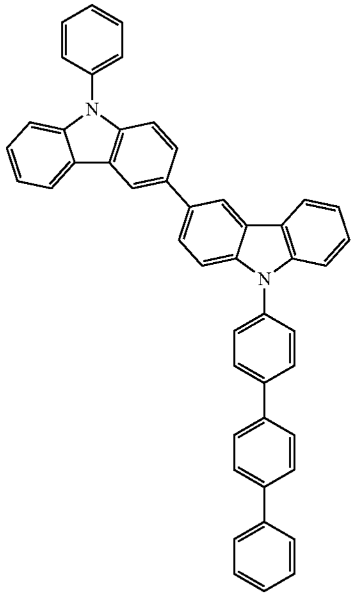
-continued
H1-12
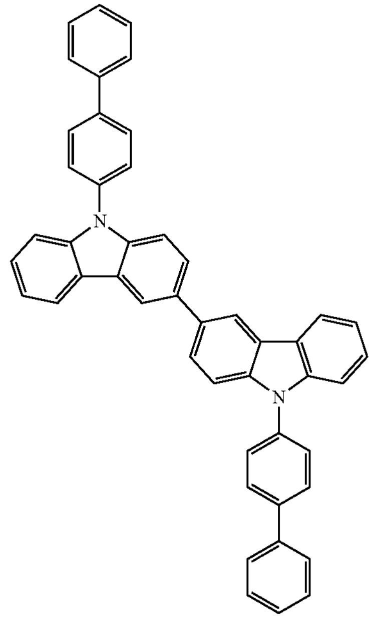
H1-11
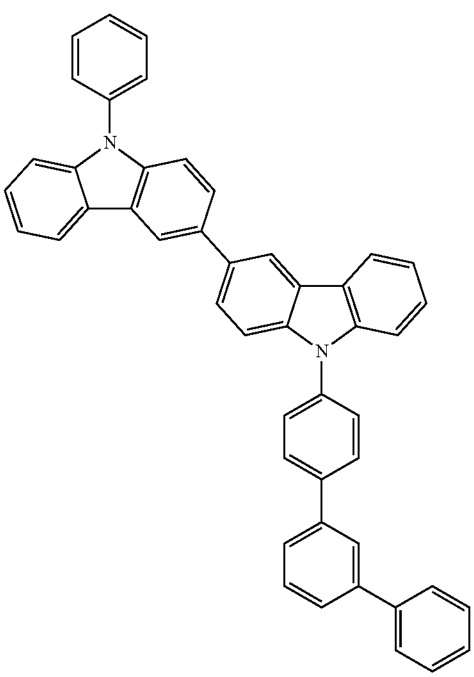
H1-13
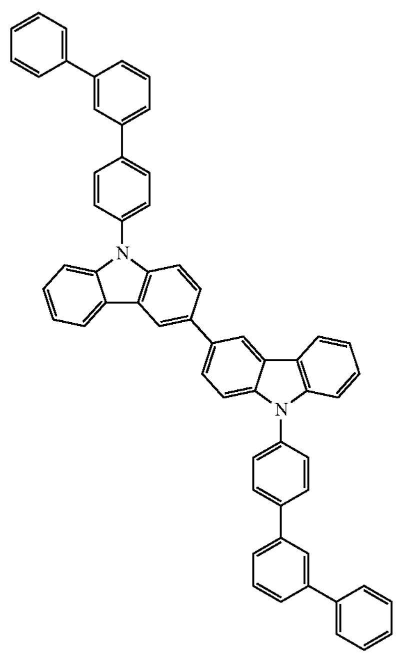

H1-16
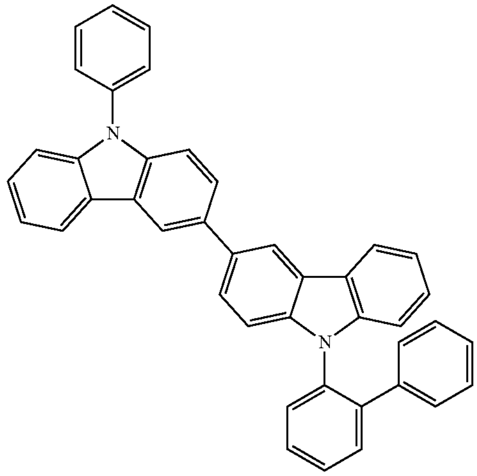
H1-17
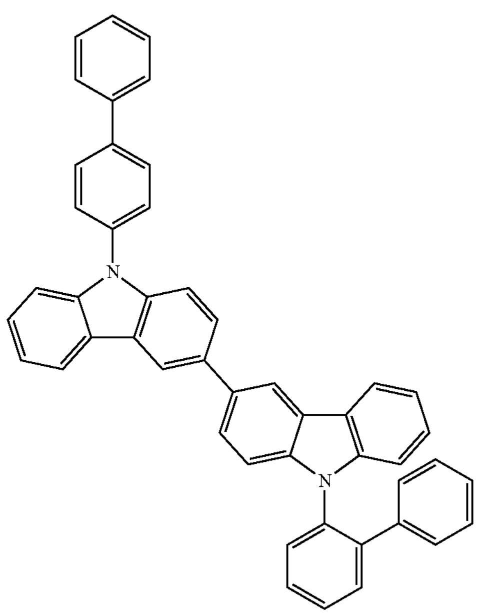
H1-18
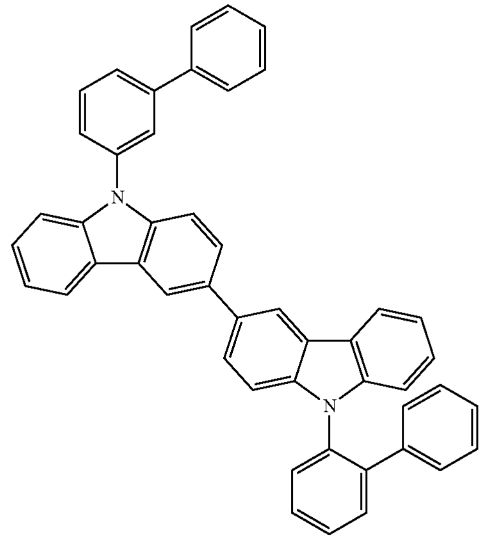
H1-19
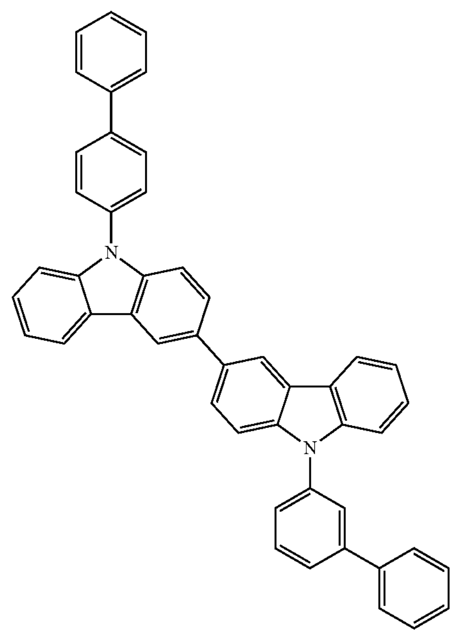

-continued
H1-20
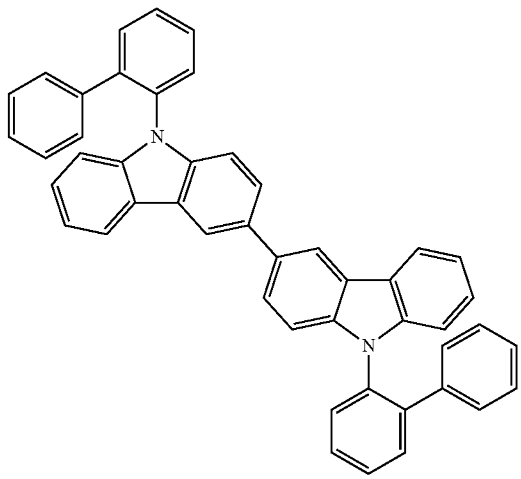
H1-31
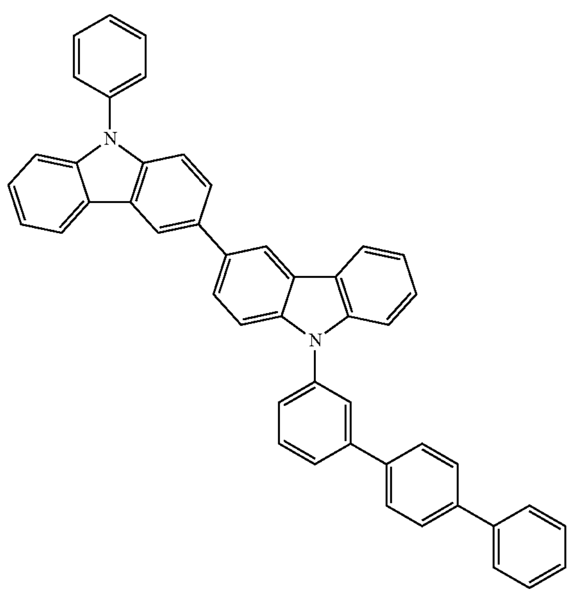
-continued
H1-34
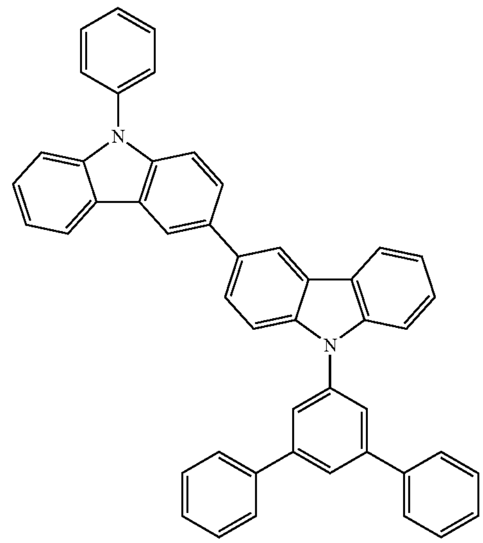
and
H1-35
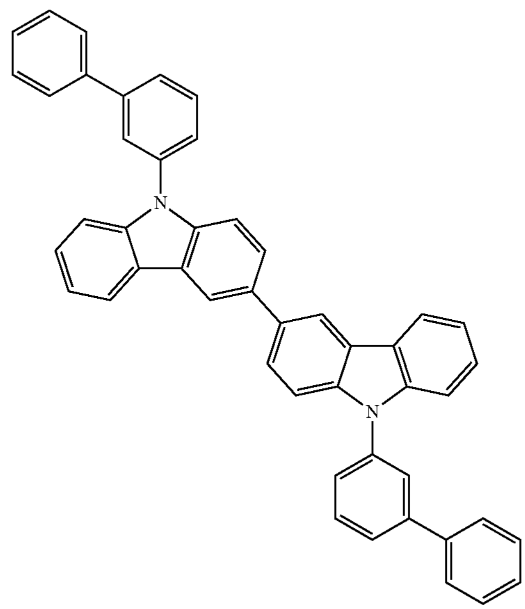
.
* * * * *